US012483274B2

(12) United States Patent
Wang et al.

(10) Patent No.: US 12,483,274 B2
(45) Date of Patent: Nov. 25, 2025

(54) POLAR CODE ENCODING AND RATE-MATCHED SEQUENCE OUTPUTTING METHOD AND APPARATUS

(71) Applicant: HUAWEI TECHNOLOGIES CO., LTD., Shenzhen (CN)

(72) Inventors: Jun Wang, Hangzhou (CN); Wen Tong, Ottawa (CA); Xianbin Wang, Hangzhou (CN); Rong Li, Hangzhou (CN); Yourui HuangFu, Hangzhou (CN); Shengchen Dai, Hangzhou (CN); Huazi Zhang, Hangzhou (CN); Jian Wang, Beijing (CN)

(73) Assignee: HUAWEI TECHNOLOGIES CO., LTD., Shenzhen (CN)

( * ) Notice: Subject to any disclaimer, the term of this patent is extended or adjusted under 35 U.S.C. 154(b) by 114 days.

(21) Appl. No.: 18/151,976

(22) Filed: Jan. 9, 2023

(65) Prior Publication Data

US 2023/0163784 A1 May 25, 2023

Related U.S. Application Data

(63) Continuation of application No. PCT/CN2021/101177, filed on Jun. 21, 2021.

(51) Int. Cl.
*H03M 13/09* (2006.01)
*H03M 13/00* (2006.01)
*H03M 13/13* (2006.01)

(52) U.S. Cl.
CPC ......... *H03M 13/09* (2013.01); *H03M 13/611* (2013.01)

(58) Field of Classification Search
CPC ... H03M 13/13; H03M 13/27; H03M 13/6362
See application file for complete search history.

(56) References Cited

U.S. PATENT DOCUMENTS 10,637,609 B2 * 4/2020 Xu .................... H03M 13/6356
10,673,466 B2 * 6/2020 Chen ................. H03M 13/3944
(Continued)

FOREIGN PATENT DOCUMENTS

CN 108540260 A 9/2018
EP 3605902 A1 2/2020

OTHER PUBLICATIONS

Bioglio, Valerio et al., Design of Polar Codes in 5G New Radio, IEEE Communications Surveys and Tutorials, vol. 23, Issue: 1,IEEE,Jan. 17, 2020, total 12 pages.

(Continued)

*Primary Examiner* — Justin R Knapp
(74) *Attorney, Agent, or Firm* — HAUPTMAN HAM, LLP

(57) ABSTRACT

A polar code encoding method includes obtaining, by an encoding apparatus, to-be-encoded bits, a mother code length, and a first sequence. The first sequence includes sequence numbers of polarized subchannels. The sequence numbers of the polarized subchannels are arranged in the first sequence based on reliability of the polarized subchannels. The method also includes determining, based on the first sequence, polarized subchannels used to contain the to-be-encoded bits, and performing polarization encoding on the to-be-encoded bits to obtain an encoded bit sequence. The method further includes performing rate matching on the encoded sequence to obtain a rate-matched sequence. The method additionally includes outputting the rate-matched sequence.

17 Claims, 5 Drawing Sheets

(56) References Cited

U.S. PATENT DOCUMENTS

| | | | | |
|---|---|---|---|---|
| 10,938,422 | B2 * | 3/2021 | Chen | H03M 13/13 |
| 10,938,506 | B2 * | 3/2021 | Zhang | H04L 1/0041 |
| 11,005,504 | B2 * | 5/2021 | Chen | H04L 1/0045 |
| 11,750,217 | B2 * | 9/2023 | Qiao | H04L 1/0057 714/758 |
| 2019/0305887 | A1 | 10/2019 | Jang et al. | |
| 2020/0119842 | A1 | 4/2020 | Xu et al. | |
| 2023/0113448 | A1 * | 4/2023 | Dai | H03M 13/6362 714/746 |
| 2023/0123058 | A1 * | 4/2023 | Dai | H03M 13/6368 370/316 |

OTHER PUBLICATIONS

3rd Generation Partnership Project; Technical Specification Group Radio Access Network; NR; Multiplexing and channel coding (Release 15),3GPP TS 38.212 V15.3.0(Sep. 2018)Sep. 27, 2018, total 99 pages.

3GPP TS 38.212, V15.8.0 (Dec. 2019)"3rd Generation Partnership Project; Technical Specification Group Radio Access Network;NR;Multiplexing and channel coding(Release 15)"XP051843137,Jan. 11, 2020,total 101 pages.

Extended European Search Report issued in corresponding European Application No. 21838335.4, dated May 7, 2024, pp. 1-12.

International Search Report issued in corresponding International Application No. PCT/CN2021/101177, dated Sep. 18, 2021, pp. 1-9.

* cited by examiner

POLAR CODE ENCODING AND RATE-MATCHED SEQUENCE OUTPUTTING METHOD AND APPARATUS

CROSS-REFERENCE TO RELATED APPLICATIONS

This application is a continuation of International Patent Application No. PCT/CN2021/101177, filed on Jun. 21, 2021, which claims priority to Chinese Patent Application No. 202010663589.9, filed on Jul. 10, 2020. The disclosures of the aforementioned applications are hereby incorporated by reference in their entireties.

TECHNICAL FIELD

Embodiments of this application relate to the field of communications technologies, and in particular, to a polar code encoding method and apparatus.

BACKGROUND

Channel encoding, as a most fundamental radio access technology, is crucial in ensuring reliable data transmission. In an existing wireless communications system, turbo code, low density parity check (LDPC) code, and polar code are usually used to perform channel encoding. The turbo code cannot support information transmission at an excessively low or high code rate. Due to encoding/decoding features of the turbo code and the LDPC code, for medium and short packet transmission, it is difficult for the turbo code and the LDPC code to achieve ideal performance in a case of a limited code length. During implementation, the turbo code and the LDPC code have high computation complexity in an encoding/decoding implementation process. The polar code is high-performance code that has been theoretically proved to be capable of achieving Shannon capacity and that has low encoding/decoding complexity, and therefore is applied increasingly widely.

In a 5th generation (5G) communications system, the polar code is determined as an encoding scheme of a control channel. Because a data amount included in the control channel is usually not large, a code block is not large. In the 3GPP standard, only a reliability ranking sequence whose mother code length is $N_{max}$=1024 is specified, and is used to sort reliability of 1024 subchannels to select a location of an information bit. For another case in which the mother code length N is less than 1024, a subsequence of the reliability ranking sequence in which $N_{max}$=1024 may be used as a corresponding reliability ranking sequence. A system design can be simplified by using this sequence nesting feature.

However, during data channel encoding, a long code block needs to be used for encoding in a plurality of cases. In this case, it is not enough to still use the reliability ranking sequence in which $N_{max}$=1024. Therefore, how to design a long reliability ranking sequence to meet a requirement of a data channel becomes a problem that needs to be resolved.

SUMMARY

Embodiments of this application provide a polar code encoding method and apparatus applied to wireless communication, to support polar code encoding of a large data block, and to allow backward compatibility with a reliability ranking sequence supported by an existing NR system. This reuses the conventional technology to a maximum extent.

Specific technical solutions provided in embodiments of this application are as follows.

According to a first aspect, a polar code encoding method is provided, including:

An encoding apparatus obtains K to-be-encoded bits, a mother code length N, and a first sequence, where the first sequence includes sequence numbers of N polarized subchannels, the sequence numbers of the N polarized subchannels are arranged in the first sequence based on reliability of the N polarized subchannels, $N=2^n$, and K≤N, N is greater than or equal to 32, and K, n, and N are positive integers;

- determines, based on the first sequence, K polarized subchannels used to contain the K to-be-encoded bits, and performs polarization encoding on the K to-be-encoded bits to obtain an encoded bit sequence;
- performs rate matching on the encoded sequence to obtain a rate-matched sequence; and
- outputs the rate-matched sequence, where
- the first sequence is any Q sequence whose length is N in the appendix.

This design fits a feature of a large data block, and can be backward compatible with a reliability ranking sequence supported by an existing NR system. This reduces implementation difficulty.

In a possible design, the first sequence is a subsequence of a second sequence, the second sequence includes sequence numbers of $N_{max}$ polarized subchannels, the sequence numbers of the $N_{max}$ polarized subchannels are arranged in the second sequence based on reliability of the $N_{max}$ polarized subchannels, N is less than or equal to $N_{max}$, and $N_{max}=2^{n_{max}}$, where $n_{max}$ is a positive integer, n is less than or equal to $n_{max}$, and the second sequence is any Q sequence whose length is $N_{max}$ in the appendix.

In a possible design, the K to-be-encoded bits include a cyclic redundancy check bit.

In a possible design, the K to-be-encoded bits include a parity check bit.

In a possible design, the polar encoding method is performed by a network device or a terminal.

In a possible design, the determining, based on the first sequence, K polarized subchannels used to contain the K to-be-encoded bits is: when M is less than or equal to N, mapping the K to-be-encoded bits to the K polarized subchannels with high reliability in M−P non-punctured polarized subchannels to enable reliability of the polarized subchannels containing the K to-be-encoded bits to be higher than reliability of remaining M−P−K polarized subchannels, where M is a target code length, P is a quantity of pre-frozen polarized subchannels, and P is greater than or equal to 0.

In a possible design, the first sequence is prestored.

In a possible design, the sequence numbers of the N polarized subchannels are 0 to (N−1) or 1 to N.

According to a second aspect, a polar code decoding method is provided, including:

A decoding apparatus obtains a to-be-decoded information sequence, where the to-be-decoded information sequence includes K to-be-decoded bits;

- determines a mother code length N and a first sequence, where the first sequence includes sequence numbers of N polarized subchannels, the sequence numbers of the N polarized subchannels are arranged in the first sequence based on reliability of the N polarized subchannels, $N=2^n$, K≤N, N is greater than or equal to 32, and K, n, and N are positive integers;
- determines, based on the first sequence, K polarized subchannels used to contain the K to-be-decoded bits, and decodes the to-be-decoded information sequence to obtain a decoding result; and outputs the decoding result, where the first sequence is any Q sequence whose length is N in the appendix or a subsequence of any Q sequence whose length is greater than N in the appendix.

This design completely corresponds to the encoding method according to the first aspect, fits a feature of a large data block, and can be backward compatible with a reliability ranking sequence supported by an existing NR system. This reduces implementation difficulty.

In a possible design, the first sequence is a subsequence of a second sequence, the second sequence includes sequence numbers of $N_{max}$ polarized subchannels, the sequence numbers of the $N_{max}$ polarized subchannels are arranged in the second sequence based on reliability of the $N_{max}$ polarized subchannels, N is less than or equal to $N_{max}$, and $N_{max}=2^{n_{max}}$, where $n_{max}$ is a positive integer, n is less than or equal to $n_{max}$, and the second sequence is any Q sequence whose length is $N_{max}$ in the appendix.

In a possible design, the K to-be-decoded bits include a cyclic redundancy check bit.

In a possible design, the K to-be-decoded bits include a parity check bit.

In a possible design, the polar encoding method is performed by a network device or a terminal.

In a possible design, the determining, based on the first sequence, K polarized subchannels used to contain the K to-be-decoded bits is: when M is less than or equal to N, mapping the K to-be-decoded bits to the K polarized subchannels with high reliability in M−P non-punctured polarized subchannels to enable reliability of the polarized subchannels containing the K to-be-decoded bits to be higher than reliability of remaining M−P−K polarized subchannels, where M is a target code length, P is a quantity of pre-frozen polarized subchannels, and P is greater than or equal to 0.

In a possible design, the first sequence is prestored.

In a possible design, the sequence numbers of the N polarized subchannels are 0 to (N−1) or 1 to N.

According to a third aspect, a polar code encoding apparatus is provided. The apparatus has functions of implementing the method according to any one of the first aspect and the possible designs of the first aspect. The function may be implemented by hardware, or may be implemented by hardware executing corresponding software. The hardware or the software includes one or more modules corresponding to the foregoing function.

In a possible design, when some or all of the functions are implemented by using hardware, the polar code encoding apparatus includes: an input interface circuit, configured to obtain a to-be-encoded bit; a logical circuit, configured to perform the operation according to any one of the first aspect and the possible designs of the first aspect; and an output interface circuit, configured to output a rate-matched sequence.

Optionally, the polar code encoding apparatus may be a chip or an integrated circuit.

In a possible design, when some or all of the functions are implemented by using software, the polar code encoding apparatus includes: a memory, configured to store a program; and a processor, configured to execute the program stored in the memory. When the program is executed, the polar code encoding apparatus may implement the method according to any one of the first aspect and the possible designs of the first aspect.

Optionally, the memory may be a physically independent unit, or may be integrated with the processor.

In a possible design, when some or all of the functions are implemented by using software, the polar code encoding apparatus includes a processor. A memory configured to store a program is located outside of the polar code encoding apparatus, and the processor is connected to the memory through a circuit/cable, and is configured to read and execute the program stored in the memory.

In a possible design, the apparatus is a network device or a terminal.

According to a fourth aspect, a polar code decoding apparatus is provided. The apparatus has functions of implementing the method according to any one of the second aspect and the possible designs of the second aspect. The function may be implemented by hardware, or may be implemented by hardware executing corresponding software. The hardware or the software includes one or more modules corresponding to the foregoing function.

In a possible design, when some or all of the functions are implemented by using hardware, the polar code decoding apparatus includes: an input interface circuit, configured to obtain a to-be-decoded information sequence; a logical circuit, configured to perform the operation according to any one of the second aspect and the possible designs of the second aspect; and an output interface circuit, configured to output a decoding result.

Optionally, the polar code decoding apparatus may be a chip or an integrated circuit.

In a possible design, when some or all of the functions are implemented by using software, the polar code decoding apparatus includes: a memory, configured to store a program; and a processor, configured to execute the program stored in the memory. When the program is executed, the polar code decoding apparatus may implement the method according to any one of the second aspect and the possible designs of the second aspect.

Optionally, the memory may be a physically independent unit, or may be integrated with the processor.

In a possible design, when some or all of the functions are implemented by using software, the polar code decoding apparatus includes a processor. A memory configured to store a program is located outside of the polar code decoding apparatus, and the processor is connected to the memory through a circuit/cable, and is configured to read and execute the program stored in the memory.

In a possible design, the apparatus is a network device or a terminal.

According to a fifth aspect, a communications system is provided. The communications system includes a network device and a terminal. The network device performs the method according to the first aspect and the possible designs of the first aspect, and the terminal performs the method according to the second aspect and the possible designs of the second aspect. Alternatively, the terminal performs the method according to the first aspect and the possible designs of the first aspect, and the network device performs the method according to the second aspect and the possible designs of the second aspect.

According to a sixth aspect, a computer storage medium is provided, where the computer storage medium stores a computer program. The computer program includes instructions used to perform the method according to any one of the first aspect and the possible designs of the first aspect.

According to a seventh aspect, a computer storage medium is provided, where the computer storage medium stores a computer program. The computer program includes instructions used to perform the method according to any one of the second aspect and the possible designs of the second aspect.

According to an eighth aspect, an embodiment of this application provides a computer program product including instructions. When the instructions are run on a computer, the computer is enabled to perform the method in the foregoing aspects.

According to a ninth aspect, a wireless device is provided, including an encoding apparatus and a transceiver that are configured to implement any one of the first aspect and the possible designs of the first aspect.

The transceiver is configured to receive or send a signal.

In a possible design, the wireless device is a terminal or a network device.

According to a tenth aspect, a wireless device is provided, including a decoding apparatus and a transceiver that are configured to implement any one of the second aspect and the possible designs of the second aspect.

The transceiver is configured to receive or send a signal.

In a possible design, the wireless device is a terminal or a network device.

DESCRIPTION OF EMBODIMENTS

Figure 1:
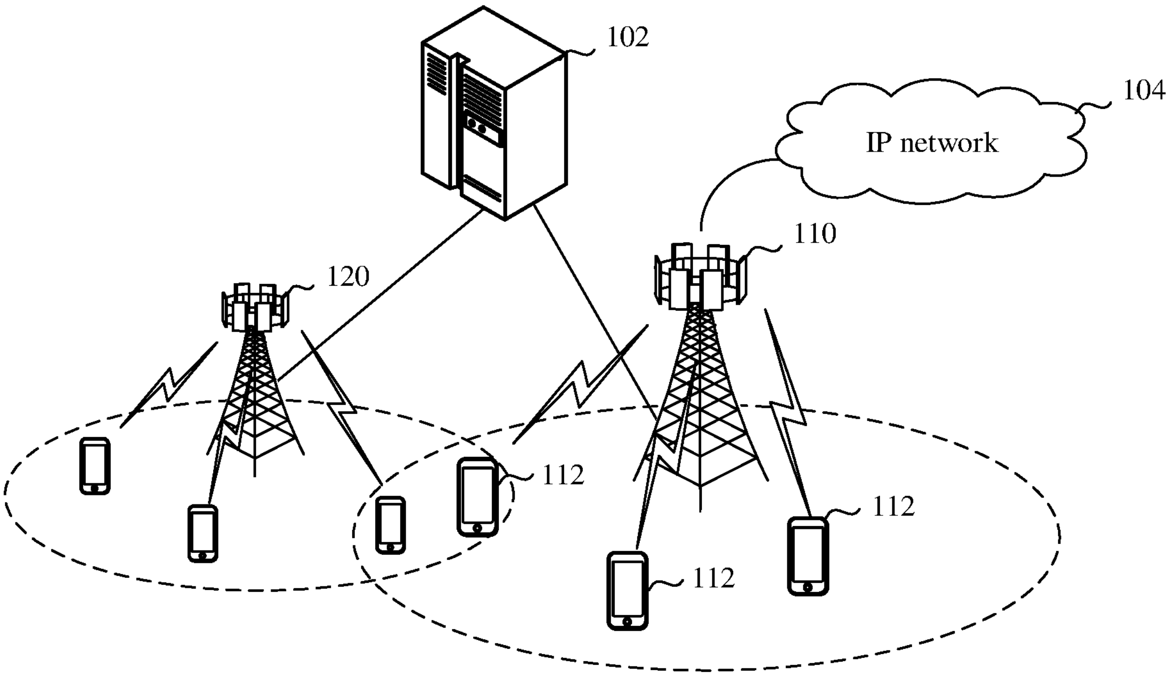
FIG. 1 is a schematic diagram of an architecture of a communications system to which an embodiment of this application is applied.

The following describes in detail embodiments of this application with reference to accompanying drawings.

If a polar code encoding scheme used for a control channel in an existing 5G NR standard is directly applied to data without considering a feature of a data channel, because in the current 5G NR standard, a maximum mother code length of a polar code is 1024, a data packet length that can be supported is limited. Therefore, it is necessary to redesign the polar code encoding scheme, to be more suitable for the data channel. In addition, it is optimal that the polar code encoding scheme is applicable to the control channel.

Embodiments of this application provide a polar code encoding method and apparatus. A sequence number of a polarized subchannel used to send an information bit is selected based on a prestored reliability ranking sequence or a subsequence of the reliability ranking sequence, and polar code encoding is performed based on the selected sequence number of the information polarized subchannel. Then, a rate matching operation is performed on an encoded sequence, and a rate-matched sequence is output, where the rate matching operation includes repetition, puncturing, or shortening. Embodiments of this application are more applicable to the data channel. The following describes in detail the polar code encoding method and apparatus provided in embodiments of the present application with reference to the accompanying drawings.

For convenience of understanding embodiments of this application, polar code is briefly described below.

According to an encoding policy of the polar code, a noiseless channel is used to transmit information useful to a user, while a pure noisy channel is used to transmit agreed information or is not used to transmit information. The polar code is also linear block code. An encoding matrix of the polar code is $G_N$, and an encoding process is $x_1^N=u_1^N G_N$. $u_1^N=(u_1, u_2, \ldots, u_N)$ is a binary row vector whose length is N (that is, a code length. It can be learned that lengths of the sequences x and u before and after encoding are both N, where N is also referred to as a mother code length). $G_N$ is an N×N matrix, and $G_N=F_2^{\otimes(log_2(N))}$. $F_2^{\otimes(log_2(N))}$ is defined as a Kronecker product of $\log_2 N$ matrices $F_2$. The matrix $$F_2=\begin{bmatrix}1 & 0\\ 1 & 1\end{bmatrix}.$$

In some implementations, there may be a transpose matrix in $u_1^N$ and $G_N$. Because polar code performance is not affected essentially, details are not described in this application.

In a polar code encoding process, one part of bits in $u_1^N$ are used to carry information, and are referred to as a set of information bits, where a set of indexes of the bits is denoted as A; and another part of bits are set to a fixed value pre-agreed upon between a receiving end and a transmitting end, and are referred to as a set of fixed bits or a set of frozen bits, where a set of indexes of the bits is indicated by a complementary set $A^c$ of A. The polar code encoding process is equivalent to: $x_1^N=u_A G_N\cdot(A)\oplus u_{A^c} G_N\cdot(A^C)$. Herein, $G_N(A)$ is a submatrix obtained by using rows corresponding to the indexes in the set A in $G_N$, and $G_N(A^C)$ is a submatrix obtained by using rows corresponding to the indexes in the set $A^c$ in $G_N$. $u_A$ is an information bit set in $u_1^N$, and a quantity of information bits is K. Usually, various types of check bits including but not limited to a cyclic redundancy check (CRC) bit and a parity check (PC) bit may also be included in the information bit set. $u_{A^c}$ is a frozen bit set in $u_1^N$, a quantity of frozen bits is (N-K), and the frozen bits are known bits. These frozen bits are usually set to 0. However, values of the frozen bits may be set to any value provided that the value is pre-agreed on by the receiving end and the transmitting end. Therefore, an encoding output of the polar code may be simplified as $x_n^N=u_A G_N(A)$. Herein, $u_A$ is the information bit set in $u_1^N$, and $u_A$ is a row vector of a length K, that is, $|A|=K$. $|\bullet|$ indicates a quantity of elements in the set, K is an information block size, $G_N(A)$ is the submatrix obtained by using the rows corresponding to the indexes in the set A in the matrix $G_N$, and $G_N(A)$ is a K×N matrix.

After the mother code length N is determined, a polar code construction process is a selection process of the set A, and polar code performance is determined. The polar code construction process is usually as follows: It is determined, based on the mother code length N that N polarized channels co-exist, where the N polarized channels respectively correspond to N rows in an encoding matrix.

When rate matching is not performed, indexes of first K polarized subchannels with high reliability are used as elements of the set A, and indexes corresponding to remaining (N-K) polarized subchannels are used as elements of the index set $A^c$ of the frozen bits. The set A determines a location of the information bit, and the set $A^c$ determines a location of the frozen bit. A sequence number of a polarized channel is a location index of an information bit or a frozen bit, that is, a location index in $u_1^N$.

When rate matching is performed, particularly when puncturing or shortening is performed, N−M polarized subchannels that need to be punctured or shortened (that is, deleted) usually are first determined. Herein, M is a target code length, that is, a length of a rate-matched bit sequence, and the N−M polarized subchannels selected herein are used to contain frozen bits. In the 5G NR standard, when puncturing is performed, some pre-frozen polarized subchannels are further additionally determined, and are also used to contain frozen bits. Herein, a quantity of the pre-frozen polarized subchannels are defined as P, and P is greater than or equal to 0 (in 5G NR, when shortening is performed, P is 0, and in this case, P may not need to be considered. This is not limited in this application). Then, the K polarized subchannels with high reliability are selected from remaining M−P polarized subchannels based on reliability to contain K information bits. Certainly, M−P−K subchannels with low reliability may alternatively be first selected to contain frozen bits, and remaining K subchannels are used to contain information bits. Reliability of any one of the K polarized subchannels containing the K information bits is higher than reliability of any one of the M−P−K subchannels containing the frozen bits. In this application, a value of P is not limited. Even when puncturing is performed, P may be 0. Even when shortening is performed, P may be greater than 0. This does not affect implementation of the technical solutions in this application. Regardless of an encoder or a decoder, principles and methods for determining that the K subchannels are used to contain the K information bits are consistent. In the 5G NR standard, for selection of N−M polarized subchannels, a solution is to contain a sequence obtained after subblock interleaving (divided into 32 subblocks) in a circular buffer (equivalent to a rate-matched sequence). If puncturing is performed, reading starts from an $(N-M)^{th}$ location in the circular buffer, and bits from a $0^{th}$ location to an $(N-M-1)^{th}$ location are discarded. If shortening is performed, reading starts from a $0^{th}$ location to an $(M-1)^{th}$ location in the circular buffer, and bits from an $M^{th}$ location to an $(N-1)^{th}$ location are discarded. Generally, a reliability ranking sequence whose length is the mother code length N is used to represent a relative reliability relationship between different polarized subchannels. The reliability ranking sequence includes sequence numbers (starting from 0 to N−1) of N polarized subchannels, and the sequence numbers may be arranged in descending order or ascending order of reliability. Without loss of generality, this application uses an example in which the sequence numbers are arranged in ascending order of the reliability.

It should be noted that the relative reliability relationship described herein is based on a specific reliability calculation manner. Different reliability calculation manners may cause a change in the relative reliability relationship between the polarized subchannels. However, methods for selecting polarized subchannels used to contain information bits are the same. In addition to the 5G NR standard, it may also be considered that an information bit is contained by a last punctured or shortened polarized subchannel. In this application, it is not limited that the polarized subchannel containing the information bit needs to be selected according to the 5G NR standard.

In the 5G NR standard, when reliability ranking sequences corresponding to different mother code lengths meet a nesting feature, that is, the mother code length N is less than or equal to a mother code length N', a relative relationship between reliability of polarized subchannels (polarized subchannels 0, . . . , and N−1) in the reliability ranking sequence corresponding to N is consistent with a relative relationship between the reliability of the polarized subchannels (the polarized subchannels 0, . . . , and N−1) in a reliability ranking sequence corresponding to N'. In other words, in the reliability ranking sequence corresponding to N', only numbers of polarized subchannels less than N are retained, and a relative ranking relationship between locations of the numbers of the N polarized subchannels is not changed. In this way, the reliability ranking sequence corresponding to N can be obtained. Therefore, the reliability ranking sequence whose length is N may be referred to as a subsequence of the reliability ranking sequence whose length is N', where N is less than or equal to N'. For example, N'=8, and a reliability ranking sequence 1 is [0, 4, 6, 2, 3, 1, 7, 5]. Correspondingly, if N=4, and a reliability ranking sequence 2 is [0, 2, 3, 1], the sequence 2 is a subsequence of the sequence 1. Therefore, in a specific implementation, reliability ranking sequences of different mother code lengths may be prestored. Alternatively, only a reliability ranking sequence whose length is equal to a maximum mother code length $N_{max}$ may be prestored, and another reliability ranking sequence corresponding to the mother code length N is obtained by retaining only sequence numbers of polarized subchannels less than N in the reliability ranking sequence corresponding to the maximum mother code length. In this way, storage overheads can be reduced. Particularly, a sequence may also be a subsequence of the sequence. Therefore, a largest value of N may be equal to $N_{max}$.

FIG. 1 is a schematic diagram of a structure of a wireless communications network according to an embodiment of the present invention. FIG. 1 is merely an example, and other wireless networks to which the encoding method or apparatus in embodiments of the present application can be applied shall fall within the protection scope of the present invention.

As shown in FIG. 1, the wireless communications network 100 includes a network device 110 and a terminal 112. When the wireless communications network 100 includes a core network 102, the network device 110 may further be connected to the core network 102. The network device 110 may further communicate with an IP network 104 such as the Internet, a private IP network, or another data network. The network device provides services for a terminal within coverage. For example, refer to FIG. 1. The network device 110 provides wireless access for one or more terminals 112 within the coverage of the network device 110. In addition, coverage of network devices, for example, the network device 110 and a network device 120, may have an overlapping area. The network devices may further communicate with each other. For example, the network device 110 may communicate with the network device 120.

The network device may be a device configured to communicate with a terminal device. For example, the network device may be an evolved NodeB (eNB, or eNodeB) in an LTE system, may be a gNB in a 5G network, may be a satellite in satellite communication, a network side device in a future communications system, or the like. Alternatively, the network device may be a relay station, an access point, a vehicle-mounted device, or the like. In a device to device (D2D) communications system, a machine to machine (M2M) communications system, and an Internet of vehicles system, the network device may alternatively be a terminal that functions as a base station.

The terminal may be user equipment (UE), an access terminal, a subscriber unit, a mobile station, a remote station, a remote terminal, a mobile device, a user terminal, a wireless communications device, a user agent, or a user apparatus. The access terminal may be a cellular phone, a cordless phone, a session initiation protocol (SIP) phone, a wireless local loop (WLL) station, a personal digital assistant (PDA), a handheld device having a wireless communications function, a computing device, another processing device connected to a wireless modem, a vehicle-mounted device, a wearable device, or a terminal device in a future communications network.

Based on the architecture of the communications system shown in FIG. 1, in embodiments of this application, the polar code encoding method may be performed by the foregoing network device or terminal. When the network device or the terminal is used as a transmitting end to send data or information, the polar code encoding method may be used. Correspondingly, when the network device or the terminal serves as a receiving end to receive data or information, the network device or the terminal also needs to determine a reliability ranking sequence according to the method described in the present application and then perform decoding. The following describes in detail the polar code encoding method provided in embodiments of this application.

Figure 2:
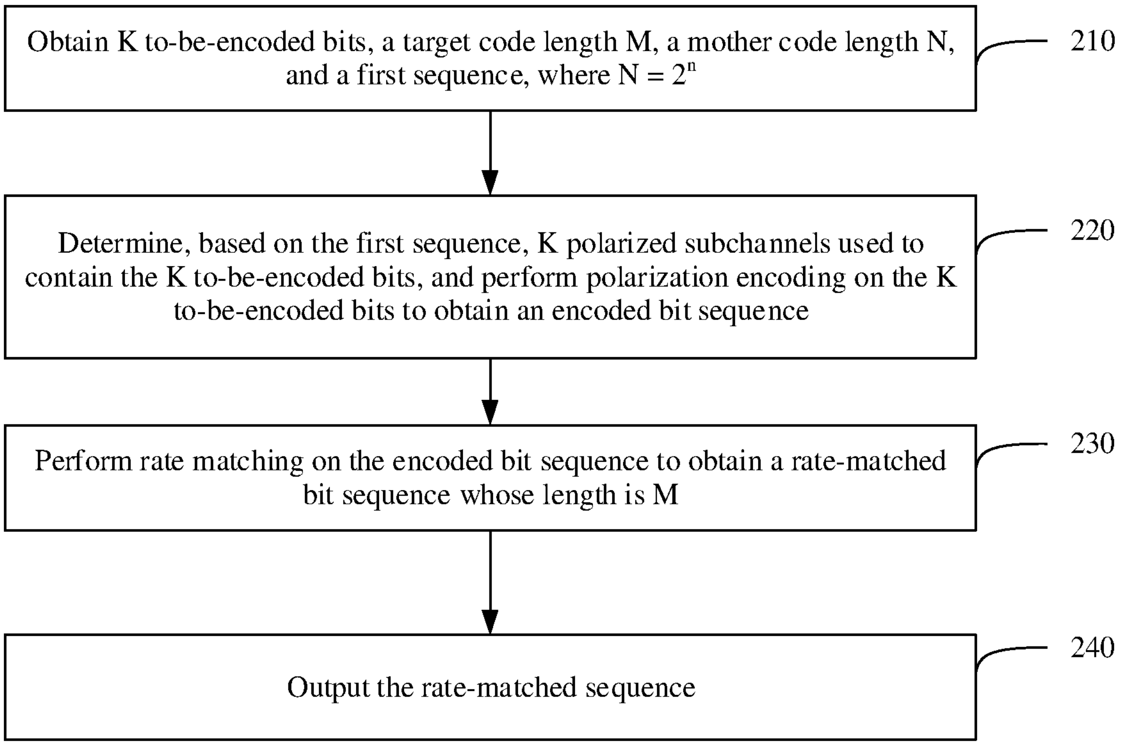
FIG. 2 is a schematic flowchart of a polar code encoding method according to an embodiment of this application.

Based on the architecture of the communications system shown in FIG. 1, as shown in FIG. 2, a specific process of a polar code encoding method provided in an embodiment of this application is as follows.

Operation 210: Obtain K to-be-encoded bits, a target code length M, a mother code length N, and a first sequence, where the first sequence is a reliability ranking sequence and includes sequence numbers of N polarized subchannels, the sequence numbers of the N polarized subchannels are arranged in the first sequence based on reliability of the N polarized subchannels, $N=2^n$, and $K \le N$. In an application scenario of polar code, N may be a value greater than or equal to 32, and M, K, n, and N are positive integers.

The K to-be-encoded bits herein may include only a payload bit, or may include one or more types of other types of non-frozen bits such as a CRC bit and a PC bit in addition to the payload bit.

How to obtain the mother code length N based on factors such as the target code length M and a code rate is specified in the 5G NR system. Because this is not a technical problem to be resolved in this application, the manner of obtaining the mother code length N is directly used, but it is not indicated that only the 5G NR manner can be used to obtain the mother code length N in the solution of this application.

After N is determined, the first sequence whose length is N may be determined. As described above, the first sequence may be prestored, or may be a subsequence whose length is N and that is extracted from a second sequence. The second sequence is a reliability ranking sequence whose length is a maximum mother code length $N_{max}$. The first sequence may be any Q sequence whose length is N in the appendix or a subsequence of any Q sequence whose length is greater than N in the appendix, the second sequence may be any Q sequence whose length is $N_{max}$ in the appendix, and the first sequence is a subsequence of the second sequence, where N is less than or equal to $N_{max}$. $N_{max}$ may be any one of 2048, 4096, 8192, and 16384.

In this application, the appendix provides, based on decoding implementation, rate matching, and code block retransmission, eight groups of polar code reliability ranking sequences applicable to long code block encoding. In terms of reliability, each group of sequences includes reliability ranking sequences (Qx_y sequences, which are generally referred to as Q sequences for ease of understanding, where x is any integer from 1 to 8, and y is any value in 2048, 4096, 8192, and 16384. This also applies to the following statements) that are of lengths of 2048, 4096, 8192, and 16384 and that are arranged in ascending order of the reliability, and corresponding reliability location sequences (Zx_y sequences, which are generally referred to as Z sequences for ease of understanding, where x is any integer from 1 to 8, and y is any value in 2048, 4096, 8192, and 16384. This also applies to the following statements). For the Q sequence, each value in the sequence is a sequence number of a polarized subchannel, and a location of the value in the sequence is a reliability order. A higher location indicates lower reliability. For the Z sequence, each value in the sequence is a reliability order of a location of the value (that is, a polarized subchannel containing the value) in reliability of all polarized subchannels. The Q sequence is in a one-to-one correspondence with the Z sequence. In a simple example, if a Q sequence is [0, 4, 6, 2, 3, 1, 7, 5], a corresponding Z sequence is [0, 5, 3, 4, 1, 7, 2, 6], and both the Q sequence and the Z sequence indicate that a polarized subchannel 5 has highest reliability, a polarized subchannel 7 has second highest reliability, and a polarized subchannel 1 has third highest reliability. The rest may be deduced by analogy. A polarized subchannel 0 has lowest reliability. It should be noted that only reliability ranking sequences whose lengths are greater than 1024 is provided in the appendix. This is because the sequences are backward compatible. To be specific, a reliability ranking sequence whose length is $N_{max}$=1024 and that is specified in the 5G NR protocol is a subsequence of any Qx_y sequence in the appendix. In other words, reliability ranking sequences whose lengths are separately 32, 64, 128, 256, 512, or 1024 and that are used in the 5G NR protocol are subsequences of any Qx_y sequence in the appendix. In an actual implementation, K polarized subchannels are usually selected by using the Q sequence, but may also be selected by using the Z sequence.

Sequence group 1 (Q1_y and Z1_y): A criterion for designing the sequence is to ensure decoding performance and provide a high degree of parallelism for polar decoding, to further reduce a decoding delay.

Sequence group 2 (Q2 y and Z2_y): Currently, in NR, in addition to a repetition rate matching scheme, there are two rate matching schemes based on a code rate: puncturing and shortening. A criterion for designing the sequence is to preferentially optimize performance in the rate matching scheme in which puncturing is performed.

Sequence group 3 (Q3_y and Z3_y): Currently, in NR, in addition to a repetition rate matching scheme, there are two rate matching schemes based on a code rate: puncturing and shortening. A criterion for designing the sequence is to preferentially optimize performance in the rate matching scheme in which shortening is performed.

Sequence group 4 (Q4_y and Z4_y): HARQ needs to be supported in a data channel. Currently, a polar code HARQ solution commonly used in the industry mainly includes IR and IF. A criterion for designing the sequence is to consider both IR (incremental redundancy) HARQ performance and IF (incremental frozen) HARQ performance.

In a high-throughput communications scenario of a data channel, a system defines several fixed MCS formats, and corresponding required mother code lengths are expected to include 2048/4096/8192/16384 and the like. The mother code lengths vary with different subdivided scenarios. Therefore, some reliability ranking sequences are designed for different mother code lengths and modulation schemes in the present invention.

Sequence group 5 (Q5_y and Z5_y): Performance in a 16-QAM modulation scheme is preferentially considered, but it can also be ensured that performance in another modulation scheme can meet a requirement.

Sequence group 6 (Q6_y and Z6_y): Performance in a 64-QAM modulation scheme is preferentially considered, but it can also be ensured that performance in another modulation scheme can meet a requirement.

Sequence group 7 (Q7_y and Z7_y): Performance of a mother code length 2048 is preferentially considered, but it can also be ensured that performance of another mother code length can meet a requirement.

Sequence group 8 (Q8_y and Z8_y): Performance of a mother code length 4096 is preferentially considered, but it can also be ensured that performance of another mother code length can meet a requirement.

Pay attention to the following points:

1. A reliability ranking sequence whose length is 1024 given in the 5G NR protocol is a subsequence of any Q sequence in the appendix. In this way, a data channel encoding requirement is met, and compatibility with an existing protocol is ensured. Correspondingly, reliability ranking sequences that are used in the 5G NR protocol and whose lengths are separately 32, 64, 128, 256, 512, or 1024 are subsequences of any Q sequence in the appendix.

2. Locations of fewer elements in the sequence are exchanged. For example, a sequence number location may be adjusted by a specified magnitude, for example, the specified magnitude is 5. A location of an element whose sequence number is 10 may be adjusted by left and right five locations.

3. Some elements in the sequence are adjusted, but channel sets that are used to transmit T-bit information and that are selected based on the sequence are consistent or similar.

4. The sequence includes N elements from 0 to N−1, and the N elements from 0 to N−1 represent sequence numbers of N polarized subchannels. Actually, the sequence numbers of the N polarized subchannels may alternatively start from 1 and end with N, that is, 1 is added to the sequence numbers in the foregoing sequence. This is also a sequence number form in the foregoing calculation manner. Certainly, a sequence number or an identifier of the polar subchannel may alternatively be represented in another manner. The specific representation manner does not affect a specific location of the polar subchannel in the sequence.

Operation 220: Determine, based on the first sequence, the K polarized subchannels used to contain the K to-be-encoded bits, and perform polarization encoding on the K to-be-encoded bits to obtain an encoded bit sequence.

For a specific encoding operation, refer to the foregoing description. A specific scheme of rate matching may be first determined. When puncturing or shortening is performed, polarized subchannels to be punctured or shortened (that is, deleted) and possible P pre-frozen polarized subchannels (P is greater than or equal to 0) are first determined, and the K polarized subchannels with high reliability are selected from remaining M−P polarized subchannels based on reliability to contain K information bits. When repetition is performed, the K polarized subchannels with high reliability are directly selected from the N polarized subchannels based on reliability to contain the K information bits. A decoder may also determine locations of the K information bits in the same manner.

Operation 230: Perform a rate matching operation on the encoded bit sequence to obtain a rate-matched bit sequence whose length is M.

For a specific rate matching operation, refer to a manner in which block interleaving is first performed and then bits are sequentially fetched in a circular buffer in 5G NR. Alternatively, a specific rate matching operation may be performed by using a preset rate matching sequence. This is not limited herein.

Operation 240: Output the rate-matched sequence.

It should be noted that if a modulation operation is used, the output herein should be a sequence obtained after modulation is performed on a rate-matched bit sequence. The sequence is a symbol sequence. In this case, a length of the sequence may not be M. If modulation is not used, the rate-matched sequence is a rate-matched bit sequence. For ease of understanding, terms "rate-matched sequence" and "rate-matched bit sequence" are not strictly distinguished in this application.

The embodiment shown in FIG. 2 is an operation of a transmitting end, and an operation of a receiving end is similar. After receiving a to-be-decoded information sequence, a receiver (or a receiving apparatus) also needs to use a similar method. A to-be-decoded information sequence including K to-be-decoded bits, a target code length M, and a mother code length N is obtained, a first sequence is determined, K polarized subchannels used to contain the K to-be-decoded bits are determined based on the first sequence, and a decoding operation is performed on the to-be-decoded information sequence to obtain and output a decoding result. A detailed decoding algorithm is not limited herein.

Figure 3:
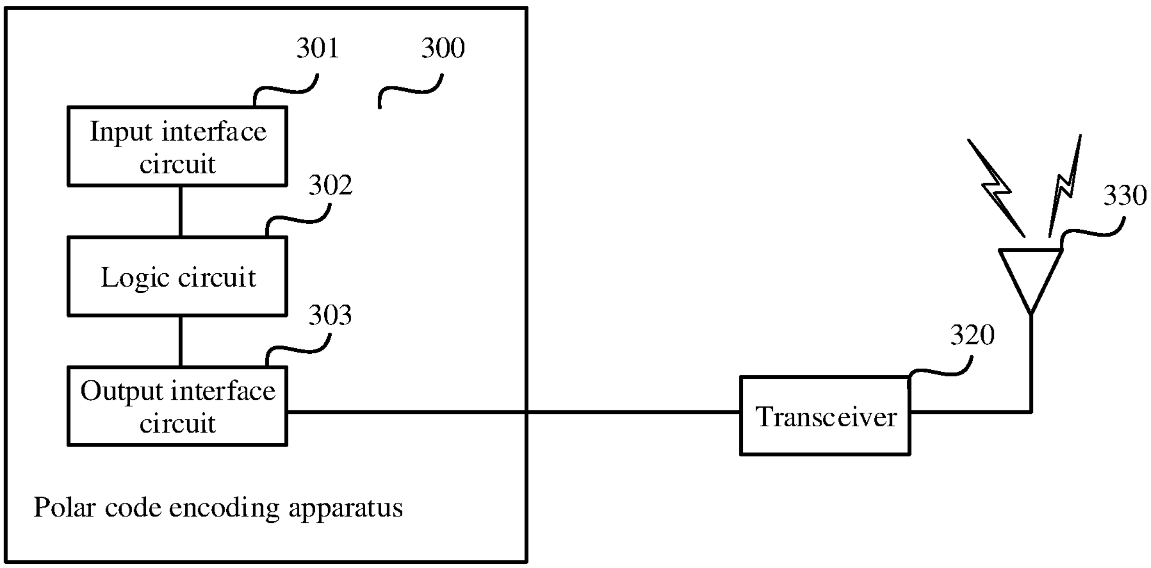
FIG. 3 is a first schematic diagram of a structure of a polar code encoding apparatus according to an embodiment of this application.

As shown in FIG. 3, an embodiment of this application further provides a polar code encoding apparatus 300. Some or all of the polar code encoding method shown in FIG. 3 may be implemented by hardware, or may be implemented by software.

For the polar code encoding apparatus 300, based on a same inventive concept as the polar code encoding method shown in FIG. 2, the polar code encoding apparatus 300 is configured to perform the polar code encoding method shown in FIG. 2. When some or all of the polar code encoding method is implemented by hardware, the polar code encoding apparatus 300 includes: an input interface circuit 301, configured to obtain to-be-encoded bits; a logic circuit 302, configured to perform the polar code encoding method shown in FIG. 2; and an output interface circuit 303, configured to output a rate-matched sequence. Further, the rate-matched sequence is still a modulated sequence, where for details, refer to description in the foregoing method embodiments, and details are not described herein again.

The sequence is a modulated symbol sequence, and is output to a transceiver 320. The transceiver 320 performs corresponding processing (including but not limited to processing such as digital-to-analog conversion and/or frequency conversion) on the modulated sequence, and sends a processed modulated sequence through an antenna 330. Optionally, in a specific implementation, the polar code encoding apparatus 300 may be a chip or an integrated circuit.

Figure 4:
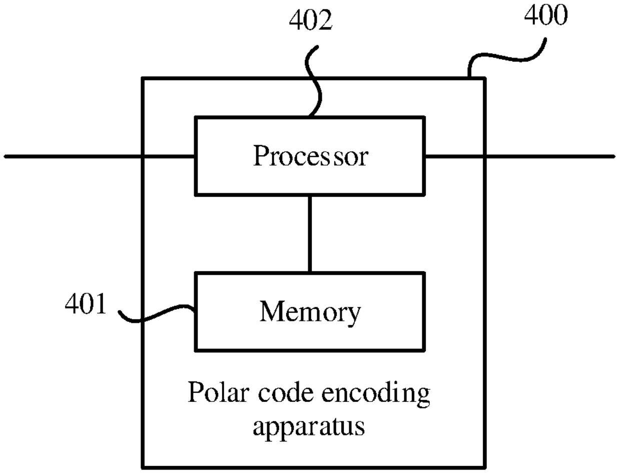
FIG. 4 is a second schematic diagram of a structure of a polar code encoding apparatus according to an embodiment of this application.

Optionally, when some or all of the polar code encoding method in the foregoing embodiment is implemented by software, as shown in FIG. 4, a polar code encoding apparatus 400 includes: a memory 401, configured to store a program; and a processor 402, configured to execute the program stored in the memory 401. When the program is executed, the polar code encoding apparatus 400 can implement the polar code encoding method provided in the foregoing embodiment.

Figure 5:
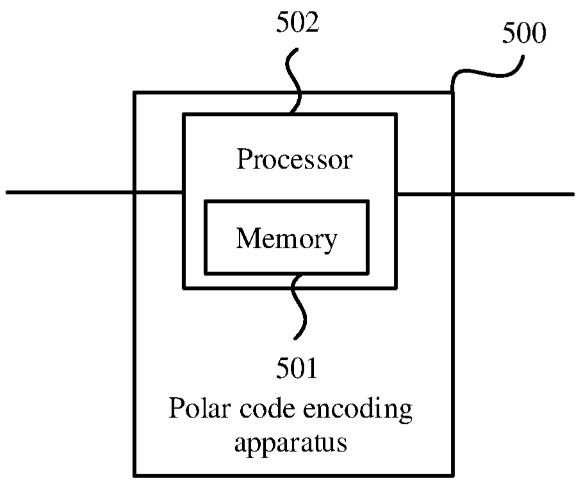
FIG. 5 is a third schematic diagram of a structure of a polar code encoding apparatus according to an embodiment of this application.

Optionally, the memory 401 may be a physically independent unit. Alternatively, as shown in FIG. 5, a memory 501 and a processor 502 may be integrated together.

Optionally, when some or all of the encoding method in the foregoing embodiment is implemented by software, the polar code encoding apparatus 400 may alternatively include only the processor 402. The memory 401 configured to store the program is located outside the polar code encoding apparatus 400. The processor 402 is connected to the memory 401 through a circuit/cable, and is configured to read and execute the program stored in the memory 401.

Figure 6:
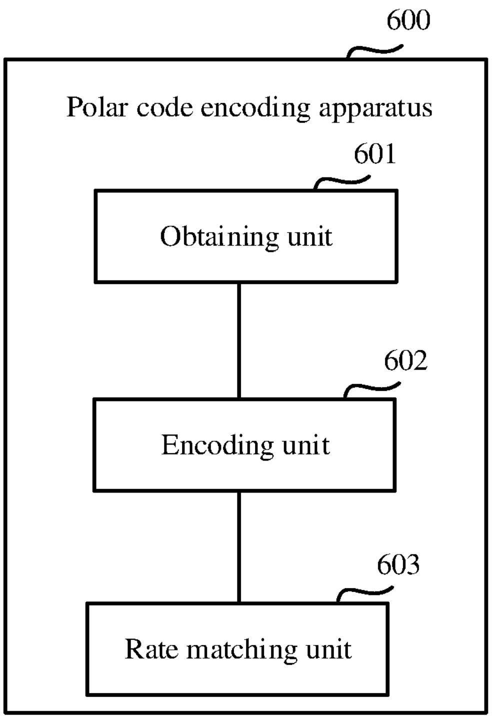
FIG. 6 is a fourth schematic diagram of a structure of a polar code encoding apparatus according to an embodiment of this application.

Based on the polar code encoding method shown in FIG. 2, as shown in FIG. 6, an embodiment of this application further provides a polar code encoding apparatus 600. The polar code encoding apparatus 600 is configured to perform the polar code encoding method shown in FIG. 2. The polar code encoding apparatus 600 includes:

- an obtaining unit 601, configured to obtain K to-be-encoded bits;
- an encoding unit 602, configured to: determine a mother code length N and a first sequence (a reliability ranking sequence whose length is N), and perform polar encoding on the K to-be-encoded bits based on the mother code length N to obtain an encoded bit sequence, where for a specific encoding process, refer to operation 220 in the foregoing embodiment; and
- a rate matching unit 603, configured to perform a rate matching operation on the encoded bit sequence to obtain a rate-matched bit sequence whose length is M (or a sequence obtained through further modulation on the bit sequence, which is also referred to as a rate-matched sequence), where for a specific rate matching method, refer to operation 230 in the foregoing embodiment.

Corresponding to the transmitting end, an apparatus at the receiving end may also be designed similarly.

Figure 7:
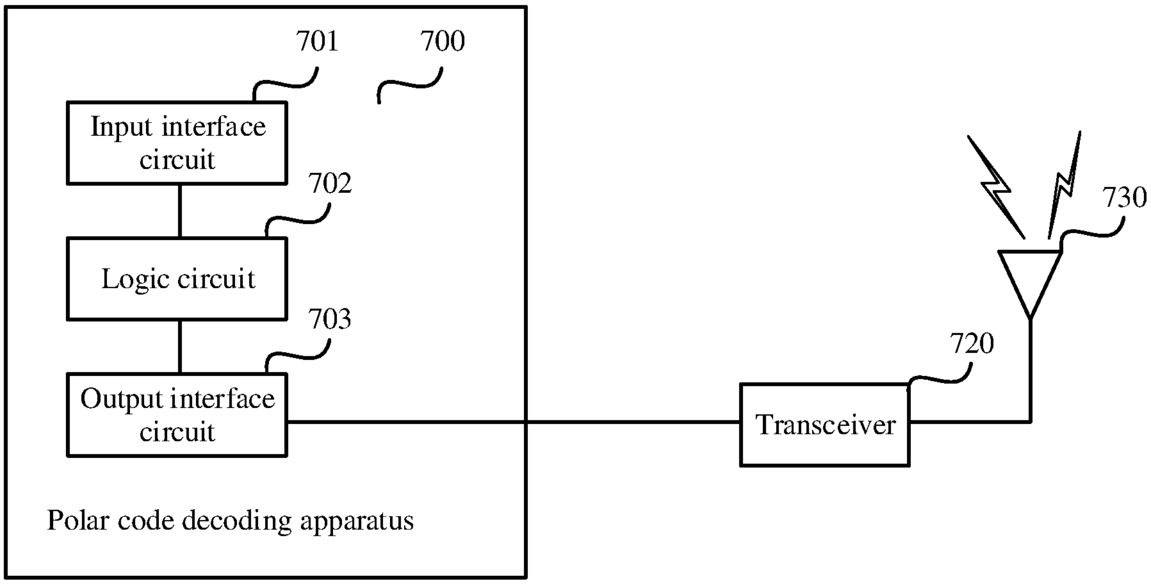
FIG. 7 is a first schematic diagram of a structure of a polar code decoding apparatus according to an embodiment of this application.

As shown in FIG. 7, a polar code decoding apparatus 700 includes: an input interface circuit 701, configured to obtain a to-be-decoded information sequence; a logic circuit 702, configured to perform the foregoing polar code decoding method to obtain a decoded information bit; and an output interface circuit 703, configured to output decoded information. The polar code decoding apparatus 700 may further include a transceiver 720 that obtains the to-be-decoded information sequence through an antenna 730. In a specific implementation, the polar code decoding apparatus 700 may be a chip or an integrated circuit.

Figure 8:
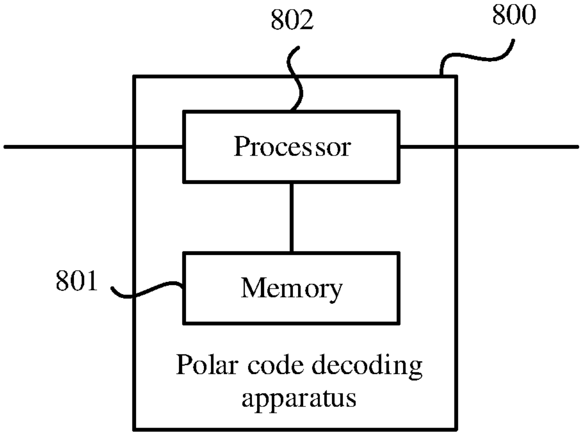
FIG. 8 is a second schematic diagram of a structure of a polar code decoding apparatus according to an embodiment of this application.

Optionally, when some or all of the polar code decoding method in the foregoing embodiment is implemented by software, as shown in FIG. 8, a polar code decoding apparatus 800 includes: a memory 801, configured to store a program; and a processor 802, configured to execute the program stored in the memory 801. When the program is executed, the polar code decoding apparatus 800 can implement the polar code decoding method provided in the foregoing embodiment.

Figure 9:
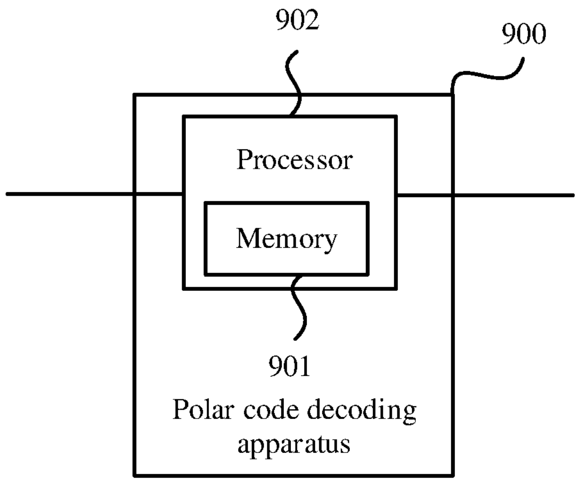
FIG. 9 is a third schematic diagram of a structure of a polar code decoding apparatus according to an embodiment of this application.

Optionally, the memory 801 may be a physically independent unit. Alternatively, as shown in FIG. 9, a memory 901 and a processor 902 may be integrated together.

Optionally, when some or all of the decoding method in the foregoing embodiment is implemented by software, the polar code decoding apparatus 800 may alternatively include only the processor 802. The memory 801 configured to store the program is located outside the polar code decoding apparatus 800. The processor 802 is connected to the memory 801 through a circuit/cable, and is configured to read and execute the program stored in the memory 801.

The processor 402 and/or the processor 802 may be a central processing unit (CPU), a network processor (NP), or a combination of the CPU and the NP.

The processor 402 and/or the processor 802 may further include a hardware chip. The hardware chip may be an application-specific integrated circuit (ASIC), a programmable logic device (PLD), or a combination thereof. The PLD may be a complex programmable logic device (CPLD), a field-programmable gate array (FPGA), generic array logic (GAL), or any combination thereof.

The memory in the foregoing embodiments may include a volatile memory, for example, a random-access memory (RAM). Alternatively, the memory may include a non-volatile memory, such as a flash memory, a hard disk drive (HDD), or a solid-state drive (SSD). Alternatively, the memory may include a combination of the foregoing types of memories.

Figure 10:
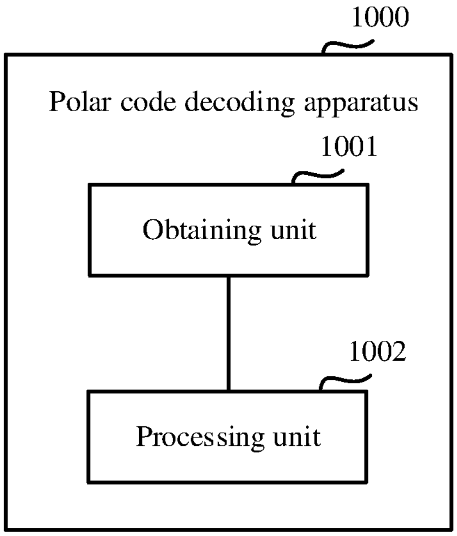
FIG. 10 is a fourth schematic diagram of a structure of a polar code decoding apparatus according to an embodiment of this application.

Based on the foregoing polar code decoding method, as shown in FIG. 10, an embodiment of this application further provides a polar code decoding apparatus 1000. The polar code decoding apparatus 1000 is configured to perform the foregoing polar code decoding method. The polar code decoding apparatus 1000 includes:

- an obtaining unit 1001, configured to obtain a to-be-decoded information sequence; and
- a processing unit 1002, configured to: determine a first sequence of a mother code length N (a reliability ranking sequence whose length is N), and perform a decoding operation on the to-be-decoded information sequence to obtain and output a decoding result.

An embodiment of this application further provides a computer storage medium that stores computer program instructions. When the computer program instructions are executed by a computer, the foregoing polar code encoding method or polar code decoding method is performed.

An embodiment of this application further provides a computer program product including instructions. When the computer program product runs on a computer, the foregoing polar code encoding method or polar code decoding method is performed.

A person skilled in the art should understand that embodiments of this application may be provided as a method, a system, or a computer program product. Therefore, this application may use a form of hardware only embodiments, software only embodiments, or embodiments with a combination of software and hardware. In addition, this application may use a form of a computer program product that is implemented on one or more computer-usable storage media (including but not limited to a disk memory, a CD-ROM, an optical memory, and the like) that include computer-usable program code.

This application is described with reference to the flowcharts and/or block diagrams of the method, the device (system), and the computer program product according to embodiments of this application. It should be understood that computer program instructions may be used to implement each process and/or each block in the flowcharts and/or the block diagrams and a combination of a process and/or a block in the flowcharts and/or the block diagrams. The computer program instructions may be provided for a general-purpose computer, a dedicated computer, an embedded processor, or a processor of another programmable data processing device to generate a machine, so that the instructions executed by a computer or a processor of another programmable data processing device generate an apparatus for implementing a specific function in one or more processes in the flowcharts and/or in one or more blocks in the block diagrams.

The computer program instructions may be stored in a computer-readable memory that can instruct the computer or another programmable data processing device to work in a specific manner, so that the instructions stored in the computer-readable memory generate an artifact that includes an instruction apparatus. The instruction apparatus implements a specific function in one or more processes in the flowcharts and/or in one or more blocks in the block diagrams.

The computer program instructions may alternatively be loaded onto a computer or another programmable data processing device, so that a series of operations and steps are performed on the computer or the another programmable device. In this way, computer-implemented processing is generated. Therefore, the instructions executed on the computer or the another programmable device provide steps for implementing a specific function in one or more processes in the flowcharts and/or in one or more blocks in the block diagrams.

Although some example embodiments of this application have been described, a person skilled in the art can make changes and modifications to these embodiments once the person skilled in the art learns of the basic inventive concept. Therefore, the following claims are intended to be construed as to cover the embodiments and all changes and modifications falling within the scope of this application.

Clearly, a person skilled in the art can make various modifications and variations to embodiments of this application without departing from the scope of embodiments of this application. This application is intended to cover these modifications and variations provided that they fall within the scope of protection defined by the following claims and their equivalent technologies.

APPENDIX

Sequence Group 1: Q1_2048

[0,1,2,4,8,16,32,3,5,64,9,6,17,10,18,128,12,33,65,20,
256,34,24,36,7,129,66,512,11,40,6 8,130,19,13,48,14,72,
257,21,132,35,258,26,513,80,37,25,22,136,260,264,38,514,
96,1024,1025,67, 41,144,28,69,42,516,49,74,272,160,520,
288,528,192,544,70,44,131,81,50,73,15,320,133,52,23,134,
384,76,1026,1028,137,82,56,27,97,39,259,84,138,145,261,
29,43,98,515,88,1032,1040,140,30,146, 71,262,265,161,
576,45,100,640,51,148,46,1056,1027,75,266,273,517,104,
162,53,193,1029,1088,1 52,77,1033,1030,164,768,1041,
1034,268,274,518,54,83,57,521,112,135,78,289,194,85,
276,522,58, 168,139,99,86,60,280,89,290,529,524,196,141,
101,147,176,142,530,321,31,200,90,545,292,322,53 2,263,
149,102,105,304,296,163,92,47,267,385,546,324,208,386,
1042,1152,150,153,165,106,55,32 8,536,577,548,113,154,
79,269,108,578,224,1036,1057,166,519,552,195,1089,
1044,270,641,523,27 5,580,291,59,169,560,114,277,156,
1280,1058,87,197,116,170,61,531,525,642,281,278,526,
177,29 3,388,1048,1060,91,584,769,198,1031,1153,172,
120,201,336,62,282,1090,1536,143,103,178,294,9 3,644,
202,592,323,392,297,770,107,180,1035,1064,151,209,284,
648,94,204,298,400,608,352,325, 533,155,210,305,547,
300,109,1092,1154,1043,1037,184,534,537,115,167,225,
326,306,772,157,65 6,329,1072,1038,110,117,212,171,776,
330,226,549,1096,1281,538,387,308,216,1045,1156,416,
271, 279,158,337,550,672,118,332,579,540,389,173,121,
553,199,784,179,228,338,312,704,1059,1282, 390,174,554,
581,393,283,122,448,353,561,203,63,340,394,527,582,556,
181,1050,1537,1104,1061, 1049,1046,295,285,232,124,
205,182,643,562,286,585,1160,1284,299,354,211,401,
1288,1062,1538, 1120,185,396,344,586,1091,1065,1168,
1052,645,593,1093,1066,535,240,206,95,327,564,1540,10
73,800,402,356,307,301,417,213,568,832,588,186,646,404,
227,896,594,1098,1296,1184,1544,131 2,1552,418,302,
649,771,1216,1568,360,539,111,331,214,309,188,449,
1094,1068,1155,1105,217,40 8,609,596,551,650,229,159,
420,310,541,773,610,657,333,119,600,339,218,368,652,
230,391,313,1 074,1097,450,542,1039,1344,334,233,555,
774,175,123,1157,1076,658,612,341,777,220,314,424,3
95,673,583,1047,1158,355,287,183,234,125,557,660,616,
1408,1100,342,316,241,778,1161,1106,56 3,345,452,397,
403,207,1080,1051,674,558,785,432,357,187,1121,1063,
1283,1108,236,664,624,58 7,780,705,126,242,565,398,
1162,1169,346,456,1285,1053,358,405,303,569,244,595,
189,566,676,3 61,1067,1122,706,589,215,786,1539,1112,
1164,1054,647,348,419,406,464,680,801,362,590,409,57
0,788,597,572,219,311,1170,1095,1286,1289,708,598,601,
651,1185,1600,1069,1124,421,792,802,6 11,602,410,1664,
1075,231,688,1172,1070,653,248,369,190,364,654,659,
335,1099,1290,480,315,2 21,370,1297,1541,1128,1186,
613,422,425,451,614,543,235,412,343,372,1077,1217,775,
317,222,4 26,453,237,559,833,1176,1101,1188,1792,1292,
1298,804,712,834,661,808,779,617,604,433,720,81 6,836,
347,897,1542,1078,1107,1081,243,662,1545,1136,454,318,
675,618,898,781,376,428,665,73 6,567,840,625,238,1159,
1102,1313,1218,1109,1300,1546,1082,359,457,399,787,
591,678,434,677,1 192,1163,1123,1110,349,245,458,666,
620,363,127,191,782,407,436,626,1084,1304,1113,1314,
155 3,1548,571,465,1220,1165,681,246,707,350,1125,
1171,1200,1166,599,668,790,460,1554,1345,105 5,1224,
249,682,1114,1569,573,411,803,789,709,365,440,628,689,
374,423,466,793,250,371,481,13 16,1346,1556,1287,1173,
1126,1129,1328,574,413,603,366,468,655,900,805,1320,
1187,1116,1071, 1291,1409,1570,1348,615,684,710,429,
1232,1410,794,252,373,605,848,690,1174,1177,713,632,48
2,806,427,904,414,223,1189,1130,663,692,835,619,1079,
1352,1560,1601,472,455,796,809,1572,11 37,1178,1103,
714,721,1293,1132,837,716,864,810,606,912,722,696,
1602,1248,1190,1543,377,435, 817,319,621,812,484,430,
838,667,1576,1219,1294,1665,1547,1299,488,239,378,459,
622,627,1604, 1315,1083,1193,437,380,818,461,496,669,
679,724,841,629,1584,1138,1301,1180,1111,1221,351,4
67,438,737,251,462,442,441,1140,1194,1085,1555,1549,
1666,1305,1302,1550,1201,469,247,683,8 42,1317,1412,
738,899,670,783,849,820,728,928,791,367,901,630,1115,
1608,685,844,1793,1222,6 33,711,1196,1144,1225,1360,
253,691,1086,1306,1167,1127,824,902,1202,1318,1117,
1668,686,740, 850,375,444,470,483,415,1226,1616,1347,
1416,485,905,1321,1794,795,473,1131,1204,1175,1233, 1308,1672,1118,1228,634,744,852,960,1322,1424,1632,1376,1349,1557,1179,1234,865,693,1329, 1571,1324,1133,1208,1558,1561,1139,797,906,715,807,1191,1249,1350,1330,474,636,694,254,717, 575,913,798,1796,1181,1680,1353,811,379,697,431,607,489,866,723,486,908,1134,1141,718,813, 476,856,839,725,1236,1195,1800,1354,698,914,752,868,819,814,439,929,1250,1573,490,623,671, 739,916,463,843,381,497,930,1562,1411,1332,1240,1440,1295,1303,1182,1361,1574,1696,1142,13 56,1603,1564,1413,1197,1145,1577,1223,821,726,1808,1203,1252,1362,1336,1728,961,872,1414, 1198,492,631,1578,1605,729,700,443,741,1417,1307,1146,1472,1377,1585,1227,1087,845,920,38 2,822,1364,1418,1551,1606,1580,1205,1319,1309,1256,1148,851,730,498,880,742,445,471,635,12 29,1206,1667,1586,1310,1609,932,687,1323,1378,903,825,500,846,745,826,1235,1425,1209,1420, 732,446,962,936,475,853,1368,1610,867,637,907,487,1669,1617,1559,1264,695,746,1230,1119,82 8,753,1351,1588,854,857,1824,1426,1380,1331,1325,1441,504,799,255,964,1237,1592,1856,1612, 909,719,1210,1670,1428,1251,1920,1618,477,915,638,748,1442,1326,1673,1795,944,869,491,699, 754,858,1384,1563,478,968,383,910,815,976,1135,1355,870,917,1238,1333,727,493,873,701,1212, 1473,1241,1432,1633,1620,1575,1674,1253,1183,1444,1334,931,756,1565,1797,860,499,731,823, 1634,1681,1357,1143,1624,1363,1242,1392,1676,1254,922,874,1415,1337,918,502,1474,1566,933,743,760,881,1358,1257,1579,1798,1199,1147,1682,1636,494,702,921,501,1365,1801,1244,1338,1 448,1419,1697,1607,1379,1311,1207,1258,1149,1581,1684,1640,1366,1340,1265,1802,1587,1369, 1476,1421,876,847,992,447,1427,1231,733,827,1698,1582,1809,1456,934,882,937,963,1381,1211, 1260,1688,747,505,855,924,734,829,965,938,1648,1611,1804,1729,884,506,749,945,1150,1266,966,755,859,940,1589,1422,1370,1480,1382,1429,1327,1593,1268,1619,830,911,871,639,888,479,12 13,1590,946,750,969,508,861,757,970,919,875,862,758,948,1700,1385,1730,1613,1239,1810,1671, 1372,1443,1430,1488,1704,1825,1386,1614,1433,1594,1812,1621,1596,1243,1335,977,923,1732, 1622,1625,1675,1445,1816,1826,1635,1626,1434,1255,1712,972,761,1677,1272,1393,1214,1388,1 678,1683,1359,1504,1339,1245,1394,877,952,495,703,935,978,883,762,503,925,878,735,1637,144 6,1449,1475,993,885,1638,1567,1259,1436,1367,1396,1799,1341,1246,1450,1477,1261,1583,1857, 1828,1736,1858,1685,1832,1803,939,994,1641,1628,1457,1744,980,926,1840,1860,1371,1921,12 67,1686,1478,1342,1699,1642,764,941,1922,1805,967,886,1400,1452,831,947,1689,1760,1591,18 64,507,889,1649,1262,1383,1481,1423,1811,984,751,1615,1702,1458,1701,1373,1269,1482,1690, 1644,1387,1151,1215,1806,1431,1460,1650,1595,1489,942,996,1705,1270,971,890,1731,1374,162 3,1692,1814,1484,1273,1706,509,949,1597,1435,973,1000,892,950,1827,1813,1733,1389,1464,16 52,1713,1398,1447,1490,863,759,1817,1274,1395,1505,1598,1437,1008,510,1627,1390,1492,1679, 1924,1829,979,953,1639,1708,1734,1453,1818,1276,763,974,1397,1629,1872,1714,954,879,981,9 82,1737,1656,1506,1830,1451,1928,1438,1247,1687,1716,927,995,1859,1643,1496,1479,1820,183 3,1738,1745,765,956,1861,1740,1888,1834,887,985,1630,1936,1746,1720,1401,1459,1841,1343,9 97,986,1645,1836,1508,1454,1862,1691,1512,1263,1402,1483,1646,1651,943,891,1461,1404,998, 766,1842,1485,1520,1693,1703,1748,511,988,1865,1653,1375,1491,1462,1761,1275,1486,1466,14 65,1001,951,1493,1271,1707,1866,1762,1923,1002,893,1694,1807,975,894,1873,1844,1752,1952, 1815,1391,1925,1654,1709,1868,1657,1735,1009,955,1277,1715,1848,1926,1710,1764,1874,1399, 1468,1494,1004,1010,1507,1439,1509,1929,1819,1497,1658,1768,1876,1984,957,983,1889,1717,1 821,1930,1739,1831,1498,1660,958,987,1718,1278,1741,1599,1012,999,1937,1822,1835,1403,172 1,1455,1016,767,1631,1513,1890,1747,1510,1932,1742,1837,1500,1880,1863,1749,1722,1938,989, 1003,1776,1892,1843,1838,1463,1953,1514,1647,1695,1763,1940,1487,1867,1405,990,1005,1521,1954,1845,1750,1985,1896,1516,1655,1753,1724,1467,1765,1869,1944,1406,1846,1875,1754,152 2,1904,1766,1469,959,1011,1495,1659,1956,1711,1927,1849,1013,895,1524,1870,1769,1850,1756, 1470,1986,1960,1499,1877,1891,1661,1931,1511,1719,1770,1852,1777,1878,1881,1528,1823,127 9,1988,1933,1743,1501,1939,1006,1014,1662,1772,1968,1893,1515,1723,1778,1882,1502,1992,1017,1018,1407,1934,1839,2000,1894,1941,1751,1517,1897,1725,1955,1780,1884,1523,1755,1847,1 946,1898,1942,1526,1957,1767,1784,1905,1518,1726,1945,1525,1900,1871,991,1020,2016,1471,1 757,1851,1958,1906,1961,1987,1771,1529,1879,1948,1758,1853,1007,1015,1989,1962,1908,1530, 1773,1969,1990,1779,1883,1964,1854,1935,1895,1663,1912,1503,1019,1021,1970,1774,1993,1532,1885,1781,1994,1943,1899,1886,1782,1972,2001,1947,1996,1785,1901,1976,1519,1727,1959,20 02,1907,1786,1527,1949,1902,1759,2017,1909,1963,2018,2004,1950,1788,1965,1991,1910,1855,1 971,1022,1023,1531,1913,2008,1775,1966,2020,1995,1914,1533,1973,1997,2024,1916,1974,1887, 1783,2032,1534,2003,1977,1787,1998,1978,1903,2005,2006,1951,2019,1789,1980,1911,2009,2021,2010,1967,1915,2022,1790,153 5,2012,2025,1975,2026,1917,1999,1918,2033,1979,2028,2034,19 81,2007,1982,2011,2036,2023,2040,1791,2013,2027,2014,2029,1983,2035,2037,1919,2030,2038,2 041,2042,2015,2044,2031,2039,2043,2045,2046,2047]

Sequence Group 1: Z1_2048

[0,1,2,7,3,8,11,24,4,10,13,28,16,33,35,78,5,12,14,32,19,38,47,82,22,46,42,91,59,99,107, 174,6,17,21,40,23,45,51,93,29,57,61,100,73,114,119,189,34,63,76,117,81,128,143,202,90,145,155, 228,160,240,262,369,9,18,26,56,30,60,72,109,36,77,64,122,85,133,149,209,44,75,89,144,95,152,159,236,103,162,176,252,188,270,286,417,53,92,101,158,115,168,183,267,126,184,201,278,211,29 9,318,452,147,207,231,307,238,319,341,477,259,347,364,497,385,516,552,728,15,25,31,74,39,80, 83,148,48,88,96,157,106,167,171,266,58,97,108,169,118,182,198,282,132,199,208,294,233,313,33 7,469,66,112,127,187,136,200,216,308,156,229,239,321,258,346,359,496,170,247,268,351,279,375,387,514,304,402,432,541,456,568,625,729,70,129,151,219,166,237,255,349,175,260,272,368,28 7,386,416,533,194,283,295,396,320,428,454,576,331,462,480,596,504,634,654,825,213,309,324,4 35,352,468,483,618,384,493,515,646,546,657,701,877,415,524,553,684,566,723,745,921,623,760, 777,906,811,950,1021,1196,20,37,41,94,49,98,110,181,50,111,123,190,140,210,222,335,65,124,141,225,153,232,245,336,161,244,263,363,284,383,390,513,68,150,163,227,178,248,269,382,186,27 6,288,394,298,426,445,564,185,296,311,425,330,455,471,597,354,485,505,633,523,653,689,863,7 9,173,179,274,193,292,310,418,203,315,323,453,342,476,492,629,261,338,353,479,370,502,522,6 48,404,529,558,678,583,722,747,902,291,366,395,512,424,540,562,710,450,571,589,727,626,769,791,935,481,624,635,778,649,812,773,965,694,860,878,1031,887,1069,1122,1228,84,191,195,329, 249,345,358,484,275,362,371,507,403,531,555,712,289,397,423,532,434,563,585,731,463,591,615, 765,647,789,824,969,334,427,444,584,470,610,641,774,506,642,655,822,695,807,867,1033,539,6 74,716,861,732,886,904,1058,770,909,908, 1110,966,1139,1163,1323,365,457,488,643,530,656,688, 837,559,711,724,879,755,889,907,1067,586,741,775,903, 792,920,967,1140,836,979,1018,1166,10 44,1210,1226, 1377,632,779,820,968,866,974,1038,1173,876,1035,1062, 1220,1104,1239,1292,144 4,890,1070,1136,1259,1154, 1295,1277,1450,1194,1341,1353,1512,1383,1554,1581, 1668,27,43,52, 102,62,125,142,217,67,146,154,224,165, 242,246,372,69,164,172,241,180,293,305,414,204,306,32 8,451,344,472,489,645,71,177,192,297,206,325,339,466, 218,348,360,494,374,517,537,658,230,36 7,389,528,419, 554,569,698,429,565,592,740,595,764,788,1023,113,205, 212,343,226,361,373,509, 253,391,405,549,431,575,590, 714,273,411,437,567,465,594,603,752,478,604,614,790, 673,813,852, 1034,290,464,474,613,501,640,644,804,519, 672,691,831,726,864,880,1063,548,700,733,881,771, 895, 937,1105,819,944,988,1141,1019,1171,1212,1375,116,223, 243,388,271,410,433,582,285,446,4 67,605,482,622,627, 793,314,475,500,628,518,669,685,828,547,696,725,869, 753,891,928,1064,340, 508,536,690,570,717,715,892,587, 744,761,922,805,940,962,1149,619,772,815,951,829,1001, 1020, 1178,855,1032,1052,1221,1109,1241,1293,1445,355, 551,574,746,602,768,806,945,667,818,844,1 012,849,1022, 1042,1203,675,845,854,1037,893,1047,1093,1238,932, 1108,1135,1260,1162,1326,13 44,1453,697,905,926,1065, 963,1111,1138,1281,989,1156,1179,1340,1213,1354,1381, 1521,1054,11 83,1222,1359,1255,1385,1390,1573,1282, 1429,1449,1596,1498,1626,1661,1755,137,254,277,447, 312,473,495,652,322,503,525,671,550,693,730,929,350, 538,577,713,593,767,754,934,611,776,810, 978,838,1010, 1025,1195,422,588,612,766,666,795,821,1013,670,839, 851,1030,865,1043,1057,12 30,676,862,888,1056,931, 1092,1123,1261,956,1153,1157,1327,1182,1345,1372, 1506,430,659,668, 830,677,848,868,1046,699,894,923, 1068,941,1120,1155,1321,814,930,964,1134,990,1167, 1186,13 42,1045,1187,1223,1360,1258,1384,1389,1572, 850,1000,1036,1170,1055,1219,1234,1374,1101,12 40,1273,1388,1320,1442,1452,1603,1137,1283,1333,1448, 1352,1459,1503,1632,1376,1513,1545,1 657,1560,1689, 1693,1819,436,679,692,927,794,936,957,1152,823,975, 1011,1172,1039,1202,1229, 1373,853,1024,1053,1211, 1066,1235,1276,1387,1121,1294,1272,1415,1343,1451, 1487,1616,933,1 059,1071,1254,1148,1280,1332,1446, 1165,1334,1347,1480,1361,1499,1540,1656,1218,1355, 1380, 1507,1391,1555,1561,1681,1443,1589,1602,1707, 1627,1730,1740,1810,991,1100,1164,1335,1197, 1346, 1358,1502,1227,1382,1386,1544,1428,1558,1597,1692, 1231,1414,1447,1588,1486,1604,160 5,1731,1520,1633, 1643,1741,1669,1770,1786,1892,1322,1458,1481,1617, 1541,1642,1660,1747,15 59,1680,1688,1771,1718,1787, 1848,1908,1580,1706,1719,1811,1746,1818,1849,1909, 1754,1860,1 861,1926,1893,1927,1968,1969,54,55,86,121, 87,130,135,256,104,134,139,280,214,303,317,490,10 5,138,196,302,221,332,381,510,250,380,376,535,409,561, 581,758,120,215,235,356,251,379,399,5 43,281,407,413, 572,459,608,621,799,316,421,486,617,499,650,681,832, 534,683,709,884,734,912, 952,1119,131,220,264,406,300, 412,458,599,326,487,438,630,521,661,703,843,378,461, 527,682,54 5,706,721,900,579,736,762,938,798,960,986, 1181,401,542,573,720,609,748,785,955,638,786,827, 980, 847,1005,1040,1232,687,841,897,1009,910,1041,1083, 1265,947,1089,1114,1289,1133,1308,13 56,1532,197,257, 301,460,333,498,511,702,392,526,556,719,580,743,751, 954,408,557,598,749,620, 784,816,982,660,817,842,998, 899,1027,1079,1251,440,606,639,797,662,826,858,1014, 718,885,91 1,1049,946,1088,1103,1288,750,919,958,1095, 981,1129,1143,1306,1006,1160,1204,1337,1242,137 8,1433,1533,448,651,705,871,742,901,943,1091,759,948, 970,1118,987,1142,1180,1325,808,983,99 9,1158,1048, 1198,1236,1396,1075,1244,1268,1412,1298,1440,1468, 1613,857,1015,1060,1207,109 6,1250,1271,1426,1132, 1285,1307,1462,1338,1471,1515,1651,1177,1314,1357, 1492,1370,1527,15 43,1683,1431,1552,1575,1676,1595, 1708,1743,1842,234,327,357,544,393,560,600,783,398, 601,63 1,800,664,846,872,1077,439,636,665,875,707,898, 917,1078,735,916,953,1113,984,1131,1146,1305, 442,704, 737,883,780,924,959,1130,796,976,992,1150,1004,1192, 1215,1368,787,1002,1017,1191,1 074,1237,1253,1413, 1098,1275,1299,1439,1313,1467,1495,1641,491,757,781, 972,803,996,1016,1 184,833,1029,1051,1233,1084,1264, 1284,1437,949,1080,1097,1267,1124,1296,1312,1464, 1168,13 17,1364,1490,1399,1526,1547,1672,995,1116, 1151,1304,1190,1336,1366,1516,1224,1393,1405,15 31,1434,1565,1583,1699,1269,1432,1441,1576,1465,1598, 1569,1715,1504,1638,1652,1751,1659,1 785,1802,1862, 520,801,809,1073,925,1087,1102,1274,973,1112,1125, 1301,1161,1319,1363,1518,9 93,1159,1189,1324,1206, 1367,1401,1535,1245,1407,1425,1557,1463,1579,1612, 1721,1076,1193,1 214,1400,1252,1420,1455,1570,1300, 1456,1469,1610,1505,1593,1647,1753,1331,1484,1524, 1639, 1536,1658,1674,1776,1566,1679,1678,1798,1716, 1809,1825,1895,1115,1243,1278,1457,1318,147 0,1494, 1621,1365,1517,1528,1653,1551,1663,1677,1783,1402, 1539,1571,1673,1584,1682,1717,18 12,1620,1725,1738, 1828,1764,1846,1858,1925,1438,1577,1608,1720,1646, 1722,1760,1833,1650,1 757,1778,1854,1794,1869,1886, 1946,1664,1788,1806,1875,1820,1889,1881,1952,1840, 1903,1913, 1970,1931,1978,1987,2008,265,377,400,578, 420,637,680,859,441,686,708,874,739,914,918,1126, 443, 738,756,913,782,997,1007,1176,834,1008,1072,1225,1086, 1256,1279,1461,449,763,802,1003, 840,1061,1081,1248, 870,1090,1106,1286,1128,1309,1329,1472,896,1117,1145, 1316,1185,1362,13 79,1510,1199,1369,1408,1538,1411, 1556,1578,1745,607,835,856,1085,882,1107,1127,1303, 939,11 47,1169,1349,1201,1395,1406,1522,971,1175,1209, 1371,1247,1410,1417,1548,1266,1418,1424,15 82,1483, 1599,1634,1756,994,1246,1262,1423,1291,1454,1460, 1590,1311,1482,1497,1619,1530,16 44,1654,1779,1348, 1514,1537,1655,1567,1671,1701,1795,1607,1704,1726, 1813,1739,1831,1850,1 923,616,873,915,1144,961,1174, 1205,1398,985,1216,1249,1419,1270,1430,1435,1585, 1028,1263, 1290,1436,1310,1477,1493,1614,1339,1508, 1529,1649,1549,1665,1690,1780,1082,1302,1328,149 6,1392,1525,1523,1666,1403,1542,1553,1684,1591,1702, 1712,1815,1427,1568,1601,1709,1615,17 33,1742,1834, 1637,1752,1768,1855,1797,1871,1887,1947,1099,1351, 1394,1546,1416,1564,1592,1 705,1475,1606,1624,1736, 1629,1744,1762,1845,1485,1625,1636,1759,1667,1767, 1791,1868,1696, 1796,1805,1876,1824,1896,1906,1955, 1509,1675,1686,1781,1713,1799,1808,1883,1727,1822,183 5,1902,1851,1914,1929,1973,1772,1837,1856,1917,1873, 1933,1938,1985,1884,1943,1951,1990,19 62,1998,2007, 2027,663,942,977,1217,1026,1257,1287,1466,1050,1297, 1315,1479,1350,1501,1534, 1691,1094,1330,1397,1519, 1409,1563,1550,1698,1421,1574,1594,1724,1622,1734, 1749,1841,118 8,1404,1422,1562,1474,1587,1609,1737, 1478,1623,1631,1750,1645,1763,1775,1864,1488,1640,16 62,1774,1695,1790,1803,1877,1710,1817,1823,1897,1836, 1907,1920,1966,1200,1473,1476,1618,1 489,1628,1648, 1766,1511,1670,1685,1784,1703,1800,1821,1891,1600, 1694,1714,1804,1728,1829, 1838,1904,1765,1839,1857, 1918,1874,1932,1937,1984,1630,1732,1758,1830,1773, 1853,1866,192 2,1793,1870,1879,1936,1890,1944,1954, 1993,1807,1885,1899,1950,1912,1957,1965,2000,1924,19 71,1977,2005,1982,2013,2015,2035,1208,1491,1500,1687, 1586,1700,1711,1816,1611,1723,1735,1 832,1761,1844,
1863,1921,1635,1748,1769,1847,1782,1867,1880,1935,
1801,1888,1878,1941,1905, 1953,1961,1996,1697,1777,
1789,1872,1814,1882,1898,1948,1827,1900,1911,1958,
1919,1963,197 4,2004,1852,1915,1928,1967,1939,1979,
1983,2011,1945,1989,1992,2017,1999,2020,2022,2032,17
29,1792,1826,1901,1843,1910,1916,1964,1859,1930,1934,
1976,1942,1980,1991,2014,1865,1940,1 949,1988,1960,
1994,1995,2021,1972,2001,2003,2023,2009,2028,2030,
2040,1894,1956,1959,1997, 1975,2002,2006,2025,1981,
2010,2012,2029,2018,2031,2036,2042,1986,2016,2019,
2033,2024,203 4,2037,2043,2026,2038,2039,2044,2041,
2045,2046,2047]

Sequence Group 1: Q1_4096

[0,1,2,4,8,16,32,3,5,64,9,6,17,10,18,128,12,33,65,20,
256,34,24,36,7,129,66,512,11,40,6 8,130,19,13,48,14,72,
257,21,132,35,258,26,513,80,37,25,22,136,260,264,38,514,
96,1024,1025,67, 41,144,28,69,42,516,49,74,272,160,520,
288,528,192,544,70,44,131,81,50,73,15,320,133,52,23,134,
384,76,1026,1028,137,82,56,27,97,39,259,84,138,145,261,
29,43,98,515,88,1032,1040,140,30,204 8,2049,2050,2052,
146,71,262,265,161,576,45,100,640,51,148,46,1056,1027,
75,266,273,517,104,1 62,53,193,1029,1088,152,77,1033,
1030,164,768,1041,1034,268,274,518,54,83,57,521,112,
135,78, 289,194,85,276,522,58,168,139,99,86,60,280,89,
290,529,524,196,141,2056,2064,2080,2051,101,1 47,176,
142,530,321,31,200,90,545,292,322,532,263,149,102,105,
304,296,163,92,47,267,385,546,3 24,208,386,1042,1152,
150,153,2053,2112,2057,2054,165,106,55,328,536,577,
548,113,154,79,269, 108,578,224,1036,1057,166,519,552,
195,1089,1044,270,641,523,275,580,291,2065,2058,2066,
217 6,59,169,560,114,277,156,1280,1058,87,197,116,170,
61,531,525,642,2060,2081,2113,2068,281,27 8,526,177,
2304,2082,2072,2084,293,388,1048,1060,2055,2177,2114,
2560,91,584,769,198,1031,11 53,172,120,201,336,62,282,
1090,1536,143,103,178,294,93,644,202,592,323,392,297,
770,107,180, 1035,1064,151,209,284,648,94,204,298,400,
608,352,325,533,155,210,305,547,300,109,1092,1154,
1043,1037,184,534,537,115,167,225,326,306,772,157,656,
329,1072,1038,110,117,212,171,776,330, 226,549,1096,
1281,538,387,308,216,1045,1156,416,271,279,158,337,
550,672,118,332,579,540,38 9,173,121,553,199,784,179,
228,338,312,704,1059,1282,390,174,554,581,393,283,
2059,2088,2116, 2178,122,448,353,561,203,63,340,394,
527,582,556,181,1050,1537,1104,1061,1049,1046,295,285,
232,124,205,182,643,562,286,585,1160,1284,299,354,
2067,2061,2096,2062,211,401,1288,1062,15 38,1120,185,
396,2120,2305,2069,2180,344,586,1091,1065,1168,1052,
645,593,1093,1066,535,240, 206,95,327,564,1540,1073,
800,402,356,307,301,417,2083,2306,2074,2561,213,568,
832,588,186,6 46,404,227,896,594,1098,1296,1184,1544,
1312,1552,418,302,649,771,1216,1568,360,539,111,331,
214,309,2128,2085,2073,2070,188,449,1094,1068,1155,
1105,217,408,2184,2308,2312,2086,609,5 96,551,650,229,
159,420,310,541,773,610,657,2562,2144,3072,3073,333,
119,600,339,218,368,652, 230,391,313,1074,1097,450,542,
1039,1344,334,233,555,774,175,123,1157,1076,658,612,
341,777, 2115,2089,2192,2076,220,314,424,395,673,583,
1047,1158,355,287,183,234,125,557,660,616,1408, 1100,
342,316,241,778,1161,1106,563,345,452,397,403,207,
1080,1051,674,558,785,432,2117,2090, 2564,2097,2122,
2320,2208,2568,357,187,1121,1063,1283,1108,236,664,
624,587,780,705,126,242, 565,398,1162,1169,346,456,
1285,1053,358,405,2336,2576,2240,2592,303,569,244,595,
189,566,6 76,361,1067,1122,706,589,215,786,1539,1112,
2118,2092,2179,2129,1164,1054,647,348,419,406,4
64,680,2098,2121,2063,2368,801,362,590,409,570,788,
597,572,219,311,1170,1095,1286,1289,708, 598,601,651,
1185,1600,1069,1124,421,792,802,611,602,410,1664,1075,
231,688,1172,1070,653,24 8,369,190,364,654,659,335,
1099,1290,2181,2100,2071,2182,480,315,221,370,1297,
1541,1128,118 6,613,422,425,451,614,543,235,412,343,
372,1077,1217,775,317,222,426,453,237,559,833,1176,11
01,1188,1792,1292,1298,804,712,2432,2124,3074,3076,
2185,2130,2104,2075,2145,2087,2307,213 2,834,661,808,
779,617,604,433,720,816,836,347,897,1542,1078,1107,
1081,243,662,1545,1136,21 86,2193,2309,2077,454,318,
675,618,898,781,376,428,2091,2146,2563,2136,3080,3088,
2188,2078, 665,736,567,840,625,238,1159,1102,2194,
2119,2310,2313,2209,2624,2093,2148,1313,1218,1109,1
300,2688,2099,2196,2094,1546,1082,359,457,399,787,591,
678,434,677,1192,1163,3104,3075,212 3,2314,1123,1110,
349,245,458,666,620,363,127,191,782,407,436,626,1084,
1304,1113,1314,1553,1 548,571,465,1220,1165,681,246,
707,350,1125,1171,1200,1166,2321,2565,2152,2210,2101,
2241,30 77,3136,2200,2125,3081,3078,599,668,790,460,
1554,1345,1055,1224,2212,2816,3089,3082,249,6 82,1114,
1569,573,411,803,789,709,365,440,628,689,374,423,466,
2316,2322,2566,2102,2131,2105, 2569,2160,793,250,371,
481,1316,1346,1556,1287,1173,1126,1129,1328,574,413,
603,366,468,655, 900,805,1320,1187,1116,1071,1291,
1409,1570,1348,615,684,710,429,1232,1410,794,252,373,
605, 848,690,1174,1177,713,632,482,806,427,904,2183,
2126,2337,2242,414,223,1189,1130,2133,2324, 2570,2106,
663,692,835,619,1079,1352,1560,1601,472,455,796,809,
2216,2187,2147,2134,1572,11 37,1178,1103,714,721,1293,
1132,837,716,864,810,606,912,722,696,1602,1248,1190,
1543,2108,23 28,2137,2338,377,435,817,319,621,812,484,
430,838,667,1576,1219,1294,1665,1547,1299,2577,25
72,2244,2189,488,239,378,459,622,627,1604,1315,2149,
2195,2224,2190,1083,1193,437,380,818,4 61,496,669,679,
724,841,629,2578,2369,2079,2248,1584,1138,1301,1180,
1111,1221,351,467,438,7 37,251,462,2138,2593,2340,
2370,2580,2311,2197,2150,442,441,1140,1194,1085,1555,
1549,1666,1 305,1302,1550,1201,469,247,683,842,1317,
1412,738,899,2153,2352,2344,2211,670,783,849,820,2
140,2095,2315,2433,728,928,791,367,901,630,1115,1608,
685,844,1793,1222,633,711,1196,1144,1 225,1360,253,
691,2594,2372,2256,2434,1086,1306,1167,1127,824,902,
1202,1318,3090,3200,2198, 2201,2213,2154,2103,2376,
1117,1668,686,740,850,375,444,470,483,415,1226,1616,
1347,1416,48 5,905,1321,1794,795,473,1131,1204,1175,
1233,1308,1672,1118,1228,634,744,852,960,2584,2625,
2596,2161,2202,2127,2317,2156,1322,1424,1632,1376,
1349,1557,1179,1234,2626,2272,3084,310 5,2214,2567,
2600,2243,865,693,1329,1571,1324,1133,1208,1558,1561,
1139,797,906,3137,3092,2 318,2689,715,807,1191,1249,
2571,2323,2628,2339,1350,1330,474,636,694,254,717,575,
913,798,1 796,1181,1680,1353,811,379,2107,2217,2608,
2162,697,431,607,489,866,723,486,908,2325,2204,3 328,
3106,2135,2245,2164,2218,1134,1141,718,813,476,856,
839,725,1236,1195,1800,1354,698,914, 752,868,819,814,
439,929,2109,2579,2573,2690,1250,1573,490,623,671,739,
916,463,843,381,497, 930,1562,1411,1332,1240,2329,
2326,2574,2225,2341,2436,3096,3108,2139,2632,2817,
2246,1440, 1295,1303,1182,1361,1574,1696,1142,1356,
1603,1564,1413,1197,1145,1577,1223,821,726,1808,1 203,
1252,1362,1336,1728,961,872,1414,1198,3079,3201,2220,
2168,2249,2384,2110,2330,492,631, 1578,1605,3138,3584,
2191,2151,729,700,443,741,1417,1307,1146,1472,1377,
1585,1227,1087,84 5,920,382,822,1364,1418,1551,1606,
1580,1205,1319,1309,1256,1148,851,730,2226,2342,2141, 26 92,2250,2640,2371,2440,2345,2818,2155,2228,3083,3112,2199,2257,498,880,742,445,471,635,12 29,1206,1667,1586,1310,1609,932,687,1323,1378,2332,2696,2142,2252,2346,2448,2656,2400,903, 825,500,846,745,826,1235,1425,1209,1420,732,446,962,936,475,853,1368,1610,867,637,907,487, 1669,1617,2373,2581,2203,2258,2353,2595,2348,2157,3140,3202,3091,3085,1559,1264,695,746,2 232,2582,2585,2163,1230,1119,828,753,1351,1588,854,857,2215,2273,2374,2354,2820,2205,2704, 2377,1824,1426,1380,1331,1325,1441,504,799,3120,3086,2158,2165,2260,2219,2824,2378,255,9 64,1237,1592,2274,2597,3144,3329,1856,1612,909,719,1210,1670,1428,1251,1920,1618,477,915, 638,748,1442,1326,1673,1795,944,869,491,699,754,858,1384,1563,478,968,383,910,815,976,2586, 2435,2356,2264,3093,3204,2464,2319,2327,2206,2385,2598,2720,2166,2380,2627,1135,1355,870, 917,1238,1333,727,493,873,701,1212,1473,1241,1432,1633,1620,2588,2437,2221,2169,2601,224 7,2832,2227,2276,2386,2360,2752,3107,3330,2438,2222,1575,1674,1253,1183,1444,1334,931,756, 2602,2629,2441,2331,1565,1797,860,499,731,823,1634,1681,1357,1143,1624,1363,2170,2496,24 01,2609,1242,1392,1676,1254,922,874,1415,1337,918,502,1474,1566,933,743,760,881,2251,2111, 2388,2442,1358,1257,1579,1798,1199,1147,1682,1636,2575,2630,2604,2229,3098,3585,3152,310 9,494,702,921,501,1365,1801,1244,1338,3097,3094,2343,2333,2280,2172,2253,2230,1448,1419,1 697,1607,2691,2610,2334,2633,1379,1311,1207,1258,1149,1581,1684,1640,1366,1340,1265,1802,1587,1369,1476,1421,3208,3332,2347,2402,2259,2449,3336,3110,876,847,992,447,1427,1231,733, 827,1698,1582,1809,1456,934,882,937,963,1381,1211,1260,1688,3586,3168,2233,2444,2392,263 4,3139,3113,3216,3100,2693,2641,747,505,855,924,734,829,965,938,1648,1611,1804,1729,3141,3 114,2583,2288,2254,2143,2375,2612,884,506,749,945,1150,1266,966,755,859,940,1589,1422,137 0,1480,1382,1429,1327,1593,1268,1619,3588,3121,2848,2450,2404,2355,2349,2465,2261,2616,28 80,2636,830,911,871,639,888,479,1213,1590,946,750,969,508,861,757,970,919,2234,2694,2452,2 275,2944,2642,3146,3344,3232,3592,3360,3600,2466,2350,2697,2819,3264,3616,2408,2587,875,8 62,758,948,1700,1385,1730,1613,2159,2379,2262,2357,1239,1810,1671,1372,1443,1430,1488,170 4,1825,1386,1614,1433,1594,1812,1621,1596,1243,1335,977,923,1732,1622,1625,1675,2236,2497, 3142,3116,1445,1816,1826,1635,3203,3153,2265,2456,1626,1434,1255,1712,2657,2644,2599,269 8,2277,2207,2468,2358,972,761,1677,1272,2589,2821,2658,2705,2381,2167,2648,2387,1393,1214, 1388,1678,2266,2416,2700,2278,2439,2361,3122,3145,1683,1359,1504,1339,1245,1394,877,952, 495,703,935,978,883,762,503,925,2498,2590,3087,3392,2382,2281,2603,2822,878,735,1637,1446, 2223,2171,3205,3124,1449,1475,993,885,2706,2660,2389,2825,2268,2362,2472,2443,2721,2631,3 095,3206,2403,2335,2231,2282,1638,1567,1259,1436,1367,1396,1799,1341,2173,2605,2708,2664, 3456,3148,2390,2364,2289,2826,3209,3154,2611,2393,2500,2445,1246,1450,1477,1261,2451,225 5,3128,3099,2722,2606,2833,2480,2405,2235,3169,3111,3331,3156,2284,2712,1583,1857,1828,17 36,1858,1685,1832,1803,2672,2635,2828,2753,2174,2290,2613,2446,939,994,1641,1628,1457,174 4,980,926,1840,1860,1371,1921,1267,1686,1478,1342,3210,3217,2394,2504,3333,3101,2406,2453, 1699,1642,764,941,1922,1805,967,886,1400,1452,831,947,1689,1760,1591,1864,507,889,1649,12 62,2351,2617,2292,2643,1383,1481,1423,1811,984,751,1615,1702,1458,1701,1373,1269,2237,261 4,2724,2409,3115,3170,2754,2637,1482,1690,1644,1387,1151,1215,1806,1431,1460,1650,1595,14 89,942,996,1705,1270,2263,2834,3587,3160,971,890,1731,1374,1623,1692,1814,1484,1273,1706,509,949,1597,1435,973,1000,892,950,1827,1813,3212,3102,2695,2396,2467,2454,2512,2728,2849, 2410,2638,2457,2618,2836,2645,2620,2267,2359,3218,3143,3334,3337,2756,2646,2649,2699,323 3,3648,3117,3172,2469,2840,2850,2659,2650,2458,3712,3123,2279,2736,1733,1389,1464,1652,32 20,3118,2701,2296,2417,2238,2412,2702,2707,2383,3147,3338,1713,1398,1447,1490,2528,2363,2 269,2418,863,759,1817,1274,3345,3589,3176,3234,1395,1505,1598,1437,1008,510,1627,1390,266 1,2470,2473,2499,2662,2591,2283,2460,2391,2420,3125,3265,2823,2365,2270,2474,1492,1679,19 24,1829,979,953,1639,1708,2501,2285,2607,2881,3224,3149,3236,3840,3340,3346,2852,2760,288 2,2709,2856,2827,2665,2652,2481,2768,1734,1453,1818,1276,763,974,1397,1629,1872,1714,954, 879,981,982,1737,1656,2864,2884,2395,2945,3590,3126,3155,3129,2291,2710,3593,3184,1506,18 30,1451,1928,2502,2366,2723,2666,1438,1247,1687,1716,927,995,1859,1643,1496,1479,1820,183 3,2946,2829,2424,2476,2713,2784,2615,2888,1738,1745,765,956,1861,1740,1888,1834,887,985,1 630,1936,2673,2286,3207,3150,1746,1720,1401,1459,1841,1343,997,986,3361,3266,3157,3348,35 94,3130,2407,2505,1645,1836,1508,1454,2447,2835,2639,2726,1862,1691,1512,1263,2482,2725,3 240,3211,1402,1483,1646,1651,3171,3158,2397,2293,2506,2714,2668,2411,2175,2239,2830,2455, 943,891,1461,1404,998,766,1842,1485,2484,2674,3132,3352,3161,3362,3601,3596,1520,1693,170 3,1748,2619,2513,3268,3213,2729,2294,2755,2398,3173,3219,3248,3214,511,988,1865,1653,1375,1491,1462,1761,2647,2716,2838,2508,3602,3393,3103,3272,1275,1486,1466,1465,1001,951,1493, 1271,1707,1866,1762,1923,2297,2730,3162,3617,1002,893,1694,1807,975,894,1873,1844,1752,1 952,1815,1391,2621,2459,2851,2837,1925,1654,1709,1868,2757,2413,2488,2676,1657,1735,1009, 955,1277,1715,1848,1926,2737,2422,2471,2514,2841,2298,2419,2529,3364,3394,3604,3335,3221, 3174,3177,3376,2622,2461,2651,2414,2516,2703,2948,2853,1710,1764,1874,1399,3368,3235,316 4,3119,1468,1494,1004,1010,1507,1439,1509,1929,3339,3457,3618,3396,2663,2732,2758,2477,32 80,3458,2842,2300,2421,2653,2896,2738,3222,3225,2761,2680,1819,1497,1658,1768,2530,2854,2 475,2952,1876,1984,957,983,2462,2271,3237,3178,1889,1717,1821,1930,1739,1831,1498,1660,27 11,2740,2883,2667,3127,3400,3608,3649,2520,2503,2844,2857,3620,3185,3226,3151,958,987,171 8,1278,1741,1599,1012,999,2762,2769,3341,3180,2885,2764,2912,2858,2654,2960,2770,2744,365 0,3296,3238,3591,2425,2483,2865,2367,2669,2860,2532,2478,2886,2715,3624,3267,3342,3713,35 95,3347,2536,2287,2426,2507,2670,2675,3652,3363,3131,3241,2485,2428,2866,2509,2544,2717,1 937,1822,1835,1403,1721,1455,1016,767,2727,2772,2889,2677,1631,1513,1890,1747,3632,3186,3 349,3228,3159,3269,2399,2515,1510,1932,1742,1837,1500,1880,1863,1749,2486,2785,2299,2510, 2490,2489,3188,3242,1722,1938,989,1003,1776,1892,1843,1838,1463,1953,1514,1647,1695,1763, 1940,1487,3133,3603,3597,3714,3353,3350,3598,3249,1867,1405,990,1005,1521,1954,1845,1750, 2517,2295,2731,2890,1985,1896,1516,1655,1753,1724,1467,1765,3365,3460,2786,2947,2718,283 1,2897,2868,2776,2976,2839,2415,2949,2678,3163,3656,2733,2892,3841,3270,1869,1944,1406,18 46,1875,1754,1522,1904,1766,1469,959,1011,2681,2759,3244,3192,1495,1659,1956,1711,1927,18 49,1013,895,1524,1870,1769,1850,1756,1470,1986,1960,1499,1877,1891,1661,1931,1511,1719,17 70,3273,3408,2301,2739,3134,3354,3215,3175,2872,2950,3250,3366,3165,3716,2734,2788,2898,2 423,2492,2518,2531,2463,3274,3664, 3395,3464,2533,2953,3369,3842,2843,2521,3179,3252,
3223, 3281,3356,3720,3166,3276,2682,2792,2900,3008,
1852,1777,1878,1881,3370,3472,3680,3424,339 7,3605,
3227,3282,2913,2741,3377,3619,3372,3181,3256,3606,
3609,3187,2845,2954,2763,2855,32 39,3297,1528,1823,
1279,1988,3398,3378,2522,2684,2742,2302,2765,2623,
2961,2846,3844,3229,3 728,3401,2859,2427,2745,2479,
2655,2537,2914,2771,2534,2956,1933,1743,1501,1939,
1006,1014, 1662,1772,1968,1893,1515,1723,1778,1882,
1502,1992,1017,1018,1407,1934,1839,2000,1894,194
1,3182,3189,2766,2861,2524,2904,2887,2773,1751,1517,
1897,1725,3284,3243,3848,3402,2746,29 62,2800,2916,
2867,2862,2487,2977,3298,3621,2538,2671,2719,2787,
2964,2511,2891,2429,2545,2 978,3610,3459,3380,3288,
3488,3343,3351,3230,3409,3622,3744,3190,3404,3651,
3612,3461,1955, 1780,1884,1523,3245,3193,3625,3271,
2869,2774,3856,3251,1755,1847,1946,1898,3300,3410,338
4,3776,3009,2920,3462,3246,2540,2679,3626,3653,2777,
2748,2491,2789,3465,3355,3194,3520,19 42,1526,1957,
1767,3425,3633,3275,3135,1784,1905,1518,1726,2893,
2968,2430,2870,1945,1525,1 900,1871,3412,3466,3599,
3654,3628,3253,3367,3357,991,1020,2016,1471,3304,
3196,2899,2778,2 546,2928,2790,2493,2519,2683,3277,
3254,1757,1851,1958,1906,3715,3634,3358,3657,2980,
2735, 3371,3426,2951,2873,2548,2894,2793,2874,3283,
3473,3257,3468,2780,2494,3010,2984,2523,290 1,3416,
3658,2915,2685,2955,2535,3717,3665,3607,3312,2743,
2794,1961,1987,1771,1529,3278,31 67,2876,2801,1879,
1948,1758,1853,3399,3636,2902,2905,3872,3474,3428,
3379,3373,3489,2552,2 847,2303,3012,3285,3640,1007,
1015,1989,1962,3904,3660,2957,2767,1908,1530,1773,
1969,1990, 1779,1883,1964,3258,3718,3476,3299,3968,
3666,2525,2963,2686,2796,3490,3374,3721,3843,299
2,2917,2539,2747,2802,2906,1854,1935,1895,1663,3432,
3611,2526,3016,2431,2958,2863,3024,31 83,3403,2918,
2965,1912,1503,1019,1021,3286,3381,2775,2541,2921,
2749,3260,3521,3289,3480,3 681,3668,1970,1774,1993,
1532,3623,3722,3301,3231,3492,3382,2979,2804,3613,
3845,2908,2547, 1885,1781,1994,1943,2779,2871,3682,
3729,3405,3191,3672,3411,1899,1886,1782,1972,2001,194
7,1996,1785,3290,3440,3724,3302,2970,2922,3463,3385,
2966,2550,3522,3614,2981,2791,2808,29 29,3406,3305,
3627,3846,1901,1976,1519,1727,3247,3195,3730,3684,
2542,2750,2969,2549,3413,3 849,3292,3386,3496,3467,
3745,3655,1959,2002,1907,1786,3427,3359,3255,3306,
3197,3629,3732, 3688,1527,1949,1902,1759,3414,3388,
3313,3850,3635,3417,3524,3469,2924,2895,3040,2495,347
5,3279,2781,2875,2017,1909,1963,2018,3746,3630,3857,
3504,2982,2930,2985,3011,3429,3259,33 08,3736,2795,
2553,2903,2972,2782,2877,3013,2986,3696,3659,3852,
3777,2004,1950,1788,1965,2 932,2554,2797,2993,1991,
1910,1855,1971,3198,3314,3014,2803,2907,2988,3637,
3470,3418,3528, 3430,3477,1022,1023,1531,1913,3375,
3641,3316,3667,2878,2959,2919,2687,2936,2527,3261,363
8,2994,2798,3017,2556,2909,2805,3018,2967,2008,1775,
1966,2020,2923,2910,2806,2996,3748,34 33,3778,3661,
3287,3858,3719,3420,1995,1914,1533,1973,3491,3478,
3536,3752,1997,2024,1916,1 974,3873,3434,3662,3481,
3642,3860,3669,3644,3291,3383,3025,2971,3780,3670,
3673,3723,3493, 3864,3874,3683,3674,3482,3303,3760,
1887,1783,2032,1534,3020,2809,3725,3320,3441,3262,343
6,3726,3731,3407,3552,3387,3293,3442,2925,3000,2543,
2751,2983,3026,2003,1977,1787,1998,29 31,2810,2551,
2973,2926,2783,3685,3494,3497,3523,3041,2933,3686,
3615,3307,3484,3415,3444,3 847,3389,1978,1903,2005,
2006,3294,3498,3525,3309,3631,3905,3876,3784,3906,
3733,3880,3851, 2987,3042,3689,3676,1951,2019,1789,
1980,3505,3792,3028,2974,3888,3908,3419,3969,1911,200
9,2021,2010,3315,3734,3526,3390,3747,3690,2812,2989,
3970,3853,3015,2934,1967,1915,2022,17 90,3448,3500,
2879,2995,3737,3808,3639,3912,2555,2937,3697,3310,
3431,3529,3471,3859,3032,2 799,3663,3750,3506,3749,
3421,3317,3530,3738,3692,3435,1535,2012,2025,1975,
3199,3263,3854, 3479,3508,3698,3643,3537,2990,3044,
3753,3318,3019,2938,3779,3422,3671,3740,3862,3532,332
1,3754,2557,2997,3645,3483,3021,3048,2026,1917,1999,
1918,2940,2998,3875,3861,3781,3437,35 12,3700,3761,
3446,3495,3538,2911,2807,3865,3322,3443,3553,3646,
3485,3056,2558,3675,3438,3 540,3727,3972,3877,3027,
3001,3687,3756,3782,3501,3866,3324,2811,3022,3445,
3677,3920,3762, 3002,2927,2033,1979,2028,2034,3029,
3030,3785,3704,3554,3878,3499,3976,3486,3295,3735,376
4,1981,2007,1982,2011,2975,3043,3907,3691,3544,3527,
3868,3881,3786,3793,2813,3004,3909,37 88,3936,3882,
2935,3033,3678,3984,3794,3768,3449,3507,3889,3391,
3045,3034,3693,3884,3556,3 502,3910,3739,3560,3311,
3450,3531,3694,3699,2991,2939,3509,3452,3046,2814,
3890,3533,3568, 3741,3751,3796,2559,3036,3913,3701,
2036,2023,2040,1791,3423,3539,3510,3809,3323,3534,351
4,3513,3049,2999,3541,3319,3755,3914,3810,3971,3050,
2941,3742,3855,2013,2027,2014,2029,30 23,2942,3921,
3892,3800,4000,3863,3439,3973,3702,3757,3916,3705,
3783,3057,3003,3325,3763,3 896,3974,3758,3812,3922,
3447,3516,3542,3052,3058,3555,3487,3557,3977,3867,
3545,3706,3816, 3924,4032,3005,3031,3937,3765,3869,
3978,3787,3879,3546,3708,3006,3035,3766,3326,3789,364
7,3060,3047,3985,3870,3883,3451,1983,2035,2037,1919,
3769,3503,3064,2815,3679,3561,3938,37 95,3558,3980,
3790,3885,3548,3928,3911,3797,3770,3986,3037,3051,
3824,3940,3891,3886,3511,4 001,3562,3695,2030,2038,
2041,2042,3743,3811,3988,3535,3915,3453,3038,3053,
3569,4002,3893, 3798,4033,3944,3564,3703,3801,3772,
3515,3813,3917,3992,3454,3894,3923,3802,3570,3952,381
4,3517,3007,3059,2015,2044,2031,2039,3543,3707,4004,
3759,3975,3897,3061,2943,3572,3918,38 17,3898,3804,
3518,4034,4008,3547,3925,3939,3709,3979,3559,3767,
3818,3900,3825,3926,3929,3 576,3871,3327,4036,3981,
3791,3549,3987,3054,3062,3710,3820,4016,3941,3563,
3771,3826,3930, 3550,4040,3065,3066,3455,3982,3887,
4048,3942,3989,3799,3565,3945,3773,4003,3828,3932,357
1,3803,3895,3994,3946,3990,3574,4005,3815,3832,3953,
3566,3774,3993,3573,3948,3919,2043,20 45,2046,2047,
3039,3068,4064,3519,3805,3899,4006,3954,4009,4035,
3819,3577,3927,3996,3806,3 901,3055,3063,4037,4010,
3956,3578,3821,4017,4038,3827,3931,4012,3902,3983,
3943,3711,3960, 3551,3067,3069,4018,3822,4041,3580,
3933,3829,4042,3991,3947,3934,3830,4020,4049,3995,404
4,3833,3949,4024,3567,3775,4007,4050,3955,3834,3575,
3997,3950,3807,4065,3957,4011,4066,40 52,3998,3836,
4013,4039,3958,3903,4019,3070,3071,3579,3961,4056,
3823,4014,4068,4043,3962,3 581,4021,4045,4072,3964,
4022,3935,3831,4080,3582,4051,4025,3835,4046,4026,
3951,4053,4054, 3999,4067,3837,4028,3959,4057,4069,
4058,4015,3963,4070,3838,3583,4060,4073,4023,4074,396
5,4047,3966,4081,4027,4076,4082,4029,4055,4030,4059,
4084,4071,4088,3839,4061,4075,4062,40 77,4031,4083,
4085,3967,4078,4086,4089,4090,4063,4092,4079,4087,
4091,4093,4094,4095]

Sequence Group 1: Z1_4096

[0,1,2,7,3,8,11,24,4,10,13,28,16,33,35,78,5,12,14,32,19,
38,47,82,22,46,42,91,59,99,107, 182,6,17,21,40,23,45,51,
93,29,57,61,100,73,118,123,197,34,63,76,121,81,132,147, 214,90,149,159, 244,164,256,290,401,9,18,26,56,30,60,72,113,36,77,64,126,85,137,153,221,44,75,89,148,95,156,163,252,103,166,184,280,196,298,314,457,53,92,101,162,119,176,191,295,130,192,213,306,223,32 7,346,496,151,219,247,335,254,347,369,533,287,375,396,553,417,576,620,852,15,25,31,74,39,80, 83,152,48,88,96,161,106,171,179,294,58,97,112,177,122,190,206,310,136,207,220,322,249,341,36 5,521,66,116,131,195,140,212,228,336,160,245,255,349,286,374,387,552,178,267,296,379,307,407,419,574,332,438,476,609,504,640,705,853,70,133,155,231,170,253,283,377,183,288,300,400,31 5,418,456,593,202,311,323,432,348,472,498,648,359,510,536,676,564,718,738,977,225,337,352,4 79,380,520,539,698,416,549,575,730,614,741,809,1045,455,584,621,780,638,847,869,1105,703,90 0,925,1082,959,1142,1249,1520,20,37,41,94,49,98,114,189,50,115,127,198,144,222,234,363,65,128,145,237,157,248,265,364,165,264,291,391,312,415,422,573,68,154,167,239,186,272,297,414,19 4,304,316,426,326,466,489,636,193,324,339,465,358,499,523,677,382,541,565,717,583,737,789,1 027,79,181,187,302,201,320,338,458,215,343,351,497,370,532,548,709,289,366,381,535,402,558, 582,732,444,589,626,774,659,846,871,1078,319,398,427,572,464,608,630,830,494,643,669,851,706,909,939,1127,537,704,719,926,733,960,913,1169,794,1024,1046,1259,1059,1313,1390,1556,84, 199,203,357,273,373,386,540,303,390,403,567,439,591,623,832,317,433,463,592,478,631,661,855, 511,671,695,905,731,937,976,1173,362,467,488,660,522,690,725,914,566,726,739,970,795,955,1 031,1265,599,770,836,1025,856,1058,1080,1298,910,1093,1092,1378,1170,1423,1455,1723,397,505,544,727,590,740,788,993,627,831,848,1047,891,1061,1083,1311,662,865,915,1079,940,1104,11 71,1424,992,1183,1246,1458,1284,1538,1554,1809,716,927,968,1172,1030,1178,1270,1465,1044,1 267,1306,1548,1368,1583,1672,1932,1062,1314,1420,1623,1446,1675,1645,1938,1510,1753,1773, 2076,1815,2134,2221,2420,27,43,52,102,62,129,146,229,67,150,158,236,169,258,266,404,69,168,180,257,188,321,333,454,216,334,356,495,372,524,545,729,71,185,200,325,218,353,367,518,230, 376,388,550,406,577,597,742,246,399,421,588,459,622,641,806,473,637,672,864,675,904,936,125 1,117,217,224,371,238,389,405,569,281,423,445,617,475,647,670,834,301,451,481,639,517,674,6 83,888,534,684,694,938,769,961,1012,1266,318,516,526,693,557,724,728,952,579,768,791,987,850,1028,1048,1307,616,808,857,1049,911,1067,1129,1369,967,1136,1192,1425,1247,1463,1540,180 7,120,235,259,420,299,450,477,658,313,490,519,685,538,702,707,941,342,527,556,708,578,765,7 81,984,615,804,849,1033,889,1063,1116,1308,368,568,596,790,642,837,835,1064,663,868,901,110 6,953,1132,1166,1433,699,912,963,1143,985,1221,1248,1482,1015,1264,1292,1549,1377,1585,1673,1933,383,619,646,870,682,908,954,1137,751,966,1004,1236,1009,1250,1282,1531,771,1005,101 4,1269,1065,1287,1349,1582,1124,1376,1403,1624,1454,1726,1756,1949,805,1081,1110,1309,116 7,1379,1422,1649,1193,1448,1483,1752,1541,1774,1813,2089,1294,1491,1550,1779,1615,1817,18 42,2209,1650,1901,1937,2272,2062,2326,2393,2647,141,282,305,491,340,525,551,736,350,559,58 5,767,618,793,854,1117,378,598,649,833,673,907,890,1126,691,924,958,1182,994,1230,1253,1511, 462,668,692,906,750,943,969,1237,766,995,1011,1258,1029,1283,1297,1558,772,1026,1060,1296, 1119,1348,1391,1625,1152,1445,1449,1727,1490,1757,1804,2070,474,743,764,986,773,1008,1032, 1286,807,1066,1107,1312,1133,1388,1447,1721,962,1118,1168,1402,1194,1459,1494,1754,1285,1 495,1551,1780,1622,1816,1841,2208,1010,1220,1268,1462,1295,1547,1578,1806,1357,1584,1641, 1840, 1720,1930,1948,2279,1421,1651,1733,1936,1772,1959,2067,2332,1808,2077,2125,2389,214 0,2453,2457,2767,480,775,792,1111,942,1128,1153,1444,971,1179,1231,1464,1271,1530,1557,180 5,1013,1252,1293,1539,1310,1579,1644,1819,1389,1674,1640,1871,1755,1939,2043,2308,1125,12 99,1315,1614,1432,1648,1732,1934,1457,1734,1759,2036,1781,2063,2116,2388,1546,1775,1812,2071,1843,2135,2141,2441,1931,2245,2278,2479,2327,2554,2584,2754,1195,1356,1456,1735,1521, 1758,1778,2066,1555,1814,1818,2124,1900,2138,2273,2456,1559,1870,1935,2244,2042,2280,228 1,2555,2088,2333,2347,2585,2421,2682,2706,3024,1722,1958,2037,2309,2117,2346,2392,2591,21 39,2440,2452,2683,2518,2707,2888,3108,2220,2478,2519,2755,2590,2766,2889,3109,2646,2900,2 901,3162,3025,3163,3336,3337,54,55,86,125,87,134,139,284,104,138,143,308,226,331,345,546,10 5,142,204,330,233,360,413,570,274,412,408,595,449,629,657,894,124,227,251,384,275,411,435,6 11,309,447,453,644,507,688,701,947,344,461,542,697,555,734,777,988,594,779,829,1056,858,109 6,1148,1387,135,232,292,446,328,452,506,679,354,543,482,710,581,745,811,1003,410,509,587,77 8,613,822,845,1076,651,860,902,1130,946,1164,1190,1489,437,610,645,844,689,872,933,1151,722, 934,979,1184,1007,1225,1280,1576,783,1001,1073,1229,1094,1281,1339,1629,1139,1345,1382,1 661,1401,1700,1776,2108,205,285,329,508,361,554,571,810,424,586,624,839,656,867,875,1150,4 48,625,678,873,700,932,964,1186,744,965,1002,1210,1075,1255,1335,1611,484,686,723,945,746,978,1018,1238,838,1057,1095,1289,1138,1344,1359,1660,874,1103,1154,1351,1185,1397,1427,16 98,1226,1452,1532,1737,1586,1810,1913,2109,492,735,821,1035,866,1077,1135,1347,895,1140,11 74,1386,1191,1426,1488,1725,956,1187,1211,1450,1288,1522,1580,1852,1319,1588,1636,1868,16 78,1928,2000,2305,1017,1239,1304,1535,1352,1610,1639,1890,1400,1657,1699,1978,1738,2003,2 079,2367,1481,1706,1777,2048,1790,2095,2119,2443,1903,2132,2211,2436,2271,2480,2587,2858, 250,355,385,612,425,628,680,931,434,681,711,948,748,1006,1036,1333,483,720,749,1039,823,10 74,1101,1334,859,1100,1149,1381,1188,1399,1430,1697,486,820,861,1051,928,1108,1155,1398,94 4,1180,1204,1434,1224,1508,1543,1788,935,1222,1245,1507,1318,1581,1613,1869,1354,1643,167 9,1927,1705,1983,2051,2345,547,893,929,1176,951,1208,1244,1492,989,1257,1291,1577,1340,16 28,1656,1925,1141,1336,1353,1631,1392,1676,1704,1980,1460,1709,1784,2046,1855,2094,2127,2 424,1207,1384,1435,1696,1506,1736,1786,2084,1552,1845,1861,2107,1914,2185,2223,2463,1637, 1912,1929,2216,1981,2274,2201,2511,2068,2342,2372,2643,2391,2705,2746,2902,580,949,957,13 17,1109,1343,1358,1642,1177,1380,1393,1689,1453,1711,1783,2086,1205,1451,1505,1724,1534,1 787,1857,2111,1589,1863,1889,2137,1979,2219,2304,2521,1332,1509,1542,1856,1612,1880,1951, 2202,1688,1956,2001,2298,2069,2269,2359,2645,1731,2040,2092,2343,2112,2390,2426,2688,218 6,2439,2438,2722,2516,2753,2773,3027,1383,1587,1646,1957,1710,2002,2050,2313,1785,2085,21 04,2373,2131,2395,2437,2695,1858,2115,2203,2425,2240,2442,2517,2760,2312,2545,2566,2776,2668,2886,2898,3161,1926,2217,2296,2520,2358,2522,2664,2781,2366,2653,2690,2894,2718,2917, 3006,3234,2404,2708,2750,2963,2768,3013,2997,3264,2856,3083,3117,3338,3179,3378,3415,354 0,293,409,436,650,460,721,776,1019,485,782,828,1038,863,1098,1102,1394,487,862,892,1097,93 0,1209,1227,1480,990,1228,1316,1553,1342,1620,1647,1977,493,903,950,1223,1000,1305,1337,1608,1034,1346,1370,1658,1396,1701,1729,2020,1072,1385,1429,1708,1493,1782,1811,2074,1523, 1789,1864, 2114,1867,2136,2218,2589,687,991,1016,1341,1050,1371,1395,1691,1131,1431,1461,1761,1529,1847,1862,2090,1175,1467,1537,1791,1591,1866,1873,2128,1630,1874,1888,2222,2039,2275,2334,2652,1206,1590,1626,1883,1663,1950,1976,2246,1703,2038,2061,2311,2106,2356,2374,2691,1760,2078,2113,2375,2187,2423,2469,2719,2283,2476,2546,2761,2567,2779,2890,3147,696,1037,1099,1428,1165,1466,1533,1854,1189,1544,1609,1875,1638,1902,1915,2241,1256,1627,1662,1924,1702,2025,2049,2306,1739,2072,2105,2365,2129,2405,2454,2692,1338,1690,1728,2060,1844,2093,2091,2406,1859,2118,2133,2444,2247,2470,2508,2763,1891,2200,2277,2481,2307,2561,2586,2782,2341,2644,2680,2895,2721,2919,3007,3235,1355,1763,1846,2126,1872,2184,2268,2477,2023,2282,2324,2564,2329,2588,2666,2885,2041,2325,2340,2655,2407,2671,2711,2916,2460,2720,2749,2972,2772,3040,3090,3267,2073,2427,2446,2693,2509,2723,2752,2999,2547,2770,2783,3082,2891,3118,3177,3361,2684,2829,2896,3121,2961,3193,3206,3413,3004,3211,3255,3438,3314,3482,3511,3699,747,1134,1181,1545,1254,1621,1659,1982,1290,1677,1707,2027,1762,2065,2110,2455,1350,1730,1853,2087,1865,2143,2130,2462,1881,2210,2270,2544,2314,2562,2641,2857,1504,1860,1882,2142,2022,2243,2297,2565,2026,2315,2331,2642,2357,2667,2687,2904,2044,2344,2394,2686,2459,2710,2747,2973,2482,2765,2771,3041,2828,3091,3144,3322,1528,2021,2024,2310,2045,2328,2364,2670,2075,2422,2445,2704,2471,2744,2769,3015,2276,2458,2510,2748,2552,2777,2830,3088,2669,2831,2897,3122,2962,3192,3205,3412,2330,2560,2654,2778,2685,2893,2906,3146,2717,2918,2975,3204,3014,3232,3266,3461,2751,3005,3043,3254,3116,3285,3321,3492,3160,3339,3377,3509,3386,3573,3575,3787,1536,2047,2064,2447,2242,2468,2483,2764,2299,2523,2563,2780,2665,2884,2903,3145,2335,2640,2681,2887,2694,2907,2996,3195,2745,3012,2974,3209,3089,3265,3313,3480,2461,2689,2709,2960,2762,2998,3042,3252,2775,3080,3111,3286,3123,3315,3362,3508,2892,3119,3176,3323,3207,3379,3387,3543,3233,3437,3460,3621,3483,3636,3638,3784,2553,2716,2774,3081,2859,3110,3120,3320,2899,3178,3194,3376,3210,3384,3439,3574,2905,3208,3253,3436,3312,3462,3463,3637,3360,3493,3495,3639,3541,3720,3722,3852,3026,3284,3287,3481,3363,3494,3510,3697,3385,3542,3572,3721,3622,3723,3816,3854,3414,3620,3623,3785,3696,3786,3817,3855,3698,3818,3819,3936,3853,3937,3938,3939,108,109,110,175,111,208,211,276,172,210,241,392,260,429,431,666,173,240,242,428,263,442,503,714,270,502,470,759,563,787,803,1070,174,261,269,468,271,501,515,761,393,561,601,796,653,818,827,1121,430,603,664,825,713,880,919,1162,758,921,983,1260,1020,1300,1366,1653,209,262,278,560,394,600,652,813,440,665,604,842,753,885,973,1201,500,655,757,920,763,980,999,1276,799,1022,1084,1328,1120,1406,1438,1769,529,760,797,998,819,1052,1091,1375,878,1112,1161,1414,1203,1475,1514,1848,923,1199,1263,1487,1278,1515,1573,1909,1363,1595,1632,1953,1685,1984,2032,2384,243,277,395,654,443,712,715,972,512,756,784,997,802,1043,1055,1374,562,785,812,1053,826,1090,1158,1418,884,1159,1200,1470,1273,1501,1569,1897,606,816,879,1115,896,1160,1216,1496,996,1261,1279,1517,1362,1594,1607,1952,1054,1323,1404,1599,1415,1667,1687,1974,1484,1742,1820,2013,1876,2096,2193,2385,634,881,975,1219,1042,1277,1331,1597,1071,1364,1408,1652,1439,1686,1768,2005,1146,1419,1471,1716,1516,1800,1850,2120,1563,1886,1916,2160,1964,2206,2238,2557,1213,1497,1524,1823,1600,1896,1919,2182,1684,1945,1975,2230,2018,2249,2337,2625,1767,1992,2033,2292,2082,2379,2413,2713,2191,2448,2489,2674,2535,2786,2865,3104,268,441,469,762,513,786,814,1089,514,815,843,1122,916,1202,1234,1567,605,876,917,1241,981,1272,1321,1568,1021,1320,1367,1619,1436,1683,1694,1973,632,974,1023,1243,1086,1324,1405,1682,1114,1412,1440,1714,1474,1798,1833,2080,1113,1472,1499,1797,1562,1851,1899,2161,1602,1921,1965,2205,1991,2237,2301,2611,667,1069,1087,1410,1145,1468,1498,1770,1163,1503,1519,1849,1574,1908,1944,2197,1365,1570,1601,1911,1654,1962,1990,2232,1744,1997,2054,2286,2147,2378,2415,2662,1443,1634,1715,1972,1796,2012,2058,2354,1838,2099,2153,2383,2194,2473,2503,2735,1917,2192,2207,2490,2233,2536,2485,2801,2318,2608,2626,2875,2635,2941,3010,3152,752,1123,1147,1561,1325,1593,1606,1920,1411,1618,1655,1967,1743,1999,2035,2360,1441,1717,1795,2004,1822,2059,2149,2387,1887,2155,2179,2465,2231,2501,2556,2805,1566,1799,1832,2148,1898,2174,2225,2486,1966,2226,2239,2550,2319,2531,2615,2877,2011,2266,2368,2609,2396,2634,2672,2930,2474,2677,2676,2990,2802,3035,3063,3279,1633,1877,1940,2227,1998,2248,2300,2577,2055,2355,2380,2627,2431,2637,2675,2939,2150,2409,2487,2663,2504,2712,2803,3036,2576,2815,2862,3066,2912,3130,3150,3349,2204,2491,2548,2804,2614,2810,2882,3073,2624,2879,2934,3140,2984,3167,3240,3432,2638,2942,3032,3191,3054,3243,3221,3442,3102,3301,3317,3520,3355,3566,3597,3692,279,471,528,798,602,877,918,1217,607,922,982,1240,1041,1302,1322,1664,633,1040,1068,1301,1088,1469,1485,1766,1196,1486,1560,1839,1592,1904,1941,2229,635,1085,1144,1473,1198,1525,1571,1894,1218,1596,1616,1946,1666,1985,2009,2250,1262,1635,1693,1996,1771,2034,2097,2322,1801,2081,2156,2408,2159,2464,2500,2867,817,1197,1212,1575,1242,1617,1665,1969,1329,1695,1745,2029,1803,2103,2154,2362,1409,1751,1825,2083,1893,2158,2167,2428,1910,2168,2178,2502,2265,2537,2600,2878,1442,1892,1906,2177,1961,2224,2228,2528,1987,2264,2303,2571,2382,2612,2628,2935,2028,2336,2397,2629,2475,2651,2737,2985,2543,2756,2824,3037,2863,3071,3132,3347,824,1235,1303,1692,1407,1750,1821,2146,1437,1834,1895,2169,1918,2190,2195,2505,1502,1907,1960,2196,1986,2261,2293,2568,2019,2320,2381,2617,2429,2639,2728,2936,1572,1968,2008,2302,2098,2369,2363,2648,2151,2412,2449,2714,2529,2740,2798,3049,2183,2484,2539,2787,2569,2841,2864,3078,2603,2876,2924,3141,2989,3169,3241,3433,1603,2031,2102,2414,2166,2472,2530,2757,2259,2542,2592,2852,2597,2866,2910,3115,2267,2593,2602,2881,2649,2915,2969,3166,2732,2988,3031,3196,3062,3282,3304,3445,2321,2673,2726,2937,2799,2991,3034,3225,2825,3056,3079,3300,3133,3318,3353,3529,2926,3087,3142,3327,3187,3357,3366,3589,3226,3417,3441,3612,3502,3650,3685,3791,897,1330,1413,1835,1500,1905,1947,2236,1518,1963,1993,2263,2030,2317,2386,2729,1598,2010,2121,2361,2157,2467,2430,2734,2175,2488,2534,2814,2578,2850,2869,3103,1794,2152,2176,2466,2258,2507,2549,2853,2262,2579,2599,2874,2613,2911,2929,3154,2284,2610,2636,2928,2731,2968,3011,3197,2792,3053,3057,3283,3086,3305,3344,3514,1802,2251,2260,2570,2285,2596,2616,2914,2323,2650,2715,2940,2741,3008,3055,3277,2538,2730,2800,3030,2826,3067,3094,3302,2913,3095,3143,3328,3190,3356,3365,3588,2598,2840,2880,3070,2927,3139,3158,3346,2981,3168,3217,3364,3276,3430,3444,3619,3033,3227,3293,3440,3316,3451,3507,3656,3348,3521,3557,3681,3576,3717,3725,3863,1824,2287,2316,2727,2506,2736,2793,3052,2551,2811,2851,3072,2883,3114,3153,3345,2601,2868,2925,3131,2938,3159,3220,3359,3009,3242,3216,3399,3303,3443,3487,3640,2733,2931, 2943,3186,3048,3224,3292,3434,3065,3294,3307,3476,3329,3503,3552,3680,3138,3 319,3352,3515,3367,3567,3577,3709,3431,3605,3618,3739,3651,3762,3772,3850,2827,2980,3064, 3295,3105,3306,3326,3506,3151,3354,3358,3556,3416,3570,3613,3724,3155,3398,3435,3604,3486,3624,3625,3763,3528,3657,3667,3773,3693,3806,3826,3940,3278,3450,3477,3641,3553,3666,36 84,3779,3571,3708,3716,3807,3750,3827,3892,3956,3596,3738,3751,3851,3778,3862,3893,3957,3 790,3904,3905,3974,3941,3975,4016,4017,530,531,754,841,755,882,887,1360,800,886,899,1416,1 214,1479,1513,1942,801,898,1156,1478,1233,1564,1681,1970,1326,1680,1668,2007,1749,2057,2145,2434,840,1215,1275,1604,1327,1671,1719,2015,1417,1747,1765,2100,1879,2172,2189,2515,15 12,1793,1922,2181,1955,2234,2289,2572,2006,2291,2353,2632,2398,2696,2788,3003,883,1232,13 72,1746,1476,1764,1878,2163,1526,1923,1826,2198,1989,2253,2339,2583,1670,1885,1995,2290,2 017,2350,2377,2660,2123,2400,2450,2738,2514,2796,2822,3085,1741,2014,2101,2376,2173,2416, 2497,2791,2214,2498,2559,2816,2595,2845,2908,3156,2295,2581,2657,2849,2678,2909,2955,320 1,2759,2965,2994,3237,3029,3260,3324,3544,1157,1361,1477,1884,1565,1954,1971,2338,1712,19 94,2052,2371,2144,2411,2419,2790,1748,2053,2162,2417,2188,2496,2540,2818,2252,2541,2582,2 838,2659,2871,2951,3183,1828,2170,2215,2513,2254,2558,2606,2854,2370,2633,2679,2921,2758, 2964,2983,3236,2418,2703,2794,2971,2817,3021,3039,3258,2846,3060,3124,3297,3170,3350,3421,3545,1836,2235,2349,2619,2410,2661,2743,2967,2435,2784,2806,3002,2823,3038,3084,3281,25 32,2819,2839,3058,2920,3106,3164,3372,2947,3172,3212,3396,3246,3428,3464,3633,2605,2855,2 932,3127,2976,3182,3215,3410,3028,3229,3259,3454,3298,3467,3523,3675,3077,3270,3325,3496, 3342,3535,3555,3711,3419,3564,3591,3704,3611,3740,3775,3886,1274,1527,1605,2016,1713,2056,2164,2495,1718,2165,2199,2524,2256,2594,2620,2949,1827,2212,2257,2623,2351,2658,2701,29 50,2399,2700,2789,2993,2820,3023,3046,3257,1830,2348,2401,2631,2492,2724,2795,3022,2512,2 812,2832,3050,2844,3100,3135,3340,2499,2842,2861,3099,2946,3165,3185,3397,2978,3219,3247, 3427,3269,3459,3499,3665,1943,2433,2493,2808,2527,2836,2860,3092,2573,2873,2923,3157,2956,3200,3228,3425,2785,2952,2977,3203,3016,3244,3268,3456,3068,3273,3332,3490,3375,3534,35 59,3700,2835,3000,3051,3256,3098,3296,3334,3524,3148,3369,3389,3539,3422,3581,3599,3731,3 213,3420,3429,3592,3457,3614,3585,3747,3512,3662,3676,3783,3683,3825,3842,3906,1988,2525, 2533,2945,2725,2959,2982,3218,2809,2992,3017,3249,3061,3275,3331,3526,2833,3059,3097,3280,3126,3335,3381,3547,3173,3391,3409,3569,3455,3595,3632,3753,2948,3101,3134,3380,3184,34 04,3447,3586,3248,3448,3465,3630,3513,3609,3671,3789,3291,3484,3532,3663,3548,3682,3702,3 812,3582,3707,3706,3838,3748,3849,3869,3943,2995,3171,3222,3449,3274,3466,3498,3645,3333, 3525,3536,3677,3563,3687,3705,3823,3382,3551,3587,3701,3600,3710,3749,3856,3644,3757,3770,3872,3800,3890,3902,3973,3426,3593,3628,3752,3670,3754,3796,3877,3674,3793,3814,3898,38 34,3913,3930,3994,3688,3828,3846,3919,3864,3933,3925,4000,3884,3951,3961,4018,3979,4026,4 035,4056,1373,1669,1740,2122,1792,2213,2288,2607,1829,2294,2352,2622,2403,2698,2702,3018, 1831,2402,2432,2697,2494,2837,2847,3076,2574,2848,2944,3149,2958,3188,3223,3453,1837,2451,2526,2843,2580,2933,2953,3180,2618,2966,2986,3230,3020,3261,3289,3468,2656,3001,3045,32 72,3093,3330,3351,3518,3107,3341,3392,3550,3395,3568,3594,3777,2171,2575,2604,2957,2630,2 987,3019,3251,2739,3047,3069,3309,3113,3371,3390,3530,2807,3075,3129,3343,3175,3394,3401, 3560,3202,3402,3408,3598,3479,3615,3658,3792,2834,3174,3198,3407,3239,3446,3452,3606,3263,3478,3501,3643,3538,3668,3678,3815,3308,3522,3549,3679,3583,3695,3733,3835,3627,3736,37 58,3857,3771,3875,3894,3971,2180,2621,2699,3044,2797,3074,3125,3374,2821,3136,3181,3403,3 214,3418,3423,3601,2872,3199,3238,3424,3262,3473,3497,3634,3299,3516,3537,3673,3561,3689, 3718,3820,2954,3250,3288,3500,3368,3533,3531,3690,3383,3554,3565,3712,3607,3734,3744,3859,3411,3584,3617,3741,3635,3765,3774,3878,3661,3788,3804,3899,3837,3915,3931,3995,2979,33 11,3370,3558,3400,3580,3608,3737,3471,3626,3648,3768,3653,3776,3798,3889,3485,3649,3660,3 795,3691,3803,3831,3912,3728,3836,3845,3920,3868,3944,3954,4003,3517,3703,3714,3821,3745, 3839,3848,3927,3759,3866,3879,3950,3895,3962,3977,4021,3808,3881,3900,3965,3917,3981,3986,4033,3928,3991,3999,4038,4010,4046,4055,4075,2255,2742,2813,3137,2870,3189,3231,3458,29 22,3245,3271,3475,3310,3505,3546,3719,2970,3290,3373,3527,3393,3579,3562,3730,3405,3590,3 610,3756,3646,3766,3781,3885,3096,3388,3406,3578,3470,3603,3629,3769,3474,3647,3655,3782, 3669,3799,3811,3908,3488,3664,3686,3810,3727,3830,3843,3921,3742,3861,3867,3945,3880,3955,3968,4014,3112,3469,3472,3642,3489,3652,3672,3802,3519,3694,3713,3824,3735,3840,3865,39 35,3616,3726,3746,3844,3760,3873,3882,3952,3801,3883,3901,3966,3918,3980,3985,4032,3654,3 764,3794,3874,3809,3897,3910,3970,3833,3914,3923,3984,3934,3992,4002,4041,3847,3929,3947, 3998,3960,4005,4013,4048,3972,4019,4025,4053,4030,4061,4063,4083,3128,3491,3504,3715,3602,3732,3743,3860,3631,3755,3767,3876,3797,3888,3907,3969,3659,3780,3805,3891,3822,3911,39 24,3983,3841,3932,3922,3989,3953,4001,4009,4044,3729,3813,3829,3916,3858,3926,3946,3996,3 871,3948,3959,4006,3967,4011,4022,4052,3896,3963,3976,4015,3987,4027,4031,4059,3993,4037, 4040,4065,4047,4068,4070,4080,3761,3832,3870,3949,3887,3958,3964,4012,3903,3978,3982,4024,3990,4028,4039,4062,3909,3988,3997,4036,4008,4042,4043,4069,4020,4049,4051,4071,4057,40 76,4078,4088,3942,4004,4007,4045,4023,4050,4054,4073,4029,4058,4060,4077,4066,4079,4084,4 090,4034,4064,4067,4081,4072,4082,4085,4091,4074,4086,4087,4092,4089,4093,4094,4095]

Sequence Group 1: Q1_8192

[0,1,2,4,8,16,32,3,5,64,9,6,17,10,18,128,12,33,65,20,256,34,24,36,7,129,66,512,11,40,6 8,130,19,13,48,14,72,257,21,132,35,258,26,513,80,37,25,22,136,260,264,38,514,96,1024,1025,67, 41,144,28,69,42,516,49,74,272,160,520,288,528,192,544,70,44,131,81,50,73,15,320,133,52,23,134,384,76,1026,1028,137,82,56,27,97,39,259,84,138,145,261,29,43,98,515,88,1032,1040,140,30,204 8,2049,2050,2052,146,71,262,265,161,576,45,100,640,51,148,46,1056,1027,75,266,273,517,104,1 62,53,193,1029,1088,152,77,1033,1030,164,768,1041,1034,268,274,518,54,83,57,521,112,135,78, 289,194,85,276,522,58,168,139,99,86,60,280,89,290,529,524,196,141,2056,2064,2080,2051,101,1 47,176,142,530,321,31,200,90,545,292,322,532,263,149,102,105,304,296,163,92,47,267,385,546,3 24,208,386,1042,1152,150,153,2053,2112,2057,2054,165,106,55,328,4096,4097,4098,4100,4104,4 112,4128,4099,536,577,548,113,154,79,269,108,578,224,1036,1057,166,519,552,195,1089,1044,270,641,523,275,580,291,2065,2058,2066,2176,59,169,560,114,277,156,1280,1058,87,197,116,170, 61,531,525,642,2060,2081,2113,2068,281,278,526,177,2304,2082,2072, 2084,293,388,1048,1060,2 055,2177,2114,2560,91,584, 769,198,1031,1153,172,120,201,336,62,282,1090,1536, 143,103,178,2 94,93,644,202,592,323,392,297,770,107, 180,1035,1064,151,209,284,648,94,204,298,400,608,352, 325,533,155,210,305,547,300,109,1092,1154,1043,1037, 184,534,537,115,4101,4160,4105,4102,41 13,4106,4114, 4224,167,225,326,306,772,157,656,329,1072,1038,110, 117,212,171,776,330,226,549, 1096,1281,538,387,308,216, 1045,1156,416,271,279,158,337,550,672,118,332,579,540, 389,173,12 1,553,199,784,179,228,338,312,704,1059,1282, 390,174,554,581,393,283,2059,2088,2116,2178,12 2,448, 353,561,4108,4129,4161,4116,4352,4130,4120,4132,203, 63,340,394,527,582,556,181,1050, 1537,1104,1061,1049, 1046,295,285,232,124,205,182,643,562,286,585,1160, 1284,299,354,2067,20 61,2096,2062,211,401,1288,1062, 1538,1120,185,396,2120,2305,2069,2180,344,586,1091, 1065,116 8,1052,645,593,1093,1066,535,240,4103,4225, 4162,4608,4107,4136,4164,4226,206,95,327,564,15 40,1073,800,402,356,307,301,417,2083,2306,2074,2561, 213,568,832,588,186,646,404,227,896,59 4,1098,1296, 1184,1544,1312,1552,4115,4109,4144,4110,4168,4353, 4117,4228,418,302,649,771,12 16,1568,360,539,4131, 4354,4122,4609,4176,4133,4121,4118,111,331,214,309, 2128,2085,2073,207 0,4232,4356,4360,4134,4610,4192, 5120,5121,188,449,1094,1068,1155,1105,217,408,2184, 2308,2 312,2086,609,596,551,650,229,159,420,310,541, 773,610,657,2562,2144,3072,3073,333,119,600,3 39,218, 368,652,230,391,313,1074,1097,450,542,1039,1344,334, 233,555,774,175,123,1157,1076,6 58,612,341,777,2115, 2089,2192,2076,220,314,424,395,673,583,1047,1158,355, 287,183,234,125,5 57,660,616,1408,1100,342,316,241,778, 1161,1106,563,345,452,397,403,207,1080,1051,674,558,78 5,432,2117,2090,2564,2097,2122,2320,2208,2568,357,187, 1121,1063,1283,1108,236,664,624,587, 780,705,126,242, 565,398,1162,1169,346,456,1285,1053,358,405,2336,2576, 2240,2592,303,569,24 4,595,189,566,676,361,1067,1122, 706,589,215,786,1539,1112,2118,2092,2179,2129,1164, 1054,64 7,348,419,406,464,680,2098,2121,2063,2368,801, 362,590,409,570,788,597,572,219,311,1170,109 5,1286, 1289,708,598,601,651,1185,1600,1069,1124,421,792,802, 611,602,410,1664,1075,231,688,1 172,1070,653,248,369, 190,364,654,659,335,1099,1290,2181,2100,2071,2182,480, 315,221,370,129 7,1541,1128,1186,613,422,425,451,4163, 4137,4240,4124,4165,4138,4612,4145,614,543,235,412,3 43,372,1077,1217,775,317,222,426,453,237,559,833,1176, 1101,1188,1792,1292,1298,804,712,243 2,2124,3074,3076, 2185,2130,2104,2075,2145,2087,2307,2132,834,661,808, 779,617,604,433,720,8 16,836,347,897,1542,1078,1107, 1081,243,662,1545,1136,2186,2193,2309,2077,454,318, 675,618,4 170,4368,4256,4616,4384,4624,4288,4640,898, 781,376,428,2091,2146,2563,2136,3080,3088,2188, 2078, 665,736,567,840,4166,4140,4227,4177,4146,4169,4111, 4416,625,238,1159,1102,2194,2119, 2310,2313,2209,2624, 2093,2148,1313,1218,1109,1300,2688,2099,2196,2094, 1546,1082,359,457,3 99,787,591,678,434,677,1192,1163, 3104,3075,2123,2314,1123,1110,349,245,458,666,620,363, 127, 191,782,407,4229,4148,4119,4230,4480,4172,5122, 5124,436,626,1084,1304,1113,1314,1553,1548, 571,465, 1220,1165,681,246,707,350,1125,1171,1200,1166,2321, 2565,2152,2210,2101,2241,3077,3 136,2200,2125,3081, 3078,599,668,790,460,1554,1345,1055,1224,2212,2816, 3089,3082,249,682,1 114,1569,573,411,803,789,709,365, 440,628,4233,4178,4152,4123,4193,4135,4355,4180,689, 374,4 23,466,2316,2322,2566,2102,2131,2105,2569,2160, 793,250,371,481,4234,4241,4357,4125,4139,4 194,4611, 4184,1316,1346,1556,1287,1173,1126,1129,1328,574,413, 603,366,468,655,900,805,1320, 1187,1116,1071,1291, 1409,1570,1348,5128,5136,4236,4126,6144,6145,6146, 6148,615,684,710,42 9,1232,1410,794,252,373,605,848, 690,1174,1177,713,632,482,806,427,904,2183,2126,2337, 2242, 414,223,1189,1130,2133,2324,2570,2106,663,692, 835,619,1079,1352,1560,1601,472,455,796,809, 2216, 2187,2147,2134,1572,1137,1178,1103,714,721,1293,1132, 4242,4167,4358,4361,4257,4672,4 141,4196,837,716,864, 810,606,912,722,696,1602,1248,1190,1543,2108,2328, 2137,2338,377,435,8 17,319,621,812,484,430,838,667, 1576,1219,1294,1665,1547,1299,2577,2572,2244,2189, 488,239,3 78,459,622,627,1604,1315,2149,2195,2224, 2190,1083,1193,437,380,818,461,496,669,679,724,841, 629,2578,2369,2079,2248,1584,1138,1301,1180,1111, 1221,351,467,4736,4147,4244,4142,5152,51 23,4171,4362, 4369,4613,4200,4258,4149,4289,5125,5184,438,737,251, 462,2138,2593,2340,2370, 2580,2311,2197,2150,442,441, 1140,1194,1085,1555,1549,1666,1305,1302,1550,1201, 469,247,683, 842,1317,1412,738,899,2153,2352,2344, 2211,670,783,849,820,2140,2095,2315,2433,728,928,791, 367,4248,4173,5129,5126,4260,4864,5137,5130,901,630, 1115,1608,685,844,1793,1222,633,711,11 96,1144,1225, 1360,253,691,2594,2372,2256,2434,1086,1306,1167,1127, 824,902,1202,1318,3090,3 200,2198,2201,4364,4370,4614, 4150,4179,4153,4617,4208,2213,2154,2103,2376,1117, 1668,686,7 40,850,375,444,470,483,415,1226,1616,4231, 4174,4385,4290,4181,4372,4618,4154,1347,1416,48 5,905, 1321,1794,795,473,1131,1204,1175,1233,1308,1672,1118, 1228,634,744,852,960,2584,2625, 2596,2161,2202,2127, 2317,2156,1322,1424,1632,1376,1349,1557,1179,1234, 2626,2272,3084,310 5,2214,2567,2600,2243,865,693,1329, 1571,1324,1133,1208,1558,1561,1139,797,906,3137, 3092,2 318,2689,715,807,1191,1249,2571,2323,2628,2339, 1350,1330,474,636,694,254,717,575,913,798,1 796,1181, 1680,1353,811,379,2107,2217,2608,2162,4264,4235,4195, 4182,4156,4376,4185,4386,69 7,431,607,489,866,723,486, 908,2325,2204,3328,3106,2135,2245,2164,2218,1134, 1141,718,813,47 6,856,839,725,1236,1195,1800,1354,698, 914,752,868,819,814,439,929,2109,2579,2573,2690,1250, 1573,490,623,671,739,916,463,843,381,497,930,1562, 1411,1332,1240,2329,2326,2574,2225,2341, 2436,3096, 3108,2139,2632,2817,2246,1440,1295,1303,1182,4625, 4620,4292,4237,6152,6160,617 6,6147,4197,4243,4272, 4238,4626,4417,4127,4296,4186,4641,4388,4418,4628, 4359,4245,4198,13 61,1574,1696,1142,1356,1603,1564, 1413,1197,1145,1577,1223,821,726,1808,1203,1252,1362, 133 6,1728,961,872,1414,1198,3079,3201,2220,2168,2249, 2384,2110,2330,492,631,1578,1605,3138,3 584,2191,2151, 4201,4400,4392,4259,4188,4143,4363,4481,729,700,443, 741,1417,1307,1146,1472, 1377,1585,1227,1087,845,920, 382,822,4642,4420,4304,4482,5138,5248,4246,4249,6149, 6208,61 53,6150,4261,4202,4151,4424,1364,1418,1551, 1606,1580,1205,1319,1309,1256,1148,851,730,222 6,2342, 2141,2692,4632,4673,4644,4209,4250,4175,4365,4204, 4674,4320,5132,5153,4262,4615,46 48,4291,2250,2640, 2371,2440,2345,2818,2155,2228,5185,5140,4366,4737, 4619,4371,4676,4387,3 083,3112,2199,2257,498,880,742, 445,471,635,1229,1206,1667,1586,1310,1609,932,687, 1323,137 8,2332,2696,2142,2252,6161,6154,6162,6272, 4155,4265,4656,4210,2346,2448,2656,2400,903,825, 500, 846,745,826,1235,1425,1209,1420,732,446,962,936,475, 853,1368,1610,867,637,907,487,166 9,1617,2373,2581, 2203,2258,2353,2595,2348,2157,3140,3202,3091,3085, 1559,1264,695,746,2232, 2582,2585,2163,1230,1119,828, 753,1351,1588,854,857,2215,2273,2374,2354,2820,2205, 2704,23 77,4373,4252,5376,5154,4183,4293,4212,4266, 4157,4627,4621,4738,6156,6177,6209,6164,4377,4 374, 4622,4273,6400,6178,6168,6180,1824,1426,1380,1331, 1325,1441,504,799,3120,3086,2158,21 65,2260,2219,2824,2378,4389,4484,5144,5156,6151,6273,6210,6656,255,964,1237,1592,2274,259 7,3144,3329,1856,1612,909,719,1210,1670,1428,1251,1920,1618,477,915,638,748,1442,1326,167 3,1795,944,869,491,699,754,858,4187,4680,4865,4294,5127,5249,4268,4216,4297,4432,4158,437 8,5186,5632,4239,4199,1384,1563,478,968,383,910,815,976,2586,2435,2356,2264,3093,3204,246 4,2319,2327,2206,2385,2598,2720,2166,2380,2627,1135,1355,870,917,1238,1333,727,493,873,70 1,1212,1473,1241,1432,1633,1620,2588,2437,2221,2169,2601,2247,2832,2227,2276,2386,2360,2752,3107,3330,2438,2222,1575,1674,1253,1183,1444,1334,931,756,2602,2629,2441,2331,1565,179 7,860,499,731,823,1634,1681,1357,1143,1624,1363,2170,2496,2401,2609,1242,1392,1676,1254,9 22,874,1415,1337,918,502,1474,1566,4274,4390,4189,4740,4298,4688,4419,4488,933,743,760,88 1,2251,2111,2388,2442,4393,4866,4203,4276,5131,5160,4247,4305,1358,1257,1579,1798,1199,1147,1682,1636,2575,2630,2604,2229,3098,3585,3152,3109,494,702,921,501,1365,1801,1244,1338, 4380,4744,4190,4300,4394,4496,4704,4448,3097,3094,2343,2333,2280,2172,2253,2230,1448,141 9,1697,1607,2691,2610,2334,2633,1379,1311,1207,1258,1149,1581,1684,1640,1366,1340,1265,18 02,1587,1369,1476,1421,3208,3332,2347,2402,2259,2449,3336,3110,4421,4629,4251,4306,4401,4643,4396,4205,876,847,992,447,1427,1231,733,827,1698,1582,1809,1456,934,882,937,963,1381,1 211,1260,1688,3586,3168,2233,2444,2392,2634,3139,3113,3216,3100,2693,2641,5188,5250,5139, 5133,4280,4630,4633,4211,747,505,855,924,734,829,965,938,1648,1611,1804,1729,3141,3114,258 3,2288,4263,4321,4422,4402,4868,4253,4752,4425,2254,2143,2375,2612,884,506,749,945,1150,1266,966,755,859,940,1589,1422,1370,1480,1382,1429,1327,1593,1268,1619,5168,5134,4206,4213, 4308,4267,4872,4426,3588,3121,2848,2450,2404,2355,2349,2465,2261,2616,2880,2636,830,911, 871,639,888,479,1213,1590,946,750,969,508,4322,4645,5192,5377,4634,4483,4404,4312,5141,52 52,4512,4367,4375,4254,4433,4646,861,757,970,919,2234,2694,2452,2275,2944,2642,3146,3344, 3232,3592,3360,3600,2466,2350,2697,2819,3264,3616,2408,2587,875,862,758,948,1700,1385,173 0,1613,2159,2379,2262,2357,1239,1810,1671,1372,4768,4214,4428,4675,4636,4485,4269,4217,14 43,1430,1488,1704,1825,1386,1614,1433,4649,4295,4880,4275,4324,4434,4408,4800,1594,1812,1 621,1596,1243,1335,977,923,1732,1622,1625,1675,2236,2497,3142,3116,1445,1816,1826,1635,32 03,3153,2265,2456,1626,1434,1255,1712,2657,2644,2599,2698,2277,2207,2468,2358,972,761,167 7,1272,5155,5378,4486,4270,4650,4677,4489,4379,2589,2821,2658,2705,2381,2167,2648,2387,13 93,1214,1388,1678,2266,2416,2700,2278,6155,6184,6212,6274,4218,4544,4449,4657,4299,4159,4 436,4490,4623,4678,4652,4277,2439,2361,3122,3145,1683,1359,1504,1339,1245,1394,877,952,49 5,703,935,978,883,762,503,925,2498,2590,3087,3392,2382,2281,2603,2822,878,735,1637,1446,2223,2171,3205,3124,1449,1475,993,885,2706,2660,2389,2825,2268,2362,2472,2443,2721,2631,309 5,3206,2403,2335,2231,2282,1638,1567,1259,1436,1367,1396,1799,1341,5146,5633,5200,5157,51 45,5142,4391,4381,4328,4220,4301,4278,4739,4658,4382,4681,2173,2605,2708,2664,3456,3148,2 390,2364,2289,2826,3209,3154,2611,2393,2500,2445,5256,5380,4395,4450,6163,6157,6192,6158, 4307,4497,5384,5158,5634,5216,4281,4492,1246,1450,1477,1261,2451,2255,3128,3099,2722,260 6,2833,2480,2405,2235,3169,3111,3331,3156,2284,2712,1583,1857,1828,1736,6216,6401,6165,62 76,4440,4682,5187,5161,1858,1685,1832,1803,2672,2635,2828,2753,5264,5148,4741,4689,5189,5 162,4631,4336,2174,2290,2613,2446,939,994,1641,1628,1457,1744,980,926,1840,1860,1371,1921, 1267,1686,1478,1342,3210,3217,2394,2504,3333,3101,2406,2453,1699,1642,764,941,4302,4191, 4423,4660,5636,5169,4896,4498,1922,1805,967,886,1400,1452,831,947,1689,1760,1591,1864,507, 889,1649,1262,4452,4403,4397,4513,6179,6402,6170,6657,4309,4664,4928,4684,4282,4742,4500, 4323,2351,2617,2292,2643,1383,1481,1423,1811,984,751,1615,1702,1458,1701,1373,1269,2237, 2614,2724,2409,3115,3170,2754,2637,1482,1690,1644,1387,1151,1215,1806,1431,1460,1650,159 5,1489,942,996,1705,1270,4992,4690,5194,5392,5280,5640,5408,5648,2263,2834,3587,3160,971, 890,1731,1374,1623,1692,1814,1484,1273,1706,509,949,1597,1435,973,1000,892,950,1827,1813, 3212,3102,2695,2396,2467,2454,2512,2728,4514,4398,4745,4867,5312,5664,4456,4635,4207,4427,4310,4405,6224,6181,6169,6166,4284,4545,5190,5164,5251,5201,4313,4504,2849,2410,2638,24 57,2618,2836,2645,2620,2267,2359,3218,3143,3334,3337,2756,2646,2649,2699,3233,3648,3117,3 172,2469,2840,2850,2659,2650,2458,3712,3123,2279,2736,1733,1389,1464,1652,3220,3118,2701, 2296,2417,2238,2412,2702,2707,2383,3147,3338,1713,1398,1447,1490,2528,2363,2269,2418,6280,6404,6408,6182,4705,4692,4647,4746,4325,4255,4516,4406,4637,4869,4706,4753,863,759,1817, 1274,3345,3589,3176,3234,6658,6240,7168,7169,4429,4215,4696,4435,1395,1505,1598,1437,100 8,510,1627,1390,2661,2470,2473,2499,2662,2591,2283,2460,2391,2420,3125,3265,2823,2365,227 0,2474,1492,1679,1924,1829,979,953,1639,1708,2501,2285,2607,2881,3224,3149,3236,3840,3340,3346,2852,2760,2882,2709,2856,2827,2665,2652,2481,2768,1734,1453,1818,1276,4314,4464,474 8,4326,4487,4409,5170,5193,4546,4638,5135,5440,4430,4329,4651,4870,4271,4219,5253,5172,47 54,4708,4437,4873,6211,6185,6288,6172,4316,4410,4520,4491,763,974,1397,1629,1872,1714,954, 879,981,982,1737,1656,2864,2884,2395,2945,3590,3126,3155,3129,2291,2710,3593,3184,1506,1830,1451,1928,2502,2366,2723,2666,4769,4679,5143,5254,4451,4383,4279,4330,4221,4653,4756, 4712,5504,5196,4438,4412,1438,1247,1687,1716,927,995,1859,1643,1496,1479,1820,1833,2946,2 829,2424,2476,2713,2784,2615,2888,1738,1745,765,956,1861,1740,1888,1834,887,985,1630,1936, 2673,2286,3207,3150,1746,1720,1401,1459,1841,1343,997,986,3361,3266,3157,3348,4337,4874,5257,5202,4659,4441,4548,4493,4499,4303,5176,5147,4770,4654,4881,4528,6213,6186,6660,619 3,6218,6416,6304,6664,3594,3130,2407,2505,1645,1836,1508,1454,4453,4283,5217,5159,5379,52 04,4332,4760,2447,2835,2639,2726,1862,1691,1512,1263,2482,2725,3240,3211,1402,1483,1646,1 651,4720,4683,4876,4801,4222,4338,4661,4494,5258,5265,4442,4552,5381,5149,4454,4501,3171, 3158,2397,2293,2506,2714,2668,2411,2175,2239,2830,2455,943,891,1461,1404,6432,6672,6336,6 688,4399,4665,4340,4691,4285,4662,4772,4457,5163,5218,4802,4685,998,766,1842,1485,2484,26 74,3132,3352,4311,4882,5635,5208,6214,6188,6275,6225,3161,3362,3601,3596,1520,1693,1703,1 748,2619,2513,3268,3213,2729,2294,2755,2398,3173,3219,3248,3214,511,988,1865,1653,1375,14 91,1462,1761,2647,2716,2838,2508,3602,3393,3103,3272,1275,1486,1466,1465,1001,951,1493,12 71,1707,1866,1762,1923,2297,2730,3162,3617,1002,893,1694,1807,975,894,1873,1844,1752,1952, 1815,1391,5260,5150,4743,4444,4515,4502,4560,4776,6194,6217,6159,6464,4897,4458,4686,450 5,4666,4884,4693,4668,4315,4407,5266,5191,5382,5385,4804,4694,4697,4747,5281,5696,2621,24 59,2851,2837,1925,1654,1709,1868,2757,2413,2488,2676,1657,1735,1009,955,1277,1715,1848,19

26,2737,2422,2471,2514,2841,2298,2419,2529,3364,3394,3604,3335,5165,5220,4517,4888,4898,4707,4698,4506,5760,5171,4327,4784,5268,5166,4749,4344,4465,4286,4460,4750,4755,4431,5195,5386,6277,6196,6167,6278,4576,4411,4317,4466,3221,3174,3177,3376,2622,2461,2651,2414,2516,2703,2948,2853,1710,1764,1874,1399,5393,5637,5224,5282,4709,4518,4521,4547,3368,3235,3164,3119,1468,1494,1004,1010,1507,1439,1509,1929,3339,3457,3618,3396,2663,2732,2758,2477,3280,3458,2842,2300,4710,4639,4331,4508,4439,4468,5173,5313,2421,2653,2896,2738,3222,3225,2761,2680,1819,1497,1658,1768,2530,2854,2475,2952,1876,1984,957,983,2462,2271,3237,3178,1889,1717,1821,1930,1739,1831,1498,1660,4871,4413,4318,4522,4549,4333,4655,4929,2711,2740,2883,2667,3127,3400,3608,3649,2520,2503,2844,2857,3620,3185,3226,3151,5272,5197,5284,5888,5388,5394,4900,4808,6528,6220,7170,7172,6281,6226,6200,6171,958,987,1718,1278,1741,1599,1012,999,2762,2769,3341,3180,2885,2764,2912,2858,6241,6183,6403,6228,4930,4757,4904,4875,4713,4700,4529,4816,4912,4932,4443,4993,2654,2960,2770,2744,3650,3296,3238,3591,5638,5174,5203,5177,4339,4758,5641,5232,2425,2483,2865,2367,2669,2860,2532,2478,2886,2715,3624,3267,3342,3713,3595,3347,2536,2287,2426,2507,2670,2675,3652,3363,3131,3241,2485,2428,2866,2509,2544,2717,6282,6289,6405,6173,4550,4414,4771,4714,4994,4877,4472,4524,6187,6242,6659,6232,1937,1822,1835,1403,1721,1455,1016,767,2727,2772,2889,2677,1631,1513,1890,1747,3632,3186,3349,3228,3159,3269,2399,2515,1510,1932,1742,1837,1500,1880,1863,1749,2486,2785,2299,2510,2490,2489,3188,3242,7176,7184,6284,6174,4761,4832,4663,4936,4721,4334,5255,5198,6290,6215,6406,6409,6305,6720,6189,6244,5409,5314,5205,5396,1722,1938,989,1003,1776,1892,1843,1838,1463,1953,1514,1647,1695,1763,1940,1487,3133,3603,3597,3714,3353,3350,3598,3249,6784,6195,6292,6190,5642,5178,4455,4553,4495,4883,4687,4774,4530,4773,5288,5259,1867,1405,990,1005,1521,1954,1845,1750,2517,2295,2731,2890,1985,1896,1516,1655,1753,1724,1467,1765,3365,3460,2786,2947,2718,2831,2897,2868,2776,2976,2839,2415,2949,2678,3163,3656,2733,2892,3841,3270,7200,7171,6219,6410,5219,5206,4445,4341,4554,4762,4716,4459,4223,4287,4878,4503,4532,4722,5180,5400,5209,5410,5649,5644,1869,1944,1406,1846,1875,1754,1522,1904,1766,1469,959,1011,2681,2759,3244,3192,1495,1659,1956,1711,1927,1849,1013,895,1524,1870,1769,1850,1756,1470,1986,1960,4667,4561,5316,5261,4777,4342,4803,4446,5221,5267,5296,5262,6417,6661,6248,6306,6197,6337,7173,7232,6296,6221,7177,7174,4695,4764,4886,4556,5650,5441,5151,5320,6308,6912,7185,7178,4345,4778,5210,5665,1499,1877,1891,1661,1931,1511,1719,1770,3273,3408,2301,2739,3134,3354,3215,3175,4669,4507,4899,4885,4805,4461,4536,4724,2872,2950,3250,3366,3165,3716,2734,2788,2898,2423,2492,2518,2531,2463,3274,3664,3395,3464,2533,2953,3369,3842,2843,2521,3179,3252,3223,3281,3356,3720,3166,3276,2682,2792,2900,3008,1852,1777,1878,1881,3370,3472,3680,3424,3397,3605,3227,3282,4785,4470,4519,4562,6412,6418,6662,6198,2913,2741,3377,3619,3372,3181,3256,3606,6227,6201,6665,6256,4889,4346,4467,4577,3609,3187,2845,2954,2763,2855,3239,3297,5412,5442,5652,5383,5269,5222,5225,5424,4670,4509,4699,4462,4564,4751,4996,4901,1528,1823,1279,1988,3398,3378,2522,2684,5416,5283,5212,5167,5387,5505,5666,5444,4711,4780,4806,4525,5328,5506,4890,4348,2742,2302,2765,2623,2961,2846,3844,3229,4469,4701,4944,4786,5270,5273,4809,4728,4578,4902,4523,5000,6279,6222,6433,6338,37

28,3401,2859,2427,2745,2479,2655,2537,2914,2771,2534,2956,1933,1743,1501,1939,1006,1014,1662,1772,1968,1893,1515,1723,1778,1882,1502,1992,1017,1018,1407,1934,4510,4319,5285,5226,6229,6420,6666,6202,4759,4788,4931,4715,5175,5448,5656,5697,1839,2000,1894,1941,3182,3189,2766,2861,4568,4551,4892,4905,6312,6283,6243,6230,2524,2904,2887,2773,1751,1517,1897,1725,5668,5233,5274,5199,4810,4817,5389,5228,4933,4812,4960,4906,4702,5008,4818,4792,5698,5344,5286,5639,6204,6424,6233,6434,4473,4531,4913,4415,4717,4908,4580,4526,3284,3243,3848,3402,2746,2962,2800,2916,2867,2862,2487,2977,3298,3621,2538,2671,4934,4763,5672,5315,5390,5761,5643,5395,6673,6668,6340,6285,4584,4335,4474,4555,4718,4723,5700,5411,6245,6291,6320,6286,5179,5289,4533,4476,4914,4557,4592,4765,2719,2787,2964,2511,2891,2429,2545,2978,4775,4820,4937,4725,6674,6465,6175,6344,5680,5234,5397,5276,5207,5317,4447,4563,4534,4833,4347,4558,6234,6689,6436,6466,6676,6407,6293,6246,4538,4537,5236,5290,3610,3459,3380,3288,3488,3343,3351,3230,3409,3622,3744,3190,3404,3651,3612,3461,5181,5651,5645,5762,5401,5398,5646,5297,4565,4343,4779,4938,5413,5508,4834,4995,1955,1780,1884,1523,3245,3193,3625,3271,2869,2774,3856,3251,1755,1847,1946,1898,3300,3410,3384,3776,3009,2920,3462,3246,2540,2679,3626,3653,2777,2748,2491,2789,6249,6448,6440,6307,4766,4879,4945,4916,6236,6191,6411,6529,4824,5024,4887,4463,3465,3355,3194,3520,1942,1526,1957,1767,3425,3633,3275,3135,1784,1905,1518,1726,2893,2968,2430,2870,1945,1525,1900,1871,3412,3466,3599,3654,3628,3253,3367,3357,991,1020,2016,1471,3304,3196,2899,2778,4997,4726,5211,5704,4781,4940,5889,5318,2546,2928,2790,2493,2519,2683,3277,3254,1757,1851,1958,1906,3715,3634,3358,3657,2980,2735,3371,3426,2951,2873,2548,2894,4729,4807,5292,5240,5321,5456,4349,4787,6690,6468,6352,6530,5182,5402,5263,5223,2793,2874,3283,3473,3257,3468,2780,2494,3010,2984,2523,2901,3416,3658,2915,2685,2955,2535,3717,3665,3607,3312,2743,2794,1961,1987,1771,1529,3278,3167,2876,2801,4920,4998,5298,5414,7186,7296,6294,6297,1879,1948,1758,1853,3399,3636,2902,2905,3872,3474,3428,3379,3373,3489,2552,2847,2303,3012,3285,3640,1007,1015,1989,1962,3904,3660,2957,2767,1908,1530,1773,1969,1990,1779,1883,1964,3258,3718,3476,3299,6309,6250,6199,6472,5213,5764,4782,4836,4946,4471,4540,4566,4579,4511,5322,5712,5443,5512,4581,5001,5417,5890,4891,4569,5227,5300,5271,5329,5404,5768,5214,5324,4730,4840,4948,5056,6680,6721,6692,6257,6298,6223,6413,6252,5418,5520,5728,5472,5445,5653,5275,5330,6722,6368,7180,7201,6310,6663,6696,6339,4961,4789,5425,5667,5420,5229,5304,5654,5657,5235,4893,5002,7233,7188,6414,6785,4811,4903,5287,5345,3968,3666,2525,2963,2686,2796,3490,3374,6667,6419,6724,6435,5446,5426,4570,4732,4790,4350,4813,4671,5009,4894,5892,5277,5776,5449,4907,4475,6203,6313,6704,6258,3721,3843,2992,2917,2539,2747,2802,2906,4793,4527,4703,4585,4962,4819,4582,5004,1854,1935,1895,1663,3432,3611,2526,3016,6421,6300,7424,7202,6231,6341,6260,6314,2431,2958,2863,3024,3183,3403,2918,2965,1912,1503,1019,1021,3286,3381,2775,2541,5230,5237,4814,4909,4572,4952,4935,4821,5332,5291,5896,5450,4794,5010,4848,4964,4915,4910,4535,5025,6205,6675,6669,6786,5346,5669,4586,4719,4767,4835,5012,4559,2921,2749,3260,3521,3289,3480,3681,3668,1970,1774,1993,1532,3623,3722,3301,3231,4939,4477,4593,5026,5658,5507,5428,5336,6425,6422,6670,6321,6437,6532,7192,7204,6235,6728,6913,6342,5536,5391,5399,5278,5457,5670,5792,5238,5452,5699,5660,5509, 5293,5241,5673,5319,4917,4822,5904,5299,3492,3382,2979,2804,3613, 3845,2908,2547,1885,1781,1994,1943,2779,2871,3682,3729,3405,3191,3672,3411,1899,1886,1782,1972,2001,1947,1996,1785,3290,3440,3724,3302,5348,5458,5432,5824,5057,4968,5510,5294,71 75,7297,6316,6264,6345,6480,6206,6426,4588,4727,5674,5701,7234,7680,6287,6247,2970,2922,3 463,3385,2966,2550,3522,3614,4825,4796,4539,4837,5513,5403,5242,5568,2981,2791,2808,2929, 3406,3305,3627,3846,1901,1976,1519,1727,3247,3195,3730,3684,2542,2750,2969,2549,3413,3849,3292,3386,5473,5681,5323,5183,4941,5016,4478,4918,5460,5514,5647,5702,5676,5301,5415,54 05,3496,3467,3745,3655,1959,2002,1907,1786,3427,3359,3255,3306,3197,3629,3732,3688,1527,1 949,1902,1759,3414,3388,3313,3850,5352,5244,4947,4826,6322,6438,6237,6788,3635,3417,3524, 3469,2924,2895,3040,2495,3475,3279,2781,2875,2017,1909,1963,2018,6346,6736,6467,6536,6441,6914,6251,6324,7179,7208,6295,6353,4594,4976,4838,4541,3746,3630,3857,3504,2982,2930,29 85,3011,4567,4731,5325,5302,5763,5682,5406,5705,3429,3259,3308,3736,2795,2553,2903,2972,5 028,4783,5419,5474,6428,6792,6238,6348,2782,2877,3013,2986,3696,3659,3852,3777,6442,6544, 6752,6496,4999,4921,4596,4942,4841,4922,5331,5521,5305,5516,4828,4542,5058,5032,4571,4949,5464,5706,4963,4733,2004,1950,1788,1965,2932,2554,2797,2993,1991,1910,1855,1971,3198,33 14,3014,2803,5003,4583,5765,5713,6469,6677,6299,6354,6449,6691,6444,6253,7236,7298,7187,7 181,2907,2988,3637,3470,3418,3528,3430,3477,5655,5360,4791,4842,6328,6678,6681,6259,5326, 5215,4924,4849,5447,5684,4950,4953,6311,6369,6470,6450,6916,6301,6800,6473,1022,1023,1531,1913,3375,3641,3316,3667,2878,2959,2919,2687,2936,2527,3261,3638,5920,5522,5476,5427,54 21,5537,4600,4895,7216,7182,6254,6261,6356,6315,6920,6474,2994,2798,3017,2556,2909,2805,3 018,2967,2008,1775,1966,2020,2923,2910,2806,2996,3748,3433,3778,3661,3287,3858,3719,3420, 4351,5060,5333,5688,6370,6693,7240,7425,1995,1914,1533,1973,3491,3478,3536,3752,1997,2024,1916,1974,3873,3434,3662,3481,3642,3860,3669,3644,3291,3383,3025,2971,5952,5708,5005,48 15,5306,5766,5524,5347,3780,3670,3673,3723,3493,3864,3874,3683,6016,5714,4573,5011,4734,4 844,5538,5422,3674,3482,3303,3760,1887,1783,2032,1534,3020,2809,3725,3320,3441,3262,3436, 3726,5769,5891,5040,4965,4587,4795,4850,4954,5480,5659,4574,5064,4479,5006,4911,5072,6682,6531,6452,6360,7189,7300,6560,6415,6423,6302,6481,6694,6816,6262,6476,6723,5231,5451,49 66,5013,5334,5429,4823,4589,4969,4797,5308,5569,5337,5528,5729,5716,3731,3407,3552,3387,3 293,3442,2925,3000,6684,6533,6317,6265,6697,6343,6928,6323,2543,2751,2983,3026,2003,1977, 1787,1998,2931,2810,2551,2973,2926,2783,3685,3494,6372,6482,6456,6848,7203,7426,6534,6318,5671,5770,5349,5279,5540,5430,5027,4852,6698,6725,6537,6427,5661,5893,4956,4595,4827,49 19,5730,5777,5453,5239,5720,5459,6266,6592,6497,6705,5338,5488,5772,5350,3497,3523,3041,2 933,3686,3615,3307,3484,5018,4970,5511,5433,5014,4598,5570,5662,3415,3444,3847,3389,1978, 1903,2005,2006,5029,4839,4856,4977,6347,6207,6484,6538,3294,3498,3525,3309,3631,3905,3876,3784,3906,3733,3880,3851,2987,3042,3689,3676,5454,5353,5675,5894,5295,5243,5778,5732,66 71,6726,6700,6325,7194,7681,7248,7205,4590,4798,5017,4597,5461,5897,5340,5434,7193,7190,6 439,6429,6376,6268,6349,6326,1951,2019,1789,1980,3505,3792,3028,2974,3888,3908,3419,3969, 1911,2009,2021,2010,5544,5515,5793,5703,6787,6706,6430,6729,5475,5407,5303,5354,5245,5677,5780,5736,5462,5436,5361,5898,5683,5465,5572,5517,7304,7428,6443,6498,6355,6545,7432,72 06,4972,4943,5088,4543,5523,5327,4829,4923,5794,5678,5905,5552,5030,4978,5033,5059,5477,5 307,5356,5784,7682,7264,6329,6540,6488,6730,7235,7209,7312,7196,6789,6737,4843,4601,4951, 5020,4830,4925,5061,5034,5744,5707,5900,5825,7237,7210,6679,6384,6350,6239,6471,6708,4980,4602,4845,5041,5246,5362,5062,4851,4955,5036,5685,5518,3315,3734,3526,3390,3747,3690,28 12,2989,3970,3853,3015,2934,1967,1915,2022,1790,5466,5576,5478,5525,5423,5689,5364,5715,3 448,3500,2879,2995,3737,3808,3639,3912,7684,7217,6944,6546,6500,6451,6445,6561,6357,6712, 6976,6732,4926,5007,4967,4735,2555,2937,3697,3310,3431,3529,3471,3859,3032,2799,3663,3750,3506,3749,3421,3317,4984,4575,5309,5686,5042,4846,5065,4604,4957,4853,5066,5015,6330,67 90,6548,6371,3530,3738,3692,3435,1535,2012,2025,1975,3199,3263,3854,3479,3508,3698,3643,3 537,2990,3044,3753,3318,3019,2938,3779,3422,3671,3740,3862,3532,3321,3754,2557,2997,7040, 6738,7242,7440,7328,7688,7456,7696,6562,6446,6793,6915,7360,7712,6504,6683,3645,3483,3021,3048,2026,1917,1999,1918,2940,2998,3875,3861,3781,3437,3512,3700,4971,4958,4854,5044,57 96,5481,5826,5709,3761,3446,3495,3538,2911,2807,3865,3322,3443,3553,3646,3485,3056,2558,3 675,3438,6255,6475,6358,6453,5335,5906,5767,5468,5539,5526,5584,5800,5921,5482,5710,5529, 5690,5908,5717,5692,5339,5431,5073,5019,5828,5718,5721,5771,6332,6593,7238,7212,5541,5912,5922,5731,7299,7249,6361,6552,3540,3727,3972,3877,3027,3001,3687,3756,3782,3501,3866,33 24,2811,3022,3445,3677,3920,3762,3002,2927,2033,1979,2028,2034,5722,5530,5351,5808,6753,6 740,6695,6794,3029,3030,3785,3704,3554,3878,3499,3976,3486,3295,3735,3764,1981,2007,1982, 2011,2975,3043,3907,3691,3544,3527,3868,3881,3786,3793,2813,3004,3909,3788,3936,3882,2935,3033,3678,3984,3794,3768,3449,3507,3889,3391,3045,3034,3693,3884,3556,3502,6373,6303,65 64,6454,5068,4857,5773,5368,6685,6917,6754,6801,6477,6263,6744,6483,5489,5310,5484,5774,6 362,6512,6796,6374,6535,6457,7218,7241,5779,5455,5600,5435,5341,5490,4973,5048,4591,4799, 5031,5074,4979,4858,4599,5021,6594,6686,7183,7488,6478,6377,6699,6918,4974,4831,5733,5542,6319,6267,7301,7220,5545,5571,5089,4981,6802,6756,6485,6921,6364,6458,6568,6539,6817,67 27,7191,7302,6499,6431,6327,6378,5734,5663,5355,5532,5463,5492,5895,5437,3910,3739,3560,3 311,3450,3531,3694,3699,6269,6701,6804,6760,7552,7244,6486,6460,6385,6922,7305,7250,6707, 6489,6596,6541,5342,5546,5573,5357,6547,6351,7224,7195,6818,6702,6929,6576,6501,6331,7265,7207,7427,7252,6380,6808,5679,5953,5924,5832,5954,5781,5928,5899,6768,6731,6924,6849,29 91,2939,3509,3452,3046,2814,3890,3533,6270,6386,6709,6542,5035,5090,5737,5724,5553,5840,5 076,5022,5936,5956,5467,6017,5363,5782,5574,5438,7306,7313,6490,6600,7429,7197,6502,6549, 5795,5738,4860,5037,6018,5901,5063,4982,5496,5548,4927,5043,5785,5856,5687,5960,4603,4985,5745,5358,3568,3741,3751,3796,2559,3036,3913,3701,2036,2023,2040,1791,3423,3539,3510,38 09,3323,3534,3514,3513,3049,2999,3541,3319,3755,3914,3810,3971,3050,2941,3742,3855,2013,2 027,2014,2029,3023,2942,3921,3892,3800,4000,3863,3439,3973,3702,3757,3916,6447,6713,6388, 6739,5479,5577,5519,5907,5080,4847,5711,5798,5554,5797,5469,5365,3705,3783,3057,3003,3325,3763,3896,3974,6333,6710,6820,6505,7211,7266,6850,6733,5578,5786,5740,5483,5247,5311,59 02,5527,5556,5746,5691,5585,5038,5092,5801,5366,6359,6930,7683,7256,5067,4986,5827,5470,5 719,5788,5910,5580,5369,5802,4605,5045,5693,5531,5069,5096,4988,5046,5923, 5909,7308,7198,6791,6492,6563,6550,6608,6824,6945,6506,6734,6553,6714,6932,6741,6716,6363,6455,7314,7239,7430,7433,6852,6742,6745,6795,7329,7744,7213,7268,6565,6936,3758,3812,3922,3447,3516,3542,3052,3058,6946,6755,6746,6554,7808,7219,6375,6832,5829,5485,5560,5748,7316,7214,6797,6392,3555,3487,3557,3977,3867,3545,3706,3816,6513,6334,6508,6798,6803,6479,7243,7434,5809,5494,5543,5586,6624,6459,6365,6514,4959,4855,5913,5370,7441,7685,7272,7330,5491,5601,5694,5533,5104,4606,5723,5486,6757,6566,6569,6595,6758,6687,6379,6556,3924,4032,3005,3031,3937,3765,3869,3978,6487,6516,7221,7361,6919,6461,6366,6570,3787,3879,3546,3708,3006,3035,3766,3326,5588,5775,6020,5925,5075,5049,5735,5804,3789,3647,3060,3047,3985,3870,3883,3451,6597,6381,6703,6977,7320,7245,7332,7936,7436,7442,6948,6856,6978,6805,6952,6923,1983,2035,2037,1919,3769,3503,3064,2815,6761,6748,6577,6864,5830,5549,5914,5372,4859,5070,5493,5725,5968,5810,5050,4975,5077,5078,5833,5752,6960,6980,6491,7041,3679,3561,3938,3795,5558,3980,3790,3885,7686,7222,7251,7225,6387,6806,7689,7280,5602,5926,5547,6024,6598,6462,6819,6762,5534,5343,5783,5812,5023,5091,5955,5739,5592,5575,5916,5929,7042,6925,6520,6572,6809,6880,6711,6984,5834,5841,4861,5052,5957,5836,5984,5930,4983,5081,5726,6032,6769,6382,7303,7246,5842,5816,5497,5555,5937,5439,5093,5082,7457,7362,7253,7444,7690,7226,6503,6601,5741,5932,5604,5550,3548,3928,3911,3797,3770,3986,3037,3051,6543,6931,6735,6822,5958,5787,5608,5359,3824,3940,3891,3886,3511,4001,3562,3695,6578,6821,7336,7307,5498,5579,5742,5747,7267,7254,6493,6389,6602,6810,6764,6507,6271,6335,6926,6551,5039,4987,5557,5500,5094,4862,5938,5581,6580,6770,7228,7448,2030,2038,2041,2042,3743,3811,3988,3535,7257,7458,7697,7692,5616,5789,5799,5844,3915,3453,3038,3053,3569,4002,3893,3798,4033,3944,3564,3703,3801,3772,3515,3813,6715,6609,7364,7309,6825,6390,6851,6494,7269,7315,7344,7310,4607,5084,5961,5749,5471,5587,5558,5857,6743,6812,6934,6604,7698,7489,7199,7368,5371,5582,5562,5561,5097,5047,5589,5367,5803,5962,5858,6019,3917,3992,3454,3894,3923,3802,3570,3952,6393,6826,7258,7713,5098,4989,5790,5903,5071,4990,5969,5940,5848,6048,5911,5487,6717,6555,6947,6933,6021,5750,5805,5964,3814,3517,3007,3059,2015,2044,2031,2039,6853,6509,6584,6772,5753,5831,5105,5051,5373,5811,5944,6022,6833,6518,6567,6610,6937,6394,6515,6625,7460,7490,7700,7431,3543,3707,4004,3759,3975,3897,3061,2943,7317,7270,7273,7472,6718,6557,6747,6510,6612,6799,7044,6949,5806,5860,5970,5495,7464,7331,7260,7215,5564,5590,5100,5106,3572,3918,3817,3898,3804,3518,4034,4008,5603,5535,5605,6025,7435,7553,7714,7492,6759,6828,6854,6573,7376,7554,6938,6396,3547,3925,3939,3709,3979,3559,3767,3818,3900,3825,3926,3929,3576,3871,3327,4036,6517,6749,6992,6834,7318,7321,6857,6776,5915,5593,5754,5864,6626,6950,6571,7048,5972,6080,5053,5079,6558,6367,7333,7274,5985,5813,5917,6026,5835,5927,5594,5756,6807,6836,6979,6763,7223,7496,7704,7745,3981,3791,3549,3987,3054,3062,3710,3820,6616,6599,6940,6953,7716,7281,7322,7247,5054,5083,5814,5374,5837,5695,5108,5095,6858,6865,7437,7276,6981,6860,7008,6954,6750,7056,6866,6840,7746,7392,7334,7687,4016,3941,3563,3771,3826,3930,3550,4040,6521,6579,6961,6463,6765,6956,6628,6574,6982,6811,7720,7363,7438,7809,7691,7443,3065,3066,3455,3982,3887,4048,3942,3989,6632,6383,6522,6603,6766,6771,7748,7459,7227,7337,6581,6524,6962,6605,6640,6813,6033,5918,5931,5499,5817,5551,5112,4863,6823,6868,6985,6773,5727,5609,5986,5843,3799,3565,3945,3773,4003,3828,3932,3571,7728,7282,7445,7324,7255,7365,6495,6611,5606,6028,5838,5933,5596,5976,5959,5845,6582,6881,6395,6606,6586,6585,7284,7338,5818,6034,5085,5099,5872,5988,5939,5934,5559,6049,5610,5743,5791,5859,6036,5583,7229,7699,7693,7810,7449,7446,7694,7345,3803,3895,3994,3946,3990,3574,4005,3815,5963,5501,5086,5101,5617,6050,5941,5846,3832,3953,3566,3774,3993,3573,3948,3919,6613,6391,6827,6986,6081,5992,5612,5751,5849,5820,5563,5861,7461,7556,6882,7043,6814,6927,6993,6964,6872,7072,6935,6511,2043,2045,2046,2047,3039,3068,4064,3519,7045,6774,7259,7752,6829,6988,7937,7366,5965,6040,5502,5942,5971,5850,5618,6000,5862,5565,5055,5107,6777,6855,7340,7288,5591,5755,6052,5807,6023,5945,5109,4991,5620,5966,5865,5946,5852,5566,6082,6056,3805,3899,4006,3954,4009,4035,3819,3577,5595,5973,5987,5757,6027,5607,5815,5866,7369,7504,6397,6835,7230,7450,7311,7271,6968,7046,7346,7462,7261,7812,6830,6884,3927,3996,3806,3901,3055,3063,4037,4010,6994,6519,6588,6614,6627,6559,7370,7760,3956,3578,3821,4017,4038,3827,3931,4012,7491,7560,6629,7049,7465,7938,6939,6617,7275,7348,7319,7377,7452,7816,7262,7372,6778,6888,6996,7104,5948,5873,5974,5977,7466,7568,7776,7520,7493,7701,7323,7378,7009,6837,7473,7715,7468,7277,7352,7702,7705,7283,6941,7050,6859,6951,7335,7393,3902,3983,3943,3711,3960,3551,3067,3069,5624,5919,5375,6084,7494,7474,6618,6780,6838,6398,6861,6719,7057,6942,7940,7325,7824,7497,6955,6523,6841,6575,6751,6633,7010,6867,6630,7052,6029,5839,5597,6035,5102,5110,5758,5868,6064,5989,5611,5819,4018,3822,4041,3580,3933,3829,4042,3991,5874,5978,5598,6088,5113,5114,5503,6030,5935,6096,5990,6037,7278,7285,6862,6957,6620,7000,6983,6869,5847,5613,5993,5821,7380,7339,7944,7498,6842,7058,6896,7012,6963,6958,6583,7073,7394,7717,6634,6767,3947,3934,3830,4020,4049,3995,4044,3833,6815,6883,7060,6607,6987,6525,6641,7074,7706,7555,7476,7384,7584,7439,7447,7326,7505,7718,7840,7286,7500,7747,7708,7557,6051,5876,5980,5619,7341,7289,7721,7367,3949,4024,3567,3775,4007,4050,3955,3834,6965,6870,7952,7347,5851,5943,6042,5994,7396,7506,7480,7872,7105,7016,7558,7342,3575,3997,3950,3807,4065,3957,4011,4066,6636,6775,7722,7749,6873,6844,6587,6885,7561,7451,7290,7616,6038,5622,6053,5863,7521,7729,7371,7231,5880,6001,5614,5822,4052,3998,3836,4013,4039,3958,3903,4019,6989,7064,6526,6966,6041,5621,5996,5967,7508,7562,7695,7750,7724,7349,7463,7453,5087,5116,6112,5567,7400,7292,6995,6874,6642,7024,6886,6589,6615,6779,7373,7350,5853,5947,6054,6002,7811,7730,7454,7753,7076,6831,7467,7522,7047,6969,6644,6990,6889,6970,7379,7569,7353,7564,6876,6590,3070,3071,3579,3961,4056,3823,4014,4068,7106,7080,6619,6997,7512,7754,7011,6781,7051,6631,7813,7761,7703,7408,6839,6890,6057,6083,5867,5625,7374,7263,6972,6897,5975,6044,5854,5949,7495,7732,6998,7001,7968,7570,7524,7475,7469,7585,6648,6943,6399,7108,7381,7736,5103,5111,6085,6058,8000,7756,7053,6863,6004,5626,5869,6065,4043,3962,3581,4021,4045,4072,3964,4022,6086,5875,5979,6060,7354,7814,7572,7395,8064,7762,6621,7059,6782,6892,7586,7470,7817,7939,7088,7013,6635,6843,6898,7002,5950,6031,5991,5759,7528,7707,6622,7112,6527,7054,6959,7120,7279,7499,7014,7061,6008,5599,5115,5117,7382,7477,6871,6637,7017,6845,7356,7617,7385,7576,7777,7764,6066,5870,6089,5628,7719,7818,7397,7327,7588,7478,7075,6900,7709,7941,7004,6643,5981,5877,6090,6039,6875,6967,7778,7825,7501,7287,7768,7507,5995,5982,5878,6068,3935,3831,4080,3582,4051,4025, 3835,4046,6097,6043,6092,5881,7386,7536,7820,7398,7066,7018,7559,7481,7062,6646,7618,7710,7077,6887,6904,7025,7502,7401,7723,7942,4026,3951,40 53,4054,3999,4067,3837,4028,5997,6072,5615,5823,7343,7291,7826,7780,6638,6846,7065,6645,7 509,7945,7388,7482,7592,7563,7841,7751,6055,6098,6003,5882,7523,7455,7351,7402,7293,7725, 7828,7784,5623,6045,5998,5855,7510,7484,7409,7946,7731,7513,7620,7565,7020,6991,7136,6591,7571,7375,6877,6971,6113,6005,6059,6114,7842,7726,7953,7600,7078,7026,7081,7107,7525,73 55,7404,7832,6891,6649,6999,7068,6878,6973,7109,7082,7792,7755,7948,7873,6100,6046,5884,6 061,7028,6650,6893,7089,6087,6006,5951,6067,7294,7410,7110,6899,7003,7084,7733,7566,7514, 7624,7526,7573,5118,5119,5627,6009,7471,7737,7412,7763,3959,4057,4069,4058,4015,3963,4070,3838,6974,7055,7015,6783,7032,6623,7357,7734,7090,6894,7113,6652,7005,6901,7114,7063,61 04,5871,6062,6116,7019,7006,6902,7092,7844,7529,7874,7757,7383,7954,7815,7516,6091,6010,5 629,6069,7587,7574,7632,7848,3583,4060,4073,4023,4074,3965,4047,3966,6093,6120,6012,6070, 7969,7530,7758,7577,7738,7956,7765,7740,7387,7479,7121,7067,7876,7766,7769,7819,7589,7960,7970,7779,7770,7578,7399,7856,5983,5879,6128,5630,7116,6905,7821,7416,7537,7358,7532,78 22,7827,7503,7648,7483,7389,7538,7021,7096,6639,6847,7079,7122,6099,6073,5883,6094,7027,6 906,6647,7069,7022,6879,7781,7590,7593,7619,7137,7029,7782,7711,7403,7580,7511,7540,7943, 7485,6074,5999,6101,6102,7390,7594,7621,7405,7727,8001,7972,7880,8002,7829,7976,7947,7083,7138,7785,7772,6047,6115,5885,6076,7601,7888,7124,7070,7984,8004,7515,8065,6007,6105,61 17,6106,7411,7830,7622,7486,7843,7786,6908,7085,4081,4027,4076,4082,4029,4055,4030,4059,8 066,7949,7111,7030,6063,6011,6118,5886,7544,7596,6975,7091,7833,7904,7735,8008,6651,7033, 7793,7406,7527,7625,7567,7955,7128,6895,7759,7846,7602,7845,7517,7413,7626,7834,7788,7531,5631,6108,6121,6071,7295,7359,7950,7575,7604,7794,7739,7633,7086,7140,7849,7414,7115,70 34,7875,7518,4084,4071,4088,3839,4061,4075,4062,4077,7767,7836,7958,7628,7417,7850,6653,7 093,7741,7579,7117,7144,6122,6013,6095,6014,7036,7094,7971,7957,7877,7533,7608,7796,7857, 7542,7591,7634,7007,6903,7961,7418,7539,7649,7742,7581,7152,6654,7771,7534,7636,7823,8068,7973,7123,7097,7783,7852,7878,7597,7962,7420,6907,7118,7541,7773,8016,7858,7098,7023,61 29,6075,6124,6130,4031,4083,4085,3967,4078,4086,4089,4090,7125,7126,7881,7800,7650,7974,7 595,8072,7582,7391,7831,7860,6077,6103,6078,6107,7071,7139,8003,7787,7640,7623,7964,7977, 7882,7889,6909,7100,8005,7884,8032,7978,7031,7129,7774,8080,7890,7864,7545,7603,7985,7487,7141,7130,7789,7980,7652,7598,8006,7835,7656,7407,7546,7627,7790,7795,7087,7035,7605,75 48,7142,6910,7986,7629,7664,7837,7847,7892,6655,7132,8009,7797,6132,6119,6136,5887,7519,7 635,7606,7905,7419,7630,7610,7609,7145,7095,7637,7415,7851,8010,7906,8067,7146,7037,7838, 7951,6109,6123,6110,6125,7119,7038,8017,7988,7896,8096,7959,7535,8069,7798,7853,8012,7801,7879,7153,7099,7421,7859,7992,8070,7854,7908,8018,7543,7612,7638,7148,7154,7651,7583,76 53,8073,7963,7641,7802,7912,8020,8128,7101,7127,8033,7861,7965,8074,7883,7975,7642,7804,7 102,7131,7862,7422,7885,7743,7156,7143,8081,7966,7979,7547,4063,4092,4079,4087,4091,4093, 4094,4095,6079,6131,6133,6015,7865,7599,7160,6911,7775,7657,8034,7891,7654,8076,7886,7981,7644,8024,8007,7893,7866,8082,7133,7147,7920,8036,7987,7982,7607,8097,7658,7791,6126,61 34,6137,6138,7839,7907,8084,7631,8011,7549,7134,7149,7665,8098,7989,7894,8129,8040,7660,7 799,7897,7868,7611,7909,8013,8088,7550,7990,8019,7898,7666,8048,7910,7613,7103,7155,6111, 6140,6127,6135,7639,7803,8100,7855,8071,7993,7157,7039,7668,8014,7913,7994,7900,7614,8130,8104,7643,8021,8035,7805,8075,7655,7863,7914,7996,7921,8022,8025,7672,7967,7423,8132,80 77,7887,7645,8083,7150,7158,7806,7916,8112,8037,7659,7867,7922,8026,7646,8136,7161,7162,7 551,8078,7983,8144,8038,8085,7895,7661,8041,7869,8099,7924,8028,7667,7899,7991,8090,8042, 8086,7670,8101,7911,7928,8049,7662,7870,8089,7669,8044,8015,6139,6141,6142,6143,7135,7164,8160,7615,7901,7995,8102,8050,8105,8131,7915,7673,8023,8092,7902,7997,7151,7159,8133,81 06,8052,7674,7917,8113,8134,7923,8027,8108,7998,8079,8039,7807,8056,7647,7163,7165,8114,7 918,8137,7676,8029,7925,8138,8087,8043,8030,7926,8116,8145,8091,8140,7929,8045,8120,7663, 7871,8103,8146,8051,7930,7671,8093,8046,7903,8161,8053,8107,8162,8148,8094,7932,8109,8135,8054,7999,8115,7166,7167,7675,8057,8152,7919,8110,8164,8139,8058,7677,8117,8141,8168,80 60,8118,8031,7927,8176,7678,8147,8121,7931,8142,8122,8047,8149,8150,8095,8163,7933,8124,8 055,8153,8165,8154,8111,8059,8166,7934,7679,8156,8169,8119,8170,8061,8143,8062,8177,8123, 8172,8178,8125,8151,8126,8155,8180,8167,8184,7935,8157,8171,8158,8173,8127,8179,8181,8063,8174,8182,8185,8186,8159,8188,8175,8183,8187,8189,8190,8191]

Sequence Group 1: Z1_8192

[0,1,2,7,3,8,11,24,4,10,13,28,16,33,35,78,5,12,14,32,19,38,47,82,22,46,42,91,59,99,107, 182,6,17,21,40,23,45,51,93,29,57,61,100,73,118,123,197,34,63,76,121,81,132,147,214,90,149,159, 252,164,264,298,425,9,18,26,56,30,60,72,113,36,77,64,126,85,137,153,229,44,75,89,148,95,156,163,260,103,166,184,288,196,306,322,489,53,92,101,162,119,176,191,303,130,192,213,314,231,33 5,362,544,151,227,255,343,262,363,385,589,295,391,412,609,441,632,676,932,15,25,31,74,39,80, 83,152,48,88,96,161,106,171,179,302,58,97,112,177,122,190,206,318,136,207,228,330,257,357,38 1,577,66,116,131,195,140,212,236,352,160,253,263,365,294,390,403,608,178,275,304,395,315,431,443,630,340,462,508,665,560,696,761,933,70,133,155,239,170,261,291,393,183,296,308,424,32 3,442,488,649,202,319,331,456,364,504,546,704,375,566,592,732,620,774,802,1089,233,353,368, 511,396,576,595,754,440,605,631,794,670,805,889,1165,479,640,677,844,694,927,957,1241,759,9 88,1021,1218,1071,1286,1409,1800,20,37,41,94,49,98,114,189,50,115,127,198,144,230,242,379,6 5,128,145,245,157,256,273,380,165,272,299,407,320,439,446,629,68,154,167,247,186,280,305,43 8,194,312,324,450,334,498,529,692,193,332,355,497,374,547,579,733,398,597,621,773,639,801,8 53,1147,79,181,187,310,201,328,354,490,215,359,367,545,386,588,604,765,297,382,397,591,426, 614,638,796,468,645,682,838,715,926,959,1198,327,414,451,628,496,664,686,910,534,699,725,93 1,762,997,1043,1263,593,760,775,1022,797,1072,1009,1321,866,1144,1166,1419,1179,1481,1590, 1852,84,199,203,373,281,389,402,596,311,406,427,623,463,647,679,912,325,457,495,648,510,687, 717,935,567,727,751,993,795,1041,1088,1325,378,499,528,716,578,746,781,1010,622,782,803,10 82,867,1067,1151,1433,655,834,916,1145,944,1178,1216,1466,998,1229,1228,1578,1322,1663,1703,2051,413,561,600,783,646,804,852,1105,683,911,928,1167,979,1181,1219,1479,718,953,1011,11 99,1044,1240,1323,1664,1104,1343,1406,1706,1452,1818,1850,2161,772,1023,1080,1324,1150,13 38,1438,1713,1164,1435, 1474,1828,1560,1879,1984,2340,1182,1482,1660,1919,1694,1987,1941,2 346,1782,2089,2117,2540,2167,2622,2757,3076,27,43,52,102,62,129,146,237,67,150,158,244,169, 266,274,428,69,168,180,265,188,329,341,478,224,342,372,535,388,580,601,793,71,185,200,333,2 26,369,383,574,238,392,404,606,430,633,653,806,254,415,445,644,491,678,697,878,505,693,728, 952,731,992,1040,1411,117,225,232,387,246,405,429,625,289,447,469,673,507,703,726,914,309,4 75,513,695,573,730,739,976,590,740,750,1042,833,1073,1132,1434,326,572,582,749,613,780,792, 1064,635,832,855,1099,930,1148,1168,1475,672,888,945,1169,999,1187,1273,1561,1079,1280,135 2,1665,1407,1711,1820,2159,120,243,267,444,307,474,509,714,321,530,575,741,594,758,763,104 5,358,583,612,764,634,829,845,1096,671,876,929,1153,977,1183,1252,1476,384,624,652,854,698, 917,915,1184,719,956,989,1242,1065,1276,1318,1673,755,1008,1075,1287,1097,1381,1408,1730,1135,1432,1460,1829,1577,1881,1985,2341,399,675,702,958,738,996,1066,1281,815,1078,1116,13 96,1129,1410,1450,1811,835,1117,1134,1437,1185,1455,1541,1878,1260,1576,1619,1920,1702,20 54,2092,2357,877,1217,1246,1477,1319,1579,1662,1953,1353,1696,1731,2088,1821,2118,2165,25 69,1462,1739,1830,2123,1911,2185,2210,2737,1954,2285,2345,2840,2518,2910,3041,3447,141,29 0,313,531,356,581,607,800,366,615,641,831,674,865,934,1253,394,654,705,913,729,995,978,1262, 747,1020,1070,1342,1106,1390,1413,1783,494,724,748,994,814,1047,1081,1397,830,1107,1131,1 418,1149,1451,1465,1854,836,1146,1180,1464,1255,1540,1591,1921,1296,1693,1697,2055,1738,2 093,2156,2534,506,807,828,1098,837,1128,1152,1454,879,1186,1243,1480,1277,1588,1695,2049,1 074,1254,1320,1618,1354,1707,1742,2090,1453,1743,1831,2124,1918,2184,2209,2736,1130,1380, 1436,1710,1463,1827,1874,2158,1549,1880,1937,2208,2048,2338,2356,2847,1661,1955,2061,234 4,2116,2367,2531,2916,2160,2541,2613,3021,2628,3109,3113,3631,512,839,864,1247,1046,1272, 1297,1692,1083,1339,1391,1712,1439,1810,1853,2157,1133,1412,1461,1819,1478,1875,1940,218 7,1589,1986,1936,2255,2091,2347,2499,2892,1261,1467,1483,1910,1672,1952,2060,2342,1705,2062,2095,2492,2125,2519,2596,3020,1826,2119,2164,2535,2211,2623,2629,3097,2339,2781,2846,3 167,2911,3290,3344,3618,1355,1548,1704,2063,1801,2094,2122,2530,1851,2166,2186,2612,2284, 2626,2841,3112,1855,2254,2343,2780,2498,2848,2849,3291,2568,2917,2931,3345,3077,3506,354 6,4152,2050,2366,2493,2893,2597,2930,3040,3351,2627,3096,3108,3507,3246,3547,3864,4268,2756,3166,3247,3619,3350,3630,3865,4269,3446,3876,3877,4442,4153,4443,4840,4841,54,55,86,12 5,87,134,139,292,104,138,143,316,234,339,361,602,105,142,204,338,241,376,437,626,282,436,43 2,651,473,685,713,982,124,235,259,400,283,435,459,667,317,471,477,700,563,744,757,1051,360, 493,598,753,611,798,841,1100,650,843,909,1176,946,1232,1292,1587,135,240,300,470,336,476,562,735,370,599,514,766,637,809,891,1115,434,565,643,842,669,902,925,1196,707,948,990,1274,10 50,1316,1350,1737,461,666,701,924,745,960,1037,1295,778,1038,1091,1344,1119,1385,1448,187 2,847,1113,1193,1389,1230,1449,1531,1925,1283,1537,1582,1973,1617,2020,2120,2588,205,293,3 37,564,377,610,627,890,448,642,680,919,712,955,963,1294,472,681,734,961,756,1036,1076,1346,808,1077,1114,1370,1195,1415,1503,1907,516,742,779,1049,810,1090,1138,1398,918,1177,1231,1 457,1282,1536,1551,1972,962,1239,1298,1543,1345,1613,1667,2018,1386,1700,1812,2065,1882,2 162,2305,2589,532,799,901,1155,954,1197,1279,1539,983,1284,1326,1586,1351,1666,1736,2053, 1068,1347,1371,1698,1456,1802,1876,2220,1487,1884,1932,2252,1990,2336,2440,2889,1137,1399,1472,1815,1544,1906,1935,2274,1616,1969,2019,2386,2066,2443,2543,2983,1729,2026,2121,25 04,2134,2575,2599,3099,2287,2620,2739,3092,2807,3168,3347,3802,258,371,401,668,449,684,73 6,1035,458,737,767,1052,812,1118,1156,1501,515,776,813,1159,903,1194,1237,1502,947,1236,12 93,1581,1348,1615,1670,2017,518,900,949,1171,1032,1244,1299,1614,1048,1340,1364,1674,1384,1780,1823,2132,1039,1382,1405,1779,1486,1877,1909,2253,1546,1939,1991,2335,2025,2391,250 7,2929,603,981,1033,1336,1055,1368,1404,1740,1101,1417,1459,1873,1532,1924,1968,2333,1285, 1528,1545,1927,1608,1988,2024,2388,1708,2029,2128,2502,2223,2574,2615,3080,1367,1584,167 5,2016,1778,2064,2130,2564,1848,2213,2237,2587,2306,2697,2759,3119,1933,2304,2337,2752,2389,2842,2713,3231,2532,2926,2988,3443,3023,3545,3610,3878,636,1053,1069,1485,1245,1535,15 50,1938,1337,1580,1609,2009,1701,2031,2127,2566,1365,1699,1777,2052,1814,2131,2233,2591,1 885,2239,2273,2625,2387,2755,2888,3249,1500,1781,1822,2232,1908,2264,2359,2714,2008,2364, 2441,2866,2533,2805,2967,3445,2059,2496,2572,2927,2592,3022,3082,3512,2698,3095,3094,3562,3244,3617,3637,4155,1583,1883,1942,2365,2030,2442,2506,2897,2129,2565,2584,2989,2619,30 43,3093,3519,2234,2595,2715,3081,2776,3098,3245,3624,2896,3281,3302,3680,3468,3862,3874,4 441,2334,2753,2864,3248,2966,3250,3464,3685,2982,3453,3514,3870,3558,3917,4134,4618,3060, 3548,3614,4075,3632,4141,4125,4664,3800,4235,4277,4842,4491,4906,4959,5364,301,433,460,70 6,492,777,840,1139,517,846,908,1158,951,1234,1238,1610,519,950,980,1233,1034,1369,1387,172 8,1102,1388,1484,1849,1534,1916,1943,2385,533,991,1054,1383,1112,1473,1529,1904,1154,1538, 1562,1970,1612,2021,2057,2460,1192,1585,1669,2028,1741,2126,2163,2538,1803,2133,2248,259 4,2251,2624,2754,3349,743,1103,1136,1533,1170,1563,1611,2011,1275,1671,1709,2097,1809,2215,2238,2570,1327,1715,1817,2135,1887,2250,2257,2616,1926,2258,2272,2758,2495,2843,2918,34 52,1366,1886,1922,2267,1975,2358,2384,2782,2023,2494,2517,2895,2586,2964,2990,3515,2096,2 542,2593,2991,2699,3079,3157,3559,2851,3164,3282,3625,3303,3683,3866,4419,752,1157,1235,1 668,1317,1714,1813,2222,1349,1824,1905,2259,1934,2286,2307,2777,1416,1923,1974,2332,2022, 2473,2505,2890,2067,2536,2585,2981,2617,3061,3110,3516,1530,2010,2056,2516,2212,2573,257 1,3062,2235,2598,2621,3100,2783,3158,3228,3627,2275,2712,2845,3169,2891,3297,3346,3686,29 25,3444,3504,3871,3561,3919,4135,4619,1547,2099,2214,2614,2256,2696,2804,3165,2463,2850,2 908,3300,2913,3348,3466,3861,2497,2909,2924,3455,3063,3471,3551,3916,3116,3560,3613,4084, 3636,4176,4250,4667,2537,3083,3102,3517,3229,3563,3616,4127,3283,3634,3687,4234,3867,4278,4489,4881,3508,3741,3872,4281,4073,4545,4558,4957,4132,4563,4655,5038,4778,5170,5295,57 79,811,1278,1341,1825,1414,1917,1971,2390,1458,1989,2027,2475,2098,2529,2590,3111,1542,20 58,2221,2567,2249,2631,2618,3118,2265,2738,2806,3280,2898,3298,3441,3801,1776,2236,2266,2 630,2462,2779,2865,3301,2474,2899,2915,3442,2965,3467,3511,3896,2500,2928,3042,3510,3115, 3550,3611,4085,3170,3629,3635,4177,3740,4251,4416,4786,1808,2461,2472,2894,2501,2912,298 0,3470,2539,3078,3101,3544,3159,3608,3633,4143,2844,3114,3230,3612,3288,3681,3742,4248,34 69,3743,3873,4282,4074,4544,4557,4956,2914,3296,3454,3682,3509,3869,3898,4418,3557,3918,4 087,4556,4142,4616,4666,5109,3615,4133,4179,4654,4276,4693,4785,5180,4440,4843,4905,5293, 4914,5413,5415,6051,1816,2503,2528,3103, 2778,3156,3171,3628,2867,3251,3299,3684,3465,3860,3879,4417,2919,3440,3505,3863,3518,3899,4124,4547,3609,4140,4086,4561,4249,4665,4777,5168,3117,3513,3549,4072,3626,4126,4178,4652,3639,4232,4271,4694,4283,4779,4882,5292,3868,4279,4488,4787,4559,4907,4915,5367,4617,5037,5108,5509,5171,5532,5534,6048,3289,3556,3638, 4233,3803,4270,4280,4784,3875,4490,4546,4904,4562,4912,5039,5414,3897,4560,4653,5036,4776,5110,5111,5533,4880,5181,5183,5535,5365,5800,5802,6324,4154,4692,4695,5169,4883,5182,5294,5777,4913,5366,5412,5801,5510,5803,6216,6326,4958,5508,5511,6049,5776,6050,6217,6327,5778,6218,6219,6672,6325,6673,6674,6675,108,109,110,175,111,208,211,284,172,210,249,408,268, 453,455,722,173,248,250,452,271,466,551,770,278,550,502,823,619,851,875,1190,174,269,277,500,279,549,571,825,409,617,657,868,709,898,907,1257,454,659,720,905,769,968,1015,1314,822,1017,1095,1420,1140,1468,1558,1957,209,270,286,616,410,656,708,893,464,721,660,922,817,973,1085,1361,548,711,821,1016,827,1092,1111,1444,871,1142,1220,1496,1256,1622,1678,2113,585,824,869,1110,899,1172,1227,1567,966,1248,1313,1646,1363,1723,1786,2216,1019,1359,1423,1735,1446,1787,1869,2301,1555,1891,1928,2361,2005,2408,2488,3016,251,285,411,710,467,768,771,1084,568,820,848,1109,874,1163,1175,1566,618,849,892,1173,906,1226,1302,1658,972,1303,1360,1718,1441,1749,1865,2281,662,896,967,1251,984,1312,1376,1744,1108,1421,1447,1789,1554,1890, 1903,2360,1174,1491,1620,1895,1647,1979,2007,2382,1732,2070,2188,2453,2260,2576,2705,3017,690,969,1087,1379,1162,1445,1499,1893,1191,1556,1640,1956,1679,2006,2112,2445,1290,1659, 1719,2036,1788,2152,2218,2608,1859,2270,2308,2672,2372,2718,2774,3293,1373,1745,1804,2191,1896,2280,2311,2694,2004,2353,2383,2766,2458,2785,2921,3409,2103,2416,2489,2860,2562,3011,3069,3553,2703,3104,3177,3474,3263,3690,3825,4264,276,465,501,826,569,850,894,1225,570, 895,923,1258,1012,1362,1394,1863,661,964,1013,1401,1093,1440,1489,1864,1141,1488,1559,1915,1676,2003,2014,2381,688,1086,1143,1403,1222,1492,1621,2002,1250,1644,1688,2034,1722,2150,2201,2560,1249,1720,1747,2149,1858,2219,2283,2673,1898,2329,2373,2717,2415,2773,2869,3395,723,1189,1223,1642,1289,1716,1746,2114,1315,1751,1791,2217,1870,2300,2352,2709,1557,1866,1897,2303,1958,2370,2414,2768,2072,2421,2510,2854,2635,3010,3071,3462,1691,1930,2035,2380,2148,2452,2514,2962,2206,2579,2665,3015,2706,3161,3223,3575,2309,2704,2719,3178,2769, 3272,3173,3713,2902,3392,3410,3851,3419,4005,4138,4432,816,1259,1291,1857,1493,1889,1902, 2328,1643,1914,1959,2375,2071,2423,2491,2976,1689,2037,2147,2444,2190,2515,2637,3019,2271,2667,2691,3153,2767,3221,3292,3717,1862,2151,2200,2636,2282,2686,2761,3174,2374,2762,2775,3286,2903,3259,3399,3853,2451,2802,2984,3393,3044,3418,3472,3962,3162,3477,3476,4102,3714,4171,4215,4687,1929,2261,2348,2763,2422,2784,2868,3321,2511,2963,3012,3411,3087,3421, 3475,4003,2638,3065,3175,3463,3224,3552,3715,4172,3320,3727,3806,4218,3912,4370,4422,4853,2716,3179,3284,3716,3398,3722,3858,4225,3408,3855,3966,4404,4096,4447,4624,5032,3422,4006,4168,4543,4190,4627,4597,5042,4262,4733,4781,5328,4875,5390,5445,5772,287,503,584,870,658,965,1014,1377,663,1018,1094,1400,1161,1470,1490,1976,689,1160,1188,1469,1224,1717,1733,2102,1356,1734,1856,2207,1888,2296,2349,2765,691,1221,1288,1721,1358,1805,1867,2278,1378,1892,1912,2354,1978,2409,2449,2786,1422,1931,2013,2420,2115,2490,2577,2906,2153,2561,2668,3064,2671,3152,3220,3827,897,1357,1372,1871,1402,1913,1977,2377,1497,2015,2073,2477,2155,2583,2666,2978,1641,2079,2193,2563,2277,2670,2679,3084,2302,2680,2690,3222,2801,3273,3376,3854,1690,2276,2298,2689,2369,2760,2764,3256,2411,2800,2871,3315,3014,3396,3412,3967, 2476,2920,3045,3413,3163,3451,3577,4097,3279,3620,3736,4173,3807,4223,4372,4851,904,1395, 1471,2012,1623,2078,2189,2634,1677,2202,2279,2681,2310,2702,2707,3225,1750,2299,2368,2708,2410,2797,2861,3312,2459,2904,3013,3401,3085,3423,3568,4000,1868,2376,2448,2870,2578,2985,2979,3448,2639,3068,3105,3554,3257,3580,3710,4185,2695,3172,3275,3691,3313,3761,3824,4230,3379,3852,3956,4405,4101,4481,4625,5033,1899,2479,2582,3070,2678,3160,3258,3621,2795, 3278,3352,3780,3357,3826,3902,4275,2803,3353,3378,3857,3449,3915,4081,4446,3572,4100,4159,4548,4214,4690,4744,5045,2905,3473,3566,4001,3711,4103,4170,4609,3737,4208,4231,4732,4373,4782,4873,5337,3958,4239,4406,4791,4539,4877,4886,5437,4610,4961,5041,5500,5286,5546,5717,6055,985,1498,1645,2203,1748,2297,2355,2772,1790,2371,2417,2799,2478,2901,3018,3569,1894,2450,2609,2977,2669,3155,3086,3574,2687,3176,3262,3726,3322,3778,3829,4263,2146,2664, 2688,3154,2794,3227,3285,3781,2798,3323,3359,3850,3397,3903,3961,4434,2852,3394,3420,3960,3571,4080,4139,4549,3704,4189,4209,4691,4238,4745,4848,5306,2154,2787,2796,3314,2853,3356,3400,3914,2907,3450,3555,4004,3581,4136,4191,4685,3274,3570,3712,4158,3738,4219,4254,4734,3913,4255,4407,4808,4542,4876,4885,5436,3358,3760,3856,4222,3959,4403,4438,4850,4093, 4480,4593,4884,4684,5022,5044,5507,4169,4611,4717,5040,4780,5091,5291,5552,4852,5329,5381,5713,5416,5797,5805,6359,2192,2855,2900,3567,3226,3576,3705,4188,3287,3723,3779,4224,3859,4274,4433,4849,3377,3828,3957,4371,4002,4439,4596,4879,4137,4626,4592,4927,4735,5043,5175,5536,3573,3963,4007,4538,4184,4608,4716,5034,4217,4718,4747,5132,4809,5287,5376,5712, 4402,4783,4872,5307,4887,5391,5417,5789,5023,5493,5506,5835,5547,5994,6012,6322,3739,4092,4216,4719,4265,4746,4790,5290,4423,4874,4878,5380,4960,5410,5501,5804,4435,4926,5035,5492,5174,5520,5521,5995,5336,5553,5563,6013,5773,6166,6234,6676,4686,5090,5133,5537,5377,5562,5716,6027,5411,5788,5796,6167,5926,6235,6468,6756,5444,5834,5927,6323,6026,6358,6469, 6757,6054,6528,6529,6830,6677,6831,7080,7081,586,587,818,921,819,970,975,1552,872,974,987, 1656,1374,1727,1785,2350,873,986,1300,1726,1393,1860,2001,2378,1494,2000,1980,2447,2077,2513,2633,3090,920,1375,1443,1900,1495,1983,2039,2455,1657,2075,2101,2580,2263,2684,2701,3243,1784,2145,2330,2693,2363,2770,2857,3316,2446,2859,2961,3416,3046,3520,3692,4131,971,1392,1564,2074,1724,2100,2262,2675,1806,2331,2194,2710,2413,2789,2923,3327,1982,2269,2419, 2858,2457,2934,3009,3460,2611,3056,3106,3578,3242,3708,3734,4237,2069,2454,2581,3008,2685,3072,3217,3695,2742,3218,3295,3728,3355,3765,3900,4436,2863,3325,3457,3777,3478,3901,4051,4553,3623,4077,4122,4621,4157,4660,4788,5368,1301,1553,1725,2268,1861,2362,2379,2922,2032,2418,2508,2987,2632,3067,3075,3694,2076,2509,2674,3073,2700,3216,3276,3730,2788,3277, 3326,3750,3459,3831,4047,4495,2196,2682,2743,3241,2790,3294,3382,3782,2986,3417,3479,3953,3622,4076,4095,4620,3074,3527,3706,4083,3729,4149,4175,4658,3766,4212,4284,4729,4482,4854,4965,5369,2204,2771,2933,3403,3066,3461,3583,4079,3091,3688,3718,4130,3735,4174,4236,4689,3260,3731,3751,4210,3952,4266,4444,4892,4043,4484,4564,4924,4630,5020,5120,5529,3381, 3783,3964,4287,4088,4494,4567,4954, 4156,4613,4659,5094,4730,5123,5331,5659,4229,4670,4789,5280,4846,5343,5379,5791,4963,5388,5439,5784,5499,5836,6015,6422,1442,1807,1901,2456,20 33,2512,2676,3183,2038,2677,2711,3252,2792,3354,3404,4045,2195,2740,2793,3407,2935,3458,3 525,4046,3047,3524,3693,4121,3732,4151,4182,4657,2198,2932,3057,3415,3180,3564,3707,4150, 3240,3724,3744,4186,3764,4260,4375,4844,3219,3762,3805,4259,4042,4445,4537,4925,4090,4595,4631,5019,4669,5107,5283,5561,2351,3089,3181,3720,3255,3748,3804,4252,3317,3849,3955,44 37,4052,4552,4612,5017,3689,4048,4089,4555,4144,4628,4668,5104,4220,4681,4812,5178,4895,5 342,5383,5780,3747,4128,4187,4656,4258,4728,4814,5332,4420,4889,4917,5363,4966,5421,5447, 5811,4565,4964,5021,5440,5105,5502,5433,5923,5304,5558,5660,6031,5715,6233,6290,6530,2412,3253,3261,4041,3565,4055,4094,4594,3721,4120,4145,4649,4213,4683,4811,5334,3745,4211,42 57,4688,4286,4815,4909,5371,4485,4919,4953,5409,5095,5443,5528,5945,4044,4261,4374,4908,4 536,4940,5047,5434,4648,5088,5121,5526,5305,5497,5567,6053,4715,5172,5340,5559,5372,5714, 5782,6180,5422,5787,5786,6246,5924,6321,6389,6679,4123,4483,4598,5089,4682,5122,5282,5541,4813,5333,5360,5661,5387,5719,5785,6223,4910,5375,5435,5781,5488,5790,5925,6352,5540,59 49,6010,6408,6160,6466,6510,6829,5018,5441,5524,5944,5566,5946,6084,6413,5658,6081,6182,6 506,6242,6569,6642,6962,5768,6236,6294,6575,6384,6645,6629,6984,6420,6727,6769,7082,6875, 7146,7243,7440,1565,1981,2068,2610,2144,2741,2856,3383,2197,2862,2960,3406,3059,3522,3526,4146,2199,3058,3088,3521,3182,3749,3767,4228,3318,3776,4040,4421,4054,4540,4599,5093,22 05,3107,3254,3763,3324,3965,4049,4492,3402,4078,4098,4614,4148,4661,4713,5124,3456,4129,4 181,4680,4253,4810,4855,5310,4267,4845,4920,5374,4923,5408,5442,6025,2683,3319,3380,4053, 3414,4099,4147,4651,3579,4183,4221,4749,4273,4891,4918,5338,3719,4227,4369,4847,4487,4922,4937,5384,4554,4938,4952,5446,5135,5503,5554,6080,3746,4486,4550,4943,4623,5046,5092,54 94,4663,5134,5285,5539,5362,5564,5662,6183,4748,5330,5373,5663,5423,5775,5813,6243,5523,5 832,5950,6353,6011,6411,6470,6827,2692,3405,3523,4180,3709,4226,4285,4894,3733,4400,4493, 4939,4566,4962,4967,5489,3848,4551,4622,5016,4662,5129,5281,5530,4731,5308,5361,5657,5385,5769,5798,6220,4050,4650,4712,5284,4888,5341,5339,5770,4911,5378,5389,5792,5495,5814,59 20,6355,4955,5432,5505,5837,5531,5997,6014,6414,5557,6052,6164,6507,6245,6571,6643,6963,4 091,4751,4890,5382,4936,5420,5496,5833,5127,5522,5544,6008,5549,6024,6086,6465,5173,5545, 5556,6083,5771,6163,6239,6568,5808,6244,6293,6624,6388,6720,6754,6987,5309,5783,5794,6221,5921,6247,6320,6631,5951,6386,6415,6726,6471,6770,6873,7085,6176,6417,6508,6773,6573,68 77,6922,7241,6640,6927,6967,7246,7018,7278,7399,7635,2791,3582,3725,4401,3830,4541,4615,5 106,3954,4629,4671,5131,4750,5289,5370,5799,4082,4714,4893,5335,4921,5419,5386,5810,4941, 5438,5498,5948,5542,5998,6029,6421,4256,4916,4942,5418,5126,5491,5525,6009,5130,5543,5551,6030,5565,6087,6179,6532,5176,5560,5718,6178,5807,6238,6291,6625,5838,6357,6387,6721,64 16,6755,6824,7022,4272,5125,5128,5538,5177,5548,5656,6162,5311,5774,5793,6232,5815,6288,6 385,6647,5504,5806,5922,6292,5992,6409,6418,6752,6161,6419,6509,6774,6574,6876,6921,7240, 5550,5996,6082,6410,6177,6505,6534,6826,6241,6570,6627,6920,6646,6960,6986,7273,6295,6641,6723,6966,6768,6989,7021,7392,6828,7083,7145,7397,7150,7445,7447,7707,4368,5179,5288,57 95,5490,5812,5839,6356,5527,5947,5999,6412,6085,6464,6531,6825,5555,6028,6165,6467,6222,6 535,6628,6879,6289,6644,6626,6925,6753,6985,7017,7276,5809,6181,6237,6572,6354,6630,6722, 6964,6391,6724,6759,6990,6775,7019,7086,7396,6504,6771,6872,7023,6923,7147,7151,7443,6961,7245,7272,7569,7279,7572,7574,7704,5993,6240,6390,6725,6423,6758,6772,7020,6511,6874,68 78,7144,6926,7148,7247,7446,6533,6924,6965,7244,7016,7274,7275,7573,7084,7393,7395,7575,7 441,7636,7638,7872,6678,6988,6991,7277,7087,7394,7398,7633,7149,7442,7444,7637,7570,7639, 7708,7874,7242,7568,7571,7705,7632,7706,7709,7875,7634,7710,7711,7876,7873,7877,7878,7879,216,217,218,223,219,344,347,480,220,346,349,484,416,521,523,886,221,348,350,520,419,526,5 43,938,422,542,538,1003,787,1027,1059,1518,222,417,421,536,423,541,555,1005,485,785,789,10 28,881,1126,1203,1573,522,791,884,1201,937,1212,1307,1606,1002,1309,1335,1684,1428,1760,1 842,2321,345,418,482,784,486,788,880,1121,524,885,856,1206,941,1265,1329,1629,540,883,1001, 1308,1007,1332,1427,1756,1031,1430,1520,1832,1572,1946,1994,2521,557,1004,1029,1426,1127, 1512,1527,1847,1210,1568,1605,1962,1631,2047,2138,2648,1311,1627,1687,2087,1758,2139,222 5,2749,1839,2231,2316,2825,2401,2880,2996,3596,351,481,487,882,527,936,939,1328,552,1000,1 024,1425,1058,1507,1515,1846,786,1025,1120,1513,1202,1526,1598,1966,1264,1599,1628,2042,1 753,2109,2181,2729,858,1124,1211,1571,1268,1604,1636,2104,1424,1685,1759,2141,1838,2230,2 291,2824,1514,1771,1944,2243,1963,2327,2403,2878,2084,2438,2556,2969,2656,3032,3201,3597, 862,1213,1331,1639,1506,1757,1835,2241,1519,1840,1948,2320,1995,2402,2520,2945,1594,1967, 2043,2432,2140,2552,2650,3048,2175,2662,2808,3140,2836,3214,3306,3881,1633,2105,2168,2559,2244,2728,2811,3194,2400,2821,2879,3266,2974,3309,3489,3981,2487,2936,2997,3388,3030,35 91,3645,4065,3199,3676,3773,4026,3823,4198,4385,4896,420,525,537,1006,553,1026,1122,1525, 554,1123,1207,1574,1304,1630,1650,2179,857,1208,1305,1653,1333,1752,1769,2180,1429,1768,1 843,2295,1992,2399,2406,2877,860,1330,1431,1655,1522,1792,1945,2398,1570,1960,1996,2426,2046,2546,2641,3028,1569,2044,2107,2545,2174,2651,2731,3141,2246,2813,2837,3213,2887,3305, 3429,3947,887,1517,1523,1950,1593,2040,2106,2522,1607,2111,2143,2649,2226,2748,2820,3205, 1841,2182,2245,2751,2322,2830,2886,3268,2468,2941,3002,3374,3123,3590,3647,4022,1999,231 8,2427,2876,2544,2968,3006,3534,2646,3035,3133,3595,3202,3701,3795,4119,2809,3200,3215,37 74,3269,3832,3753,4297,3434,3944,3982,4395,3995,4497,4638,4980,940,1575,1595,2173,1793,2229,2290,2812,1951,2294,2323,2839,2439,2943,2999,3536,1997,2433,2527,2944,2558,3007,3125,3 599,2663,3135,3191,3697,3267,3793,3880,4301,2178,2547,2640,3124,2730,3186,3237,3754,2838, 3238,3307,3842,3435,3819,3951,4409,2951,3370,3540,3945,3600,3994,4024,4466,3702,4037,403 6,4602,4298,4711,4767,5219,2317,2657,2816,3239,2942,3308,3428,3905,3003,3535,3592,3983,3667,3997,4027,4479,3126,3641,3755,4023,3796,4064,4299,4720,3904,4311,4382,4770,4452,4946,4 978,5345,3212,3775,3840,4300,3950,4306,4414,4793,3980,4411,4474,4972,4584,5007,5152,5604, 3998,4498,4708,5071,4758,5155,5101,5610,4862,5249,5269,5764,5351,5878,5981,6260,483,539,5 56,1030,790,1209,1306,1637,859,1310,1334,1652,1505,1762,1770,2324,861,1504,1516,1761,1524, 2041,2085,2486,1624,2086,2172,2647,2228,2732,2817,3265,863,1521,1592,2045,1626,2169,2183, 2726,1638,2240,2292,2822,2326,2881,2949,3310,1686,2319,2405,2940,2523,2998,3033,3486,255 3,3029,3136,3640,3139,3696,3792,4387,1125,1625,1632,2227,1654,2293, 2325,2873,1833,2407,2469,2993,2555,3039,3134,3538,1949,2483,2601,3031,2725,3138,3147,3664,2750,3148,3190,3794,3369,3833,3932,4410,1998,2724,2734,3189,2829,3236,3264,3816,2883,3368,3431,3891,3594,3948,3984,4475,2992,3488,3601,3985,3703,4011,4161,4585,3839,4192,4320,4721,4383,4775,4948,5327,1200,1651,1763,2404,1947,2482,2557,3122,1993,2642,2727,3149,2810,3198,3203,3797,2110,2735,2828,3204,2882,3365,3389,3888,2975,3484,3593,3969,3665,3999,4108,4476,2224,2872,2948,3430,3034,3541,3539,4008,3127,3644,3677,4066,3817,4164,4294,4737,3195,3752,3835,4199,3889, 4349,4384,4818,3935,4408,4460,4973,4601,5009,5153,5605,2247,2995,3038,3646,3146,3700,3818,4193,3335,3838,3924,4364,3929,4386,4450,4931,3371,3925,3934,4413,4009,4455,4533,5006,4116,4600,4675,5072,4766,5222,5252,5621,3485,4025,4070,4477,4295,4603,4710,5113,4321,4760,4819,5248,4949,5270,5349,5825,4462,4827,4974,5275,5063,5353,5426,5969,5114,5573,5609,6064, 5750,6126,6209,6559,1269,1834,1961,2643,2108,2733,2823,3304,2142,2831,2937,3367,2994,3433,3598,4109,2242,2950,3049,3537,3137,3699,3666,4118,3187,3772,3822,4310,3906,4358,4389,4863,2526,3132,3188,3698,3334,3799,3841,4365,3366,3907,3931,4394,3949,4451,4465,4982,3372,3946,3996,4464,4111,4532,4639,5073,4240,4757,4761,5223,4826,5253,5324,5758,2554,3311,3364, 3890,3373,3928,3968,4454,3487,4010,4067,4496,4165,4636,4759,5217,3834,4110,4296,4674,4322,4771,4830,5250,4453,4831,4975,5276,5070,5352,5425,5968,3930,4348,4412,4774,4463,4971,5002,5326,4573,5008,5097,5424,5216,5602,5620,6071,4709,5115,5229,5608,5268,5631,5755,6132,5344,5765,5869,6205,5884,6301,6305,6711,2600,3375,3432,4071,3798,4160,4241,4756,3843,4307, 4359,4792,4415,4930,4981,5325,3933,4388,4461,4947,4478,5003,5100,5355,4637,5154,5096,5471,5251,5611,5731,6108,4117,4467,4499,5062,4736,5112,5228,5606,4769,5230,5255,5724,5277,5751,5860,6204,4970,5271,5348,5759,5427,5879,5885,6281,5603,6021,6070,6335,6127,6442,6480,6698,4323,4572,4768,5231,4897,5254,5274,5754,4979,5350,5354,5868,5572,5882,6065,6304,4983, 5470,5607,6020,5730,6072,6073,6443,5824,6133,6147,6481,6261,6602,6634,7040,5218,5630,5725,6109,5861,6146,6208,6487,5883,6280,6300,6603,6382,6635,6864,7132,5980,6334,6383,6699,6486,6710,6865,7133,6558,6884,6885,7194,7041,7195,7384,7385,558,559,942,1205,943,1214,1267, 1836,1056,1266,1271,1964,1634,2083,2137,2818,1057,1270,1596,2082,1649,2176,2397,2874,1794,2396,2392,2947,2481,3005,3121,3670,1204,1635,1755,2288,1795,2395,2435,2971,1965,2471,2485,3036,2659,3184,3197,3811,2136,2525,2814,3193,2827,3270,3385,3892,2946,3387,3533,3992,3602,4056,4204,4635,1215,1648,1844,2470,2080,2484,2658,3143,2170,2815,2602,3206,2885,3329, 3491,3923,2394,2661,2939,3386,2973,3502,3589,4020,3051,3604,3678,4162,3810,4292,4318,4825,2437,2970,3037,3588,3185,3648,3789,4207,3234,3790,3883,4312,3927,4353,4448,5000,3391,3921,4017,4357,4038,4449,4523,5077,4195,4529,4606,5141,4673,5196,5272,5852,1597,1837,2081,2660,2177,2826,2875,3490,2424,2938,3000,3543,3120,3643,3651,4206,2480,3001,3142,3649,3196, 3788,3836,4314,3328,3837,3922,4338,4019,4391,4519,5059,2604,3150,3235,3809,3330,3882,3938,4366,3542,3993,4039,4457,4194,4528,4575,5140,3650,4063,4242,4535,4313,4645,4723,5194,4354,4764,4932,5233,5010,5346,5585,5853,2644,3271,3501,3971,3642,4021,4167,4531,3671,4196,4302,4634,4319,4722,4824,5221,3820,4315,4339,4762,4456,4898,5004,5452,4503,5012,5084,5468, 5158,5600,5680,6105,3937,4367,4472,4935,4568,5058,5087,5514,4672,5137,5195, 5650,5234,5683,5767,6175,4817,5202,5273,5736,5302,5831,5863,6283,5575,5876,5971,6276,6063,6336,6483,6834,1754,2171,2289,2972,2425,3004,3144,3787,2434,3145,3207,3812,3332,3926,3972,4517,2603,3232,3333,3975,3503,4018,4061,4518,3603,4060,4205,4605,4316,4647,4726,5193,2606,3500,3605, 3987,3784,4068,4243,4646,3808,4308,4332,4738,4352,4860,4951,5300,3791,4350,4381,4859,4502,5005,5061,5469,4570,5099,5159,5599,5201,5655,5739,6145,2819,3669,3785,4304,3815,4336,4380,4828,3893,4393,4459,5001,4524,5076,5136,5597,4197,4520,4569,5079,4640,5156,5200,5652,4772,5205,5296,5734,5455,5830,5871,6264,4335,4632,4739,5192,4858,5232,5298,5820,4976,5429, 5461,5851,5586,5937,5983,6311,5085,5584,5601,5976,5653,6066,5961,6375,5756,6142,6188,6555,6207,6633,6690,6886,2884,3813,3821,4501,4069,4527,4574,5098,4305,4604,4641,5185,4765,5207,5279,5822,4333,4763,4857,5220,4934,5299,5457,5855,5013,5463,5513,5881,5651,5979,6104,6393,4516,4861,4950,5456,5060,5480,5623,5962,5184,5628,5681,6098,5757,6061,6159,6557,5227, 5728,5828,6143,5856,6206,6266,6608,5938,6279,6278,6658,6380,6697,6717,7043,4607,5011,5102,5629,5206,5682,5738,6113,5297,5821,5848,6189,5875,6211,6277,6615,5458,5859,5963,6265,6016,6282,6381,6704,6112,6433,6454,6728,6588,6862,6882,7193,5598,5977,6096,6392,6158,6394,6584,6733,6174,6565,6610,6870,6654,6901,7014,7282,6228,6636,6694,6955,6712,7029,7005,7312, 6832,7107,7141,7386,7211,7434,7479,7612,1845,2393,2436,3050,2524,3233,3384,3939,2605,3390,3532,3974,3607,4058,4062,4642,2607,3606,3668,4057,3786,4337,4355,4816,3894,4356,4500,4977,4526,5068,5103,5649,2645,3679,3814,4351,3920,4473,4521,5056,3970,4530,4586,5138,4644,5197,5225,5700,4016,4633,4725,5204,4829,5278,5347,5762,4899,5301,5464,5858,5467,5880,5978, 6485,3151,3895,3936,4525,3986,4587,4643,5187,4163,4727,4773,5257,4929,5431,5462,5826,4303,4795,4945,5303,5015,5466,5473,5872,5078,5474,5512,5982,5727,6067,6134,6564,4334,5014,5074,5483,5143,5622,5648,6022,5199,5726,5749,6111,5850,6156,6190,6611,5256,5766,5857,6191,5939,6263,6317,6655,6075,6332,6434,6705,6455,6731,6866,7179,3192,3973,4059,4724,4293,4794, 4933,5454,4317,4968,5057,5475,5086,5574,5587,6017,4392,5075,5142,5596,5198,5705,5737,6106,5235,5760,5849,6173,5873,6229,6302,6612,4522,5186,5224,5748,5428,5829,5827,6230,5459,5862,5877,6284,6023,6318,6372,6707,5515,5960,6069,6337,6107,6449,6482,6734,6141,6556,6600,6871,6657,6903,7015,7283,4571,5259,5430,5870,5472,5936,6060,6333,5703,6074,6124,6452,6129, 6484,6586,6861,5729,6125,6140,6567,6231,6591,6639,6900,6308,6656,6693,6972,6716,7056,7114,7315,5761,6267,6286,6613,6373,6659,6696,7007,6435,6714,6735,7106,6867,7142,7209,7417,6604,6797,6880,7153,6953,7225,7238,7477,7012,7251,7303,7502,7362,7546,7583,7787,3331,4166,4309,4969,4390,5069,5139,5654,4458,5157,5203,5707,5258,5753,5854,6303,4534,5226,5453,5823, 5465,5887,5874,6310,5481,5970,6062,6432,6114,6450,6553,6833,4856,5460,5482,5886,5702,6019,6097,6453,5706,6115,6131,6554,6157,6587,6607,6888,5732,6144,6210,6606,6307,6638,6691,6973,6338,6709,6715,7057,6796,7115,7176,7370,4928,5701,5704,6110,5733,6128,6172,6590,5763,6262,6285,6632,6319,6688,6713,7031,6068,6306,6374,6692,6440,6729,6798,7112,6589,6799,6881, 7154,6954,7224,7237,7476,6130,6448,6566,6730,6605,6869,6890,7178,6653,6902,6975,7236,7030,7280,7314,7525,6695,7013,7059,7302,7140,7333,7369,7556,7192,7387,7433,7581,7450,7653,7655,7883,4944,5735,5752,6287,6018,6316,6339,6708,6099,6395,6451,6732,6585,6860,6887,7177,6135,6552,6601, 6863,6614,6891,7004,7227,6689,7028,6974,7249,7113,7313,7361,7544,6309,6609,6637,6952,6706,7006,7058,7300,6719,7104,7135,7334,7155,7363,7418,7580,6868,7143,7208,7371,7239,7435,7451,7615,7281,7501,7524,7701,7547,7724,7726,7880,6441,6652,6718,7105,6835,7134,7152,7368,6883,7210,7226,7432,7250,7448,7503,7654,6889,7248,7301,7500,7360,7526,7527,7725,7416,7557,7559,7727,7613,7808,7810,7948,7042,7332,7335,7545,7419,7558,7582,7785,7449,7614,7652,7809,7702,7811,7912,7950,7478,7700,7703,7881,7784,7882,7913,7951,7786,7914,7915,8032,7949,8033,8034,8035,1060,1061,1062,1511,1063,1600,1603,1796,1508,1602,1681,2312,1764,2429,2431,3130,1509,1680,1682,2428,1767,2466,2655,3210,1774,2654,2550,3343,2835,3427,3483,4014,1510,1765,1773,2548,1775,2653,2723,3361,2313,2833,2953,3436,3053,3498,3531,4113,2430,2955,3128,3529,3209,3656,3759,4290,3342,3769,3887,4396,3940,4468,4582,5117,1601,1766,1798,2832,2314,2952,3052,3493,2464,3129,2956,3586,3337,3661,3845,4329,2652,3055,3341,3768,3363,3884,3911,4428,3439,3942,4028,4512,4112,4678,4742,5265,2745,3360,3437,3910,3499,3988,4035,4591,3654,4104,4289,4702,4331,4803,4866,5448,3771,4327,4399,4823,4430,4867,4997,5581,4579,5027,5080,5625,5165,5664,5720,6200,1683,1797,2315,3054,2467,3208,3211,3844,2720,3340,3424,3909,3482,3979,3991,4590,2834,3425,3492,3989,3530,4034,4246,4706,3660,4247,4328,4798,4425,4837,4993,5569,2958,3496,3655,4107,3672,4288,4344,4832,3908,4397,4431,4869,4578,5026,5055,5624,3990,4507,4676,5031,4703,5147,5167,5646,4820,5238,5356,5693,5476,5840,5953,6201,3026,3657,3847,4347,3978,4429,4515,5029,4015,4580,4696,5116,4743,5166,5264,5685,4202,4707,4799,5212,4868,5320,5450,5864,4987,5486,5588,5904,5636,5966,6006,6445,4341,4833,4900,5359,5048,5568,5591,5934,5164,5617,5647,5990,5698,6033,6137,6537,5263,5672,5721,6092,5818,6195,6253,6649,5943,6296,6345,6594,6407,6738,6841,7128,1772,2465,2549,3362,2721,3426,3494,4033,2722,3495,3587,4114,3756,4330,4362,4991,2957,3652,3757,4377,3885,4424,4505,4992,3941,4504,4583,5067,4740,5163,5190,5645,3024,3846,3943,4379,4030,4508,4677,5162,4106,4700,4752,5210,4802,5318,5401,5816,4105,4800,4835,5317,4986,5451,5571,5905,5050,5593,5637,5965,5671,6005,6101,6515,3131,4013,4031,4698,4201,4796,4834,5266,4291,4839,4871,5449,4998,5580,5616,5957,4581,4994,5049,5583,5118,5634,5670,6000,5240,5677,5742,6078,5891,6194,6255,6582,4755,5082,5211,5644,5316,5692,5746,6154,5406,5843,5897,6199,5954,6329,6367,6671,5589,5952,5967,6346,6001,6424,6341,6761,6118,6512,6538,6851,6547,6933,7026,7184,3336,4115,4203,4985,4509,5025,5054,5592,4699,5066,5119,5639,5239,5679,5723,6168,4753,5213,5315,5684,5358,5747,5893,6203,5487,5899,5931,6313,5991,6365,6444,6765,4990,5319,5400,5892,5570,5918,5985,6342,5638,5986,6007,6438,6119,6403,6519,6853,5691,6058,6184,6513,6212,6546,6592,6914,6330,6597,6596,6998,6762,7051,7079,7327,5081,5477,5612,5987,5678,6032,6100,6473,5743,6155,6196,6539,6271,6549,6595,6931,5894,6249,6343,6583,6368,6648,6763,7052,6472,6783,6838,7090,6896,7162,7182,7405,5964,6347,6436,6764,6518,6778,6858,7097,6536,6855,6918,7172,6992,7199,7288,7496,6550,6934,7048,7223,7070,7291,7261,7506,7126,7349,7365,7592,7411,7646,7677,7780,1799,2551,2744,3438,2954,3653,3758,4345,2959,3770,3886,4376,3977,4470,4506,5144,3025,3976,4012,4469,4032,4797,4821,5262,4324,4822,4984,5407,5024,5576,5613,5989,3027,4029,4200,4801,4326,4901,4995,5518,4346,5028,5064,5618,5146,5665,5689,6034,4398,5083,5189,5676,5267,5722,5841,6122,5321,5817, 5900,6248,5903,6312,6364,6843,3497,4325,4340,4999,4378,5065,5145,5641,4513,5191,5241,5709,5323,5847,5898,6170,4697,5247,5393,5819,5517,5902,5911,6268,5582,5912,5930,6366,6057,6425,6496,6854,4754,5516,5578,5929,5633,5984,5988,6400,5667,6056,6103,6459,6198,6516,6540,6919,5708,6136,6213,6541,6331,6563,6681,6993,6431,6700,6792,7053,6839,7095,7164,7403,3528,4363,4471,5188,4679,5246,5357,5890,4741,5402,5519,5913,5590,5942,5955,6369,4838,5579,5632,5956,5666,6045,6093,6456,5699,6120,6197,6521,6269,6551,6664,6928,4996,5640,5688,6102,5842,6185,6171,6560,5895,6252,6297,6650,6401,6684,6750,7065,5935,6340,6427,6739,6457,6809,6840,7102,6499,6852,6908,7173,6997,7201,7289,7497,5051,5711,5846,6254,5910,6328,6402,6701,6043,6430,6488,6820,6493,6842,6894,7139,6059,6489,6498,6857,6561,6899,6969,7198,6668,6996,7047,7228,7078,7330,7352,7509,6121,6593,6662,6929,6751,6999,7050,7265,6793,7072,7103,7348,7165,7366,7409,7601,6910,7111,7174,7375,7219,7413,7422,7669,7266,7481,7505,7692,7566,7738,7773,7887,3673,4514,4701,5403,4836,5577,5619,6004,4870,5635,5673,6047,5710,6117,6202,6665,5030,5690,5865,6169,5901,6315,6270,6670,5919,6344,6406,6782,6474,6818,6845,7127,5314,5896,5928,6314,6042,6371,6437,6821,6046,6475,6495,6850,6517,6895,6913,7186,6076,6514,6548,6912,6667,6968,7027,7229,6744,7069,7073,7331,7110,7353,7400,7586,5322,6035,6044,6458,6077,6492,6520,6898,6123,6562,6651,6932,6685,7024,7071,7325,6426,6666,6760,7046,6794,7091,7118,7350,6897,7119,7175,7376,7222,7412,7421,7668,6494,6808,6856,7094,6911,7171,7190,7402,6981,7200,7257,7420,7324,7494,7508,7699,7049,7267,7341,7504,7364,7515,7579,7744,7404,7593,7629,7769,7656,7805,7813,7959,5392,6079,6116,6663,6370,6680,6745,7068,6439,6779,6819,7096,6859,7138,7185,7401,6497,6844,6909,7163,6930,7191,7260,7415,7025,7290,7256,7463,7351,7507,7551,7728,6669,6915,6935,7218,7064,7264,7340,7498,7089,7342,7355,7540,7377,7567,7624,7768,7170,7367,7408,7587,7423,7647,7657,7797,7495,7685,7698,7827,7739,7850,7860,7946,6795,6980,7088,7343,7129,7354,7374,7578,7183,7410,7414,7628,7480,7650,7693,7812,7187,7462,7499,7684,7550,7712,7713,7851,7600,7745,7755,7861,7781,7902,7922,8036,7326,7514,7541,7729,7625,7754,7772,7867,7651,7796,7804,7903,7838,7923,7988,8052,7676,7826,7839,7947,7866,7958,7989,8053,7886,8000,8001,8070,8037,8071,8112,8113,2746,2747,3338,3585,3339,3658,3663,4576,3480,3662,3675,4704,4342,4807,4865,5614,3481,3674,4244,4806,4361,4988,5161,5642,4510,5160,5148,5687,5245,5745,5889,6274,3584,4343,4427,5052,4511,5151,5215,5695,4705,5243,5261,5844,5479,5916,5941,6379,4864,5313,5594,5933,5627,6002,6089,6460,5686,6091,6153,6544,6214,6616,6740,7011,3659,4360,4588,5242,4804,5260,5478,5907,4902,5595,5394,5958,5669,6037,6139,6479,5150,5485,5675,6090,5697,6150,6193,6580,5867,6224,6298,6682,6378,6748,6790,7109,5237,5694,5845,6192,5917,6256,6361,6743,5974,6362,6447,6784,6491,6813,6892,7188,6095,6477,6577,6817,6598,6893,6947,7233,6703,6957,7002,7285,7045,7308,7372,7616,4245,4577,4805,5484,4989,5626,5643,6138,5208,5674,5740,6187,5888,6251,6259,6742,5244,5741,5906,6257,5940,6360,6428,6786,6036,6429,6478,6806,6579,6847,6943,7215,5396,5914,5975,6377,6038,6446,6502,6822,6186,6545,6599,6905,6702,6956,6983,7284,6258,6623,6746,6971,6785,7037,7055,7306,6814,7076,7156,7345,7202,7406,7485,7617,5404,6003,6149,6523,6250,6581,6687,6959,6275,6736,6766,7010,6791,7054,7108,7329,6404,6787,6807,7074,6904,7130,7196,7428,6939,7204,7252,7460,7294,7492,7528,7721,6501,6823, 6916,7159,6976,7214,7255, 7474,7044,7269,7307,7518,7346,7531,7595,7763,7101,7318,7373,7560,7390,7607,7627,7799,748 3,7644,7671,7792,7691,7828,7863,7982,4426,4903,5053,5696,5209,5744,5908,6351,5214,5909,5959,6396,6040,6490,6524,6941,5395,5972,6041,6527,6151,6578,6621,6942,6215,6620,6741,7001,6 788,7039,7062,7305,5398,6148,6225,6543,6348,6660,6747,7038,6376,6780,6800,7066,6812,7124, 7167,7388,6363,6810,6837,7123,6938,7197,7217,7461,6978,7259,7295,7491,7317,7523,7563,775 3,5615,6273,6349,6776,6399,6804,6836,7116,6461,6849,6907,7189,6948,7232,7268,7489,6737,6944,6977,7235,7032,7292,7316,7520,7092,7321,7380,7554,7431,7606,7631,7788,6803,7008,7067,7 304,7122,7344,7382,7596,7180,7425,7453,7611,7486,7661,7679,7819,7253,7484,7493,7672,7521, 7694,7665,7835,7584,7750,7764,7871,7771,7921,7938,8002,5668,6397,6405,6937,6661,6951,698 2,7258,6777,7000,7033,7297,7077,7323,7379,7598,6801,7075,7121,7328,7158,7383,7437,7619,7205,7455,7473,7649,7519,7675,7720,7841,6940,7125,7166,7436,7216,7468,7511,7666,7296,7512,7 529,7718,7585,7689,7759,7885,7339,7548,7604,7751,7620,7770,7790,7908,7662,7795,7794,7934, 7836,7945,7965,8039,7003,7203,7262,7513,7322,7530,7562,7733,7381,7597,7608,7765,7643,777 5,7793,7919,7438,7623,7667,7789,7680,7798,7837,7952,7732,7845,7858,7968,7896,7986,7998,8069,7490,7673,7716,7840,7758,7842,7892,7973,7762,7889,7910,7994,7930,8009,8026,8090,7776,7 924,7942,8015,7960,8029,8021,8096,7980,8047,8057,8114,8075,8122,8131,8152,4589,5149,5236, 5866,5312,5973,6088,6503,5397,6094,6152,6526,6227,6618,6622,7034,5399,6226,6272,6617,635 0,6805,6815,7100,6462,6816,6936,7181,6950,7220,7263,7517,5405,6299,6398,6811,6476,6917,6945,7212,6522,6958,6994,7270,7036,7309,7337,7532,6576,7009,7061,7320,7117,7378,7407,7590,7 131,7389,7456,7622,7459,7648,7674,7865,5915,6463,6500,6949,6542,6995,7035,7299,6683,7063, 7093,7357,7137,7427,7454,7602,6767,7099,7161,7391,7207,7458,7465,7640,7234,7466,7472,767 8,7543,7695,7746,7888,6802,7206,7230,7471,7287,7510,7516,7686,7311,7542,7565,7731,7610,7756,7766,7911,7356,7594,7621,7767,7663,7783,7821,7931,7715,7824,7846,7953,7859,7971,7990,8 067,5932,6525,6619,7060,6749,7098,7157,7430,6789,7168,7213,7467,7254,7482,7487,7681,6848, 7231,7286,7488,7310,7537,7561,7722,7347,7588,7609,7761,7641,7777,7806,7916,6946,7298,733 6,7564,7424,7605,7603,7778,7439,7626,7645,7800,7687,7822,7832,7955,7475,7664,7697,7829,7723,7853,7862,7974,7749,7884,7900,7995,7933,8011,8027,8091,6979,7359,7426,7630,7464,7660,7 688,7825,7535,7714,7736,7856,7741,7864,7894,7985,7549,7737,7748,7891,7779,7899,7927,8008, 7816,7932,7941,8016,7964,8040,8050,8099,7589,7791,7802,7917,7833,7935,7944,8023,7847,796 2,7975,8046,7991,8058,8073,8117,7904,7977,7996,8061,8013,8077,8082,8129,8024,8087,8095,8134,8106,8142,8151,8171,6039,6686,6781,7169,6846,7221,7271,7522,6906,7293,7319,7539,7358,7 577,7618,7807,6970,7338,7429,7599,7457,7659,7642,7818,7469,7670,7690,7844,7734,7854,7869, 7981,7120,7452,7470,7658,7534,7683,7717,7857,7538,7735,7743,7870,7757,7895,7907,8004,755 2,7752,7774,7906,7815,7926,7939,8017,7830,7957,7963,8041,7976,8051,8064,8110,7136,7533,7536,7730,7553,7740,7760,7898,7591,7782,7801,7920,7823,7936,7961,8031,7696,7814,7834,7940,7 848,7969,7978,8048,7897,7979,7997,8062,8014,8076,8081,8128,7742,7852,7890,7970,7905,7993, 8006,8066,7929,8010,8019,8080,8030,8088,8098,8137,7943,8025,8043,8094,8056,8101,8109,814 4,8068,8115,8121,8149,8126,8157,8159,8179,7160,7555,7576,7803,7682,7820,7831,7956,7719,7843,7855,7972,7893,7984,8003,8065,7747,7868,7901,7987,7918,8007,8020,8079,7937,8028,8018,8 085,8049,8097,8105,8140,7817,7909,7925,8012,7954,8022,8042,8092,7967,8044,8055,8102,8063, 8107,8118,8148,7992,8059,8072,8111,8083,8123,8127,8155,8089,8133,8136,8161,8143,8164,8166, 8176,7849,7928,7966,8045,7983,8054,8060,8108,7999,8074,8078,8120,8086,8124,8135,8158,8005,8084,8093,8132,8104,8138,8139,8165,8116,8145,8147,8167,8153,8172,8174,8184,8038,8100,81 03,8141,8119,8146,8150,8169,8125,8154,8156,8173,8162,8175,8180,8186,8130,8160,8163,8177,8 168,8178,8181,8187,8170,8182,8183,8188,8185,8189,8190,8191]

Sequence Group 2: Q2_2048

[0,1,2,4,8,16,32,3,5,64,9,6,17,10,18,128,12,33,65,20,256,34,24,36,7,129,66,512,11,40,6 8,130,19,13,48,14,72,257,21,132,35,258,26,513,80,37,25,22,136,260,264,38,514,96,67,41,144,28,6 9,42,516,49,74,272,1024,1025,160,520,288,528,192,544,70,44,131,81,50,73,15,320,133,52,23,134,384,76,137,82,56,27,97,39,259,84,138,145,261,29,1026,1028,43,98,515,88,140,30,146,71,262,265, 161,576,45,100,640,51,148,46,75,266,273,517,104,162,1032,1040,53,193,152,77,164,768,268,274, 518,54,83,57,521,112,135,78,289,194,85,276,522,58,1056,1027,168,139,99,86,60,280,89,290,529, 524,196,141,101,147,1029,1088,176,142,530,321,31,200,90,545,292,322,532,263,149,102,105,304, 296,163,92,47,267,385,1033,1030,546,324,208,386,150,153,165,106,55,328,536,577,548,113,154, 79,1041,1034,269,108,578,224,166,519,552,195,270,641,523,275,580,291,1042,1152,59,169,560,1 14,277,156,87,197,116,170,61,531,525,642,1036,1057,281,278,526,177,293,388,91,584,1089,1044, 769,198,172,120,201,336,62,282,1280,1058,143,103,178,294,93,644,202,592,323,392,1048,1060, 297,770,107,180,151,209,284,648,1031,1153,94,204,298,400,608,352,325,533,155,210,305,547,30 0,109,1090,1536,184,534,537,115,167,225,326,306,1035,1064,772,157,656,329,110,117,212,171,1 092,1154,776,330,226,549,538,387,308,216,1043,1037,416,271,279,158,1072,1038,337,550,672,118,332,579,540,389,173,121,553,199,784,179,228,338,312,704,1096,1281,390,174,554,581,1045,1 156,393,283,122,448,353,561,1059,1282,203,63,340,394,527,582,556,181,295,285,232,124,205,18 2,643,562,286,585,1050,1537,299,354,1104,1061,211,401,185,396,1049,1046,344,586,645,593,53 5,240,206,95,327,564,800,402,1160,1284,356,307,301,417,1288,1062,213,568,832,588,186,646,40 4,227,896,594,418,302,1538,1120,649,771,360,539,1091,1065,1168,1052,111,331,214,309,188,449, 217,408,609,596,551,650,1093,1066,229,159,420,310,1540,1073,541,773,1098,1296,610,657,333, 119,600,339,218,368,652,230,391,313,450,542,1184,1544,334,233,555,774,175,123,658,612,1312,1552,341,777,220,314,1216,1568,424,395,673,583,1094,1068,355,287,183,234,1155,1105,125,557, 660,616,1074,1097,1039,1344,342,316,241,778,563,345,452,397,1157,1076,1047,1158,403,207,6 74,558,785,432,357,187,236,664,624,587,1408,1100,780,705,126,242,565,398,1161,1106,346,456, 358,405,1080,1051,1121,1063,303,569,244,595,189,566,676,361,706,589,215,786,647,348,419,406,464,680,801,362,1283,1108,590,409,1162,1169,1285,1053,570,788,597,572,219,311,1067,1122,1 539,1112,708,598,601,651,421,792,802,611,1164,1054,602,410,1170,1095,231,688,653,248,369,19 0,364,654,659,335,1286,1289,480,315,221,370,1185,1600,1069,1124,613,422,425,451,1664,1075, 614,543,235,412,343,372,1172,1070,775,317,222,426,1099,1290,453,237,559,833,804,712,1297,1541,1128,1186,834,661,808,779,1077,1217,617,604,1176,1101,433,720,816,836,347,897,1188,179 2,1292,1298,243, 662,454,318,675,618,1542,1078,898,781,376,428,1107,1081,665,736,567,840,62 5,238,1545,1136,1159,1102,359,457,1313,1218,399,787,591,678,1109,1300,434,677,349,245,458,6 66,620,363,127,191,782,407,1546,1082,1192,1163,436,626,571,465,1123,1110,681,246,707,350,1084,1304,599,668,790,460,1113,1314,249,682,573,411,803,789,709,365,1553,1548,1220,1165,440,6 28,689,374,423,466,793,250,1125,1171,1200,1166,1554,1345,1055,1224,371,481,574,413,1114,15 69,1316,1346,603,366,468,655,900,805,615,684,1556,1287,710,429,1173,1126,794,252,1129,1328, 373,605,848,690,713,632,1320,1187,482,806,1116,1071,427,904,1291,1409,414,223,663,692,1570,1348,835,619,1232,1410,472,455,796,809,1174,1177,1189,1130,714,721,837,716,864,810,606,912, 1079,1352,722,696,377,435,817,319,1560,1601,621,812,1572,1137,484,430,1178,1103,1293,1132, 838,667,488,239,378,459,1602,1248,1190,1543,1576,1219,622,627,437,380,1294,1665,1547,1299, 818,461,496,669,679,724,841,629,351,467,1604,1315,1083,1193,438,737,1584,1138,251,462,442,441,469,247,1301,1180,683,842,1111,1221,1140,1194,738,899,670,783,1085,1555,1549,1666,849, 820,1305,1302,728,928,1550,1201,791,367,901,630,1317,1412,685,844,633,711,1115,1608,1793,1 222,1196,1144,1225,1360,253,691,1086,1306,824,902,686,740,850,375,444,470,483,415,1167,112 7,1202,1318,1117,1668,1226,1616,485,905,1347,1416,795,473,1321,1794,634,744,852,960,1131,1 204,865,693,1175,1233,797,906,1308,1672,715,807,1118,1228,474,636,1322,1424,1632,1376,694, 254,717,575,913,798,1349,1557,1179,1234,1329,1571,1324,1133,811,379,1208,1558,697,431,607, 489,1561,1139,866,723,486,908,718,813,476,856,1191,1249,1350,1330,839,725,1796,1181,1680,1 353,698,914,752,868,1134,1141,819,814,1236,1195,1800,1354,1250,1573,1562,1411,1332,1240,43 9,929,490,623,671,739,916,463,843,381,1440,1295,1303,1182,1361,1574,497,930,1696,1142,821, 726,961,872,1356,1603,492,631,1564,1413,1197,1145,729,700,443,741,1577,1223,1808,1203,125 2,1362,845,920,1336,1728,382,822,1414,1198,851,730,1578,1605,1417,1307,498,880,1146,1472,7 42,445,471,635,932,687,1377,1585,903,825,1227,1087,1364,1418,500,846,745,826,1551,1606,158 0,1205,1319,1309,732,446,1256,1148,1229,1206,1667,1586,962,936,475,853,867,637,1310,1609,1 323,1378,1235,1425,907,487,695,746,828,753,1209,1420,1368,1610,854,857,1669,1617,1559,126 4,1230,1119,504,799,255,964,1351,1588,1824,1426,1380,1331,909,719,477,915,1325,1441,638,74 8,944,869,1237,1592,491,699,1856,1612,754,858,1210,1670,1428,1251,478,968,1920,1618,1442,1 326,1673,1795,383,910,1384,1563,1135,1355,815,976,870,917,727,493,1238,1333,873,701,1212,1 473,1241,1432,931,756,1633,1620,1575,1674,860,499,1253,1183,1444,1334,1565,1797,731,823,922,874,1634,1681,918,502,1357,1143,1624,1363,933,743,1242,1392,760,881,1676,1254,1415,133 7,1474,1566,1358,1257,494,702,1579,1798,921,501,1199,1147,1682,1636,1365,1801,876,847,992, 447,1244,1338,733,827,1448,1419,934,882,1697,1607,937,963,1379,1311,1207,1258,1149,1581,7 47,505,855,924,1684,1640,1366,1340,1265,1802,734,829,1587,1369,1476,1421,965,938,1427,1231,1698,1582,1809,1456,884,506,1381,1211,749,945,1260,1688,1648,1611,966,755,859,940,1804,1 729,1150,1266,1589,1422,1370,1480,830,911,871,639,1382,1429,1327,1593,1268,1619,888,479,1 213,1590,1700,1385,1730,1613,946,750,1239,1810,1671,1372,1443,1430,1488,1704,969,508,861, 757,1825,1386,970,919,1614,1433,875,862,1594,1812,1621,1596,758,948,1243,1335,1732,1622,1 625,1675,1445,1816,977,923,1826,1635,972,761,1626,1434,1255,1712,877,952,1677,1272,495,70 3,1393,1214,1388,1678,935,978,1683,1359,1504,1339,1245,1394,1637,1446,1449,1475,1638,1567, 1259,1436,883,762,1367,1396,503,925,1799,1341,1246,1450,878,735,1477,1261,993,885,1583,1857,1828,1736,939,994,1858,1685,1832,1803,1641,1628,1457,1744,1840,1860,980,926,764,941,13 71,1921,1267,1686,1478,1342,967,886,1699,1642,831,947,1922,1805,1400,1452,1689,1760,507,8 89,1591,1864,1649,1262,984,751,1383,1481,942,996,1423,1811,1615,1702,1458,1701,1373,1269, 1482,1690,1644,1387,971,890,1151,1215,1806,1431,1460,1650,509,949,973,1000,1595,1489,1705, 1270,1731,1374,892,950,1623,1692,1814,1484,1273,1706,863,759,1008,510,1597,1435,1827,181 3,1733,1389,1464,1652,1713,1398,1447,1490,979,953,1817,1274,1395,1505,1598,1437,763,974,1 627,1390,1492,1679,954,879,1924,1829,981,982,1639,1708,1734,1453,1818,1276,927,995,1397,1629,1872,1714,1737,1656,1506,1830,1451,1928,1438,1247,1687,1716,1859,1643,1496,1479,1820, 1833,765,956,1738,1745,1861,1740,1888,1834,887,985,1630,1936,1746,1720,1401,1459,997,986, 1841,1343,1645,1836,1508,1454,1862,1691,943,891,1512,1263,1402,1483,1646,1651,1461,1404,1 842,1485,998,766,1520,1693,511,988,1703,1748,1865,1653,1375,1491,1462,1761,1275,1486,1466, 1465,1001,951,1493,1271,1707,1866,1762,1923,1694,1807,1873,1844,1752,1952,1815,1391,1002, 893,1925,1654,1709,1868,1657,1735,1277,1715,975,894,1848,1926,1710,1764,1874,1399,1468,1 494,1507,1439,1509,1929,1009,955,1819,1497,1658,1768,1876,1984,1889,1717,1821,1930,1739,1 831,1004,1010,1498,1660,957,983,1718,1278,1741,1599,1937,1822,958,987,1835,1403,1721,1455, 1631,1513,1890,1747,1012,999,1510,1932,1742,1837,1500,1880,1863,1749,1016,767,1722,1938, 1776,1892,1843,1838,1463,1953,1514,1647,1695,1763,1940,1487,1867,1405,989,1003,1521,1954, 1845,1750,1985,1896,1516,1655,1753,1724,1467,1765,990,1005,1869,1944,1406,1846,1875,1754, 1522,1904,1766,1469,1495,1659,959,1011,1956,1711,1927,1849,1524,1870,1769,1850,1756,1470, 1986,1960,1499,1877,1891,1661,1931,1511,1013,895,1719,1770,1852,1777,1878,1881,1528,1823, 1279,1988,1933,1743,1501,1939,1662,1772,1006,1014,1968,1893,1515,1723,1778,1882,1502,199 2,1407,1934,1839,2000,1894,1941,1017,1018,1751,1517,1897,1725,1955,1780,1884,1523,1755,18 47,1946,1898,1942,1526,1957,1767,991,1020,1784,1905,1518,1726,1945,1525,1900,1871,2016,14 71,1757,1851,1958,1906,1961,1987,1771,1529,1879,1948,1758,1853,1989,1962,1908,1530,1773,1969,1990,1779,1883,1964,1854,1935,1895,1663,1912,1503,1970,1774,1993,1532,1885,1781,1994, 1943,1899,1886,1782,1972,2001,1947,1996,1785,1901,1976,1519,1727,1959,2002,1007,1015,190 7,1786,1527,1949,1902,1759,2017,1909,1963,2018,2004,1950,1788,1965,1991,1910,1855,1971,15 31,1913,2008,1775,1966,2020,1995,1914,1533,1973,1997,2024,1916,1974,1887,1783,2032,1534,2 003,1977,1019,1021,1787,1998,1978,1903,2005,2006,1951,2019,1789,1980,1911,2009,2021,2010, 1967,1915,2022,1790,1535,2012,2025,1975,1022,1023,2026,1917,1999,1918,2033,1979,2028,203 4,1981,2007,1982,2011,2036,2023,2040,1791,2013,2027,2014,2029,1983,2035,2037,1919,2030,20 38,2041,2042,2015,2044,2031,2039,2043,2045,2046,2047]

Sequence Group 2: Z2_2048

[0,1,2,7,3,8,11,24,4,10,13,28,16,33,35,78,5,12,14,32,19,38,47,82,22,46,42,89,57,97,105, 170,6,17,21,40,23,45,51,91,29,55,59,100,73,112,117,185,34,61,76,115,81,126,135,198,88,137,147, 224,154,234,256,369,9,18,26,54,30,58,72,107,36,77,62,118,85,129,141,205,44,75,87,136,93,144,153,230,103,156,172,246,184,264,282,405,53,90,101,152, 113,162,179,261,122,180,197,274,209,29 5,312,440,139,203,227,301,232,313,337,467,253,343,362,485,379,508,544,722,15,25,31,74,39,80, 83,140,48,86,94,151,104,161,167,260,56,95,106,163,116,178,194,276,128,195,204,290,229,309,33 1,455,66,110,123,183,130,196,212,302,150,225,233,315,252,342,355,484,166,243,262,347,275,375,381,504,298,394,422,535,444,562,615,723,70,127,143,215,160,231,251,345,171,254,266,368,28 3,380,404,529,192,277,291,392,314,418,442,568,325,446,470,590,492,624,646,819,211,303,320,4 25,348,454,473,610,378,481,505,638,536,651,699,867,403,518,545,680,560,717,737,907,613,748, 767,902,799,950,1005,1188,20,37,41,92,49,96,108,177,50,109,119,186,132,208,216,329,63,120,133,219,145,228,241,330,155,240,257,361,278,377,384,503,68,142,157,221,174,244,263,376,182,27 2,284,388,294,414,429,558,181,292,305,413,324,443,457,591,350,475,493,623,517,645,683,851,7 9,169,175,268,191,288,304,406,199,311,319,441,338,466,480,619,255,334,349,469,370,490,516,6 40,398,521,550,674,571,716,739,892,287,364,389,502,412,534,552,704,434,565,577,721,616,755,785,933,471,614,625,776,641,802,763,959,690,848,868,1019,879,1073,1110,1226,84,187,193,323, 245,341,354,474,269,360,371,497,395,523,547,708,285,393,409,528,424,553,573,725,447,581,607, 751,639,779,818,963,328,415,428,572,456,600,631,764,496,632,647,814,691,795,859,1023,533,6 70,714,849,730,878,898,1064,760,905,904,1098,960,1125,1149,1301,363,445,476,633,522,650,682,829,551,705,718,869,745,885,903,1071,574,733,765,893,786,906,961,1126,828,977,998,1158,10 34,1198,1218,1377,622,777,810,962,858,972,1030,1169,866,1025,1066,1208,1090,1237,1286,143 4,886,1080,1120,1253,1138,1291,1267,1460,1186,1321,1345,1510,1395,1542,1563,1666,27,43,52, 102,60,121,134,213,67,138,146,218,159,236,242,372,69,158,168,235,176,289,299,402,200,300,322,435,340,460,477,637,71,173,190,293,202,321,335,450,214,344,356,482,374,509,531,652,226,36 5,383,520,407,546,563,696,419,559,586,732,589,750,778,1007,111,201,210,339,220,357,373,499, 247,385,399,539,421,567,580,710,267,401,427,561,449,588,597,742,468,598,606,784,667,803,842, 1024,286,448,464,603,487,630,636,790,511,666,685,825,720,854,876,1067,538,698,731,877,761, 891,935,1091,807,940,980,1127,999,1161,1202,1369,114,217,237,382,265,400,423,570,279,432,45 1,599,472,612,617,787,310,465,486,618,510,661,681,820,537,694,719,865,743,887,918,1068,336, 498,530,684,564,715,711,888,575,736,749,910,791,938,956,1129,611,762,805,951,821,987,1004,1 170,847,1022,1046,1209,1097,1241,1287,1435,351,543,566,738,596,754,794,941,655,806,836,994, 839,1006,1032,1197,671,837,846,1029,889,1041,1085,1236,928,1096,1115,1260,1148,1304,1330, 1467,695,899,916,1069,957,1099,1124,1273,981,1140,1171,1320,1203,1348,1385,1517,1048,1173, 1212,1355,1247,1397,1410,1561,1276,1425,1457,1584,1490,1624,1663,1767,131,250,273,433,308, 461,483,644,318,491,519,663,542,689,724,919,346,532,569,709,587,753,744,932,601,766,798,97 6,830,990,1009,1187,408,576,602,752,654,789,811,995,662,831,841,1018,855,1033,1053,1232,67 2,850,884,1052,925,1084,1111,1261,954,1133,1141,1305,1172,1331,1366,1502,420,653,660,824,6 73,838,864,1040,697,890,911,1072,939,1106,1139,1299,804,924,958,1114,982,1159,1178,1322,1035,1179,1213,1356,1252,1396,1405,1560,840,986,1028,1160,1049,1205,1234,1368,1087,1240,126 3,1404,1298,1430,1466,1591,1121,1277,1309,1456,1344,1471,1499,1632,1376,1511,1535,1651,15 52,1697,1707,1833,426,675,688,917,788,934,955,1132,815,973,991,1168,1031,1196,1227,1367,84 3,1008,1047,1199,1070,1235,1266,1401,1107,1290,1262,1421,1323,1461,1489,1602,929,1065,108

1,1246,1128,1272,1308,1440,1157,1312,1337,1476,1357,1491,1520,1650,1204,1349,1384,1503,14 11,1543,1553,1681,1431,1577,1590,1721,1625,1738,1746,1812,983,1086,1156,1313,1189,1336,13 54,1498,1219,1394,1400,1534,1424,1544,1585,1706,1233,1420,1441,1576,1488,1594,1595,1739,1 516,1633,1641,1747,1667,1784,1798,1884,1300,1470,1477,1603,1521,1640,1662,1757,1545,1680, 1696,1785,1734,1799,1850,1946,1562,1720,1735,1813,1756,1832,1851,1947,1766,1866,1867,198 6,1885,1987,2010,2011,64,65,98,149,99,164,189,280,124,188,207,306,238,327,333,514,125,206,2 22,326,249,358,397,526,270,396,386,555,439,585,605,774,148,239,259,366,271,391,417,557,307, 437,453,592,501,628,643,813,332,459,512,635,525,664,687,844,554,693,727,896,740,920,952,113 5,165,248,296,436,316,452,500,609,352,513,462,648,541,669,703,861,390,507,549,692,579,712,7 35,912,595,746,780,942,812,968,996,1185,431,556,593,734,629,768,797,965,658,800,835,984,863, 1017,1050,1230,701,857,901,1027,914,1051,1083,1269,947,1095,1122,1293,1151,1318,1360,153 6,223,281,317,506,359,524,527,702,410,548,582,729,604,759,771,964,438,583,608,769,642,796,832,988,668,833,860,1012,909,1043,1077,1255,478,626,659,809,676,834,872,1036,728,897,915,10 55,946,1094,1113,1292,770,931,966,1103,985,1145,1153,1316,1020,1174,1214,1347,1242,1378,14 37,1537,494,665,707,875,758,913,945,1101,775,948,970,1134,997,1152,1184,1339,826,989,1013,1 166,1054,1206,1238,1386,1063,1244,1274,1412,1302,1446,1464,1615,871,1037,1058,1217,1104,1254,1279,1428,1150,1285,1317,1454,1350,1469,1515,1653,1183,1328,1361,1494,1374,1529,1549, 1683,1433,1558,1579,1676,1601,1704,1741,1842,258,353,367,578,411,584,620,793,416,621,649,8 16,678,862,880,1075,463,656,679,883,713,908,927,1076,741,926,953,1119,992,1147,1162,1315,48 8,706,747,895,782,936,967,1146,808,978,1000,1164,1016,1200,1223,1372,801,1014,1039,1195,10 62,1239,1257,1413,1108,1281,1303,1445,1327,1463,1497,1643,515,773,783,974,823,1010,1038,1 190,845,1045,1057,1231,1088,1268,1284,1443,949,1078,1105,1271,1136,1296,1326,1458,1176,13 33,1364,1492,1389,1528,1551,1672,1003,1130,1165,1314,1194,1346,1370,1518,1228,1381,1399,1 533,1438,1569,1587,1695,1275,1436,1447,1580,1459,1604,1573,1713,1506,1638,1654,1749,1659, 1783,1802,1860,540,817,827,1061,937,1093,1112,1280,975,1118,1137,1307,1175,1335,1363,1522,1001,1167,1193,1338,1216,1371,1391,1539,1245,1403,1427,1565,1455,1583,1614,1717,1074,120 1,1222,1390,1256,1418,1449,1574,1306,1450,1465,1612,1507,1599,1647,1751,1343,1484,1526,16 39,1540,1658,1674,1774,1570,1679,1678,1796,1714,1809,1823,1895,1123,1243,1282,1451,1334,1 468,1496,1621,1365,1519,1530,1655,1557,1661,1677,1781,1392,1547,1575,1673,1588,1682,1715, 1810,1620,1723,1736,1826,1762,1846,1858,1923,1444,1581,1610,1716,1646,1718,1758,1831,165 2,1753,1776,1854,1792,1869,1888,1942,1664,1786,1806,1875,1818,1891,1881,1950,1840,1903,19 11,1966,1927,1974,1983,2006,297,387,430,594,458,657,686,873,479,700,726,882,757,922,930,11 42,489,756,772,921,792,1011,1021,1182,852,1026,1060,1229,1092,1258,1283,1453,495,781,822,1 015,856,1059,1079,1250,874,1100,1116,1288,1144,1319,1341,1472,900,1131,1155,1332,1191,136 2,1379,1512,1207,1373,1406,1546,1409,1564,1582,1743,627,853,870,1089,894,1117,1143,1311,94 3,1163,1177,1353,1211,1383,1402,1524,971,1181,1221,1375,1249,1408,1415,1554,1270,1416,142 6,1586,1483,1605,1634,1752,1002,1248,1264,1423,1295,1448,1452,1596,1325,1482,1501,1619,15 32,1644,1656,1777,1352,1514,1541,1657,1571,1671,1699,1793,1609,1702,1724,1811,1737,1829,1 848, 1921,634,881,923,1154,969,1180,1215,1388,993,1224, 1251,1417,1278,1432,1439,1589,1044, 1265,1294,1442, 1324,1479,1495,1616,1351,1508,1531,1649,1555,1665, 1688,1778,1082,1310,134 0,1500,1380,1527,1525,1668, 1393,1548,1559,1684,1597,1700,1710,1815,1429,1572, 1607,1705,16 17,1729,1740,1834,1637,1750,1768,1855, 1795,1871,1889,1943,1109,1359,1382,1550,1414,1568,1 598,1703,1475,1608,1626,1732,1629,1742,1760,1845, 1485,1627,1636,1755,1669,1765,1789,1868, 1692,1794, 1805,1876,1822,1896,1906,1953,1509,1675,1686,1779, 1711,1797,1808,1883,1725,182 0,1835,1902,1849,1912, 1925,1969,1770,1837,1856,1915,1873,1929,1934,1981, 1886,1939,1949,19 88,1960,1996,2005,2027,677,944,979, 1225,1042,1259,1289,1462,1056,1297,1329,1481,1358, 1505, 1538,1689,1102,1342,1387,1523,1407,1567,1556, 1694,1419,1578,1600,1722,1622,1730,1745,184 1,1192, 1398,1422,1566,1474,1593,1611,1733,1480,1623,1631, 1748,1645,1761,1773,1862,1486,16 42,1660,1772,1691, 1788,1803,1877,1708,1817,1821,1897,1836,1907,1918, 1964,1210,1473,1478,1 618,1487,1628,1648,1764,1513, 1670,1685,1782,1701,1800,1819,1893,1606,1690,1712, 1804,1726, 1827,1838,1904,1763,1839,1857,1916,1874, 1928,1933,1980,1630,1728,1754,1828,1771,1853,186 4,1920,1791,1870,1879,1932,1892,1940,1952,1991,1807, 1887,1899,1948,1910,1955,1963,1998,19 22,1967,1973, 2003,1978,2013,2015,203 5,1220,1493,1504,1687,1592, 1698,1709,1816,1613,1719,1 731,1830,1759,1844,1861, 1919,1635,1744,1769,1847,1780,1865,1880,1931,1801, 1890,1878,1937, 1905,1951,1959,1994,1693,1775,1787, 1872,1814,1882,1898,1944,1825,1900,1909,1956,1917,196 1,1970,2002,1852,1913,1924,1965,193 5,1975,1979,2009, 1941,1985,1990,2017,1997,2020,2022,20 32,1727,1790, 1824,1901,1843,1908,1914,1962,1859,1926,1930,1972, 1938,1976,1989,2014,1863,1 936,1945,1984,1958,1992, 1993,2021,1968,1999,2001,2023,2007,2028,2030,2040, 1894,1954,1957, 1995,1971,2000,2004,2025,1977,2008, 2012,2029,2018,2031,2036,2042,1982,2016,2019,2033,202 4,2034,2037,2043,2026,2038,2039,2044,2041,2045,2046, 2047]

Sequence Group 2: Q2_4096

[0,1,2,4,8,16,32,3,5,64,9,6,17,10,18,128,12,33,65,20, 256,34,24,36,7,129,66,512,11,40,6 8,130,19,13,48,14,72, 257,21,132,35,258,26,513,80,37,25,22,136,260,264,38,514, 96,67,41,144,28,6 9,42,516,49,74,272,1024,1025,160,520, 288,528,192,544,70,44,131,81,50,73,15,320,133,52,23,134, 384,76,137,82,56,27,97,39,259,84,138,145,261,29,1026, 1028,43,98,515,88,140,30,146,71,262,265, 161,576,45,100, 640,51,148,46,75,266,273,517,104,162,1032,1040,53,193, 2048,2049,2050,2052,15 2,77,164,768,268,274,518,54,83, 57,521,112,135,78,289,194,85,276,522,58,1056,1027,168, 139,99, 86,60,280,89,290,529,524,196,141,101,147,1029, 1088,176,142,530,321,31,200,90,545,292,322,53 2,263, 149,102,105,304,296,163,92,47,267,385,1033,1030,546, 324,2056,2064,2080,2051,208,386,1 50,153,165,106,55, 328,536,577,548,113,154,79,1041,1034,269,108,578,224, 166,519,552,195,270, 641,523,275,580,291,1042,1152,59, 169,560,114,277,156,87,197,116,170,61,531,525,642,1036, 105 7,2053,2112,2057,2054,281,278,526,177,293,388,91, 584,1089,1044,769,198,172,120,201,336,62,2 82,1280, 1058,143,103,178,294,93,644,202,592,323,392,1048,1060, 297,770,107,180,151,209,284,6 48,1031,1153,94,204,2065, 2058,2066,2176,298,400,608,352,325,533,155,210,305, 547,300,109,10 90,1536,184,534,537,115,167,225,326,306, 1035,1064,772,157,656,329,2060,2081,2113,2068,110,1 17,212,171,1092,1154,776,330,226,549,538,387,308,216, 1043,1037,416,271,279,158,1072,1038,3 37,550,672,118, 332,579,540,389,173,121,553,199,784,179,228,338,312, 704,1096,1281,390,174,23 04,2082,2072,2084,554,581, 1045,1156,393,283,122,448,353,561,1059,1282,203,63, 340,394,527,5 82,556,181,295,285,232,124,205,182,643, 562,286,585,1050,1537,2055,2177,2114,2560,299,354,1 104,1061,211,401,185,396,1049,1046,344,586,645,593, 535,240,206,95,327,564,800,402,1160,128 4,356,307,301, 417,2059,2088,2116,2178,1288,1062,213,568,832,588,186, 646,404,227,896,594,41 8,302,1538,1120,649,771,360,539, 1091,1065,1168,1052,111,331,214,309,2067,2061,2096, 2062,18 8,449,217,408,609,596,551,650,1093,1066,229, 159,420,310,1540,1073,2120,2305,2069,2180,541, 773, 1098,1296,610,657,333,119,600,339,218,368,652,230,391, 313,2083,2306,2074,2561,450,542, 1184,1544,334,233, 555,774,175,123,658,612,1312,1552,341,777,220,314, 1216,1568,2128,2085,20 73,2070,424,395,673,583,1094, 1068,355,287,183,234,1155,1105,125,557,660,616,2184, 2308,2312, 2086,1074,1097,1039,1344,342,316,241,778, 563,345,452,397,1157,1076,1047,1158,403,207,674, 558, 785,432,357,187,236,664,624,587,2562,2144,2115,2089, 1408,1100,780,705,126,242,565,398, 1161,1106,346,456, 358,405,1080,1051,2192,2076,2117,2090,1121,1063,303, 569,244,595,189,566, 676,361,706,589,215,786,647,348, 2564,2097,2122,2320,419,406,464,680,801,362,1283,1108, 590, 409,1162,1169,1285,1053,570,788,3072,3073,2208, 2568,597,572,219,311,1067,1122,1539,1112,23 36,2576, 2240,2592,708,598,601,651,421,792,802,611,1164,1054, 602,410,1170,1095,231,688,653,2 48,369,190,364,654,659, 335,1286,1289,480,315,221,370,1185,1600,1069,1124,613, 422,2118,2092, 2179,2129,425,451,1664,1075,614,543, 235,412,2098,2121,2063,2368,343,372,1172,1070,775,317, 222,426,1099,1290,453,237,2181,2100,2071,2182,559,833, 804,712,1297,1541,1128,1186,834,661, 808,779,1077, 1217,617,604,1176,1101,433,720,816,836,347,897,1188, 1792,1292,1298,243,662,45 4,318,675,618,1542,1078, 2432,2124,2185,2130,898,781,376,428,2104,2075,2145, 2087,1107,1081, 665,736,567,840,625,238,2307,2132, 2186,2193,1545,1136,1159,1102,359,457,1313,1218,399, 787, 591,678,1109,1300,434,677,349,245,458,666,620,363, 127,191,2309,2077,3074,3076,782,407,1546, 1082,1192, 1163,436,626,2091,2146,2563,2136,571,465,1123,1110, 681,246,707,350,1084,1304,59 9,668,790,460,1113,1314, 249,682,573,411,803,789,709,365,2188,2078,2194,2119, 1553,1548,1220, 1165,440,628,689,374,2310,2313,2209, 2624,2093,2148,2688,2099,423,466,793,250,1125,1171, 120 0,1166,1554,1345,1055,1224,371,481,574,413,1114, 1569,1316,1346,603,366,468,655,2196,2094,2 123,2314, 900,805,615,684,1556,1287,710,429,2321,2565,2152,2210, 1173,1126,794,252,3080,308 8,2101,2241,1129,1328,373, 605,848,690,713,632,1320,1187,482,806,1116,1071,427, 904,1291,140 9,414,223,663,692,1570,1348,835,619,1232, 1410,2200,2125,2212,2816,472,455,796,809,1174,117 7,1189,1130,714,721,837,716,864,810,606,912,2316,2322, 2566,2102,1079,1352,722,696,377,435, 817,319,2131, 2105,2569,2160,1560,1601,621,812,1572,1137,484,430, 2183,2126,2337,2242,1178, 1103,1293,1132,838,667,488, 239,2133,2324,2570,2106,378,459,1602,1248,1190,1543, 1576,1219,3 104,3075,2216,2187,2147,2134,2108,2328, 622,627,437,380,1294,1665,1547,1299,818,461,496,66 9,679,724,841,629,2137,2338,2577,2572,2244,2189,2149, 2195,351,467,1604,1315,1083,1193,438, 737,1584,1138, 251,462,442,441,469,247,1301,1180,683,842,1111,1221, 1140,1194,3077,3136,2224, 2190,738,899,670,783,1085, 1555,1549,1666,849,820,1305,1302,2578,2369,2079,2248, 728,928,15 50,1201,791,367,901,630,2138,2593,2340, 2370,2580,2311,2197,2150,1317,1412,685,844,633,711, 1115,1608,1793,1222,1196,1144,1225,1360,253,691,1086, 1306,824,902,686,740,850,375,444,470, 483,415,1167, 1127,1202,1318,1117,1668,1226,1616,485,905,1347,1416, 2153,2352,2344,2211,795, 473,1321,1794,2140,2095,2315, 2433,3081,3078,2594,2372,634,744,852,960,1131,1204, 865,693,1 175,1233,797,906,2256,2434,2198,2201,2213, 2154,2103,2376,1308,1672,715,807,1118,1228,474, 636, 1322,1424,1632,1376,694,254,717,575,2584,2625,2596, 2161,913,798,1349,1557,2202,2127,3 089,3082,1179,1234, 1329,1571,1324,1133,811,379,1208,1558,697,431,607,489, 1561,1139,866,723, 486,908,2317,2156,2626,2272,718, 813,476,856,1191,1249,1350,1330,2214,2567,2600,2243, 2318, 2689,2571,2323,839,725,1796,1181,1680,1353,698, 914,2628,2339,3090,3200,752,868,1134,1141,8 19,814, 1236,1195,1800,1354,1250,1573,2107,2217,2608,2162, 1562,1411,1332,1240,439,929,490, 623,2325,2204,2135, 2245,671,739,916,463,843,381,1440,1295,1303,1182,1361, 1574,2164,2218,2 109,2579,2573,2690,3084,3105,497,930, 1696,1142,821,726,961,872,2329,2326,2574,2225,1356,1 603,492,631,2341,2436,2139,2632,1564,1413,1197,1145, 729,700,443,741,1577,1223,1808,1203,3 137,3092,2817, 2246,2220,2168,2249,2384,1252,1362,845,920,1336,1728, 382,822,1414,1198,851, 730,2110,2330,3328,3106,1578, 1605,1417,1307,498,880,1146,1472,2191,2151,2226,2342, 742,445, 471,635,932,687,1377,1585,903,825,1227,1087, 2141,2692,2250,2640,2371,2440,3096,3108,1364, 1418, 500,846,2345,2818,2155,2228,745,826,1551,1606,1580, 1205,1319,1309,2199,2257,2332,269 6,732,446,1256,1148, 1229,1206,1667,1586,962,936,475,853,867,637,1310,1609, 1323,1378,1235,1 425,907,487,695,746,3079,3201,2142, 2252,2346,2448,2656,2400,828,753,1209,1420,1368, 1610,8 54,857,2373,2581,2203,2258,1669,1617,1559,1264, 1230,1119,504,799,2353,2595,2348,2157,255, 964,1351, 1588,1824,1426,1380,1331,3138,3584,2232,2582,909,719, 477,915,1325,1441,638,748,9 44,869,1237,1592,491,699, 1856,1612,2585,2163,2215,2273,2374,2354,3083,3112, 754,858,1210,1 670,1428,1251,478,968,1920,1618,1442, 1326,1673,1795,383,910,2820,2205,2704,2377,2158,2165, 2260,2219,3140,3202,2824,2378,2274,2597,2586,2435, 1384,1563,1135,1355,815,976,870,917,23 56,2264,3091, 3085,2464,2319,2327,2206,727,493,1238,1333,873,701, 1212,1473,1241,1432,931,7 56,1633,1620,1575,1674,3120, 3086,2385,2598,860,499,1253,1183,2720,2166,2380,2627, 1444,133 4,1565,1797,2588,2437,2221,2169,731,823,922, 874,1634,1681,918,502,1357,1143,1624,1363,260 1,2247, 2832,2227,933,743,1242,1392,2276,2386,2360,2752,760, 881,1676,1254,3144,3329,2438,2 222,1415,1337,1474, 1566,1358,1257,494,702,2602,2629,3093,3204,1579,1798, 921,501,2441,2331, 2170,2496,1199,1147,1682,1636,1365, 1801,876,847,2401,2609,3107,3330,2251,2111,2388, 2442,9 92,447,1244,1338,733,827,1448,1419,934,882, 1697,1607,937,963,1379,1311,2575,2630,2604,222 9,1207, 1258,1149,1581,747,505,855,924,1684,1640,1366,1340, 2343,2333,2280,2172,1265,1802,7 34,829,2253,2230,2691, 2610,1587,1369,1476,1421,2334,2633,3098,3585,2347, 2402,3152,3109,96 5,938,1427,1231,1698,1582,1809,1456, 884,506,1381,1211,2259,2449,2233,2444,3097,3094,2392, 2634,2693,2641,2583,2288,749,945,1260,1688,1648,1611, 966,755,2254,2143,2375,2612,2848,245 0,3208,3332,859, 940,1804,1729,1150,1266,1589,1422,1370,1480,830,911, 871,639,1382,1429,132 7,1593,1268,1619,2404,2355,2349, 2465,3336,3110,2261,2616,888,479,1213,1590,2880,2636, 2234, 2694,1700,1385,1730,1613,946,750,1239,1810,1671, 1372,1443,1430,2452,2275,2944,2642,1488, 1704,969,508, 2466,2350,3586,3168,2697,2819,2408,2587,861,757,1825, 1386,970,919,1614,1433, 3139,3113,3216,3100,2159,2379, 2262,2357,875,862,1594,1812,2236,2497,2265,2456,1621, 1596,7 58,948,2657,2644,2599,2698,1243,1335,1732,1622, 1625,1675,1445,1816,3141,3114,2277,2207,97 7,923,1826, 1635,972,761,1626,1434,2468,2358,3588,3121,2589,2821, 3146,3344,2658,2705,2381, 2167,2648,2387,2266,2416, 1255,1712,877,952,2700,2278,2439,2361,1677,1272,495, 703,1393,121 4,1388,1678,935,978,1683,1359,1504,1339, 1245,1394,1637,1446,1449,1475,2498,2590,3232,3592, 2382,2281,2603,2822,2223,2171,2706,2660,3360,3600, 2389,2825,1638,1567,1259,1436,2268,236 2,3264,3616, 883,762,1367,1396,2472,2443,2721,2631,503,925,1799, 1341,1246,1450,878,735,314 2,3116,2403,2335,1477,1261, 993,885,2231,2282,3203,3153,1583,1857,1828,1736,2173, 2605,2708, 2664,939,994,1858,1685,3122,3145,3087,3392, 1832,1803,1641,1628,2390,2364,2289,2826,2611, 2393, 2500,2445,1457,1744,1840,1860,980,926,764,941,1371, 1921,1267,1686,3205,3124,3095,320 6,2451,2255,2722, 2606,2833,2480,2405,2235,2284,2712,2672,2635,1478, 1342,967,886,3456,3148, 2828,2753,1699,1642,831,947, 1922,1805,1400,1452,2174,2290,2613,2446,1689,1760, 507,889,15 91,1864,1649,1262,984,751,1383,1481,942, 996,1423,1811,3209,3154,2394,2504,2406,2453,3128, 3099,1615,1702,1458,1701,3169,3111,2351,2617,2292, 2643,2237,2614,1373,1269,1482,1690,164 4,1387,971,890, 2724,2409,2754,2637,1151,1215,1806,1431,2263,2834, 2695,2396,2467,2454,2512, 2728,2849,2410,3331,3156, 2638,2457,3210,3217,3333,3101,2618,2836,1460,1650, 509,949,973,1 000,1595,1489,1705,1270,1731,1374,892, 950,1623,1692,1814,1484,1273,1706,2645,2620,2267,23 59,3115,3170,3587,3160,2756,2646,2649,2699,863,759, 1008,510,2469,2840,2850,2659,1597,1435, 1827,1813, 1733,1389,1464,1652,3212,3102,2650,2458,1713,1398, 1447,1490,3218,3143,2279,273 6,2701,2296,2417,2238, 979,953,1817,1274,1395,1505,1598,1437,2412,2702,2707, 2383,3334,3337, 2528,2363,2269,2418,3233,3648,763,974, 1627,1390,3117,3172,2661,2470,1492,1679,954,879,24 73,2499,3712,3123,1924,1829,981,982,2662,2591,2283, 2460,2391,2420,3220,3118,1639,1708,173 4,1453,2823, 2365,2270,2474,1818,1276,927,995,1397,1629,1872,1714, 1737,1656,1506,1830,3147, 3338,2501,2285,1451,1928, 1438,1247,2607,2881,2852,2760,3345,3589,3176,3234, 1687,1716,185 9,1643,1496,1479,1820,1833,2882,2709, 2856,2827,3125,3265,2665,2652,3224,3149,2481,2768,76 5,956,1738,1745,2864,2884,2395,2945,3236,3840,3340, 3346,2291,2710,2502,2366,1861,1740,188 8,1834,887,985, 1630,1936,1746,1720,1401,1459,2723,2666,3590,3126, 2946,2829,2424,2476,3155, 3129,2713,2784,997,986,1841, 1343,1645,1836,1508,1454,1862,1691,943,891,2615,2888, 2673,22 86,3593,3184,3207,3150,1512,1263,1402,1483, 2407,2505,3361,3266,2447,2835,2639,2726,3157,3 348, 2482,2725,1646,1651,1461,1404,1842,1485,998,766,2397, 2293,2506,2714,2668,2411,2175,22 39,2830,2455,3594, 3130,1520,1693,511,988,1703,1748,1865,1653,3240,3211, 2484,2674,1375,149 1,1462,1761,1275,1486,1466,1465, 2619,2513,3171,3158,1001,951,1493,1271,2729,2294, 2755,239 8,1707,1866,1762,1923,3132,3352,2647,2716, 2838,2508,3161,3362,1694,1807,1873,1844,2297,27 30,2621,2459,2851,2837,2757,2413,3601,3596,3268,3213, 1752,1952,1815,1391,2488,2676,2737,2 422,2471,2514, 2841,2298,1002,893,1925,1654,1709,1868,1657,1735, 1277,1715,975,894,3173,321 9,3248,3214,1848,1926,1710, 1764,3602,3393,3103,3272,2419,2529,2622,2461,1874, 1399,1468,14 94,3162,3617,3364,3394,2651,2414,2516, 2703,1507,1439,1509,1929,2948,2853,2663,2732,3604,3 335,2758,2477,3221,3174,2842,2300,1009,955,1819,1497, 1658,1768,1876,1984,3177,3376,2421,2 653,1889,1717, 1821,1930,2896,2738,2761,2680,3368,3235,2530,2854, 1739,1831,1004,1010,3164, 3119,2475,2952,1498,1660, 957,983,3339,3457,2462,2271,2711,2740,3618,3396,2883,2667,3280,3458,2520,2503,2844,2857,1718,1278,1741,1599,3222,3225,3237,3178,1937,1822,958,987,2762,2769,2885,2764,2912,2858,2654,2960,3127,3400,2770,2744,1835,1403,1721,1455,1631,1513,1890,1747,2425,2483,2865,2367,1012,999,1510,1932,3608,3649,2669,2860,1742,1837,1500,1880,3620,3185,2532,2478,1863,1749,1016,767,3226,3151,3341,3180,2886,2715,2536,2287,2426,2507,3650,3296,1722,1938,1776,1892,1843,1838,1463,1953,3238,3591,3624,3267,2670,2675,2485,2428,3342,3713,3595,3347,1514,1647,1695,1763,2866,2509,2544,2717,2727,2772,2889,2677,1940,1487,1867,1405,2399,2515,3652,3363,3131,3241,2486,2785,3632,3186,2299,2510,989,1003,1521,1954,2490,2489,2517,2295,1845,1750,1985,1896,3349,3228,2731,2890,3159,3269,3188,3242,1516,1655,1753,1724,1467,1765,990,1005,2786,2947,2718,2831,3133,3603,3597,3714,2897,2868,3353,3350,2776,2976,3598,3249,1869,1944,1406,1846,1875,1754,1522,1904,2839,2415,2949,2678,3365,3460,2733,2892,2681,2759,3163,3656,1766,1469,1495,1659,3841,3270,3244,3192,3273,3408,2301,2739,3134,3354,2872,2950,959,1011,1956,1711,2734,2788,2898,2423,2492,2518,2531,2463,3215,3175,3250,3366,3165,3716,3274,3664,1927,1849,1524,1870,1769,1850,1756,1470,2533,2953,3395,3464,1986,1960,1499,1877,2843,2521,3369,3842,1891,1661,1931,1511,2682,2792,2900,3008,3179,3252,2913,2741,1013,895,1719,1770,3223,3281,2845,2954,3356,3720,2763,2855,3166,3276,2522,2684,3370,3472,3680,3424,1852,1777,1878,1881,2742,2302,2765,2623,1528,1823,1279,1988,2961,2846,3397,3605,3227,3282,3377,3619,1933,1743,1501,1939,3372,3181,2859,2427,1662,1772,1006,1014,3256,3606,2745,2479,2655,2537,3609,3187,1968,1893,1515,1723,2914,2771,2534,2956,2766,2861,2524,2904,3239,3297,3398,3378,2887,2773,3844,3229,3728,3401,2746,2962,2800,2916,3182,3189,2867,2862,3284,3243,1778,1882,1502,1992,3848,3402,3298,3621,1407,1934,1839,2000,3610,3459,3380,3288,2487,2977,2538,2671,1894,1941,1017,1018,2719,2787,2964,2511,1751,1517,1897,1725,2891,2429,3488,3343,3351,3230,3409,3622,1955,1780,1884,1523,2545,2978,3744,3190,2869,2774,3009,2920,3404,3651,2540,2679,3612,3461,3245,3193,2777,2748,2491,2789,1755,1847,1946,1898,1942,1526,1957,1767,3625,3271,3856,3251,3300,3410,2893,2968,3384,3776,2430,2870,991,1020,1784,1905,3462,3246,2899,2778,1518,1726,1945,1525,3626,3653,3465,3355,2546,2928,3194,3520,2790,2493,2519,2683,1900,1871,2016,1471,2980,2735,3425,3633,2951,2873,3275,3135,1757,1851,1958,1906,3412,3466,2548,2894,1961,1987,1771,1529,2793,2874,3599,3654,3628,3253,3367,3357,2780,2494,3304,3196,3277,3254,3715,3634,3010,2984,2523,2901,2915,2685,3358,3657,1879,1948,1758,1853,3371,3426,3283,3473,2955,2535,2743,2794,2876,2801,3257,3468,1989,1962,1908,1530,1773,1969,1990,1779,3416,3658,2902,2905,3717,3665,3607,3312,3278,3167,2552,2847,1883,1964,1854,1935,2303,3012,3399,3636,3872,3474,3428,3379,2957,2767,2525,2963,1895,1663,1912,1503,1970,1774,1993,1532,3373,3489,2686,2796,2992,2917,3285,3640,2539,2747,3904,3660,2802,2906,3258,3718,3476,3299,2526,3016,3968,3666,3490,3374,1885,1781,1994,1943,3721,3843,2431,2958,3432,3611,3183,3403,2863,3024,2918,2965,1899,1886,1782,1972,2775,2541,3286,3381,2921,2749,3260,3521,2001,1947,1996,1785,3289,3480,2979,2804,1901,1976,1519,1727,3681,3668,3623,3722,2908,2547,3301,3231,3492,3382,3613,3845,1959,2002,1007,1015,2779,2871,2970,2922,3682,3729,2966,2550,3405,3191,3672,3411,2981,2791,3290,3440,2808,2929,3724,3302,3463,3385,3522, 3614,3406,3305,2542,2750,3627,3846,2969,2549,3247,3195,3730,3684,3413,3849,2924,2895,1907,1786,1527,1949,3040,2495,3292,3386,2781,2875,3496,3467,2982,2930,3745,3655,1902,1759,2017,1909,2985,3011,3427,3359,3255,3306,3197,3629,2795,2553,2903,2972,1963,2018,2004,1950,3732,3688,3414,3388,3313,3850,2782,2877,3635,3417,3524,3469,3013,2986,3475,3279,1788,1965,1991,1910,3746,3630,3857,3504,2932,2554,3429,3259,2797,2993,3308,3736,3696,3659,3014,2803,2907,2988,3852,3777,1855,1971,1531,1913,3198,3314,3637,3470,2008,1775,1966,2020,3418,3528,2878,2959,2919,2687,3430,3477,3375,3641,3316,3667,2936,2527,3261,3638,3748,3433,3778,3661,2994,2798,3287,3858,1995,1914,1533,1973,3719,3420,3491,3478,3536,3752,3017,2556,2909,2805,3873,3434,3018,2967,3662,3481,2923,2910,3642,3860,3669,3644,2806,2996,3291,3383,3780,3670,1997,2024,1916,1974,3673,3723,3493,3864,3025,2971,3874,3683,3020,2809,3674,3482,3303,3760,2925,3000,1887,1783,2032,1534,3725,3320,2543,2751,3441,3262,3436,3726,2983,3026,3731,3407,3552,3387,3293,3442,3685,3494,3497,3523,3686,3615,3307,3484,2003,1977,1019,1021,2931,2810,3415,3444,2551,2973,3847,3389,3294,3498,2926,2783,3525,3309,3041,2933,3631,3905,3876,3784,2987,3042,3906,3733,1787,1998,1978,1903,3880,3851,3689,3676,2005,2006,1951,2019,3505,3792,3888,3908,3028,2974,2812,2989,3419,3969,3315,3734,1789,1980,1911,2009,3526,3390,3015,2934,3747,3690,2879,2995,3970,3853,3448,3500,3737,3808,2555,2937,2021,2010,1967,1915,3639,3912,3697,3310,3032,2799,3431,3529,2990,3044,3471,3859,3663,3750,3506,3749,2022,1790,1535,2012,3421,3317,3530,3738,3692,3435,3019,2938,3199,3263,3854,3479,3508,3698,2557,2997,3021,3048,3643,3537,3753,3318,3779,3422,2940,2998,3671,3740,3862,3532,3321,3754,2025,1975,1022,1023,2911,2807,3056,2558,3645,3483,3875,3861,3781,3437,3512,3700,3761,3446,3495,3538,3027,3001,3865,3322,3443,3553,3646,3485,2026,1917,1999,1918,2811,3022,3675,3438,3540,3727,3002,2927,3972,3877,3029,3030,3687,3756,3782,3501,3866,3324,2975,3043,3445,3677,3920,3762,2033,1979,2028,2034,3785,3704,3554,3878,3499,3976,3486,3295,3735,3764,3907,3691,3544,3527,3868,3881,2813,3004,3786,3793,3909,3788,3936,3882,2935,3033,3678,3984,3794,3768,3449,3507,3045,3034,3889,3391,1981,2007,1982,2011,3693,3884,3556,3502,3910,3739,2991,2939,3560,3311,3450,3531,3694,3699,3509,3452,3890,3533,3046,2814,3568,3741,2559,3036,3751,3796,3913,3701,3423,3539,3510,3809,2036,2023,2040,1791,3323,3534,3514,3513,3049,2999,3541,3319,3755,3914,3810,3971,3742,3855,3921,3892,3800,4000,3863,3439,3050,2941,3973,3702,3757,3916,3705,3783,2013,2027,2014,2029,3325,3763,3023,2942,3896,3974,3758,3812,3922,3447,3516,3542,3555,3487,3557,3977,3057,3003,3867,3545,3706,3816,3924,4032,3937,3765,3869,3978,3787,3879,3052,3058,1983,2035,2037,1919,3546,3708,3005,3031,3766,3326,3789,3647,3985,3870,3006,3035,3883,3451,3769,3503,3679,3561,3938,3795,3060,3047,3558,3980,3790,3885,3548,3928,3911,3797,3064,2815,3770,3986,3824,3940,3891,3886,3511,4001,3562,3695,3743,3811,3988,3535,3915,3453,3037,3051,3569,4002,3893,3798,4033,3944,3564,3703,3801,3772,3515,3813,3038,3053,3917,3992,3454,3894,3923,3802,3570,3952,3814,3517,3543,3707,3007,3059,4004,3759,3975,3897,3572,3918,3817,3898,3804,3518,4034,4008,3547,3925,3939,3709,3979,3559,3061,2943,3767,3818,3900,3825,3926,3929,3576,3871,3327,4036,3981,3791,3549,3987,3710,3820,3054,3062,4016,3941,3563,3771,2030,2038,2041,2042,3826,3930,3550,4040,3455,3982,3887,4048,3942,3989,3065,3066,3799,3565,3945, 3773,4003,3828,3932,3571,3803,3895,39 94,3946,3990, 3574,4005,3815,3039,3068,3832,3953,3566,3774,3993, 3573,3948,3919,4064,3519,3 805,3899,4006,3954,4009, 4035,3819,3577,3927,3996,3806,3901,4037,4010,3956, 3578,3821,4017, 4038,3827,3931,4012,3902,3983,3943, 3711,3960,3551,4018,3822,4041,3580,3933,3829,4042,399 1,2015,2044,2031,2039,3947,3934,3830,4020,4049,3995, 4044,3833,3949,4024,3567,3775,4007,40 50,3055,3063, 3955,3834,3575,3997,3950,3807,4065,3957,4011,4066, 4052,3998,3836,4013,4039,3 958,3903,4019,3579,3961, 4056,3823,4014,4068,4043,3962,3581,4021,2043,2045, 2046,2047,4045, 4072,3964,4022,3935,3831,4080,3582, 4051,4025,3067,3069,3835,4046,4026,3951,4053,4054,399 9,4067,3837,4028,3959,4057,4069,4058,4015,3963,4070, 3838,3583,4060,4073,4023,3070,3071,40 74,3965,4047, 3966,4081,4027,4076,4082,4029,4055,4030,4059,4084, 4071,4088,3839,4061,4075,4 062,4077,4031,4083,4085, 3967,4078,4086,4089,4090,4063,4092,4079,4087,4091, 4093,4094,4095]

Sequence Group 2: Z2_4096

[0,1,2,7,3,8,11,24,4,10,13,28,16,33,35,78,5,12,14,32,19, 38,47,82,22,46,42,89,57,97,105, 174,6,17,21,40,23,45,51, 91,29,55,59,100,73,112,117,189,34,61,76,115,81,126,139, 206,88,141,151, 232,158,242,268,393,9,18,26,54,30,58,72, 107,36,77,62,118,85,133,145,213,44,75,87,140,93,148,1 57,238,103,160,176,258,188,276,294,433,53,90,101,156, 113,166,183,273,122,184,205,286,217,31 1,332,472,143, 211,235,317,240,333,357,507,265,363,386,529,403,556, 600,818,15,25,31,74,39,80, 83,144,48,86,94,155,104,165, 171,272,56,95,106,167,116,182,202,288,132,203,212,306, 237,325,35 1,491,66,110,123,187,134,204,220,318,154, 233,241,335,264,362,375,528,170,255,274,367,287,39 9,405,552,314,422,454,587,480,622,687,819,70,127,147, 223,164,239,263,365,175,266,278,392,29 5,404,432,581, 200,289,307,420,334,450,474,628,345,482,510,658,536, 696,726,947,219,319,340,4 57,368,490,513,682,402,525, 553,714,588,731,791,1011,431,570,601,764,620,813,841, 1071,685,85 2,883,1066,923,1130,1205,1484,20,37,41,92, 49,96,108,181,50,109,119,190,136,216,224,349,63,12 0,137,227,149,236,253,350,159,252,269,385,290,401,408, 551,68,146,161,229,178,256,275,400,18 6,284,300,416, 310,442,461,618,185,308,321,441,344,475,493,659,370, 515,537,695,569,725,767,9 87,79,173,179,280,195,304, 320,434,207,327,339,473,358,506,524,691,267,354,369, 509,394,534,5 68,720,426,573,606,758,631,812,843,1056, 303,388,417,550,440,586,608,800,466,625,641,817,688, 859,901,1105,511,686,697,892,721,930,871,1139,778,984, 1016,1227,1035,1305,1366,1534,84,191, 201,343,257,361, 374,514,281,384,395,545,423,575,603,804,301,421,437, 580,456,609,637,825,48 3,645,679,855,715,895,946,1143, 348,443,460,636,492,672,703,880,544,708,727,942,779, 915,999, 1231,585,754,810,985,830,1034,1062,1292,868, 1069,1068,1346,1140,1389,1429,1673,387,481,52 0,709, 574,730,766,961,607,801,814,1017,849,1041,1067,1303, 638,837,881,1057,902,1070,1141,1 390,960,1161,1198, 1438,1246,1498,1526,1797,694,893,938,1142,998,1152, 1238,1449,1010,1233,1 294,1508,1334,1569,1642,1910, 1042,1320,1380,1589,1410,1651,1611,1960,1478,1697, 1737,2058, 1823,2130,2163,2394,27,43,52,102,60,121,138, 221,67,142,150,226,163,244,254,396,69,162,172,2 43,180, 305,315,430,208,316,342,467,360,500,521,713,71,177,194, 309,210,341,355,486,222,364,3 80,526,398,557,583,736, 234,389,407,572,435,602,623,788,451,619,650,836,657, 854,894,1207,111, 209,218,359,228,381,397,547,259,409, 427,591,453,627,644,806,279,429,459,621,485,656,669,84 6,508,670,678,900,751,931,974,1232,302,484,504,675,531, 702,712,910,559,750,769,953,816,994, 1032,1295,590,790, 831,1033,869,1047,1107,1335,935,1120,1172,1391,1199, 1441,1502,1781,114,2 25,245,406,277,428,455,630,291, 464,487,671,512,684,689,903,326,505,530,690,558,745, 765,948, 589,786,815,1009,847,1043,1086,1300,356,546, 582,768,624,811,807,1044,639,840,853,1074,911, 1118, 1136,1393,683,870,933,1131,949,1179,1204,1450,983, 1230,1266,1509,1345,1573,1643,1911, 371,599,626,842, 668,858,914,1121,739,934,968,1194,971,1206,1244,1497, 755,969,982,1237,1045, 1261,1325,1568,1100,1344,1371, 1604,1428,1676,1710,1967,787,1063,1084,1301,1137, 1347,1388, 1621,1173,1416,1451,1696,1503,1752,1809, 2065,1272,1461,1520,1759,1579,1833,1858,2161,162 8,1881,1953,2212,2014,2296,2379,2627,135,262,285,465, 324,501,527,724,338,535,571,747,598,7 77,824,1087,366, 584,629,805,651,857,848,1104,673,882,922,1160,962, 1182,1213,1479,436,640,67 4,856,738,909,939,1195,746, 963,973,1226,995,1245,1277,1556,756,986,1040,1276, 1093,1324,136 7,1605,1134,1397,1417,1677,1460,1711, 1778,2046,452,737,744,952,757,970,1008,1260,789,1046, 1075,1304,1119,1362,1411,1663,932,1092,1138,1370, 1174,1439,1466,1698,1247,1467,1521,1768, 1588,1832, 1849,2160,972,1178,1236,1440,1273,1505,1558,1780, 1327,1572,1607,1848,1662,1902, 1966,2223,1381,1629, 1681,1952,1736,1975,2039,2316,1796,2059,2099,2347, 2140,2465,2475,282 1,458,759,776,1085,908,1106,1135, 1396,943,1153,1183,1448,1239,1496,1535,1779,975,1212, 1267, 1499,1302,1559,1610,1837,1363,1650,1606,1877, 1699,1961,2013,2250,1101,1293,1321,1578,139 2,1620, 1680,1916,1437,1684,1729,1988,1769,2015,2068,2346, 1504,1753,1808,2047,1859,2131,21 41,2417,1903,2193, 2222,2521,2297,2554,2582,2768,1175,1326,1436,1685, 1485,1728,1758,2038,1 527,1822,1836,2098,1880,2132, 2213,2474,1557,1876,1917,2192,2012,2230,2231,2555, 2064,2317, 2337,2583,2395,2688,2714,2996,1672,1974, 1989,2251,2069,2336,2378,2609,2133,2416,2464,268 9,2546,2715,2870,3206,2162,2520,2547,2769,2608,2820, 2871,3207,2626,2934,2935,3442,2997,34 43,3570,3571,64, 65,98,153,99,168,193,292,124,192,215,322,246,347,353, 566,125,214,230,346,26 1,382,425,578,282,424,410,611, 471,649,677,890,152,247,271,390,283,419,449,617,323, 469,489,6 60,549,700,723,941,352,495,564,711,577,748, 771,980,610,785,827,1060,844,1088,1132,1399,169, 260, 312,468,336,488,548,681,372,565,502,728,597,753,799, 1005,418,555,605,784,643,808,839,10 76,663,850,896, 1122,940,1148,1196,1477,463,616,661,838,701,884,921, 1145,742,928,967,1176,10 07,1225,1274,1554,797,997, 1065,1235,1078,1275,1323,1613,1127,1343,1382,1657, 1431,1694,177 2,2104,231,293,337,554,383,576,579,798, 438,604,646,829,676,867,887,1144,470,647,680,885,722, 920,964,1180,752,965,1004,1220,1073,1263,1309,1591, 522,698,743,937,760,966,1020,1248,828, 1061,1079,1279, 1126,1342,1369,1656,886,1103,1146,1351,1177,1421, 1433,1692,1228,1462,1522, 1739,1574,1798,1913,2105, 538,749,803,1023,866,1077,1125,1349,891,1128,1150, 1398,1197,1432, 1476,1731,954,1181,1221,1446,1278, 1506,1570,1810,1291,1576,1622,1864,1674,1922,1964, 2267, 1019,1249,1282,1525,1360,1590,1631,1900,1430, 1641,1693,1946,1754,1973,2063,2357,1475,170 8,1773, 2018,1786,2093,2137,2419,1909,2146,2195,2408,2249, 2472,2573,2850,270,373,391,642,4 39,648,692,913,448, 693,729,944,762,1006,1036,1307,503,740,763,1039,809, 1072,1095,1308,845, 1094,1133,1379,1192,1423,1442, 1687,532,802,851,1059,898,1116,1147,1422,936,1162, 1200,1444, 1224,1500,1531,1784,929,1222,1251,1491, 1290,1571,1597,1865,1364,1637,1675,1921,1703,1963, 2037,2339,567,889,899,1154,951,1214,1250,1486,981,
1265,1281,1555,1332,1612,1640,1919,1129, 1310,1361,
1615,1408,1660,1702,1954,1464,1717,1776,2016,1813,
2092,2139,2404,1203,1394,144 5,1686,1490,1738,1782,
2066,1552,1805,1835,2097,1914,2173,2215,2455,1623,
1912,1923,2196,19 55,2252,2181,2493,2050,2322,2358,
2597,2375,2675,2734,2920,596,945,955,1289,1117,1341,
1368, 1636,1155,1378,1409,1679,1463,1719,1775,2070,
1201,1447,1489,1730,1524,1783,1815,2107,157 7,1839,
1883,2169,1947,2199,2266,2505,1306,1501,1530,1814,
1596,1870,1925,2182,1678,1926,19 65,2264,2051,2243,
2343,2599,1735,2008,2082,2323,2128,2374,2406,2646,
2174,2411,2410,2712,2 494,2753,2795,3023,1383,1575,
1638,1927,1718,1972,2036,2281,1777,2067,2094,2359,
2145,2377, 2409,2673,1820,2135,2183,2405,2220,2418,
2495,2754,2280,2523,2552,2802,2618,2862,2914,312
3,1920,2197,2258,2504,2342,2506,2610,2811,2356,2601,
2660,2882,2708,2941,3004,3190,2392,26 90,2738,2955,
2790,3007,2981,3250,2848,3043,3087,3326,3127,3362,
3415,3534,313,411,462,662, 494,741,770,1021,523,796,
826,1038,865,1090,1102,1418,533,864,888,1089,912,1215,
1229,1474,9 92,1234,1288,1553,1340,1598,1639,1945,539,
897,950,1223,996,1283,1311,1582,1022,1348,1376, 1648,
1420,1695,1733,1980,1064,1395,1435,1716,1487,1774,
1799,2060,1507,1785,1850,2134,185 7,2168,2198,2575,
699,993,1018,1333,1058,1377,1419,1683,1123,1443,1465,
1757,1511,1807,1838, 2080,1151,1473,1529,1787,1581,
1856,1867,2142,1614,1868,1882,2214,1999,2253,2318,
2600,120 2,1580,1608,1879,1659,1924,1944,2240,1701,
1998,2045,2279,2096,2340,2372,2661,1756,2062,21
29,2373,2175,2399,2467,2709,2257,2470,2524,2755,2553,
2809,2868,3121,710,1037,1091,1434,11 49,1472,1523,
1812,1193,1532,1583,1869,1630,1908,1915,2221,1264,
1609,1658,1918,1700,1991,2 019,2276,1755,2056,2095,
2345,2143,2393,2436,2662,1322,1682,1732,2044,1804,
2083,2081,2396, 1821,2136,2147,2424,2241,2468,2482,
2771,1901,2180,2255,2473,2277,2533,2572,2822,2321,259
8,2640,2883,2711,2943,3005,3191,1365,1771,1806,2138,
1866,2172,2242,2471,1983,2256,2298,25 44,2313,2574,
2616,2861,2009,2299,2320,2603,2397,2625,2697,2940,
2452,2710,2737,2976,2794,3 032,3070,3265,2057,2407,
2426,2663,2483,2713,2752,2983,2525,2792,2823,3042,
2869,3088,3125, 3333,2642,2841,2912,3091,2953,3153,
3170,3413,2998,3183,3249,3468,3300,3492,3533,3703,
761, 1124,1163,1533,1262,1599,1649,1962,1280,1661,
1709,1997,1770,2049,2106,2437,1350,1734,1811, 2071,
1851,2171,2144,2454,1871,2194,2248,2522,2282,2534,
2581,2849,1488,1834,1878,2170,198 2,2229,2259,2545,
1996,2283,2315,2596,2341,2617,2645,2922,2010,2338,
2376,2644,2439,2696,27 35,2977,2480,2789,2793,3033,
2840,3071,3106,3324,1510,1981,1990,2278,2011,2312,
2344,2624,2 061,2398,2425,2674,2469,2732,2791,3021,
2254,2438,2492,2736,2526,2803,2842,3068,2619,2843,
2913,3104,2954,3152,3169,3412,2314,2532,2602,2808,
2643,2881,2932,3120,2699,2942,2979,316 8,3020,3188,
3264,3471,2739,2999,3035,3248,3086,3267,3303,3494,
3122,3327,3361,3515,3394,35 97,3599,3771,1528,2017,
2048,2427,2228,2466,2481,2788,2265,2507,2535,2810,
2611,2860,2921,3 107,2319,2580,2641,2863,2672,2933,
2980,3155,2733,3006,2978,3181,3069,3251,3283,3478,
2453, 2647,2691,2952,2770,2982,3034,3204,2801,3040,
3085,3280,3105,3301,3334,3514,2880,3089,312 4,3325,
3171,3363,3395,3569,3189,3441,3470,3625,3493,3664,
3666,3768,2527,2698,2800,3041,28 51,3084,3090,3302,
2915,3126,3154,3360,3182,3392,3469,3598,2923,3180,
3205,3440,3282,3476,3 477,3665,3332,3495,3513,3667,
3535,3732,3734,3972,3022,3266,3281,3479,3335,3512,
3532,3701, 3393,3568,3596,3733,3626,3735,3892,3974,
3414,3624,3627,3769,3700,3770,3893,3975,3702,389
4,3895,4020,3973,4021,4022,4023,128,129,130,199,131,
248,251,412,196,250,297,444,328,477,47 9,718,197,296,
298,476,331,498,543,734,378,542,518,781,613,821,861,
1098,198,329,377,516,379, 541,563,783,445,595,615,832,
705,876,905,1165,478,633,716,879,733,926,979,1190,780,
989,1015, 1284,1030,1314,1372,1669,249,330,414,594,
446,614,704,863,496,717,634,906,773,957,1001,1217, 540,
707,775,988,793,1012,1029,1298,835,1048,1108,1338,
1164,1400,1454,1761,593,782,833,102 8,877,1054,1115,
1385,918,1156,1189,1414,1241,1483,1540,1844,991,1211,
1287,1513,1312,1541,1 593,1895,1357,1603,1654,1937,
1707,1984,2052,2386,299,413,447,706,499,732,735,1000,
560,774, 794,1027,860,1053,1083,1384,612,795,862,1055,
904,1114,1186,1424,956,1187,1216,1470,1297,15 37,1567,
1875,654,874,919,1159,958,1188,1252,1514,1026,1285,
1313,1543,1356,1602,1635,1936, 1082,1331,1386,1619,
1415,1691,1713,1976,1494,1742,1802,2031,1852,2090,
2191,2387,666,927,1 003,1255,1052,1299,1355,1617,1099,
1358,1402,1668,1455,1712,1760,2025,1184,1425,1471,
1740, 1542,1794,1846,2108,1561,1854,1898,2150,1948,
2208,2246,2559,1243,1515,1548,1817,1624,187 4,1905,
2186,1706,1933,1977,2234,2032,2263,2351,2635,1751,
2002,2053,2308,2088,2381,2421,26 95,2189,2440,2463,
2686,2519,2762,2845,3108,376,497,517,792,561,820,872,
1113,562,873,907,11 66,976,1240,1256,1565,635,916,977,
1259,1013,1296,1329,1566,1031,1328,1373,1653,1426,
1705, 1720,1971,664,1002,1049,1269,1110,1336,1387,
1704,1158,1412,1456,1724,1482,1790,1825,2086, 1157,
1480,1517,1789,1560,1847,1885,2151,1626,1907,1949,
2207,2001,2245,2311,2607,719,1097, 1111,1404,1171,
1468,1516,1762,1191,1539,1547,1845,1594,1894,1932,
2203,1359,1586,1625,1897, 1670,1942,2000,2236,1746,
2005,2074,2302,2111,2380,2423,2676,1459,1664,1725,
1970,1788,203 0,2076,2360,1830,2101,2117,2385,2200,
2447,2501,2741,1899,2190,2209,2488,2237,2530,2459,27
75,2330,2604,2636,2867,2655,2945,2994,3158,772,1167,
1185,1551,1337,1601,1634,1906,1405,16 52,1671,1957,
1743,2007,2055,2364,1457,1741,1765,2024,1816,2077,
2113,2389,1855,2121,2179,2 443,2235,2491,2558,2779,
1564,1791,1824,2112,1884,2164,2219,2460,1956,2224,
2247,2550,2331, 2515,2623,2875,2029,2294,2370,2605,
2402,2654,2682,2928,2456,2693,2692,2974,2776,3017,305
3,3253,1655,1853,1928,2225,2006,2262,2310,2569,2075,
2361,2382,2637,2433,2665,2687,2939,21 14,2413,2461,
2677,2502,2694,2777,3018,2568,2805,2834,3062,2890,
3118,3146,3349,2206,2489,2 542,2778,2622,2796,2886,
3077,2634,2877,2930,3136,2966,3173,3234,3418,2666,
2956,3012,3197, 3038,3239,3215,3448,3102,3277,3309,
3510,3371,3550,3575,3690,415,519,592,834,632,917,978,1
253,655,990,1014,1258,1051,1316,1330,1688,665,1050,
1096,1315,1112,1469,1495,1750,1208,151 2,1550,1831,
1600,1888,1929,2233,667,1109,1170,1481,1210,1549,
1587,1862,1254,1616,1644,193 4,1690,1985,2027,2268,
1286,1665,1715,2004,1763,2054,2091,2348,1795,2087,
2126,2412,2149,24 42,2490,2847,875,1209,1242,1595,
1268,1645,1689,1959,1339,1721,1747,2035,1801,2103,
2120,23 66,1403,1749,1819,2089,1861,2148,2157,2430,
1896,2158,2178,2500,2291,2531,2590,2876,1458,1 860,
1892,2167,1939,2218,2232,2510,1987,2290,2325,2565,
2384,2614,2652,2931,2034,2350,2403, 2653,2457,2671,
2743,2967,2539,2748,2812,3019,2835,3065,3130,3341,
878,1257,1317,1714,1401, 1748,1803,2110,1427,1828,
1863,2159,1904,2188,2201,2503,1538,1893,1938,2202,
1986,2285,230 9,2560,2033,2334,2383,2633,2431,2667,
2718,2936,1592,1958,2026,2324,2100,2371,2367,2668,21

15,2420,2441,2702,2511,2746,2772,3025,2187,2458,2537,2763,2561,2819,2844,3078,2595,2874,2 902,3137,2973,3177,3235,3419,1627,2043,2102,2422,2156,2446,2514,2749,2271,2538,2584,2830, 2587,2846,2888,3117,2295,2585,2594,2885,2669,2897,2961,3172,2728,2972,3003,3208,3052,325 6,3290,3455,2335,2683,2716,2937,2773,2975,3016,3221,2813,3044,3079,3276,3131,3312,3357,3521,2904,3081,3140,3319,3187,3373,3386,3573,3224,3405,3445,3600,3486,3644,3687,3803,959,13 54,1413,1829,1536,1889,1935,2244,1546,1943,2003,2287,2042,2329,2388,2719,1618,2028,2109,2 365,2127,2445,2432,2740,2165,2462,2518,2804,2570,2826,2853,3103,1764,2116,2166,2444,2270, 2509,2543,2831,2286,2571,2589,2866,2615,2889,2909,3164,2300,2606,2664,2908,2725,2960,2995,3209,2766,3029,3045,3257,3080,3291,3338,3502,1800,2269,2284,2564,2301,2586,2632,2896,23 49,2670,2703,2944,2747,2990,3039,3247,2536,2724,2774,3002,2814,3063,3094,3278,2891,3095,3 141,3320,3196,3372,3381,3572,2588,2818,2884,3064,2905,3133,3166,3340,2963,3176,3211,3380, 3246,3410,3454,3607,3013,3225,3261,3444,3308,3459,3499,3652,3348,3511,3543,3675,3560,3725,3739,3869,1818,2303,2328,2717,2508,2742,2767,3028,2551,2797,2827,3076,2887,3116,3159,33 39,2591,2852,2903,3119,2938,3167,3214,3377,2991,3238,3210,3401,3279,3449,3485,3618,2729,2 929,2957,3186,3024,3220,3260,3424,3061,3268,3297,3464,3321,3487,3524,3674,3132,3313,3356, 3503,3387,3551,3561,3709,3411,3589,3606,3753,3645,3774,3782,3848,2815,2962,3060,3269,3109,3296,3318,3498,3147,3370,3376,3542,3404,3552,3601,3738,3165,3400,3425,3588,3484,3610,36 11,3775,3520,3653,3661,3783,3691,3820,3834,3924,3252,3458,3465,3619,3525,3660,3686,3793,3 553,3708,3724,3821,3766,3835,3886,3990,3574,3752,3767,3849,3792,3868,3887,3991,3802,3906, 3907,4034,3925,4035,4058,4059,652,653,822,1025,823,1080,1169,1452,924,1168,1219,1518,1318,1563,1585,1994,925,1218,1270,1562,1353,1646,1745,2022,1406,1744,1722,2079,1843,2125,2177, 2486,1024,1319,1375,1666,1407,1727,1793,2085,1519,1841,1873,2152,1969,2216,2239,2549,158 4,1887,1992,2227,2021,2288,2327,2592,2078,2333,2391,2680,2428,2720,2764,3031,1081,1352,14 92,1840,1544,1872,1968,2185,1632,1993,1890,2260,2041,2293,2355,2629,1726,1979,2073,2332,2 119,2368,2415,2704,2155,2434,2496,2750,2548,2784,2832,3101,1827,2084,2153,2414,2217,2476, 2517,2781,2274,2528,2579,2816,2631,2865,2906,3162,2353,2621,2685,2879,2706,2907,2959,321 7,2759,2971,3014,3241,3055,3274,3328,3544,1271,1453,1545,1978,1647,2020,2023,2354,1766,20 72,2122,2401,2176,2451,2479,2780,1842,2123,2184,2477,2238,2516,2576,2824,2292,2577,2628,2 856,2701,2899,2949,3199,1930,2210,2275,2541,2304,2578,2648,2892,2400,2681,2707,2911,2758,2970,3001,3240,2478,2731,2782,2987,2817,3049,3057,3272,2872,3082,3142,3311,3178,3350,342 1,3545,1950,2289,2363,2651,2450,2705,2757,2985,2487,2760,2786,3030,2833,3056,3100,3299,25 66,2825,2857,3074,2910,3134,3174,3358,2927,3184,3222,3388,3254,3430,3452,3635,2639,2893,2 918,3145,2988,3198,3227,3408,3054,3233,3273,3438,3314,3457,3519,3677,3099,3288,3329,3490, 3346,3537,3557,3711,3417,3566,3591,3704,3617,3736,3777,3878,1374,1633,1667,2118,1767,212 4,2204,2513,1792,2205,2261,2556,2306,2630,2656,2947,1891,2272,2307,2659,2369,2700,2727,29 48,2429,2726,2765,3011,2828,3051,3066,3271,1940,2362,2435,2679,2498,2744,2783,3050,2540,2 806,2836,3072,2864,3128,3151,3344,2529,2858,2895,3115,2926,3175,3201,3389,2992,3229,3255, 3429,3287,3451,3497,3663,1995,2485,2499,2798,2563,2854,2894,3110,2593,2901,2917,3163,2964,3216,3232,3427,2761,2950,2989,3219,3036,3244,3286,3446,3092,3293,3336,3488,3365,3536,35 59,3696,2839,3026,3073,3270,3114,3310,3342,3522,3160,3353,3375,3541,3422,3581,3603,3723,3 223,3420,3431,3592,3447,3620,3585,3745,3506,3658,3678,3785,3683,3819,3838,3900,2040,2557, 2567,2925,2745,2969,3000,3228,2799,3010,3037,3259,3083,3295,3331,3526,2837,3075,3113,3298,3144,3343,3367,3547,3185,3379,3407,3577,3439,3595,3634,3749,2946,3129,3150,3366,3200,33 98,3433,3586,3258,3434,3453,3632,3507,3615,3671,3787,3307,3480,3530,3659,3548,3682,3698,3 810,3582,3707,3706,3832,3746,3845,3859,3935,3015,3179,3230,3435,3294,3456,3496,3641,3337, 3523,3538,3679,3565,3685,3705,3817,3368,3555,3587,3697,3604,3710,3747,3846,3640,3755,3772,3862,3798,3882,3898,3963,3428,3593,3630,3748,3670,3750,3794,3867,3676,3789,3812,3890,38 28,3909,3928,3986,3688,3822,3842,3915,3854,3931,3921,3994,3876,3943,3951,4010,3967,4018,4 031,4054,1493,1723,1826,2154,1886,2273,2326,2649,1931,2352,2390,2658,2449,2722,2730,3046, 1941,2448,2484,2721,2512,2855,2873,3098,2612,2878,2924,3161,2968,3202,3231,3437,1951,2497,2562,2859,2620,2919,2951,3194,2650,2984,3008,3236,3048,3275,3305,3460,2684,3027,3059,32 92,3111,3330,3351,3516,3135,3345,3382,3554,3385,3576,3594,3779,2211,2613,2638,2965,2678,3 009,3047,3263,2751,3067,3093,3317,3139,3355,3378,3528,2787,3097,3149,3347,3193,3384,3391, 3562,3218,3396,3406,3602,3475,3621,3654,3788,2838,3192,3212,3403,3243,3432,3436,3612,3285,3474,3501,3639,3540,3668,3680,3813,3316,3518,3549,3681,3583,3695,3727,3829,3629,3730,37 56,3847,3773,3865,3884,3961,2226,2657,2723,3058,2785,3096,3143,3364,2829,3156,3195,3397,3 226,3416,3423,3605,2900,3213,3242,3426,3284,3467,3491,3636,3315,3508,3539,3673,3563,3689, 3716,3814,2958,3262,3304,3500,3352,3531,3529,3692,3369,3556,3567,3712,3613,3728,3742,3851,3409,3584,3623,3737,3637,3761,3776,3870,3657,3786,3804,3891,3831,3911,3929,3987,2993,33 23,3354,3558,3390,3580,3614,3731,3463,3628,3646,3764,3649,3778,3796,3881,3481,3647,3656,3 791,3693,3801,3825,3908,3720,3830,3841,3916,3858,3936,3946,3997,3509,3699,3714,3815,3743, 3833,3844,3923,3757,3856,3871,3942,3885,3952,3965,4013,3806,3873,3896,3955,3913,3969,3978,4029,3926,3983,3993,4036,4004,4044,4053,4075,2305,2756,2807,3157,2898,3203,3237,3450,29 16,3245,3289,3473,3322,3505,3546,3717,2986,3306,3359,3527,3383,3579,3564,3722,3399,3590,3 616,3754,3642,3762,3781,3877,3112,3374,3402,3578,3462,3609,3631,3765,3472,3643,3651,3784, 3669,3797,3809,3902,3482,3662,3684,3808,3719,3824,3839,3917,3740,3853,3857,3937,3872,3947,3958,4008,3138,3461,3466,3638,3483,3648,3672,3800,3517,3694,3713,3818,3729,3836,3855,39 33,3622,3718,3744,3840,3758,3863,3874,3944,3799,3875,3897,3956,3914,3968,3977,4028,3650,3 760,3790,3864,3807,3889,3904,3960,3827,3910,3919,3976,3932,3984,3996,4039,3843,3927,3939, 3992,3950,3999,4007,4046,3962,4011,4017,4051,4026,4061,4063,4083,3148,3489,3504,3715,3608,3726,3741,3852,3633,3751,3763,3866,3795,3880,3901,3959,3655,3780,3805,3883,3816,3905,39 20,3971,3837,3930,3918,3981,3945,3995,4003,4042,3721,3811,3823,3912,3850,3922,3938,3988,3 861,3940,3949,4000,3957,4005,4014,4050,3888,3953,3964,4009,3979,4019,4027,4057,3985,4033, 4038,4065,4045,4068,4070,4080,3759,3826,3860,3941,3879,3948,3954,4006,3899,3966,3970,4016,3982,4024,4037,4062,3903,3980,3989,4032,4002,4040,4041,4069,4012,4047,4049,4071,4055,40 76,4078,4088,3934,3998,4001,4043,4015,4048,4052,4073,4025,4056, 4060,4077,4066,4079,4084,4 090,4030,4064,4067,4081,4072,4082,4085,4091,4074,4086,4087,4092,4089,4093,4094,4095]

Sequence Group 2: Q2_8192

[0,1,2,4,8,16,32,3,5,64,9,6,17,10,18,128,12,33,65,20,256,34,24,36,7,129,66,512,11,40,6 8,130,19,13,48,14,72,257,21,132,35,258,26,513,80,37,25,22,136,260,264,38,514,96,67,41,144,28,6 9,42,516,49,74,272,1024,1025,160,520,288,528,192,544,70,44,131,81,50,73,15,320,133,52,23,134,384,76,137,82,56,27,97,39,259,84,138,145,261,29,1026,1028,43,98,515,88,140,30,146,71,262,265, 161,576,45,100,640,51,148,46,75,266,273,517,104,162,1032,1040,53,193,2048,2049,2050,2052,15 2,77,164,768,268,274,518,54,83,57,521,112,135,78,289,194,85,276,522,58,1056,1027,168,139,99, 86,60,280,89,290,529,524,196,141,101,147,1029,1088,176,142,530,321,31,200,90,545,292,322,53 2,263,149,102,105,304,296,163,92,47,267,385,1033,1030,546,324,2056,2064,2080,2051,208,386,1 50,153,165,106,55,328,536,577,548,113,154,79,1041,1034,269,108,578,224,166,519,552,195,270, 641,523,275,580,291,1042,1152,59,169,560,114,277,156,87,197,116,170,61,531,525,642,1036,105 7,2053,2112,2057,2054,281,278,526,177,4096,4097,4098,4100,4104,4112,4128,4099,293,388,91,5 84,1089,1044,769,198,172,120,201,336,62,282,1280,1058,143,103,178,294,93,644,202,592,323,39 2,1048,1060,297,770,107,180,151,209,284,648,1031,1153,94,204,2065,2058,2066,2176,298,400,6 08,352,325,533,155,210,305,547,300,109,1090,1536,184,534,537,115,167,225,326,306,1035,1064,772,157,656,329,2060,2081,2113,2068,110,117,212,171,1092,1154,776,330,226,549,538,387,308,2 16,1043,1037,416,271,279,158,1072,1038,337,550,672,118,332,579,540,389,173,121,553,199,784, 179,228,338,312,704,1096,1281,390,174,2304,2082,2072,2084,554,581,1045,1156,4101,4160,410 5,4102,4113,4106,4114,4224,393,283,122,448,353,561,1059,1282,203,63,340,394,527,582,556,18 1,295,285,232,124,205,182,643,562,286,585,1050,1537,2055,2177,2114,2560,299,354,1104,1061, 211,401,185,396,1049,1046,344,586,645,593,535,240,206,95,327,564,800,402,1160,1284,356,307, 301,417,2059,2088,2116,2178,1288,1062,213,568,832,588,186,646,404,227,896,594,418,302,1538, 1120,649,771,360,539,1091,1065,1168,1052,111,331,214,309,2067,2061,2096,2062,4108,4129,41 61,4116,4352,4130,4120,4132,188,449,217,408,609,596,551,650,1093,1066,229,159,420,310,1540, 1073,2120,2305,2069,2180,541,773,1098,1296,610,657,333,119,600,339,218,368,652,230,391,31 3,2083,2306,2074,2561,450,542,1184,1544,334,233,555,774,175,123,658,612,1312,1552,341,777, 220,314,1216,1568,2128,2085,2073,2070,424,395,673,583,1094,1068,355,287,183,234,1155,1105,125,557,660,616,2184,2308,2312,2086,1074,1097,1039,1344,4103,4225,4162,4608,4107,4136,416 4,4226,342,316,241,778,563,345,452,397,1157,1076,1047,1158,403,207,674,558,785,432,357,187, 236,664,624,587,2562,2144,2115,2089,1408,1100,780,705,126,242,565,398,1161,1106,346,456,35 8,405,1080,1051,2192,2076,2117,2090,1121,1063,303,569,244,595,189,566,4115,4109,4144,4110,4168,4353,4117,4228,676,361,706,589,215,786,647,348,2564,2097,2122,2320,419,406,464,680,80 1,362,1283,1108,590,409,1162,1169,1285,1053,570,788,3072,3073,2208,2568,597,572,219,311,10 67,1122,1539,1112,2336,2576,2240,2592,708,598,601,651,421,792,802,611,1164,1054,602,410,11 70,1095,231,688,653,248,369,190,364,654,659,335,1286,1289,480,315,221,370,1185,1600,1069,1 124,613,422,2118,2092,2179,2129,425,451,1664,1075,4131,4354,4122,4609,4176,4133,4121,4118, 614,543,235,412,2098,2121,2063,2368,343,372,1172,1070,775,317,222,426,1099,1290,453,237,2 181,2100,2071,2182,559,833,804,712,1297,1541,1128,1186,834,661,808,779,1077,1217,617,604,1 176,1101,433,720,816,836,347,897,1188,1792,1292,1298,243,662,454,318,675,618,1542,1078,243 2,2124,2185,2130,4232,4356,4360,4134,4610,4192,4163,4137,898,781,376,428,2104,2075,2145,2 087,1107,1081,665,736,567,840,625,238,2307,2132,2186,2193,1545,1136,1159,1102,359,457,1313, 1218,399,787,591,678,1109,1300,434,677,349,245,458,666,620,363,127,191,2309,2077,3074,307 6,782,407,1546,1082,1192,1163,436,626,4240,4124,4165,4138,4612,4145,4170,4368,2091,2146,2 563,2136,571,465,1123,1110,681,246,707,350,1084,1304,599,668,790,460,1113,1314,249,682,573, 411,803,789,709,365,2188,2078,2194,2119,1553,1548,1220,1165,440,628,689,374,2310,2313,2209, 2624,2093,2148,2688,2099,423,466,793,250,1125,1171,1200,1166,5120,5121,4256,4616,4384,462 4,4288,4640,1554,1345,1055,1224,371,481,574,413,1114,1569,1316,1346,603,366,468,655,2196,2 094,2123,2314,900,805,615,684,1556,1287,710,429,2321,2565,2152,2210,4166,4140,4227,4177,4 146,4169,4111,4416,1173,1126,794,252,3080,3088,2101,2241,1129,1328,373,605,848,690,713,632, 1320,1187,482,806,1116,1071,427,904,1291,1409,414,223,663,692,1570,1348,4229,4148,4119,42 30,4480,4172,4233,4178,835,619,1232,1410,2200,2125,2212,2816,472,455,796,809,1174,1177,118 9,1130,714,721,837,716,864,810,606,912,2316,2322,2566,2102,1079,1352,722,696,377,435,817,3 19,2131,2105,2569,2160,4152,4123,4193,4135,4355,4180,4234,4241,1560,1601,621,812,1572,113 7,484,430,2183,2126,2337,2242,1178,1103,1293,1132,838,667,488,239,2133,2324,2570,2106,378, 459,1602,1248,1190,1543,1576,1219,4357,4125,5122,5124,4139,4194,4611,4184,3104,3075,2216, 2187,2147,2134,2108,2328,622,627,437,380,1294,1665,1547,1299,818,461,496,669,679,724,841,6 29,2137,2338,2577,2572,2244,2189,2149,2195,351,467,1604,1315,1083,1193,438,737,1584,1138, 251,462,442,441,469,247,1301,1180,683,842,1111,1221,1140,1194,4236,4126,4242,4167,4358,436 1,4257,4672,3077,3136,2224,2190,738,899,670,783,1085,1555,1549,1666,849,820,1305,1302,257 8,2369,2079,2248,728,928,1550,1201,791,367,901,630,2138,2593,2340,2370,4141,4196,4736,414 7,4244,4142,4171,4362,2580,2311,2197,2150,1317,1412,685,844,633,711,1115,1608,1793,1222,11 96,1144,1225,1360,253,691,1086,1306,824,902,686,740,850,375,444,470,483,415,4369,4613,4200,4258,5128,5136,4149,4289,1167,1127,1202,1318,1117,1668,1226,1616,485,905,1347,1416,2153,2 352,2344,2211,795,473,1321,1794,2140,2095,2315,2433,3081,3078,2594,2372,634,744,852,960,6 144,6145,6146,6148,4248,4173,4260,4864,1131,1204,865,693,1175,1233,797,906,2256,2434,2198, 2201,2213,2154,2103,2376,4364,4370,4614,4150,4179,4153,4617,4208,1308,1672,715,807,1118, 1228,474,636,1322,1424,1632,1376,694,254,717,575,2584,2625,2596,2161,913,798,1349,1557,22 02,2127,3089,3082,1179,1234,1329,1571,1324,1133,811,379,1208,1558,697,431,607,489,1561,113 9,866,723,486,908,2317,2156,2626,2272,718,813,476,856,1191,1249,1350,1330,2214,2567,2600,2 243,2318,2689,2571,2323,839,725,1796,1181,4231,4174,4385,4290,4181,4372,4618,4154,1680,13 53,698,914,2628,2339,3090,3200,752,868,1134,1141,819,814,1236,1195,5152,5123,4264,4235,419 5,4182,4156,4376,1800,1354,1250,1573,2107,2217,2608,2162,1562,1411,1332,1240,439,929,490, 623,2325,2204,2135,2245,671,739,916,463,4185,4386,4625,4620,4292,4237,4197,4243,843,381,1 440,1295,1303,1182,1361,1574,2164,2218,2109,2579,2573,2690,3084,3105,497,930,1696,1142,82 1,726,961,872,2329,2326,2574,2225,1356,1603,492,631,2341,2436, 2139,2632,1564,1413,1197,11 45,729,700,443,741,1577, 1223,1808,1203,3137,3092,2817,2246,2220,2168,2249, 2384,1252,1362, 845,920,1336,1728,382,822,1414,1198, 851,730,2110,2330,3328,3106,5125,5184,4272,4238,4626, 4417,4127,4296,1578,1605,1417,1307,498,880,1146,1472, 4186,4641,4388,4418,4628,4359,4245,4 198,2191,2151, 2226,2342,742,445,471,635,932,687,1377,1585,903,825, 1227,1087,4201,4400,439 2,4259,4188,4143,4363,4481, 2141,2692,2250,2640,2371,2440,3096,3108,1364,1418, 500,846,2345, 2818,2155,2228,745,826,1551,1606,1580, 1205,1319,1309,2199,2257,2332,2696,732,446,1256,1148,1229,1206,1667,1586,962,936,475,853,867,637,1310, 1609,1323,1378,1235,1425,5129,5126,46 42,4420,6152, 6160,6176,6147,907,487,695,746,3079,3201,2142,2252, 2346,2448,2656,2400,828,7 53,1209,1420,4304,4482,4246, 4249,4261,4202,4151,4424,1368,1610,854,857,2373,2581, 2203,225 8,1669,1617,1559,1264,1230,1119,504,799,2353, 2595,2348,2157,255,964,1351,1588,1824,1426,1 380,1331, 3138,3584,2232,2582,909,719,477,915,1325,1441,638,748, 944,869,1237,1592,491,699,1 856,1612,4632,4673,4644, 4209,4250,4175,5137,5130,2585,2163,2215,2273,2374, 2354,3083,3112, 754,858,1210,1670,1428,1251,478,968, 4365,4204,4674,4320,4262,4615,4648,4291,4366,4737,4619,4371,4676,4387,5138,5248,1920,1618,1442,1326,1673, 1795,383,910,2820,2205,2704,2377,2158, 2165,2260,2219, 3140,3202,2824,2378,2274,2597,2586,2435,1384,1563, 1135,1355,815,976,870,9 17,2356,2264,3091,3085,2464, 2319,2327,2206,727,493,1238,1333,873,701,1212,1473, 4155,4265, 4656,4210,4373,4252,4183,4293,1241,1432, 931,756,1633,1620,1575,1674,3120,3086,2385,2598,860,499,1253,1183,4212,4266,4157,4627,4621,4738,5132, 5153,2720,2166,2380,2627,1444,1334,15 65,1797,6149, 6208,6153,6150,4377,4374,4622,4273,2588,2437,2221, 2169,731,823,922,874,1634, 1681,918,502,1357,1143, 1624,1363,2601,2247,2832,2227,933,743,1242,1392,2276, 2386,2360,275 2,760,881,1676,1254,3144,3329,2438,2222, 1415,1337,1474,1566,1358,1257,494,702,2602,2629,3 093, 3204,1579,1798,921,501,2441,2331,2170,2496,4389,4484, 4187,4680,5185,5140,4865,4294,11 99,1147,1682,1636, 1365,1801,876,847,2401,2609,3107,3330,2251,2111,2388, 2442,992,447,1244,1 338,733,827,1448,1419,934,882, 1697,1607,937,963,1379,1311,4268,4216,4297,4432,4158, 4378,5 376,5154,2575,2630,2604,2229,1207,1258,1149, 1581,747,505,855,924,1684,1640,1366,1340,4239, 4199, 4274,4390,4189,4740,4298,4688,2343,2333,2280,2172, 1265,1802,734,829,2253,2230,2691, 2610,1587,1369,1476, 1421,4419,4488,5144,5156,4393,4866,4203,4276,2334, 2633,3098,3585,234 7,2402,3152,3109,965,938,1427,1231, 1698,1582,1809,1456,4247,4305,4380,4744,5127,5249, 4190, 4300,884,506,1381,1211,2259,2449,2233,2444,3097, 3094,2392,2634,2693,2641,2583,2288,6161, 6154,6162, 6272,4394,4496,4704,4448,4421,4629,4251,4306,4401, 4643,4396,4205,749,945,1260,1 688,1648,1611,966,755, 2254,2143,2375,2612,2848,2450,3208,3332,859,940,1804, 1729,1150,1266, 1589,1422,1370,1480,830,911,871,639, 1382,1429,5186,5632,4280,4630,4633,4211,4263,4321,4422,4402,5131,5160,4868,4253,4752,4425,1327,1593,1268, 1619,2404,2355,2349,2465,3336,3110,2 261,2616,888,479, 1213,1590,2880,2636,2234,2694,1700,1385,1730,1613, 946,750,1239,1810,1671, 1372,1443,1430,2452,2275,2944, 2642,1488,1704,969,508,2466,2350,3586,3168,2697,2819, 2408, 2587,6156,6177,6209,6164,4206,4213,4308,4267, 861,757,1825,1386,970,919,1614,1433,3139,311 3,3216, 3100,2159,2379,2262,2357,875,862,1594,1812,2236,2497, 2265,2456,5188,5250,4872,4426, 4322,4645,4634,4483, 1621,1596,758,948,2657,2644,2599,2698,1243,1335,1732, 1622,1625,1675, 1445,1816,4404,4312,5139,5133,4512, 4367,4375,4254,5168,5134,4433,4646,4768,4214,4428,4675,3141,3114,2277,2207,977,923,1826,1635,972,761,1626, 1434,2468,2358,3588,3121,2589,2821,3 146,3344,2658, 2705,2381,2167,2648,2387,2266,2416,1255,1712,877,952, 2700,2278,2439,2361,16 77,1272,495,703,1393,1214,1388, 1678,935,978,1683,1359,1504,1339,1245,1394,1637,1446, 1449, 1475,2498,2590,3232,3592,2382,2281,2603,2822, 2223,2171,2706,2660,3360,3600,2389,2825,163 8,1567, 1259,1436,2268,2362,3264,3616,4636,4485,4269,4217, 4649,4295,4880,4275,883,762,1367, 1396,2472,2443,2721, 2631,4324,4434,4408,4800,5192,5377,4486,4270,6400, 6178,6168,6180,465 0,4677,5141,5252,503,925,1799,1341, 1246,1450,878,735,3142,3116,2403,2335,1477,1261,993, 88 5,2231,2282,3203,3153,1583,1857,1828,1736,4489, 4379,4218,4544,4449,4657,5155,5378,4299,41 59,4436, 4490,4623,4678,4652,4277,2173,2605,2708,2664,939,994, 1858,1685,3122,3145,3087,339 2,1832,1803,1641,1628, 2390,2364,2289,2826,2611,2393,2500,2445,1457,1744, 1840,1860,980,926, 764,941,4391,4381,4328,4220,4301, 4278,4739,4658,1371,1921,1267,1686,3205,3124,3095, 3206, 4382,4681,5146,5633,6151,6273,6210,6656,2451, 2255,2722,2606,2833,2480,2405,2235,2284,271 2,2672, 2635,1478,1342,967,886,3456,3148,2828,2753,1699,1642, 831,947,1922,1805,1400,1452,2 174,2290,2613,2446,1689, 1760,507,889,1591,1864,1649,1262,4395,4450,5200,5157, 4307,4497,42 81,4492,984,751,1383,1481,942,996,1423, 1811,3209,3154,2394,2504,2406,2453,3128,3099,5145, 5142,4440,4682,4741,4689,4631,4336,4302,4191,4423, 4660,4896,4498,5256,5380,1615,1702,145 8,1701,3169, 3111,2351,2617,2292,2643,2237,2614,1373,1269,1482, 1690,4452,4403,4397,4513,61 55,6184,6212,6274,1644, 1387,971,890,2724,2409,2754,2637,1151,1215,1806,1431, 2263,2834,269 5,2396,2467,2454,2512,2728,2849,2410, 3331,3156,5384,5158,4309,4664,4928,4684,4282,4742,2638,2457,3210,3217,3333,3101,2618,2836,1460,1650,509, 949,973,1000,1595,1489,4500,4323,4992, 4690,4514,4398, 5634,5216,1705,1270,1731,1374,892,950,1623,1692,1814, 1484,1273,1706,2645, 2620,2267,2359,3115,3170,3587, 3160,2756,2646,2649,2699,4745,4867,4456,4635,5187, 5161,526 4,5148,4207,4427,4310,4405,6163,6157,6192, 6158,863,759,1008,510,2469,2840,2850,2659,1597, 1435, 1827,1813,1733,1389,1464,1652,4284,4545,4313,4504, 4705,4692,4647,4746,3212,3102,265 0,2458,1713,1398, 1447,1490,5189,5162,4325,4255,4516,4406,5636,5169, 3218,3143,2279,2736,27 01,2296,2417,2238,979,953,1817, 1274,1395,1505,1598,1437,2412,2702,2707,2383,3334, 3337,252 8,2363,6216,6401,6165,6276,4637,4869,5194, 5392,4706,4753,4429,4215,4696,4435,4314,4464,2269,2418,3233,3648,763,974,1627,1390,3117,3172,2661, 2470,1492,1679,954,879,2473,2499,3712, 3123,1924,1829, 981,982,4748,4326,4487,4409,6179,6402,6170,6657,2662, 2591,2283,2460,2391,2 420,3220,3118,1639,1708,1734, 1453,2823,2365,2270,2474,4546,4638,5280,5640,4430, 4329,4651, 4870,1818,1276,927,995,1397,1629,1872,1714, 1737,1656,1506,1830,3147,3338,2501,2285,1451,1 928, 1438,1247,2607,2881,2852,2760,4271,4219,4754,4708, 5408,5648,4437,4873,4316,4410,5312, 5664,6224,6181, 6169,6166,3345,3589,3176,3234,1687,1716,1859,1643, 4520,4491,4769,4679,519 0,5164,4451,4383,1496,1479, 1820,1833,2882,2709,2856,2827,3125,3265,2665,2652, 3224,3149,24 81,2768,4279,4330,5251,5201,4221,4653, 4756,4712,765,956,1738,1745,2864,2884,2395,2945,3236,3840,3340,3346,2291,2710,2502,2366,1861,1740,1888, 1834,887,985,1630,1936,1746,1720,1401, 1459,2723,2666, 3590,3126,2946,2829,2424,2476,3155,3129,2713,2784, 997,986,1841,1343,1645, 1836,1508,1454,6280,6404,6408, 6182,5170,5193,5135,5440,4438,4412,4337,4874,4659, 4441,454 8,4493,1862,1691,943,891,2615,2888,2673,2286,
3593,3184,3207,3150,1512,1263,1402,1483,5253, 5172,
5143,5254,4499,4303,4770,4654,2407,2505,3361,3266,
2447,2835,2639,2726,3157,3348,248 2,2725,1646,1651,
1461,1404,4881,4528,4453,4283,4332,4760,4720,4683,
1842,1485,998,766,2397, 2293,2506,2714,2668,2411,2175,
2239,2830,2455,3594,3130,6658,6240,6211,6185,5504,
5196,487 6,4801,1520,1693,511,988,1703,1748,1865,1653,
3240,3211,2484,2674,1375,1491,1462,1761,1275, 1486,
1466,1465,2619,2513,3171,3158,1001,951,1493,1271,
2729,2294,2755,2398,4222,4338,4661, 4494,5257,5202,
4442,4552,4454,4501,5176,5147,6288,6172,6213,6186,
1707,1866,1762,1923,313 2,3352,2647,2716,2838,2508,
3161,3362,1694,1807,1873,1844,2297,2730,2621,2459,
2851,2837,27 57,2413,3601,3596,3268,3213,1752,1952,
1815,1391,5217,5159,4399,4665,4340,4691,4285,4662,4
772,4457,4802,4685,4311,4882,4743,4444,6660,6193,
6218,6416,4515,4502,4560,4776,4897,4458, 5379,5204,
4686,4505,5258,5265,2488,2676,2737,2422,2471,2514,
2841,2298,1002,893,1925,1654, 1709,1868,1657,1735,
5381,5149,4666,4884,7168,7169,6304,6664,4693,4668,
4315,4407,5163,521 8,5635,5208,1277,1715,975,894,3173,
3219,3248,3214,1848,1926,1710,1764,3602,3393,3103,
3272, 2419,2529,2622,2461,1874,1399,1468,1494,3162,
3617,3364,3394,2651,2414,2516,2703,6432,667 2,6336,
6688,4804,4694,4697,4747,1507,1439,1509,1929,2948,
2853,2663,2732,4517,4888,4898,47 07,5260,5150,4698,
4506,3604,3335,2758,2477,3221,3174,2842,2300,5266,
5191,4327,4784,4749,4 344,4465,4286,1009,955,1819,
1497,1658,1768,1876,1984,3177,3376,2421,2653,1889,
1717,1821,1 930,2896,2738,2761,2680,3368,3235,2530,
2854,4460,4750,4755,4431,5382,5385,4576,4411,1739,
1831,1004,1010,3164,3119,2475,2952,4317,4466,5281,
5696,5165,5220,4709,4518,1498,1660,957, 983,3339,3457,
2462,2271,6214,6188,6275,6225,4521,4547,5760,5171,
2711,2740,3618,3396,2883, 2667,3280,3458,2520,2503,
2844,2857,1718,1278,1741,1599,4710,4639,4331,4508,
6194,6217,615 9,6464,3222,3225,3237,3178,1937,1822,
958,987,4439,4468,5268,5166,4871,4413,4318,4522,2762,
2769,2885,2764,2912,2858,2654,2960,3127,3400,2770,
2744,1835,1403,1721,1455,5195,5386,454 9,4333,6277,
6196,6167,6278,4655,4929,4900,4808,5393,5637,5224,
5282,1631,1513,1890,1747,24 25,2483,2865,2367,1012,
999,1510,1932,3608,3649,2669,2860,1742,1837,1500,
1880,3620,3185,25 32,2478,1863,1749,1016,767,3226,
3151,3341,3180,4930,4757,4904,4875,5173,5313,4713,
4700,28 86,2715,2536,2287,2426,2507,3650,3296,1722,
1938,1776,1892,1843,1838,1463,1953,3238,3591,3 624,
3267,2670,2675,2485,2428,5272,5197,4529,4816,4912,
4932,4443,4993,3342,3713,3595,3347, 1514,1647,1695,
1763,5284,5888,5388,5394,4339,4758,4550,4414,2866,
2509,2544,2717,2727,277 2,2889,2677,4771,4714,5638,
5174,6528,6220,6281,6226,4994,4877,4472,4524,6200,
6171,6241,61 83,1940,1487,1867,1405,2399,2515,3652,
3363,3131,3241,2486,2785,3632,3186,2299,2510,989,10
03,1521,1954,2490,2489,2517,2295,5203,5177,4761,4832,
4663,4936,4721,4334,6403,6228,6282,6 289,5641,5232,
5255,5198,4455,4553,5409,5314,4495,4883,4687,4774,
1845,1750,1985,1896,3349, 3228,2731,2890,3159,3269,
3188,3242,1516,1655,1753,1724,5205,5396,4530,4773,
4445,4341,455 4,4762,4716,4459,4223,4287,6405,6173,
7170,7172,1467,1765,990,1005,2786,2947,2718,2831,313
3,3603,3597,3714,2897,2868,3353,3350,2776,2976,3598,
3249,1869,1944,1406,1846,1875,1754,15 22,1904,2839,
2415,2949,2678,3365,3460,2733,2892,2681,2759,3163,
3656,4878,4503,5642,5178,5 288,5259,4532,4722,6187,
6242,6659,6232,4667,4561,5219,5206,1766,1469,1495,
1659,3841,3270, 3244,3192,4777,4342,4803,4446,5180,
5400,4695,4764,3273,3408,2301,2739,3134,3354,2872,295
0,959,1011,1956,1711,2734,2788,2898,2423,2492,2518,
2531,2463,3215,3175,3250,3366,4886,455 6,5209,5410,
4345,4778,4669,4507,3165,3716,3274,3664,1927,1849,
1524,1870,4899,4885,4805,44 61,6284,6174,6290,6215,
5649,5644,5316,5261,4536,4724,4785,4470,1769,1850,
1756,1470,2533,2 953,3395,3464,1986,1960,1499,1877,
2843,2521,3369,3842,6406,6409,6305,6720,6189,6244,
6784, 6195,4519,4562,4889,4346,5221,5267,5296,5262,
1891,1661,1931,1511,2682,2792,2900,3008,565 0,5441,
5151,5320,4467,4577,4670,4509,3179,3252,2913,2741,
1013,895,1719,1770,5210,5665,541 2,5442,4699,4462,
4564,4751,3223,3281,2845,2954,3356,3720,2763,2855,
3166,3276,2522,2684,33 70,3472,3680,3424,6292,6190,
6219,6410,4996,4901,4711,4780,1852,1777,1878,1881,
2742,2302,2 765,2623,1528,1823,1279,1988,2961,2846,
3397,3605,5652,5383,4806,4525,6417,6661,6248,6306,
5269,5222,4890,4348,7176,7184,6197,6337,5225,5424,
4469,4701,4944,4786,4809,4728,5416,528 3,4578,4902,
5212,5167,4523,5000,3227,3282,3377,3619,1933,1743,
1501,1939,5387,5505,4510,43 19,4759,4788,5666,5444,
3372,3181,2859,2427,1662,1772,1006,1014,3256,3606,
2745,2479,2655,2 537,3609,3187,1968,1893,1515,1723,
2914,2771,2534,2956,2766,2861,2524,2904,3239,3297,
3398, 3378,2887,2773,3844,3229,3728,3401,2746,2962,
4931,4715,5328,5506,6296,6221,6308,6912,456 8,4551,
4892,4905,5270,5273,5285,5226,4810,4817,4933,4812,
4960,4906,4702,5008,6412,6418,66 62,6198,5175,5448,
4818,4792,2800,2916,3182,3189,2867,2862,3284,3243,
4473,4531,4913,4415,6 227,6201,6665,6256,1778,1882,
1502,1992,3848,3402,3298,3621,5656,5697,4717,4908,
5668,5233, 4580,4526,1407,1934,1839,2000,3610,3459,
3380,3288,2487,2977,2538,2671,1894,1941,1017,101
8,6279,6222,6433,6338,5274,5199,5389,5228,2719,2787,
2964,2511,1751,1517,1897,1725,4934,47 63,4584,4335,
6229,6420,6666,6202,2891,2429,3488,3343,3351,3230,
3409,3622,4474,4555,5698,5 344,5286,5639,5672,5315,
1955,1780,1884,1523,2545,2978,3744,3190,7200,7171,
6312,6283,6243, 6230,6204,6424,2869,2774,3009,2920,
3404,3651,2540,2679,4718,4723,4533,4476,5390,5761,564
3,5395,4914,4557,4592,4765,4775,4820,4937,4725,3612,
3461,3245,3193,2777,2748,2491,2789,17 55,1847,1946,
1898,1942,1526,1957,1767,3625,3271,3856,3251,3300,
3410,2893,2968,6233,6434,6 673,6668,6340,6285,6245,
6291,4447,4563,5700,5411,5179,5289,4534,4833,5680,
5234,4347,4558, 4538,4537,4565,4343,5397,5276,4779,
4938,5207,5317,5236,5290,3384,3776,2430,2870,991,
1020, 1784,1905,7173,7232,6320,6286,4834,4995,4766,
4879,3462,3246,2899,2778,1518,1726,1945,152 5,3626,
3653,3465,3355,2546,2928,3194,3520,5181,5651,5645,
5762,4945,4916,5401,5398,2790,24 93,2519,2683,1900,
1871,2016,1471,2980,2735,3425,3633,2951,2873,3275,
3135,1757,1851,1958,1 906,3412,3466,2548,2894,1961,
1987,1771,1529,2793,2874,3599,3654,6674,6465,6175,
6344,4824, 5024,5646,5297,4887,4463,4997,4726,6234,
6689,6436,6466,3628,3253,3367,3357,2780,2494,330
4,3196,6676,6407,6293,6246,5413,5508,4781,4940,4729,
4807,5211,5704,5889,5318,5292,5240,32 77,3254,3715,
3634,3010,2984,2523,2901,2915,2685,3358,3657,1879,
1948,1758,1853,5321,5456,4 349,4787,5182,5402,4920,
4998,3371,3426,3283,3473,2955,2535,2743,2794,4782,
4836,4946,4471, 4540,4566,4579,4511,5263,5223,5298,
5414,5213,5764,5322,5712,4581,5001,5443,5512,6249,644
8,6440,6307,4891,4569,5417,5890,6236,6191,6411,6529,
7177,7174,6690,6468,4730,4840,4948,50 56,2876,2801,
3257,3468,1989,1962,1908,1530,1773,1969,1990,1779, 3416,3658,2902,2905,3717,3665,3607,3312,3278,3167,2552,2847,1883,1964,1854,1935,2303,3012,3399,3636,3872,3474,3428,3379,2957,2767,2525,2963,5227,5300,4961,4789,5271,5329,4893,5002,6352,6530,6294,6297,6309,6250,6199,6472,5404,5768,4811,4903,5214,5324,4570,4732,1895,1663,1912,1503,1970,1774,1993,1532,5418,5520,5728,5472,4790,4350,4813,4671,3373,3489,2686,2796,2992,2917,3285,3640,2539,2747,3904,3660,2802,2906,3258,3718,6680,6721,6692,6257,5009,4894,5445,5653,3476,3299,2526,3016,3968,3666,3490,3374,6298,6223,7185,7178,5275,5330,5425,5667,5420,5229,4907,4475,5304,5654,4793,4527,1885,1781,1994,1943,3721,3843,2431,2958,3432,3611,3183,3403,2863,3024,2918,2965,4703,4585,5657,5235,4962,4819,4582,5004,6413,6252,6722,6368,4814,4909,4572,4952,5287,5345,5446,5426,6310,6663,6696,6339,1899,1886,1782,1972,2775,2541,3286,3381,6414,6785,6667,6419,4935,4821,5892,5277,2921,2749,3260,3521,2001,1947,1996,1785,5776,5449,4794,5010,6724,6435,7186,7296,3289,3480,2979,2804,1901,1976,1519,1727,4848,4964,5230,5237,4915,4910,5332,5291,5896,5450,5346,5669,6203,6313,6704,6258,3681,3668,3623,3722,2908,2547,3301,3231,5658,5507,5428,5336,4535,5025,4586,4719,3492,3382,3613,3845,1959,2002,1007,1015,2779,2871,2970,2922,3682,3729,2966,2550,3405,3191,3672,3411,2981,2791,3290,3440,6421,6300,6231,6341,4767,4835,5012,4559,2808,2929,3724,3302,3463,3385,3522,3614,4939,4477,5536,5391,5399,5278,5457,5670,6260,6314,6205,6675,6669,6786,7180,7201,3406,3305,2542,2750,3627,3846,2969,2549,3247,3195,3730,3684,3413,3849,2924,2895,4593,5026,5792,5238,4917,4822,5057,4968,6425,6422,6670,6321,5452,5699,4588,4727,6437,6532,6235,6728,5660,5509,5293,5241,1907,1786,1527,1949,3040,2495,3292,3386,4825,4796,4539,4837,5673,5319,5904,5299,7233,7188,6913,6342,6316,6264,6345,6480,5348,5458,4941,5016,5432,5824,4478,4918,2781,2875,3496,3467,2982,2930,3745,3655,1902,1759,2017,1909,2985,3011,3427,3359,3255,3306,3197,3629,2795,2553,2903,2972,5510,5294,4947,4826,6206,6426,7424,7202,5674,5701,5513,5403,4594,4976,5242,5568,6287,6247,6322,6438,4838,4541,4567,4731,1963,2018,2004,1950,3732,3688,3414,3388,3313,3850,2782,2877,3635,3417,3524,3469,3013,2986,3475,3279,1788,1965,1991,1910,5028,4783,5473,5681,4999,4921,5323,5183,6237,6788,6346,6736,6467,6536,7192,7204,3746,3630,3857,3504,2932,2554,3429,3259,5460,5514,4596,4942,6441,6914,6251,6324,4841,4922,5647,5702,5676,5301,5415,5405,6295,6353,6428,6792,4828,4542,5352,5244,2797,2993,3308,3736,3696,3659,3014,2803,2907,2988,3852,3777,1855,1971,1531,1913,5325,5302,5763,5682,5058,5032,4571,4949,4963,4733,5406,5705,5419,5474,5331,5521,5003,4583,4791,4842,7175,7297,6238,6348,3198,3314,3637,3470,2008,1775,1966,2020,3418,3528,2878,2959,2919,2687,3430,3477,6442,6544,6752,6496,4924,4849,5305,5516,3375,3641,3316,3667,2936,2527,3261,3638,3748,3433,3778,3661,2994,2798,3287,3858,5464,5706,4950,4953,6469,6677,6299,6354,1995,1914,1533,1973,3719,3420,3491,3478,5765,5713,5655,5360,5326,5215,4600,4895,3536,3752,3017,2556,2909,2805,3873,3434,6449,6691,6444,6253,4351,5060,5447,5684,5920,5522,5476,5427,7234,7680,6328,6678,3018,2967,3662,3481,2923,2910,3642,3860,5005,4815,4573,5011,5421,5537,4734,4844,5040,4965,5333,5688,4587,4795,5952,5708,6681,6259,6311,6369,6470,6450,7179,7208,3669,3644,2806,2996,3291,3383,3780,3670,4850,4954,5306,5766,5524,5347,4574,5064,6016,5714,5538,5422,5769,5891,4479,5006,1997,2024,1916,1974,3673,3723,3493,3864,3025,2971,3874,3683,3020,2809,3674,3482,3303,3760,2925,3000,1887,1783,2032,1534,6916,6301,6800,6473,6254,6261,6356,6315,3725,3320,2543,2751,3441,3262,3436,3726,7236,7298,6920,6474,6370,6693,6682,6531,5480,5659,5231,5451,4911,5072,4966,5013,2983,3026,3731,3407,3552,3387,3293,3442,6452,6360,7187,7181,6560,6415,6423,6302,4823,4589,5334,5429,4969,4797,5308,5569,3685,3494,3497,3523,3686,3615,3307,3484,5337,5528,5027,4852,5729,5716,5671,5770,7216,7182,6481,6694,4956,4595,5349,5279,6816,6262,6476,6723,5540,5430,5661,5893,2003,1977,1019,1021,2931,2810,3415,3444,2551,2973,3847,3389,3294,3498,2926,2783,6684,6533,6317,6265,4827,4919,5018,4970,3525,3309,3041,2933,3631,3905,3876,3784,5730,5777,5014,4598,5453,5239,5720,5459,6697,6343,6928,6323,5029,4839,5338,5488,2987,3042,3906,3733,1787,1998,1978,1903,6372,6482,6456,6848,4856,4977,5772,5350,3880,3851,3689,3676,2005,2006,1951,2019,7240,7425,6534,6318,5511,5433,5570,5662,5454,5353,4590,4798,6698,6725,7189,7300,5675,5894,5017,4597,6537,6427,6266,6592,5295,5243,5778,5732,5461,5897,4972,4943,3505,3792,3888,3908,3028,2974,2812,2989,6497,6705,7203,7426,6347,6207,6484,6538,3419,3969,3315,3734,1789,1980,1911,2009,5088,4543,5340,5434,4829,4923,5544,5515,5030,4978,5793,5703,5033,5059,5475,5407,6671,6726,6700,6325,5303,5354,5245,5677,3526,3390,3015,2934,3747,3690,2879,2995,3970,3853,3448,3500,3737,3808,2555,2937,4843,4601,4951,5020,5780,5736,5462,5436,2021,2010,1967,1915,3639,3912,3697,3310,6439,6429,6376,6268,5361,5898,4830,4925,3032,2799,3431,3529,2990,3044,3471,3859,6349,6326,6787,6706,5683,5465,5572,5517,3663,3750,3506,3749,2022,1790,1535,2012,6430,6729,7194,7681,6443,6498,7248,7205,5061,5034,5523,5327,5794,5678,5905,5552,4980,4602,5477,5307,6355,6545,6329,6540,3421,3317,3530,3738,3692,3435,3019,2938,3199,3263,3854,3479,3508,3698,2557,2997,7193,7190,6488,6730,6789,6737,6679,6384,4845,5041,5356,5784,5744,5707,5062,4851,6350,6239,6471,6708,6944,6546,7304,7428,3021,3048,3643,3537,3753,3318,3779,3422,4955,5036,5900,5825,5246,5362,5685,5518,5466,5576,4926,5007,4967,4735,5478,5525,2940,2998,3671,3740,3862,3532,3321,3754,5423,5689,5364,5715,6500,6451,6445,6561,7432,7206,6357,6712,4984,4575,5309,5686,6976,6732,6330,6790,5796,5481,5826,5709,2025,1975,1022,1023,2911,2807,3056,2558,5042,4846,5335,5906,5767,5468,5539,5526,3645,3483,3875,3861,3781,3437,3512,3700,6548,6371,7040,6738,5584,5800,5065,4604,6562,6446,7682,7264,6793,6915,6504,6683,3761,3446,3495,3538,3027,3001,3865,3322,3443,3553,3646,3485,2026,1917,1999,1918,4957,4853,5921,5482,5066,5015,5710,5529,7235,7209,7312,7196,6255,6475,6358,6453,4971,4958,5690,5908,6332,6593,6361,6552,5717,5692,4854,5044,6753,6740,6695,6794,2811,3022,3675,3438,3540,3727,3002,2927,3972,3877,3029,3030,3687,3756,3782,3501,5339,5431,5828,5718,5721,5771,5541,5912,7237,7210,6373,6303,5073,5019,5922,5731,5068,4857,5722,5530,6564,6454,7684,7217,3866,3324,2975,3043,3445,3677,3920,3762,6685,6917,7242,7440,6754,6801,6477,6263,6744,6483,6362,6512,5351,5808,4973,5048,6796,6374,6535,6457,5773,5368,4591,4799,2033,1979,2028,2034,3785,3704,3554,3878,5489,5310,5484,5774,5031,5074,5779,5455,5600,5435,5341,5490,5733,5542,5545,5571,6594,6686,7328,7688,6478,6377,6699,6918,6319,6267,6802,6756,7456,7696,6485,6921,3499,3976,3486,3295,3735,3764,3907,3691,3544,3527,3868,3881,2813,3004,3786,3793,5734,5663,5355,5532,6364,6458,7360,7712,3909,3788,3936,3882,2935,3033,3678,3984,4979,4858,5463,5492,6568,6539,6817,6727,3794,3768,3449,3507,3045,3034,3889,3391,4599,5021,5895, 5437,5342,5546,4974,4831,7238,7212,6499,6431,5573,5357,5089,4981, 1981,2007,1982,2011,3693,3884,3556,3502,6327,6378,7299,7249,5679,5953,5924,5832,6269,6701,6804,6760,5035,5090,5954,5781,7218,7241,7183,7488,5928,5899,5737,5724,6486,6460,6385,69 22,6707,6489,6596,6541,3910,3739,2991,2939,3560,3311,3450,3531,5553,5840,5936,5956,5076,5 022,4860,5037,3694,3699,3509,3452,3890,3533,3046,2814,5467,6017,5363,5782,7301,7220,7191, 7302,6547,6351,6818,6702,6929,6576,6501,6331,3568,3741,2559,3036,3751,3796,3913,3701,6380,6808,6768,6731,5574,5438,5063,4982,3423,3539,3510,3809,2036,2023,2040,1791,7552,7244,69 24,6849,5795,5738,4927,5043,6018,5901,5496,5548,6270,6386,6709,6542,3323,3534,3514,3513,3 049,2999,3541,3319,5785,5856,4603,4985,5687,5960,5745,5358,5080,4847,5479,5577,5038,5092, 5519,5907,7305,7250,6490,6600,6502,6549,7224,7195,5711,5798,5554,5797,7265,7207,6447,6713,6388,6739,6333,6710,5469,5365,5578,5786,5740,5483,5067,4986,6820,6505,6850,6733,5247,53 11,5902,5527,6359,6930,6791,6492,3755,3914,3810,3971,3742,3855,3921,3892,6563,6550,6608,6 824,6945,6506,7427,7252,3800,4000,3863,3439,3050,2941,3973,3702,6734,6553,7306,7313,7429, 7197,6714,6932,5556,5746,4605,5045,5069,5096,5691,5585,3757,3916,3705,3783,2013,2027,2014,2029,5801,5366,5827,5470,4988,5046,5719,5788,3325,3763,3023,2942,3896,3974,3758,3812,59 10,5580,5369,5802,6741,6716,6363,6455,7211,7266,7683,7256,6852,6742,6745,6795,3922,3447,3 516,3542,3555,3487,3557,3977,4959,4855,5104,4606,6565,6936,6946,6755,5693,5531,5923,5909, 5829,5485,5560,5748,7308,7198,6746,6554,5809,5494,5543,5586,7314,7239,6375,6832,6797,6392,6513,6334,5075,5049,5913,5370,5491,5601,5694,5533,3057,3003,3867,3545,3706,3816,3924,40 32,3937,3765,3869,3978,3787,3879,3052,3058,6508,6798,6803,6479,7430,7433,6624,6459,6365,6 514,7329,7744,4859,5070,5723,5486,7213,7268,6757,6566,5588,5775,5050,4975,1983,2035,2037, 1919,3546,3708,3005,3031,6569,6595,7808,7219,6020,5925,5077,5078,3766,3326,3789,3647,3985,3870,3006,3035,6758,6687,6379,6556,6487,6516,7316,7214,5735,5804,5830,5549,6919,6461,63 66,6570,5914,5372,5023,5091,5493,5725,5968,5810,3883,3451,3769,3503,3679,3561,3938,3795,5 833,5752,5602,5926,7243,7434,6597,6381,5547,6024,5534,5343,6703,6977,6948,6856,3060,3047, 3558,3980,3790,3885,3548,3928,7441,7685,7272,7330,5783,5812,5955,5739,3911,3797,3064,2815,3770,3986,3824,3940,5592,5575,5916,5929,6978,6805,6952,6923,7221,7361,6761,6748,7320,72 45,6577,6864,4861,5052,5834,5841,6960,6980,6491,7041,7332,7936,7436,7442,6387,6806,6598,6 462,5957,5836,5984,5930,4983,5081,5726,6032,5842,5816,5497,5555,6819,6762,7686,7222,3891, 3886,3511,4001,3562,3695,3743,3811,7042,6925,6520,6572,7251,7225,6809,6880,5093,5082,5937,5439,5741,5932,5604,5550,5958,5787,5039,4987,6711,6984,6769,6382,3988,3535,3915,3453,30 37,3051,3569,4002,3893,3798,4033,3944,3564,3703,3801,3772,7689,7280,7303,7246,5608,5359,5 498,5579,6503,6601,7457,7362,6543,6931,6735,6822,7253,7444,6578,6821,5742,5747,5557,5500, 3515,3813,3038,3053,3917,3992,3454,3894,5938,5581,5094,4862,6493,6389,6602,6810,6764,6507,6271,6335,6926,6551,7690,7226,5616,5789,4607,5084,5799,5844,5961,5749,3923,3802,3570,39 52,3814,3517,3543,3707,3007,3059,4004,3759,3975,3897,3572,3918,7336,7307,6580,6770,5471,5 587,5558,5857,5371,5582,5562,5561,6715,6609,7267,7254,5097,5047,5589,5367,6825,6390,6851, 6494,5803,5962,5858,6019,7228,7448,6743,6812,6934,6604,7257,7458,5790,5903,5969,5940,6393,6826,6717,6555,6947,6933,6853,6509,3817,3898,3804, 3518,4034,4008,3547,3925,7697,7692,73 64,7309,5848,6048,5911,5487,6584,6772,6833,6518,6567,6610,6937,6394,5098,4989,6021,5750,5 805,5964,5753,5831,3939,3709,3979,3559,3061,2943,3767,3818,5373,5811,5071,4990,7269,7315, 7344,7310,5944,6022,5806,5860,7698,7489,7199,7368,3900,3825,3926,3929,3576,3871,3327,4036,6515,6625,6718,6557,5970,5495,5564,5590,3981,3791,3549,3987,3710,3820,3054,3062,7258,77 13,7460,7490,6747,6510,6612,6799,5603,5535,5605,6025,7044,6949,6759,6828,7700,7431,6854,6 573,7317,7270,6938,6396,4016,3941,3563,3771,2030,2038,2041,2042,5105,5051,5915,5593,5754, 5864,5972,6080,7273,7472,6517,6749,5985,5813,5917,6026,6992,6834,6857,6776,7464,7331,6626,6950,5835,5927,5100,5106,7260,7215,6571,7048,5594,5756,5053,5079,7435,7553,6558,6367,68 07,6836,7714,7492,6979,6763,7376,7554,6616,6599,6940,6953,5814,5374,5837,5695,7318,7321,7 333,7274,6033,5918,5054,5083,6858,6865,6981,6860,7008,6954,6750,7056,7223,7496,6866,6840, 5931,5499,5817,5551,3826,3930,3550,4040,3455,3982,3887,4048,5727,5609,5986,5843,6521,6579,6961,6463,5108,5095,5606,6028,7704,7745,6765,6956,5838,5933,5596,5976,7716,7281,6628,65 74,3942,3989,3065,3066,3799,3565,3945,3773,5959,5845,5112,4863,7322,7247,7437,7276,6982,6 811,6632,6383,6522,6603,7746,7392,5818,6034,5872,5988,5939,5934,5559,6049,4003,3828,3932, 3571,3803,3895,3994,3946,7334,7687,7720,7363,6766,6771,6581,6524,7438,7809,7691,7443,5610,5743,5791,5859,6962,6605,6640,6813,6823,6868,6985,6773,6036,5583,5963,5501,6495,6611,77 48,7459,3990,3574,4005,3815,3039,3068,3832,3953,7227,7337,6582,6881,7728,7282,6395,6606,5 085,5099,5617,6050,6586,6585,6613,6391,5941,5846,6081,5992,7445,7324,6827,6986,7255,7365, 7284,7338,5612,5751,5849,5820,5563,5861,5086,5101,6882,7043,6814,6927,3566,3774,3993,3573,3948,3919,4064,3519,7229,7699,7693,7810,6993,6964,7449,7446,3805,3899,4006,3954,4009,40 35,3819,3577,6872,7072,7694,7345,5965,6040,5502,5942,5971,5850,5618,6000,6935,6511,7045,6 774,7461,7556,6829,6988,6777,6855,7259,7752,5862,5565,5591,5755,7937,7366,7340,7288,7369, 7504,6397,6835,7230,7450,6968,7046,5055,5107,6052,5807,6830,6884,6994,6519,3927,3996,3806,3901,4037,4010,3956,3578,6588,6614,6627,6559,7311,7271,7346,7462,7261,7812,7370,7760,60 23,5945,5620,5966,5865,5946,5852,5566,6629,7049,7491,7560,6082,6056,5595,5973,6939,6617,7 465,7938,5987,5757,6027,5607,6778,6888,6996,7104,7275,7348,7009,6837,5109,4991,5815,5866, 7319,7377,6941,7050,7452,7816,6859,6951,3821,4017,4038,3827,3931,4012,3902,3983,7262,7372,6618,6780,7466,7568,7776,7520,5948,5873,5974,5977,6838,6398,6861,6719,5624,5919,5375,60 84,7057,6942,7493,7701,7323,7378,7473,7715,6029,5839,5597,6035,3943,3711,3960,3551,4018,3 822,4041,3580,7468,7277,6955,6523,5758,5868,5102,5110,7352,7702,6841,6575,6751,6633,7705, 7283,6064,5989,5611,5819,7010,6867,6630,7052,6862,6957,6620,7000,7335,7393,7494,7474,6983,6869,7940,7325,7824,7497,6842,7058,6896,7012,7278,7285,6963,6958,7380,7339,3933,3829,40 42,3991,2015,2044,2031,2039,5874,5978,5598,6088,7944,7498,7394,7717,5503,6030,5935,6096,7 706,7555,7476,7384,6583,7073,6634,6767,5990,6037,5113,5114,6815,6883,7060,6607,5847,5613, 5993,5821,6987,6525,7584,7439,7447,7326,7505,7718,6051,5876,5980,5619,6641,7074,7840,7286,3947,3934,3830,4020,4049,3995,4044,3833,6965,6870,7105,7016,7500,7747,6636,6775,3949,40 24,3567,3775,4007,4050,3055,3063,7708,7557,7341,7289,6873,6844,6587,6885,5851,5943,6042,5 994,6038,5622,6053,5863,7721,7367,7952,7347,7396,7506,6989,7064,3955,3834, 3575,3997,3950, 3807,4065,3957,7480,7872,6526,6966,5087,5116,5880,6001,7558,7342,6995,6874,5614,5822,6041,5621,7722,7749,7561,7451,6642,7024,7290,7616,6886,6589,6615,6779,5996,5967,6112,5567,40 11,4066,4052,3998,3836,4013,4039,3958,7076,6831,7521,7729,7047,6969,7371,7231,5853,5947,6 054,6002,7508,7562,6644,6990,6057,6083,5867,5625,6889,6970,7695,7750,7724,7349,7463,7453, 6876,6590,7400,7292,3903,4019,3579,3961,4056,3823,4014,4068,7373,7350,7811,7730,7106,7080,6619,6997,7011,6781,7454,7753,5975,6044,5854,5949,7467,7522,7379,7569,7051,6631,6839,68 90,6972,6897,7353,7564,6085,6058,6004,5626,5869,6065,6086,5875,7512,7754,6998,7001,7813,7 761,7703,7408,7374,7263,6648,6943,5979,6060,5950,6031,6399,7108,7495,7732,7968,7570,7524, 7475,7053,6863,6621,7059,4043,3962,3581,4021,2043,2045,2046,2047,5991,5759,6008,5599,6066,5870,6089,5628,7469,7585,6782,6892,7088,7013,7381,7736,6635,6843,8000,7756,6898,7002,73 54,7814,7572,7395,6622,7112,8064,7762,7586,7470,5981,5877,6090,6039,7817,7939,6527,7054,7 528,7707,7279,7499,6959,7120,7014,7061,4045,4072,3964,4022,3935,3831,4080,3582,5995,5982, 5878,6068,6871,6637,7382,7477,7017,6845,7356,7617,6097,6043,6092,5881,7385,7576,7075,6900,5997,6072,5615,5823,7777,7764,7719,7818,7004,6643,7397,7327,7588,7478,7709,7941,6055,60 98,5103,5111,6875,6967,7066,7018,7778,7825,7062,6646,4051,4025,3067,3069,3835,4046,4026,3 951,7501,7287,7768,7507,7077,6887,7386,7536,6904,7025,7820,7398,7559,7481,7618,7710,7502, 7401,6638,6846,7723,7942,7065,6645,7343,7291,7826,7780,7509,7945,7020,6991,6003,5882,5623,6045,7136,6591,7388,7482,6877,6971,7592,7563,7078,7026,7841,7751,5998,5855,6113,6005,70 81,7107,7523,7455,7351,7402,7293,7725,6891,6649,6999,7068,6059,6114,6100,6046,7828,7784,7 510,7484,4053,4054,3999,4067,3837,4028,3959,4057,7409,7946,6878,6973,7731,7513,7620,7565, 7109,7082,7571,7375,5884,6061,6087,6006,7842,7726,7953,7600,7028,6650,7525,7355,6893,7089,7404,7832,7792,7755,7110,6899,7003,7084,7948,7873,5951,6067,5627,6009,7294,7410,7733,75 66,6104,5871,6062,6116,7514,7624,6974,7055,7015,6783,7526,7573,7471,7737,7412,7763,7032,6 623,7357,7734,4069,4058,4015,3963,4070,3838,3583,4060,7844,7529,7874,7757,7090,6894,7383, 7954,6091,6010,5629,6069,7815,7516,7587,7574,7632,7848,7113,6652,7005,6901,7969,7530,7114,7063,7758,7577,7019,7006,7738,7956,7765,7740,6902,7092,7387,7479,7876,7766,6093,6120,60 12,6070,7769,7819,7589,7960,7121,7067,7970,7779,7116,6905,7770,7578,4073,4023,3070,3071,4 074,3965,4047,3966,7399,7856,7021,7096,5983,5879,6128,5630,7821,7416,6639,6847,7537,7358, 7532,7822,7079,7122,7827,7503,7648,7483,7389,7538,7781,7590,7593,7619,7782,7711,7403,7580,6099,6073,5115,5117,7027,6906,7511,7540,6647,7069,7943,7485,7390,7594,7022,6879,7621,74 05,7137,7029,7727,8001,7972,7880,7083,7138,8002,7829,5883,6094,6074,5999,4081,4027,4076,4 082,4029,4055,4030,4059,7976,7947,7785,7772,6101,6102,6047,6115,7601,7888,7984,8004,7124, 7070,6908,7085,7515,8065,7411,7830,5885,6076,6007,6105,7622,7486,7111,7030,7843,7786,6975, 7091,8066,7949,7544,7596,7833,7904,6651,7033,6117,6106,6063,6011,7735,8008,7793,7406,712 8,6895,7527,7625,7086,7140,7567,7955,7759,7846,7602,7845,6118,5886,5631,6108,7517,7413,76 26,7834,7788,7531,7115,7034,7295,7359,7950,7575,7604,7794,6653,7093,7117,7144,7739,7633,7 849,7414,7875,7518,7036,7094,7767,7836,7958,7628,7417,7850,6121,6071,5118,5119,7007,6903, 7152,6654,7741,7579,7971,7957,7877,7533,7608,7796,7857,7542,7591,7634,7123,7097,7961,7418,7539,7649,7742,7581,6122,6013,6095,6014,6907,7118,7771,7534,7636,7823,7098,7023,8068,79 73,7125,7126,7783,7852,7878,7597,7962,7420,7071,7139,7541,7773,8016,7858,6129,6075,6124,6 130,7881,7800,7650,7974,7595,8072,7582,7391,7831,7860,8003,7787,7640,7623,7964,7977,6909, 7100,7882,7889,8005,7884,8032,7978,7031,7129,7774,8080,7890,7864,7545,7603,7141,7130,7985,7487,6077,6103,6078,6107,7789,7980,7652,7598,8006,7835,7087,7035,7656,7407,7546,7627,77 90,7795,7605,7548,7986,7629,7142,6910,7664,7837,6655,7132,7847,7892,8009,7797,7519,7635,7 606,7905,6132,6119,6136,5887,7419,7630,7610,7609,7145,7095,7637,7415,4084,4071,4088,3839, 4061,4075,4062,4077,7851,8010,7906,8067,7838,7951,8017,7988,7896,8096,7959,7535,7146,7037,8069,7798,7853,8012,7801,7879,6109,6123,6110,6125,7421,7859,7119,7038,7992,8070,7854,79 08,8018,7543,7612,7638,7651,7583,7653,8073,7153,7099,7963,7641,7802,7912,8020,8128,8033,7 861,7965,8074,7883,7975,7148,7154,6079,6131,6133,6015,7642,7804,7101,7127,7862,7422,7885, 7743,8081,7966,7102,7131,7979,7547,7865,7599,7775,7657,8034,7891,7156,7143,7654,8076,7886,7981,7644,8024,8007,7893,7160,6911,7866,8082,7920,8036,7987,7982,7607,8097,7658,7791,78 39,7907,8084,7631,8011,7549,7133,7147,7665,8098,7989,7894,8129,8040,7660,7799,7897,7868,7 611,7909,7134,7149,8013,8088,7550,7990,8019,7898,7666,8048,7910,7613,7639,7803,7103,7155, 8100,7855,8071,7993,7668,8014,7913,7994,7900,7614,8130,8104,7643,8021,4031,4083,4085,3967,4078,4086,4089,4090,8035,7805,8075,7655,7157,7039,7863,7914,7996,7921,8022,8025,7672,79 67,7423,8132,8077,7887,7645,8083,7806,7916,7150,7158,8112,8037,7659,7867,6126,6134,6137,6 138,7922,8026,7646,8136,7551,8078,7983,8144,8038,8085,7161,7162,7895,7661,8041,7869,8099, 7924,8028,7667,7899,7991,8090,8042,8086,7670,8101,7911,7135,7164,7928,8049,7662,7870,8089,7669,8044,8015,8160,7615,7901,7995,8102,8050,8105,8131,7915,7673,8023,8092,7902,7997,81 33,8106,8052,7674,4063,4092,4079,4087,4091,4093,4094,4095,7917,8113,8134,7923,8027,8108,7 998,8079,8039,7807,8056,7647,8114,7918,8137,7676,8029,7925,8138,8087,6111,6140,6127,6135, 8043,8030,7926,8116,8145,8091,8140,7929,8045,8120,7663,7871,8103,8146,7151,7159,8051,7930,7671,8093,8046,7903,8161,8053,8107,8162,8148,8094,7932,8109,8135,8054,7999,8115,7675,80 57,8152,7919,8110,8164,8139,8058,7677,8117,6139,6141,6142,6143,8141,8168,8060,8118,8031,7 927,8176,7678,8147,8121,7163,7165,7931,8142,8122,8047,8149,8150,8095,8163,7933,8124,8055, 8153,8165,8154,8111,8059,8166,7934,7679,8156,8169,8119,7166,7167,8170,8061,8143,8062,8177, 8123,8172,8178,8125,8151,8126,8155,8180,8167,8184,7935,8157,8171,8158,8173,8127,8179,818 1,8063,8174,8182,8185,8186,8159,8188,8175,8183,8187,8189,8190,8191]

Sequence Group 2: Z2_8192

[0,1,2,7,3,8,11,24,4,10,13,28,16,33,35,78,5,12,14,32,19,38,47,82,22,46,42,89,57,97,105, 174,6,17,21,40,23,45,51,91,29,55,59,100,73,112,117,189,34,61,76,115,81,126,139,206,88,141,151, 232,158,242,276,409,9,18,26,54,30,58,72,107,36,77,62,118,85,133,145,213,44,75,87,140,93,148,157,238,103,160,176,266,188,284,302,449,53,90,101,156,113,166,183,281,122,184,205,294,217,31 9,340,488,143,211,235,325,240,341,365,531,273,371,402,553,419,580,632,874,15,25,31,74,39,80, 83,144,48,86,94,155,104,165,171,280,56,95,106,167,116,182,202,296,132,203,212,314,237,333,35 9,515,66,110,123,187,134,204,220,326,154, 233,241,343,272,370,383,552,170,255,282,375,295,41
5,421,576,322,438,470,619,504,654,727,875,70,127,147,
223,164,239,271,373,175,274,286,408,30 3,420,448,613,
200,297,315,436,342,466,490,668,353,506,534,698,560,
736,774,1027,219,327,348, 473,376,514,537,722,418,549,
577,762,620,779,847,1107,447,602,633,812,652,869,905,
1175,725,9 16,947,1170,1003,1250,1349,1692,20,37,41,92,
49,96,108,181,50,109,119,190,136,216,224,357,63, 120,
137,227,149,236,253,358,159,252,277,401,298,417,424,
575,68,146,161,229,178,264,283,416, 186,292,308,432,
318,458,477,650,185,316,329,457,352,491,517,699,378,
539,561,735,601,773,815, 1075,79,173,179,288,195,312,
328,450,207,335,347,489,366,530,548,731,275,362,377,
533,410,55 8,600,768,442,605,638,806,671,868,907,1160,
311,404,433,574,456,618,640,856,482,665,681,873, 728,
923,973,1217,535,726,737,964,769,1010,935,1259,834,
1072,1112,1371,1139,1473,1534,1766, 84,191,201,351,
265,369,382,538,289,400,411,569,439,607,635,860,309,
437,453,612,472,641,677, 881,507,685,719,919,763,967,
1026,1263,356,459,476,676,516,712,743,944,568,748,775,
1022,835, 987,1095,1375,617,802,866,1073,886,1138,
1166,1452,932,1173,1172,1514,1260,1573,1621,1937,4
03,505,544,749,606,778,814,1049,639,857,870,1113,913,
1145,1171,1463,678,901,945,1161,974,11 74,1261,1574,
1048,1289,1342,1630,1390,1706,1742,2125,734,965,1018,
1262,1094,1280,1382,164 9,1106,1377,1454,1716,1502,
1801,1898,2270,1146,1488,1556,1829,1602,1907,1867,
2344,1686,19 69,2033,2474,2151,2586,2643,2994,27,43,
52,102,60,121,138,221,67,142,150,226,163,244,254,412,
69,162,172,243,180,313,323,446,208,324,350,483,368,524,
545,761,71,177,194,317,210,349,363,5 10,222,372,388,
550,414,581,615,784,234,405,423,604,451,634,655,844,
467,651,690,900,697,918, 966,1351,111,209,218,367,228,
389,413,571,267,425,443,623,469,667,684,862,287,445,
475,653,50 9,696,709,910,532,710,718,972,799,1011,1062,
1376,310,508,528,715,555,742,760,982,583,798,81 7,1041,
872,1090,1136,1455,622,846,887,1137,933,1151,1219,
1503,1015,1240,1300,1575,1343,163 3,1710,2093,114,225,
245,422,285,444,471,670,299,480,511,711,536,724,729,
975,334,529,554,730, 582,793,813,1028,621,842,871,1105,
911,1147,1198,1460,364,570,614,816,664,867,863,1148,
679,9 04,917,1178,983,1238,1256,1577,723,934,1013,
1251,1029,1315,1348,1650,1071,1374,1418,1717, 1513,
1805,1899,2271,379,631,666,906,708,922,986,1241,787,
1014,1056,1338,1059,1350,1388,17 05,803,1057,1070,
1381,1149,1405,1493,1800,1212,1512,1539,1860,1620,
1940,1990,2351,843,116 7,1196,1461,1257,1515,1572,
1877,1301,1608,1651,1968,1711,2064,2137,2489,1424,
1661,1736,20 71,1819,2169,2202,2641,1884,2241,2321,
2724,2414,2856,2971,3371,135,270,293,481,332,525,55
1,772,346,559,603,795,630,833,880,1199,374,616,669,861,
691,921,912,1216,713,946,1002,1288,1 050,1318,1357,
1687,452,680,714,920,786,981,1019,1339,794,1051,1061,
1370,1091,1389,1429,17 88,804,1074,1144,1428,1205,
1492,1535,1861,1254,1581,1609,1941,1660,1991,2090,
2462,468,785, 792,1040,805,1058,1104,1404,845,1150,
1179,1472,1239,1530,1603,1927,1012,1204,1258,1538,13
02,1631,1674,1970,1391,1675,1737,2080,1828,2168,2185,
2640,1060,1314,1380,1632,1425,1713,1 790,2092,1495,
1804,1863,2184,1926,2262,2350,2735,1557,1885,1945,
2320,2032,2359,2455,2876, 2124,2475,2547,2923,2604,
3113,3139,3717,474,807,832,1197,980,1218,1255,1580,
1023,1281,131 9,1648,1383,1704,1767,2091,1063,1356,
1419,1707,1462,1791,1866,2173,1531,1906,1862,2237,19
71,2345,2413,2778,1213,1453,1489,1818,1576,1876,1944,
2276,1629,1948,2017,2388,2081,2415,2 492,2922,1712,
2065,2136,2463,2203,2587,2605,3017,2263,2689,2734,
3209,2857,3258,3302,3616, 1303,1494,1628,1949,1693,
2016,2070,2454,1743,2150,2172,2546,2240,2588,2725,
3138,1789,223 6,2277,2688,2412,2742,2743,3259,2488,
2877,2897,3303,2995,3472,3538,4076,1936,2358,2389,27
79,2493,2896,2970,3353,2589,3016,3112,3473,3242,3539,
3822,4502,2642,3208,3243,3617,3352,3 716,3823,4503,
3370,3934,3935,5042,4077,5043,5378,5379,64,65,98,153,
99,168,193,300,124,192, 215,330,246,355,361,590,125,
214,230,354,269,390,441,610,290,440,426,643,487,689,
717,962,152, 247,279,406,291,435,465,649,331,485,513,
700,573,740,771,1021,360,519,588,751,609,796,819,1 068,
642,841,883,1164,908,1200,1252,1583,169,268,320,484,
344,512,572,721,380,589,526,776,62 9,801,855,1101,434,
579,637,840,683,864,903,1180,703,914,968,1242,1020,
1276,1340,1685,479,6 48,701,902,741,948,1001,1273,790,
1008,1055,1312,1103,1369,1426,1786,853,1093,1169,
1379,118 2,1427,1491,1869,1247,1511,1558,1921,1623,
1966,2084,2552,231,301,345,578,391,608,611,854,4
54,636,686,885,716,931,951,1272,486,687,720,949,770,
1000,1052,1316,800,1053,1100,1364,1177, 1407,1477,
1831,546,738,791,1017,808,1054,1116,1392,884,1165,
1183,1431,1246,1510,1537,1920, 950,1215,1274,1519,
1313,1613,1625,1964,1372,1662,1738,2035,1806,2126,
2273,2553,562,797,8 59,1119,930,1181,1245,1517,963,
1248,1278,1582,1341,1624,1684,2019,1042,1317,1365,
1638,143 0,1714,1802,2138,1451,1816,1878,2208,1938,
2282,2348,2795,1115,1393,1442,1741,1528,1830,18
87,2260,1622,1897,1965,2306,2066,2357,2479,2933,1683,
1988,2085,2426,2114,2533,2601,3019,2 269,2610,2691,
3008,2777,3136,3285,3762,278,381,407,682,455,688,732,
985,464,733,777,1024,81 0,1102,1140,1475,527,788,811,
1143,865,1176,1207,1476,909,1206,1253,1555,1336,1615,
1634,195 1,556,858,915,1163,970,1236,1275,1614,1016,
1290,1344,1636,1368,1708,1763,2112,1009,1366,1 395,
1699,1450,1803,1845,2209,1532,1893,1939,2281,1975,
2347,2453,2899,591,961,971,1282,103 1,1358,1394,1694,
1069,1417,1441,1787,1500,1868,1896,2279,1249,1478,
1529,1871,1600,1924,19 74,2322,1672,1997,2088,2424,
2141,2532,2603,3004,1347,1578,1637,1950,1698,2034,
2094,2490,1 784,2133,2171,2545,2274,2653,2727,3071,
1879,2272,2283,2692,2323,2780,2669,3157,2466,2882,
2934,3325,2959,3459,3558,3920,628,1025,1043,1449,
1237,1509,1536,1892,1283,1554,1601,1943, 1663,1999,
2087,2494,1345,1639,1697,2018,1740,2095,2143,2555,
1817,2175,2243,2649,2307,269 5,2794,3177,1474,1709,
1762,2142,1844,2214,2285,2670,1942,2286,2349,2792,
2467,2763,2903,33 27,2023,2408,2522,2883,2584,2958,
3006,3398,2654,3011,3010,3536,3158,3593,3667,4119,
1559,1 807,1894,2287,1998,2356,2452,2833,2089,2491,
2534,2935,2609,2969,3009,3457,2148,2591,2671, 3005,
2732,3018,3159,3594,2832,3211,3256,3674,3362,3806,
3906,4323,2280,2693,2786,3176,290 2,3178,3354,3699,
2932,3345,3420,3834,3516,3949,4092,4462,2992,3474,
3562,3979,3646,4095,40 29,4594,3760,4139,4263,4758,
4327,4834,4951,5254,321,427,478,702,518,789,818,1117,
547,852,8 82,1142,929,1202,1214,1610,557,928,960,1201,
984,1359,1373,1682,1088,1378,1448,1785,1508,1 846,
1895,2305,563,969,1030,1367,1092,1443,1479,1822,1118,
1516,1552,1904,1612,1967,2021,23 64,1168,1579,1627,
1996,1695,2086,2127,2476,1715,2113,2186,2590,2201,
2648,2694,3287,739,10 89,1114,1501,1162,1553,1611,
1947,1243,1635,1673,2069,1719,2135,2174,2520,1279,
1681,1761,2 115,1821,2200,2211,2606,1870,2212,2242,
2726,2399,2781,2878,3344,1346,1820,1864,2239,1923,
2284,2304,2760,1973,2398,2461,2823,2544,2900,2956,
3421,2068,2478,2585,2957,2655,2999,311 5,3517,2785,
3118,3212,3595,3257,3697,3820,4321,750,1141,1203, 1626,1277,1680,1739,2140,133 7,1764,1823,2213,1886,2268,2275,2733,1416,1865,1922,2278,1972,2391,2427,2820,2067,2472,25 35,2921,2607,2993,3052,3422,1490,1946,2020,2460,2132,2523,2521,2996,2149,2600,2611,3040,2 761,3116,3146,3619,2261,2668,2783,3137,2821,3221,3284,3718,2881,3326,3392,3835,3519,3951, 4093,4463,1533,2083,2134,2602,2210,2652,2762,3119,2367,2784,2858,3240,2873,3286,3360,380 5,2409,2859,2880,3347,2997,3369,3505,3948,3068,3518,3561,4024,3666,4128,4198,4633,2473,30 07,3042,3423,3147,3537,3592,4031,3213,3664,3719,4138,3821,4264,4325,4789,3394,3753,3904,4 267,3977,4385,4426,4949,4078,4447,4593,5092,4692,5164,5253,5743,809,1244,1291,1765,1406,1847,1905,2346,1440,1925,1989,2397,2082,2465,2554,3053,1518,2022,2139,2495,2187,2651,2608, 3070,2215,2690,2776,3210,2834,3222,3301,3761,1696,2170,2238,2650,2366,2741,2787,3241,239 6,2835,2875,3324,2901,3361,3397,3922,2410,2898,2968,3396,3055,3504,3559,4025,3144,3645,36 65,4129,3752,4199,4282,4756,1718,2365,2390,2822,2411,2872,2920,3368,2477,2998,3041,3458,3 117,3556,3647,4117,2782,3054,3156,3560,3214,3675,3754,4196,3363,3755,3905,4280,3978,4384, 4425,4948,2874,3220,3346,3696,3395,3833,3932,4320,3507,3950,4027,4424,4116,4460,4632,509 5,3563,4079,4131,4592,4262,4635,4695,5166,4322,4759,4833,5219,4930,5429,5431,5995,1760,24 25,2464,3043,2740,3114,3145,3644,2793,3179,3223,3698,3355,3804,3921,4283,2879,3300,3393,3 807,3456,3933,4028,4387,3557,4094,4026,4445,4197,4595,4675,5110,3069,3399,3475,3976,3618,4030,4130,4500,3673,4136,4261,4672,4281,4693,4790,5218,3832,4265,4324,4757,4427,4835,493 1,5377,4461,5041,5094,5537,5165,5640,5642,5992,3215,3506,3672,4137,3763,4260,4266,4694,39 07,4326,4386,4832,4446,4928,5093,5430,3923,4444,4501,5040,4674,5108,5109,5641,4788,5167,5 217,5643,5255,5868,5870,6884,4118,4634,4673,5111,4791,5216,5252,5741,4929,5376,5428,5869, 5538,5871,6412,6886,4950,5536,5539,5993,5740,5994,6413,6887,5742,6414,6415,7140,6885,714 1,7142,7143,128,129,130,199,131,248,251,428,196,250,305,460,336,493,495,766,197,304,306,492, 339,522,567,782,386,566,542,837,645,877,925,1210,198,337,385,540,387,565,587,839,461,627,6 47,896,745,940,977,1293,494,673,764,943,781,1006,1067,1326,836,1077,1111,1444,1134,1482,15 40,1933,249,338,430,626,462,646,744,927,520,765,674,978,821,1045,1097,1361,564,747,823,107 6,849,1108,1133,1458,899,1152,1220,1506,1292,1592,1654,2073,625,838,897,1132,941,1158,1235, 1569,990,1284,1325,1606,1385,1691,1772,2180,1079,1355,1447,1729,1480,1773,1841,2255,1525, 1859,1910,2297,1987,2384,2468,2978,307,429,463,746,523,780,783,1096,584,822,850,1131,924,1157,1195,1568,644,851,926,1159,976,1234,1322,1616,1044,1323,1360,1678,1457,1769,1799,223 5,694,938,991,1287,1046,1324,1396,1730,1130,1445,1481,1775,1524,1858,1891,2296,1194,1499, 1570,1875,1607,1963,1993,2360,1702,2038,2130,2447,2188,2530,2687,2979,706,1007,1099,1399, 1156,1459,1523,1873,1211,1526,1594,1932,1655,1992,2072,2441,1320,1617,1679,2036,1774,2122,2182,2556,1793,2190,2258,2614,2308,2720,2766,3263,1387,1731,1780,2145,1880,2234,2265,26 82,1986,2293,2361,2754,2448,2791,2927,3387,2047,2402,2469,2868,2528,2973,3021,3479,2685,3 056,3111,3470,3199,3610,3757,4284,384,521,541,848,585,876,936,1233,586,937,979,1294,1064,1 384,1400,1797,675,988,1065,1403,1109,1456,1497,1798,1135,1496,1541,1909,1618,1985,2008,2355,704,1098,1153,1421,1222,1504,1571,1984,1286,1604,1656,2012,1690,2118,2153,2526,1285,16 88,1733,2117,1792,2183,2245,2615,1882,2267,2309,2703,2401,2765, 2871,3351,767,1209,1223,15 96,1299,1676,1732,2074,1327,1771,1779,2181,1842,2254,2292,2699,1527,1826,1881,2257,1934,2 302,2400,2756,2042,2405,2498,2862,2559,2972,3023,3460,1659,1928,2013,2354,2116,2446,2500, 2944,2158,2549,2565,2977,2696,3063,3165,3565,2259,2686,2721,3152,2757,3218,3107,3623,289 0,3348,3388,3819,3407,3961,4074,4390,820,1295,1321,1783,1505,1857,1890,2266,1597,1908,193 5,2325,2039,2407,2471,2948,1657,2037,2077,2440,2144,2501,2561,2981,2191,2577,2667,3059,27 55,3155,3262,3627,1796,2119,2152,2560,2244,2644,2731,3108,2324,2736,2767,3246,2891,3195,3 367,3827,2445,2846,2954,3349,3002,3406,3466,3928,3104,3477,3476,4022,3624,4113,4165,4597,1911,2189,2288,2737,2406,2790,2870,3281,2499,2945,2974,3389,3049,3433,3471,3947,2562,301 3,3109,3461,3166,3478,3625,4114,3280,3677,3738,4190,3842,4294,4362,4813,2702,3153,3230,36 26,3366,3668,3838,4213,3386,3829,3930,4344,3998,4429,4554,4962,3434,3980,4100,4485,4134,4 559,4511,5048,4278,4645,4717,5206,4851,5294,5383,5722,431,543,624,898,672,989,1066,1397,6 95,1078,1110,1402,1155,1484,1498,1960,705,1154,1208,1483,1232,1677,1703,2046,1352,1728,17 82,2159,1856,2248,2289,2753,707,1221,1298,1689,1354,1781,1827,2206,1398,1872,1900,2294,19 62,2385,2443,2796,1446,1929,1995,2404,2075,2470,2531,2924,2123,2527,2582,3012,2613,3058,3 154,3759,939,1353,1386,1843,1420,1901,1961,2327,1507,2009,2043,2451,2129,2551,2576,2950,1 595,2045,2147,2529,2205,2612,2621,3046,2256,2622,2666,3164,2843,3219,3318,3828,1658,2204,2252,2647,2299,2730,2752,3182,2387,2842,2885,3277,2976,3358,3404,3931,2450,2926,3003,340 5,3105,3439,3567,3999,3227,3572,3700,4115,3739,4193,4338,4797,942,1401,1485,1994,1593,204 4,2131,2558,1619,2156,2207,2623,2264,2684,2697,3167,1770,2253,2298,2698,2386,2837,2869,32 72,2449,2894,2975,3385,3047,3435,3542,3944,1840,2326,2442,2884,2548,2955,2951,3436,2563,3 020,3057,3510,3183,3570,3620,4121,2683,3106,3225,3611,3273,3715,3756,4214,3323,3826,3854, 4345,4021,4441,4555,4963,1883,2459,2550,3022,2620,3062,3194,3573,2799,3226,3312,3734,331 5,3758,3840,4293,2847,3313,3322,3837,3437,3849,3993,4428,3552,4020,4091,4504,4164,4624,46 82,5055,2895,3467,3540,3945,3621,4023,4112,4517,3701,4140,4215,4644,4339,4744,4821,5233,3 888,4257,4348,4751,4459,4853,4906,5381,4528,4941,5045,5464,5150,5588,5703,6083,1047,1522,1605,2157,1768,2249,2295,2764,1778,2303,2403,2839,2458,2889,2980,3543,1874,2444,2557,294 9,2583,3061,3048,3564,2645,3110,3198,3676,3282,3730,3765,4279,2076,2564,2646,3060,2798,31 81,3231,3735,2838,3283,3317,3818,3359,3841,3893,4396,2860,3350,3432,3892,3549,3992,4075,4 505,3614,4125,4141,4625,4256,4683,4794,5198,2128,2797,2836,3276,2861,3314,3384,3848,2925, 3438,3511,3960,3571,4038,4135,4567,3224,3548,3622,4090,3702,4191,4270,4646,3843,4271,434 9,4752,4484,4852,4877,5380,3316,3714,3836,4192,3889,4341,4398,4796,3995,4440,4507,4876,45 66,4946,5054,5471,4101,4529,4629,5044,4716,5067,5195,5604,4812,5207,5287,5683,5344,5845,5 883,6341,2146,2863,2888,3541,3180,3566,3615,4124,3247,3669,3731,4212,3839,4292,4391,4795, 3319,3764,3855,4295,3946,4399,4510,4873,4039,4558,4506,4937,4647,5049,5149,5506,3553,3929,3981,4458,4120,4516,4628,4984,4189,4636,4689,5088,4753,5151,5236,5682,4340,4745,4820,51 99,4907,5295,5345,5765,4947,5421,5470,5953,5589,5998,6014,6248,3703,3994,4188,4637,4285,4 688,4750,5194,4363,4850,4872,5286,4940,5320,5465,5882,4397,4936,4985,5420,5148,5474,5475, 5999,5232,5605,5621,6015,5723,6172, 6210,6604,4596,5066,5089,5507,5237,5620,5702,6065,5321,5764,5844,6173,5966,6211,6382,6958,5382,5952,5967,6249,6064,6340,6383,6959,6082,6530,65 31,7250,6605,7251,7466,7467,692,693,878,1129,879,1192,1297,1652,1004,1296,1363,1734,1486, 1795,1825,2394,1005,1362,1422,1794,1521,1902,2041,2430,1598,2040,2010,2503,2179,2581,266 5,3150,1128,1487,1543,1930,1599,2015,2121,2525,1735,2177,2233,2616,2353,2728,2759,3245,1824,2247,2392,2739,2429,2840,2887,3320,2502,2893,2983,3464,3044,3544,3612,4127,1193,1520,1 700,2176,1776,2232,2352,2681,1888,2393,2250,2788,2457,2845,2931,3373,2014,2363,2497,2892, 2567,2952,3015,3512,2619,3050,3160,3574,3244,3640,3736,4277,2155,2524,2617,3014,2729,314 0,3197,3629,2818,3216,3299,3712,3375,3817,3890,4394,2929,3365,3469,3831,3514,3891,3983,4513,3599,4019,4102,4561,4167,4642,4784,5288,1423,1653,1777,2362,1903,2428,2431,2930,2078,2 496,2578,3001,2664,3067,3143,3628,2178,2579,2680,3141,2758,3196,3296,3728,2844,3297,3372, 3800,3509,3851,3965,4487,2290,2722,2819,3229,2864,3298,3400,3844,3000,3465,3515,3895,359 8,4018,4089,4560,3142,3555,3630,4035,3713,4161,4185,4640,3824,4258,4350,4719,4442,4814,4965,5289,2310,2841,2947,3403,3066,3513,3597,4033,3151,3608,3642,4126,3737,4184,4276,4691,3 278,3729,3801,4210,3894,4342,4430,4822,3927,4456,4518,4908,4598,4990,5052,5579,3391,3845, 3910,4361,4036,4486,4531,4944,4166,4553,4641,5014,4746,5065,5223,5685,4275,4680,4785,516 2,4810,5281,5325,5767,4961,5350,5423,5760,5505,5880,6009,6366,1542,1889,1931,2566,2079,2580,2700,3193,2120,2701,2789,3260,2866,3374,3416,3963,2251,2816,2867,3419,2953,3508,3551,3 964,3045,3550,3613,4099,3732,4163,4194,4639,2300,2946,3051,3463,3162,3568,3631,4162,3228, 3678,3740,4208,3816,4336,4367,4808,3217,3802,3847,4291,3926,4431,4497,4909,4072,4533,459 9,4989,4679,5051,5193,5623,2395,3149,3163,3670,3275,3766,3846,4286,3321,3853,3909,4395,3996,4512,4552,4987,3609,3966,4037,4515,4132,4564,4678,5046,4268,4685,4792,5160,4837,5280,5 327,5736,3743,4122,4209,4638,4290,4718,4798,5234,4392,4817,4855,5285,4966,5397,5467,5843, 4519,4964,4991,5424,5047,5508,5417,5905,5202,5618,5686,6041,5699,6171,6214,6500,2456,326 1,3279,3925,3569,4017,4088,4532,3671,4098,4133,4627,4259,4687,4787,5238,3741,4211,4289,4690,4360,4799,4839,5291,4457,4875,4943,5393,5015,5427,5578,5909,3962,4337,4366,4838,4496,4 934,5009,5418,4626,5010,5053,5576,5203,5479,5647,6043,4715,5144,5250,5619,5292,5698,5738, 6138,5398,5763,5762,6208,5906,6245,6307,6655,4103,4443,4534,5011,4686,5064,5192,5585,479 3,5235,5282,5687,5349,5701,5761,6169,4848,5323,5419,5737,5468,5766,5907,6246,5584,5955,5996,6310,6070,6378,6498,6827,4988,5425,5542,5908,5646,5910,6066,6339,5684,6045,6140,6410,6 180,6533,6648,6954,5720,6174,6242,6563,6254,6651,6601,6986,6364,6671,6727,7066,6831,7138, 7199,7406,1701,2011,2154,2618,2246,2817,2886,3401,2291,2928,2982,3418,3065,3546,3554,414 2,2301,3064,3148,3545,3192,3767,3825,4274,3356,3830,3924,4393,4016,4498,4535,5013,2311,3161,3274,3803,3364,3911,3967,4482,3402,4032,4096,4556,4160,4643,4713,5068,3468,4123,4187,4 684,4287,4786,4815,5220,4343,4809,4878,5322,4905,5392,5426,6011,2723,3357,3390,3997,3462, 4097,4143,4631,3575,4195,4269,4749,4347,4819,4874,5248,3643,4273,4365,4811,4481,4904,491 1,5346,4514,4932,4942,5466,5107,5509,5606,6044,3742,4480,4508,4939,4563,5008,5012,5476,4677,5106,5197,5583,5284,5644,5696,6141,4748,5222,5293,5697,5399,5727,5847,6181,5541,5866,5 956,6247,5997,6337,6380,6825,2738,3417,3547,4186,3641,4272,4351, 4836,3733,4388,4483,4933, 4530,4960,4967,5469,3852,4509,4562,4986,4676,5091,5163,5580,4747,5204,5283,5681,5347,572 1,5828,6142,3982,4630,4712,5196,4816,5251,5249,5724,4849,5324,5351,5824,5477,5864,5886,6251,4945,5416,5511,5881,5581,5961,6008,6342,5617,6042,6084,6411,6183,6535,6649,6955,4073,4 755,4818,5326,4910,5396,5478,5867,5071,5540,5590,5964,5601,6010,6068,6377,5145,5591,5616, 6047,5725,6081,6177,6532,5840,6182,6241,6564,6306,6664,6722,6989,5205,5739,5826,6143,588 7,6209,6244,6603,5957,6304,6343,6670,6381,6784,6829,7069,6086,6361,6496,6787,6561,6881,6938,7197,6606,6943,6985,7252,7028,7332,7405,7787,2865,3596,3679,4389,3850,4499,4557,5050,3 908,4565,4681,5105,4754,5201,5290,5829,4034,4714,4823,5239,4879,5395,5348,5842,4935,5422, 5504,5954,5586,5962,6013,6365,4288,4854,4938,5394,5070,5473,5543,5965,5104,5587,5603,604 0,5645,6069,6137,6502,5146,5622,5700,6136,5831,6176,6215,6565,5884,6253,6305,6665,6360,6723,6790,7064,4346,5069,5090,5582,5147,5600,5680,6080,5221,5726,5825,6170,5865,6212,6255,6 653,5510,5830,5904,6240,5958,6311,6362,6720,6071,6363,6497,6788,6562,6880,6937,7196,5602, 5960,6046,6336,6087,6409,6528,6824,6179,6534,6567,6936,6652,6952,6988,7255,6243,6607,666 7,6984,6726,6991,7031,7334,6826,7067,7137,7403,7194,7469,7471,7947,4364,5161,5200,5827,5472,5846,5885,6252,5577,5911,5963,6338,6067,6376,6501,6791,5607,6012,6085,6379,6168,6529,6 600,6883,6213,6650,6566,6941,6721,6987,7027,7330,5841,6139,6175,6560,6250,6602,6666,6956, 6309,6668,6725,7024,6789,7029,7070,7402,6408,6785,6828,7065,6939,7139,7195,7465,6953,724 9,7254,7537,7333,7540,7542,7944,5959,6178,6308,6669,6367,6724,6786,7030,6499,6830,6882,7136,6942,7192,7253,7470,6503,6940,6957,7248,7026,7328,7329,7541,7068,7335,7401,7543,7407,7 788,7790,8040,6654,6990,7025,7331,7071,7400,7404,7785,7193,7464,7468,7789,7538,7791,7948, 8042,7198,7536,7539,7945,7784,7946,7949,8043,7786,7950,7951,8044,8041,8045,8046,8047,256, 257,258,263,259,392,395,592,260,394,397,596,496,657,659,998,261,396,398,656,499,662,759,1034,502,758,754,1081,889,1121,1185,1550,262,497,501,752,503,757,827,1083,597,831,891,1124,993, 1224,1229,1589,658,893,996,1227,1033,1270,1331,1670,1080,1333,1415,1808,1438,1834,1956,2 377,393,498,594,830,598,890,992,1187,660,997,894,1230,1037,1309,1409,1725,756,995,1039,133 2,1085,1412,1437,1814,1127,1464,1560,1914,1588,1980,2030,2513,829,1082,1125,1436,1225,1470,1567,1977,1266,1584,1669,2006,1745,2063,2164,2632,1335,1723,1811,2101,1832,2165,2229,27 15,1953,2315,2370,2801,2419,2852,3024,3530,399,593,599,994,663,1032,1035,1408,824,1038,10 86,1435,1184,1469,1547,1976,888,1087,1186,1471,1228,1566,1666,2024,1308,1667,1724,2058,18 13,2109,2223,2675,954,1190,1267,1587,1310,1668,1748,2102,1434,1809,1833,2167,1952,2314,23 35,2800,1546,1855,1978,2319,2007,2383,2421,2848,2098,2486,2574,2963,2656,3078,3207,3531,958,1271,1411,1751,1468,1815,1919,2317,1551,1954,1982,2376,2031,2420,2512,2941,1664,2025,2 059,2484,2166,2570,2634,3084,2217,2658,2718,3130,2808,3248,3310,3811,1747,2103,2196,2593, 2328,2674,2745,3202,2418,2773,2849,3290,2964,3331,3487,3955,2511,2914,3025,3428,3076,352 5,3601,4063,3205,3636,3691,4058,3779,4202,4333,4860,500,661,753,1084,825,1120,1188,1565,826,1189,1231,1590,1328,1744,1752,2221,895,1264,1329,1755,1413,1812,1853,2222,1439,1852,19 57,2369,2026,2417,2432,2831,956,1410,1465,1757,1562,1912,1979,2416,1586,2004,2052,2480,20 62,2538,2597,3074,1585,2060,2105,2537,2216,2635,2677,3131,2330,2747,2809, 3239,2913,3309,3 431,3899,999,1549,1563,2000,1643,2056,2104,2514,1671,2111,2195,2633,2230,2714,2772,3235,1 955,2226,2329,2717,2378,2806,2912,3304,2506,2917,3030,3414,3087,3524,3603,4048,2055,2372, 2481,2830,2536,2962,3032,3496,2626,3081,3097,3529,3232,3651,3725,4153,2719,3206,3249,370 8,3305,3786,3663,4219,3450,3896,3968,4379,4003,4537,4622,4926,1036,1591,1665,2199,1913,23 13,2334,2746,2001,2368,2379,2825,2487,2919,3027,3500,2053,2485,2517,2940,2592,3033,3093,3 577,2659,3101,3191,3639,3291,3711,3810,4223,2220,2539,2596,3092,2676,3184,3255,3688,2824,3268,3311,3798,3451,3771,3919,4383,2961,3410,3522,3897,3582,4002,4054,4492,3660,4061,406 0,4602,4220,4669,4741,5169,2371,2657,2768,3269,2918,3330,3430,3865,3031,3497,3526,3969,36 33,4009,4059,4527,3094,3589,3689,4049,3726,4062,4221,4670,3864,4241,4318,4766,4414,4882,4 918,5365,3238,3709,3794,4222,3918,4232,4406,4777,3954,4401,4494,4892,4582,5001,5122,5534, 4010,4568,4660,5029,4722,5131,5075,5624,4846,5209,5273,5770,5407,5858,5915,6234,595,755,8 28,1126,892,1265,1330,1749,955,1334,1414,1754,1467,1836,1854,2380,957,1466,1548,1835,1564, 2057,2099,2510,1720,2100,2198,2627,2312,2708,2769,3289,959,1561,1642,2061,1722,2197,2227, 2662,1750,2316,2340,2774,2382,2853,2943,3336,1810,2373,2423,2916,2515,3026,3079,3484,257 1,3075,3122,3588,3129,3638,3710,4335,1191,1721,1746,2231,1756,2341,2381,2827,1915,2433,2507,2967,2573,3083,3100,3502,1983,2509,2595,3077,2661,3128,3173,3606,2716,3174,3190,3724,3 383,3787,3878,4400,2054,2660,2712,3187,2803,3254,3288,3750,2855,3382,3441,3857,3528,3914, 4000,4495,2966,3486,3583,4001,3661,4015,4155,4583,3791,4176,4252,4671,4319,4769,4886,534 1,1226,1753,1837,2422,1981,2508,2575,3086,2027,2624,2663,3175,2744,3204,3233,3727,2110,2713,2802,3234,2854,3377,3429,3812,2965,3482,3527,3953,3607,4011,4086,4524,2228,2826,2942,3 440,3080,3523,3503,4012,3095,3600,3637,4066,3751,4174,4216,4697,3203,3662,3789,4203,3813, 4299,4332,4778,3887,4382,4450,4893,4601,5005,5123,5535,2331,2991,3082,3602,3172,3650,377 0,4177,3339,3790,3872,4314,3875,4334,4412,4881,3411,3873,3886,4405,4013,4437,4573,5000,4148,4600,4651,5060,4740,5172,5230,5631,3483,4055,4084,4525,4217,4603,4668,5085,4253,4728,4 779,5208,4887,5304,5385,5777,4464,4805,4912,5311,5019,5433,5458,5913,5100,5497,5609,5980, 5694,6104,6219,6539,1311,1918,2005,2625,2108,2709,2775,3308,2194,2807,2915,3379,2990,344 9,3576,4087,2318,2960,3085,3501,3123,3649,3632,4152,3185,3690,3778,4240,3866,4302,4357,4847,2516,3096,3186,3648,3338,3749,3795,4315,3378,3867,3877,4378,3915,4413,4469,4980,3412,3 898,4008,4468,4109,4572,4623,5061,4206,4701,4729,5173,4804,5231,5338,5750,2572,3337,3376, 3856,3413,3874,3952,4436,3485,4014,4067,4536,4175,4618,4723,5143,3788,4108,4218,4650,425 4,4767,4826,5210,4415,4827,4913,5328,5028,5432,5449,5912,3876,4298,4404,4768,4465,4889,4982,5340,4575,5004,5063,5448,5142,5526,5630,5991,4661,5101,5177,5608,5272,5639,5735,6124,5 364,5771,5811,6163,5876,6329,6347,6773,2594,3415,3448,4085,3748,4154,4207,4700,3799,4233, 4303,4776,4407,4880,4927,5339,3879,4356,4451,4883,4526,4983,5074,5437,4619,5130,5062,549 3,5211,5625,5693,6034,4149,4493,4569,5018,4696,5084,5176,5548,4765,5180,5265,5660,5329,5695,5780,6162,4888,5305,5384,5751,5459,5859,5877,6273,5527,5945,5990,6417,6105,6450,6478,6 712,4255,4574,4764,5181,4861,5264,5310,5734,4919,5406,5436,5810,5496,5860,5981,6346,4981, 5492,5549,5944,5692,6006,6007,6451,5776,6125,6153,6479,6235,6616,6642,6996,5168,5638,566 1,6035,5781,6152,6218,6513,5861,6272,6328,6617,6442,6643,6838,7238,5914,6416,6443,6713,6512,6772,6839,7239,6538,6910,6911,7506,6997,7507,7642,7643,952,953,1122,1433,1123,1544,164 1,2028,1268,1640,1727,2106,1838,2219,2225,2910,1269,1726,1758,2218,1917,2342,2505,2938,20 02,2504,2434,3035,2631,3121,3189,3706,1432,1839,1959,2374,2003,2483,2569,3073,2107,2629,2 673,3132,2829,3252,3307,3797,2224,2679,2908,3271,2937,3380,3443,3884,3034,3481,3579,4052,3604,4104,4204,4703,1545,1916,2096,2628,2192,2672,2828,3201,2332,2909,2710,3328,2989,340 9,3495,3941,2482,2851,3029,3480,3099,3520,3591,4068,3135,3634,3720,4178,3796,4228,4316,48 45,2599,3072,3133,3590,3253,3692,3777,4225,3342,3784,3871,4296,3943,4377,4466,4978,3493,3 917,4057,4403,4070,4467,4571,5077,4183,4591,4662,5137,4743,5190,5332,5816,1759,2029,2193, 2850,2343,2936,2939,3494,2518,3028,3102,3581,3188,3659,3695,4224,2630,3103,3200,3693,330 6,3776,3868,4300,3408,3869,3940,4372,4065,4439,4541,5031,2770,3250,3343,3793,3424,3870,39 72,4416,3580,4053,4071,4471,4182,4590,4649,5136,3694,4151,4226,4607,4297,4733,4761,5188,4 380,4806,4914,5275,5006,5366,5545,5817,2810,3381,3499,3975,3658,4069,4181,4605,3707,4200, 4230,4702,4317,4760,4844,5267,3858,4301,4373,4774,4470,4890,5002,5386,4491,5016,5086,5480,5170,5554,5628,6059,3971,4417,4474,4917,4616,5030,5103,5524,4742,5121,5189,5594,5306,56 37,5775,6189,4843,5228,5333,5706,5354,5805,5873,6275,5533,5890,5947,6264,6033,6344,6469,6 810,1958,2333,2375,3098,2519,3120,3236,3769,2568,3237,3329,3808,3426,3942,4004,4539,2711, 3340,3427,4007,3521,4064,4111,4540,3605,4110,4205,4659,4312,4735,4770,5183,2804,3498,3635, 4051,3722,4172,4227,4734,3792,4242,4328,4772,4376,4884,4923,5352,3785,4374,4419,4867,449 0,5003,5037,5481,4620,5117,5171,5553,5215,5627,5733,6155,2911,3705,3723,4234,3815,4358,44 18,4862,3885,4449,4473,4979,4580,5076,5120,5551,4201,4542,4617,5079,4720,5140,5214,5610,4 824,5245,5336,5704,5389,5804,5875,6260,4331,4698,4773,5182,4866,5274,5342,5778,4976,5373, 5435,5809,5546,5925,5983,6319,5087,5544,5555,5948,5611,6036,5933,6373,5754,6130,6190,6493,6207,6595,6678,6896,2988,3809,3859,4489,4173,4589,4648,5116,4235,4658,4721,5175,4807,52 47,5335,5782,4329,4775,4865,5266,4916,5343,5391,5819,5017,5439,5499,5921,5595,5951,6058,6 393,4538,4885,4922,5390,5036,5486,5557,5934,5174,5558,5629,6056,5755,6027,6159,6495,5271, 5688,5794,6131,5856,6206,6262,6558,5926,6267,6266,6640,6374,6697,6747,7023,4663,5007,5118,5559,5246,5636,5732,6089,5337,5779,5806,6191,5889,6217,6265,6593,5404,5863,5935,6261,59 88,6274,6375,6698,6088,6419,6448,6754,6522,6822,6890,7147,5552,5949,6050,6392,6158,6394,6 514,6763,6188,6505,6580,6850,6636,6917,7004,7222,6232,6618,6682,6931,6742,7007,6973,7290, 6808,7051,7103,7374,7151,7418,7479,7606,2097,2435,2598,3134,2678,3341,3442,3973,2771,3492,3578,4006,3657,4106,4150,4730,2805,3656,3704,4105,3768,4359,4381,4842,3912,4402,4488,49 77,4588,5038,5119,5593,2811,3721,3814,4375,3916,4475,4543,5022,3974,4604,4656,5128,4732,5 191,5269,5652,4056,4699,4763,5244,4863,5334,5367,5772,4891,5353,5450,5862,5457,5920,5950, 6471,3251,3913,3970,4581,4050,4657,4731,5179,4179,4771,4825,5309,4895,5375,5438,5792,4231,4841,4921,5355,5021,5456,5483,5878,5078,5484,5498,5982,5671,6037,6126,6504,4330,5020,50 72,5495,5139,5556,5592,6024,5213,5670,5749,6079,5808,6156,6204,6581,5308,5774,5857,6205,5 927,6239,6331,6637,6049,6334,6420,6699,6449,6761,6836,7145,3270,4005,4107, 4762,4229,4840,4915,5388,4313,4924,5023,5485,5102,5532,5547,5989,4448,5073,5138,5550,5212,5663,5707,6076,5307,5768,5807,6161,5879,6233,6292,6582,4570,5178,5268,5748,5372,5795,5793,6236,5405,5872,5891,6280,6025,6332,6354,6715,5525,5932,6039,6345,6077,6429,6468,6774,6129,6494,6552,6851,6639,6919,7005,7223,4621,5331,5374,5874,5482,5924,6026,6335,5655,6048,6106,6440,6121,6470,6520,6821,5689,6107,6128,6507,6237,6537,6625,6916,6316,6638,6681,6968,6746,7040,7086,7305,5769,6263,6282,6583,6355,6641,6696,6975,6421,6744,6775,7050,6837,7104,7149,7381,6554,6801,6888,7107,6929,7177,7202,7477,6998,7215,7289,7532,7348,7564,7605,7775,3425,4180,4243,4925,4438,5039,5129,5626,4472,5141,5229,5669,5330,5753,5818,6293,4606,5270,5387,5783,5451,5923,5888,6318,5487,5946,6032,6418,6090,6430,6477,6809,4864,5434,5494,5922,5654,6005,6051,6441,5668,6091,6123,6492,6157,6521,6557,6898,5690,6154,6216,6556,6295,6624,6679,6969,6352,6741,6745,7041,6800,7087,7122,7372,4894,5653,5662,6078,5691,6120,6160,6536,5773,6238,6281,6594,6333,6676,6743,7021,6038,6294,6372,6680,6422,6755,6802,7084,6523,6803,6889,7120,6930,7176,7201,7476,6122,6428,6506,6760,6555,6849,6908,7144,6627,6918,6971,7200,7020,7220,7304,7535,6683,6999,7043,7288,7102,7307,7351,7566,7146,7375,7417,7587,7450,7669,7671,7851,4920,5705,5752,6283,6004,6330,6353,6740,6057,6395,6431,6762,6515,6820,6897,7123,6127,6476,6553,6823,6592,6909,6972,7179,6677,7006,6970,7213,7085,7291,7323,7550,6317,6559,6619,6928,6714,6974,7042,7236,6753,7048,7101,7320,7121,7349,7382,7586,6848,7105,7148,7373,7203,7419,7451,7641,7221,7505,7534,7697,7565,7736,7738,7848,6423,6626,6752,7049,6811,7100,7106,7350,6891,7150,7178,7416,7214,7448,7533,7670,6899,7212,7237,7504,7322,7548,7549,7737,7380,7567,7585,7739,7607,7812,7814,8068,7022,7306,7321,7551,7383,7584,7604,7773,7449,7640,7668,7813,7698,7815,7980,8070,7478,7696,7699,7849,7772,7850,7981,8071,7774,7982,7983,8116,8069,8117,8118,8119,1304,1305,1306,1647,1307,1848,1851,2436,1644,1850,2049,2540,2160,2637,2639,3294,1645,2048,2050,2636,2163,2706,2815,3334,2338,2814,2750,3453,3037,3533,3653,4146,1646,2161,2337,2748,2339,2813,2907,3455,2541,2987,3039,3584,3265,3684,3745,4245,2638,3089,3292,3687,3333,3782,3883,4310,3452,3901,3959,4476,3990,4546,4652,5157,1849,2162,2438,2986,2542,3038,3264,3655,2704,3293,3090,3746,3445,3861,3937,4369,2812,3267,3447,3900,3489,3956,3989,4522,3587,4040,4156,4586,4244,4704,4782,5313,2985,3454,3585,3988,3685,4046,4171,4665,3774,4236,4309,4726,4409,4859,4956,5444,3903,4355,4479,4897,4544,4957,5033,5519,4613,5059,5134,5569,5227,5656,5756,6226,2051,2437,2543,3266,2707,3332,3335,3936,2904,3446,3490,3987,3652,4045,4083,4664,3036,3491,3654,4047,3744,4170,4306,4736,3860,4307,4368,4830,4521,4953,4999,5491,3126,3682,3775,4239,3862,4308,4420,4898,3986,4477,4545,4959,4612,5058,5115,5568,4082,4579,4666,5083,4727,5187,5241,5648,4870,5278,5370,5719,5452,5802,5943,6227,3170,3783,3939,4423,4044,4523,4611,5081,4147,4614,4706,5156,4783,5240,5312,5713,4304,4737,4831,5276,4958,5362,5446,5820,4993,5454,5522,5894,5596,5976,6030,6455,4411,4899,4972,5401,5096,5490,5529,5938,5226,5565,5649,6018,5728,6055,6167,6547,5303,5674,5757,6116,5800,6221,6277,6623,5941,6296,6327,6614,6407,6706,6805,7124,2336,2705,2749,3488,2905,3532,3680,4169,2906,3681,3747,4246,3880,4408,4432,4997,3091,3772,3881,4435,3957,4520,4577,4998,3991,4576,4653,5133,4738,5225,5256,5635,3168,3938,4041,4453,4158,4584,4667,5224,4238,4724,4800,5260,4858,5358,5409,5798,4237,4856,4901,5357,4992,5447,5501,5895,5098,5531,5597,5975,5673,6029,6119,6511,3295,4145,4159,4708,4251,4828,4900,5314,4311,4955,4971,5445,5034,5518,5564,5971,4615,5026,5097,5521,5158,5574,5672,6020,5298,5677,5786,6110,5823,6220,6279,6596,4803,5152,5261,5634,5356,5718,5788,6192,5414,5813,5837,6225,5968,6303,6389,6685,5523,5942,5977,6368,6021,6426,6323,6719,6146,6508,6548,6835,6575,6921,6994,7182,3444,4247,4305,4975,4585,5057,5114,5530,4709,5132,5159,5613,5279,5679,5759,6196,4801,5277,5317,5712,5400,5789,5833,6229,5455,5849,5931,6299,6019,6371,6454,6731,4996,5359,5408,5832,5500,5916,5987,6324,5612,6000,6031,6446,6147,6403,6527,6843,5717,6102,6202,6509,6258,6574,6610,6904,6320,6621,6620,6966,6728,7017,7061,7293,5135,5453,5560,6001,5678,6054,6118,6465,5787,6193,6222,6549,6289,6585,6615,6915,5834,6269,6325,6597,6390,6622,6729,7018,6464,6757,6794,7078,6858,7134,7170,7397,5974,6369,6438,6730,6526,6748,6854,7093,6546,6845,6906,7160,6950,7205,7274,7482,6586,6932,7012,7229,7046,7279,7247,7512,7118,7317,7357,7582,7427,7622,7647,7762,2439,2751,2984,3586,3088,3773,3882,4421,3127,3902,3958,4434,4043,4548,4578,5184,3169,4042,4144,4547,4168,4829,4871,5302,4352,4896,4974,5415,5056,5512,5561,6017,3171,4157,4250,4857,4354,4973,5027,5462,4422,5080,5124,5566,5186,5657,5715,6060,4478,5153,5243,5676,5315,5758,5803,6164,5363,5799,5854,6268,5893,6298,6370,6807,3683,4353,4410,5035,4452,5125,5185,5615,4587,5257,5299,5731,5369,5815,5848,6198,4707,5301,5403,5801,5461,5892,5901,6286,5520,5902,5930,6388,6099,6427,6486,6844,4802,5460,5516,5919,5571,5986,6016,6398,5659,6098,6133,6461,6224,6518,6572,6907,5730,6166,6259,6573,6321,6591,6687,6951,6435,6692,6764,7019,6795,7081,7154,7389,3686,4433,4549,5242,4705,5300,5371,5822,4739,5412,5463,5903,5528,5940,5969,6391,4954,5517,5570,5970,5658,6093,6117,6456,5729,6150,6223,6545,6287,6587,6646,6912,5032,5614,5714,6132,5812,6203,6199,6588,5835,6276,6297,6630,6399,6690,6716,7033,5939,6322,6433,6707,6457,6771,6804,7094,6491,6842,6870,7161,6965,7209,7275,7483,5099,5747,5814,6278,5900,6302,6402,6693,6063,6434,6480,6782,6483,6806,6856,7133,6103,6481,6490,6853,6589,6865,6945,7204,6672,6964,7003,7240,7060,7296,7338,7519,6151,6611,6644,6913,6717,6967,7016,7261,6765,7052,7095,7316,7155,7360,7413,7593,6872,7097,7164,7367,7219,7429,7442,7645,7264,7461,7509,7672,7558,7716,7759,7883,3863,4610,4725,5413,4952,5513,5567,6028,4970,5575,5675,6095,5746,6145,6228,6647,5082,5716,5821,6197,5855,6301,6288,6684,5917,6326,6406,6756,6466,6778,6813,7119,5316,5836,5918,6300,6062,6397,6439,6783,6094,6467,6485,6834,6519,6857,6877,7188,6108,6510,6584,6876,6661,6944,6995,7241,6710,7037,7053,7297,7096,7339,7386,7574,5368,6061,6092,6460,6109,6482,6544,6864,6165,6590,6631,6920,6691,6982,7047,7287,6432,6660,6718,7002,6766,7079,7110,7318,6859,7111,7165,7368,7228,7428,7437,7644,6484,6770,6852,7080,6873,7157,7190,7388,6947,7208,7243,7436,7286,7474,7518,7679,7013,7265,7301,7508,7356,7523,7571,7724,7396,7583,7615,7747,7632,7805,7819,7957,5402,6111,6144,6645,6396,6686,6711,7036,6447,6749,6779,7092,6855,7132,7183,7387,6487,6812,6871,7135,6914,7191,7246,7433,6983,7278,7242,7457,7319,7513,7557,7690,6673,6905,6933,7218,7032,7260,7300,7488,7077,7308,7345,7528,7369,7559,7596,7746,7156,7361,7412,7575,7443,7623,7633,7781,7475,7661,7678,7833,7717,7854,7862,7928,6767,6946,7076,7309,7125,7344,7366,7570,7171,7426,7432,7614,7460,7624,7673,7818,7189,7456, 7489,7660,7556,7682,7683,7855,7592,7725,7733,7863,7763,7900,7914,8012,7292,7522,7529,7691,7597,7732,7758,7873,7625,7780,7804,7901,7846,7915,79 74,8086,7646,7832,7847,7929,7872,7956,7975,8087,7882,7994,7995,8130,8013,8131,8154,8155,3 124,3125,3534,3985,3535,4080,4249,4780,3780,4248,4371,4902,4550,4995,5025,5666,3781,4370, 4454,4994,4609,5126,5297,5710,4710,5296,5258,5791,5443,5853,5929,6358,3984,4551,4655,5154,4711,5263,5361,5797,4903,5441,5489,5896,5633,5984,6023,6445,5024,5503,5664,6003,5709,60 96,6135,6488,5790,6149,6231,6608,6284,6656,6708,7039,4081,4608,4868,5440,4968,5488,5632,5 937,5112,5665,5514,6052,5745,6101,6187,6541,5262,5651,5785,6148,5839,6200,6271,6632,5899, 6290,6384,6694,6444,6736,6792,7117,5411,5796,5897,6270,5985,6348,6405,6733,6074,6424,6475,6768,6543,6833,6874,7186,6185,6525,6613,6847,6634,6875,6935,7257,6703,6963,7014,7281,70 63,7314,7376,7616,4455,4781,4969,5650,5127,5708,5711,6186,5318,5784,5850,6257,5928,6315,6 351,6732,5442,5851,5936,6349,6022,6404,6472,6776,6100,6473,6540,6816,6629,6867,6925,7231, 5562,5978,6075,6437,6112,6474,6568,6860,6256,6609,6635,6879,6702,6962,7001,7280,6350,6675,6734,6979,6769,7057,7073,7312,6840,7098,7166,7359,7210,7398,7485,7617,5598,6097,6195,65 71,6314,6633,6701,6977,6359,6704,6738,7038,6793,7072,7116,7347,6462,6777,6817,7090,6878,7 158,7206,7414,6903,7216,7262,7444,7294,7494,7516,7707,6551,6861,6894,7169,6980,7230,7267, 7472,7062,7273,7313,7502,7362,7521,7591,7749,7115,7336,7377,7562,7394,7609,7629,7783,7481,7638,7663,7776,7689,7816,7857,7966,4654,5113,5155,5838,5319,5852,5972,6401,5360,5973,60 53,6452,6114,6542,6576,6923,5515,6072,6115,6579,6201,6628,6663,6924,6285,6662,6709,7011,6 780,7059,7082,7311,5572,6194,6291,6599,6386,6688,6735,7058,6436,6758,6796,7088,6832,7152, 7175,7392,6425,6818,6863,7131,6902,7207,7233,7445,6992,7269,7295,7493,7327,7515,7569,7735,5667,6357,6387,6750,6459,6814,6862,7126,6489,6869,6893,7187,6948,7256,7272,7491,6705,69 26,6981,7259,7044,7284,7326,7510,7108,7341,7384,7560,7421,7608,7631,7768,6799,7034,7089,7 310,7130,7358,7390,7594,7184,7409,7431,7613,7486,7653,7675,7803,7263,7484,7495,7664,7511, 7692,7657,7825,7578,7730,7750,7865,7755,7899,7918,7988,5744,6453,6463,6901,6689,6961,7000,7268,6751,7010,7045,7299,7099,7343,7379,7598,6797,7091,7129,7346,7168,7391,7423,7619,72 17,7435,7463,7649,7503,7667,7706,7829,6922,7153,7174,7422,7232,7454,7497,7658,7298,7498,7 517,7704,7579,7687,7743,7867,7355,7552,7602,7731,7620,7754,7770,7890,7654,7779,7778,7912, 7826,7925,7939,8023,7015,7211,7270,7499,7342,7520,7568,7713,7385,7595,7610,7751,7637,7757,7777,7897,7424,7627,7659,7769,7676,7782,7827,7926,7712,7835,7852,7942,7878,7970,7986,80 59,7492,7665,7702,7828,7742,7830,7874,7955,7748,7869,7892,7978,7908,7997,8016,8082,7760,7 902,7922,8003,7934,8019,8009,8090,7964,8031,8039,8106,8063,8114,8127,8150,4869,5259,5410, 5898,5502,6073,6134,6569,5563,6184,6230,6578,6313,6658,6674,7054,5573,6312,6356,6657,6400,6815,6841,7114,6516,6846,6900,7185,6960,7234,7271,7501,5599,6385,6458,6819,6524,6895,69 27,7226,6570,6976,7008,7276,7056,7315,7353,7524,6612,7035,7075,7340,7127,7378,7399,7588,7 159,7393,7438,7626,7441,7648,7666,7859,5979,6517,6550,6949,6598,7009,7055,7303,6695,7083, 7109,7365,7163,7411,7434,7600,6739,7113,7173,7395,7225,7440,7447,7634,7258,7452,7462,7674,7547,7693,7726,7868,6798,7224,7244,7459,7283,7496,7500,7684,7325,7546,7573,7711,7612,77 40,7752,7893,7364,7590,7621,7753,7655,7767,7807,7909,7701,7810, 7836,7927,7853,7953,7972,8 057,6002,6577,6659,7074,6737,7112,7167,7420,6781,7180,7227,7453,7266,7480,7487,7677,6868, 7245,7282,7490,7324,7531,7563,7708,7363,7580,7611,7745,7635,7761,7796,7894,6934,7302,7352,7572,7408,7603,7601,7764,7425,7628,7639,7792,7685,7808,7822,7931,7473,7656,7695,7817,77 09,7841,7856,7958,7729,7866,7884,7979,7911,7999,8017,8083,6993,7371,7410,7630,7446,7652,7 686,7811,7527,7700,7718,7844,7721,7858,7876,7969,7553,7719,7728,7871,7765,7881,7905,7996, 7800,7910,7921,8004,7938,8024,8034,8093,7581,7771,7794,7895,7823,7913,7924,8011,7837,7936,7959,8030,7973,8048,8061,8109,7886,7961,7984,8051,8001,8065,8074,8125,8014,8079,8089,81 32,8100,8140,8149,8171,6113,6700,6759,7181,6866,7235,7277,7514,6892,7285,7337,7545,7370,7 577,7618,7797,6978,7354,7415,7599,7439,7651,7636,7802,7455,7662,7688,7834,7714,7842,7861, 7965,7128,7430,7458,7650,7526,7681,7703,7845,7544,7715,7723,7864,7741,7877,7889,7990,7554,7734,7756,7888,7799,7904,7919,8005,7820,7933,7937,8025,7960,8035,8054,8104,7162,7525,75 30,7710,7555,7720,7744,7880,7589,7766,7793,7898,7809,7916,7935,8021,7694,7798,7824,7920,7 838,7943,7962,8032,7879,7963,7985,8052,8002,8064,8073,8124,7722,7840,7870,7952,7887,7977, 7992,8056,7907,7998,8007,8072,8020,8080,8092,8135,7923,8015,8027,8088,8038,8095,8103,8142,8058,8107,8113,8147,8122,8157,8159,8179,7172,7561,7576,7795,7680,7806,7821,7932,7705,78 31,7843,7954,7875,7968,7989,8055,7727,7860,7885,7971,7896,7993,8008,8067,7917,8018,8006,8 077,8033,8091,8099,8138,7801,7891,7903,8000,7930,8010,8026,8084,7941,8028,8037,8096,8053, 8101,8110,8146,7976,8049,8060,8105,8075,8115,8123,8153,8081,8129,8134,8161,8141,8164,8166,8176,7839,7906,7940,8029,7967,8036,8050,8102,7987,8062,8066,8112,8078,8120,8133,8158,79 91,8076,8085,8128,8098,8136,8137,8165,8108,8143,8145,8167,8151,8172,8174,8184,8022,8094,8 097,8139,8111,8144,8148,8169,8121,8152,8156,8173,8162,8175,8180,8186,8126,8160,8163,8177, 8168,8178,8181,8187,8170,8182,8183,8188,8185,8189,8190,8191]

Sequence Group 3: Q3_2048

[0,1,2,4,8,16,32,3,5,64,1024,9,6,17,10,18,128,12,33,65,20,256,34,24,36,7,129,66,512,11, 40,68,130,19,13,48,14,72,257,1025,21,132,35,258,26,513,80,37,25,22,136,260,264,38,514,96,67,4 1,144,28,69,42,516,49,1026,74,272,160,520,288,528,192,544,70,44,131,81,50,73,15,320,133,52,10 28,23,134,384,76,137,82,56,27,97,39,259,84,138,145,261,1032,29,43,98,515,88,140,30,146,71,262, 265,161,576,45,1040,100,640,51,148,46,75,266,273,517,104,162,53,193,1056,152,77,164,768,268, 274,518,54,83,57,521,1027,112,135,78,289,194,85,276,522,58,168,1029,139,99,86,60,280,89,290, 529,524,196,1088,141,101,147,176,142,530,321,31,200,1033,90,545,292,322,532,263,149,102,105,1030,304,296,163,92,47,267,385,546,324,1041,208,386,150,153,165,106,55,1034,328,536,577,54 8,113,154,79,269,1042,108,578,224,166,519,552,195,1152,270,641,523,275,580,291,59,1036,169, 560,114,277,156,87,197,1057,116,170,61,531,525,642,281,1089,278,526,177,293,388,91,1044,584, 769,198,172,120,201,336,1280,62,282,143,103,178,294,1058,93,644,202,592,323,1048,392,297,7 70,107,180,151,1060,209,284,648,94,204,298,1031,400,608,352,325,533,1153,155,210,305,547,30 0,1090,109,184,534,537,115,167,1536,225,326,306,772,157,1035,656,329,110,117,212,1064,171,7 76,330,226,549,1092,538,387,308,216,1154,416,271,279,158,337,1043,550,672,118,332,579,1037, 540,389,173,121,1072,553,199,784,179,1038,228, 338,312,704,390,1096,174,554,581,393,1281,28 3,122,448,
353,1045,561,203,63,340,1156,394,527,582,556,181,1059,
295,285,232,124,1282,205,18 2,643,562,1050,286,585,299,
1537,354,211,401,185,1104,396,344,586,645,1061,593,
535,240,206,1 049,95,327,564,1046,800,402,356,307,1160,
301,417,213,568,1284,832,588,186,1288,646,404,227, 896,
1062,594,418,302,1538,649,771,360,539,1120,111,331,
214,1091,309,188,449,1065,217,408,60 9,596,1168,551,
650,229,1052,159,420,310,1093,541,773,610,1066,657,
333,119,1540,600,339,218, 1073,368,652,230,1098,391,
313,450,1296,542,334,233,1184,555,774,175,1544,123,
658,612,1312, 341,777,220,1552,314,424,395,1216,673,
583,355,1568,287,183,234,1094,125,557,660,1068,616,3
42,316,1155,241,778,1105,563,345,452,1074,397,403,207,
1097,674,558,1039,785,432,357,1344,1 87,236,664,1157,
624,587,1076,780,705,126,1047,242,565,1158,398,346,
456,1408,358,405,1100,30 3,569,244,1161,595,189,1106,
566,676,361,1080,706,589,1051,215,786,647,1121,348,
419,1063,406, 464,680,1283,801,362,1108,590,409,1162,
570,788,597,1169,572,219,1285,311,708,1053,598,601,
1067,651,421,792,1122,802,611,1539,602,410,1112,231,
688,1164,653,248,1054,369,190,364,1170, 654,659,1095,
335,480,1286,315,221,1289,370,613,1185,422,425,1600,
451,614,1069,543,235,1124, 412,343,372,1664,775,317,
1075,222,426,1172,453,237,1070,559,833,1099,804,712,
1290,834,661, 1297,808,779,1541,617,1128,604,433,1186,
720,816,1077,836,347,1217,897,243,1176,662,454,110
1,318,675,1188,618,898,1792,781,376,1292,428,1298,665,
736,1542,567,840,1078,625,238,1107,3 59,457,1081,399,
787,1545,591,1136,678,434,1159,677,349,1102,245,458,
1313,666,1218,620,363,1 109,127,191,1300,782,1546,407,
436,1082,626,571,1192,465,1163,681,246,1123,707,350,
1110,599, 1084,668,790,1304,460,249,1113,682,1314,573,
411,1553,803,789,1548,709,1220,365,440,1165,62 8,1125,
689,374,1171,423,466,1200,793,1166,250,371,1554,481,
1345,574,413,1055,603,1224,366,4 68,1114,655,1569,900,
805,1316,615,1346,684,710,1556,429,1287,794,252,1173,
373,1126,605,848, 1129,690,1328,713,1320,632,482,1187,
806,1116,427,904,1071,414,1291,223,663,1409,692,1570,8
35,1348,619,472,1232,455,1410,796,809,1174,714,1177,
721,1189,837,716,1130,864,1079,810,135 2,606,912,1560,
722,1601,696,1572,377,435,1137,817,1178,319,1103,621,
1293,812,484,1132,430,1 602,838,1248,667,488,1190,239,
1543,378,1576,459,1219,622,627,1294,437,1665,380,1547,
818,12 99,461,496,1604,669,1315,679,1083,724,1193,841,
629,1584,351,1138,467,1301,438,1180,737,111 1,251,
1221,462,442,1140,441,1194,469,1085,247,1555,683,1549,
842,1666,738,899,1305,670,1302, 783,1550,849,1201,820,
1317,728,1412,928,1115,791,367,1608,901,1793,630,1222,
685,1196,844,1 144,633,1225,711,1360,253,1086,691,
1306,824,1167,902,1127,686,740,1202,850,1318,375,
1117,4 44,1668,470,1226,483,1616,415,1347,485,1416,
905,1321,795,1794,473,1131,634,1204,744,1175,8
52,1233,960,1308,865,1672,693,1118,797,1228,906,1322,
715,1424,807,1632,474,1376,636,1349,6 94,1557,254,
1179,717,1234,575,1329,913,1571,798,1324,811,1133,379,
1208,697,1558,431,607,48 9,1561,866,1139,723,1191,486,
1249,908,1350,718,1330,813,1796,476,1181,856,1680,839,
1353,72 5,1134,698,1141,914,1236,752,1195,868,1800,
819,1354,814,1250,439,1573,929,1562,490,1411,62
3,1332,671,1240,739,1440,916,1295,463,1303,843,1182,
381,1361,497,1574,930,1696,821,1142,72 6,1356,1603,
961,1564,872,1413,492,1197,631,1145,729,1577,700,1223,
443,1808,741,1203,845,12 52,920,1362,382,1336,822,
1728,1414,851,1198,730,1578,498,1605,880,1417,742,
1307,445,1146,4 71,1472,1377,635,1585,932,1227,687,
1087,903,1364,825,1418,500,1551,1606,846,1580,745,
1205, 826,1319,732,1309,446,1256,1148,962,1229,936,
1206,475,1667,853,1586,867,1310,1609,637,132 3,907,
1378,487,1235,695,1425,1209,746,1420,828,1368,753,
1610,854,1669,1617,857,1559,504,12 64,799,1230,1119,
255,1351,964,1588,909,1824,719,1426,1380,477,1331,915,
1325,638,1441,1237, 748,1592,944,1856,869,1612,1210,
491,1670,699,1428,1251,754,1920,858,1618,478,1442,
1326,96 8,1673,383,1795,910,1384,1563,815,1135,976,
1355,1238,870,1333,917,1212,1473,727,1241,493,1 432,
873,1633,1620,701,1575,931,1674,1253,756,1183,860,
1444,1334,499,1565,731,1797,1634,82 3,1681,922,1357,
1143,874,1624,918,1363,1242,502,1392,933,1676,1254,
743,1415,1337,760,1474, 881,1566,1358,494,1257,702,
1579,1798,921,1199,501,1147,1682,876,1636,1365,847,
1801,992,12 44,1338,447,1448,1419,733,1697,827,1607,
1379,934,1311,1207,882,1258,937,1149,1581,963,168
4,1640,747,1366,505,1340,1265,855,1802,1587,924,1369,
734,1476,1421,829,1427,1231,965,1698, 1582,938,1809,
1456,884,1381,506,1211,1260,749,1688,1648,945,1611,
1804,966,1729,1150,755,12 66,859,1589,1422,940,1370,
1480,830,1382,1429,911,1327,1593,871,1268,1619,639,
1213,1590,88 8,1700,1385,479,1730,1613,946,1239,750,
1810,1671,969,1372,1443,508,1430,1488,861,1704,182
5,757,1386,1614,970,1433,1594,919,1812,1621,1596,875,
1243,1335,862,1732,1622,758,1625,167 5,948,1445,1816,
977,1826,1635,923,1626,1434,972,1255,1712,761,1677,
1272,877,1393,1214,138 8,952,1678,1683,495,1359,1504,
703,1339,1245,935,1394,1637,978,1446,1449,1475,883,
1638,156 7,762,1259,1436,503,1367,1396,925,1799,1341,
1246,878,1450,1477,735,1261,1583,1857,993,182 8,1736,
885,1858,1685,939,1832,1803,1641,994,1628,1457,980,
1744,1840,1860,926,1371,1921,76 4,1267,1686,1478,941,
1342,1699,967,1642,1922,1805,886,1400,1452,831,1689,
1760,1591,947,18 64,1649,507,1262,1383,1481,889,1423,
1811,1615,984,1702,1458,751,1701,1373,1269,942,1482,1
690,1644,996,1387,1151,1215,971,1806,1431,890,1460,
1650,1595,509,1489,1705,1270,949,1731, 1374,1623,973,
1692,1814,1484,1000,1273,1706,1597,892,1435,1827,
1813,950,1733,1389,1464,86 3,1652,1713,1398,759,1447,
1490,1817,1008,1274,1395,1505,510,1598,1437,1627,979,
1390,1492, 1679,953,1924,1829,1639,763,1708,1734,1453,
974,1818,1276,1397,1629,954,1872,1714,1737,879, 1656,
1506,1830,981,1451,1928,1438,982,1247,1687,1716,1859,
927,1643,1496,1479,995,1820,18 33,1738,1745,765,1861,
1740,1888,956,1834,1630,1936,1746,887,1720,1401,1459,
1841,985,1343, 1645,1836,997,1508,1454,1862,1691,986,
1512,1263,1402,1483,943,1646,1651,1461,1404,891,184
2,1485,1520,1693,998,1703,1748,1865,766,1653,1375,
1491,1462,511,1761,1275,1486,1466,1465, 988,1493,1271,
1707,1866,1001,1762,1923,1694,1807,951,1873,1844,
1752,1952,1002,1815,1391,1 925,1654,1709,893,1868,
1657,1735,1277,975,1715,1848,1926,1710,894,1764,1874,
1399,1468,149 4,1009,1507,1439,1509,1929,1819,955,
1497,1658,1768,1876,1984,1004,1889,1717,1821,1930,101
0,1739,1831,1498,1660,1718,957,1278,1741,1599,1937,
1822,983,1835,1403,1721,1455,1631,1513, 958,1890,1747,
1510,1932,1742,987,1837,1500,1880,1863,1749,1012,
1722,1938,1776,1892,1843, 1838,999,1463,1953,1514,
1647,1695,1763,1016,1940,1487,1867,1405,1521,767,
1954,1845,1750,1 985,1896,1516,1655,989,1753,1724,
1467,1765,1869,1944,1003,1406,1846,1875,1754,1522,
1904,9 90,1766,1469,1495,1659,1956,1711,1927,1005,
1849,1524,1870,1769,1850,1756,1470,959,1986,19
60,1499,1877,1891,1661,1931,1011,1511,1719,1770,1852,
1777,1878,1881,1013,1528,1823,1279,1 988,1933,1743,
1501,1939,895,1662,1772,1968,1893,1515,1723,1778,
1882,1006,1502,1992,1407,1 934,1839,2000,1894,1941, 1014,1751,1517,1897,1725,1955,1780,1884,1523,1755,1017,1847,1946, 1898,1942,1526,1957,1767,1784,1905,1018,1518,1726,1945,1525,1900,1871,2016,1471,1757,1851,991,1958,1906,1961,1987,1771,1529,1879,1948,1758,1853,1020,1989,1962,1908,1530,1773,196 9,1990,1779,1883,1964,1854,1935,1007,1895,1663,1912,1503,1970,1774,1993,1532,1885,1781,19 94,1943,1015,1899,1886,1782,1972,2001,1947,1996,1785,1901,1976,1519,1727,1959,2002,1019,1 907,1786,1527,1949,1902,1759,2017,1909,1963,2018,2004,1950,1788,1965,1991,1021,1910,1855, 1971,1531,1913,2008,1775,1966,2020,1995,1914,1533,1973,1997,2024,1916,1974,1887,1783,102 2,2032,1534,2003,1977,1787,1998,1978,1903,2005,2006,1951,2019,1789,1980,1911,2009,2021,20 10,1967,1915,2022,1790,153 5,1023,2012,2025,1975,2026,1917,1999,1918,2033,1979,2028,2034,1 981,2007,1982,2011,2036,2023,2040,1791,2013,2027,2014,2029,1983,2035,2037,1919,2030,2038, 2041,2042,2015,2044,2031,2039,2043,2045,2046,2047]

Sequence Group 3: Z3_2048

[0,1,2,7,3,8,12,25,4,11,14,29,17,34,36,79,5,13,15,33,20,40,49,84,23,48,44,91,59,100,10 6,170,6,18,22,42,24,47,53,93,30,57,61,101,74,113,119,187,35,63,77,117,82,126,136,199,90,138,14 9,224,155,236,257,366,9,19,27,56,31,60,73,108,37,78,65,120,87,130,143,207,46,76,89,137,95,146,154,231,104,157,173,247,186,264,280,404,55,92,102,153,115,164,180,260,124,181,198,273,210,2 96,311,436,141,205,228,300,234,312,334,463,253,341,360,485,378,505,540,721,16,26,32,75,41,81, 85,142,50,88,96,152,105,163,167,259,58,97,107,165,118,179,195,275,129,196,206,290,230,307,3 29,453,67,111,125,185,131,197,213,301,150,226,235,315,252,340,354,483,166,244,261,346,274,373,381,502,297,392,420,531,441,557,613,722,71,127,145,216,161,232,251,344,171,254,266,365,2 81,380,402,522,193,277,291,390,313,415,438,566,324,444,467,588,491,623,644,818,212,303,318, 424,348,451,471,606,377,479,503,635,532,648,697,870,401,513,542,674,554,713,735,914,610,746, 771,905,797,950,1007,1188,21,38,43,94,51,98,109,178,52,110,121,188,133,208,218,327,66,122,134,221,147,229,242,328,156,240,258,359,278,376,385,501,69,144,158,223,175,245,262,375,184,2 71,282,387,294,413,429,552,183,292,305,411,323,440,455,590,350,474,493,622,511,642,679,856, 80,169,176,268,191,287,304,405,201,310,317,437,335,462,478,619,255,330,349,466,367,489,510, 638,395,517,546,671,570,711,738,897,286,362,389,499,410,529,549,699,433,561,578,719,614,758,781,936,469,612,625,772,639,799,764,963,686,851,872,1019,881,1077,1108,1225,86,189,194,322, 246,339,352,473,270,357,369,495,394,520,545,702,284,391,409,521,423,550,573,726,445,581,60 4,751,637,777,816,971,326,414,428,571,454,597,628,766,494,629,645,813,688,794,863,1023,528, 665,708,852,727,879,901,1059,759,910,908,1100,965,1123,1149,1303,361,442,475,631,518,647,677,828,547,700,714,874,745,885,907,1073,574,732,767,899,782,912,967,1125,826,979,1001,1156,1 039,1197,1220,1381,620,774,809,969,861,973,1031,1167,868,1025,1063,1211,1092,1242,1285,143 9,886,1079,1117,1257,1138,1292,1272,1458,1183,1324,1346,1513,1392,1543,1579,1673,28,45,54, 103,62,123,135,214,68,139,148,220,160,238,243,370,70,159,168,237,177,288,298,400,202,299,321,434,338,457,477,634,72,174,190,293,204,319,332,449,215,343,355,481,372,506,525,650,227,36 4,383,516,406,543,559,693,416,553,583,730,587,750,776,1011,112,203,211,336,222,356,371,498,2 49,386,396,536,419,564,580,705,267,399,427,556,447,585,593,740,465,594,603,779,664,801,844, 1024,285,446,459,601,487,626,632,789,509,662,682,825,718,858,876,1065,535,696,729,877,761,895,940,1094,808,946,981,1128,1003,1163,1201,1375,116,219,239,382,265,397,422,568,279,431,45 0,596,470,609,616,784,309,461,486,617,507,657,676,819,533,690,716,867,742,888,923,1067,333, 497,524,680,560,710,707,890,575,734,748,916,791,942,958,1132,607,763,804,952,821,991,1005,1 169,849,1021,1047,1213,1098,1247,1287,1442,351,539,563,737,591,756,792,948,654,806,833,997, 838,1009,1035,1194,667,835,847,1029,892,1045,1085,1240,931,1096,1115,1259,1147,1306,1332, 1468,691,903,920,1069,959,1102,1121,1277,983,1143,1172,1322,1204,1349,1386,1524,1051,1176, 1216,1358,1252,1398,1414,1571,1280,1429,1455,1591,1492,1626,1668,1784,132,250,272,432,306, 458,482,641,316,490,514,660,538,685,724,925,345,527,567,703,584,754,743,935,598,769,796,97 7,830,993,1015,1185,408,577,600,753,653,787,811,999,659,831,842,1017,860,1037,1057,1230,66 8,854,883,1055,929,1083,1110,1262,954,1136,1145,1308,1174,1335,1366,1506,418,651,656,823,6 70,837,865,1043,694,894,918,1075,944,1104,1141,1298,802,927,961,1113,985,1158,1178,1327,10 41,1181,1218,1360,1254,1395,1411,1567,840,989,1027,1160,1053,1208,1235,1372,1090,1244,1267,1408,1295,1432,1465,1604,1119,1282,1314,1452,1344,1475,1503,1635,1378,1517,1539,1659,15 59,1700,1710,1847,425,673,683,921,786,938,956,1134,814,975,995,1165,1033,1192,1227,1369,84 5,1013,1049,1199,1071,1237,1269,1404,1106,1290,1264,1423,1330,1461,1489,1617,933,1061,108 1,1249,1130,1274,1311,1445,1154,1316,1341,1478,1363,1496,1528,1654,1206,1352,1384,1510,14 17,1547,1563,1689,1436,1587,1600,1722,1630,1739,1752,1822,987,1088,1152,1319,1190,1338,1355,1499,1223,1389,1401,1536,1426,1551,1595,1705,1232,1420,1448,1583,1485,1608,1612,1745,1 521,1640,1649,1758,1679,1792,1806,1896,1300,1472,1482,1621,1532,1644,1664,1771,1555,1684, 1694,1799,1728,1814,1856,1920,1575,1716,1733,1830,1764,1838,1865,1933,1778,1875,1885,194 8,1907,1964,1984,2008,10,39,64,140,83,151,182,283,99,172,200,308,225,337,347,526,114,192,209,331,248,363,407,541,269,403,384,565,452,592,611,778,128,233,263,374,276,398,426,572,314,4 43,460,595,508,633,649,815,342,468,519,643,537,669,695,841,562,701,728,891,741,913,951,1133, 162,241,295,439,320,456,504,618,353,523,472,652,551,678,712,857,393,515,558,698,579,720,73 9,904,605,747,783,934,812,964,992,1187,435,569,599,736,636,762,800,957,663,803,839,980,862, 1018,1046,1231,706,853,898,1028,909,1048,1084,1266,945,1095,1124,1293,1151,1317,1357,1534, 217,289,325,512,368,534,544,709,412,555,582,733,608,760,770,955,448,586,615,765,646,798,83 2,984,675,834,855,1008,902,1040,1076,1253,480,627,666,810,681,836,869,1030,731,893,911,105 2,943,1093,1114,1291,768,928,960,1103,982,1144,1155,1313,1020,1171,1210,1347,1238,1376,1434,1535,496,672,717,875,757,906,941,1099,780,947,968,1131,994,1153,1186,1337,827,986,1010,11 68,1050,1203,1234,1385,1068,1241,1271,1409,1301,1444,1464,1613,866,1032,1058,1215,1105,12 51,1276,1427,1150,1286,1315,1456,1348,1469,1514,1651,1184,1326,1359,1493,1373,1527,1546,1 681,1431,1556,1576,1675,1597,1704,1740,1841,256,358,379,576,417,589,621,795,421,624,655,81 7,687,859,878,1072,476,658,689,884,723,900,924,1074,744,922,953,1122,988,1148,1161,1312,488, 715,749,889,788,930,962,1146,807,976,996,1164,1016,1200,1222,1370,805,1012,1036,1198,1066, 1236,1256,1410,1109,1279,1302,1443,1325,1463,1497,1641,530,775,790,972,824,1004,1034,1189, 843,1044,1056,1233,1086,1265,1284,1440,949,1078,1107,1270,1135,1297,1323,1459,1175, 1331,1 364,1490,1390,1526,1549,1670,1002,1127,1166,
1310,1196,1345,1367,1515,1228,1380,1399,1533, 1435,
1565,1584,1696,1273,1433,1446,1577,1460,1598,1570,
1713,1504,1637,1652,1747,1658,178 2,1800,1859,548,820,
829,1064,932,1091,1112,1278,974,1120,1137,1305,1173,
1334,1362,1518,998, 1170,1195,1336,1214,1368,1393,
1538,1243,1402,1425,1560,1457,1581,1611,1718,1070,
1202,122 1,1391,1255,1418,1449,1572,1304,1450,1466,
1609,1505,1594,1646,1749,1343,1484,1523,1638,15
40,1657,1672,1772,1566,1678,1677,1795,1714,1808,1821,
1893,1126,1239,1281,1451,1333,1467,1 495,1620,1365,
1516,1529,1653,1554,1661,1676,1780,1394,1544,1573,
1671,1585,1680,1715,1809, 1619,1723,1736,1825,1760,
1845,1857,1924,1441,1578,1606,1717,1645,1719,1755,
1831,1650,175 1,1774,1852,1790,1867,1886,1944,1662,
1783,1804,1873,1816,1889,1880,1951,1839,1902,1911,19
68,1928,1976,1986,2007,302,388,430,602,464,661,692,
871,484,704,725,882,755,917,926,1139,49 2,752,773,915,
793,1006,1022,1182,846,1026,1062,1229,1089,1258,1283,
1454,500,785,822,1014,8 50,1060,1080,1248,873,1097,
1116,1288,1142,1318,1340,1470,896,1129,1159,1329,
1191,1361,137 7,1509,1205,1371,1403,1542,1407,1558,
1580,1742,630,848,864,1087,887,1118,1140,1309,937,116
2,1177,1353,1209,1383,1400,1520,970,1180,1219,1374,
1246,1406,1413,1550,1268,1415,1424,158 2,1483,1599,
1632,1750,1000,1245,1261,1422,1296,1447,1453,1590,
1321,1481,1500,1618,1531,16 42,1655,1775,1351,1512,
1541,1656,1568,1669,1698,1791,1605,1702,1724,1810,
1737,1828,1848,1 922,640,880,919,1157,966,1179,1212,
1388,990,1224,1250,1416,1275,1430,1437,1586,1042,
1263, 1294,1438,1320,1477,1494,1614,1350,1507,1530,
1648,1552,1663,1687,1776,1082,1307,1339,149 8,1379,
1525,1522,1665,1396,1545,1557,1682,1592,1699,1709,
1812,1428,1569,1602,1706,1615,17 30,1738,1832,1636,
1748,1765,1853,1794,1869,1887,1945,1111,1356,1382,
1548,1412,1564,1593,1 703,1474,1603,1624,1734,1628,
1741,1757,1844,1486,1625,1634,1754,1666,1763,1787,
1866,1692, 1793,1803,1874,1820,1894,1905,1954,1508,
1674,1685,1777,1711,1796,1807,1882,1725,1818,183
3,1901,1849,1912,1926,1971,1767,1835,1854,1915,1871,
1930,1936,1983,1883,1941,1950,1989,19 61,1997,2006,
2027,684,939,978,1226,1038,1260,1289,1462,1054,1299,
1328,1480,1354,1502,1537, 1688,1101,1342,1387,1519,
1405,1562,1553,1695,1419,1574,1596,1721,1622,1731,
1744,1840,119 3,1397,1421,1561,1473,1589,1607,1735,
1479,1623,1631,1746,1643,1759,1770,1861,1487,1639,16
60,1769,1691,1786,1801,1876,1707,1815,1819,1895,1834,
1906,1918,1966,1207,1471,1476,1616,1 488,1627,1647,
1762,1511,1667,1683,1781,1701,1797,1817,1891,1601,
1690,1712,1802,1726,1826, 1836,1903,1761,1837,1855,
1916,1872,1929,1935,1982,1629,1729,1753,1827,1768,
1851,1863,192 1,1789,1868,1878,1934,1890,1942,1953,
1992,1805,1884,1898,1949,1910,1956,1965,1999,1923,19
69,1975,2004,1980,2013,2015,2035,1217,1491,1501,1686,
1588,1697,1708,1813,1610,1720,1732,1 829,1756,1843,
1860,1919,1633,1743,1766,1846,1779,1864,1879,1932,
1798,1888,1877,1939,1904, 1952,1960,1995,1693,1773,
1785,1870,1811,1881,1897,1946,1824,1899,1909,1957,
1917,1962,197 2,2003,1850,1913,1925,1967,1937,1977,
1981,2011,1943,1988,1991,2017,1998,2020,2022,2032,17
27,1788,1823,1900,1842,1908,1914,1963,1858,1927,1931,
1974,1940,1978,1990,2014,1862,1938,1 947,1987,1959,
1993,1994,2021,1970,2000,2002,2023,2009,2028,2030,
2040,1892,1955,1958,1996, 1973,2001,2005,2025,1979,
2010,2012,2029,2018,2031,2036,2042,1985,2016,2019,
2033,2024,203 4,2037,2043,2026,2038,2039,2044,2041,
2045,2046,2047]

Sequence Group 3: Q3_4096

[0,1,2,4,8,16,32,3,5,64,1024,2048,9,6,17,10,18,128,12,
33,65,20,256,34,24,36,7,129,66,5 12,11,40,68,130,19,13,
48,14,72,257,1025,21,132,35,258,26,2049,513,80,37,25,22,
136,260,264,38, 514,96,67,41,144,28,69,42,516,49,1026,
74,272,160,520,288,528,192,544,70,44,131,81,2050,50,73,
15,320,133,52,1028,23,134,384,76,137,82,56,27,97,39,259,
84,138,145,261,1032,29,43,2052,98,51 5,88,140,30,146,71,
262,265,161,576,45,1040,100,640,51,148,46,75,266,273,
517,2056,104,162,53, 193,1056,152,77,164,768,268,274,
518,54,83,57,521,1027,112,135,2064,78,289,194,85,276,
522,58, 168,1029,139,99,86,60,280,89,290,529,2080,524,
196,1088,141,101,147,176,142,530,321,31,200,1 033,90,
545,292,2051,322,532,263,149,102,105,1030,304,296,163,
92,47,267,385,546,2053,324,104 1,208,386,150,153,165,
106,55,1034,328,536,577,548,2112,113,154,79,269,1042,
108,578,224,166, 519,552,195,1152,270,3072,641,523,275,
580,291,59,1036,169,560,114,277,156,2057,87,197,1057,
116,170,61,531,525,642,281,1089,278,526,2054,177,293,
388,91,1044,584,769,198,172,120,201,20 65,336,1280,62,
282,143,103,178,294,1058,93,644,2058,202,592,323,1048,
392,297,770,107,180,15 1,1060,2066,209,284,648,94,204,
298,1031,400,608,352,2176,325,533,1153,155,210,305,
547,300,1 090,109,2060,184,534,537,115,167,1536,225,
326,306,772,2081,157,1035,656,329,110,117,212,106
4,171,2113,776,330,226,549,1092,538,387,308,216,2068,
1154,416,271,279,158,337,1043,550,672, 2304,118,332,
579,1037,540,389,173,121,1072,2082,553,199,784,179,
1038,228,338,312,2072,704, 390,1096,174,554,581,393,
1281,283,2084,122,448,353,1045,561,203,63,340,2055,
1156,394,527,5 82,556,181,1059,2177,295,285,232,124,
1282,205,182,643,2114,562,1050,286,585,299,1537,354,2
11,2560,401,185,1104,396,344,586,645,2059,1061,593,
535,240,206,1049,95,2088,327,564,1046,8 00,402,356,307,
2116,1160,301,417,213,568,1284,832,2178,588,186,1288,
646,404,227,896,2067,1 062,594,418,302,1538,649,771,
2061,360,539,1120,111,331,214,1091,2096,309,188,449,
1065,217,4 08,2062,609,596,1168,551,650,229,1052,2120,
159,420,310,1093,541,773,2305,610,1066,657,333, 119,
1540,3073,600,339,218,1073,368,652,230,2069,1098,391,
313,450,1296,542,2180,334,233,118 4,555,774,175,2083,
1544,123,658,612,1312,2306,341,777,220,1552,314,424,
2074,395,1216,673,5 83,355,1568,2561,287,183,234,1094,
125,557,2128,660,1068,616,342,316,2085,1155,241,778,
1105, 563,345,2073,452,1074,397,403,207,2070,1097,674,
558,1039,785,432,2184,357,1344,187,236,66 4,2308,1157,
624,587,1076,780,2312,705,126,1047,242,565,1158,2086,
398,346,456,1408,358,2562, 405,1100,303,569,244,2144,
1161,595,189,1106,566,2115,676,361,1080,706,589,2089,
1051,215,78 6,647,1121,2192,348,419,1063,406,464,2076,
680,1283,801,362,1108,2117,590,409,1162,570,2090, 788,
597,1169,572,219,2564,1285,311,708,1053,598,2097,601,
1067,651,421,3074,792,1122,802,61 1,1539,2122,602,410,
1112,231,688,2320,1164,653,248,1054,2208,369,190,364,
1170,654,2568,659, 1095,335,480,2336,1286,315,221,
1289,2576,370,613,1185,422,425,2240,1600,451,614,1069,
2592, 543,235,1124,412,2118,343,372,1664,775,317,2092,
1075,222,426,1172,2179,453,237,1070,559,21 29,833,
1099,804,712,2098,1290,834,661,1297,2121,808,779,1541,
617,1128,2063,604,433,1186,72 0,2368,816,1077,836,347,
2181,1217,897,243,1176,2100,662,454,1101,318,3076,675,
1188,618,898, 2071,1792,781,376,2182,1292,428,1298,
665,2432,736,1542,567,840,2124,1078,625,238,1107,218
5,359,457,1081,399,2130,787,1545,591,1136,2104,678,
434,1159,2075,677,349,1102,245,2145,458, 1313,666,
1218,2087,620,363,1109,2307,127,191,1300,782,2132, 1546,407,436,1082,2186,626,571, 1192,2193,465,1163,681,246,2309,1123,707,350,3080,1110,599,1084,668,2077,790,1304,460,2091, 249,1113,682,1314,2146,573,411,1553,2563,803,789,1548,709,2136,1220,365,440,2188,1165,628, 1125,689,2078,374,1171,423,2194,466,1200,793,2119,1166,250,371,1554,2310,481,1345,574,2313,413,1055,603,2209,1224,366,468,1114,2624,655,1569,900,2093,805,1316,615,3088,1346,684,710, 2148,1556,429,1287,2688,794,252,1173,373,2099,1126,605,848,2196,1129,690,1328,2094,713,13 20,632,2123,482,1187,806,2314,1116,427,904,2321,1071,414,1291,2565,223,663,1409,2152,692,1 570,835,2210,1348,619,472,2101,1232,455,1410,2241,796,809,1174,3104,714,1177,721,2200,1189, 837,716,2125,1130,864,1079,2212,810,1352,606,2816,912,1560,722,2316,1601,696,1572,2322,37 7,435,1137,2566,817,1178,319,2102,1103,621,1293,2131,812,484,1132,2105,430,1602,838,2569,1 248,667,3075,488,1190,239,2160,1543,378,1576,2183,459,1219,622,2126,627,1294,437,2337,166 5,380,2242,1547,818,1299,2133,461,496,1604,2324,669,1315,2570,679,1083,724,2106,1193,841,6 29,2216,1584,351,1138,3077,467,1301,2187,438,1180,737,2147,1111,251,1221,2134,462,442,2108,1140,441,1194,2328,469,1085,2137,247,1555,683,2338,1549,842,1666,2577,738,899,2572,1305,6 70,1302,2244,783,1550,3136,849,1201,820,2189,1317,728,2149,1412,928,1115,2195,791,367,222 4,1608,901,1793,2190,630,1222,2578,685,1196,844,2369,1144,633,2079,1225,711,1360,2248,253, 1086,3081,691,1306,824,2138,1167,902,2593,1127,686,740,2340,1202,850,2370,1318,375,2580,11 17,444,1668,2311,470,1226,2197,483,1616,415,2150,1347,485,2153,1416,905,3078,1321,795,179 4,2352,473,1131,2344,634,1204,2211,744,1175,852,2140,1233,960,2095,1308,865,2315,1672,693, 2433,1118,797,1228,2594,906,1322,2372,715,1424,3089,807,1632,474,2256,1376,636,2434,1349, 694,2198,1557,254,2201,1179,717,2213,1234,575,1329,2154,913,1571,2103,798,1324,3082,811,11 33,2376,379,1208,2584,697,1558,431,2625,607,489,2596,1561,866,2161,1139,723,2202,1191,486, 2127,1249,908,2317,1350,718,1330,3090,813,1796,2156,476,1181,2626,856,1680,2272,839,1353, 2214,725,1134,2567,698,1141,2600,914,1236,2243,752,1195,3200,868,1800,2318,819,1354,2689,8 14,1250,439,2571,1573,929,2323,1562,490,2628,1411,623,2339,1332,671,2107,1240,739,3084,14 40,916,2217,1295,463,2608,1303,843,2162,1182,381,2325,1361,497,2204,1574,930,2135,1696,82 1,2245,1142,726,3105,1356,1603,2164,961,2218,1564,872,2109,1413,492,2579,1197,631,2573,114 5,729,2690,1577,700,2329,1223,443,3137,1808,741,2326,1203,845,2574,1252,920,2225,1362,382, 2341,1336,822,2436,1728,2139,1414,851,3092,1198,730,2632,1578,498,2817,1605,880,2246,1417, 742,2220,1307,445,2168,1146,2249,471,1472,2384,1377,635,3328,1585,932,2110,1227,687,2330, 1087,903,2191,1364,2151,825,1418,2226,500,1551,2342,1606,846,3106,1580,745,2141,1205,2692, 826,1319,2250,732,1309,2640,446,1256,2371,1148,3096,962,1229,2440,936,1206,2345,475,1667, 2818,853,2155,1586,867,2228,1310,1609,2199,637,1323,3108,907,2257,1378,487,2332,1235,695, 2696,1425,2142,1209,746,2252,1420,828,2346,1368,3079,753,1610,2448,854,1669,2656,1617,240 0,857,1559,2373,504,1264,2581,799,3201,1230,1119,2203,255,1351,2258,964,2353,1588,909,259 5,1824,719,2348,1426,3138,1380,477,2157,1331,915,2232,1325,2582,638,1441,2585,1237,2163,7 48,1592,2215,944,1856,3584,869,2273,1612,1210,2374,491,2354,1670,699,2820,1428,1251,2205, 754,3083,1920,858,2704,1618,2377,478,1442,2158,1326,968,2165,1673,2260,383,1795,3112,910, 2219,1384,1563,2824,815,2378,1135,976,2274,1355,2597,1238,870,3140,1333,2586,917, 1212,243 5,1473,2356,727,1241,2264,493,3202,1432,873,2464,1633,2319,1620,701,2327,1575,2206,931,16 74,2385,1253,3091,756,1183,2598,860,2720,1444,1334,2166,499,2380,1565,731,2627,1797,3085, 1634,823,2588,1681,2437,922,1357,2221,1143,2169,874,1624,3120,918,2601,1363,2247,1242,502, 2832,1392,2227,933,1676,3086,1254,2276,743,1415,2386,1337,2360,760,2752,1474,881,2438,15 66,3144,1358,494,2222,1257,2602,702,2629,1579,1798,2441,921,3329,1199,501,2331,1147,2170, 1682,2496,876,1636,2401,1365,3093,847,1801,2609,992,2251,1244,2111,1338,447,2388,1448,320 4,1419,2442,733,1697,2575,827,2630,1607,2604,1379,934,2229,1311,3107,1207,2343,882,1258,2 333,937,2280,1149,2172,1581,963,3330,1684,2253,1640,2230,747,1366,2691,505,2610,1340,3098, 1265,855,2334,1802,2633,1587,2347,924,3585,1369,734,2402,1476,2259,1421,2449,829,1427,22 33,1231,3152,965,2444,1698,2392,1582,938,2634,1809,2693,1456,3109,884,1381,2641,506,2583, 1211,2288,1260,2254,749,1688,3097,1648,2143,945,2375,1611,2612,1804,966,3094,1729,2848,11 50,2450,755,2404,1266,859,2355,1589,3208,1422,2349,940,2465,1370,2261,1480,830,2616,1382, 3332,1429,2880,911,2636,1327,1593,2234,871,3336,1268,2694,1619,2452,639,2275,1213,1590,29 44,888,3110,1700,2642,1385,2466,479,2350,1730,3586,1613,946,2697,1239,2819,750,2408,1810, 2587,1671,3168,969,2159,1372,1443,2379,508,2262,1430,3139,1488,2357,861,2236,1704,2497,18 25,757,3113,1386,2265,1614,2456,970,2657,1433,2644,1594,3216,919,2599,1812,1621,2698,1596, 2277,875,3100,1243,2207,1335,2468,862,2358,1732,3141,1622,2589,758,1625,2821,1675,2658,9 48,3114,1445,2705,1816,2381,977,2167,1826,3588,1635,2648,923,2387,1626,2266,1434,972,3121, 1255,2416,1712,2700,761,2278,1677,3146,1272,2439,877,2361,1393,2498,1214,3344,1388,2590, 952,2382,1678,2281,1683,495,3232,1359,2603,1504,2822,703,2223,1339,3592,1245,2171,935,270 6,1394,2660,1637,3360,978,2389,1446,2825,1449,2268,1475,3600,883,2362,1638,2472,1567,2443, 762,3264,1259,2721,1436,2631,503,2403,1367,3616,1396,2335,925,2231,1799,2282,1341,3142,1 246,2173,878,2605,1450,2708,1477,3116,735,2664,1261,2390,1583,2364,1857,3203,993,2289,182 8,2826,1736,3153,885,2611,1858,2393,1685,2500,939,3122,1832,2445,1803,2451,1641,2255,994,3145,1628,2722,1457,2606,980,3087,1744,2833,1840,2480,1860,2405,926,3392,1371,2235,1921,2 284,764,2712,1267,3205,1686,2672,1478,2635,941,3124,1342,2828,1699,2753,967,2174,1642,309 5,1922,2290,1805,2613,886,1400,1452,3206,831,2446,1689,2394,1760,2504,1591,3456,947,2406, 1864,2453,1649,3148,507,2351,1262,2617,1383,2292,1481,3209,889,2643,1423,2237,1811,3154,1 615,2614,984,2724,1702,2409,1458,3128,751,2754,1701,2637,1373,3099,1269,2263,942,2834,148 2,2695,1690,3169,1644,2396,996,2467,1387,3111,1151,2454,1215,2512,971,2728,1806,3331,1431, 2849,890,2410,1460,3156,1650,2638,1595,2457,509,3210,1489,2618,1705,2836,1270,2645,949,32 17,1731,2620,1374,2267,1623,3333,973,2359,1692,2756,1814,3101,1484,2646,1000,2649,1273,31 15,1706,2699,1597,2469,892,2840,1435,3170,1827,2850,1813,2659,950,3587,1733,2650,1389,245 8,1464,3160,863,2279,2736,1652,3212,1713,2701,1398,2296,759,3102,1447,2417,1490,2238,1817, 2412,1008,3218,1274,2702,1395,2707,1505,3143,510,2383,1598,2528,3334,1437,2363,1627,2269, 979,3337,1390,2418,1492,2661,1679,3233,953,2470,1924,2473,1829,3648,1639,2499,2662,763,3 117,1708,2591,1734,2283,1453,3172,974,2460,1818,2391,1276,2420,1397,3712,2823,1629,2365,9 54,3123,1872,2270,1714,2474,1737,3220,879,2501,1656,2285,3118,1506,2607,1830,2881,981,314 7,1451,2852,1928,2760,1438,3338,2882,982,2709,1247,3345,1687,2856, 1716,2827,1859,3589,927, 2665,3176,1643,2652,1496,2481,1479,3234,995,2768,1820,2864,1833,3125,2884,1738,2395,1745, 3265,765,2945,1861,2291,3224,1740,2710,1888,2502,956,3149,1834,2366,1630,2723,3236,1936, 2666,1746,2946,887,3840,1720,2829,1401,2424,3340,1459,2476,1841,3346,985,2713,1343,2784,3 590,1645,2615,1836,2888,997,3126,1508,2673,2286,1454,3155,1862,2407,1691,2505,986,3129,24 47,1512,2835,1263,3593,1402,2639,3184,1483,2726,943,2482,1646,3207,1651,2725,2397,1461,31 50,1404,2293,891,2506,3361,1842,2714,1485,3266,1520,2668,1693,2411,3157,998,2175,1703,223 9,1748,3348,2830,1865,3594,766,2455,1653,2484,3130,1375,2674,1491,2619,1462,3240,2513,511, 3211,1761,2729,1275,2294,3171,1486,2755,1466,2398,1465,3158,2647,988,3132,1493,2716,1271, 2838,3352,1707,2508,1866,2297,3161,1001,2730,1762,3362,1923,2621,2459,1694,3601,1807,285 1,951,2837,3596,1873,2757,1844,3268,2413,1752,2488,1952,3213,1002,2676,3173,1815,2737,139 1,2422,3219,1925,2471,1654,2514,1709,3248,2841,893,3214,1868,2298,2419,1657,3602,1735,252 9,3393,1277,2622,975,2461,1715,3103,2651,1848,3272,1926,2414,2516,1710,3162,894,2703,3617, 1764,2948,1874,2853,3364,1399,2663,1468,3394,2732,1494,2758,1009,3604,2477,1507,3335,143 9,2842,2300,1509,3221,1929,2421,3174,1819,2653,955,2896,3177,1497,2738,1658,3376,2761,176 8,3368,1876,2680,2530,1984,3235,1004,2854,3164,1889,2475,1717,2952,3119,1821,2462,1930,33 39,2271,1010,2711,1739,3457,2740,1831,3618,2883,1498,3396,1660,2667,2520,1718,3280,957,25 03,3458,1278,2844,1741,2857,3222,1599,2762,3225,1937,2769,1822,3237,2885,983,2764,1835,3178,2912,1403,3127,2858,1721,3400,1455,2654,2960,1631,3608,1513,2770,3649,958,2744,3620,18 90,2425,1747,2483,3185,1510,2865,3226,1932,2367,1742,3151,2669,987,3341,2860,1837,2532,15 00,3180,2478,1880,3650,2886,1863,3296,1749,2715,2536,1012,3238,2287,1722,3591,1938,2426,3 624,1776,2507,3267,1892,2670,1843,2675,3342,1838,2485,3713,999,2428,1463,3595,2866,1953,3 347,2509,1514,2544,3652,1647,2717,1695,3363,2727,1763,3131,2772,1016,3241,2889,1940,2677, 1487,3632,2399,1867,3186,2515,1405,3349,2486,1521,3228,2785,767,3159,1954,2299,3269,1845, 2510,2490,1750,3188,2489,1985,3242,1896,2517,3133,1516,2295,3603,1655,2731,3597,989,2890, 3714,1753,2786,2947,1724,3353,1467,2718,3350,1765,2831,3598,1869,2897,3249,1944,2868,336 5,1003,2776,3460,1406,2976,3163,1846,2839,1875,2415,3656,1754,2949,3841,1522,2678,3270,1904,2733,3244,990,2892,3192,1766,2681,3273,1469,2759,3408,1495,2301,3134,1659,2739,3354,19 56,2872,3215,1711,2950,3175,1927,2734,1005,2788,3250,1849,2898,3366,1524,2423,3165,1870,2 492,3716,1769,2518,3274,1850,2531,3664,1756,2463,3395,1470,2533,3464,959,2953,3369,1986,2 843,3842,1960,2521,3179,1499,2682,3252,1877,2792,3223,1891,2900,3281,3008,1661,3356,2913, 1931,3720,2741,1011,3166,2845,1511,3276,2954,1719,3370,2763,1770,3472,2855,1852,3680,252 2,1777,3424,2684,1878,3397,2742,1881,3605,2302,1013,3227,2765,1528,3282,2623,3377,1823,29 61,3619,1279,2846,3372,1988,2859,3181,1933,2427,3256,1743,2745,3606,1501,2479,2655,2537,1 939,3609,2914,895,3187,2771,1662,3239,2534,1772,3297,2956,1968,3398,2766,3378,1893,2861,3 844,1515,2524,3229,1723,2904,3728,1778,2887,3401,1882,2773,3182,2746,1006,3189,2962,1502,3284,2800,1992,3243,2916,3848,1407,2867,3402,1934,2862,3298,1839,2487,3621,2000,2977,361 0,2538,1894,3459,2671,1941,3380,2719,1014,3288,2787,3488,1751,2964,3343,1517,2511,3351,28 91,1897,3230,2429,1725, 3409,2545,1955,3622,2978,3744,1780,2869,3190,1884,2774,3404,1523,3 651,3009,3612,1755,2920,3461,1017,2540,3245,2679,1847,3193,2777,1946,3625,2748,3271,1898, 2491,3856,1942,2789,3251,2893,1526,3300,2968,1957,3410,2430,3384,1767,2870,3776,1784,346 2,2899,3246,1905,2778,3626,1018,2546,3653,2928,1518,3465,2790,1726,3355,2493,3194,1945,25 19,3520,1525,3425,2683,3633,1900,2980,3275,2735,1871,3135,2951,2016,3412,2873,3466,1471,2 548,3599,1757,3654,2894,3628,1851,2793,3253,2874,991,3367,2780,1958,3357,2494,3304,1906,3 196,3010,3277,1961,2984,3254,2523,1987,3715,2901,1771,3634,2915,3358,1529,3657,2685,3371,1879,2955,3426,2535,1948,3283,2743,1758,3473,3257,2794,1853,3468,2876,3416,1020,2801,365 8,2902,1989,3717,3665,1962,2905,3607,2552,1908,3312,2847,3278,1530,3167,2303,3399,1773,30 12,3636,2957,1969,3872,2767,3474,1990,3428,2525,3379,1779,2963,3373,2686,1883,3489,3285,2 796,1964,3640,2992,3904,1854,2917,3660,3258,1935,2539,3718,2747,1007,3476,3299,2802,1895, 3968,2906,3666,1663,2526,3490,3374,1912,3016,3721,2431,1503,3843,2958,3432,1970,3611,286 3,3183,1774,3024,3403,3286,1993,2918,3381,2965,1532,3260,3521,2775,1885,3289,2541,3480,17 81,2921,3681,3668,1994,2749,3623,2979,3722,1943,3301,2804,3231,1015,2908,3492,3382,1899,2 547,3613,2779,1886,3845,3682,2871,3729,1782,2970,3405,3191,1972,2922,3672,2966,2001,3411, 3290,2550,1947,3440,2981,3724,3302,1996,2791,3463,3385,1785,2808,3522,2929,1901,3614,3406,2542,3305,1976,2750,3627,3846,1519,2969,3247,2549,3195,1727,3730,2924,3684,1959,3413,28 95,3849,3040,2002,3292,3386,2495,1019,3496,3467,2781,3745,1907,2875,3655,3427,1786,2982,3 359,3255,2930,1527,3306,2985,3197,1949,3629,3011,3732,3688,1902,2795,3414,2553,3388,1759, 3313,2903,3850,2017,3635,2972,3417,2782,1909,3524,3469,2877,3475,1963,3279,3013,3746,2018,3630,2986,3857,3504,2004,2932,3429,2554,3259,1950,3308,2797,3736,3696,1788,2993,3659,38 52,3014,1965,3777,3198,2803,3314,1991,2907,3637,3470,2988,1021,3418,3528,2878,1910,3430,3 477,2959,3375,1855,3641,2919,3316,3667,1971,2687,3261,3638,2936,1531,3748,3433,2527,3778, 1913,3661,2994,3287,2798,3858,2008,3719,3017,3420,3491,1775,2556,3478,3536,2909,1966,3752,3873,2805,3434,2020,3662,3018,3481,3642,1995,2967,3860,3669,3644,2923,1914,3291,3383,29 10,3780,1533,3670,2806,3673,3723,1973,2996,3493,3864,3025,3874,1997,3683,2971,3674,3482,2 024,3020,3303,3760,2809,1916,3725,3320,2925,3441,3262,1974,3436,3000,3726,3731,1887,2543, 3407,3552,2751,3387,1783,3293,2983,3442,3685,3026,1022,3494,3497,3523,2931,2032,3686,3615,2810,3307,3484,1534,2551,3415,3444,2973,3847,2003,3389,3294,2926,3498,3525,1977,2783,33 09,3631,3905,1787,3041,3876,3784,2933,3906,1998,3733,2987,3880,3851,3689,1978,3042,3676,3 505,3028,3792,1903,3888,3908,2974,3419,3969,2005,2812,3315,3734,3526,2989,2006,3390,3747, 3015,3690,3970,1951,3853,2934,3448,3500,2879,3737,2019,3808,3639,2995,3912,3697,1789,2555,3310,3431,3529,2937,1980,3471,3859,3663,3032,3750,3506,1911,2799,3749,3421,3317,2990,20 09,3530,3738,3692,3044,3435,3199,2021,3263,3019,3854,3479,2938,2010,3508,3698,3643,2557,3 537,3753,1967,3318,2997,3779,3422,3671,3021,1915,3740,3862,3532,3048,3321,3754,2022,3645, 2940,3483,3875,3861,1790,2998,3781,3437,3512,2911,3700,1535,3761,3446,2807,3495,3538,3865,3056,1023,3322,3443,3553,2558,3646,3485,2012,3675,3027,3438,3540,3727,3001,2025,3972,38 77,3687,2811,3756,3782,1975,3501,3022,3866,3324,3445,3677,3002,2026,3920,3762,3785,2927,3 704,3554,1917,3878,3029, 3499,3976,3486,3030,3295,1999,3735,3764,3907,2975,3691,3544,3527, 1918,3043,3868,3881,3786,3793,2813,3909,2033,3788,3936,3004,3882,3678,3984,3794,1979,2935,3768,3449,3507,3889,3033,3391,2028,3693,3884,3045,3556,3502,3910,3739,2034,3034,3560,33 11,3450,3531,2991,3694,1981,3699,3509,3452,2939,3890,3533,3568,3741,2007,3046,3751,3796,3 913,2814,3701,3423,3539,1982,3510,2559,3809,3323,3534,3514,3513,2011,3036,3541,3319,3755, 3914,3049,3810,3971,3742,2036,3855,2999,3921,3892,3800,4000,3050,3863,2023,3439,3973,3702,3757,2941,3916,3705,3783,2040,3325,3023,3763,3896,3974,3758,2942,3812,3922,1791,3447,35 16,3542,3057,3555,3487,3557,3977,3867,2013,3003,3545,3706,3816,3924,4032,3052,3937,3765,2 027,3869,3978,3058,3787,3879,3546,3708,3766,3005,2014,3326,3789,3647,3985,3870,3031,3883, 3451,3769,3503,2029,3679,3561,3006,3938,3795,3558,3980,3790,3035,3885,1983,3548,3928,3911,3797,3060,3770,3986,3824,3940,3891,2035,3886,3047,3511,4001,3562,3695,3743,3811,3064,39 88,3535,2037,3915,3453,3569,2815,4002,3893,3798,4033,3944,3564,3703,1919,3037,3801,3772,3 515,3813,3917,3992,3051,3454,3894,3923,3802,2030,3570,3952,3038,3814,3517,3543,3707,4004, 3759,3975,3053,3897,2038,3572,3918,3817,3898,3804,3518,3007,4034,4008,3547,3925,3939,2041,3709,3979,3059,3559,3767,3818,3900,3825,3926,3929,3061,3576,3871,3327,2042,4036,3981,37 91,3549,3987,2943,3710,3820,4016,3941,3563,3771,3826,3930,2015,3054,3550,4040,3455,3982,3 887,4048,3942,3989,3062,3799,3565,3945,3773,4003,2044,3828,3932,3571,3803,3065,3895,3994, 3946,3990,3574,4005,3815,3832,3953,3066,3566,2031,3774,3993,3573,3948,3919,4064,3519,3805,3899,3039,4006,3954,4009,4035,3819,3577,3927,2039,3996,3806,3901,3068,4037,4010,3956,35 78,3821,4017,4038,3827,3931,4012,3902,3983,3055,3943,3711,3960,2043,3551,4018,3822,4041,3 580,3933,3829,4042,3991,3063,3947,3934,3830,4020,4049,3995,4044,3833,3949,4024,3567,2045, 3775,4007,4050,3067,3955,3834,3575,3997,3950,3807,4065,3957,4011,4066,4052,3998,3836,4013,4039,3069,3958,3903,4019,3579,3961,2046,4056,3823,4014,4068,4043,3962,3581,4021,4045,40 72,3964,4022,3935,3831,3070,4080,3582,4051,4025,3835,4046,4026,3951,4053,4054,3999,4067,3 837,4028,3959,4057,4069,2047,4058,4015,3963,4070,3838,3583,3071,4060,4073,4023,4074,3965, 4047,3966,4081,4027,4076,4082,4029,4055,4030,4059,4084,4071,4088,3839,4061,4075,4062,4077,4031,4083,4085,3967,4078,4086,4089,4090,4063,4092,4079,4087,4091,4093,4094,4095]

Sequence Group 3: Z3_4096

[0,1,2,7,3,8,13,26,4,12,15,30,18,35,37,82,5,14,16,34,21,41,51,87,24,50,45,94,61,103,11 0,177,6,19,23,43,25,49,55,96,31,59,63,104,76,117,123,195,36,65,80,121,85,131,141,208,93,143,15 5,235,161,248,271,391,9,20,28,58,32,62,75,112,38,81,67,124,90,135,149,217,48,78,92,142,98,152,160,243,108,163,180,260,194,278,296,434,57,95,106,159,119,171,188,274,129,189,207,288,220,3 13,330,471,146,215,239,318,246,331,356,502,266,363,385,528,405,551,593,816,17,27,33,77,42,84, 88,147,52,91,99,158,109,170,174,273,60,100,111,172,122,187,204,290,134,205,216,307,241,326, 350,491,69,115,130,193,136,206,223,319,156,237,247,334,265,362,378,525,173,257,275,369,289, 399,408,548,315,421,453,582,477,613,681,817,73,132,151,226,168,244,264,367,178,267,281,390, 297,407,432,571,202,293,308,418,332,447,473,624,344,480,507,650,535,693,719,942,222,321,338, 457,371,488,511,672,404,521,549,708,583,724,785,1011,431,561,595,756,609,805,833,1072, 677, 848,880,1059,914,1122,1203,1479,22,39,44,97,53,101,113,186,54,114,125,196,138,218,228,348,68, 126,139,232,153,240,254,349,162,252,272,383,294,403,413,547,71,150,164,234,182,258,276,402, 192,286,298,415,311,445,463,607,191,309,323,442,343,476,493,653,373,515,537,692,558,716,762, 992,83,176,184,283,200,304,322,436,210,329,337,472,357,501,520,688,269,351,372,506,392,533, 557,712,424,565,600,752,629,803,837,1048,302,387,417,544,441,580,603,788,468,618,638,813,68 2,863,893,1102,509,680,696,881,713,916,871,1140,771,986,1014,1221,1026,1306,1353,1539,89,1 97,203,342,259,361,376,514,285,381,395,540,423,569,599,791,300,420,440,570,456,605,632,822, 481,642,670,854,710,888,939,1151,347,446,462,630,492,661,699,873,538,700,720,935,774,910,1002,1226,578,745,799,987,823,1023,1054,1279,864,1066,1063,1341,1143,1376,1417,1670,386,478, 516,703,567,723,760,955,601,789,807,1017,846,1032,1062,1300,633,830,875,1051,894,1069,1146, 1380,952,1163,1194,1428,1250,1493,1531,1810,689,884,930,1149,999,1154,1238,1445,1009,1229, 1285,1516,1329,1567,1639,1919,1033,1309,1367,1592,1400,1651,1617,1957,1471,1707,1746,2065,1830,2125,2198,2406,29,47,56,107,64,127,140,224,70,144,154,231,167,250,255,396,72,165,175, 249,185,305,316,430,211,317,341,469,360,495,518,707,74,181,198,310,213,339,353,486,225,366, 379,523,398,552,575,726,238,389,411,564,437,596,615,780,448,608,644,827,649,853,886,1209,11 6,212,221,358,233,380,397,543,262,414,425,588,452,621,641,795,282,429,461,612,484,647,656,840,505,658,669,890,744,919,976,1228,301,483,498,666,530,697,704,903,556,741,766,951,812,995, 1019,1288,587,784,826,1021,867,1045,1108,1332,928,1116,1166,1384,1197,1439,1500,1799,120, 230,251,409,279,426,455,626,295,465,487,660,510,676,684,897,328,500,529,686,554,735,759,943, 584,776,809,1007,842,1036,1084,1291,354,542,574,764,617,802,798,1039,635,832,850,1074,906,1111,1133,1390,673,869,923,1125,946,1180,1200,1448,983,1224,1262,1519,1338,1575,1643,1925, 375,592,620,836,654,860,907,1119,731,926,962,1189,968,1206,1244,1488,747,964,980,1235,1041, 1259,1318,1564,1095,1335,1364,1595,1414,1676,1721,1977,778,1056,1080,1294,1134,1344,1373, 1626,1169,1407,1453,1704,1505,1752,1819,2087,1268,1460,1524,1768,1584,1841,1872,2182,1631,1900,1951,2224,2025,2299,2394,2688,137,263,287,466,324,496,524,715,336,534,562,739,590,7 70,819,1087,368,577,625,793,646,858,844,1101,663,877,913,1160,958,1183,1215,1474,439,637,66 5,857,730,901,932,1192,738,959,974,1218,998,1247,1277,1547,749,990,1029,1274,1092,1315,135 6,1600,1127,1397,1411,1679,1456,1727,1782,2051,450,728,734,948,751,967,1004,1256,781,1044,1077,1303,1113,1347,1404,1662,920,1090,1137,1361,1171,1431,1463,1712,1253,1468,1527,1771, 1587,1836,1866,2173,971,1177,1232,1434,1271,1511,1555,1793,1326,1570,1609,1860,1657,1906, 1971,2251,1370,1634,1690,1945,1743,1991,2047,2319,1804,2073,2117,2373,2157,2470,2494,287 5,458,755,767,1081,899,1105,1130,1393,936,1157,1186,1442,1241,1485,1542,1788,978,1212,1265, 1496,1297,1559,1612,1853,1350,1648,1604,1889,1718,1963,2019,2279,1098,1282,1312,1579,138 7,1621,1684,1931,1425,1693,1737,1997,1777,2033,2095,2362,1508,1757,1815,2059,1877,2133,21 65,2443,1914,2215,2243,2524,2308,2567,2601,2797,1174,1323,1422,1698,1482,1732,1762,2039,1 535,1825,1847,2111,1894,2141,2232,2482,1550,1883,1937,2207,2011,2260,2269,2583,2081,2330, 2350,2617,2420,2710,2750,3042,1665,1985,2005,2288,2103,2339,2385,2652,2149,2432,2455,2730,2539,2773,2904,3134,2190,2509,2552,2822,2633,2846,2933,3187,2671,2967,3002,3252,3083,33 28,3433,3584,10, 40,66,145,86,157,190,299,102,179,209,327,236,359,370, 576,118,201,219,352,26 1,388,438,594,284,433,412,623, 489,655,678,889,133,245,277,400,291,428,460,631,333, 479,499,6 59,555,705,725,938,364,508,568,718,589,750, 783,972,619,790,824,1040,841,1070,1123,1392,169, 253, 312,474,340,494,550,687,377,573,513,729,606,761,804, 994,422,563,614,786,639,814,839,105 8,671,849,895,1099, 934,1142,1182,1477,470,627,664,835,709,868,918,1132, 742,922,970,1164,100 0,1219,1260,1549,796,988,1049, 1234,1065,1263,1317,1607,1115,1334,1378,1653,1420, 1695,1766, 2107,227,306,346,560,394,586,597,800,444, 611,643,831,675,866,879,1129,485,648,683,872,721, 915, 960,1170,757,963,991,1205,1055,1251,1305,1585,522,698, 746,931,765,966,1010,1237,828,10 43,1067,1269,1112, 1331,1363,1650,876,1091,1136,1346,1167,1409,1426, 1688,1222,1452,1514,17 48,1560,1801,1910,2109,541,754, 810,1018,862,1060,1109,1340,892,1118,1147,1389,1184, 1423,14 76,1730,954,1173,1208,1447,1266,1503,1554, 1817,1293,1565,1616,1862,1667,1929,1969,2271,10 06,1240,1278,1522,1349,1582,1624,1896,1418,1641,1691, 1953,1750,1979,2067,2355,1472,1711,1 770,2027,1795, 2093,2131,2424,1904,2151,2192,2410,2236,2480,2570, 2856,270,382,406,636,449, 652,691,911,454,694,733,940, 773,996,1022,1299,517,736,775,1030,818,1052,1085,1302, 845,1083, 1126,1375,1176,1415,1436,1686,531,808,851, 1037,902,1094,1139,1412,927,1159,1187,1440,1216, 1498, 1534,1790,924,1210,1245,1495,1290,1557,1590,1864, 1355,1629,1669,1927,1709,1967,2035, 2332,581,885,905, 1153,950,1199,1243,1480,975,1257,1275,1552,1320,1605, 1638,1921,1120,1308, 1352,1614,1395,1660,1705,1959, 1458,1720,1779,2021,1827,2091,2137,2399,1196,1383, 1444,168 3,1492,1744,1784,2069,1544,1808,1843,2105, 1912,2169,2209,2460,1619,1908,1933,2194,1961,22 38,2180,2502,2048,2323,2357,2588,2371,2682,2733,2914, 602,944,956,1287,1097,1328,1360,1627, 1156,1372,1398, 1674,1455,1725,1775,2075,1190,1450,1490,1728,1521, 1786,1832,2115,1569,184 9,1893,2159,1955,2203,2266, 2514,1296,1501,1532,1828,1589,1879,1939,2184,1672, 1941,1973,22 62,2049,2230,2344,2593,1741,2009,2085, 2326,2119,2369,2403,2654,2171,2417,2415,2718,2504,2 756,2794,3031,1381,1562,1633,1943,1723,1975,2031, 2286,1781,2071,2097,2360,2147,2378,2413, 2676,1834, 2127,2186,2401,2211,2422,2507,2759,2284,2527,2560, 2806,2622,2868,2907,3150,192 3,2196,2256,2512,2341, 2517,2609,2825,2353,2598,2660,2891,2704,2940,3006, 3234,2380,2685,27 44,2960,2779,3016,2985,3266,2849, 3064,3098,3347,3166,3389,3444,3576,320,416,464,667, 503,7 40,779,1013,527,794,821,1028,859,1076,1088,1401, 536,855,882,1073,909,1202,1225,1469,979,12 31,1284, 1545,1325,1594,1636,1949,545,898,947,1213,984,1281, 1311,1577,1015,1337,1366,1645, 1406,1697,1736,1981, 1047,1386,1433,1716,1484,1773,1802,2057,1506,1791, 1851,2123,1858,215 5,2200,2575,702,982,1003,1321,1034, 1369,1403,1681,1104,1437,1461,1759,1513,1814,1845, 2079, 1150,1466,1529,1797,1574,1856,1870,2139,1610, 1873,1891,2205,2007,2241,2312,2596,1193,157 2,1599, 1887,1658,1935,1947,2221,1702,2003,2041,2282,2101, 2335,2364,2663,1755,2063,2121,23 66,2176,2396,2465, 2707,2253,2475,2529,2762,2562,2816,2878,3142,714, 1025,1078,1429,1144,14 64,1518,1823,1179,1537,1580, 1875,1622,1902,1916,2213,1254,1602,1655,1918,1700, 1995,2029,2 273,1753,2053,2099,2348,2143,2382,2439, 2665,1314,1677,1734,2037,1806,2089,2083,2387,1838, 2129,2153,2427,2226,2467,2492,2768,1898,2178,2247, 2484,2275,2544,2565,2828,2321,2591,263 6,2894,2716, 2947,3009,3239,1358,1764,1812,2135,1868,2167,2228, 2477,1989,2249,2295,2554,23 04,2572,2614,2865,2013, 2297,2317,2606,2389,2630,2696,2937,2451,2713,2741, 2964,2791,3034,3 075,3280,2055,2408,2434,2668,2497, 2721,2753,2992,2532,2785,2831,3060,2881,3102,3158, 3363, 2641,2837,2897,3114,2954,3174,3200,3427,2995, 3221,3261,3461,3313,3510,3569,3740,769,1106, 1161, 1540,1248,1597,1646,1965,1272,1663,1714,2001,1761, 2045,2113,2441,1343,1739,1821,207 7,1855,2163,2145, 2458,1881,2188,2234,2522,2290,2547,2580,2853,1487, 1840,1885,2161,1987,22 19,2258,2557,1999,2292,2310, 2585,2337,2620,2649,2920,2015,2328,2376,2646,2448, 2693,2736,2 971,2487,2776,2788,3038,2834,3079,3126, 3337,1509,1983,1993,2277,2017,2301,2346,2628,2061, 2392,2429,2679,2472,2724,2782,3024,2245,2446,2499, 2738,2534,2809,2840,3068,2625,2843,290 0,3118,2957, 3170,3195,3421,2306,2542,2604,2812,2644,2888,2927, 3138,2701,2944,2978,3191,30 20,3225,3275,3479,2747, 2999,3049,3257,3094,3289,3332,3523,3146,3352,3384, 3556,3410,3620,3 636,3827,1526,2023,2043,2436,2217, 2463,2489,2771,2264,2519,2549,2819,2612,2862,2917, 3130, 2315,2578,2638,2872,2674,2930,2981,3183,2727, 3013,2974,3212,3072,3270,3308,3497,2453,265 7,2690, 2950,2765,2988,3045,3243,2803,3053,3090,3294,3122, 3318,3368,3549,2884,3106,3154,33 42,3204,3394,3416, 3605,3230,3456,3473,3652,3516,3676,3694,3792,2537, 2699,2800,3057,2859,3 087,3110,3323,2910,3162,3178, 3378,3217,3400,3467,3628,2923,3208,3248,3450,3303, 3485,3491, 3685,3358,3529,3542,3702,3591,3750,3770, 3896,3027,3284,3298,3504,3373,3536,3563,3721,340 5,3598,3613,3760,3660,3781,3840,3929,3438,3644,3668, 3803,3712,3815,3853,3947,3730,3866,38 81,3968,3912, 3990,4016,4049,11,46,79,183,105,199,256,393,128,242, 280,427,314,467,482,743,14 8,268,292,459,345,512,572, 768,374,566,539,801,634,843,870,1117,166,325,365,526, 384,559,598, 811,435,622,645,847,717,900,925,1175,475, 657,732,917,758,953,993,1214,797,1001,1042,1292,1 064, 1327,1388,1668,214,335,410,616,443,640,711,878,490, 737,668,929,782,969,1020,1239,553,7 27,792,997,820, 1031,1061,1313,861,1071,1128,1359,1172,1408,1451, 1756,610,806,852,1057,908, 1096,1152,1396,945,1155, 1211,1432,1249,1494,1533,1826,1012,1233,1304,1504, 1322,1536,1591, 1884,1377,1608,1654,1930,1696,1970, 2040,2386,303,401,451,722,519,753,772,1016,579,787, 825, 1053,865,1093,1107,1394,628,829,874,1100,921, 1148,1201,1438,965,1204,1236,1478,1310,1523,1 578, 1863,679,891,949,1168,973,1207,1258,1507,1046,1298, 1324,1543,1374,1606,1640,1926,1103, 1351,1399,1620, 1435,1685,1703,1964,1497,1729,1792,2022,1837,2076, 2187,2388,701,957,1027, 1267,1086,1316,1371,1615,1121, 1379,1413,1666,1454,1701,1751,2004,1195,1443,1481, 1724,153 8,1780,1831,2094,1566,1844,1892,2138,1942, 2206,2246,2551,1255,1512,1551,1800,1625,1859,19 01,2174,1694,1917,1966,2229,2024,2254,2343,2635,1749, 1986,2044,2302,2070,2372,2411,2705,2 181,2430,2473, 2691,2516,2760,2845,3100,355,497,532,815,585,834,883, 1145,591,887,933,1178,9 81,1242,1273,1573,674,937,985, 1283,1035,1307,1345,1576,1068,1339,1391,1652,1446, 1692,1713, 1962,690,1024,1075,1289,1135,1354,1402, 1689,1165,1427,1457,1717,1489,1776,1811,2066,1162, 1483,1517,1772,1563,1835,1867,2142,1630,1907,1946, 2204,1982,2242,2311,2613,748,1114,1138, 1419,1188, 1470,1515,1758,1220,1530,1548,1829,1593,1882,1915, 2199,1382,1581,1628,1890,167 1,1938,1980,2235,1735, 1994,2054,2296,2102,2368,2416,2678,1467,1659,1722, 1958,1769,2018,20 60,2347,1820,2084,2118,2383,2189, 2450,2490,2739,1897,2185,2210,2474,2237,2520,2461, 2780,2 324,2605,2639,2863,2653,2946,2990,3149,777, 1181,1198,1561,1357,1603,1635,1905,1424,1647,1 675, 1950,1733,2000,2052,2352,1462,1726,1767,2002,1798,2062,2108,2395,1846,2124,2170,2438, 2233,2483,2548,2792,1571,1778,1809,2104,1865,2156,2216,2464,1948,2218,2248,2543,2327,251 1,2624,2869,2016,2285,2363,2607,2397,2650,2684,2921,2452,2698,2695,2979,2783,3011,3047,32 51,1656,1839,1909,2222,1996,2252,2307,2568,2056,2349,2374,2642,2428,2659,2694,2941,2110,2405,2466,2681,2491,2702,2786,3014,2564,2804,2836,3056,2892,3112,3143,3350,2201,2478,2536, 2789,2621,2795,2880,3071,2632,2871,2926,3131,2968,3172,3228,3422,2661,2949,3003,3192,303 2,3237,3211,3445,3093,3278,3306,3511,3364,3546,3588,3696,419,546,604,856,651,941,989,1261, 685,1005,1038,1280,1082,1333,1348,1678,695,1079,1110,1330,1141,1473,1499,1747,1223,1502,1 558,1822,1601,1871,1913,2227,706,1131,1185,1486,1230,1553,1586,1854,1264,1613,1642,1922,1 682,1972,2010,2257,1301,1664,1708,1992,1760,2046,2080,2336,1783,2068,2128,2402,2136,2437, 2481,2851,896,1227,1252,1596,1286,1644,1680,1956,1365,1715,1738,2032,1789,2090,2122,2358, 1416,1745,1807,2074,1850,2132,2148,2419,1888,2150,2168,2486,2283,2523,2594,2870,1465,184 8,1876,2164,1934,2212,2223,2503,1978,2280,2316,2563,2381,2616,2645,2929,2030,2342,2400,2647,2456,2675,2745,2970,2535,2754,2807,3018,2839,3066,3117,3343,912,1276,1336,1706,1410,17 40,1796,2098,1449,1816,1857,2154,1899,2179,2193,2495,1528,1880,1932,2195,1974,2270,2305,2 553,2026,2331,2377,2631,2423,2664,2719,2932,1588,1954,2008,2313,2082,2367,2361,2667,2112, 2409,2433,2708,2506,2748,2772,3023,2175,2459,2528,2763,2556,2821,2842,3074,2602,2866,2903,3133,2976,3179,3231,3425,1632,2038,2088,2414,2144,2447,2508,2757,2265,2531,2576,2830,25 84,2848,2886,3108,2289,2579,2599,2877,2670,2901,2958,3169,2731,2973,3000,3194,3044,3255,3 288,3457,2333,2687,2714,2935,2774,2982,3008,3218,2810,3039,3078,3276,3121,3310,3356,3524, 2909,3084,3137,3321,3185,3371,3391,3579,3222,3409,3441,3602,3486,3642,3690,3819,977,1368, 1430,1818,1520,1874,1924,2240,1546,1940,1988,2276,2036,2322,2391,2722,1618,2014,2096,235 4,2130,2444,2425,2737,2158,2469,2515,2801,2571,2824,2857,3096,1765,2116,2162,2442,2263,25 00,2540,2833,2274,2573,2590,2860,2619,2889,2918,3156,2291,2610,2656,2915,2728,2955,2993,3 198,2766,3029,3041,3258,3081,3292,3331,3502,1787,2259,2268,2559,2294,2582,2627,2898,2338, 2673,2711,2943,2751,2984,3036,3245,2525,2725,2777,2997,2813,3059,3086,3282,2895,3091,3140,3324,3188,3367,3387,3574,2587,2818,2874,3062,2912,3127,3163,3339,2965,3175,3205,3383,32 41,3413,3453,3617,3005,3224,3265,3437,3304,3465,3499,3653,3346,3515,3541,3680,3565,3726,3 737,3887,1803,2300,2318,2715,2498,2742,2769,3026,2545,2798,2827,3069,2883,3105,3152,3335, 2595,2854,2906,3115,2938,3165,3207,3379,2987,3235,3201,3402,3286,3448,3482,3632,2734,2924,2952,3181,3021,3214,3262,3429,3054,3268,3300,3469,3327,3490,3528,3674,3124,3314,3354,35 07,3395,3551,3570,3714,3418,3597,3612,3751,3647,3769,3784,3860,2815,2962,3051,3272,3103,3 296,3317,3494,3147,3360,3375,3538,3406,3555,3607,3732,3159,3398,3432,3593,3477,3622,3626, 3776,3520,3658,3669,3790,3703,3828,3843,3939,3247,3462,3474,3637,3533,3663,3686,3805,3560,3708,3719,3835,3757,3851,3897,3964,3583,3744,3763,3869,3797,3877,3906,3978,3812,3917,39 27,3994,3951,4010,4031,4056,229,504,662,1008,763,1050,1158,1459,838,1124,1217,1525,1295,1 598,1623,2012,904,1191,1246,1583,1362,1661,1763,2042,1421,1754,1710,2092,1861,2146,2183,2 485,961,1319,1405,1687,1441,1742,1805,2106,1541,1842,1878,2152,1976,2225,2255,2546,1611,1895,1998,2244,2034,2293,2340,2589,2086,2351,2398,2669,2421,2703,2761,3025,1089,1342,1491, 1833,1556,1869,1968,2197,1637,2006,1903,2261,2064,2309,2370,2615,1731,1990,2078,2345,212 0,2384,2418,2689,2172,2431,2493,2735,2541,2781,2823,3099,1824,2100,2160,2412,2231,2457,25 21,2770,2281,2526,2586,2805,2623,2861,2902,3157,2359,2608,2680,2876,2697,2905,2956,3203,2 752,2972,3012,3238,3050,3269,3320,3535,1270,1475,1568,1984,1673,2028,2050,2365,1774,2072, 2126,2407,2177,2454,2471,2767,1852,2134,2191,2462,2250,2518,2574,2811,2303,2577,2611,284 7,2686,2893,2945,3186,1920,2214,2287,2538,2314,2581,2634,2879,2404,2672,2700,2911,2749,29 69,2998,3236,2468,2726,2775,2983,2808,3040,3055,3264,2864,3077,3129,3307,3167,3344,3415,3 537,1952,2298,2379,2643,2449,2692,2746,2977,2488,2755,2787,3022,2826,3052,3097,3295,2566,2814,2850,3073,2908,3120,3161,3355,2934,3171,3210,3385,3249,3428,3452,3627,2629,2882,291 9,3136,2986,3184,3216,3407,3048,3229,3267,3442,3309,3458,3512,3671,3095,3281,3322,3487,33 40,3527,3550,3705,3412,3561,3585,3698,3609,3731,3771,3880,1385,1649,1699,2114,1785,2140,2 202,2513,1794,2208,2267,2550,2325,2618,2648,2939,1911,2272,2329,2658,2390,2683,2720,2942, 2426,2717,2764,3010,2817,3046,3063,3263,1936,2375,2435,2666,2501,2729,2778,3043,2533,279 9,2829,3067,2858,3116,3145,3336,2530,2852,2887,3113,2931,3164,3190,3386,2991,3220,3250,34 26,3279,3451,3492,3659,2020,2479,2505,2793,2561,2841,2885,3101,2592,2899,2916,3160,2959,3 202,3227,3423,2758,2948,2989,3209,3028,3244,3277,3446,3082,3287,3329,3483,3361,3526,3553, 3692,2838,3017,3070,3260,3111,3305,3333,3513,3153,3349,3372,3534,3417,3572,3594,3722,3213,3414,3430,3586,3447,3610,3578,3741,3500,3655,3672,3778,3679,3817,3836,3900,2058,2555,25 69,2928,2732,2966,2996,3219,2796,3007,3030,3254,3080,3291,3326,3517,2832,3076,3109,3293,3 135,3334,3365,3540,3173,3376,3404,3566,3443,3590,3625,3746,2936,3119,3144,3362,3189,3396, 3434,3580,3253,3435,3454,3623,3501,3606,3665,3780,3302,3476,3522,3656,3543,3678,3695,3806,3573,3701,3700,3831,3742,3845,3859,3936,3015,3168,3223,3436,3290,3455,3489,3635,3330,35 14,3530,3673,3559,3682,3699,3814,3366,3547,3581,3693,3595,3704,3743,3846,3634,3752,3766,3 863,3793,3885,3898,3969,3424,3587,3619,3745,3664,3747,3787,3870,3670,3783,3808,3892,3825, 3908,3928,3989,3683,3818,3841,3915,3854,3932,3922,3997,3878,3945,3955,4014,3973,4023,4033,4055,1510,1719,1813,2166,1886,2278,2334,2637,1928,2356,2393,2655,2445,2709,2723,3033,19 44,2440,2476,2706,2510,2844,2867,3092,2597,2873,2925,3155,2963,3193,3226,3440,1960,2496,2 558,2855,2603,2922,2951,3180,2640,2975,3001,3232,3037,3271,3299,3459,2677,3019,3061,3285, 3104,3325,3345,3506,3123,3338,3377,3545,3382,3564,3589,3773,2220,2600,2626,2961,2662,3004,3035,3259,2740,3065,3085,3315,3128,3353,3374,3519,2790,3089,3141,3341,3177,3381,3390,35 54,3206,3392,3403,3592,3475,3611,3649,3782,2835,3176,3197,3401,3242,3431,3439,3601,3274,3 472,3495,3633,3532,3661,3675,3809,3312,3509,3544,3677,3575,3691,3724,3826,3618,3728,3753, 3847,3767,3867,3888,3966,2239,2651,2712,3058,2784,3088,3132,3359,2820,3148,3182,3393,3215,3411,3419,3596,2896,3199,3240,3420,3273,3468,3488,3629,3311,3503,3531,3667,3557,3684,37 11,3810,2953,3256,3297,3493,3348,3525,3521,3687,3369,3548,3562,3706,3603,3725,3736,3849,3 408,3577,3615,3733,3630,3759,3768,3871,3654,3779,3798,3893,3830,3910,3930,3991,2994,3319, 3351,3552,3388,3571,3604,3729,3464,3616,3640,3764,3645,3772,3789,3884,3478,3641,3651,378

6,3688,3796,3822,3907,3717,3829,3839,3916,3858,3937,
3949,4000,3505,3697,3709,3811,3738,38 32,3844,3924,
3754,3856,3872,3944,3889,3956,3971,4018,3800,3874,
3894,3959,3913,3975,3981,4 030,3925,3986,3996,4036,
4007,4044,4054,4075,2320,2743,2802,3151,2890,3196,
3233,3449,2913, 3246,3283,3471,3316,3498,3539,3713,
2980,3301,3357,3518,3380,3568,3558,3720,3397,3582,360
8,3749,3638,3761,3775,3879,3107,3370,3399,3567,3463,
3600,3621,3765,3470,3639,3648,3777,36 62,3791,3804,
3902,3480,3657,3681,3802,3716,3821,3837,3918,3734,
3852,3857,3938,3873,3950,3 962,4012,3125,3460,3466,
3631,3481,3643,3666,3795,3508,3689,3707,3816,3727,
3833,3855,3934, 3614,3715,3739,3838,3755,3864,3875,
3946,3794,3876,3895,3960,3914,3974,3980,4029,3646,375
8,3785,3865,3801,3891,3904,3965,3824,3909,3920,3979,
3933,3987,3999,4039,3842,3926,3941,39 95,3954,4002,
4011,4046,3967,4015,4022,4052,4027,4061,4063,4083,
3139,3484,3496,3710,3599,3 723,3735,3850,3624,3748,
3762,3868,3788,3883,3901,3963,3650,3774,3799,3886,
3813,3905,3921, 3977,3834,3931,3919,3984,3948,3998,
4006,4042,3718,3807,3820,3911,3848,3923,3940,3992,386
2,3942,3953,4003,3961,4008,4019,4051,3890,3957,3970,
4013,3982,4024,4028,4059,3988,4035,40 38,4065,4045,
4068,4070,4080,3756,3823,3861,3943,3882,3952,3958,
4009,3899,3972,3976,4021,3 985,4025,4037,4062,3903,
3983,3993,4034,4005,4040,4041,4069,4017,4047,4050,
4071,4057,4076, 4078,4088,3935,4001,4004,4043,4020,
4048,4053,4073,4026,4058,4060,4077,4066,4079,4084,409
0,4032,4064,4067,4081,4072,4082,4085,4091,4074,4086,
4087,4092,4089,4093,4094,4095]

Sequence Group 3: Q3_8192

[0,1,2,4,8,16,32,3,5,64,1024,2048,4096,9,6,17,10,18,
128,12,33,65,20,256,34,24,36,7,12 9,66,512,11,40,68,130,
19,13,48,14,72,257,1025,21,132,35,258,26,2049,513,80,37,
25,22,4097,136, 260,264,38,514,96,67,41,144,28,69,42,
516,49,1026,74,272,160,520,288,528,192,544,70,44,131,
81, 2050,50,73,15,320,133,52,1028,23,134,384,76,4098,
137,82,56,27,97,39,259,84,138,145,261,1032, 29,43,2052,
98,515,88,140,30,146,71,262,265,161,576,45,1040,100,
640,51,148,46,75,4100,266,273, 517,2056,104,162,53,193,
1056,152,77,164,768,268,274,518,54,83,57,521,1027,112,
135,2064,78,2 89,194,85,276,4104,522,58,168,1029,139,
99,86,60,280,89,290,529,2080,524,196,1088,141,101,14
7,176,142,530,321,31,200,1033,4112,90,545,292,2051,322,
532,263,149,102,105,1030,304,296,163, 92,47,267,385,
546,2053,324,1041,208,386,4128,150,153,165,106,55,
1034,328,536,577,548,2112, 113,154,79,269,1042,108,578,
224,166,519,552,195,4099,1152,270,3072,641,523,275,
580,291,59,1 036,169,560,114,277,156,2057,87,197,1057,
116,170,4101,61,531,525,642,281,1089,278,526,2054, 177,
293,388,91,1044,584,769,198,172,120,4160,201,2065,336,
1280,62,282,143,103,178,294,1058, 93,644,2058,202,592,
323,1048,392,5120,297,770,107,180,151,1060,2066,209,
284,648,94,204,298, 1031,400,608,352,2176,6144,325,533,
1153,155,210,305,547,300,1090,109,2060,184,534,537,
115, 167,1536,4105,225,326,306,772,2081,157,1035,656,
329,110,117,212,1064,171,2113,776,4102,330, 226,549,
1092,538,387,308,216,2068,1154,416,271,279,158,337,
1043,4113,550,672,2304,118,332,5 79,1037,540,389,173,
121,1072,2082,553,199,784,4106,179,1038,228,338,312,
2072,704,390,1096, 174,554,581,393,1281,4114,283,2084,
122,448,353,1045,561,203,63,340,2055,1156,394,527,
582,4 224,556,181,1059,2177,295,285,232,124,1282,205,
182,643,2114,4108,562,1050,286,585,299,1537, 354,211,
2560,401,185,1104,396,344,4129,586,645,2059,1061,593,
535,240,206,1049,95,2088,327, 564,4161,1046,800,402,
356,307,2116,1160,301,417,213,568,1284,832,4116,2178,
588,186,1288,64 6,404,227,896,2067,1062,594,418,4352,
302,1538,649,771,2061,360,539,1120,111,331,214,1091,20
96,4130,309,188,449,1065,217,408,2062,609,596,1168,
551,650,4120,229,1052,2120,159,420,310, 1093,541,773,
2305,610,4132,1066,657,333,119,1540,3073,600,339,218,
1073,368,652,4103,230,20 69,1098,391,313,450,1296,542,
2180,334,233,4225,1184,555,774,175,2083,1544,123,658,
612,1312, 2306,4162,341,777,220,1552,314,424,2074,395,
1216,673,583,4608,355,1568,2561,287,183,234,1 094,125,
557,2128,4107,660,1068,616,342,316,2085,1155,241,778,
1105,563,4136,345,2073,452,10 74,397,403,207,2070,
1097,674,4164,558,1039,785,432,2184,357,1344,187,236,
664,4226,2308,115 7,624,587,1076,780,2312,705,126,
1047,4115,242,565,1158,2086,398,346,456,1408,358,2562,
4109, 405,1100,303,569,244,2144,1161,595,189,4144,
1106,566,2115,676,361,1080,706,589,2089,1051,4 110,
215,786,647,1121,2192,348,419,1063,406,4168,464,2076,
680,1283,801,362,1108,2117,590,43 53,409,1162,570,
2090,788,597,1169,572,219,5121,2564,1285,311,708,1053,
598,2097,601,1067,41 17,651,421,3074,792,1122,802,611,
1539,2122,4228,602,410,1112,231,688,2320,1164,653,248,
413 1,1054,2208,369,190,364,1170,654,2568,4354,659,
1095,335,480,2336,1286,315,221,1289,4122,25 76,370,
613,1185,422,425,2240,1600,6145,451,614,1069,2592,543,
235,1124,412,4609,2118,343,37 2,1664,775,317,2092,
1075,222,4176,426,1172,2179,453,237,1070,559,2129,
4133,833,1099,804,71 2,2098,1290,834,661,4121,1297,
2121,808,779,1541,617,1128,2063,4118,604,433,1186,720,
2368,8 16,1077,4232,836,347,2181,1217,897,243,1176,
2100,4356,662,454,1101,318,3076,675,1188,618,4 360,
898,2071,1792,781,376,2182,1292,4134,428,1298,665,
2432,736,1542,567,840,4610,2124,107 8,625,238,1107,
2185,359,4192,457,1081,399,2130,787,1545,591,1136,
4163,2104,678,434,1159,20 75,677,349,4137,1102,245,
2145,458,1313,666,1218,4240,2087,620,363,1109,2307,
127,191,4124,1 300,782,2132,1546,407,436,1082,4165,
2186,626,571,1192,2193,465,1163,681,4138,246,2309,
1123, 707,350,3080,4612,1110,599,1084,668,2077,790,
1304,4145,460,2091,249,1113,682,1314,2146,51 22,573,
411,1553,2563,803,789,1548,4170,709,2136,1220,365,440,
2188,1165,4368,628,1125,689,2 078,374,1171,4256,423,
2194,466,1200,793,2119,1166,4616,250,371,1554,2310,
481,1345,574,4384, 2313,413,1055,603,2209,1224,4624,
366,468,1114,2624,655,1569,900,4288,2093,805,1316,615,
30 88,1346,4640,684,710,2148,1556,429,1287,4166,2688,
794,252,1173,373,2099,1126,4140,605,848, 2196,1129,
690,1328,4227,2094,713,1320,632,2123,482,4177,1187,
806,2314,1116,427,904,6146,23 21,1071,414,1291,2565,
223,663,4146,1409,2152,692,1570,835,2210,4169,1348,
619,472,2101,123 2,455,4111,1410,2241,796,809,1174,
3104,4416,714,1177,721,2200,1189,837,4229,716,2125,
1130, 864,1079,2212,4148,810,1352,606,2816,912,5124,
1560,722,2316,1601,696,1572,4119,2322,377,4 35,1137,
2566,817,4230,1178,319,2102,1103,621,1293,4480,2131,
812,484,1132,2105,430,4172,160 2,838,2569,1248,667,
4233,3075,488,1190,239,2160,1543,4178,378,1576,2183,
459,1219,622,4152, 2126,627,1294,437,2337,4123,1665,
380,2242,1547,818,1299,4193,2133,461,496,1604,2324,
4135, 669,1315,2570,679,1083,724,4355,2106,1193,841,
629,2216,4180,1584,351,1138,3077,467,1301,4 234,2187,
438,1180,737,2147,4241,1111,251,1221,2134,462,4357,
442,2108,1140,441,1194,2328,51 28,469,1085,2137,247,
1555,4125,683,2338,1549,842,1666,4139,2577,738,899,
2572,1305,6148,67 0,1302,2244,783,1550,3136,4194,849,
1201,820,2189,1317,4611,728,2149,1412,928,1115,4184, 219 5,791,367,2224,1608,4236,901,1793,2190,630,1222,
4126,2578,685,1196,844,2369,4242,1144,633, 2079,1225,
711,4167,1360,2248,253,1086,3081,4358,691,1306,824,
2138,1167,4361,902,2593,1127, 686,740,4257,2340,1202,
850,2370,1318,4672,375,2580,1117,444,1668,4141,2311,
470,1226,2197,4 83,5136,1616,415,2150,1347,485,4196,
2153,1416,905,3078,1321,4736,795,1794,2352,473,4147,1
131,2344,634,1204,2211,4244,744,1175,852,2140,1233,
4142,960,2095,1308,865,2315,4171,1672, 693,2433,1118,
4362,797,1228,2594,906,1322,4369,2372,715,1424,3089,
807,4613,1632,474,2256, 1376,6152,636,2434,1349,694,
2198,4200,1557,254,2201,1179,717,4258,2213,1234,575,
1329,4149, 2154,913,1571,2103,798,4289,1324,3082,811,
1133,5152,2376,379,1208,2584,697,4248,1558,431, 2625,
607,4173,489,2596,1561,866,2161,4260,1139,723,2202,
1191,4864,486,2127,1249,908,2317, 4364,1350,718,1330,
3090,4370,813,1796,2156,476,4614,1181,2626,856,1680,
2272,4150,839,1353, 2214,725,4179,1134,2567,698,1141,
2600,4153,914,1236,2243,752,4617,1195,3200,868,1800,
5123, 2318,819,1354,2689,4208,814,1250,439,2571,1573,
4231,929,2323,1562,490,6160,2628,1411,623, 2339,4174,
1332,671,2107,1240,4385,739,3084,1440,916,2217,4290,
1295,463,2608,1303,4181,843, 2162,1182,381,4372,2325,
1361,497,2204,4618,1574,930,2135,1696,4154,821,2245,
1142,726,426 4,3105,1356,1603,2164,5125,961,2218,1564,
872,2109,4235,1413,492,2579,1197,4195,631,2573,1 145,
729,4182,2690,1577,700,2329,4156,1223,443,3137,1808,
4376,741,2326,1203,845,4185,2574, 1252,920,2225,4386,
1362,382,2341,1336,4625,822,2436,1728,2139,6176,1414,
851,3092,1198,462 0,730,2632,1578,498,4292,2817,1605,
880,5184,2246,1417,742,2220,4237,1307,445,2168,1146,
41 97,2249,471,1472,2384,4243,1377,635,3328,1585,4272,
932,2110,1227,687,4238,2330,1087,903,2 191,4626,1364,
2151,825,4417,1418,2226,500,1551,4127,2342,1606,846,
3106,4296,1580,745,2141, 1205,5129,2692,826,1319,2250,
4186,732,1309,2640,4641,446,1256,2371,1148,4388,3096,
962,12 29,2440,6147,936,1206,2345,4418,475,1667,2818,
853,4628,2155,1586,867,2228,4359,1310,1609, 2199,637,
4245,1323,3108,907,4198,2257,1378,487,2332,4201,1235,
695,2696,5126,1425,2142,120 9,746,4400,2252,1420,828,
2346,4392,1368,3079,753,4259,1610,2448,854,1669,4188,
2656,1617,2 400,857,4143,1559,2373,504,4363,1264,2581,
799,3201,4481,1230,1119,2203,4642,255,1351,2258, 964,
6149,2353,1588,909,4420,2595,1824,719,2348,5137,1426,
3138,1380,4304,477,2157,1331,91 5,4482,2232,1325,2582,
4246,638,1441,2585,1237,4249,2163,748,1592,4261,2215,
944,1856,3584, 4202,869,2273,1612,4151,1210,2374,491,
5130,2354,1670,699,2820,4424,1428,1251,2205,4632,75
4,3083,1920,858,4673,2704,1618,2377,4644,478,1442,
2158,6208,1326,968,2165,1673,4209,2260, 383,1795,4250,
3112,910,2219,4175,1384,1563,2824,815,4365,2378,1135,
976,5138,2274,1355,259 7,4204,1238,870,3140,1333,4674,
2586,917,1212,4320,2435,1473,2356,4262,727,1241,2264,
493,4 615,3202,1432,873,4648,2464,1633,2319,4291,1620,
701,2327,5248,1575,2206,931,4366,1674,238 5,1253,3091,
7168,756,1183,2598,4737,860,2720,1444,4619,1334,2166,
499,4371,2380,1565,731,2 627,4676,1797,3085,1634,4387,
823,2588,1681,4155,2437,922,1357,5132,2221,1143,2169,
4265,87 4,1624,3120,4656,918,2601,1363,4210,2247,1242,
502,2832,4373,1392,2227,933,4252,1676,3086, 1254,6153,
2276,743,1415,4183,2386,1337,2360,4293,760,2752,1474,
5153,881,2438,1566,4212,31 44,1358,494,4266,2222,1257,
2602,4157,702,2629,1579,4627,1798,2441,921,4621,3329,
1199,501, 4738,2331,1147,2170,4377,1682,2496,876,5185,
1636,2401,1365,4374,3093,847,1801,2609,4622,9 92,2251,
6150,1244,2111,1338,4273,447,2388,1448,4389,3204,
1419,2442,4484,733,1697,2575,418 7,827,2630,1607,5140,
2604,1379,934,4680,2229,1311,3107,4865,1207,2343,882,
4294,1258,2333, 937,4268,2280,1149,2172,4216,1581,963,
3330,4297,1684,2253,1640,6161,2230,747,1366,4432,26
91,505,2610,5376,1340,3098,1265,4158,855,2334,4378,
1802,2633,1587,4239,2347,924,3585,4199, 1369,734,2402,
4274,1476,2259,1421,4390,2449,829,1427,5154,2233,
1231,3152,4189,965,2444,4 740,1698,2392,1582,6154,938,
2634,1809,4298,2693,1456,3109,4688,884,1381,2641,
4419,506,258 3,5144,1211,2288,1260,4488,2254,749,1688,
4393,3097,1648,2143,4866,945,2375,1611,4203,2612,
1804,4276,966,3094,1729,4247,2848,1150,2450,5156,755,
2404,1266,6162,859,2355,4305,1589,3 208,1422,4380,
2349,940,2465,4744,1370,2261,4190,1480,830,2616,4300,
1382,3332,1429,4394,28 80,911,2636,5127,1327,1593,
4496,2234,871,3336,4704,1268,2694,1619,4448,2452,639,
6272,2275, 1213,1590,4421,2944,888,3110,4629,1700,
2642,5249,1385,2466,479,4251,2350,1730,3586,4306,
1613,946,4401,2697,1239,2819,4643,750,2408,4396,1810,
2587,1671,5186,3168,969,2159,4205,13 72,1443,6156,
2379,508,2262,4280,1430,3139,4630,1488,2357,861,4633,
2236,1704,2497,4211,182 5,757,4263,3113,1386,2265,
5632,1614,2456,4321,970,2657,1433,4422,2644,1594,
3216,4402,919, 2599,4868,1812,1621,2698,6177,1596,
2277,4253,875,3100,1243,5131,2207,1335,4752,2468,
862,2 358,4425,1732,3141,4206,1622,2589,758,4213,1625,
2821,4308,1675,2658,948,5160,3114,1445,42 67,2705,
1816,2381,6209,977,2167,4872,1826,3588,1635,4426,
2648,923,4322,2387,1626,2266,464 5,1434,972,5188,3121,
1255,2416,4634,1712,2700,4483,761,2278,1677,4404,
3146,1272,4312,2439, 877,6164,2361,1393,2498,5250,
1214,3344,4512,1388,2590,952,4367,2382,1678,4375,
2281,1683, 495,4254,3232,1359,4433,2603,1504,5139,
2822,703,2223,4646,1339,3592,4768,1245,2171,935,64
00,2706,1394,4214,2660,1637,4428,3360,978,2389,4675,
1446,2825,5133,1449,2268,1475,4636,36 00,883,4485,
2362,1638,4269,2472,1567,2443,4217,762,3264,5168,
1259,2721,6178,1436,2631,503, 4649,2403,1367,4295,
3616,1396,4880,2335,925,2231,4275,1799,2282,5134,
1341,3142,4324,1246, 2173,878,4434,2605,1450,4408,
2708,1477,6168,3116,735,2664,4800,1261,2390,4486,
1583,2364, 5192,1857,3203,4270,993,2289,1828,4650,
2826,1736,4677,3153,885,4489,2611,1858,2393,5377,1
685,2500,4379,939,3122,6180,1832,2445,4218,1803,2451,
1641,4544,2255,994,4449,3145,1628,51 41,2722,1457,
4657,2606,980,3087,4299,1744,2833,4159,1840,2480,
4436,1860,2405,6151,926,339 2,5252,1371,2235,1921,
4490,2284,764,4623,2712,1267,4678,3205,1686,4652,
2672,1478,2635,427 7,941,3124,5155,1342,2828,6273,
1699,2753,4391,967,2174,4381,1642,3095,4328,1922,
2290,1805, 4220,2613,886,5378,1400,1452,4301,3206,831,
4278,2446,1689,4739,2394,1760,6210,2504,1591, 3456,
4658,947,2406,5146,1864,2453,4382,1649,3148,4681,507,
2351,4395,1262,2617,5633,1383,2 292,4450,1481,3209,
889,4307,2643,1423,6656,2237,1811,4497,3154,1615,
4281,2614,984,5200,27 24,1702,4492,2409,1458,4440,
3128,751,4682,2754,1701,4741,2637,1373,3099,6155,
1269,2263,51 57,942,2834,4689,1482,2695,4631,1690,
3169,4336,1644,2396,4302,996,2467,5145,1387,3111,419
1,1151,2454,6184,1215,2512,4423,971,2728,4660,1806,
3331,5142,1431,2849,4896,890,2410,1460, 4498,3156,
1650,4452,2638,1595,4403,2457,509,6212,3210,1489,
5256,2618,1705,4397,2836,1270, 4513,2645,949,4309,
3217,1731,4664,2620,1374,5380,2267,1623,4928,3333,
973,6274,2359,1692, 4684,2756,1814,4282,3101,1484,
5384,2646,1000,4742,2649,1273,4500,3115,1706,4323,
2699,159 7,4992,2469,892,6163,2840,1435,5158,3170,
1827,4690,2850,1813,4514,2659,950,4398,3587,1733, 5634,2650,1389,4745,2458,1464,4867,3160,863,6157,
2279,2736,4456,1652,4635,3212,1713,5216, 2701,1398,
4207,2296,759,4427,3102,1447,4310,2417,1490,5187,
2238,1817,6192,2412,1008,4405, 3218,1274,4284,2702,
1395,4545,2707,1505,5161,3143,510,4313,2383,1598,
4504,2528,3334,6158, 1437,2363,4705,1627,4692,2269,
979,5264,3337,1390,4647,2418,1492,4746,2661,1679,
4325,3233, 953,5148,2470,1924,6216,2473,1829,4255,
3648,1639,4516,2499,4406,2662,763,5189,3117,1708,
4637,2591,1734,4869,2283,1453,6401,3172,974,4706,
2460,1818,5162,2391,1276,4753,2420,4429, 1397,3712,
4215,2823,1629,5636,2365,954,7169,3123,1872,4696,
2270,1714,4435,2474,4314,1737, 3220,5169,879,2501,
4464,1656,2285,4748,3118,1506,4326,2607,1830,6165,
2881,5194,981,3147,4 487,1451,2852,4409,1928,2760,
4546,1438,3338,5392,2882,982,4638,2709,6276,1247,
3345,4430,1 687,2856,4329,1716,2827,5280,1859,3589,
4651,927,4870,2665,3176,4271,1643,2652,6179,1496,2
481,5640,1479,3234,4219,995,4754,2768,1820,4708,2864,
1833,5408,3125,2884,6402,1738,4437,2 395,1745,4873,
3265,765,4316,2945,1861,5648,2291,4410,3224,1740,
4520,2710,1888,6170,2502,9 56,4491,3149,5312,1834,
2366,4769,1630,2723,4679,3236,1936,4451,2666,5664,
1746,2946,6657,8 87,3840,4383,1720,2829,4279,1401,
4330,2424,3340,5190,1459,2476,4221,1841,3346,4653,
985,62 24,2713,1343,4756,2784,3590,5164,1645,4712,
2615,1836,4438,2888,997,4412,3126,1508,6181,26
73,5251,2286,1454,4337,3155,1862,4874,2407,5201,1691,
2505,4659,986,3129,4441,2447,6169,15 12,2835,4548,
1263,3593,5170,1402,4493,2639,3184,4499,1483,2726,
4303,943,6166,2482,1646,51 93,3207,1651,4770,2725,
2397,4654,1461,5135,3150,1404,4881,2293,4528,891,
2506,6280,3361,18 42,4453,2714,5440,1485,3266,4283,
1520,2668,4332,1693,4760,2411,3157,6404,998,2175,
5253,17 03,4720,2239,1748,4683,3348,2830,5172,1865,
4876,3594,766,6408,2455,1653,4801,2484,4222,31
30,1375,5143,2674,4338,1491,2619,4661,1462,3240,5254,
2513,6182,511,3211,4494,1761,4442,27 29,1275,4552,
2294,3171,5504,1486,4454,2755,1466,6658,2398,4501,
1465,3158,5196,2647,988,43 99,3132,4665,1493,2716,
4340,1271,6240,2838,3352,5257,1707,2508,4691,1866,
4285,2297,3161,5 202,1001,4662,2730,1762,6211,3362,
1923,4772,2621,4457,2459,1694,5176,3601,4802,1807,
2851, 4685,951,6185,2837,3596,5147,1873,2757,4311,
1844,4882,3268,2413,4743,1752,5217,2488,1952, 6288,
3213,4444,1002,2676,4515,3173,5159,1815,2737,4502,
1391,4560,2422,3219,6172,1925,247 1,4776,1654,5379,
2514,1709,4897,3248,4458,2841,893,5204,3214,6213,
1868,2298,4686,2419,450 5,1657,3602,5258,1735,4666,
2529,3393,6186,1277,4884,2622,975,4693,2461,5265,
1715,3103,466 8,2651,4315,1848,3272,6660,1926,5381,
2414,2516,4407,1710,4804,3162,894,5149,2703,4694,361
7,1764,6193,2948,4697,1874,2853,5163,3364,4747,1399,
2663,4517,1468,7170,3394,2732,4888,14 94,5218,2758,
1009,4898,3604,4707,2477,1507,5635,3335,6218,1439,
2842,4698,2300,4506,1509,3 221,5208,1929,4327,2421,
3174,4784,1819,6416,2653,955,5260,2896,4749,3177,
4344,1497,2738,5 150,1658,6304,3376,2761,4465,1768,
4286,3368,1876,4460,2680,5266,2530,1984,4750,3235,
6664, 1004,4755,2854,3164,5191,1889,4431,2475,1717,
4576,2952,6432,3119,1821,5382,2462,4411,193 0,3339,
4317,2271,5385,1010,6672,2711,1739,4466,3457,4709,
2740,1831,5281,3618,4518,2883,45 21,1498,3396,6336,
1660,5696,2667,2520,4547,1718,4710,3280,957,5165,
2503,6688,3458,4639,12 78,2844,4331,1741,5220,2857,
3222,4508,1599,6214,2762,4439,3225,1937,4468,2769,
5760,1822,3 237,4871,2885,4413,983,6188,2764,1835,
5171,3178,4318,2912,4522,1403,3127,5268,2858,6275,1
721,3400,4549,1455,4333,2654,5166,2960,1631,4655,
3608,6225,1513,2770,4929,3649,5195,958,4 900,2744,
3620,4808,1890,6194,2425,5386,1747,2483,4930,3185,
4757,1510,5393,2865,3226,6217, 1932,4904,2367,4875,
1742,3151,5637,2669,4713,987,3341,5224,2860,6159,
1837,4700,2532,1500, 4529,3180,5282,2478,4816,1880,
3650,6464,2886,4912,1863,5173,3296,1749,4932,2715,
4443,253 6,6277,1012,3238,5313,2287,4993,1722,4339,
3591,1938,5272,2426,6196,3624,4758,1776,2507,45
50,3267,5197,1892,4414,2670,7172,1843,2675,4771,3342,
5284,1838,4714,2485,3713,4994,999,61 67,2428,5888,
1463,3595,4877,2866,4472,1953,6278,3347,2509,5388,
1514,4524,2544,5394,3652,4 761,1647,2717,6528,1695,
4832,3363,5638,2727,1763,4663,3131,4936,2772,6220,
1016,3241,5174, 2889,4721,1940,4334,2677,5203,1487,
3632,6281,2399,4455,1867,4553,3186,5177,2515,1405,449
5,3349,6226,2486,4883,1521,3228,5641,2785,4687,767,
5232,3159,6200,1954,2299,4774,3269,453 0,1845,5255,
2510,6171,2490,1750,4773,3188,4445,2489,5198,1985,
4341,3242,1896,6241,2517,45 54,3133,5409,1516,4762,
2295,3603,5314,1655,6183,2731,4716,3597,4459,989,
2890,5205,3714,64 03,1753,4223,2786,4287,2947,1724,
5396,3353,4878,1467,6228,2718,5642,3350,1765,4503,
2831,4 532,3598,5178,1869,6282,2897,4722,3249,1944,
4667,2868,5288,3365,6289,1003,4561,2776,3460, 5259,
1406,4777,2976,4342,3163,6405,1846,5219,2839,1875,
4803,2415,4446,3656,7176,1754,520 6,2949,3841,4695,
1522,5180,2678,4764,3270,6173,1904,4886,2733,3244,
5400,990,4556,2892,618 7,3192,4345,1766,5209,2681,
3273,4778,1469,5410,2759,6242,3408,4669,1495,4507,
2301,5649,31 34,1659,6659,2739,4899,3354,4885,1956,
5644,2872,4805,3215,1711,6232,2950,5316,3175,4461,1
927,4536,2734,6284,1005,5261,2788,3250,4724,1849,
5221,2898,4785,3366,6174,1524,4470,2423, 5267,3165,
1870,4519,2492,6290,3716,4562,1769,5296,2518,4889,
3274,6215,1850,2531,5262,366 4,4346,1756,4467,2463,
5650,3395,6406,1470,4577,2533,3464,5441,959,4670,
2953,6409,3369,450 9,1986,5151,2843,4699,3842,6305,
1960,2521,5320,3179,4462,1499,4564,2682,5210,3252,
6720,18 77,4751,2792,5665,3223,1891,4996,2900,6189,
3281,4901,3008,5412,1661,4711,3356,7184,2913,5 442,
1931,4780,3720,2741,4806,1011,6244,3166,5652,2845,
4525,1511,5383,3276,6784,2954,4890, 1719,4348,3370,
5269,2763,1770,4469,3472,6195,2855,5222,1852,4701,
3680,4944,2522,6292,177 7,5225,3424,4786,2684,5424,
1878,3397,6190,2742,4809,1881,5416,3605,4728,2302,
6219,1013,45 78,3227,5283,2765,4902,1528,6410,3282,
5212,2623,3377,4523,1823,5000,2961,6417,3619,5167,1
279,4510,2846,5387,3372,6661,1988,4319,2859,4759,
3181,5505,1933,6248,2427,4788,3256,1743, 5666,2745,
4931,3606,6306,1501,5444,2479,4715,2655,4568,2537,
6197,1939,5328,3609,4551,291 4,5506,895,6337,3187,
4892,2771,4905,1662,3239,5270,2534,7200,1772,4810,
3297,5273,2956,481 7,1968,6296,3398,5285,2766,4933,
3378,4812,1893,6221,2861,5226,3844,4960,1515,5175,
2524,63 08,3229,4906,1723,5448,2904,4702,3728,6912,
1778,5008,2887,3401,5656,1882,4818,2773,6412,3 182,
5697,2746,4792,1006,5668,3189,6418,2962,4473,1502,
4531,3284,5233,2800,6662,1992,4913, 3243,5274,2916,
4415,3848,6198,1407,5199,2867,4717,3402,5389,1934,
6227,2862,4908,3298,458 0,1839,5228,2487,6201,3621,
4526,2000,5698,2977,4934,3610,6665,2538,5344,1894,
4763,3459,71 71,2671,4584,1941,5286,3380,4335,2719,
6256,1014,5639,3288,4474,2787,5672,3488,6279,1751,4
555,2964,5315,3343,4718,1517,6222,2511,4723,3351,
5390,2891,1897,4533,6433,3230,5761,2429, 4476,1725, 6338,3409,5643,2545,4914,1955,5395,3622,6229,2978,4557,3744,4592,1780,5700,286 9,6420,3190,4765,1884,5411,2774,6666,3404,4775,1523,5179,3651,4820,3009,6202,3612,5289,17 55,4937,2920,4725,3461,6312,1017,5680,2540,4447,3245,5234,2679,7173,1847,4563,3193,5397,2 777,6283,1946,4534,3625,5276,2748,4833,3271,6243,1898,5207,2491,4347,3856,5317,1942,6230, 2789,4558,3251,4538,2893,6204,1526,5236,3300,4537,2968,5290,1957,6424,4565,3410,5181,243 0,6233,3384,4343,1767,5651,2870,4779,3776,6434,1784,5645,3462,4938,2899,5762,3246,6673,19 05,4834,2778,4995,3626,6668,1018,5401,2546,4766,3653,5398,2928,6340,1518,4879,3465,2790,1 726,5646,3355,7232,2493,4945,3194,5297,1945,4916,2519,6285,3520,5413,1525,4824,3425,6245,2683,5508,3633,5024,1900,5211,2980,6291,3275,4887,2735,4463,1871,6320,3135,5704,2951,499 7,2016,3412,5889,2873,6286,3466,4726,1471,5318,2548,6674,3599,4781,1757,5292,3654,4940,28 94,6465,3628,5240,1851,4729,2793,6175,3253,5321,2874,4807,991,5456,3367,6344,2780,4349,19 58,5182,3357,7177,2494,4787,3304,5402,1906,4920,3196,6234,3010,5263,3277,4998,1961,6689,2 984,5223,3254,4782,2523,4836,1987,6436,3715,5298,2901,4946,1771,6466,3634,5414,2915,4471, 3358,6676,1529,5213,3657,4540,2685,5764,3371,6407,1879,4566,2955,5322,3426,6293,2535,457 9,1948,5712,3283,4511,2743,6246,1758,5443,3473,4581,3257,6249,2794,5512,1853,5001,3468,71 74,2876,5417,3416,4891,1020,5890,2801,6448,3658,4569,2902,5227,1989,6440,3717,4730,3665,5 300,1962,6307,2905,4840,3607,5271,2552,4948,1908,6236,3312,5329,2847,5056,3278,6191,1530,5404,3167,4961,2303,6411,3399,5768,1773,4789,3012,6529,3636,5214,2957,4893,1969,5324,387 2,6690,2767,5002,3474,5418,1990,6468,3428,4811,2525,5520,3379,7185,1779,4903,2963,5728,33 73,4570,2686,6352,5472,1883,4732,3489,6530,3285,5445,2796,4790,1964,6294,3640,5653,2992,4 350,3904,6297,1854,5275,2917,4813,3660,6309,3258,5330,1935,4671,2539,5425,3718,6250,2747, 5009,1007,5667,3476,6199,4894,3299,5420,2802,7178,1895,4907,3968,5229,2906,6472,3666,447 5,1663,5304,2526,6680,3490,4793,3374,5654,1912,4527,3016,6721,3721,4703,2431,4585,6692,15 03,5657,3843,4962,2958,6257,3432,5235,1970,4819,3611,6298,2863,5287,3183,4582,1774,6223,3 024,5345,3403,5004,3286,6413,5446,1993,4814,2918,5426,3381,7186,2965,4909,1532,5892,3260, 6252,3521,4572,2775,5277,1885,6722,3289,4952,5776,2541,6368,3480,4935,1781,5449,2921,6310,3681,4821,3668,5230,1994,6663,2749,4794,3623,5237,6696,2979,5010,3722,5332,1943,6339,33 01,4848,2804,5291,3231,7296,1015,4964,2908,5896,3492,6414,4915,3382,5450,1899,6785,2547,4 910,3613,5346,2779,4535,1886,6667,3845,5669,5025,3682,6419,2871,5658,3729,4586,1782,6724, 2970,5507,3405,4719,3191,6435,1972,5428,4767,2922,6203,3672,5336,2966,4835,2001,7180,3411,5536,3290,5012,2550,6313,5391,1947,4559,3440,6704,2981,5399,3724,4939,3302,6258,1996,52 78,4477,2791,6421,3463,5457,3385,4593,1785,6300,2808,5670,3522,5026,6231,2929,5792,1901,4 917,3614,6341,3406,5238,2542,4822,3305,7201,5452,1976,5699,2750,6260,3627,5057,3846,6314, 1519,5660,2969,4968,6205,3247,5509,2549,4588,3195,6675,1727,5293,3730,4727,6669,2924,5241,3684,4825,1959,6786,3413,5673,2895,4796,3849,6425,5319,3040,4539,2002,7233,3292,5904,33 86,4837,2495,6422,5299,1019,4941,3496,6670,3467,5348,2781,5016,6321,3745,5458,1907,4478,2 875,6437,3655,5432,3427,4918,6532,1786,5824,2982,6235,3359,5510,3255,4947,2930,7188,5294, 1527,4826,3306,6728,2985,5674,3197,4594,6913,1949,5701,3629,4976,3011,6342,3732,5513,3688,4838,6316,1902,5403,2795,4541,3414,6264,2553,5242,6345,3388,4567,1759,5568,3313,6480,29 03,5473,4731,3850,7424,2017,5681,3635,5028,2972,6206,5323,3417,4783,2782,6426,1909,5183,3 524,4999,6287,3469,5460,2877,6247,3475,4921,1963,5514,6322,3279,4596,3013,5647,3746,6438, 2018,5702,4942,3630,7202,2986,5676,3857,4841,3504,6237,5301,2004,6788,2932,4922,3429,5415,6346,2554,4828,3259,5405,1950,6736,3308,4542,5352,2797,6467,3736,5244,3696,7192,5058,17 88,5325,2993,6536,3659,5032,3852,5302,6441,3014,4571,1965,5763,3777,6914,4949,3198,6251,2 803,5682,3314,4963,1991,6324,5406,2907,5705,3637,6295,3470,4733,5419,2988,7204,1021,5003, 3418,6353,5474,3528,4583,2878,6428,1910,5331,4791,3430,6792,3477,5521,2959,6238,3375,5305,4842,1855,6348,3641,5516,2919,4924,6442,3316,5464,3667,7175,1971,4849,5706,2687,6544,32 61,4950,3638,5765,6752,2936,5713,1531,6496,3748,4953,5655,3433,6469,2527,4600,3778,5360,6 677,1913,4895,3661,7297,2994,5326,5215,3287,6299,2798,4351,5447,3858,6354,2008,5060,3719, 6449,5684,3017,5005,3420,6691,3491,5920,4815,1775,6444,2556,5522,3478,7234,5476,3536,4573,2909,6253,5427,1966,5011,3752,6328,3873,5421,6678,2805,4734,3434,5537,2020,6681,5333,36 62,6259,3018,4844,5688,3481,6311,3642,5040,1995,5952,7680,2967,4965,3860,6369,3669,5708,5 306,3644,6470,2923,4587,6450,1914,5766,3291,4795,3383,6916,5524,2910,5347,3780,6301,4850, 1533,7179,3670,6016,2806,4954,6800,3673,5714,3723,6473,4574,1973,5538,2996,6254,5422,3493,5064,3864,6261,3025,5769,6356,3874,4479,1997,5891,7208,3683,5006,2971,6315,3674,5480,56 59,3482,6920,2024,4911,6474,3020,5231,3303,5072,6370,3760,5451,2809,6693,5334,1916,4966,3 725,7236,3320,5429,6682,2925,5013,3441,5308,6531,3262,5569,1974,6452,4823,3436,5337,3000, 6360,4589,3726,7298,3731,5528,4969,1887,6560,2543,5729,3407,6415,5716,3552,4797,2751,6423,5671,3387,6302,1783,5027,5770,3293,6481,2983,5349,7187,3442,4852,3685,5279,6694,3026,49 56,1022,6816,5540,3494,5430,3497,6262,4595,3523,6476,2931,5661,4827,2032,6723,3686,5893,7 181,3615,5730,2810,4919,6684,3307,5777,3484,6533,5018,1534,5453,2551,6317,5239,3415,6265, 3444,4970,5720,2973,7216,3847,5014,6697,2003,5459,3389,6343,5338,3294,4598,2926,6928,5488,3498,6323,3525,5029,5772,1977,7182,2783,5350,6372,3309,4839,3631,5511,6482,3905,5433,17 87,6456,4856,3041,6848,5570,3876,4977,3784,6534,5662,2933,7240,3906,5454,4590,1998,6318,3 733,5353,6698,2987,4798,3880,6725,5675,3851,5894,6537,3689,5017,1978,7425,5295,3042,4597, 3676,6427,5243,3505,6266,3028,5778,6592,3792,4972,1903,5732,6497,3888,5461,7189,3908,4943,2974,5897,6705,3419,5088,3969,6347,5340,2005,6207,5434,2812,4543,3315,6484,5544,3734,73 00,3526,5515,6538,2989,4829,5793,2006,6671,3390,4923,6726,3747,5703,3015,6700,5475,3690,5 030,6325,3970,5407,1951,7203,5303,3853,6439,2934,4978,5354,3448,6429,5033,3500,6376,2879, 5245,6268,3737,5677,2019,5059,7426,3808,5780,6349,3639,5736,2995,6326,4843,3912,5462,6787,3697,4601,1789,6706,5436,2555,7194,5361,3310,4951,3431,6430,5898,3529,6729,5683,2937,64 43,1980,5020,7681,3471,5465,4830,3859,6498,3663,5572,6355,3032,5517,6545,3750,4925,3506,5 523,6329,1911,5327,7248,2799,5061,3749,6540,5794,3421,6488,5678,3317,5034,2990,6730,5905, 2009,6789,5552,3530,7205,3738,4980,5477,3692,6737,4602,3044,6679,3435,5307,6384,3199,5356,6350,2021,4845,3263,5784,7193,3019,5744,6239,3854,5041,6471,3479,5707,2938,6708,5900,20 10,5062,7190,3508,5825,3698,6944,5246,3643,6546,4851,2557,6500,5362,3537,4955,3753,6451,5 685,1967,7304,5518,3318, 6445,5036,2997,6561,3779,5466,6357,3422,5576,4926,3671,6712,5478, 3021,7428,1915,5525,6976,3740,5007,6732,3862,5423,5689,3532,6330,3048,4967,7432,3321,5364,6790,3754,5715,6548,2022,4735,3645,6371,5309,2940,5686,7040,3483,4984,7206,3875,5796,67 38,3861,5481,1790,6562,4575,2998,6446,5826,3781,7682,5709,3437,5042,3512,6793,5335,2911,6 915,4846,3700,6504,5906,1535,6683,5767,3761,7264,3446,5065,6255,2807,5468,5539,3495,6475, 4604,3538,6358,5526,3865,7235,5584,3056,6453,1023,4957,6332,3322,5800,6593,3443,5921,4853,3553,7209,5482,2558,6361,5710,3646,6552,3485,5066,6753,2012,5529,6740,3675,5690,7312,30 27,5015,6695,3438,5908,5717,3540,6794,3727,5692,6373,3001,4971,7196,2025,5339,6303,3972,5 431,6564,3877,4958,6454,3687,5828,7237,2811,5718,6685,3756,4854,3782,5721,6917,1975,5771, 6754,3501,5044,7210,3022,5541,6801,3866,5912,6477,3324,5073,6263,3445,5922,7684,3677,5731,6744,3002,5019,6483,2026,5722,3920,6362,5530,3762,5068,7217,3785,5351,6512,2927,5808,67 96,3704,4857,6374,3554,5773,7242,1917,5368,6535,3878,4973,6457,3029,5489,6594,3499,5310,7 440,3976,5484,6686,3486,5048,6478,3030,5774,6377,3295,5779,1999,4591,7328,3735,5455,6699, 3764,5600,6918,3907,4799,6319,2975,5435,7688,3691,5341,6267,3544,5031,6802,3527,5490,6756,1918,5733,7456,3043,5074,6485,3868,5542,6921,3881,5545,6364,3786,5571,7696,3793,4979,64 58,2813,5734,6568,3909,5663,6539,2033,4858,7360,3788,5355,6817,3936,5532,6727,3004,4599,6 499,3882,5463,7712,3678,5492,6431,3984,5021,6327,3794,5895,6378,1979,5437,7238,2935,5342, 6269,3768,4974,6701,3449,5546,6804,5573,3507,7212,4831,3889,6760,5357,3033,6486,5679,3391,6460,5953,2028,7299,5089,3693,6385,5924,3884,6922,5832,3045,7249,4981,3556,6707,5954,35 02,6489,5781,3910,6596,5035,3739,7218,5928,2034,6541,5899,3034,6547,5737,6351,3560,5090,7 241,3311,5724,6818,3450,5553,6702,3531,5076,7183,2991,5840,6929,3694,5936,6576,1981,5956, 6501,3699,5022,7488,3509,5467,6331,6017,3452,6380,4860,2939,6808,5363,3890,7301,5782,3533,6768,5574,3568,6731,5037,3741,7220,5438,2007,6924,5795,6849,3046,5063,6270,3751,5738,71 91,3796,6018,6386,3913,5901,6709,2814,4982,5496,3701,5548,7302,4927,3423,6542,5785,3539,6 490,5856,1982,6600,5687,3510,7552,5043,2559,6502,5960,6549,3809,5745,7244,3323,4603,6447, 3534,5358,6713,3514,5479,6388,3513,5577,7305,4985,2011,6739,5519,3036,6333,5907,3541,7250,5711,3319,6710,5080,3755,6820,5798,6505,3914,5554,7224,3049,4847,6850,3810,5797,6733,39 71,5469,7195,5365,3742,6359,5038,2036,6930,5578,3855,6791,5786,2999,7265,5740,6492,3921,5 092,6563,3892,5483,7207,3800,5247,6550,5311,4000,6608,5067,3050,6824,5902,3863,7427,5527, 2023,6945,4986,6506,3439,5556,7252,3973,5746,6734,3702,5691,6553,4605,3757,7306,5585,2941,6714,5801,3916,6932,5366,6741,3705,5045,7313,3783,5827,6716,2040,5470,6363,5719,3325,74 29,5069,3023,6455,5788,3763,6852,5910,7197,3896,5580,6742,3974,5096,6745,5369,3758,7211,5 802,2942,6795,5693,3812,6565,4988,6936,3922,5531,7266,1791,5923,6946,3447,5909,6755,5046, 3516,7683,5829,3542,6746,5485,6554,3057,5560,7256,3555,4959,6375,3487,6832,5748,7308,3557,5809,6797,3977,5494,6392,4855,3867,7198,5543,2013,6513,5586,6334,3003,5913,6508,3545,51 04,7314,3706,5370,6798,5491,3816,6803,5601,3924,7239,4606,6479,4032,5694,6624,3052,7430,5 533,6459,3937,5723,6365,3765,5075,7433,5486,2027,6514,5588,3869,6757,5775,7329,3978,5049, 6566,3058,6020,6569,5925,3787,7744,5735,3879,6595,6758,4859,3546,7213,5804,3708,6687,5830,6379,3766,5549,7268,3005,5070,6556,5914,2014,6487,5372,3326,6516,5493,7808,3789,6919,57 25,6461,3647,5050,7219,3985,5968,6366,5810,3870,6570,5833,3031,7316,4975,6597,3883,5752,6 381,3451,7214,5602,6703,3769,5926,6977,5077,3503,7243,5547,2029,6948,6024,6856,3679,5534, 7434,3561,6978,5078,6805,3006,5343,7441,5783,3938,6952,5812,3795,6923,5955,7685,3558,5023,6761,3980,7272,5739,6748,3790,5592,6577,5575,3035,7330,5091,3885,6864,5916,6960,1983,59 29,7221,6980,3548,5834,6491,3928,5841,7361,4861,3911,7041,5957,6387,3797,7320,5836,3060,6 806,5984,6598,3770,5052,7245,5930,3986,6462,5726,6819,3824,7332,6032,3940,6762,5842,7042, 3891,4983,7936,5816,2035,6925,5497,3886,6520,7436,5555,3047,6572,5937,7442,3511,5081,6809,5439,4001,6880,7686,5741,3562,6711,5932,3695,6984,5093,7222,3743,5604,6769,6382,3811,55 50,7251,5958,3064,6503,5787,3988,6601,5082,7225,3535,6543,5608,6931,2037,5359,7689,5498,3 915,6735,7280,5579,3453,6822,5039,3569,6578,5742,7303,2815,5747,6821,6493,4002,5557,7246, 5500,3893,6389,4987,6602,3798,7457,5938,6810,4033,5581,7362,5616,3944,6764,5789,3564,6507,7253,5094,3703,6271,5799,6335,1919,5844,7444,6926,3037,5961,7690,4862,3801,6551,5749,65 80,3772,7226,5471,6770,3515,5587,6715,5558,3813,7336,6609,4607,3917,7307,5857,6825,3992,5 371,6390,7267,3051,5582,6851,5562,3454,6494,5561,7254,3894,6743,5084,7228,3923,5589,6812, 5367,3802,6934,7448,5803,2030,6604,5962,6393,3570,7257,5097,6826,3952,5858,7458,6019,3038,6717,6555,5790,3814,7697,5903,6947,3517,5047,6933,7692,3543,5969,6853,5940,3707,7364,65 09,5848,4004,6584,6048,7309,3759,5098,6772,7269,3975,5911,6833,5487,3053,6518,7315,6021,3 897,6567,5750,6610,2038,5805,7344,6937,3572,4989,7310,5964,3918,6394,6515,5753,3817,7698, 5831,6625,7489,3898,5373,6718,5071,3804,6557,5811,7199,3518,6747,5944,7368,3007,6022,6510,6612,4034,5806,7258,4990,4008,6799,7713,5860,3547,7044,5970,6949,7460,3925,5495,6759,55 64,3939,7490,6828,5590,2041,6854,5105,7700,3709,6573,5603,7431,5535,3979,6938,6396,5605,3 059,7317,6025,6517,3559,7270,5915,6749,3767,5051,6992,7273,5593,3818,6834,5754,7472,3900, 6857,5864,7464,3825,5972,6776,6626,3926,6080,7331,5100,6950,3929,7260,5985,6571,3061,5813,7048,7215,3576,5917,6558,6026,7435,3871,6367,5106,6807,3327,5835,7553,6836,2042,5927,77 14,6979,5594,4036,7492,5756,6763,3981,6616,5814,7376,3791,5053,6599,7554,5374,3549,6940,5 837,6953,3987,7318,5695,6858,7321,2943,6033,6865,5918,3710,7333,6981,5079,3820,6860,5931, 7274,7008,4016,5499,7223,6954,3941,5817,7496,5551,6750,3563,7056,5727,7704,3771,5609,6866,7745,5054,3826,6840,7716,5986,3930,6521,5843,6579,7281,2015,5606,6961,7322,3054,6028,64 63,5838,7247,3550,6765,5083,7437,4040,6956,5933,6628,5596,3455,7276,6574,5976,7746,3982,6 982,5959,7392,3887,5845,6811,6632,5108,4048,7334,6383,5818,3942,7687,6034,6522,7720,3989, 5872,6603,7363,5988,3062,6766,5939,6771,3799,7438,5934,6581,7809,3565,5095,6524,5559,3945,7691,6962,6049,7443,3773,6605,5610,6640,7748,4003,5743,6813,5791,7459,2044,6823,5859,72 27,3828,6868,5112,7337,6985,3932,6036,6773,5583,7728,3571,6495,5963,7282,3803,6611,5501,7 445,6582,3065,5617,7324,6881,4863,3895,7255,6050,6395,7365,3994,5941,6606,6586,5846,3946, 7284,6585,6081,3990,7338,5992,6613,7229,3574,5612,6391,7699,5751,4005,6827,7693,5085,6986,3815,7810,5849,6882,7043,3832,5820,7449,5563,6814,3953,7446,5861,6927,7694,3066,5965,69 93,7345,6040,3566,6964,7461,5099,2031,6872,7556,5502,7072,3774,7259,5942,6935,5971,3993,6 511,7752,5850,7045,3573,7937,5618,6774,7366,3948,6000,6829,7340,5086,3919, 6988,7288,5862,6777,4064,7369,5565,6855,7504,3519,5591,6397,7230,5755,3805,6835,7450,6052,6968,3899,7311,5807,7046,7271,6023,3039,6830,5101,6884,7346,4006,5945,6994,7462,5620,3954,6519,7261,5966,6588,4009,7812,5865,6614,7370,4035,5946,6627,7760,5852,3819,6559,7491,5566,6629,3577,7560,5055,7049,7465,6082,3927,6939,7938,6056,6617,2039,7275,5595,6778,7348,3996,5973,6888,7319,5987,3806,6996,7377,7104,5757,7452,3901,7009,6027,7816,6837,3068,5107,7262,6941,5607,4037,7372,7050,5815,7466,6859,4010,5866,7568,6951,5948,3956,7776,6618,5873,7520,3578,6780,5974,7493,6838,5977,3821,7701,6398,5109,7323,4017,6861,5624,7378,6719,4038,7473,5919,7057,7715,5375,3827,6942,7468,6084,6955,3931,7277,6029,6523,7352,5839,4012,6841,7702,5597,6575,3902,6751,6633,6035,7705,7010,3983,4991,7283,6867,5758,3055,7335,6630,5868,7393,7052,3943,6064,7494,6862,7474,3711,5989,6957,7940,5611,6620,3960,7325,5819,7000,7824,5874,2043,6983,7497,5978,6869,3551,7278,6842,5102,7285,7058,4018,5598,7380,6896,6088,7339,3822,7012,7944,5503,6963,4041,7498,6030,6958,7394,5935,3580,6583,7717,6096,7073,7706,3933,6634,5990,7555,6767,6037,3829,7476,6815,5110,7384,6883,4042,7584,5847,7060,7439,3991,5613,6607,7447,6987,5993,3063,7326,6525,5821,7505,6641,3947,6051,7718,7074,7840,5876,3934,6965,7286,5980,6870,7500,3830,5619,7747,7105,7708,5851,4020,7016,7557,5113,6636,7341,4049,6775,5943,7289,6873,6042,3995,7721,6844,7367,5994,6587,4044,7952,6038,6885,7347,6989,3833,5622,7396,7064,6053,7506,3949,6526,7480,5863,6966,7872,4024,5880,7558,6995,7342,6001,3567,6874,7722,5114,6642,7749,2045,7024,5614,7561,6886,5822,7451,3775,6589,7290,6041,6615,7616,4007,5621,7521,6779,7729,5996,4050,7076,7371,6831,5967,7231,3067,7047,6112,7508,6969,7562,5567,3955,6644,7695,5853,7750,6990,3834,7724,5947,6889,7349,6970,5087,3575,7463,6876,6054,7453,6590,3997,7400,6002,7292,7106,7373,3950,6057,7080,7350,6619,6083,7811,3807,6997,5867,7730,7011,7454,4065,5625,7753,6781,7467,5975,7051,3957,7522,6631,6044,7379,6839,4011,5854,7569,7353,6890,5949,7564,4066,6972,7512,5116,6897,7754,6998,4052,6085,7813,7761,6058,7001,3998,7703,6648,6004,7408,6943,7374,3836,5626,7263,6399,7495,5869,7108,4013,7732,7053,6065,7968,6863,7570,4039,6086,7524,6621,7475,5875,7059,3069,7469,6782,5979,7585,7381,3958,6892,6060,7736,7088,8000,5950,3903,7013,7756,7354,6031,6635,7814,4019,6843,5103,7572,7395,6898,5991,3579,8064,7002,7762,5759,6622,7586,3961,7470,6008,7112,7817,6527,5599,7939,2046,7054,7528,6066,7707,6959,7279,4056,5870,7120,7499,7382,6089,7014,3823,7477,7061,5628,7356,7617,6871,4014,5981,7385,6637,7576,5877,7017,4068,7777,7764,6090,6845,7719,7075,7818,4043,6039,7397,6900,7327,5111,7004,3962,7588,7478,5995,6643,7709,6875,3581,5982,7941,7778,6967,7825,5878,7066,4021,7501,7287,6068,7018,7768,7062,4045,6097,7507,7386,6646,6043,7536,7077,4072,7820,7398,6092,6887,7559,7481,5881,3964,6904,7618,7025,5997,7710,7502,4022,6638,7401,6072,6846,7723,7942,5615,3935,7065,7343,6645,7291,5823,7826,7020,3831,7780,6055,7509,6991,7945,7136,6098,3070,7388,7482,6591,5115,7592,7563,6877,4080,7841,6003,6971,7751,7523,5882,7078,3582,7455,7351,7026,5623,7402,7081,7293,4051,6045,7725,7107,7828,7784,5998,6891,4025,7510,6649,7484,5855,7409,6999,7946,3835,6113,7731,7068,7513,6878,6005,7620,4046,7565,6973,7571,6059,7375,7109,7842,4026,6114,7726,7082,7953,7600,6100,7028,7525,3951,6650,7355,6046,7404,6893,7832,7792,4053,5884,7089,7755,7948,7110,6061,7873,7294,4054,6899,7410,6087,7003,7733,7566,7084,3999,5117,7514,7624,6974,6006,7526,7573,7055,4067,7471,5951,7737,7015,7412,7763,6067,6783,3837,7357,7734,7032,5627,7844,7529,6623,4028,7874,6009,7757,7090,7383,6894,7954,6104,3959,7815,7113,7516,7587,5871,6652,7574,7632,4057,7005,6062,7848,7969,6901,7530,6116,7758,7114,4069,7577,7738,6091,7063,7956,7765,7740,7019,2047,6010,7387,7479,7006,7876,5629,7766,6902,4058,7769,7819,6069,7092,7589,7960,7121,7970,4015,6093,7779,7067,7770,7578,6120,7116,7399,7856,3963,6905,6012,7821,7416,7021,7537,7358,6070,4070,7532,7096,7822,7827,5983,6639,7503,7648,6847,3838,7483,5879,7389,7079,7538,7781,7122,5118,7590,3583,7593,7619,7027,6128,7782,7711,6906,7403,7580,3071,5630,6647,7511,7540,7069,7943,6099,7485,7390,4060,7022,7594,7621,6073,6879,7405,7727,8001,5883,4073,7137,7972,7880,7029,8002,6094,7829,7083,7976,4023,7947,7785,6074,7138,7772,7601,7124,7888,5999,7984,4074,8004,7070,7515,8065,6101,6908,7411,7830,7622,7085,3965,6102,7486,7843,7111,7786,8066,6047,7949,7030,4047,7544,7596,6975,7833,6115,7904,7735,7091,8008,7793,3966,5885,6651,7406,7527,7625,7033,6076,7567,7955,7759,4081,7128,7846,7602,6007,6895,7845,7517,7413,7086,6105,4027,7626,7834,7788,7140,7531,7295,6117,7359,7115,7950,7575,4076,7034,6106,7604,7794,7739,6653,7633,7849,6063,7414,4082,7093,7875,7518,7767,7117,6011,7836,7958,7628,7144,7417,4029,7850,6118,7741,7036,7579,7971,7957,5886,7094,7877,7533,4055,7608,7007,7796,5631,7857,7542,6903,7591,7634,7961,7152,4030,5119,7418,7539,7649,6654,7742,7581,6108,7771,7123,7534,7636,4059,7823,7097,6121,8068,7973,7783,6907,7852,7878,6071,7597,7118,4084,7962,7420,7541,7773,7098,6122,8016,7858,7881,7023,7800,4071,7650,6013,7974,7125,7595,8072,7582,7126,7391,6095,7831,7860,8003,4088,7071,7787,7640,7623,6014,7139,7964,7977,7882,7889,6909,8005,3839,6129,7884,8032,7100,7978,7774,8080,7890,6075,7031,7864,7545,7603,4061,7985,7129,7487,6124,7789,7980,7141,7652,7598,8006,7835,6130,7130,4075,7656,7407,7546,7627,7087,7790,6077,7795,7605,7548,7035,7986,7629,7664,4062,7837,6103,7142,7847,7892,8009,6910,7797,7519,7635,6078,7606,6655,4077,7905,7419,7630,7610,7609,6107,7132,7637,7415,7851,8010,7145,7906,8067,7838,4031,6132,7951,7095,8017,7988,7896,8096,7146,7959,6119,7535,8069,7798,7853,7037,4083,8012,7801,7879,6136,7421,7119,7859,7992,8070,7854,7038,7908,8018,5887,7543,4085,7612,7638,7153,7651,7583,7653,8073,7963,6109,7099,7641,7802,7912,8020,8128,7148,3967,8033,7861,6123,7965,8074,7154,7883,7975,7642,7804,7862,7101,6110,7422,7885,7743,4078,8081,7966,7127,7979,7547,7865,7599,6125,7775,7657,7102,8034,7891,7654,8076,7886,7131,4086,7981,6079,7644,8024,8007,7893,7156,7866,8082,7920,8036,7987,6131,7982,7143,7607,8097,7658,4089,7791,7839,7907,7160,8084,7631,6133,8011,7549,7665,6911,8098,7989,7894,8129,8040,7660,7799,6015,4090,7133,7897,7868,7611,7909,8013,8088,7147,7550,7990,8019,7898,6126,7666,8048,7134,7910,7613,7639,7803,4063,8100,7855,8071,7149,7993,6134,7668,8014,7913,7994,7900,7614,7103,8130,8104,7643,8021,8035,6137,7805,4092,8075,7155,7655,7863,7914,7996,7921,8022,8025,7157,7672,7967,7423,6138,8132,8077,7887,7645,8083,7039,7806,7916,8112,4079,8037,7659,7867,7922,8026,6111,7150,7646,8136,7551,8078,7983,8144,8038,8085,7158,7895,7661,8041,7869,8099,6140,7924,8028,4087,7667,7899,7161,7991,8090,8042,8086,7670,8101,7911,7928,8049,7162,7662,6127,7870,8089,7669,8044,8015,8160,7615,7901,7995,7135,8102,4091,8050,8105,8131,7915,7673,8023,6135,8092,7902, 7997,7164,8133,8106,8052,7674,7917,8113,8134,7923,
8027,8108,7998, 8079,7151,8039,7807,8056,6139,7647,
8114,4093,7918,8137,7676,8029,7925,8138,8087,7159,804
3,8030,7926,8116,8145,8091,8140,7929,8045,8120,7663,
6141,7871,8103,8146,7163,8051,7930,76 71,8093,8046,
7903,8161,8053,8107,4094,8162,8148,8094,7932,8109,
8135,7165,8054,7999,8115,7 675,8057,6142,8152,7919,
8110,8164,8139,8058,7677,8117,8141,8168,8060,8118,
8031,7927,7166, 8176,7678,8147,8121,7931,8142,8122,
8047,8149,8150,8095,4095,8163,7933,8124,8055,8153,816
5,6143,8154,8111,8059,8166,7934,7679,7167,8156,8169,
8119,8170,8061,8143,8062,8177,8123,81 72,8178,8125,
8151,8126,8155,8180,8167,8184,7935,8157,8171,8158,
8173,8127,8179,8181,8063,8 174,8182,8185,8186,8159,
8188,8175,8183,8187,8189,8190,8191]

Sequence Group 3: Z3_8192

[0,1,2,7,3,8,14,27,4,13,16,31,19,36,38,84,5,15,17,35,22,
42,52,89,25,51,46,97,63,106,11 3,182,6,20,24,44,26,50,57,
99,32,61,65,107,78,120,126,201,37,67,82,124,87,135,145,
215,96,147,16 0,243,166,257,281,408,9,21,29,60,33,64,77,
115,39,83,69,127,92,139,153,224,49,80,95,146,101,15
6,165,251,111,168,186,269,200,288,307,454,59,98,109,
164,122,176,194,284,133,195,214,299,227, 325,343,494,
150,222,247,330,254,344,371,528,275,378,402,556,423,
581,627,877,18,28,34,79,43,8 6,90,151,54,94,102,163,112,
175,179,283,62,103,114,177,125,193,211,301,138,212,223,
319,249,33 9,364,516,71,118,134,199,140,213,230,331,
161,245,255,347,274,377,394,553,178,266,285,385,30
0,417,426,578,327,440,475,615,501,649,725,878,75,136,
155,233,173,252,273,382,183,277,291,40 7,308,425,452,
603,208,304,320,437,345,468,496,662,358,504,533,690,
564,738,767,1022,229,334, 352,479,387,513,538,715,422,
548,579,755,616,773,842,1103,451,592,630,809,645,865,
897,1175,7 20,914,951,1160,990,1235,1333,1678,23,40,45,
100,55,104,116,192,56,117,129,202,142,225,236,36 2,70,
130,143,240,157,248,263,363,167,261,282,400,305,421,
432,577,73,154,169,242,188,267,286, 420,198,297,309,
434,323,466,486,643,197,321,336,463,357,500,518,694,
389,542,566,737,589,764, 816,1081,85,181,190,293,206,
316,335,456,217,342,351,495,372,527,547,733,279,365,
388,532,40 9,562,588,760,443,597,635,805,667,862,901,
1147,313,404,436,574,462,613,638,845,491,655,677, 874,
726,931,966,1211,535,724,742,952,761,992,940,1257,826,
1074,1107,1355,1121,1459,1518,17 55,91,203,209,356,
268,376,392,541,295,397,412,569,442,601,634,849,311,
439,461,602,478,641,6 70,884,505,682,713,921,757,960,
1019,1270,361,467,484,668,517,703,745,943,567,746,769,
1014,8 30,985,1092,1361,611,797,858,1075,885,1117,
1154,1426,932,1168,1165,1503,1260,1547,1599,192 8,403,
502,543,750,599,772,814,1037,636,847,867,1110,912,
1128,1163,1452,672,893,945,1150,967, 1172,1264,1552,
1034,1284,1322,1613,1390,1696,1745,2117,734,955,1008,
1267,1089,1273,1376, 1634,1101,1365,1433,1725,1488,
1791,1886,2269,1129,1463,1535,1824,1577,1902,1857,
2323,166 7,1977,2030,2480,2145,2568,2678,3005,30,48,
58,110,66,131,144,231,72,148,159,239,172,259,264, 413,
74,170,180,258,191,317,328,450,218,329,355,492,375,520,
545,754,76,187,204,322,220,353,3 68,510,232,381,395,
551,416,582,608,775,246,406,430,595,457,631,652,836,
469,644,684,890,689, 920,957,1340,119,219,228,373,241,
396,414,572,271,433,445,622,474,658,680,853,292,449,
483,64 8,508,687,697,905,531,699,712,962,796,996,1062,
1363,312,507,523,708,558,743,751,977,587,792, 820,1033,
873,1084,1112,1437,621,841,889,1115,936,1143,1218,
1492,1006,1228,1288,1557,1326, 1626,1705,2102,123,238,
260,427,289,446,477,664,306,488,511,702,536,719,728,
970,341,526,557, 731,585,785,813,1023,617,832,869,1098,
907,1133,1190,1441,369,571,606,818,654,861,857,1136,6
74,895,916,1178,981,1222,1248,1564,716,938,1000,1239,
1027,1305,1329,1638,1070,1358,1405,1 729,1499,1802,
1892,2278,391,626,657,900,695,928,982,1231,781,1004,
1046,1316,1053,1336,138 3,1689,799,1048,1067,1372,
1138,1401,1474,1788,1203,1495,1532,1828,1595,1936,
1996,2352,834, 1156,1185,1445,1249,1507,1543,1869,
1292,1586,1644,1973,1711,2038,2130,2512,1412,1653,173
6,2060,1814,2160,2203,2654,1876,2243,2315,2718,2421,
2834,2985,3484,141,272,298,489,337,52 1,552,763,349,
563,593,790,624,825,881,1193,383,610,663,851,686,925,
909,1210,705,947,989,128 1,1041,1309,1347,1671,460,
676,707,924,780,975,1011,1319,789,1042,1060,1351,1088,
1387,1424, 1765,801,1078,1124,1420,1199,1471,1522,
1835,1241,1573,1591,1940,1648,2004,2079,2459,471,7
78,784,1029,804,1051,1095,1398,837,1142,1181,1456,
1224,1510,1582,1917,997,1197,1253,1528,1 294,1616,
1657,1984,1394,1663,1739,2064,1818,2153,2195,2640,
1056,1301,1368,1620,1416,1719, 1776,2094,1484,1795,
1847,2187,1910,2251,2343,2760,1539,1880,1954,2306,
2026,2372,2453,286 6,2109,2491,2557,2952,2616,3109,
3149,3832,480,808,822,1186,972,1215,1245,1568,1015,
1277,1 312,1630,1379,1685,1759,2087,1064,1344,1409,
1699,1448,1781,1851,2177,1514,1898,1840,2227, 1992,
2332,2413,2803,1206,1430,1467,1807,1561,1862,1946,
2286,1609,1958,2018,2381,2072,243 3,2524,2934,1715,
2045,2124,2471,2210,2580,2628,3065,2262,2704,2747,
3199,2848,3272,3331,36 83,1298,1481,1605,1965,1681,
2011,2052,2442,1750,2138,2169,2548,2234,2592,2730,
3129,1769,2 219,2295,2692,2401,2774,2787,3300,2503,
2883,2915,3359,3027,3524,3596,4162,1921,2364,2392,
2817,2536,2897,2971,3420,2604,3047,3085,3560,3225,
3639,3888,4347,2666,3174,3247,3730,338 7,3776,3946,
4458,3454,4014,4085,4599,4244,4770,5021,5420,10,41,68,
149,88,162,196,310,105,1 84,216,340,244,374,386,609,
121,207,226,366,270,405,459,628,294,453,431,660,514,
696,722,961, 137,253,287,418,302,448,482,669,346,503,
525,700,586,752,774,1018,379,534,600,766,623,802,84
0,1057,656,848,886,1137,906,1173,1236,1567,174,262,
324,497,354,519,580,732,393,605,540,779, 642,815,864,
1083,441,594,651,843,678,875,904,1159,714,915,968,
1207,1013,1259,1307,1675,493, 665,706,899,756,937,994,
1247,793,999,1055,1286,1090,1352,1403,1768,854,1076,
1148,1371,116 7,1406,1473,1844,1227,1494,1549,1905,
1602,1961,2057,2542,235,318,360,591,411,620,632,859,4
65,647,683,894,718,934,949,1243,509,688,727,941,770,
991,1043,1293,810,1047,1080,1335,1155, 1392,1458,1815,
550,744,798,1010,819,1050,1102,1374,891,1141,1169,
1414,1223,1490,1530,1901, 946,1198,1252,1509,1289,
1588,1610,1952,1356,1643,1723,2033,1782,2105,2257,
2545,570,807,87 0,1111,930,1161,1219,1502,964,1230,
1265,1563,1310,1606,1674,2008,1036,1296,1339,1637,
1410, 1708,1775,2127,1443,1789,1856,2189,1924,2284,
2341,2791,1097,1378,1425,1733,1513,1811,186 6,2237,
1600,1889,1956,2318,2035,2355,2483,2923,1669,1982,
2062,2424,2097,2521,2577,3034,22 48,2607,2669,3011,
2736,3126,3278,3795,280,398,424,675,470,693,736,986,
476,739,783,1020,828, 1085,1116,1451,544,787,831,1125,
880,1151,1191,1454,910,1188,1240,1546,1300,1596,1623,
1949, 559,868,917,1134,976,1201,1255,1592,1005,1279,
1313,1628,1349,1702,1749,2090,1001,1341,13 84,1698,
1440,1778,1822,2192,1520,1873,1926,2281,1980,2338,
2436,2886,614,956,979,1272,1032, 1328,1382,1679,1061,
1399,1421,1772,1477,1841,1885,2272,1233,1462,1517,
1853,1571,1914,197 4,2326,1651,1995,2075,2416,2141, 2518,2586,2993,1324,1556,1633,1945,1694,2027,2082,2486,17 62,2115,2163,2539,2260,2634,2695,3093,1860,2254,2289,2672,2329,2740,2651,3163,2455,2872,2 926,3309,2948,3473,3565,3908,637,1025,1039,1436,1205,1487,1527,1870,1276,1542,1575,1933,1 647,2001,2069,2494,1317,1641,1692,2005,1732,2084,2148,2554,1794,2171,2233,2619,2321,2686, 2783,3183,1447,1706,1746,2142,1820,2213,2298,2657,1930,2301,2346,2777,2456,2727,2905,331 7,2023,2398,2509,2877,2559,2945,3000,3424,2637,3023,3019,3538,3166,3607,3678,4140,1553,1785,1878,2303,1999,2349,2430,2814,2078,2489,2527,2931,2601,2960,3016,3463,2151,2571,2660,2 997,2698,3031,3171,3613,2811,3205,3261,3700,3367,3818,3894,4381,2275,2675,2767,3179,2900, 3188,3345,3736,2920,3326,3434,3863,3513,3960,4093,4559,2963,3479,3585,4000,3650,4111,405 0,4630,3782,4206,4274,4814,4414,4914,5049,5398,332,435,487,709,529,791,835,1105,555,852,883,1123,926,1180,1194,1578,565,922,953,1176,984,1332,1360,1665,1066,1367,1432,1763,1483,182 7,1882,2312,575,971,1028,1345,1071,1428,1466,1805,1108,1498,1534,1894,1585,1964,2016,2358, 1146,1559,1619,1989,1684,2067,2106,2468,1712,2091,2174,2565,2184,2613,2681,3286,748,1069, 1094,1478,1130,1538,1581,1942,1213,1624,1655,2047,1721,2123,2166,2500,1269,1661,1742,2099,1801,2181,2201,2589,1848,2205,2230,2689,2395,2744,2855,3322,1321,1798,1833,2224,1912,22 92,2309,2713,1970,2389,2445,2808,2533,2891,2937,3440,2042,2477,2562,2940,2645,2988,3101,3 518,2763,3118,3208,3618,3264,3719,3838,4364,762,1120,1182,1614,1261,1658,1728,2135,1304,1 752,1809,2208,1864,2245,2265,2701,1395,1837,1908,2268,1968,2378,2427,2794,2039,2462,2530, 2912,2595,2966,3058,3443,1469,1937,2014,2439,2112,2515,2506,2974,2156,2574,2610,3039,272 1,3104,3146,3629,2240,2648,2753,3133,2797,3233,3269,3742,2869,3314,3392,3869,3534,3974,40 97,4570,1524,2054,2120,2583,2198,2631,2724,3121,2369,2757,2828,3250,2842,3281,3354,3812,2 404,2831,2863,3340,2977,3381,3498,3954,3078,3529,3580,4008,3672,4146,4228,4661,2465,3008, 3050,3448,3154,3543,3602,4065,3213,3661,3747,4198,3843,4282,4397,4852,3401,3759,3875,4306,3988,4431,4486,5006,4071,4531,4619,5091,4736,5218,5378,5901,824,1216,1282,1756,1388,183 1,1896,2335,1417,1918,1987,2387,2050,2450,2551,3062,1505,2020,2133,2497,2180,2625,2598,30 90,2216,2663,2733,3196,2820,3238,3295,3789,1688,2159,2222,2622,2366,2710,2770,3255,2384,2 823,2852,3303,2894,3364,3415,3920,2407,2880,2956,3410,3073,3493,3571,4022,3138,3644,3667, 4154,3753,4236,4331,4791,1716,2361,2375,2800,2410,2837,2908,3378,2474,2982,3042,3468,311 3,3549,3655,4127,2750,3070,3158,3574,3216,3706,3765,4214,3373,3770,3880,4315,3994,4422,44 75,4992,2845,3230,3336,3711,3406,3857,3934,4356,3507,3967,4036,4467,4119,4540,4650,5137,3 591,4079,4176,4610,4266,4681,4779,5253,4372,4826,4902,5342,4965,5524,5571,6216,1738,2418, 2448,3053,2707,3098,3141,3635,2780,3191,3242,3725,3350,3807,3914,4339,2859,3291,3395,3826,3459,3940,4042,4450,3554,4105,4028,4512,4222,4639,4724,5184,3081,3429,3488,3980,3624,40 56,4168,4579,3695,4184,4258,4692,4323,4747,4864,5323,3849,4290,4389,4802,4494,4926,4979,5 480,4551,5079,5122,5619,5234,5693,5750,6084,3221,3504,3689,4192,3801,4252,4298,4758,3900, 4406,4439,4887,4522,4940,5107,5547,3926,4503,4590,5064,4713,5153,5169,5721,4840,5269,5304,5776,5440,5935,6005,6505,4133,4670,4701,5202,4875,5288,5362,5837,4952,5460,5504,5970,56 44,6044,6268,6660,5034,5595,5668,6125,5808,6170,6320,6752,5867,6374,6438,6866,6579,6995,7 168,7433,11,47,81,189,108, 205,265,410,132,250,290,447,326,490,506,794,152,278,303,481,359,5 39,604,823,390,598,568,860,673,908,939,1229,171,338,380,554,401,590,633,872,455,659,685,913,765,974,1003,1299,498,698,782,993,811,1035,1082,1346,856,1091,1140,1442,1166,1485,1562,19 25,221,348,428,653,464,679,759,948,515,788,710,1007,839,1054,1114,1377,583,776,850,1087,88 2,1127,1162,1468,929,1174,1242,1525,1295,1587,1642,2043,646,866,918,1157,983,1204,1271,157 2,1026,1275,1343,1618,1389,1697,1747,2139,1104,1369,1457,1710,1479,1751,1823,2220,1548,1845,1906,2285,1962,2342,2443,2972,314,419,473,771,546,806,827,1109,612,844,888,1153,933,120 0,1217,1569,666,892,944,1209,998,1266,1330,1625,1049,1334,1373,1676,1464,1734,1806,2191,7 23,963,1030,1290,1058,1338,1400,1714,1144,1449,1482,1760,1544,1843,1888,2279,1212,1515,15 76,1861,1621,1948,1972,2333,1701,2007,2093,2417,2155,2496,2662,2976,747,1040,1122,1411,1192,1472,1541,1855,1234,1551,1593,1922,1646,1969,2037,2391,1323,1632,1680,2000,1754,2076,2 146,2522,1790,2164,2231,2588,2302,2691,2752,3245,1396,1720,1771,2104,1868,2185,2244,2642, 1960,2267,2336,2726,2420,2764,2904,3390,2034,2365,2449,2839,2487,2950,3013,3515,2653,304 4,3114,3489,3186,3615,3774,4278,370,522,560,876,619,898,954,1263,625,959,1012,1302,1068,1380,1419,1799,717,1017,1073,1431,1131,1461,1508,1803,1170,1500,1566,1904,1635,1957,1985,23 31,735,1118,1179,1438,1251,1519,1580,1953,1287,1611,1649,1991,1690,2071,2119,2481,1283,16 83,1727,2065,1786,2152,2196,2594,1874,2253,2308,2687,2359,2746,2853,3352,800,1225,1254,16 01,1315,1666,1724,2046,1354,1743,1767,2144,1826,2217,2264,2680,1554,1810,1872,2229,1929,2 296,2356,2735,2015,2376,2464,2830,2534,2943,3021,3466,1662,1913,1997,2325,2061,2411,2472, 2910,2131,2508,2558,2968,2665,3076,3143,3576,2238,2659,2697,3116,2738,3193,3095,3652,287 4,3338,3397,3809,3422,3972,4061,4378,833,1306,1327,1784,1523,1839,1881,2250,1607,1897,193 4,2313,2012,2385,2461,2918,1656,2003,2058,2388,2101,2475,2543,2987,2167,2567,2636,3057,27 32,3131,3240,3674,1797,2073,2116,2537,2194,2615,2706,3099,2311,2709,2755,3232,2878,3178,3371,3820,2408,2812,2936,3341,2990,3417,3477,3922,3080,3502,3497,4038,3657,4101,4172,4596, 1909,2157,2255,2715,2379,2761,2847,3274,2467,2913,2953,3402,3040,3432,3495,3962,2546,300 3,3103,3472,3144,3509,3663,4107,3267,3696,3757,4190,3865,4302,4366,4821,2683,3123,3220,36 68,3366,3680,3841,4220,3385,3824,3932,4341,4016,4427,4546,4994,3436,3978,4087,4469,4142,4 566,4509,5051,4264,4656,4720,5221,4854,5315,5432,5756,438,576,639,923,692,1021,1077,1404, 729,1096,1135,1427,1187,1493,1512,1938,741,1184,1221,1489,1258,1670,1703,2031,1357,1707,1 780,2134,1836,2202,2261,2723,753,1246,1311,1687,1366,1773,1816,2178,1407,1852,1890,2274,1 944,2345,2400,2769,1453,1919,1978,2374,2049,2452,2502,2893,2080,2484,2573,2998,2585,3055, 3128,3786,969,1362,1393,1829,1435,1893,1941,2322,1533,1988,2019,2431,2088,2517,2564,2928, 1597,2028,2113,2493,2173,2579,2603,3026,2226,2606,2633,3136,2809,3198,3319,3822,1660,217 0,2209,2627,2291,2700,2717,3164,2353,2805,2861,3266,2964,3357,3408,3938,2429,2902,2995,34 11,3086,3461,3587,4020,3218,3604,3702,4115,3763,4210,4312,4805,988,1422,1497,1976,1590,20 22,2098,2528,1639,2126,2182,2612,2241,2650,2671,3151,1741,2215,2288,2674,2348,2789,2844,3 249,2423,2885,2958,3383,3032,3441,3540,3944,1819,2319,2397,2856,2505,2942,2932,3447,2549,3010,3049,3520,3169,3593,3637,4125,2643,3091,3206,3620,3254,3728,3768,4226,3333,3814,388 6,4345,4032, 4441,4553,5001,1877,2440,2514,3018,2597,3071,3173,3609,2781,3211,3288,3746,33 02,3780,3853,4294,2819,3293,3327,3836,3452,3882,3996,4420,3562,4026,4081,4473,4166,4605,4 679,5081,2888,3482,3531,3950,3641,4044,4096,4525,3708,4156,4234,4652,4321,4729,4835,5256, 3898,4246,4354,4754,4454,4871,4918,5406,4533,4962,5041,5472,5156,5589,5737,6185,1063,153 7,1615,2128,1730,2206,2277,2743,1764,2299,2368,2798,2437,2870,2980,3545,1858,2405,2525,29 21,2576,3067,3036,3573,2618,3108,3184,3691,3279,3734,3797,4270,2056,2555,2624,3063,2778,3 159,3227,3751,2795,3283,3312,3803,3362,3859,3916,4393,2822,3347,3427,3910,3556,3990,4067, 4482,3626,4136,4160,4612,4240,4688,4777,5197,2086,2772,2786,3259,2826,3298,3376,3877,2896,3457,3525,3966,3598,4048,4150,4583,3201,3551,3646,4075,3713,4196,4250,4665,3871,4260,43 60,4761,4460,4861,4909,5392,3307,3723,3830,4202,3904,4333,4408,4795,4010,4433,4497,4899,4 575,4972,5071,5515,4091,4538,4627,5031,4715,5102,5189,5622,4812,5232,5301,5706,5367,5854, 5891,6465,2108,2836,2864,3533,3156,3582,3631,4131,3235,3685,3740,4216,3847,4288,4385,4786,3321,3791,3892,4308,3956,4412,4501,4890,4054,4561,4488,4945,4674,5059,5145,5559,3567,39 28,3984,4446,4121,4516,4621,5011,4186,4634,4706,5112,4768,5166,5266,5687,4327,4738,4830,5 210,4928,5329,5381,5814,4984,5457,5501,5939,5604,6001,6055,6349,3717,4004,4180,4643,4284, 4697,4745,5176,4374,4845,4880,5293,4955,5340,5486,5874,4399,4935,5019,5446,5132,5530,5542,6026,5245,5638,5671,6077,5779,6220,6280,6711,4588,5094,5125,5574,5280,5653,5725,6132,53 53,5795,5831,6248,5959,6312,6509,6843,5418,5915,5980,6387,6102,6421,6551,6923,6159,6602,6 651,7020,6773,7126,7280,7500,237,530,704,1100,817,1149,1278,1652,902,1237,1350,1737,1446, 1832,1865,2402,978,1318,1385,1812,1529,1916,2053,2446,1604,2041,1981,2519,2188,2600,2656, 3134,1044,1476,1583,1950,1629,2024,2110,2540,1758,2162,2212,2609,2351,2720,2766,3237,184 9,2236,2382,2749,2434,2825,2899,3310,2511,2916,2992,3450,3029,3511,3617,4129,1195,1504,16 93,2149,1777,2199,2339,2677,1884,2394,2247,2775,2478,2850,2947,3355,2009,2371,2499,2907,2 561,2969,3024,3486,2639,3045,3148,3569,3228,3654,3732,4276,2137,2531,2621,3014,2729,3088, 3194,3633,2806,3203,3305,3698,3369,3805,3884,4395,2929,3343,3470,3834,3500,3890,3992,4492,3600,4024,4103,4568,4178,4636,4752,5285,1415,1672,1793,2362,1932,2426,2458,2939,2068,24 90,2570,3006,2647,3083,3111,3628,2175,2582,2668,3096,2758,3189,3284,3710,2841,3290,3348,3 778,3480,3867,3970,4456,2271,2703,2815,3223,2858,3296,3388,3839,3001,3455,3506,3902,3594, 4018,4077,4564,3106,3553,3642,4046,3704,4158,4188,4625,3811,4232,4337,4722,4416,4807,4977,5290,2316,2833,2961,3404,3075,3491,3589,4034,3139,3605,3665,4123,3738,4182,4272,4695,32 71,3715,3784,4224,3896,4319,4403,4833,3948,4424,4507,4904,4592,5009,5069,5545,3380,3845,3 918,4352,4052,4452,4520,4957,4174,4548,4632,5044,4726,5084,5224,5678,4268,4663,4756,5158, 4798,5264,5326,5785,4969,5356,5423,5763,5492,5871,6008,6434,1558,1900,1966,2552,2083,2591,2684,3181,2095,2694,2784,3243,2875,3360,3413,3958,2258,2792,2881,3431,2979,3475,3542,39 64,3037,3536,3622,4099,3721,4170,4204,4623,2294,2955,3052,3445,3161,3558,3648,4164,3215,3 687,3744,4212,3799,4310,4370,4788,3210,3787,3855,4304,3942,4410,4465,4906,4063,4529,4594, 5004,4659,5066,5171,5641,2414,3124,3168,3676,3262,3766,3851,4280,3315,3878,3912,4401,3998,4490,4544,4996,3611,3976,4059,4505,4134,4581,4654,5054,4242,4677,4772,5148,4847,5261,53 34,5744,3761,4113,4218,4616,4300,4717,4782,5226,4387,4819,4873,5282,4982,5387,5449,5841,4 514,4974,5014,5426,5056,5495,5403,5904,5192,5628,5681,6033,5703,6178,6252,6523,2469,3252, 3276,3936,3563,4012,4073,4527,3681,4095,4138,4603,4238,4686,4765,5237,3749,4230,4296,4690,4349,4784,4856,5299,4429,4883,4950,5370,5046,5437,5539,5921,3952,4317,4368,4849,4462,49 31,5024,5409,4601,5026,5074,5533,5195,5483,5659,6041,4710,5130,5250,5632,5307,5699,5753,6 136,5389,5772,5769,6232,5908,6288,6345,6695,4109,4418,4535,5029,4683,5076,5163,5568,4775, 5229,5272,5684,5351,5712,5766,6166,4859,5318,5412,5747,5452,5782,5911,6292,5565,5942,5991,6361,6088,6456,6514,6871,4999,5429,5521,5918,5656,5925,6066,6391,5675,6051,6144,6487,62 08,6560,6656,6989,5715,6181,6272,6593,6324,6675,6626,7040,6425,6741,6794,7153,6894,7218,7 296,7490,1717,1993,2121,2630,2223,2801,2889,3394,2282,2924,2984,3425,3068,3522,3547,4144, 2305,3060,3119,3516,3176,3772,3816,4262,3324,3828,3930,4391,4006,4471,4542,5039,2328,3153,3257,3793,3334,3924,3982,4443,3399,4030,4083,4555,4152,4641,4704,5086,3464,4117,4200,46 72,4286,4763,4809,5208,4325,4793,4885,5312,4897,5364,5435,6016,2712,3329,3374,4002,3438,4 089,4148,4614,3578,4208,4248,4740,4335,4828,4878,5242,3670,4256,4362,4800,4437,4894,4916, 5337,4499,4921,4947,5443,5127,5498,5610,6048,3755,4435,4480,4943,4577,5016,5036,5469,4647,5120,5179,5562,5277,5647,5690,6147,4733,5216,5309,5696,5395,5740,5847,6212,5518,5861,59 45,6296,5994,6378,6469,6854,2741,3418,3527,4194,3659,4254,4343,4842,3727,4376,4448,4923,4 518,4967,4987,5454,3873,4484,4572,4989,4645,5109,5161,5550,4731,5200,5274,5665,5345,5718, 5805,6151,3986,4608,4699,5174,4816,5258,5248,5728,4866,5320,5359,5788,5475,5851,5888,6304,4960,5401,5509,5877,5553,5966,5998,6395,5625,6037,6106,6491,6228,6569,6665,7002,4069,47 49,4823,5331,4911,5384,5477,5864,5099,5512,5583,5984,5598,6012,6073,6451,5135,5586,5616,6 062,5731,6099,6197,6555,5824,6224,6264,6597,6341,6700,6762,7059,5205,5760,5798,6155,5894, 6236,6284,6636,5949,6332,6400,6736,6473,6800,6883,7182,6114,6408,6496,6816,6583,6906,6941,7272,6641,6971,7033,7320,7105,7388,7480,7719,2867,3583,3693,4383,3861,4477,4557,5061,39 06,4585,4668,5117,4742,5187,5296,5811,4040,4708,4838,5240,4892,5376,5348,5834,4933,5415,5 489,5932,5577,5973,6023,6430,4292,4868,4938,5373,5097,5466,5527,5987,5114,5580,5607,6030, 5650,6080,6128,6532,5140,5635,5709,6121,5821,6193,6256,6607,5881,6316,6337,6705,6404,6768,6832,7139,4329,5089,5104,5556,5143,5592,5662,6095,5213,5734,5792,6174,5857,6240,6328,66 85,5506,5818,5898,6260,5952,6366,6412,6747,6091,6417,6500,6821,6588,6900,6935,7264,5601,5 963,6059,6370,6117,6482,6541,6849,6205,6564,6617,6929,6680,6977,7052,7345,6276,6646,6721, 7027,6789,7072,7132,7405,6860,7160,7211,7461,7249,7552,7573,7841,4358,5150,5182,5801,5463,5844,5884,6308,5536,5928,5977,6383,6069,6447,6528,6838,5613,6019,6110,6460,6162,6546,66 21,6917,6244,6670,6612,6959,6757,7046,7098,7370,5828,6140,6189,6574,6300,6631,6716,7008,6 357,6726,6784,7078,6827,7112,7189,7451,6478,6805,6877,7146,6947,7226,7256,7530,6983,7312, 7336,7595,7396,7630,7654,7792,5956,6201,6353,6731,6443,6778,6810,7119,6518,6888,6912,7204,6965,7233,7328,7562,6537,6953,7014,7304,7092,7353,7362,7642,7175,7414,7442,7667,7510,77 33,7762,7936,6690,7065,7085,7379,7196,7424,7470,7692,7241,7520,7541,7747,7607,7776,7858,7 981,7288,7584,7618,7808,7680,7824,7876,8006,7706,7895,7915,8033,7957,8064,8098,8138,12,53, 93,234,128,256,350,537,158,333,384, 584,429,640,661,1038,185,367,399,629,472,701,795,
1072,5 12,786,740,1119,879,1177,1220,1579,210,444,499,
721,524,777,829,1132,596,863,896,1183,995,12 62,1297,
1664,650,911,1024,1285,1059,1342,1397,1722,1113,1408,
1470,1838,1501,1891,1983,240 6,276,458,561,855,607,
887,987,1232,671,1031,927,1303,1093,1364,1439,1761,
768,1009,1106,140 2,1145,1455,1496,1871,1208,1511,
1594,1939,1659,2010,2077,2541,846,1126,1196,1491,
1274,155 0,1631,1994,1331,1636,1718,2048,1774,2140,
2200,2652,1423,1753,1854,2158,1883,2204,2290,27
42,1963,2314,2386,2816,2451,2879,2991,3530,415,549,
618,1002,711,1052,1079,1429,803,1099,1 152,1486,1214,
1545,1565,1990,871,1158,1226,1555,1291,1627,1704,
2055,1359,1709,1757,2118,1 863,2186,2270,2711,942,
1250,1337,1654,1370,1713,1787,2161,1475,1846,1887,
2214,1959,2310,2 363,2807,1560,1927,1998,2334,2051,
2432,2460,2871,2147,2501,2599,2962,2670,3043,3214,
3532, 973,1348,1450,1800,1536,1875,1955,2327,1584,
1967,2021,2403,2081,2457,2535,2933,1695,2066, 2122,
2492,2207,2581,2658,3072,2249,2679,2756,3137,2835,
3244,3306,3802,1783,2168,2228,261 1,2340,2702,2768,
3192,2447,2796,2873,3280,2965,3318,3460,3943,2532,
2906,2996,3393,3033,35 05,3568,4064,3204,3601,3671,
4039,3743,4167,4328,4836,485,681,730,1139,812,1164,
1238,1622, 821,1244,1308,1668,1381,1766,1808,2263,935,
1314,1386,1825,1460,1859,1915,2266,1506,1907,1 986,
2380,2070,2444,2476,2868,958,1444,1516,1834,1603,
1931,2002,2441,1650,2040,2085,2482,2 132,2575,2629,
3028,1645,2125,2176,2566,2246,2667,2716,3145,2347,
2779,2840,3241,2898,3299, 3407,3905,1045,1574,1612,
2029,1686,2107,2172,2547,1731,2197,2225,2655,2293,
2739,2793,323 1,1975,2273,2344,2754,2409,2829,2895,
3289,2510,2917,3009,3384,3084,3501,3577,4017,2100,23
93,2488,2860,2563,2957,3017,3467,2644,3056,3107,3523,
3217,3634,3699,4126,2762,3212,3251,3 673,3292,3748,
3651,4203,3428,3893,3949,4363,3973,4524,4611,4939,
1086,1673,1700,2242,1935, 2307,2357,2776,2036,2373,
2419,2849,2507,2927,3007,3474,2092,2498,2560,2930,
2608,3022,309 2,3544,2682,3117,3187,3614,3285,3688,
3796,4225,2259,2578,2626,3087,2714,3165,3258,3656,28
43,3260,3308,3788,3435,3735,3925,4373,2951,3368,3492,
3895,3546,3968,4029,4474,3636,4053,4 047,4589,4209,
4653,4727,5157,2390,2673,2782,3268,2922,3316,3403,
3829,3012,3469,3510,3955, 3597,3985,4045,4513,3094,
3561,3660,4023,3701,4058,4215,4660,3823,4249,4311,
4746,4419,486 0,4925,5380,3234,3679,3777,4221,3919,
4231,4396,4776,3939,4379,4485,4900,4567,4986,5106,55
48,3987,4530,4637,5028,4696,5126,5070,5605,4822,5217,
5279,5764,5411,5850,5954,6239,573,75 8,838,1202,903,
1320,1391,1792,950,1413,1465,1821,1531,1899,1920,
2422,965,1521,1570,1895,1 617,2111,2150,2529,1735,
2154,2239,2646,2304,2722,2788,3277,980,1598,1677,
2129,1744,2232,2 280,2696,1796,2324,2367,2802,2428,
2882,2944,3323,1850,2399,2470,2914,2550,2999,3048,
3449, 2584,3030,3122,3555,3135,3612,3684,4340,1256,
1740,1779,2297,1830,2370,2425,2857,1947,247 9,2513,
2978,2596,3064,3115,3483,2025,2526,2623,3041,2690,
3130,3152,3584,2751,3157,3185,36 92,3365,3754,3872,
4377,2096,2688,2731,3177,2821,3253,3270,3720,2892,
3358,3416,3821,3521,3 911,3959,4491,2975,3458,3552,
3963,3643,4011,4139,4573,3773,4155,4255,4667,4316,
4766,4872, 5363,1280,1817,1903,2463,2013,2516,2605,
3077,2074,2635,2699,3162,2765,3202,3222,3707,219
3,2737,2818,3226,2887,3344,3400,3804,2967,3439,3514,
3935,3588,3993,4088,4496,2283,2854,29 41,3412,3054,
3499,3490,3999,3100,3566,3606,4068,3726,4145,4189,
4678,3195,3647,3762,4173,3 810,4283,4322,4781,3887,
4369,4442,4905,4584,5000,5113,5557,2354,2989,3061,
3575,3147,3627, 3729,4161,3335,3769,3844,4301,3856,
4334,4407,4851,3372,3848,3881,4390,4003,4436,4547,498
1,4112,4578,4631,5033,4721,5167,5239,5634,3444,4033,
4080,4502,4191,4595,4648,5085,4261,47 09,4790,5212,
4881,5289,5394,5796,4453,4803,4913,5314,5015,5428,
5476,5931,5093,5519,5596,5 990,5705,6094,6223,6606,
1375,1951,2044,2638,2179,2725,2804,3297,2221,2832,
2909,3353,2983, 3426,3537,4094,2330,2949,3074,3478,
3127,3623,3592,4124,3170,3664,3741,4243,3835,4289,435
1,4827,2556,3105,3175,3621,3332,3716,3781,4307,3351,
3837,3868,4357,3917,4413,4470,4953,33 77,3901,3979,
4464,4106,4541,4617,5042,4177,4691,4716,5172,4796,
5249,5336,5743,2590,3328,3 342,3815,3382,3854,3929,
4430,3451,4009,4074,4519,4149,4600,4703,5144,3756,
4102,4197,4626, 4265,4751,4808,5225,4425,4817,4919,
5319,5020,5421,5467,5919,3862,4277,4384,4757,4459,489
1,4966,5354,4562,4991,5057,5458,5136,5528,5626,6028,
4642,5098,5190,5587,5275,5655,5738,61 22,5371,5775,
5839,6195,5896,6325,6356,6839,2614,3391,3419,4082,
3712,4132,4183,4684,3790,4 237,4295,4771,4402,4846,
4944,5346,3876,4346,4447,4865,4508,4973,5062,5447,
4606,5121,5048, 5502,5235,5614,5697,6067,4118,4479,
4536,5007,4673,5077,5180,5566,4741,5194,5265,5664,532
8,5717,5807,6180,4886,5297,5388,5755,5484,5862,5907,
6289,5540,5978,6017,6396,6107,6452,64 95,6743,4271,
4556,4735,5203,4841,5257,5305,5726,4932,5404,5438,
5830,5510,5873,6002,6340,4 958,5493,5575,5967,5685,
6040,6053,6472,5787,6137,6164,6516,6258,6634,6684,
7039,5149,5646, 5676,6079,5819,6149,6211,6561,5885,
6274,6305,6659,6415,6713,6874,7148,5943,6376,6432,677
4,6536,6803,6909,7209,6585,6950,6992,7284,7088,7371,
7488,7655,296,691,919,1418,1065,1480, 1640,2089,1171,
1589,1726,2190,1842,2300,2337,2946,1268,1691,1770,
2276,1943,2396,2553,299 4,2032,2538,2473,3069,2705,
3150,3207,3690,1353,1879,2006,2435,2059,2523,2620,
3089,2211,26 76,2734,3160,2890,3273,3320,3794,2317,
2759,2925,3304,2981,3379,3456,3864,3059,3471,3548,4
001,3586,4060,4169,4682,1540,1911,2136,2661,2235,
2719,2876,3229,2360,2938,2773,3330,3025, 3405,3503,
3909,2504,2911,3046,3462,3110,3526,3581,4037,3190,
3603,3703,4120,3785,4207,428 7,4832,2649,3079,3172,
3572,3282,3645,3752,4187,3361,3760,3860,4251,3921,
4359,4438,4956,34 85,3897,4019,4388,4051,4444,4545,
5053,4153,4576,4657,5129,4732,5198,5311,5825,1804,
2114,2 256,2903,2415,2973,3002,3494,2572,3038,3120,
3564,3200,3640,3669,4181,2693,3132,3219,3653, 3311,
3745,3840,4263,3396,3846,3903,4332,4031,4421,4523,
5017,2799,3256,3370,3779,3414,385 2,3941,4394,3557,
4007,4055,4455,4147,4571,4629,5124,3662,4104,4195,
4598,4257,4712,4743,51 86,4365,4789,4896,5283,4975,
5366,5534,5827,2851,3389,3517,3957,3632,4041,4141,
4587,3697,4 159,4217,4676,4291,4737,4831,5254,3827,
4269,4338,4780,4449,4877,4964,5391,4500,4983,5068,
5461,5152,5563,5623,6056,3933,4400,4472,4910,4604,
5012,5082,5513,4728,5110,5191,5599,528 6,5637,5767,
6171,4824,5223,5317,5708,5357,5804,5859,6263,5525,
5887,5946,6245,6007,6338,64 55,6815,1979,2377,2454,
3102,2587,3142,3239,3737,2602,3246,3339,3798,3433,
3913,3965,4511,2 785,3346,3437,3981,3535,4025,4090,
4517,3595,4086,4175,4651,4275,4723,4760,5183,2824,
3512, 3608,3995,3718,4110,4201,4718,3771,4241,4297,
4767,4353,4869,4930,5349,3764,4342,4409,486 3,4495,
4970,5025,5464,4615,5090,5155,5560,5220,5620,5720,
6139,2959,3682,3724,4229,3819,43 20,4405,4837,3870,
4432,4466,4961,4550,5050,5105,5551,4163,4528,4609,
5065,4687,5141,5214,5 608,4799,5238,5332,5700,5407, 5802,5868,6230,4314,4666,4774,5178,4858,5276,5339,
5770,4948, 5377,5431,5822,5537,5913,5969,6311,5073,
5531,5569,5948,5611,6010,5929,6367,5739,6127,617
3,6479,6192,6599,6663,6886,3015,3806,3831,4489,4116,
4565,4624,5087,4235,4646,4693,5164,47 94,5246,5325,
5778,4303,4785,4855,5251,4908,5343,5414,5836,4990,
5441,5508,5899,5602,5961,6 049,6382,4506,4874,4927,
5408,5023,5487,5578,5934,5160,5581,5629,6043,5741,
5999,6156,6485, 5271,5682,5793,6131,5842,6190,6235,
6563,5916,6254,6251,6644,6369,6692,6739,7026,4662,497
8,5096,5584,5243,5631,5714,6076,5335,5773,5810,6177,
5882,6202,6249,6591,5417,5853,5937,62 33,5972,6261,
6373,6696,6074,6399,6442,6754,6522,6830,6878,7166,
5554,5951,6035,6380,6152,6 386,6506,6777,6168,6492,
6571,6858,6627,6918,6997,7263,6204,6603,6677,6942,
6720,7009,6972, 7300,6807,7066,7106,7392,7185,7439,
7501,7646,2165,2485,2632,3180,2745,3356,3446,3947,281
3,3481,3541,3977,3625,4072,4098,4698,2838,3616,3675,
4066,3733,4326,4371,4818,3879,4382,44 83,4949,4560,
5032,5101,5593,2862,3709,3813,4348,3889,4478,4534,
5003,3951,4582,4635,5116,4 707,5201,5263,5640,4015,
4671,4755,5231,4844,5322,5368,5752,4882,5350,5444,
5848,5455,5893, 5957,6462,3265,3885,3927,4552,3989,
4640,4702,5175,4130,4762,4804,5300,4895,5386,5434,578
4,4223,4813,4922,5360,4998,5451,5473,5870,5058,5478,
5505,5964,5679,6014,6112,6489,4309,49 95,5040,5499,
5138,5572,5590,5986,5209,5673,5729,6071,5816,6143,
6183,6575,5294,5761,5845,6 186,5923,6226,6318,6630,
6031,6331,6402,6699,6445,6766,6842,7157,3294,3971,
4076,4748,4211, 4810,4903,5400,4281,4936,5008,5481,
5078,5522,5543,5975,4426,5045,5133,5546,5206,5661,571
1,6058,5291,5746,5813,6161,5876,6207,6283,6577,4539,
5168,5260,5723,5374,5799,5790,6214,54 24,5856,5890,
6267,5993,6321,6354,6707,5516,5926,6022,6343,6061,
6422,6449,6781,6124,6483,6 540,6862,6642,6926,7000,
7269,4620,5308,5383,5865,5470,5910,5996,6334,5652,
6025,6089,6435, 6101,6458,6512,6826,5688,6092,6119,
6502,6217,6533,6616,6914,6299,6638,6673,6946,6735,703
0,7079,7316,5749,6242,6277,6581,6360,6648,6688,6980,
6406,6728,6785,7061,6846,7110,7176,74 10,6547,6792,
6865,7124,6934,7194,7224,7482,6984,7248,7294,7519,
7354,7574,7638,7822,3423,4 135,4245,4941,4415,5037,
5118,5617,4461,5146,5228,5670,5303,5735,5833,6286,
4593,5268,5397, 5781,5450,5905,5879,6309,5490,5940,
6004,6393,6082,6426,6468,6812,4850,5427,5496,5902,564
9,5983,6038,6439,5667,6085,6109,6475,6146,6520,6557,
6893,5691,6134,6199,6553,6295,6613,66 67,6955,6347,
6717,6732,7035,6788,7083,7138,7381,4888,5643,5658,
6064,5694,6097,6158,6530,5 758,6221,6270,6595,6327,
6652,6724,7018,6020,6293,6363,6669,6409,6758,6796,
7070,6526,6799, 6869,7129,6938,7190,7219,7475,6104,
6419,6499,6761,6550,6855,6902,7152,6623,6922,6963,721
4,7013,7253,7310,7539,6681,6988,7048,7290,7101,7326,
7375,7588,7162,7398,7434,7624,7463,76 94,7711,7914,
4917,5702,5732,6279,5981,6315,6350,6710,6046,6389,
6428,6770,6510,6823,6890,7 143,6116,6466,6543,6835,
6589,6905,6967,7205,6655,7005,6958,7238,7075,7305,
7348,7559,6302, 6567,6609,6930,6703,6975,7043,7274,
6750,7053,7096,7332,7134,7359,7416,7616,6850,7115,717
1,7386,7229,7445,7469,7677,7259,7514,7533,7728,7580,
7754,7773,7878,6413,6620,6746,7057,68 19,7093,7120,
7365,6881,7180,7199,7427,7244,7452,7526,7702,6897,
7234,7279,7507,7342,7546,7 553,7764,7404,7594,7609,
7782,7662,7833,7854,7987,7022,7321,7337,7567,7421,
7602,7632,7802, 7457,7670,7686,7844,7737,7866,7928,
8021,7494,7720,7745,7889,7793,7902,7942,8040,7812,795
5,7971,8061,8003,8084,8111,8145,315,749,1016,1608,
1189,1682,1923,2412,1325,1867,2017,2520, 2143,2641,
2685,3363,1434,1971,2063,2617,2252,2771,2935,3421,
2350,2919,2846,3496,3097,359 0,3649,4157,1526,2183,
2320,2810,2383,2901,3004,3519,2544,3066,3125,3599,
3301,3714,3767,42 73,2664,3155,3337,3750,3398,3825,
3907,4350,3487,3923,4005,4498,4049,4563,4675,5154,
1748,2 218,2466,3051,2569,3112,3287,3666,2708,3349,
3182,3775,3453,3858,3961,4398,2884,3325,3476, 3915,
3539,3983,4043,4537,3630,4062,4179,4622,4267,4711,
4787,5295,3035,3508,3610,4035,373 1,4114,4227,4689,
3808,4233,4344,4753,4417,4862,4929,5405,3945,4386,
4521,4879,4554,4934,50 27,5494,4655,5055,5131,5564,
5199,5624,5727,6213,2103,2438,2593,3313,2790,3386,
3430,3953,2 954,3465,3550,4027,3638,4108,4137,4685,
3082,3559,3658,4122,3758,4219,4324,4764,3850,4330,
4392,4834,4532,4912,5005,5462,3209,3694,3817,4259,
3866,4336,4434,4884,4013,4510,4558,494 6,4649,5052,
5108,5558,4128,4607,4694,5075,4759,5181,5211,5615,
4867,5252,5352,5701,5422,57 80,5938,6215,3263,3833,
3975,4451,4092,4543,4644,5067,4165,4658,4719,5151,
4792,5207,5287,5 674,4313,4773,4839,5244,4937,5333,
5413,5806,4985,5433,5507,5869,5582,5965,6021,6431,
4428, 4893,4959,5365,5083,5456,5520,5920,5196,5544,
5618,5997,5704,6032,6154,6539,5284,5648,573 3,6098,
5771,6194,6246,6628,5930,6271,6329,6610,6385,6697,
6802,7108,2287,2728,2827,3528,29 70,3570,3677,4213,
2986,3686,3783,4279,3883,4404,4463,4997,3197,3792,
3891,4481,3991,4526,4 597,5002,4057,4586,4680,5128,
4778,5193,5227,5612,3236,3969,4070,4493,4193,4613,
4700,5188, 4253,4744,4797,5233,4853,5327,5382,5765,
4247,4843,4901,5321,4980,5419,5468,5875,5092,552
9,5588,5962,5642,6015,6111,6511,3375,4151,4199,4730,
4299,4820,4898,5298,4361,4924,4954,54 10,5030,5491,
5541,5955,4664,5010,5088,5503,5159,5576,5639,6006,
5262,5660,5748,6090,5817,6 188,6253,6594,4815,5139,
5241,5606,5316,5695,5757,6160,5396,5791,5840,6209,
5941,6298,6351, 6671,5514,5936,5971,6330,6009,6390,
6313,6722,6129,6501,6544,6824,6562,6925,6978,7165,344
2,4285,4318,4976,4618,5047,5100,5526,4739,5119,5165,
5594,5259,5669,5745,6167,4806,5247,53 13,5672,5361,
5759,5826,6225,5436,5849,5914,6282,6003,6342,6427,
6737,4993,5330,5379,5820,5 465,5895,5979,6317,5591,
5982,6024,6420,6133,6379,6525,6831,5692,6075,6182,
6503,6227,6558, 6601,6895,6301,6619,6615,6964,6725,
7003,7045,7283,5134,5425,5532,5988,5663,6029,6105,645
3,5751,6163,6196,6548,6269,6570,6614,6919,5829,6238,
6319,6598,6352,6624,6729,7006,6448,67 51,6791,7056,
6859,7122,7158,7395,5958,6335,6411,6733,6521,6740,
6845,7074,6535,6834,6901,7 144,6951,7192,7257,7476,
6572,6928,6993,7215,7028,7267,7237,7502,7100,7314,
7346,7575,7411, 7613,7659,7775,2495,2865,3020,3619,
3140,3800,3899,4440,3224,3931,3997,4476,4084,4574,460
2,5170,3248,4078,4143,4569,4205,4825,4870,5281,4367,
4876,4971,5399,5043,5474,5538,5995,32 75,4185,4293,
4848,4380,4963,5018,5448,4445,5063,5111,5552,5177,
5627,5683,6036,4515,5147,5 219,5657,5302,5736,5786,
6145,5338,5768,5855,6234,5866,6281,6339,6809,3705,
4375,4423,5035, 4487,5115,5173,5603,4633,5230,5267,
5716,5347,5800,5846,6175,4725,5278,5375,5777,5442,586
0,5883,6257,5500,5886,5912,6346,6072,6394,6486,6833,
4811,5439,5482,5906,5570,5974,5989,63 68,5636,6068,
6118,6446,6206,6515,6552,6904,5713,6153,6231,6554,
6306,6590,6678,6954,6410,6 689,6755,7011,6795,7068,
7128,7387,3739,4468,4580,5215,4714,5270,5358,5812,
4783,5390,5453, 5892,5517,5927,5947,6358,4920,5488,
5567,5950,5630,6054,6103,6433,5707,6138,6200,6534,626
2,6576,6645,6908,5022,5600,5680,6113,5789,6187,6179, 6580,5832,6243,6275,6632,6372,6682,6712,7017,5922,6310,6401,6701,6437,6772,6798,7077,6497,6828,6873,7147,6961,7200,7260,7479,5095,5724,5797,6250,5878,6294,6375,6693,6047,6405,6463,6783,6474,6806,6852,7117,6081,6467,6493,6841,6584,6870,6939,7188,6661,6957,6990,7217,7042,7287,7325,7515,6141,6605,6639,6911,6714,6968,6999,7245,6759,7036,7082,7311,7133,7350,7402,7589,6880,7089,7151,7363,7207,7419,7441,7649,7250,7462,7497,7674,7547,7717,7769,7906,3874,4638,4750,5393,4907,5479,5555,6013,4951,5579,5651,6063,5722,6126,6219,6649,5072,5689,5809,6169,5858,6290,6265,6668,5897,6323,6384,6748,6457,6776,6817,7103,5310,5838,5903,6287,6045,6364,6416,6787,6060,6459,6481,6820,6519,6856,6891,7173,6083,6507,6566,6887,6657,6936,6981,7222,6704,7024,7038,7291,7086,7330,7374,7565,5344,6039,6052,6441,6087,6471,6529,6867,6148,6587,6635,6921,6686,6970,7032,7276,6397,6653,6718,6986,6763,7060,7091,7318,6863,7097,7155,7366,7210,7415,7437,7644,6477,6769,6837,7063,6884,7140,7181,7383,6948,7195,7230,7432,7271,7466,7511,7690,6996,7252,7299,7493,7343,7524,7561,7729,7391,7579,7608,7758,7634,7807,7819,7977,5369,6096,6120,6640,6362,6674,6708,7021,6423,6744,6780,7071,6848,7114,7169,7378,6488,6813,6876,7125,6915,7184,7232,7428,6974,7265,7225,7454,7323,7505,7543,7707,6664,6898,6932,7202,7015,7240,7295,7484,7054,7302,7339,7528,7369,7551,7593,7752,7136,7355,7400,7570,7446,7619,7639,7795,7472,7669,7685,7834,7723,7853,7869,7949,6765,6944,7050,7307,7111,7334,7358,7556,7163,7407,7423,7604,7458,7623,7679,7814,7177,7449,7487,7664,7537,7696,7700,7861,7585,7735,7746,7875,7783,7916,7931,8031,7278,7521,7534,7712,7599,7740,7765,7891,7628,7788,7800,7923,7840,7940,7988,8057,7653,7827,7847,7959,7883,7967,7997,8072,7899,8009,8019,8088,8044,8105,8126,8152,1813,2748,3167,3937,3409,4021,4239,4801,3579,4171,4355,4915,4504,5038,5080,5686,3722,4305,4411,5013,4628,5142,5306,5730,4734,5292,5222,5803,5459,5880,5933,6344,3842,4549,4705,5185,4769,5273,5372,5823,4942,5430,5485,5889,5633,5992,6034,6424,5060,5511,5666,6018,5719,6086,6150,6480,5794,6165,6229,6582,6259,6625,6698,7019,4100,4591,4857,5416,4968,5471,5621,5953,5103,5677,5523,6042,5762,6108,6191,6513,5255,5654,5783,6157,5843,6210,6255,6608,5917,6273,6355,6666,6418,6723,6775,7107,5402,5815,5900,6247,6000,6307,6392,6709,6070,6398,6476,6753,6524,6822,6872,7174,6176,6504,6596,6840,6618,6875,6937,7228,6687,6956,7004,7268,7049,7303,7361,7601,4457,4829,4988,5645,5162,5710,5742,6184,5324,5774,5852,6241,5924,6303,6326,6706,5445,5863,5944,6314,6027,6388,6461,6760,6100,6464,6508,6804,6604,6861,6924,7208,5549,5976,6078,6414,6115,6470,6538,6844,6237,6586,6622,6882,6683,6952,6987,7266,6322,6654,6715,6969,6756,7037,7055,7298,6825,7081,7142,7347,7186,7389,7468,7603,5597,6093,6203,6549,6297,6611,6679,6962,6348,6691,6730,7016,6779,7051,7104,7333,6450,6764,6808,7076,6879,7131,7179,7401,6910,7191,7236,7435,7281,7483,7509,7701,6531,6847,6892,7150,6973,7206,7243,7459,7047,7258,7301,7498,7349,7516,7576,7749,7102,7317,7364,7548,7384,7592,7617,7785,7465,7629,7656,7778,7682,7813,7855,7970,4669,5123,5204,5835,5341,5872,5960,6381,5355,5968,6050,6429,6130,6517,6556,6916,5535,6057,6135,6568,6218,6600,6647,6920,6266,6643,6702,7001,6767,7044,7064,7297,5573,6198,6278,6578,6365,6658,6719,7041,6407,6745,6782,7069,6818,7127,7161,7380,6403,6811,6853,7123,6907,7183,7213,7436,6979,7247,7282,7481,7315,7508,7554,7736,5698,6336,6371,6738,6444,6797,6851,7109,6484,6868,6889,7178,6940,7227,7255,7477,6694,6927,6976,7235,7023,7275,7313,7503,7087,7324,7372,7544,7408,7591,7621,7771,6793,7010,7073,7293,7121,7344,7376,7577,7170,7394,7420,7600,7471,7641,7665,7803,7239,7467,7485,7657,7504,7683,7648,7823,7563,7731,7750,7863,7757,7904,7924,7991,5754,6436,6454,6903,6662,6949,6985,7246,6742,6998,7025,7286,7084,7329,7368,7581,6786,7080,7118,7331,7149,7377,7412,7606,7193,7425,7456,7635,7499,7661,7699,7829,6913,7130,7159,7409,7212,7447,7489,7650,7285,7491,7512,7697,7564,7678,7742,7865,7341,7536,7587,7732,7610,7756,7774,7892,7643,7781,7780,7919,7825,7933,7948,8028,7007,7187,7251,7492,7327,7513,7550,7710,7373,7578,7596,7751,7627,7760,7779,7901,7413,7614,7651,7772,7666,7784,7826,7934,7709,7835,7850,7952,7879,7975,7989,8062,7478,7658,7693,7828,7741,7830,7872,7960,7748,7868,7894,7983,7912,7999,8020,8083,7761,7905,7929,8007,7943,8024,8014,8091,7968,8038,8048,8109,8067,8118,8128,8151,4889,5236,5385,5909,5497,6065,6142,6542,5561,6172,6222,6565,6291,6633,6650,7029,5585,6285,6333,6629,6377,6801,6829,7099,6490,6836,6899,7172,6945,7216,7254,7496,5609,6359,6440,6814,6498,6896,6931,7201,6545,6960,6991,7261,7034,7306,7338,7517,6592,7012,7062,7322,7113,7367,7390,7569,7135,7382,7426,7612,7431,7633,7660,7857,5985,6494,6527,6943,6573,6994,7031,7292,6672,7067,7090,7356,7141,7399,7422,7583,6734,7095,7156,7385,7198,7430,7440,7622,7231,7443,7455,7663,7535,7684,7725,7867,6790,7197,7221,7453,7273,7486,7495,7673,7309,7532,7557,7708,7598,7738,7753,7896,7352,7572,7611,7755,7645,7770,7805,7913,7691,7810,7836,7935,7851,7956,7978,8059,6011,6559,6637,7058,6727,7094,7145,7406,6771,7164,7203,7444,7242,7464,7473,7668,6864,7223,7270,7474,7308,7527,7549,7703,7351,7566,7597,7744,7625,7763,7791,7897,6933,7289,7335,7555,7393,7590,7586,7766,7417,7615,7631,7786,7675,7806,7818,7938,7460,7647,7688,7815,7704,7843,7852,7961,7730,7864,7884,7984,7918,8001,8022,8085,6982,7360,7397,7620,7438,7640,7676,7811,7523,7689,7715,7848,7721,7856,7874,7974,7538,7716,7727,7871,7767,7882,7909,7998,7798,7917,7927,8008,7947,8029,8042,8094,7568,7777,7789,7898,7820,7920,7932,8016,7837,7945,7962,8037,7979,8049,8065,8113,7886,7964,7985,8052,8004,8069,8075,8125,8017,8080,8090,8131,8102,8140,8150,8171,6123,6676,6749,7167,6857,7220,7262,7506,6885,7277,7319,7531,7357,7560,7605,7794,6966,7340,7403,7582,7429,7637,7626,7801,7448,7652,7681,7832,7713,7845,7860,7969,7116,7418,7450,7636,7522,7672,7695,7849,7529,7714,7724,7862,7739,7877,7890,7993,7540,7734,7759,7888,7797,7908,7925,8010,7816,7941,7946,8030,7963,8043,8055,8107,7137,7518,7525,7705,7542,7718,7743,7881,7571,7768,7787,7903,7809,7921,7944,8026,7687,7796,7821,7926,7838,7953,7965,8039,7880,7966,7986,8053,8005,8068,8074,8124,7722,7842,7870,7954,7887,7982,7995,8058,7911,8000,8012,8073,8025,8081,8093,8134,7930,8018,8034,8089,8047,8096,8106,8142,8060,8110,8117,8148,8122,8157,8159,8179,7154,7545,7558,7790,7671,7804,7817,7939,7698,7831,7846,7958,7873,7973,7992,8056,7726,7859,7885,7976,7900,7996,8013,8071,7922,8023,8011,8078,8041,8092,8101,8137,7799,7893,7907,8002,7937,8015,8032,8086,7951,8035,8046,8097,8054,8103,8114,8147,7980,8050,8063,8108,8076,8119,8123,8155,8082,8130,8133,8161,8141,8164,8166,8176,7839,7910,7950,8036,7972,8045,8051,8104,7990,8066,8070,8116,8079,8120,8132,8158,7994,8077,8087,8129,8100,8135,8136,8165,8112,8143,8146,8167,8153,8172,8174,8184,8027,8095,8099,8139,8115,8144,8149,8169,8121,8154,8156,8173, 8162,8175,8180,8186,8127,8160,8163,81 77,8168,8178, 8181,8187,8170,8182,8183,8188,8185,8189,8190,8191]

Sequence Group 4: Q4_2048

[0,1,2,4,8,16,32,3,5,64,9,6,17,10,18,128,12,33,65,20, 256,34,24,36,7,129,66,512,11,40,6 8,130,19,13,48,14,72, 257,21,132,35,258,26,513,80,37,25,22,136,260,264,38,514, 96,67,41,144,28,6 9,42,516,49,74,272,160,1024,520,288, 528,192,544,70,44,131,81,50,73,15,320,133,52,23,134, 384,7 6,137,82,56,27,97,39,259,84,138,145,261,29,43,98, 515,88,140,30,146,1025,71,262,265,161,576,45, 100,640, 1026,51,148,46,75,266,273,517,104,162,53,193,1028,152, 77,164,768,268,274,518,54,83, 57,521,112,1032,135,78, 289,194,85,276,522,58,168,139,99,86,60,280,89,290,529, 524,196,141,104 0,101,147,176,142,530,321,31,200,90, 1056,545,292,322,532,263,149,102,105,304,296,1027, 163,9 2,1029,47,267,385,546,324,208,386,150,153,165, 106,55,328,1088,536,577,548,1033,113,154,79,2 69,108, 578,224,166,519,552,195,270,1030,641,1041,523,275,580, 291,59,169,560,114,277,156,87, 1034,197,116,170,61, 1042,531,525,642,281,278,526,177,293,388,1152,91,584, 769,198,172,120,20 1,336,62,282,143,1036,1057,103,178, 294,93,1089,644,202,592,323,392,297,770,107,180,1044, 151, 209,284,1280,648,94,204,298,400,608,1058,352,325, 533,155,210,305,547,300,109,1048,184,534, 1060,537,115, 1031,167,225,326,306,772,157,656,329,110,117,212,171, 1153,776,1090,330,1536,22 6,549,1035,538,387,308,216, 416,271,279,158,337,550,672,1064,118,332,579,540,1092, 389,173,11 54,121,553,199,784,179,228,338,312,1043,704, 1037,390,174,554,581,1072,393,283,122,448,353,5 61,1038,203,63,340,394,1096,1281,527,582,556,181,295, 1045,285,232,124,205,182,643,1156,562, 286,585,299,354, 1059,211,401,1282,185,1050,396,344,586,645,1537,593, 535,240,1104,206,95,32 7,564,800,402,356,307,301,417, 1061,213,1049,568,1046,832,588,1160,1284,186,646,404, 1288,22 7,896,594,418,302,649,771,360,539,111,1062,331, 1538,214,309,1120,1091,188,449,1065,217,408, 609,596, 551,650,229,159,420,310,1168,541,1052,773,610,657,333, 1093,119,1066,600,339,1540,2 18,368,652,1073,230,391, 313,450,542,1098,334,1296,233,555,774,175,123,1184, 658,612,341,777, 220,314,1544,424,1312,395,673,583,355, 1552,1216,287,183,234,1568,125,557,1094,660,616,342, 316,1068,241,778,563,1155,345,452,397,403,1105,207, 1074,674,558,785,1097,432,1039,357,187, 1344,236,664, 1157,624,587,780,1076,1047,705,126,242,1158,565,398, 346,456,358,405,303,569,1 408,244,1100,1161,595,1106, 189,566,676,1080,1051,1121,361,706,589,1063,215,786, 647,348,419, 406,464,680,801,1283,362,1108,590,409, 1162,570,1169,788,1285,1053,597,1067,572,1122,219,31 1,708,598,1539,601,651,421,792,802,611,1112,602,1164, 410,231,688,653,1054,248,1170,369,190, 364,1095,654, 1286,659,1289,335,480,315,221,370,1185,613,1600,422, 425,451,1069,614,543,1124, 235,412,343,372,1664,775, 317,1075,222,1172,426,453,237,1070,559,1099,1290,833, 804,712,129 7,834,661,1541,808,779,1128,617,604,1186, 433,720,816,1077,1217,836,347,897,1176,243,1101,66 2,1188,454,318,675,1792,618,1292,898,781,1298,1542, 376,428,1078,665,736,567,1107,1081,1545, 840,625,238, 1136,359,457,399,787,591,678,434,677,1159,1102,349, 1313,1218,245,1109,458,666, 1300,620,1546,1082,1192, 363,127,1163,191,1123,782,407,436,626,1110,571,465, 681,246,707,108 4,350,1304,599,668,1113,790,1314,1553, 460,1548,1220,249,682,1165,573,1125,411,803,1171,789, 1200,709,365,440,628,689,374,1166,423,1554,466,793, 1345,250,371,1055,481,574,1224,413,1114, 603,366,1569, 1316,1346,468,1556,655,900,805,615,1287,684,1173,710, 1126,429,794,252,1129,37 3,605,1328,848,690,713,632, 1320,482,806,1187,1116,427,1071,904,1291,414,1409,223, 1570,1348, 663,692,835,1232,619,472,1410,455,796,1174, 1177,809,714,1189,721,837,716,1130,1079,1352,86 4,810, 1560,606,1601,912,1572,722,696,377,1137,435,1178,1103, 817,1293,1132,319,621,1602,812, 484,1248,430,1190, 1543,1576,838,667,1219,488,1294,239,378,459,622,1665, 627,437,380,1547,12 99,818,1604,1315,461,1083,496,669, 1193,1584,679,1138,1301,1180,724,841,1111,629,1221, 351,4 67,1140,438,1194,737,251,462,442,441,1085,469, 1555,247,683,1549,1666,842,1305,1302,738,155 0,1201, 899,1317,670,1412,783,1115,849,1608,1793,820,1222,728, 928,791,367,1196,901,1144,630, 1225,685,844,1360,633, 711,1086,253,691,1306,824,1167,902,686,1127,1202,1318, 1117,740,1668, 850,375,1226,444,1616,470,1347,483, 1416,415,485,905,1321,795,473,1794,634,744,1131,852, 960, 1204,865,693,1175,1233,1308,797,1672,1118,1228, 906,1322,715,1424,1632,807,474,636,1376,69 4,254,1349, 1557,717,1179,1234,575,913,1329,798,811,379,1571,1324, 1133,697,1208,431,1558,60 7,1561,489,1139,866,723,486, 1191,1249,1350,908,1330,1796,718,813,1181,476,856, 1680,1353,83 9,1134,1141,1236,725,698,1195,914,1800, 752,868,819,1354,814,439,929,1250,1573,490,1562,141 1,623,1332,1240,671,1440,1295,739,1303,1182,1361,916, 1574,463,1696,843,1142,381,1356,1603, 497,1564,930, 821,726,961,1413,1197,872,1145,492,1577,1223,631,1808, 1203,729,1252,1362,700, 1336,443,1728,741,1414,1198, 1578,1605,845,1417,920,382,1307,822,1146,851,1472,730, 1377,49 8,880,1585,742,445,1227,471,635,1087,1364,932, 1418,687,1551,1606,1580,1205,1319,903,1309,8 25,1256, 1148,500,1229,846,1206,1667,745,826,732,1586,446,962, 1310,1609,936,1323,475,853,13 78,867,637,1235,1425, 1209,907,1420,1368,1610,1669,487,1617,695,1559,1264, 746,828,753,1230, 854,1119,1351,857,1588,1824,504,799, 1426,255,964,1380,909,1331,1325,1441,719,1237,477,159 2,915,1856,1612,638,748,944,1210,1670,1428,869,1251, 1920,491,699,1618,1442,754,1326,1673,8 58,1795,1384, 1563,478,968,1135,383,1355,910,1238,815,1333,976,870, 1212,1473,917,1241,1432, 1633,1620,727,1575,1674,493, 1253,1183,1444,873,1334,701,1565,931,1797,1634,1681, 1357,756, 1143,860,499,731,1624,1363,823,1242,922, 1392,1676,874,1254,1415,918,1337,1474,502,1566,93 3,1358,1257,1579,1798,1199,1147,743,1682,760,1636, 1365,881,1801,494,1244,1338,702,921,144 8,501,876, 1419,847,1697,1607,992,1379,447,1311,1207,1258,1149, 1581,733,1684,1640,1366,134 0,827,1265,934,1802,1587, 882,937,963,1369,747,1476,1421,505,1427,855,924,1231, 734,829,1698, 1582,1809,1456,1381,1211,1260,1688,965, 1648,1611,1804,938,884,506,1729,1150,1266,749,1589, 1422,945,966,1370,1480,755,1382,859,1429,1327,1593, 940,1268,830,1619,911,1213,1590,1700,8 71,639,1385, 1730,1613,888,1239,1810,479,1671,1372,946,1443,1430, 750,1488,1704,1825,969,50 8,1386,861,1614,1433,1594, 757,1812,970,1621,1596,919,1243,1335,1732,1622,875, 1625,1675,86 2,1445,1816,1826,758,1635,948,1626,1434, 1255,1712,1677,977,1272,923,1393,972,1214,1388,16 78,761,1683,877,1359,1504,1339,1245,952,1394,495,1637, 1446,1449,1475,1638,1567,703,1259,1 436,1367,1396,935, 1799,978,1341,883,762,1246,503,1450,925,1477,1261,878, 1583,735,1857,182 8,1736,1858,1685,1832,1803,1641, 1628,993,1457,1744,1840,885,939,994,1860,1371,1921, 980,12 67,926,764,1686,941,1478,1342,1699,1642,1922, 1805,1400,1452,967,1689,1760,1591,886,831,18 64,1649, 1262,947,1383,1481,507,1423,1811,889,1615,984,1702, 1458,1701,751,1373,942,1269,14 82,1690,1644,996,1387, 1151,1215,971,1806,1431,1460,1650,890,1595,1489,509, 1705,1270,1731, 949,973,1374,1623,1692,1814,1000,1484, 892,1273,1706,1597,1435,1827,1813,950,1733,1389,146
4,1652,1713,863,1398,759,1447,1490,1817,1274,1395,
1008,1505,1598,1437,510,1627,1390,979,1 492,953,1679,
1924,1829,1639,763,1708,974,1734,1453,1818,1276,1397,
1629,1872,1714,1737,165 6,954,1506,1830,879,981,1451,
1928,982,1438,927,1247,1687,1716,1859,1643,1496,1479,
1820,18 33,1738,995,1745,1861,1740,765,956,1888,1834,
887,1630,985,1936,997,1746,1720,1401,1459,18 41,1343,
1645,1836,1508,1454,986,1862,1691,1512,943,1263,1402,
1483,1646,891,1651,998,1461, 1404,766,1842,1485,1520,
1693,1703,511,1748,1865,1653,1375,1491,1462,988,1761,
1275,1486,14 66,1465,1001,951,1493,1271,1707,1866,
1002,1762,1923,1694,1807,1873,1844,893,1752,1952,181
5,1391,975,1925,894,1654,1709,1868,1657,1735,1277,
1715,1848,1009,1926,1710,955,1764,1874, 1399,1468,
1004,1494,1507,1439,1509,1929,1819,1497,1658,1768,
1876,1984,1010,1889,1717,957, 1821,983,1930,958,1739,
1831,1498,1660,1718,1278,1741,1599,1937,1822,1835,
1403,987,1721,14 55,1012,1631,1513,999,1890,1747,1510,
1932,1742,1837,1500,1880,1863,1016,1749,1722,1938,17
76,1892,1843,767,1838,1463,1953,989,1514,1647,1695,
1763,1940,1487,1867,1405,1521,1003,195 4,1845,1750,
1985,990,1005,1896,1516,1655,1753,1724,1467,1765,
1869,1944,1406,1846,959,1875, 1754,1522,1904,1766,
1469,1495,1659,1956,1011,1711,1927,1849,1524,1013,
1870,1769,1850,175 6,1470,1986,1960,1499,1877,1891,
1661,895,1931,1006,1511,1719,1770,1852,1777,1878,
1881,152 8,1823,1279,1988,1933,1014,1743,1501,1939,
1017,1662,1772,1968,1893,1515,1723,1778,1882,15
02,1992,1407,1934,1839,1018,2000,1894,991,1941,1751,
1517,1897,1725,1955,1780,1884,1523,17 55,1020,1847,
1946,1898,1942,1526,1957,1767,1784,1905,1007,1518,
1726,1945,1525,1900,1871,2 016,1471,1757,1851,1958,
1906,1961,1987,1771,1529,1879,1948,1758,1853,1015,
1989,1962,1908, 1530,1773,1969,1990,1779,1883,1964,
1854,1935,1019,1895,1663,1912,1503,1970,1774,1993,153
2,1885,1781,1994,1021,1943,1899,1886,1782,1972,2001,
1947,1996,1022,1785,1901,1976,1519,17 27,1959,2002,
1907,1786,1527,1949,1902,1759,2017,1909,1963,2018,
2004,1950,1788,1965,1991,1 910,1855,1971,1531,1913,
2008,1775,1966,2020,1995,1914,1533,1973,1997,2024,
1916,1023,1974, 1887,1783,2032,1534,2003,1977,1787,
1998,1978,1903,2005,2006,1951,2019,1789,1980,1911,200
9,2021,2010,1967,1915,2022,1790,153 5,2012,2025,1975,
2026,1917,1999,1918,2033,1979,2028,20 34,1981,2007,
1982,2011,2036,2023,2040,1791,2013,2027,2014,2029,
1983,2035,2037,1919,2030,2 038,2041,2042,2015,2044,
2031,2039,2043,2045,2046,2047]

Sequence Group 4: Z4_2048

[0,1,2,7,3,8,11,24,4,10,13,28,16,33,35,77,5,12,14,32,19,
38,47,81,22,46,42,88,57,96,102, 166,6,17,21,40,23,45,51,
90,29,55,59,97,72,110,116,184,34,61,75,114,80,123,133,
195,87,135,146,2 21,151,232,252,363,9,18,26,54,30,58,71,
105,36,76,62,117,84,127,140,204,44,74,86,134,92,143,15
0,227,100,153,168,244,182,260,277,402,53,89,98,149,111,
160,176,257,121,177,194,269,206,291,3 07,433,137,202,
224,297,230,308,331,462,249,339,357,483,376,504,541,
725,15,25,31,73,39,79,82, 139,48,85,93,148,101,158,163,
254,56,94,103,161,115,175,191,272,126,192,203,286,226,
304,326,4 51,64,108,122,181,128,193,209,299,147,222,
231,310,248,337,351,482,162,240,258,343,270,371,3
78,501,293,390,420,530,441,558,614,727,69,124,142,212,
157,229,247,341,167,250,263,362,278,3 77,401,521,189,
273,287,387,309,412,437,568,322,444,467,592,489,624,
644,819,208,300,316,424, 344,450,471,607,375,479,502, 636,532,648,700,874,399,512,542,675,553,715,737,915,
611,751,773, 908,799,951,1005,1192,20,37,41,91,49,95,
106,174,50,107,118,185,130,205,213,324,63,119,131,21
8,144,225,238,325,152,237,253,356,274,374,382,500,67,
141,154,220,171,241,259,372,179,267,27 9,384,290,409,
428,550,178,288,302,408,321,438,453,593,346,473,490,
623,510,642,680,859,78,16 5,172,265,188,284,301,403,
196,306,314,435,332,460,477,621,251,327,345,465,364,
487,509,638,3 93,516,546,672,571,712,740,902,283,359,
385,497,407,529,548,702,431,564,578,724,615,762,782,
939,468,613,625,774,639,801,766,965,689,851,875,1016,
881,1081,1115,1229,83,186,190,320,242, 336,350,472,266,
355,365,494,392,518,545,704,280,388,406,519,422,549,
573,730,445,581,606,756, 637,779,817,973,323,410,427,
572,452,599,629,768,492,630,646,813,690,797,865,1022,
527,666,7 08,853,731,880,905,1058,763,911,910,1105,967,
1127,1155,1308,358,442,474,631,517,647,679,829, 547,
703,717,876,748,887,909,1077,574,735,770,903,786,913,
969,1129,827,978,1001,1161,1040,1 201,1226,1385,622,
776,809,971,863,974,1030,1174,872,1026,1062,1215,1094,
1247,1294,1444,88 9,1084,1123,1263,1146,1300,1278,
1463,1189,1331,1352,1516,1396,1544,1581,1667,27,43,52,
99,6 0,120,132,210,66,136,145,217,156,235,239,368,68,
155,164,234,173,285,294,398,198,296,319,432, 334,455,
475,634,70,170,187,289,200,317,328,448,211,340,352,480,
370,505,524,650,223,360,381, 514,404,544,559,694,414,
551,583,734,590,754,777,1011,109,199,207,333,219,353,
369,496,245,38 3,394,536,417,566,580,706,264,397,426,
556,447,588,595,742,464,597,604,781,664,802,845,1024,
281,446,458,602,486,627,633,791,508,663,683,826,720,
860,877,1065,535,699,732,879,764,900,94 3,1097,807,948,
980,1130,1002,1165,1206,1378,112,215,236,379,262,395,
421,570,276,429,449,598, 469,609,617,788,305,459,485,
619,507,658,677,822,533,692,718,870,743,890,927,1068,
329,495,5 23,681,560,709,707,893,575,736,752,916,793,
945,957,1135,608,765,805,952,823,987,1004,1176,8
50,1020,1049,1216,1103,1253,1297,1451,348,540,565,738,
594,761,795,949,655,806,834,997,838, 1008,1037,1199,
667,836,849,1029,897,1048,1088,1244,936,1100,1121,
1264,1153,1314,1336,1470, 693,907,922,1071,962,1107,
1126,1287,981,1151,1179,1328,1207,1356,1391,1525,
1053,1181,1219, 1363,1260,1402,1419,1571,1289,1435,
1461,1591,1493,1628,1661,1772,129,246,268,430,303,457,
481,641,312,488,513,661,537,686,729,929,342,525,569,
705,585,759,745,938,600,771,798,977,830, 991,1014,1190,
405,576,601,757,654,790,810,1000,660,833,843,1015,862,
1038,1057,1233,668,85 6,884,1055,934,1087,1117,1267,
954,1143,1152,1319,1180,1337,1371,1509,416,653,657,
824,671,8 37,869,1044,698,898,919,1079,946,1112,1148,
1303,804,931,964,1119,983,1162,1183,1333,1041,1 186,
1222,1365,1262,1398,1415,1569,842,986,1028,1164,1054,
1212,1236,1377,1092,1251,1272,14 12,1301,1437,1468,
1607,1124,1292,1324,1460,1351,1484,1508,1632,1382,
1519,1541,1656,1556,1 693,1700,1831,425,673,685,925,
789,941,956,1141,815,975,995,1169,1034,1195,1231,1373,
847,10 12,1051,1203,1075,1239,1275,1407,1114,1298,
1269,1429,1334,1465,1492,1613,937,1059,1086,12
55,1133,1280,1321,1456,1159,1325,1350,1485,1369,1495,
1527,1651,1208,1359,1388,1513,1421,1 548,1563,1681,
1442,1586,1604,1712,1629,1732,1736,1804,984,1089,
1156,1326,1193,1346,1360,1 504,1227,1395,1404,1536,
1431,1549,1593,1698,1235,1427,1458,1584,1490,1608,
1611,1734,1521, 1634,1647,1749,1674,1776,1791,1867,
1306,1480,1486,1624,1532,1636,1658,1755,1554,1680,168
6,1786,1717,1792,1833,1888,1577,1709,1729,1814,1752,
1819,1846,1909,1765,1850,1864,1922,18 78,1934,1943,
1982,65,104,113,180,125,183,214,298,138,201,228,318, 255,349,361,528,159,216,23 3,347,271,373,415,539,292,
413,391,562,456,587,610,775,169,256,282,386,295,411,
434,567,330,4 43,463,589,511,632,649,814,354,470,522,
643,538,669,691,840,561,696,722,888,739,912,950,1131,
197,261,313,440,335,461,506,616,366,526,476,651,554,
676,711,855,400,520,557,695,579,716,73 3,899,603,744,
780,930,812,961,993,1184,439,563,591,728,635,755,796,
958,662,800,839,982,858, 1019,1045,1228,701,852,894,
1027,904,1046,1080,1261,942,1093,1118,1286,1145,1312,
1354,1534, 243,311,338,515,380,534,543,710,418,555,582,
726,605,753,767,955,454,584,612,758,645,794,831, 988,
674,832,854,1009,896,1039,1073,1249,484,626,665,811,
678,835,866,1031,723,891,906,1050, 940,1091,1109,1285,
760,924,959,1099,985,1139,1149,1310,1021,1168,1209,
1343,1237,1374,1432, 1535,499,670,714,871,750,901,935,
1096,778,944,966,1128,994,1147,1182,1335,825,989,1010,
116 6,1047,1200,1232,1383,1067,1240,1268,1408,1295,
1441,1462,1614,864,1032,1060,1213,1101,124 8,1273,
1424,1144,1282,1311,1452,1344,1467,1512,1652,1178,
1320,1355,1491,1370,1528,1546,16 83,1428,1557,1575,
1676,1597,1706,1742,1843,275,367,389,577,419,586,618,
792,423,620,652,816, 684,857,873,1070,478,656,687,883,
719,895,921,1072,741,920,953,1116,990,1142,1157,1309,
493, 713,746,886,784,926,960,1140,808,976,996,1160,
1018,1197,1220,1367,803,1013,1035,1196,1066, 1234,
1252,1409,1104,1276,1296,1440,1318,1459,1497,1642,
531,772,785,970,821,1006,1033,1185, 841,1043,1056,
1230,1082,1259,1281,1438,947,1074,1102,1266,1132,
1291,1317,1454,1171,1327,1 361,1488,1387,1526,1550,
1671,1003,1122,1163,1307,1194,1342,1364,1514,1224,
1379,1397,1533, 1433,1565,1583,1697,1270,1430,1443,
1576,1455,1598,1570,1715,1502,1639,1653,1748,1660,178
4,1802,1861,552,818,828,1064,928,1090,1108,1274,972,
1113,1134,1302,1170,1330,1358,1517,998, 1167,1191,
1332,1211,1366,1390,1538,1241,1400,1423,1560,1453,
1580,1612,1720,1069,1198,121 8,1389,1250,1416,1446,
1572,1299,1447,1464,1609,1503,1595,1646,1751,1341,
1481,1523,1640,15 39,1659,1673,1774,1566,1679,1678,
1798,1716,1810,1824,1896,1120,1238,1277,1448,1329,
1466,1 496,1620,1362,1515,1529,1654,1555,1663,1677,
1782,1392,1543,1573,1672,1585,1682,1718,1811, 1619,
1724,1739,1827,1762,1848,1859,1926,1439,1578,1605,
1719,1645,1721,1758,1834,1650,175 4,1777,1855,1794,
1870,1889,1947,1664,1785,1807,1876,1818,1892,1883,
1953,1841,1904,1913,19 69,1930,1977,1987,2008,315,396,
436,596,466,659,688,867,491,697,721,882,749,917,923,
1136,49 8,747,769,914,787,1007,1023,1177,844,1025,
1063,1225,1085,1254,1279,1450,503,783,820,1017,8
48,1061,1076,1245,868,1095,1110,1283,1138,1313,1339,
1469,892,1125,1154,1323,1187,1357,137 5,1507,1202,
1368,1401,1542,1406,1559,1579,1744,628,846,861,1083,
885,1111,1137,1305,932,115 8,1172,1348,1205,1381,1399,
1520,968,1175,1217,1372,1243,1405,1411,1551,1265,
1413,1422,158 2,1479,1599,1633,1753,999,1242,1257,
1420,1290,1445,1449,1590,1316,1478,1499,1618,1531,164
3,1655,1778,1347,1511,1540,1657,1567,1670,1701,1795,
1603,1704,1725,1812,1740,1830,1851,19 24,640,878,918,
1150,963,1173,1210,1386,992,1221,1246,1414,1271,1426,
1434,1587,1042,1258,1 288,1436,1315,1475,1494,1615,
1345,1505,1530,1649,1552,1665,1689,1779,1078,1304,
1338,1498, 1376,1524,1522,1666,1393,1545,1558,1684,
1592,1702,1711,1815,1425,1568,1601,1707,1616,173
1,1741,1835,1638,1750,1767,1856,1797,1872,1890,1948,
1106,1353,1380,1547,1410,1564,1594,17 05,1473,1602,
1623,1737,1627,1743,1760,1847,1482,1625,1637,1757,
1668,1766,1789,1869,1694,1 796,1806,1877,1823,1897,
1907,1956,1506,1675,1687,1780,1713,1799,1809,1885,
1726,1821,1836, 1903,1852,1914,1928,1972,1769,1838,
1857,1917,1874,1932,1938,1985,1886,1944,1952,1990,196
3,1998,2007,2027,682,933,979,1223,1036,1256,1284,1457,
1052,1293,1322,1477,1349,1501,1537, 1690,1098,1340,
1384,1518,1403,1562,1553,1696,1417,1574,1596,1723,
1621,1733,1746,1842,118 8,1394,1418,1561,1472,1589,
1606,1738,1476,1622,1631,1747,1644,1761,1773,1863,
1483,1641,16 62,1771,1692,1788,1803,1879,1708,1817,
1822,1898,1837,1908,1920,1967,1204,1471,1474,1617,1
487,1626,1648,1764,1510,1669,1685,1783,1703,1800,
1820,1894,1600,1691,1714,1805,1727,1828, 1839,1905,
1763,1840,1858,1918,1875,1931,1937,1984,1630,1730,
1756,1829,1770,1854,1866,192 3,1793,1871,1881,1936,
1893,1945,1955,1993,1808,1887,1900,1951,1912,1958,
1966,2000,1925,19 70,1976,2005,1981,2013,2015,2035,
1214,1489,1500,1688,1588,1699,1710,1816,1610,1722,
1735,1 832,1759,1845,1862,1921,1635,1745,1768,1849,
1781,1868,1882,1935,1801,1891,1880,1941,1906, 1954,
1962,1996,1695,1775,1787,1873,1813,1884,1899,1949,
1826,1901,1911,1959,1919,1964,197 3,2004,1853,1915,
1927,1968,1939,1978,1983,2011,1946,1989,1992,2017,
1999,2020,2022,2032,17 28,1790,1825,1902,1844,1910,
1916,1965,1860,1929,1933,1975,1942,1979,1991,2014,
1865,1940,1 950,1988,1961,1994,1995,2021,1971,2001,
2003,2023,2009,2028,2030,2040,1895,1957,1960,1997,
1974,2002,2006,2025,1980,2010,2012,2029,2018,2031,
2036,2042,1986,2016,2019,2033,2024,203 4,2037,2043,
2026,2038,2039,2044,2041,2045,2046,2047]

Sequence Group 4: Q4_4096

[0,1,2,4,8,16,32,3,5,64,9,6,17,10,18,128,12,33,65,20,
256,34,24,36,7,129,66,512,11,40,6 8,130,19,13,48,14,72,
257,21,132,35,258,26,513,80,37,25,22,136,260,264,38,514,
96,67,41,144,28,6 9,42,516,49,74,272,160,1024,520,288,
528,192,544,70,44,131,81,50,73,15,320,133,52,23,134,
384,7 6,137,82,56,27,97,39,259,84,138,145,261,29,43,98,
515,88,140,30,146,1025,71,262,265,2048,161,5 76,45,100,
640,1026,51,148,46,75,266,273,517,104,162,53,193,1028,
152,77,164,768,268,274,518,5 4,83,57,521,112,1032,135,
78,289,194,85,276,522,58,168,139,99,86,60,280,89,290,
529,524,196,14 1,1040,101,147,176,2049,142,530,321,31,
200,90,1056,545,292,322,532,2050,263,149,102,105,304,
296,1027,163,92,1029,47,267,385,546,324,2052,208,386,
150,153,165,106,55,328,1088,536,577,5 48,1033,113,154,
79,269,108,578,2056,224,166,519,552,195,270,1030,641,
1041,523,275,580,291,5 9,169,560,114,277,156,87,1034,
197,116,170,2064,61,1042,531,525,642,281,278,526,177,
293,388, 1152,91,584,769,198,2080,172,120,201,336,62,
282,143,1036,1057,103,178,294,93,1089,644,202,2 051,
592,323,392,2053,297,770,107,180,1044,151,209,284,
1280,648,94,204,298,400,608,2112,105 8,352,325,533,155,
210,305,2057,547,300,109,1048,184,534,1060,537,115,
1031,167,225,326,2054, 306,772,157,2065,656,329,110,
117,212,171,1153,776,1090,330,1536,2058,226,549,1035,
538,387,3 08,216,416,271,279,158,337,2066,550,672,1064,
118,332,579,540,1092,2176,389,173,1154,121,55 3,199,
784,179,228,338,312,1043,704,1037,390,174,554,581,
1072,393,2060,283,2081,122,448,353, 2113,561,1038,203,
63,340,394,1096,1281,527,582,556,181,295,1045,285,232,
124,2068,205,182,6 43,2304,1156,562,286,585,299,354,
2082,1059,211,401,1282,185,1050,396,344,586,645,1537,
593, 535,240,2072,1104,206,95,327,2084,564,800,402,
2055,356,307,301,417,1061,213,1049,568,1046, 832,588,
1160,1284,186,2177,646,404,2114,1288,227,896,594,418,
2560,302,649,771,360,539,2059, 111,1062,331,1538,214,
309,1120,1091,2088,188,449,1065,217,408,609,596,2116, 551,650,229,159, 420,2178,310,1168,541,1052,773,610, 657,333,1093,119,1066,2067,2061,600,339,1540,218,2096, 368,652,1073,230,391,313,450,542,1098,334,1296,233, 555,2062,774,175,123,1184,658,2120,612, 341,2305,777, 220,314,2069,1544,424,1312,395,673,583,355,1552,2180, 1216,287,183,234,1568,12 5,557,1094,660,616,342,316, 2083,1068,241,778,2306,563,2074,1155,345,452,397,2561, 403,1105, 207,2128,1074,674,558,785,1097,432,1039,357, 187,1344,236,664,1157,624,587,780,1076,2085,10 47,705, 2073,126,242,2070,1158,565,398,2184,346,456,2308,358, 405,303,569,2312,1408,244,1100, 1161,595,1106,189,566, 676,1080,1051,1121,361,2086,706,589,2562,1063,215,786, 647,348,2144,2 115,419,406,464,680,801,2089,1283,362, 1108,590,409,1162,570,1169,788,1285,2192,1053,2076,5 97,1067,572,1122,219,311,2117,708,598,2090,1539,601, 651,421,792,802,2564,611,1112,602,1164, 410,231,2097, 688,653,1054,248,1170,2122,369,2320,190,364,1095,654, 2208,1286,659,1289,335,4 80,315,221,3072,370,1185,613, 2568,1600,422,425,2336,451,1069,614,543,1124,235,412, 2576,343, 372,2240,1664,775,317,2592,2118,1075,222, 1172,426,2092,453,237,1070,559,1099,2179,1290,83 3,804,712,1297,834,661,1541,808,779,2129,1128,617,604, 2098,1186,433,720,2121,816,1077,2063, 1217,836,2368, 347,897,2181,1176,243,1101,2100,662,2071,1188,454,318, 675,1792,618,2182,129 2,898,781,1298,1542,376,428, 1078,665,736,567,1107,2432,1081,1545,840,2124,2185, 625,238,213 0,1136,359,457,2104,399,787,2075,2145,591, 678,434,677,2087,1159,1102,349,1313,1218,245,110 9,458,666,1300,620,1546,1082,2307,1192,363,2132,127, 1163,191,2186,1123,782,407,2193,436,62 6,2309,2077, 1110,571,465,681,2091,246,707,2146,1084,350,1304,599, 668,2563,1113,790,1314,15 53,460,1548,2136,1220,249, 2188,682,1165,573,1125,411,803,2078,1171,789,2194, 1200,709,365,4 40,628,689,3073,2119,374,1166,423,2310, 1554,466,793,2313,1345,250,371,1055,481,574,1224,22 09,413,2624,1114,603,366,2093,1569,2148,1316,1346,468, 1556,655,900,2688,805,615,3074,1287, 684,1173,710, 2099,1126,429,794,2196,252,1129,373,605,1328,848,690, 2094,2123,713,632,2314,1 320,482,806,2321,1187,2565, 1116,427,2152,1071,904,2210,1291,414,1409,2101,223, 1570,2241,13 48,663,3076,692,835,1232,619,472,2200, 1410,455,796,2125,1174,1177,809,714,2212,1189,721,83 7,2816,716,1130,2316,1079,1352,864,2322,2566,810,2102, 1560,606,1601,2131,912,2105,2569,15 72,722,696,377, 1137,435,2160,1178,1103,817,1293,1132,319,621,1602, 812,484,3080,1248,430,11 90,2183,1543,2126,1576,838, 2337,2242,667,1219,488,2133,1294,239,378,2324,2570, 459,622,210 6,2216,1665,627,437,2187,380,2147,1547, 1299,818,1604,1315,461,2134,1083,496,669,1193,1584, 679,1138,1301,2108,1180,724,2328,841,1111,629,2137, 1221,351,467,2338,2577,1140,438,2572,22 44,1194,737, 251,462,2189,442,441,3088,2149,1085,469,2195,1555,247, 683,2224,1549,1666,842,1 305,1302,738,1550,2190,1201, 899,2578,1317,670,1412,783,2369,1115,849,2079,1608, 1793,820,2 248,1222,728,928,2138,791,367,3104,2593, 1196,901,1144,630,2340,2370,1225,685,844,2580,136 0,633,711,1086,253,691,2311,1306,2197,824,2150,1167, 902,686,2153,1127,1202,2352,1318,1117, 740,1668,850, 375,2344,1226,444,3075,1616,2211,470,1347,483,2140, 1416,415,3077,485,2095,90 5,1321,795,473,2315,1794, 634,744,2433,2594,1131,852,960,2372,1204,865,693,2256, 1175,2434,1 233,1308,797,2198,2201,1672,2213,1118, 1228,906,1322,2154,715,1424,2103,2376,1632,807,3136, 474,636,1376,694,254,2584,1349,1557,717,2625,1179, 1234,575,913,2596,1329,798,811,3081,216 1,379,1571, 2202,1324,2127,1133,697,2317,2156,1208,431,2626,1558, 607,2272,1561,2214,489,25 67,2600,1139,866,723,2243, 486,1191,2318,1249,1350,3078,908,1330,1796,718,813, 2689,1181,476, 856,3089,1680,1353,839,1134,2571,1141, 2323,1236,725,2628,2339,698,1195,914,2107,1800,752, 868,2217,2608,2162,819,2325,2204,1354,814,439,2135, 929,3082,2245,1250,1573,490,2164,1562, 1411,623,2218, 1332,1240,671,1440,1295,739,1303,1182,2109,1361,916, 3090,2579,1574,463,1696, 843,2573,2690,1142,381,2329, 2326,1356,1603,497,2574,2225,1564,930,821,2341,2436, 726,961,3 200,2139,1413,1197,872,2632,2817,1145,492, 2246,1577,1223,631,1808,1203,729,2220,1252,2168, 1362, 700,2249,1336,443,1728,741,2384,1414,1198,2110,1578, 1605,845,2330,1417,920,382,2191, 3084,1307,822,3105, 2151,1146,2226,851,1472,730,2342,2141,1377,498,3137, 880,2692,1585,742, 445,2250,1227,471,635,2640,1087, 2371,1364,932,2440,1418,687,2345,1551,1606,2818,1580, 1205, 1319,903,2155,1309,825,2228,1256,1148,500,3092, 1229,2199,846,1206,2257,2332,1667,745,332 8,826,2696, 732,1586,446,962,2142,2252,1310,1609,936,2346,2448, 1323,475,853,2656,1378,867,6 37,3106,2400,1235,2373, 1425,2581,1209,907,2203,2258,1420,1368,2353,1610, 1669,487,1617,259 5,695,1559,2348,2157,1264,746,3096, 828,2232,753,1230,854,2582,1119,1351,3108,857,2585, 158 8,1824,504,799,2163,1426,255,964,3079,2215,1380, 909,1331,2273,1325,2374,1441,719,2354,282 0,1237,477, 2205,1592,915,2704,2377,1856,2158,2165,2260,1612,638, 748,2219,944,1210,3201,28 24,1670,1428,3138,869,1251, 1920,491,699,2378,1618,1442,754,3584,1326,1673,858, 1795,2274,1 384,2597,1563,478,3083,2586,2435,968,1135, 383,2356,2264,1355,910,2464,2319,2327,1238,815, 2206, 2385,1333,976,2598,2720,870,3112,2166,1212,1473,917, 2380,2627,1241,1432,2588,1633,16 20,3140,727,1575, 1674,493,1253,2437,1183,2221,1444,873,3202,2169,1334, 701,1565,931,2601,2 247,1797,1634,2832,2227,1681,1357, 756,2276,2386,1143,860,499,2360,3091,2752,731,3085, 2438, 1624,2222,1363,823,2602,2629,1242,3120,922,2441, 1392,1676,874,2331,1254,1415,918,2170,13 37,2496,1474, 502,2401,1566,933,1358,2609,1257,1579,3086,2251,1798, 1199,1147,743,2111,2388, 1682,760,2442,3144,1636,1365, 881,3329,2575,1801,2630,494,1244,2604,2229,2343,1338, 702,309 3,921,2333,1448,501,876,2280,2172,1419,847, 2253,1697,2230,1607,992,2691,1379,447,3204,261 0,1311, 1207,2334,1258,2633,1149,1581,733,2347,1684,1640, 2402,1366,1340,827,3107,1265,2259, 934,1802,2449,3330, 2233,1587,882,3098,937,2444,2392,963,1369,747,2634, 2693,1476,1421,358 5,505,2641,2583,1427,855,924,2288, 1231,734,829,3152,2254,1698,1582,2143,1809,2375,1456, 26 12,2848,1381,1211,2450,1260,1688,965,2404,1648, 2355,1611,2349,2465,1804,938,3109,884,2261, 506,1729, 3097,2616,1150,1266,3094,749,2880,1589,1422,945,966, 2636,3208,1370,1480,755,333 2,2234,1382,859,1429,2694, 1327,2452,1593,940,3336,2275,2944,1268,830,2642,2466, 1619,911,2 350,2697,1213,2819,1590,2408,2587,1700,871, 2159,639,1385,3110,2379,1730,1613,3586,888,226 2,1239, 1810,479,2357,1671,1372,3168,946,3139,1443,1430,750, 1488,2236,1704,2497,1825,969,3 113,2265,2456,508,1386, 861,2657,2644,1614,1433,2599,2698,2277,1594,757,2207, 2468,1812,970, 2358,3216,2589,3100,2821,1621,2658, 1596,919,2705,2381,1243,1335,3141,2167,1732,1622, 3114, 875,1625,1675,862,1445,2648,1816,2387,1826,758, 3588,2266,1635,948,1626,2416,2700,1434,12 55,3121, 2278,2439,1712,1677,977,2361,2498,1272,923,2590,3146, 2382,1393,972,3344,2281,1214, 2603,1388,2822,2223, 2171,1678,3232,761,2706,1683,877,2660,2389,1359,1504, 2825,1339,2268, 1245,952,2362,1394,495,1637,3592,2472, 1446,1449,3360,2443,1475,1638,1567,703,2721,2631,12 59,1436,2403,3600,1367,1396,935,3264,2335,1799,2231, 978,1341,2282,3616,2173,2605,883,3142, 762,2708,2664, 1246,503,2390,2364,1450,3116,925,2289,1477,2826,1261,
878,2611,1583,735,320 3,2393,1857,1828,2500,1736,2445,
1858,1685,2451,1832,1803,3153,2255,1641,1628,993,
3122,272 2,1457,2606,1744,2833,3145,2480,1840,885,
3087,939,2405,2235,994,1860,3392,2284,2712,1371, 1921,
3205,980,2672,2635,1267,926,764,2828,3124,1686,941,
3095,2753,1478,1342,2174,1699,229 0,1642,3206,2613,
2446,1922,1805,2394,2504,1400,1452,967,2406,1689,
2453,1760,2351,2617,159 1,886,3456,2292,831,1864,3148,
3209,2643,1649,1262,3154,947,2237,2614,1383,1481,507,
2724,3 128,1423,1811,3099,889,3169,2409,1615,984,1702,
2754,1458,2637,1701,751,3111,2263,2834,137 3,942,2695,
2396,1269,2467,2454,1482,2512,1690,2728,2849,1644,
996,3331,2410,1387,3156,2638, 1151,2457,1215,3210,971,
2618,1806,1431,3217,2836,1460,1650,3333,890,3101,
1595,1489,509,1 705,2645,3115,1270,2620,1731,949,3170,
2267,2359,973,1374,2756,2646,1623,1692,3587,2649,26
99,2469,1814,1000,2840,2850,1484,892,2659,3160,2650,
1273,3212,2458,1706,2279,1597,2736,27 01,1435,1827,
3102,2296,1813,3218,950,2417,1733,1389,1464,2238,
1652,2412,1713,863,3143,270 2,1398,759,1447,3334,2707,
1490,1817,3337,2383,2528,1274,1395,1008,2363,2269,
1505,1598,241 8,3233,2661,1437,510,3648,2470,1627,
2473,1390,2499,3117,2662,2591,3172,979,2283,2460,
1492, 953,2391,2420,1679,1924,3712,2823,1829,2365,
1639,763,1708,974,1734,3123,2270,1453,1818,3 220,2474,
1276,1397,1629,2501,2285,1872,1714,3118,2607,3147,
1737,1656,954,3338,2881,1506,2 852,1830,2760,3345,
2882,2709,879,3589,981,2856,2827,1451,3176,2665,2652,
1928,3234,982,248 1,2768,1438,927,2864,3125,1247,3265,
2884,1687,1716,2395,1859,2945,1643,1496,3224,2291,147
9,1820,3149,2710,1833,1738,995,3236,2502,1745,2366,
1861,2723,3840,2666,1740,765,3340,2946, 2829,956,1888,
3346,3590,2424,2476,1834,3126,887,2713,2784,1630,985,
2615,3155,1936,3129,9 97,3593,2888,1746,1720,2673,
1401,2286,1459,3184,2407,2505,1841,2447,2835,1343,
1645,2639,1 836,2726,1508,2482,2725,1454,986,3207,
3150,2397,1862,3361,3266,2293,1691,1512,3157,943,25
06,2714,1263,1402,3348,2668,3594,1483,1646,3130,891,
3240,2411,1651,998,1461,2175,3211,140 4,2239,766,3171,
2830,2455,1842,2484,2674,1485,3158,2619,2513,1520,
2729,1693,2294,2755,170 3,511,3132,2398,1748,3352,
2647,1865,2716,1653,3161,2838,1375,1491,3362,3601,
2508,1462,359 6,988,3268,2297,1761,1275,1486,2730,
3213,1466,2621,1465,1001,3173,2459,2851,951,1493,
3219, 2837,1271,1707,3248,2757,2413,2488,1866,1002,
2676,2737,1762,2422,3214,2471,1923,3602,251 4,1694,
2841,1807,3393,2298,2419,1873,3103,2529,2622,1844,
3272,893,2461,1752,1952,3162,265 1,1815,2414,1391,975,
3617,1925,894,1654,3364,3394,2516,1709,1868,3604,
2703,2948,1657,1735, 2853,2663,1277,1715,3335,2732,
3221,2758,1848,1009,3174,2477,1926,2842,1710,2300,
3177,242 1,2653,3376,955,2896,2738,1764,2761,2680,
1874,1399,3368,2530,2854,1468,1004,3235,1494,150
7,3164,2475,1439,1509,3119,2952,1929,1819,1497,3339,
2462,1658,1768,3457,2271,3618,1876,19 84,1010,3396,
2711,1889,2740,1717,2883,3280,2667,2520,957,3458,
2503,2844,1821,3222,3225,28 57,2762,3237,983,2769,
2885,1930,958,2764,3178,1739,3127,3400,2912,1831,
1498,1660,2858,171 8,1278,3608,2654,1741,3649,2960,
1599,1937,3620,2770,1822,2744,1835,2425,3185,2483,
1403,98 7,3226,3151,2865,1721,3341,3180,2367,2669,
1455,3650,1012,2860,2532,1631,3296,2478,3238,15
13,3591,999,3624,2886,1890,1747,2715,3267,1510,2536,
3342,2287,2426,1932,2507,2670,1742,18 37,3713,2675,
1500,2485,1880,2428,1863,1016,3595,3347,2866,1749,
3652,3363,2509,1722,1938,3 131,2544,2717,1776,1892,
3241,3632,2727,3186,1843,3349,767,3228,2772,1838,
1463,2889,3159,1 953,2677,989,3269,2399,2515,1514,
3188,2486,1647,3242,2785,2299,2510,1695,2490,2489,
1763,3 133,2517,1940,3603,2295,1487,2731,1867,3597,
3714,2890,1405,3353,3350,2786,1521,3598,1003, 3249,
2947,1954,1845,3365,2718,3460,1750,2831,1985,990,
3163,2897,1005,1896,3656,3841,2868, 1516,3270,2776,
2976,1655,2839,2415,1753,3244,2949,3192,2678,1724,
3273,2733,1467,2892,176 5,3408,2681,2759,3134,2301,
2739,1869,3354,2872,1944,1406,3215,2950,2734,1846,
959,3175,325 0,1875,1754,3366,3165,2788,1522,1904,
3716,2898,2423,1766,1469,3274,2492,1495,1659,3664,25
18,3395,2531,1956,1011,3464,2463,1711,2533,2953,3369,
2843,2521,3842,2682,2792,1927,3179,2 900,3008,1849,
3252,2913,2741,1524,1013,3223,1870,3281,3356,2845,
1769,1850,3720,1756,1470, 1986,3166,3276,2954,1960,
3370,2763,3472,1499,1877,3680,2855,1891,2522,1661,
2684,3424,274 2,2302,895,3397,3605,2765,1931,3227,
3282,2623,2961,3377,1006,2846,2859,1511,2427,3619,171
9,3372,3181,2745,1770,1852,3256,1777,2479,1878,3606,
2655,1881,3609,2537,1528,1823,3187,29 14,1279,2771,
1988,2534,3239,1933,1014,3297,3398,2956,1743,3378,
3844,2766,2861,1501,3229,2 524,2904,1939,3728,3401,
2887,3182,3189,1017,3284,2773,1662,1772,2746,3243,
1968,2962,3848, 2800,2916,1893,2867,1515,1723,3402,
2862,2487,1778,2977,1882,3298,3621,2538,1502,3610,345
9,2671,1992,1407,3380,3288,2719,1934,3488,3343,2787,
3351,1839,3230,1018,3409,2964,2000,36 22,2511,3744,
1894,2891,991,3190,2429,1941,3404,3651,2545,3612,
2978,2869,1751,2774,3009,15 17,3461,3245,2920,1897,
3193,1725,2540,1955,3625,3271,2679,3856,3251,2777,
1780,3300,3410,2 748,1884,1523,3384,2491,3776,2789,
1755,1020,3462,3246,1847,3626,3653,2893,1946,3465,
2968, 2430,1898,3355,2870,1942,3194,2899,3520,2778,
1526,3425,2546,1957,2928,3633,2790,2493,327 5,2519,
2683,1767,3135,3412,2980,1784,3466,2735,1905,1007,
3599,3654,1518,3628,3253,3367,29 51,1726,1945,3357,
2873,1525,1900,3304,3196,2548,1871,3277,2894,3254,
2016,3715,2793,1471,2 874,2780,3634,2494,3010,3358,
3657,2984,1757,3371,2523,2901,3426,2915,2685,1851,
3283,1958, 3473,3257,2955,1906,1961,3468,3416,1987,
1771,3658,3717,2535,1529,3665,2743,3607,1879,194
8,3312,2794,1758,2876,1853,2801,3278,2902,1015,3167,
3399,2905,3636,3872,2552,2847,3474,23 03,3012,1989,
3428,2957,3379,3373,3489,2767,1962,1908,3285,1530,
2525,3640,2963,1773,3904,1 969,1990,3660,2686,2796,
1779,2992,3258,1883,3718,3476,2917,1964,3299,3968,
2539,2747,1854, 3666,3490,2802,1935,3374,3721,2906,
3843,3432,1019,3611,2526,1895,3016,3183,1663,2431,340
3,2958,1912,3286,2863,1503,3381,3024,1970,2918,1774,
3260,3521,2965,1993,3289,3480,1532,18 85,3681,3668,
2775,3623,3722,2541,3301,1781,3231,3492,2921,1994,
3382,2749,3613,2979,1021,3 845,3682,1943,3729,3405,
2804,3191,2908,2547,1899,2779,1886,3672,3411,2871,
1782,3290,1972, 2970,3440,3724,2922,3302,3463,2966,
2001,3385,3522,2550,1947,3614,2981,3406,1996,1022,330
5,3627,3846,3247,3195,2791,1785,3730,2808,1901,3684,
3413,2929,3849,2542,3292,1976,3386,27 50,1519,2969,
3496,2549,2924,3467,2895,1727,3745,3655,3040,3427,
2495,1959,3359,3255,2002,3 306,3197,3629,2781,1907,
1786,3732,3688,1527,3414,3388,2875,1949,3313,2982,
3850,1902,3635, 2930,1759,2985,3011,3417,2795,3524,
3469,2553,3475,2903,2972,3279,2782,2877,2017,3746,363
0,3857,3504,1909,1963,3429,3259,2018,3308,3736,3013,
2004,3696,3659,1950,1788,3852,2986,29 32,1965,2554,
3777,3198,3314,2797,3637,3470,2993,3014,3418,3528,
2803,1991,3430,2907,3477,3 375,3641,2988,1910,3316, 1855,2878,3667,2959,1971,3261,3638,1531,3748,2919,1913,2687,3433,2008,3778,3661,2936,1775,3287,3858,2527,1966,3719,3420,2994,3491,3478,2798,3536,3752,3873,3017,2020,2556,3434,2909,3662,3481,1995,3642,2805,3860,3018,1914,1533,3669,3644,2967,1973,3291,3383,1997,3780,3670,2923,3673,3723,2910,3493,2024,3864,3874,2806,1916,3683,2996,3674,1023,3482,3303,3760,3725,3025,3320,2971,1974,3441,3020,3262,3436,1887,3726,1783,2809,3731,2925,3407,3552,2032,3387,3293,3000,3442,2543,3685,1534,3494,3497,3523,3686,3615,2751,2003,3307,3484,1977,3415,3444,2983,3847,3026,3389,1787,2931,1998,2810,3294,2551,3498,2973,3525,3309,2926,3631,2783,1978,3905,3876,3784,3906,3733,1903,2005,3880,3851,3689,3676,3041,2006,3505,3792,1951,3888,2933,2987,3042,3908,3419,3969,3028,3315,2974,2812,3734,2989,2019,3526,3390,3747,3690,1789,3970,3853,1980,3448,3500,3015,1911,3737,3808,2009,3639,2934,2021,2879,3912,3697,3310,2995,3431,3529,2555,3471,3859,2937,3663,3032,3750,3506,3749,2799,2010,3421,2990,3317,1967,3530,3738,3692,3044,1915,3435,2022,3199,3263,3019,1790,3854,3479,3508,3698,2938,3643,3537,2557,3753,3318,3779,2997,1535,3021,3422,3671,3740,3862,3048,3532,2940,2012,3321,3754,3645,2025,3483,3875,1975,3861,2998,3781,3437,3512,2026,3700,3761,2911,3446,2807,3495,3538,3865,3322,3443,3056,3553,3646,1917,3485,2558,3675,3438,1999,1918,3027,3540,3001,3727,3972,3877,3687,2811,3756,3022,3782,2033,3501,3866,3324,3445,3677,1979,3920,3762,3785,3704,3002,3554,3878,2028,2927,3029,3499,3976,3030,3486,2975,3295,2034,3735,3764,3907,3691,3544,1981,3527,3868,3881,3786,3043,2007,3793,3909,1982,3788,2813,3004,3936,3882,2935,3678,3033,3984,3045,3794,3768,3449,3507,2011,3889,3391,3693,2036,3884,3556,3502,3034,2023,3910,3739,3560,2991,3311,3450,3531,3694,2939,3699,3046,3509,3452,2814,2040,3890,3533,3568,3741,3751,2559,1791,3796,3913,3701,2013,3423,3539,3510,3036,3809,3323,3534,3514,3513,3049,2999,3541,3319,3755,3914,3050,3810,2027,3971,3742,3855,2014,3921,2029,3892,2941,3800,4000,3863,3439,3023,3973,2942,3702,3757,3916,3705,3783,3325,3763,3896,3057,3974,3758,1983,3003,3812,3922,3447,3516,3052,3542,3555,2035,3487,3557,3977,3867,3545,3706,3816,3924,4032,3058,3937,3765,2037,3005,3869,3031,3978,3006,3787,3879,3546,3708,3766,3326,1919,3789,3647,3985,2030,3870,3883,3451,3035,3769,3503,3060,3679,3561,3047,3938,3795,3558,2038,3980,3790,3885,3548,3928,3911,3064,2041,3797,3770,3986,3824,3940,3891,2815,3886,3511,4001,3037,3562,3695,3743,3811,2042,3988,3535,3915,2015,3453,3569,3051,4002,3893,3798,4033,3038,3053,3944,3564,3703,3801,3772,3515,3813,2044,3917,3992,3454,3894,3007,3923,3802,3570,3952,3814,3517,3543,3707,4004,3059,3759,2031,3975,3897,3572,3061,3918,3817,3898,3804,3518,4034,4008,3547,3925,3939,3709,2943,3979,3054,3559,3767,3818,3900,3825,3926,2039,3929,3576,3871,3327,4036,3981,3062,3791,3549,3987,3065,3710,3820,4016,3941,3563,3771,3826,3930,2043,3550,4040,3455,3982,3887,3066,4048,3942,3039,3989,3799,3565,3945,3773,4003,2045,3828,3932,3571,3803,3068,3895,3994,3946,3990,3574,4005,2046,3815,3832,3953,3055,3566,3774,3993,3573,3948,3919,4064,3519,3805,3899,4006,3954,4009,4035,3819,3577,3927,3996,3806,3901,3063,4037,4010,3956,3578,3821,4017,4038,3827,3931,4012,3902,3983,3067,3943,3711,3960,3551,4018,3822,4041,3580,3933,3829,4042,3069,3991,3947,3934,3830,4020,2047,4049,3995,4044,3070,3833,3949,4024,3567,3775,4007,4050,3955,3834,3575,3997,3950,3807,4065,3957,4011,4066,4052,3998,3836,4013,4039,3958,3903,4019,3579,3961,4056,3823,4014,4068,4043,3962,3581,4021,4045,4072,3964,3071,4022,3935,3831,4080,3582,4051,4025,3835,4046,4026,3951,4053,4054,3999,4067,3837,4028,3959,4057,4069,4058,4015,3963,4070,3838,3583,4060,4073,4023,4074,3965,4047,3966,4081,4027,4076,4082,4029,4055,4030,4059,4084,4071,4088,3839,4061,4075,4062,4077,4031,4083,4085,3967,4078,4086,4089,4090,4063,4092,4079,4087,4091,4093,4094,4095]

Sequence Group 4: Z4_4096

[0,1,2,7,3,8,11,24,4,10,13,28,16,33,35,77,5,12,14,32,19,38,47,81,22,46,42,88,57,96,102,168,6,17,21,40,23,45,51,90,29,55,59,97,72,111,117,187,34,61,75,115,80,124,134,199,87,136,147,226,152,238,259,382,9,18,26,54,30,58,71,105,36,76,62,118,84,128,141,208,44,74,86,135,92,144,151,232,100,154,170,250,185,267,286,425,53,89,98,150,112,161,179,264,122,180,198,278,210,302,320,462,138,206,229,308,235,321,346,494,256,355,375,519,395,544,588,818,15,25,31,73,39,79,82,140,48,85,93,149,101,159,165,261,56,94,103,162,116,178,195,281,127,196,207,296,231,316,340,482,64,109,123,184,129,197,214,310,148,227,236,323,255,353,367,518,163,246,265,359,279,390,398,541,304,412,445,575,471,609,678,820,69,125,143,217,158,234,253,357,169,257,270,381,287,397,424,565,193,282,297,409,322,437,466,621,336,474,501,650,527,689,716,943,213,311,330,451,360,481,506,668,394,514,542,704,577,721,786,1018,421,553,589,755,604,806,835,1077,673,852,881,1066,915,1125,1203,1490,20,37,41,91,49,95,106,177,50,107,119,188,131,209,218,338,63,120,132,223,145,230,244,339,153,243,260,373,283,393,403,540,67,142,155,225,173,247,266,391,182,276,288,405,301,434,456,600,181,298,314,433,335,467,485,651,362,508,528,688,550,712,762,997,78,167,174,273,191,294,312,426,200,319,327,464,347,492,512,686,258,341,361,499,383,524,549,707,415,559,595,751,624,803,839,1056,293,377,406,536,432,574,598,789,459,615,634,816,679,866,892,1108,503,676,691,882,708,917,872,1144,772,988,1019,1219,1030,1318,1369,1550,83,189,194,334,248,352,366,507,274,371,384,533,414,561,593,792,289,410,430,563,448,599,628,824,475,637,667,858,705,888,940,1156,337,435,454,627,483,659,696,874,531,697,718,934,773,912,1004,1229,572,742,798,990,826,1028,1061,1285,867,1070,1069,1356,1147,1390,1432,1688,376,472,509,699,560,720,761,956,596,790,808,1022,848,1037,1067,1312,629,832,877,1057,898,1074,1151,1393,953,1163,1199,1442,1256,1505,1544,1823,687,884,928,1153,1001,1158,1243,1463,1015,1236,1292,1529,1341,1583,1664,1935,1040,1323,1384,1609,1417,1675,1637,1972,1486,1728,1765,2076,1842,2132,2209,2406,27,43,52,99,60,121,133,215,66,137,146,222,157,241,245,387,68,156,166,240,175,295,305,420,202,307,333,460,349,487,510,702,70,172,190,300,204,331,343,479,216,356,368,515,389,545,569,723,228,379,402,556,428,592,610,777,439,601,639,831,648,856,885,1211,110,203,211,348,224,369,388,535,251,404,416,581,442,618,636,796,272,419,453,607,477,646,654,841,498,657,665,891,739,918,979,1232,290,476,490,663,523,693,701,904,548,738,765,952,811,998,1023,1296,580,785,827,1027,868,1053,1114,1345,925,1122,1166,1394,1200,1447,1516,1812,113,220,242,399,269,417,447,623,285,457,480,658,504,671,681,900,318,491,521,684,547,732,758,947,578,775,809,1013,842,1041,1092,1300,344,534,568,763,611,799,797,1044,630,833,854,1078,907,1118,1134,1402,670,869,921,1126,949,1176,1202,1466,987,1225,1270,1530,1353,1593,1670,1946,364,586,617,836,653,865,909,1123,729,924,962,1192,968,1207,1252,1501,743,965,986,1241,1049,1267,1331,1580,1104,1348,1380,1613,1430, 1698,1736,1985,776,1065,1085,1303,1141,1358,1389,1650,1167,1426,1471,1722,1517,1772,1832,2092,1275,1475,1534,1782,1604,1853,1885,2189,1654,19 20,1968,2234,2030,2312,2389,2668,130,252,277,458,315,489,517,711,325,526,554,735,582,769,8 23,1094,358,570,622,793,641,862,845,1107,660,878,913,1162,957,1182,1215,1487,429,631,661,85 9,728,903,929,1197,734,961,976,1216,1000,1253,1284,1559,745,994,1034,1280,1101,1328,1373,1 619,1130,1413,1428,1705,1473,1737,1797,2063,441,727,731,950,749,966,1010,1261,782,1051,10 82,1314,1119,1365,1421,1680,920,1097,1143,1378,1171,1443,1477,1732,1257,1482,1538,1786,16 08,1844,1879,2185,973,1175,1240,1446,1276,1526,1566,1810,1337,1589,1628,1876,1676,1923,19 82,2266,1386,1659,1715,1966,1763,2012,2060,2324,1819,2082,2128,2379,2158,2472,2484,2837,452,752,768,1089,901,1112,1133,1410,937,1160,1189,1455,1249,1495,1554,1801,982,1212,1272,15 08,1308,1571,1632,1866,1368,1672,1624,1904,1733,1977,2029,2281,1105,1287,1327,1595,1399,1 640,1709,1955,1438,1717,1761,2014,1792,2034,2097,2368,1519,1776,1828,2071,1889,2139,2176, 2439,1932,2224,2256,2516,2316,2560,2574,2762,1172,1332,1433,1720,1491,1753,1777,2052,1548,1838,1857,2119,1909,2143,2236,2481,1563,1900,1960,2220,2025,2268,2277,2570,2086,2328,23 57,2603,2424,2677,2721,2947,1685,2002,2017,2302,2109,2333,2383,2623,2154,2435,2450,2710,2 528,2724,2847,3024,2200,2505,2550,2786,2614,2807,2878,3093,2647,2897,2938,3147,2986,3190, 3225,3405,65,104,114,183,126,186,219,309,139,205,233,332,262,365,380,573,160,221,239,363,280,392,440,585,303,438,413,613,488,644,672,883,171,263,292,408,306,436,463,620,345,473,495,6 47,552,700,722,936,370,505,567,715,583,746,774,971,612,780,813,1039,838,1073,1124,1396,201, 268,326,469,350,493,546,680,385,571,511,724,605,756,802,993,423,564,608,778,635,807,830,105 2,664,844,890,1096,933,1140,1187,1479,468,614,649,822,703,857,911,1136,737,916,969,1170,996,1224,1262,1549,788,989,1045,1239,1060,1264,1317,1607,1113,1340,1376,1649,1416,1696,1769, 2115,249,324,354,558,401,579,591,801,443,606,638,819,666,855,873,1132,486,640,674,861,717,9 08,959,1178,754,960,992,1209,1048,1255,1305,1586,520,692,741,931,760,964,1005,1244,815,104 2,1064,1271,1111,1336,1361,1648,864,1088,1137,1347,1174,1408,1422,1692,1228,1454,1520,174 9,1569,1804,1912,2117,539,748,805,1014,851,1055,1103,1344,886,1117,1146,1392,1188,1419,147 6,1735,951,1180,1210,1450,1266,1504,1558,1821,1299,1574,1622,1869,1665,1931,1971,2284,100 3,1246,1290,1527,1350,1584,1630,1894,1415,1643,1694,1949,1751,1981,2069,2371,1470,1707,17 70,2028,1796,2100,2136,2443,1903,2162,2198,2428,2244,2498,2586,2872,284,386,411,633,444,6 42,683,906,450,685,726,939,767,995,1017,1302,513,730,770,1033,810,1046,1084,1304,840,1083, 1128,1372,1181,1412,1436,1691,532,804,846,1036,896,1091,1139,1409,927,1161,1190,1441,1222, 1498,1536,1789,919,1214,1250,1496,1298,1562,1592,1870,1355,1634,1669,1929,1704,1961,2038, 2348,576,880,897,1152,946,1205,1247,1480,972,1260,1283,1553,1321,1603,1641,1926,1121,1307,1352,1618,1398,1658,1703,1953,1459,1721,1780,2022,1826,2096,2144,2417,1201,1383,1445,168 7,1494,1748,1785,2074,1541,1813,1843,2112,1914,2179,2214,2480,1626,1908,1934,2199,1954,22 45,2188,2523,2050,2339,2372,2602,2387,2704,2757,2927,603,941,955,1295,1093,1335,1360,1631, 1155,1367,1401,1679,1458,1726,1775,2079,1193,1452,1489,1731,1524,1787,1831,2122,1575,1848,1893,2170,1950,2208,2280,2534,1301,1500,1533,1830,1588,1880,1939,2190,1674,1940,1975,22 71,2051,2240,2356,2612,1745,2005,2089,2341,2125,2384,2422,2672,2180,2434,2432,2744,2527,2 776,2817,3048,1379,1570,1636,1943,1725,1979,2037,2296,1781,2075,2103,2376,2157,2396,2429, 2698,1833,2131,2193,2418,2223,2440,2530,2779,2293,2540,2582,2826,2642,2887,2922,3160,1927,2203,2259,2531,2353,2535,2630,2850,2366,2621,2681,2911,2729,2960,3027,3245,2400,2708,27 70,2980,2806,3036,3005,3270,2868,3079,3114,3345,3172,3382,3433,3557,328,418,465,656,500,7 33,771,1007,530,781,812,1032,849,1080,1086,1404,537,847,876,1076,899,1206,1231,1467,978,12 34,1294,1543,1326,1594,1639,1945,543,894,944,1220,985,1291,1311,1581,1009,1343,1363,1644,1407,1697,1741,1984,1043,1388,1431,1714,1484,1774,1806,2059,1507,1791,1852,2130,1865,216 7,2204,2592,695,980,999,1322,1035,1364,1405,1684,1099,1437,1461,1757,1515,1817,1847,2085, 1149,1464,1532,1800,1578,1863,1874,2147,1616,1877,1890,2212,2001,2246,2327,2617,1196,157 7,1599,1888,1657,1936,1944,2233,1701,2000,2042,2292,2108,2349,2377,2684,1755,2068,2126,2382,2182,2414,2485,2733,2255,2494,2543,2780,2583,2832,2900,3153,710,1026,1081,1425,1142,14 62,1523,1825,1185,1537,1582,1878,1627,1899,1918,2227,1259,1602,1653,1922,1700,1994,2033,2 287,1752,2054,2105,2365,2148,2402,2460,2689,1313,1682,1740,2040,1809,2091,2087,2405,1835, 2133,2165,2444,2235,2489,2510,2789,1898,2184,2250,2499,2288,2555,2585,2853,2337,2607,2655,2912,2741,2966,3032,3252,1357,1766,1816,2138,1873,2178,2237,2495,1991,2254,2301,2577,23 11,2589,2638,2882,2007,2305,2336,2627,2409,2651,2718,2957,2474,2736,2766,2985,2816,3057,3 087,3281,2056,2427,2453,2692,2519,2746,2775,3016,2544,2813,2857,3075,2901,3118,3165,3355, 2660,2860,2916,3125,2975,3181,3206,3420,3020,3232,3267,3450,3312,3498,3544,3695,764,1100, 1165,1539,1251,1598,1647,1958,1274,1662,1710,1997,1760,2047,2121,2462,1346,1743,1822,208 0,1856,2174,2153,2478,1882,2194,2241,2539,2297,2564,2596,2869,1485,1837,1884,2171,1989,22 31,2261,2581,1996,2300,2322,2598,2351,2639,2671,2936,2011,2345,2393,2666,2470,2714,2761,2 989,2504,2802,2814,3064,2858,3089,3137,3338,1511,1988,1993,2290,2018,2307,2361,2646,2064, 2412,2449,2700,2490,2753,2809,3041,2249,2466,2522,2765,2548,2827,2862,3083,2644,2865,2918,3128,2979,3173,3202,3418,2317,2553,2626,2830,2661,2909,2945,3150,2725,2964,2997,3200,30 37,3235,3278,3469,2771,3023,3070,3266,3112,3300,3336,3505,3157,3348,3381,3538,3401,3593,3 599,3778,1528,2023,2046,2457,2228,2483,2508,2798,2275,2538,2573,2841,2635,2877,2931,3141, 2331,2593,2656,2891,2695,2950,3000,3193,2756,3033,2993,3220,3084,3274,3311,3479,2475,2675,2713,2968,2785,3008,3066,3258,2822,3071,3111,3301,3132,3316,3359,3533,2904,3120,3163,33 42,3208,3386,3413,3573,3242,3443,3463,3617,3501,3640,3649,3744,2549,2720,2818,3074,2874,3 104,3121,3329,2926,3169,3185,3376,3224,3389,3452,3598,2941,3216,3261,3440,3308,3470,3476, 3646,3351,3508,3529,3664,3566,3699,3721,3824,3045,3295,3304,3493,3370,3511,3540,3673,3397,3570,3579,3717,3625,3723,3782,3858,3426,3611,3634,3753,3668,3766,3796,3883,3688,3804,38 20,3903,3841,3919,3931,3987,108,164,176,271,192,275,313,431,212,299,329,461,372,497,516,74 7,237,317,342,496,396,529,590,759,422,587,557,794,645,829,860,1098,254,374,407,551,427,584, 616,800,470,632,655,834,719,893,922,1159,502,669,740,910,757,942,977,1194,791,983,1024,1273,1047,1306,1362,1651,291,378,449,626,478,652,714,871,522,744,675,923,783,958,1008,1223,56 6,736,787,981,817,1016,1038,1286,850,1054,1106,1334,1154,1382,1434,1742,625,795,837,1031,8 95,1072,1131,1375,935,1135,1191,1411,1227,1469,1512,1811,991,1218,1279,1488, 1293,1513,156 8,1872,1351,1591,1633,1917,1678,1964, 2039,2385,351,446,484,725,538,753,766,1006,594,784,82 1,1029,853,1068,1087,1370,643,825,863,1075,914,1129, 1183,1420,954,1184,1221,1456,1282,1506, 1560,1854,682, 887,938,1150,963,1186,1235,1493,1025,1277,1297,1518, 1349,1587,1617,1916,10 79,1325,1377,1601,1414,1667, 1683,1959,1474,1713,1784,2016,1834,2072,2181,2388, 709,945,101 2,1242,1063,1289,1342,1597,1102,1354,1391, 1646,1435,1681,1739,1999,1177,1423,1457,1708,15 14,1764,1820,2094,1552,1840,1887,2141,1930,2202,2239, 2546,1233,1497,1540,1794,1605,1851,1 896,2166,1677, 1911,1962,2221,2020,2248,2340,2633,1734,1978,2041, 2295,2062,2364,2403,2697, 2173,2426,2464,2687,2511, 2751,2836,3102,400,525,555,814,597,828,875,1127,602, 879,926,1164, 970,1226,1245,1556,677,930,974,1265, 1020,1281,1320,1557,1050,1319,1366,1629,1424,1673,169 3,1957,698,1011,1058,1269,1115,1329,1381,1668,1145, 1403,1439,1699,1468,1758,1802,2057,113 8,1460,1502, 1756,1551,1824,1858,2142,1610,1901,1933,2201,1974, 2232,2306,2610,750,1095,111 6,1397,1173,1451,1499, 1744,1195,1510,1531,1815,1572,1868,1907,2196,1359, 1561,1606,1883,16 52,1925,1973,2225,1719,1987,2048, 2289,2099,2360,2408,2679,1449,1638,1702,1951,1754, 2015,2 053,2343,1807,2084,2111,2381,2183,2447,2479, 2735,1891,2177,2205,2465,2226,2513,2454,2774, 2320, 2599,2634,2851,2645,2949,2996,3154,779,1168,1179, 1547,1330,1585,1615,1897,1400,1625, 1655,1942,1718, 1992,2045,2346,1440,1711,1750,1995,1790,2055,2102, 2392,1841,2116,2164,243 7,2222,2473,2542,2788,1555, 1759,1799,2101,1855,2152,2211,2456,1938,2213,2243, 2533,2321,25 07,2619,2861,2010,2278,2354,2601,2394, 2643,2683,2915,2448,2691,2690,2982,2778,3012,3052,3 257,1635,1836,1902,2215,1990,2247,2304,2562,2049, 2344,2369,2636,2421,2654,2688,2943,2104, 2399,2459, 2680,2488,2694,2782,3014,2559,2794,2831,3059,2889, 3115,3149,3358,2197,2468,252 5,2784,2616,2790,2875, 3078,2631,2867,2921,3135,2967,3179,3240,3431,2658, 2953,3007,3199,30 40,3248,3219,3455,3099,3288,3317, 3519,3371,3552,3595,3694,455,562,619,843,662,932,975, 123 7,694,984,1021,1263,1062,1315,1324,1661,706,1059, 1090,1310,1120,1453,1478,1730,1204,1483, 1546,1808, 1576,1860,1905,2218,713,1110,1169,1465,1213,1542, 1564,1849,1238,1596,1620,1913, 1666,1965,2006,2252, 1278,1642,1690,1983,1746,2044,2073,2329,1768,2058, 2120,2398,2137,243 3,2469,2844,889,1208,1230,1573, 1268,1621,1663,1948,1338,1695,1723,2027,1778,2090, 2114,235 0,1395,1729,1798,2067,1846,2134,2146,2411, 1881,2150,2161,2477,2274,2514,2588,2864,1444,18 45,1864,2159,1924,2207,2217,2497,1970,2273,2310,2558, 2374,2611,2637,2925,2026,2338,2395,2 641,2451,2676, 2740,2971,2521,2748,2796,3015,2833,3063,3123,3349, 902,1254,1316,1686,1387,1 724,1788,2098,1429,1803, 1850,2151,1892,2169,2187,2492,1509,1867,1921,2192, 1969,2265,2299, 2552,2021,2325,2370,2628,2413,2659, 2716,2930,1565,1947,2004,2308,2077,2355,2352,2664,210 6,2401,2430,2699,2501,2743,2760,3022,2168,2452,2518, 2752,2554,2805,2835,3081,2597,2856,29 02,3136,2978, 3187,3244,3439,1612,2036,2088,2404,2145,2446,2503, 2749,2262,2520,2568,2824,2 575,2840,2885,3110,2279, 2571,2595,2873,2670,2899,2958,3176,2731,2974,3004, 3201,3050,3265, 3293,3462,2326,2686,2707,2934,2769, 2984,3011,3231,2797,3047,3086,3285,3124,3321,3365,352 8,2907,3090,3140,3328,3196,3378,3400,3584,3234,3421, 3453,3607,3490,3651,3687,3811,967,133 9,1406,1805, 1503,1862,1915,2230,1522,1928,1980,2270,2031,2315, 2391,2719,1600,2008,2095,23 47,2124,2442,2416,2734, 2155,2461,2509,2793,2563,2812,2848,3100,1747,2107, 2156,2438,2260,2 496,2526,2829,2269,2567,2584,2849, 2615,2886,2914,3159,2282,2606,2650,2910,2728,2956, 2999, 3205,2755,3035,3049,3273,3088,3294,3339,3512, 1773,2258,2264,2556,2286,2572,2625,2894,233 5,2673, 2703,2946,2745,2992,3043,3251,2517,2723,2773,3002, 2800,3060,3092,3290,2890,3096,31 44,3331,3198,3373, 3395,3582,2580,2804,2871,3062,2908,3131,3164,3347, 2963,3184,3212,3392,3 249,3423,3460,3626,3009,3238, 3280,3451,3315,3481,3510,3655,3354,3522,3549,3682, 3565,3725, 3732,3874,1795,2291,2314,2712,2493,2738, 2759,3031,2537,2791,2821,3069,2881,3106,3156,334 1,2591,2845,2905,3117,2940,3168,3215,3385,2995,3246, 3209,3412,3291,3457,3489,3632,2732,29 17,2955,3189, 3019,3222,3276,3446,3056,3282,3314,3482,3335,3492, 3531,3677,3126,3324,3362,3 516,3403,3556,3575,3710, 3429,3602,3622,3745,3652,3767,3771,3846,2801,2959, 3053,3283,3103, 3307,3325,3504,3151,3369,3380,3543, 3415,3558,3609,3730,3162,3410,3448,3600,3487,3627,363 0,3769,3524,3657,3672,3786,3703,3815,3832,3912,3255, 3475,3483,3645,3537,3659,3684,3792,35 63,3709,3715, 3827,3750,3833,3876,3935,3590,3741,3763,3856,3789, 3862,3890,3956,3803,3894,3 909,3969,3924,3981,3991, 4030,690,870,905,1148,948,1157,1248,1492,1002,1217, 1288,1545,1371, 1614,1645,2013,1071,1258,1309,1611, 1418,1671,1771,2035,1472,1767,1716,2081,1861,2129,217 2,2467,1109,1374,1448,1706,1481,1762,1814,2093,1567, 1839,1875,2135,1976,2216,2251,2536,16 23,1895,2003, 2238,2032,2283,2323,2578,2078,2332,2378,2657,2407, 2693,2750,3017,1198,1385,1 525,1829,1579,1871,1967, 2186,1656,2009,1906,2253,2065,2298,2359,2605,1738, 1998,2070,2330, 2113,2367,2397,2674,2160,2415,2476, 2722,2532,2768,2819,3094,1827,2083,2140,2390,2219,243 6,2506,2763,2272,2512,2576,2799,2609,2855,2895,3152, 2342,2600,2665,2870,2682,2896,2948,31 97,2739,2965, 3001,3230,3039,3263,3319,3541,1333,1521,1590,1986, 1689,2024,2043,2358,1779,2 066,2118,2386,2163,2431, 2455,2758,1859,2123,2175,2441,2242,2502,2565,2808, 2294,2566,2604, 2842,2669,2888,2937,3182,1919,2206, 2276,2529,2303,2569,2620,2876,2380,2662,2685,2903,273 7,2962,2988,3229,2445,2711,2764,2973,2803,3029,3044, 3260,2859,3068,3127,3303,3166,3343,34 16,3542,1956, 2285,2363,2629,2425,2678,2730,2970,2471,2742,2777, 3013,2820,3042,3091,3292,2 557,2810,2843,3065,2898, 3113,3158,3356,2929,3170,3207,3387,3241,3428,3454, 3633,2618,2879, 2919,3133,2976,3180,3213,3407,3038, 3226,3262,3441,3305,3459,3515,3678,3085,3275,3320,348 8,3337,3532,3554,3712,3411,3567,3588,3705,3614,3738, 3777,3887,1427,1660,1712,2110,1783,21 27,2191,2500, 1793,2195,2257,2541,2313,2608,2632,2933,1910,2263, 2318,2649,2373,2667,2706,2 935,2410,2705,2754,2998, 2811,3034,3054,3259,1941,2362,2419,2653,2486,2715, 2767,3030,2524, 2792,2823,3058,2854,3108,3142,3333, 2515,2846,2883,3107,2928,3161,3186,3388,2981,3217,324 3,3427,3272,3449,3495,3666,2019,2463,2487,2783,2551, 2838,2880,3095,2579,2893,2913,3155,29 51,3195,3223, 3424,2747,2939,2977,3204,3018,3237,3271,3444,3073, 3284,3326,3485,3361,3530,3 559,3700,2834,3006,3061, 3256,3105,3302,3330,3517,3146,3350,3372,3539,3417, 3577,3597,3729, 3210,3414,3430,3589,3445,3615,3583, 3748,3502,3662,3679,3785,3686,3825,3844,3906,2061,254 5,2561,2924,2717,2961,2987,3214,2787,2994,3021,3250, 3072,3287,3323,3520,2825,3067,3101,32 89,3130,3332, 3364,3546,3171,3375,3406,3571,3442,3594,3631,3754, 2932,3109,3139,3363,3183,3 396,3434,3585,3247,3435, 3456,3628,3503,3612,3671,3788,3299,3477,3526,3663, 3547,3685,3702, 3813,3578,3708,3707,3839,3749,3852, 3867,3943,3003,3167,3218,3436,3286,3458,3494,3641,332

7,3518,3534,3680,3564,3690,3706,3822,3366,3551,3586,
3701,3601,3711,3751,3853,3639,3758,37 74,3870,3800,
3892,3904,3973,3425,3591,3623,3752,3670,3755,3795,
3877,3676,3791,3816,3899,3 835,3915,3936,3995,3691,
3826,3849,3922,3861,3939,3929,4001,3885,3951,3960,
4017,3977,4025, 4035,4056,1535,1727,1818,2149,1886,
2267,2319,2622,1937,2334,2375,2648,2423,2701,2709,302
5,1952,2420,2458,2696,2491,2839,2863,3082,2587,2866,
2923,3148,2954,3188,3221,3438,1963,24 82,2547,2852,
2594,2920,2942,3177,2624,2969,2990,3227,3028,3264,
3297,3461,2663,3010,3051,3 279,3097,3322,3344,3509,
3116,3334,3377,3550,3384,3569,3592,3780,2210,2590,
2613,2952,2652, 2991,3026,3254,2726,3055,3076,3310,
3122,3353,3374,3523,2781,3080,3138,3340,3175,3383,339
1,3560,3203,3393,3404,3596,3474,3616,3656,3790,2828,
3174,3192,3402,3236,3432,3437,3606,32 69,3473,3497,
3638,3536,3667,3681,3817,3309,3514,3548,3683,3580,
3698,3733,3836,3621,3736,3 759,3854,3775,3873,3895,
3971,2229,2640,2702,3046,2772,3077,3129,3360,2815,
3143,3178,3394, 3211,3409,3419,3603,2892,3194,3233,
3422,3268,3468,3491,3635,3306,3506,3535,3675,3561,369
2,3719,3818,2944,3253,3296,3496,3346,3527,3525,3693,
3367,3553,3568,3713,3608,3734,3743,38 57,3408,3581,
3619,3739,3636,3765,3776,3878,3661,3787,3806,3900,
3838,3917,3937,3996,2983,3 318,3352,3555,3390,3576,
3610,3737,3466,3620,3644,3772,3650,3779,3798,3891,
3478,3647,3660, 3794,3696,3805,3830,3914,3726,3837,
3848,3923,3866,3944,3954,4004,3507,3704,3716,3819,374
6,3840,3851,3932,3760,3864,3879,3950,3896,3961,3975,
4020,3808,3881,3901,3964,3920,3979,39 85,4033,3933,
3992,4000,4038,4011,4046,4055,4075,2309,2727,2795,
3145,2884,3191,3228,3447,2 906,3239,3277,3472,3313,
3500,3545,3720,2972,3298,3357,3521,3379,3574,3562,
3728,3398,3587, 3613,3757,3642,3768,3783,3886,3098,
3368,3399,3572,3465,3605,3624,3773,3471,3643,3654,378
4,3669,3799,3812,3908,3480,3665,3689,3810,3724,3829,
3845,3925,3740,3860,3865,3945,3880,39 55,3967,4015,
3119,3464,3467,3637,3484,3648,3674,3802,3513,3697,
3714,3823,3735,3842,3863,3 941,3618,3722,3747,3847,
3761,3871,3882,3952,3801,3884,3902,3965,3921,3978,
3984,4032,3653, 3764,3793,3872,3809,3898,3911,3970,
3834,3916,3927,3983,3940,3993,4003,4041,3850,3934,394
7,3999,3959,4006,4014,4048,3972,4018,4024,4053,4029,
4061,4063,4083,3134,3486,3499,3718,36 04,3731,3742,
3859,3629,3756,3770,3875,3797,3889,3907,3968,3658,
3781,3807,3893,3821,3913,3 928,3982,3843,3938,3926,
3989,3953,4002,4010,4044,3727,3814,3828,3918,3855,
3930,3946,3997, 3869,3948,3958,4007,3966,4012,4021,
4052,3897,3962,3974,4016,3986,4026,4031,4059,3994,403
7,4040,4065,4047,4068,4070,4080,3762,3831,3868,3949,
3888,3957,3963,4013,3905,3976,3980,40 23,3990,4027,
4039,4062,3910,3988,3998,4036,4009,4042,4043,4069,
4019,4049,4051,4071,4057,4 076,4078,4088,3942,4005,
4008,4045,4022,4050,4054,4073,4028,4058,4060,4077,
4066,4079,4084, 4090,4034,4064,4067,4081,4072,4082,
4085,4091,4074,4086,4087,4092,4089,4093,4094,4095]

Sequence Group 4: Q4_8192

[0,1,2,4,8,16,32,3,5,64,9,6,17,10,18,128,12,33,65,20,
256,34,24,36,7,129,66,512,11,40,6 8,130,19,13,48,14,72,
257,21,132,35,258,26,513,80,37,25,22,136,260,264,38,514,
96,67,41,144,28,6 9,42,516,49,74,272,160,1024,520,288,
528,192,544,70,44,131,81,50,73,15,320,133,52,23,134,
384,7 6,137,82,56,27,97,39,259,84,138,145,261,29,43,98,
515,88,140,30,146,1025,71,262,265,2048,161,5 76,45,100,
640,1026,51,148,46,75,266,273,517,104,162,53,193,1028,
152,77,164,768,268,274,518,5 4,83,57,521,112,1032,135,
78,289,194,85,276,522,58,168,139,99,86,60,280,89,290,
529,524,196,14 1,1040,101,147,176,2049,142,530,321,31,
200,90,1056,545,292,322,532,2050,263,149,102,105,304,
4096,296,1027,163,92,1029,47,267,385,546,324,2052,208,
386,150,153,165,106,55,328,1088,536, 577,548,1033,113,
154,79,269,108,578,2056,224,166,519,552,195,270,1030,
641,1041,523,275,580, 291,59,169,560,114,277,156,87,
1034,197,116,170,2064,61,1042,531,525,642,281,278,526,
177,293, 388,1152,91,584,769,198,2080,172,120,201,336,
62,282,4097,143,1036,1057,103,178,294,93,1089, 644,202,
2051,592,323,392,2053,297,770,4098,107,180,1044,151,
209,284,1280,648,94,204,298,40 0,608,2112,1058,352,325,
533,155,210,305,2057,4100,547,300,109,1048,184,534,
1060,537,115,10 31,167,225,326,2054,306,772,157,2065,
656,329,110,117,212,171,1153,776,1090,4104,330,1536,20
58,226,549,1035,538,387,308,216,416,271,279,158,337,
2066,550,672,1064,118,332,579,540,1092, 2176,389,173,
1154,121,553,199,784,179,228,4112,338,312,1043,704,
1037,390,174,554,581,1072, 393,2060,283,2081,122,448,
353,2113,561,1038,203,63,4128,340,394,1096,1281,527,
582,556,181, 295,1045,285,232,124,2068,205,182,643,
2304,1156,562,286,585,4099,299,354,2082,1059,4101,21
1,401,1282,185,1050,396,344,586,645,1537,593,535,240,
2072,1104,206,95,327,2084,564,800,402, 2055,4160,356,
307,301,417,1061,213,1049,568,1046,832,4105,588,1160,
1284,186,2177,646,404,2 114,1288,227,896,594,418,2560,
302,649,771,360,539,2059,4102,111,1062,331,1538,4113,
214,309, 1120,1091,2088,188,449,1065,217,408,609,596,
2116,551,650,229,159,4106,420,2178,310,1168,54 1,1052,
773,610,657,333,1093,119,1066,2067,4114,2061,600,339,
1540,218,2096,368,652,1073,230, 391,313,4224,450,542,
1098,334,1296,233,555,2062,774,175,123,1184,658,2120,
612,341,2305,77 7,220,314,2069,1544,424,1312,395,4108,
673,4129,583,355,1552,2180,1216,4161,287,183,234,156
8,125,557,1094,660,616,342,316,2083,1068,241,778,2306,
563,2074,1155,345,452,397,2561,4116, 403,1105,207,
2128,1074,4352,674,558,785,1097,432,1039,357,187,1344,
236,664,1157,624,4130,5 87,780,1076,2085,1047,705,
2073,126,242,2070,1158,565,398,2184,346,456,2308,4120,
358,405,30 3,569,2312,1408,4132,244,1100,1161,595,
1106,189,4103,566,676,1080,1051,1121,361,2086,706,5
89,2562,1063,215,786,647,348,2144,2115,419,406,464,
680,4225,801,2089,4162,1283,362,1108,59 0,409,1162,
4608,570,1169,788,1285,2192,1053,4107,2076,597,1067,
572,1122,219,311,2117,708,5 98,2090,1539,601,651,421,
792,4136,802,2564,611,1112,602,1164,410,231,2097,4164,
688,653,105 4,248,1170,2122,4226,369,2320,190,364,
1095,654,2208,1286,659,1289,335,480,4115,315,4109,22
1,3072,370,1185,613,2568,1600,4144,422,425,2336,451,
1069,614,543,1124,235,412,2576,343,372, 2240,1664,775,
317,2592,4110,2118,1075,222,1172,426,4168,2092,453,
4353,237,1070,559,1099,2 179,1290,4117,833,804,712,
1297,834,661,1541,808,779,2129,1128,617,604,2098,1186,
433,4228,7 20,2121,816,1077,2063,1217,836,2368,347,
897,2181,1176,4131,243,1101,2100,662,4354,2071,118
8,4122,454,318,675,1792,618,2182,1292,4609,898,781,
1298,1542,376,428,1078,665,4176,736,567, 1107,2432,
1081,1545,840,2124,2185,625,238,2130,1136,359,457,
2104,399,787,2075,2145,4133,5 91,678,434,4121,677,
2087,1159,4118,1102,349,1313,1218,245,4232,1109,458,
4356,666,1300,620, 1546,1082,2307,1192,4360,363,2132,
127,1163,191,2186,1123,782,407,2193,436,626,2309,2077,
11 10,571,465,681,2091,246,4134,707,2146,4610,1084,
350,1304,599,668,2563,1113,4192,4163,790,1 314,1553,
460,1548,2136,1220,4137,249,2188,682,1165,573,1125,
411,803,2078,1171,789,2194,120 0,709,365,4240,440,628, 4124,689,3073,2119,374,1166,423,2310,1554,4165,466,
793,2313,4138,13 45,250,371,1055,481,574,1224,2209,
4612,413,2624,1114,603,366,2093,1569,4145,2148,1316,
134 6,468,1556,655,900,4170,2688,805,4368,615,3074,
1287,684,1173,710,2099,1126,4256,429,794,21 96,252,
1129,373,605,1328,848,690,2094,5120,2123,713,632,2314,
1320,482,4616,806,2321,4384,1 187,2565,1116,427,2152,
1071,904,4624,2210,1291,4288,414,1409,2101,223,1570,
4640,2241,1348, 4166,663,3076,692,835,1232,619,472,
2200,1410,4140,455,796,2125,1174,1177,809,714,2212,
118 9,721,4227,837,2816,716,1130,2316,1079,1352,864,
2322,2566,4177,810,2102,1560,4146,606,160 1,2131,912,
4169,2105,2569,1572,4111,722,696,377,4416,1137,435,
2160,1178,4229,1103,817,1293, 1132,319,621,4148,1602,
812,4119,484,3080,1248,430,1190,2183,1543,2126,1576,
4230,838,2337, 2242,667,1219,488,2133,1294,239,378,
2324,2570,459,622,2106,2216,1665,4480,627,437,2187,38
0,4172,4233,2147,1547,4178,1299,818,1604,1315,461,
4152,2134,1083,4123,496,4193,669,1193,1 584,679,1138,
1301,2108,1180,4135,724,2328,841,1111,629,2137,1221,
351,467,2338,2577,1140,43 8,2572,2244,1194,737,251,
4355,462,2189,442,4180,441,3088,2149,4234,1085,469,
2195,1555,424 1,247,683,2224,1549,4357,1666,4125,842,
1305,1302,738,4139,1550,2190,1201,4194,899,2578,13
17,670,1412,783,2369,1115,4611,849,2079,1608,1793,820,
2248,1222,728,928,4184,2138,791,4236, 367,3104,2593,
1196,901,1144,630,2340,2370,1225,4126,685,844,2580,
4242,1360,633,711,1086,2 53,691,2311,1306,5121,2197,
4167,824,2150,1167,902,4358,686,2153,1127,4361,1202,
2352,1318,1 117,740,6144,1668,850,375,4257,2344,1226,
4672,444,3075,1616,2211,470,1347,4141,483,2140,1 416,
4196,415,3077,485,2095,905,1321,795,473,2315,1794,
4736,634,744,2433,5122,2594,1131,85 2,960,2372,1204,
865,4147,693,2256,4244,1175,2434,1233,1308,797,2198,
2201,1672,4142,4171,2 213,1118,1228,4362,906,1322,
2154,715,1424,4369,2103,2376,1632,4613,807,3136,474,
636,4200, 1376,694,254,2584,1349,4258,1557,717,2625,
1179,1234,575,913,4149,2596,1329,798,4289,811,3 081,
5124,2161,379,1571,2202,1324,2127,1133,4248,697,2317,
2156,4173,1208,431,2626,1558,426 0,607,2272,1561,2214,
489,4864,2567,2600,1139,4364,866,723,2243,486,4370,
1191,4614,2318,12 49,4150,1350,3078,908,1330,1796,718,
813,4179,2689,1181,4153,476,4617,856,3089,1680,1353,8
39,1134,2571,1141,2323,1236,4208,725,2628,2339,698,
1195,914,2107,1800,752,868,2217,2608,51 28,2162,819,
2325,2204,1354,4231,814,4174,439,2135,929,4385,4290,
3082,2245,1250,4181,1573, 490,2164,1562,4372,1411,623,
4618,2218,1332,4154,1240,4264,671,1440,1295,739,1303,
4235,118 2,2109,1361,4195,916,3090,2579,1574,463,1696,
843,2573,2690,1142,4182,381,2329,2326,1356,1 603,497,
2574,2225,1564,930,821,4156,2341,2436,726,4376,961,
3200,2139,1413,4185,1197,872,2 632,2817,1145,4386,
4625,492,2246,1577,4620,1223,4292,631,1808,1203,729,
4237,2220,1252,513 6,2168,1362,4197,700,2249,1336,443,
4243,1728,741,2384,1414,4272,1198,2110,1578,1605,
845,2 330,6145,1417,920,382,4238,2191,3084,1307,4626,
822,3105,2151,1146,2226,851,1472,4417,730, 2342,2141,
1377,4127,498,3137,880,2692,4296,1585,742,445,2250,
1227,4186,471,635,2640,1087, 5152,2371,1364,4641,932,
2440,1418,687,4388,4418,2345,1551,4628,1606,2818,
1580,1205,1319,9 03,6146,2155,1309,4359,825,4245,2228,
1256,1148,4198,500,3092,1229,2199,846,1206,4201,2257,
2332,1667,4400,745,3328,826,2696,732,1586,446,962,
2142,2252,1310,4392,1609,936,2346,5123, 2448,1323,475,
853,4259,2656,1378,867,4188,637,3106,5125,2400,4143,
1235,2373,1425,2581,120 9,4363,907,2203,2258,1420,
4481,1368,4642,2353,1610,1669,4420,487,6148,1617,
2595,695,1559, 4304,2348,2157,1264,4482,746,3096,828,
2232,753,4246,1230,4249,854,2582,1119,4261,1351,310
8,857,2585,1588,1824,504,799,4202,2163,1426,4151,255,
4424,964,3079,5184,2215,1380,909,133 1,2273,1325,2374,
1441,4632,719,2354,2820,4673,1237,477,2205,1592,4644,
915,2704,2377,1856, 5129,2158,4209,2165,2260,1612,
4250,638,4175,748,2219,944,4365,1210,4204,3201,2824,
1670,46 74,1428,3138,869,6152,1251,4320,1920,491,699,
4262,2378,1618,4615,1442,4648,754,3584,1326, 1673,858,
1795,4291,2274,1384,2597,1563,4366,478,3083,2586,
5126,2435,968,1135,383,2356,226 4,1355,4737,910,2464,
2319,5137,2327,1238,815,2206,2385,1333,4619,976,4371,
2598,2720,870,4 676,4387,3112,2166,1212,4155,1473,917,
2380,2627,1241,4265,1432,4656,4210,2588,1633,4373,1
620,3140,4252,727,1575,1674,493,1253,4183,2437,1183,
5130,2221,1444,4293,873,3202,2169,133 4,701,4212,1565,
931,2601,2247,1797,4266,1634,2832,2227,1681,1357,756,
2276,6160,2386,1143, 860,499,4157,2360,3091,5138,2752,
4627,731,3085,2438,1624,2222,4621,1363,4738,823,2602,
262 9,1242,4377,4374,3120,922,2441,1392,4622,1676,
4273,874,2331,1254,4389,1415,918,4484,2170, 1337,5248,
2496,1474,4187,502,2401,1566,933,4680,1358,4865,2609,
1257,4294,1579,3086,2251,1 798,1199,1147,743,2111,
6176,2388,1682,4268,760,4216,2442,3144,1636,1365,
4297,881,3329,257 5,1801,2630,494,1244,4432,2604,2229,
2343,1338,4158,702,3093,921,2333,4378,1448,501,876,22
80,2172,1419,4239,5132,847,2253,1697,5153,2230,1607,
4199,992,4274,2691,1379,447,4390,4189, 3204,5185,2610,
1311,4740,1207,2334,1258,2633,1149,4298,1581,733,
6147,2347,1684,4688,1640, 4419,2402,1366,1340,4488,
827,3107,6149,1265,2259,934,1802,4393,2449,3330,2233,
1587,4866, 882,3098,937,2444,2392,963,1369,4203,747,
2634,2693,1476,4276,1421,3585,505,2641,5140,2583,
1427,855,924,4247,2288,1231,4305,734,4380,829,3152,
5376,2254,1698,4744,1582,2143,1809,23 75,1456,4190,
4300,2612,2848,1381,4394,1211,4496,2450,1260,1688,
4704,965,6208,2404,1648,51 54,2355,1611,4448,2349,
2465,1804,4421,938,4629,3109,884,2261,506,4251,1729,
4306,3097,2616, 1150,4401,1266,3094,749,2880,6153,
1589,1422,945,966,4643,2636,3208,1370,4396,1480,
4205,7 55,3332,5144,2234,1382,859,1429,4280,2694,1327,
2452,1593,4630,940,3336,2275,5156,2944,463 3,1268,830,
2642,2466,1619,4211,911,2350,2697,1213,5127,2819,
1590,4263,2408,2587,1700,4321, 871,4422,6150,2159,639,
4402,1385,4868,3110,2379,1730,4253,1613,3586,888,
6161,2262,1239,4 752,1810,4425,479,4206,2357,1671,
4213,1372,3168,4308,946,3139,1443,1430,750,1488,4267,
223 6,1704,5249,2497,1825,4872,969,3113,2265,5186,
2456,508,1386,861,2657,2644,1614,4426,1433, 2599,2698,
5632,2277,1594,757,2207,6154,2468,1812,4322,970,4645,
2358,3216,5131,2589,4634,4 483,3100,2821,1621,2658,
4404,1596,4312,919,2705,2381,1243,4512,1335,4367,
3141,4375,2167,1 732,4254,1622,3114,4433,875,6162,
1625,4646,1675,862,1445,4768,2648,1816,5160,2387,
1826,42 14,758,3588,2266,1635,948,4428,1626,4675,2416,
2700,1434,4636,1255,3121,2278,5188,2439,171 2,1677,
977,2361,6272,2498,1272,4485,923,4269,2590,3146,5250,
2382,1393,4217,972,3344,2281, 1214,2603,4649,1388,
4295,2822,2223,2171,1678,4880,4275,3232,761,2706,
4324,1683,4434,877,2 660,2389,1359,4408,1504,5139,
4800,2825,1339,5133,2268,1245,4486,952,4270,2362,
1394,495,46 50,1637,4677,3592,5168,2472,1446,4489,
1449,3360,2443,1475,6156,1638,4379,1567,703,2721,61
77,2631,1259,4218,1436,4544,2403,3600,1367,1396,4449,
935,3264,6209,2335,1799,2231,978,134 1,4657,2282,3616,
2173,5134,2605,4299,883,3142,762,2708,2664,4159,1246,
4436,503,2390,2364, 1450,4490,5192,3116,925,2289,1477, 5377,2826,1261,4623,878,4678,2611,1583,4652,735,4277,43 91,3203,5141,2393,1857,4381,1828,2500,1736,2445,1858,4328,1685,4220,6164,2451,1832,4301,1 803,3153,4278,2255,1641,1628,4739,993,3122,6400,2722,1457,5252,2606,1744,4658,2833,3145,2 480,1840,4382,885,4681,3087,939,2405,2235,994,1860,4395,3392,2284,2712,1371,4450,1921,320 5,980,2672,6178,5155,2635,1267,926,764,4307,2828,3124,1686,4497,5378,4281,941,3095,5146,2 753,1478,4492,1342,4440,2174,1699,2290,1642,4682,4741,3206,2613,5633,2446,1922,4689,1805, 4631,2394,2504,1400,4336,1452,967,6168,2406,1689,5200,2453,1760,4302,2351,2617,1591,4191, 886,4423,3456,6180,2292,831,4660,1864,4896,3148,3209,2643,1649,4498,1262,3154,947,2237,61 51,2614,1383,1481,4452,507,4403,2724,3128,1423,4397,1811,3099,4513,889,3169,5157,2409,161 5,984,1702,4309,2754,1458,5145,2637,1701,4664,751,3111,2263,5142,2834,4928,1373,942,2695,2396,1269,4684,5256,2467,2454,1482,5380,2512,1690,4282,2728,6273,2849,1644,4742,996,4500, 6210,3331,5384,2410,4323,1387,4992,3156,2638,1151,2457,4690,1215,4514,3210,971,6656,2618, 1806,4398,1431,4745,3217,4867,2836,1460,4456,1650,3333,4635,890,3101,6155,1595,1489,509,1 705,4207,2645,3115,1270,5158,2620,1731,4427,949,3170,2267,5634,2359,973,1374,4310,2756,26 46,1623,4405,1692,3587,2649,5216,2699,5187,2469,1814,1000,2840,6184,2850,1484,4284,892,4545,2659,3160,5161,2650,1273,4313,4504,3212,2458,1706,2279,4705,1597,4692,6212,2736,2701,1 435,4647,1827,4746,3102,4325,2296,4255,1813,3218,4516,950,6274,2417,1733,4406,1389,5264,1 464,4637,2238,1652,5148,2412,1713,4869,863,4706,3143,2702,1398,759,4753,1447,4429,3334,51 89,2707,1490,4215,1817,3337,2383,5162,2528,6163,1274,1395,1008,2363,6157,2269,1505,4696,1598,4435,2418,3233,5636,2661,1437,4314,510,3648,6192,2470,1627,2473,4464,1390,4748,2499,3 117,2662,5169,2591,4326,4487,3172,979,2283,2460,4409,1492,4546,953,2391,2420,1679,4638,19 24,5194,3712,4430,2823,1829,5392,2365,1639,4329,763,4651,6158,1708,4870,974,4271,1734,421 9,3123,5280,2270,1453,4754,1818,3220,2474,1276,6216,1397,4708,1629,4437,2501,6401,2285,1872,4873,1714,3118,4316,2607,3147,1737,1656,4410,954,3338,6165,2881,1506,5640,2852,1830,45 20,2760,3345,2882,5408,2709,4491,879,3589,981,2856,2827,4769,1451,4679,3176,2665,2652,192 8,4451,5648,3234,982,2481,6276,5312,2768,1438,4383,927,4279,2864,3125,1247,4330,5664,4221, 4653,3265,5190,2884,1687,4756,1716,4712,2395,1859,2945,1643,4438,1496,4412,3224,6179,5164,2291,1479,4337,1820,3149,4874,2710,6402,1833,4659,1738,995,3236,6170,2502,1745,5251,236 6,1861,4441,2723,3840,2666,1740,4548,765,4493,3340,6657,2946,2829,956,1888,4499,3346,3590, 2424,5201,2476,4303,1834,3126,887,2713,6224,2784,5170,1630,4770,985,4654,2615,3155,1936, 4881,5193,3129,4528,997,3593,5135,2888,1746,4453,1720,4283,2673,1401,5440,2286,1459,4332, 4760,3184,2407,5253,2505,4720,1841,4683,2447,2835,1343,4876,1645,5172,6181,2639,1836,514 3,2726,1508,4801,2482,6169,2725,1454,4222,986,4338,3207,6166,3150,5254,2397,4661,1862,449 4,3361,3266,2293,1691,6280,4442,1512,4552,3157,943,2506,6404,2714,1263,1402,4454,3348,450 1,2668,3594,1483,4399,1646,3130,4665,891,3240,6408,5504,2411,1651,998,1461,4340,2175,3211, 1404,5196,2239,5257,4691,766,3171,2830,5202,2455,4285,1842,4662,2484,2674,1485,4772,5176,3158,2619,5147,2513,1520,5217,2729,1693,4457,2294,6182,2755,1703,4802,511,4685,6658,3132, 5159,2398,1748,4311,4882,3352,2647,1865,2716,4743,1653,4444,3161,6240,6211,2838,1375,451 5,1491,4502,3362,3601, 4560,2508,4776,1462,3596,4897,988,3268,6185,2297,1761,1275,5379,148 6,4458,2730,3213,1466,5204,2621,1465,4686,1001,4505,3173,2459,5258,2851,951,1493,4666,321 9,5265,2837,1271,4884,1707,3248,2757,5381,2413,6288,5149,2488,1866,1002,2676,6172,2737,1762,4693,5163,4668,2422,3214,5218,2471,1923,4315,4407,3602,6213,2514,1694,2841,4804,1807,4 694,6186,3393,2298,5635,2419,4697,1873,4747,3103,4517,2529,2622,4888,1844,4898,3272,893,6 660,2461,1752,4707,1952,5208,3162,4698,2651,1815,5260,2414,1391,4506,975,4327,3617,6193,1 925,894,4784,1654,4749,3364,3394,5150,2516,1709,4344,1868,3604,2703,5266,2948,6218,1657,1 735,4465,2853,6416,2663,1277,4286,1715,3335,4460,2732,3221,5191,2758,1848,4750,1009,3174, 6304,2477,1926,5382,2842,1710,4755,2300,3177,2421,5385,2653,4431,4576,3376,955,2896,2738, 4411,1764,4317,7168,2761,2680,1874,4466,1399,5281,3368,4709,2530,6664,5696,2854,1468,451 8,1004,4521,6432,3235,1494,4547,5165,4710,1507,4639,3164,5220,2475,1439,4331,1509,4508,31 19,2952,1929,6672,1819,4439,1497,4468,3339,6336,5760,2462,1658,4871,1768,3457,4413,2271,3618,6688,1876,1984,1010,3396,6214,2711,1889,5171,2740,1717,4318,2883,3280,2667,5268,2520, 4522,957,3458,6188,2503,2844,4549,1821,4333,3222,3225,2857,5166,2762,4655,5195,3237,983,2 769,6275,2885,5386,1930,4929,958,4900,2764,3178,1739,4808,5393,3127,4930,4757,3400,5637,2 912,1831,4904,1498,4875,6225,1660,5224,2858,1718,4713,1278,4700,3608,6194,5282,2654,4529, 1741,3649,4816,2960,6217,1599,4912,1937,5173,3620,6159,2770,1822,5313,2744,1835,4932,2425,6464,3185,2483,1403,4443,987,4993,3226,6277,3151,5272,2865,1721,4339,3341,3180,2367,519 7,2669,6196,4758,1455,3650,1012,2860,6167,2532,5284,1631,4550,3296,4414,2478,3238,1513,47 71,5888,3591,4714,999,3624,6278,5388,2886,1890,4994,1747,4877,2715,3267,1510,5394,2536,56 38,4472,4524,3342,2287,5174,2426,4761,1932,4832,2507,2670,1742,4663,1837,5203,3713,6528,5 177,2675,1500,5641,2485,1880,4936,2428,6220,6281,1863,4721,1016,4334,3595,6226,3347,5232, 2866,1749,4455,4553,3652,3363,2509,1722,6200,4495,1938,4883,3131,6171,2544,6241,2717,177 6,1892,4687,3241,3632,4774,2727,3186,4530,1843,3349,4773,767,3228,6183,2772,5255,1838,519 8,1463,4445,2889,3159,1953,5409,2677,5314,4341,989,3269,2399,5205,2515,4554,1514,4762,318 8,5396,2486,1647,4716,5642,3242,2785,5178,2299,6403,5288,2510,1695,4459,2490,6228,2489,1763,4223,5259,4287,6282,3133,5219,2517,1940,4878,4503,3603,6289,2295,1487,2731,4532,1867,4 722,3597,6405,3714,6173,5206,2890,4667,1405,4561,3353,3350,4777,2786,6187,4342,1521,4803, 3598,1003,3249,6242,2947,1954,1845,5180,3365,4446,2718,3460,1750,5400,2831,1985,4695,990, 4,764,3163,6659,5209,2897,1005,1896,4886,3656,3841,5410,2868,5649,4556,1516,3270,2776,5644,2976,6232,5316,1655,4345,2839,6284,2415,1753,4778,5261,3244,4669,2949,3192,5221,2678,17 24,4507,4899,3273,6174,2733,1467,5267,2892,1765,4885,6290,3408,2681,5296,2759,4805,4461,3 134,4536,2301,2739,4724,1869,4785,3354,7169,6215,2872,1944,4470,1406,5262,3215,4519,2950, 6406,5650,2734,1846,4562,959,4889,3175,6409,3250,1875,5441,4346,1754,4467,3366,3165,5151, 2788,1522,4577,1904,4670,3716,2898,5320,2423,6305,1766,1469,4509,3274,6720,5210,2492,149 5,4699,1659,3664,4462,2518,3395,6189,5665,2531,1956,1011,3464,6244,2463,1711,5412,2533,54 42,4564,2953,3369,2843,5652,2521,4751,4996,3842,6784,2682,2792,4901,1927,4711,7170,3179,2 900,5383,3008,4780,1849,5269,3252,4806,2913,6195,2741,5222,1524,4525,1013,4890, 6292,3223, 1870,4348,5225,3281,4469,4701,3356,5424,2845,1769,4944,1850,4786,3720,6190,1756,6219,1470,4809,1986,4728,3166,3276,6410,5416,2954,4578,1960,3370,4902,2763,3472,6417,1499,1877,52 83,3680,6661,2855,1891,5212,2522,1661,4523,2684,6248,3424,2742,5167,2302,5000,895,3397,63 06,3605,5387,2765,1931,4510,3227,3282,2623,5505,2961,6197,4319,5666,3377,1006,2846,6337,2 859,5444,1511,4759,7172,4788,2427,3619,1719,4931,5328,3372,4715,4568,3181,6296,5506,2745, 1770,4551,1852,4892,6221,3256,1777,5270,2479,5273,4905,1878,4810,3606,6308,5285,2655,481 7,1881,4933,3609,2537,6912,1528,4812,1823,5226,3187,6412,5175,2914,1279,5448,2771,1988,49 60,2534,6418,3239,6662,1933,1014,4906,3297,6198,3398,5656,2956,1743,4702,3378,3844,2766,5 697,2861,6227,5008,1501,3229,6201,2524,6665,2904,5668,1939,4818,3728,3401,4792,2887,3182, 4473,5233,3189,4531,1017,3284,6256,2773,5274,1662,5199,1772,4913,2746,3243,1968,5389,2962,5228,4415,4717,3848,2800,5698,2916,4908,1893,4580,7176,5344,2867,1515,4526,1723,5286,34 02,6279,5639,2862,6222,5672,2487,1778,4934,2977,6433,6338,1882,4763,5315,4584,3298,6229,3 621,5390,2538,1502,4335,4474,3610,6420,3459,2671,1992,6666,4555,1407,4718,3380,6202,3288, 6312,5761,2719,1934,4723,3488,3343,4533,2787,3351,6283,4476,1839,3230,1018,3409,6243,2964,5643,2000,5395,3622,4914,2511,3744,1894,5700,2891,5411,4557,991,3190,6230,5179,2429,459 2,1941,4765,3404,3651,5289,2545,5680,4775,5234,3612,2978,5397,2869,6204,5276,1751,4820,27 74,6424,3009,1517,4937,5207,3461,4725,6233,3245,5317,2920,1897,4447,4563,3193,6434,6673,1 725,5236,2540,1955,4534,3625,6668,3271,6340,5290,2679,4833,4347,3856,3251,4558,2777,6285, 4538,1780,4537,3300,7184,3410,6245,2748,1884,1523,5181,3384,4565,2491,6291,3776,5651,278 9,1755,4343,1020,4779,3462,6320,3246,5645,5762,1847,4938,3626,3653,5401,2893,5398,4834,19 46,3465,2968,5646,2430,6286,5297,1898,4995,3355,6674,5413,2870,1942,4766,5508,3194,4879,2 899,3520,6465,5211,2778,1526,4945,3425,6175,2546,1957,5704,2928,5889,4916,6344,3633,2790, 5318,2493,4824,5024,3275,6234,2519,2683,4887,1767,4463,3135,7200,3412,6689,5292,2980,4997,1784,5240,3466,4726,2735,6436,6466,5321,1905,4781,1007,4940,3599,6676,3654,1518,5456,36 28,4729,4807,3253,3367,5182,2951,1726,4349,1945,4787,3357,6407,5402,2873,6293,1525,1900,4 920,3304,3196,6246,5263,2548,4998,1871,3277,4782,2894,3254,6249,5223,2016,5298,3715,6448, 2793,1471,5414,2874,5213,4836,2780,3634,2494,5764,3010,4946,4471,3358,6440,3657,5322,2984,1757,4540,7171,3371,2523,5712,2901,6307,4566,5443,3426,4579,2915,6236,2685,5512,1851,45 11,7173,4581,6191,3283,1958,5001,5417,3473,4891,4569,3257,6411,5890,2955,1906,4730,1961,4 840,3468,6529,3416,1987,6690,5227,4948,1771,5056,3658,3717,6468,5300,2535,4961,1529,4789, 3665,2743,3607,6352,1879,1948,5271,3312,6530,5329,2794,1758,5404,2876,1853,4893,2801,6294,3278,6297,5768,2902,1015,3167,6309,3399,5214,2905,5324,5002,3636,3872,2552,5418,2847,62 50,4811,5520,3474,6199,2303,6472,3012,5728,1989,4903,7232,3428,4570,2957,3379,4732,5472,3 373,4790,4350,3489,6680,2767,5445,1962,5653,1908,4813,6721,3285,1530,5275,2525,5330,4671, 5009,3640,6692,5425,2963,4894,1773,4907,3904,7177,6257,1969,4475,1990,5667,3660,6298,5420,2686,6223,5229,2796,1779,4793,2992,6413,3258,6252,1883,5304,4527,3718,6722,3476,5654,29 17,1964,4703,3299,6368,3968,2539,5657,2747,6310,4585,1854,3666,6663,3490,6696,5235,2802,1 935,4962,3374,3721,4819,2906,3843,6339,4582,5287,3432,1019,3611,6414,2526, 5345,1895,5446, 7174,5004,3016,3183,1663,5426,2431,5892,4814,4909,3403,6785,5277,2958,4572,1912,4952,7185,3286,5776,2863,5449,4935,1503,5230,3381,6667,5237,3024,6419,5332,1970,4821,2918,6724,64 35,1774,4794,5291,3260,5010,6203,3521,5896,2965,1993,4848,4964,3289,6313,3480,6704,1532,6 258,1885,4915,3681,6421,3668,6300,5450,2775,4910,3623,3722,4535,2541,3301,6231,5025,1781, 3231,7178,3492,6341,2921,5346,1994,5669,3382,4586,2749,6260,3613,5658,2979,5507,4719,1021,3845,6314,3682,5428,5336,1943,4767,3729,3405,5536,2804,5391,4835,5399,3191,2908,5278,25 47,6205,5457,1899,5012,7186,6675,5670,2779,1886,4559,5792,3672,4939,6669,3411,6786,5238,2 871,1782,4477,3290,6425,6422,1972,5452,2970,5699,4593,3440,6670,3724,6321,5660,2922,5026, 4917,3302,6437,3463,2966,6532,4822,2001,5057,3385,7296,3522,6235,5509,2550,1947,5293,3614,4968,2981,6728,3406,6913,5241,1996,1022,4588,3305,6342,3627,5673,5319,3846,4727,3247,31 95,5904,2791,5299,4825,1785,3730,6316,5348,2808,6264,5458,1901,4796,3684,3413,6345,5432,2 929,4539,5824,3849,4837,2542,3292,6480,5510,1976,5294,3386,6206,2750,1519,5674,2969,5701, 4941,6426,3496,2549,5513,2924,5016,4478,3467,6287,7180,5403,2895,1727,4918,3745,7201,3655,6247,5242,3040,6322,4947,5568,3427,4826,2495,6438,6237,5473,1959,4594,7233,4976,3359,67 88,3255,2002,5681,3306,4838,4541,3197,6346,3629,5323,2781,1907,4567,1786,4731,3732,6736,3 688,5183,6467,5460,1527,5028,3414,3388,6536,5514,2875,4783,1949,3313,2982,3850,6441,5647, 1902,5702,3635,6914,5676,2930,1759,5301,2985,5415,4999,3011,3417,6251,5405,2795,4921,3524,6324,3469,5352,2553,5244,4596,7188,3475,2903,5325,2972,6295,4942,5302,3279,6353,2782,64 28,2877,5763,2017,4841,7424,3746,4922,6792,3630,4828,5682,3857,4542,5058,3504,6238,6348,5 406,1909,5705,1963,5032,3429,6442,3259,2018,6544,5419,4571,4949,3308,3736,6752,5474,3013, 4963,2004,4733,3696,7202,3659,6496,1950,1788,5331,3852,6469,5521,2986,6677,5305,2932,1965,5003,2554,6299,3777,6354,5516,5464,3198,6449,3314,5706,2797,5765,4583,3637,3470,2993,57 13,3014,6691,4791,5655,3418,6444,3528,6253,5360,2803,1991,4842,7192,3430,4924,2907,3477,6 328,4849,5326,3375,4950,3641,6678,2988,5215,1910,5447,7204,4953,6681,3316,1855,5684,2878, 5920,4600,4895,3667,6259,5522,2959,4351,1971,5060,3261,7175,3638,6311,5476,5005,1531,5427,3748,6369,5421,2919,6470,5537,1913,4815,2687,6450,3433,6916,2008,5333,3778,4573,6301,36 61,5688,2936,1775,5011,3287,6800,3858,6473,5952,2527,6254,1966,3719,6261,3420,6356,5708,2 994,4734,3491,3478,4844,2798,3536,6315,5040,5306,3752,7297,3873,6920,3017,5766,2020,5524, 7234,4965,2556,3434,5347,2909,6016,4587,4795,3662,6474,3481,5714,5538,1995,4850,7680,3642,5422,2805,5769,4954,5891,3860,6370,5480,3018,6693,5659,1914,4574,7179,6682,6531,1533,50 64,5231,3669,4479,6452,3644,6360,5451,2967,1973,5006,3291,6560,3383,6415,1997,6423,5334,4 911,3780,6302,3670,6481,5429,2923,5072,3673,6694,3723,2910,3493,6816,4966,2024,3864,7208, 3874,6262,5308,2806,1916,5569,3683,5013,2996,6476,3674,6723,5337,5528,1023,3482,6684,3303,5729,5716,7236,4823,3760,3725,5671,3025,5770,4589,5349,3320,6533,5279,2971,6317,5540,19 74,4969,7298,3441,6265,5430,3020,4797,5661,3262,5027,6697,3436,6343,5893,1887,5730,3726,6 928,6323,1783,5777,2809,5453,4852,6372,3731,6482,5239,2925,4956,4595,3407,6456,3552,7187, 6848,2032,4827,3387,7181,3293,6534,5720,3000,6318,5459,3442,4919,2543,6698,3685,6725,5338,1534,7216,5018,3494,6537,3497,5488,5772,3523,4970,3686,6427,3615,5350,2751,5511,5014,20 03,3307,6266, 3484,5433,6592,5570,1977,4598,3415,3444,6497,5662,2983,5029,5454,3847,3026,3 389,6705,5353,1787,5675,7182,6347,5894,2931,1998,5295,2810,5243,4839,6207,3294,6484,5778, 2551,4856,3498,6538,7240,5732,2973,5461,4977,3525,7425,3309,6671,5897,2926,6726,4590,5340,3631,6700,2783,6325,6439,5434,1978,4798,7189,3905,5017,6429,3876,5544,3784,4597,4972,39 06,6376,3733,6268,5515,1903,2005,4943,3880,6349,3851,5793,6326,5703,5088,3689,3676,6787,5 475,3041,4543,2006,3505,7300,3792,6706,5407,1951,5303,3888,6430,5354,2933,6729,5245,2987, 5677,4829,3042,3908,6443,5780,5736,3419,6498,3969,5462,3028,5436,4923,7203,3315,2974,5361,2812,6355,5030,5898,3734,6545,7426,6329,5683,2989,2019,4978,7194,3526,5033,6540,3390,64 88,5059,5465,3747,4843,3690,6730,6789,5572,1789,5517,7681,4601,3970,6737,3853,1980,6679,5 523,4951,5020,3448,6384,3500,5327,3015,4830,1911,4925,3737,7248,3808,6350,5794,2009,5678, 3639,6239,5905,2934,6471,5552,2021,2879,6708,3912,6944,5477,5307,3697,6546,3310,5356,2995,5784,5061,3431,3529,6500,5744,2555,6451,5707,3471,6445,3859,6561,5900,2937,5034,7205,36 63,4980,3032,3750,6357,4602,5825,3506,7193,3749,6712,2799,5246,2010,5362,7190,4845,6976,3 421,5685,2990,5518,5041,5062,3317,6732,7304,5466,5576,1967,4851,3530,7428,3738,6330,5478, 4955,5525,3692,6790,5423,3044,6548,5689,1915,5036,7432,6371,3435,7040,2022,5364,3199,4926,6738,3263,6562,5715,3019,1790,5007,3854,6446,3479,6793,5309,6915,5686,3508,6504,3698,66 83,5796,2938,4967,3643,3537,2557,3753,6255,4735,5481,3318,7206,3779,6475,5826,2997,1535,5 709,7682,4984,3021,3422,6358,5335,5906,4575,3671,6453,3740,5767,5468,7264,5042,7235,3862, 5539,3048,5526,4846,5584,3532,6332,5800,2940,6593,5921,2012,5065,7209,3321,6361,6552,4604,5482,3754,4957,6753,3645,6740,5710,2025,5529,3483,6695,3875,6794,1975,6373,5690,4853,63 03,3861,6564,5908,2998,5066,3781,6454,3437,7312,3512,6685,2026,3700,7196,3761,6917,5717,2 911,6754,5692,3446,5015,2807,6801,3495,6477,5339,5431,7237,3538,6263,3865,5828,5718,7210, 4971,3322,3443,5721,3056,5771,4958,5541,3553,6744,3646,5912,6483,5922,1917,4854,7684,3485,6362,5731,2558,5044,5722,3675,6512,3438,6796,5530,1999,5351,7217,6374,6535,1918,5808,30 27,5773,5073,6457,3540,6594,5368,3001,5019,3727,6686,3972,7242,6478,5489,5068,3877,7440,3 687,6377,5310,2811,6699,5484,3756,6918,3022,6319,3782,6267,5774,2033,7328,3501,4857,6802, 3866,5779,3324,4973,3445,6756,3677,6485,5455,5600,1979,3920,6921,3762,5435,6364,5341,5048,3785,3704,6458,5490,3002,4591,5733,3554,7688,3878,6568,5542,2028,5545,7456,6539,5571,29 27,5734,3029,5663,4799,6817,3499,6727,5355,5532,3976,6499,7696,5463,3030,5492,5031,7360,3 486,6431,5895,2975,6327,5074,5437,3295,6378,7712,6269,6701,2034,4979,7238,3735,4858,6804, 3764,6760,5342,3907,4599,3691,6486,3544,6460,5546,1981,7212,5021,3527,6385,3868,5573,6922,5357,4974,3881,6707,3786,5679,3043,4831,2007,3793,7299,3909,6489,5953,1982,5924,3788,65 96,5832,2813,6541,5954,5781,3004,3936,6547,5928,5899,7249,6351,3882,5737,2935,5724,5089,7 218,3678,6818,5553,3033,6702,5840,3984,6929,7241,6576,5936,3045,4981,7183,3794,5035,6501, 3768,6331,5090,5956,3449,7488,3507,6380,6808,5467,2011,6017,7301,5076,6768,3889,6731,5363,5022,4860,3391,6924,3693,7220,5782,2036,5037,3884,7191,3556,6849,5574,5438,3502,6270,57 95,3034,6386,5738,2023,7302,6709,3910,6542,6018,5901,3739,6490,3560,6600,5496,2991,5548,5 063,3311,3450,6502,5785,6549,5856,3531,6447,3694,6713,5687,2939,4982,7552,3699,3046,3509, 6388,4927,5960,3452,7244,7305,6739,5745,2814,2040,5358,7250,5043,6333,3890,6710,5479,5577,4603,3533,6820,7224,5519,5907,7195,4985,3568,7265,3741,6505,5711,5080,5798,3751,6850,55 54,2559,6733,5797,1791,4847,7207,3796,6359,6930,5469,3913,5038,6791,3701,6492,5365,2013,3 423,6563,3539,6550,5578,6608,5786,6824,3510,6945,5740,3036,5092,3809,3323,7427,3534,6506, 5483,3514,7252,3513,6734,5247,3049,6553,5311,7306,5067,2999,3541,6714,5902,5527,7313,3319,6932,3755,5556,5746,7429,4986,7197,3914,5691,3050,5585,4605,5801,3810,6741,7211,5366,67 16,5827,2027,5045,7266,3971,6363,6455,5069,5470,3742,6852,3855,6742,5719,2014,5788,7683,6 745,3921,6795,2029,6565,5910,5096,6936,3892,6946,5580,2941,4988,3800,6755,4000,7256,6746, 5369,3863,7308,3439,6554,5802,3023,6375,5693,3973,2942,6832,3702,6797,5531,5923,7198,3757,6392,3916,5909,7314,5046,3705,3783,6513,5829,5485,5560,3325,6334,3763,5748,6508,5809,49 59,7239,3896,6798,5494,3057,4855,5543,3974,7430,3758,6803,5586,1983,5913,7433,6479,6624,5 370,3003,5491,5104,6459,3812,6365,5601,5694,3922,6514,3447,7329,6757,5533,4606,7744,3516, 6566,5723,3052,6569,5486,3542,6595,7213,6758,3555,6687,2035,7268,3487,5075,6379,3557,6556,5588,3977,5049,3867,6487,3545,6516,5775,6020,7808,3706,6919,3816,5925,6461,5735,4859,39 24,4032,5804,3058,5070,5830,3937,7219,3765,6366,5549,2037,5914,7316,6570,5372,3005,5493,5 725,6597,3869,6381,5968,5810,7214,6703,7243,5833,3031,5752,5050,7434,3978,6977,5602,3006, 6948,5926,3787,6856,7441,6978,6805,4975,7685,3879,5077,6952,3546,6923,5547,3708,7272,3766,6761,3326,6748,6024,1919,7330,5078,6577,3789,6864,5534,5023,3647,6960,3985,7221,5343,20 30,3870,7361,3883,6980,5783,5812,3451,6491,5955,3035,7041,5739,5592,7320,3769,6387,5575,5 916,7245,6806,3503,5929,3060,5834,5091,7332,3679,6598,5841,6462,5957,3561,6819,7936,6762, 5836,3047,4861,7436,3938,7042,3795,6925,5052,5984,3558,7442,7686,6520,6572,2038,5930,7222,4983,6809,3980,6880,5726,5081,3790,6711,3885,7251,6032,7225,5093,3548,7689,3928,6984,58 42,5816,3911,6769,5497,3064,6382,5555,2041,7280,3797,6503,6601,5937,3770,6543,3986,6931,5 439,5741,3824,3940,6735,5932,6822,5604,6578,3891,6821,5550,2815,5082,7303,3886,7246,3511, 6493,5958,4001,7457,7362,6389,5787,3037,5608,7253,5039,6602,3562,6810,5359,5498,7444,3695,6764,7690,5579,5742,7226,4987,7336,3743,6507,5747,5094,5557,3811,6271,7307,5500,6335,20 42,4862,7267,3988,6926,6551,5938,3535,6580,3915,6770,5581,2015,7254,6715,3453,6609,5616,6 825,5789,6390,3569,6851,5799,3051,4607,4002,3893,7228,6494,5844,3798,7448,4033,6743,5961, 3038,6812,5749,7257,3053,3944,6934,5471,5587,7458,7697,6604,3564,5558,7692,5084,7364,3703,6393,5857,5371,5582,3801,6826,7309,5562,6717,5561,5097,7269,3772,6555,6947,5047,5589,35 15,7315,3813,6933,5367,2044,5803,7344,6853,6509,6584,5962,5098,6772,3917,6833,5858,3992,6 518,3454,7310,6567,6019,7698,3894,6610,5790,3007,6937,5903,3923,7489,6394,3802,6515,5969, 7199,3570,6625,3952,6718,5940,7368,4989,3814,3517,6557,5848,6048,7258,3543,6747,3707,5911,6510,5487,5071,7713,4004,6021,3059,4990,5750,3759,7460,7490,6612,5805,2031,5964,7700,67 99,7044,5753,5831,6949,3975,6759,5373,5811,7431,6828,3897,7317,6854,5944,5105,7270,3572,6 573,6022,3061,6938,5806,3918,6396,7273,6517,6749,7472,3817,5051,6992,3898,6834,5860,3804, 3518,6857,4034,6776,5970,5495,7464,6626,4008,6950,5564,5100,3547,3925,7331,5590,5603,3939,7260,3709,6571,5535,5605,7215,7048,6025,2943,5915,5593,7435,3979,6558,5754,5864,7553,63 67,7714,5972,3054,6080,5106,7492,3559,6807,5985,6836,5813,3767, 6979,7376,6763,6616,5053,7 554,3818,6599,3900,6940,5917,3825,7318,7321,6953,3926,6858,2039,7333,5079,6865,3929,6981, 6026,5054,3576,6860,3871,7274,5835,7223,3327,7496,4036,7008,5927,5594,3981,5756,3062,6954,5814,5374,7704,3791,6750,5837,7745,7056,3549,5695,6033,7716,3987,6866,5918,6840,5931,65 21,7281,6579,5499,3065,5083,7322,3710,7247,3820,6961,5817,4016,7437,7276,6463,6765,5551,7 746,5108,6956,3941,6628,5727,7392,3563,6574,3771,7334,5609,7687,5095,7720,3826,6982,5986, 5843,3930,6811,7363,5606,6632,2043,7438,3550,6383,6522,6028,4040,6603,3455,6766,5838,5933,7809,3982,6771,5596,6581,5976,6524,3887,5959,3066,5112,7691,4048,7443,6962,5845,3942,77 48,7459,6605,5818,3039,6034,7227,6640,3989,6813,5872,5988,7337,7728,6823,7282,5939,7445,4 863,7324,3799,6868,5934,5559,3565,6985,7255,6049,6773,5085,7365,3945,6495,6611,5610,3773, 7284,4003,6582,5743,2045,7338,6881,6395,6606,5791,6586,3828,6585,5859,3932,3571,7229,6613,6036,7699,3803,6391,5583,3068,6827,5963,7693,7810,3895,6986,5501,7449,7446,6882,3994,56 17,7694,5099,7345,3946,7043,6050,5941,7461,3990,6814,7556,5846,6927,6081,5086,7259,3574,6 993,5101,5992,4005,7752,7937,6964,2046,5612,7366,6872,7072,5751,6935,3815,6511,5849,7340, 7045,3832,7288,6774,5820,7369,3953,6829,5563,3055,6988,5861,3566,7504,6777,6855,7230,3774,6397,3993,6835,5965,7450,3573,3948,6968,6040,5502,7311,7046,3919,6830,5942,5055,7271,40 64,7346,5971,5850,3519,7462,7261,6884,5618,6000,7812,6994,6519,5862,5565,7370,3805,6588,5 591,5755,7760,6614,7491,6627,6052,5107,7560,3899,6559,5807,6629,4006,7049,7465,6939,6617, 7938,3954,6778,4009,6888,6023,4035,7275,6996,3819,7104,5945,7348,7009,3577,6837,5620,5109,3927,3996,7319,5966,7377,3806,7452,3901,6941,5865,5946,7816,5852,3063,5566,6082,7262,73 72,7050,6056,7466,6859,7568,5595,5973,7776,4037,6951,5987,6618,5757,6780,7520,6838,6398,4 991,7493,4010,7701,3956,6861,6027,3578,7323,7378,6719,7057,7473,5102,6942,3821,6955,5607, 4017,6523,4038,7715,5815,7468,7277,3827,6841,5866,5948,3931,7352,5873,6575,5974,7702,4012,6751,5977,7705,6633,3902,5624,5919,7283,3983,7010,5375,6867,6084,6630,7335,6029,3067,51 10,7393,3943,7494,7052,5839,3711,7474,7940,6862,6957,5597,7325,6620,3960,7000,6035,7824,7 497,6983,3551,7278,7285,5113,7380,4018,6869,5758,5868,3822,6842,7339,6064,7058,7944,4041, 6896,7012,5989,3580,3933,6963,5611,5819,7498,6958,6583,5874,7073,3829,5978,7394,4042,7717,6634,5598,7706,7555,6767,6088,3069,5503,7476,7384,3991,6815,6030,7584,7439,6883,7447,59 35,7326,5114,7505,3947,7060,6096,7718,3934,6607,7840,5990,6987,5087,7286,3830,6525,6037,4 020,7500,7747,6641,2047,7708,7074,6965,5847,6870,4049,7105,5613,7557,3995,7341,7016,5993, 7289,4044,5821,3070,6636,6051,7721,7367,6775,7952,7347,6873,3833,5876,7396,7506,3949,6844,5980,5619,7480,6587,7872,6885,5851,5116,7558,4024,7342,5943,3567,7722,7749,6989,6042,75 61,7064,6526,5994,7451,3775,6966,6038,7290,6995,7616,6874,5622,7521,4007,6642,6053,7024,4 050,7729,6886,6589,7371,3955,6615,3834,6779,5863,7231,7508,3575,7076,5880,7562,6831,3997, 6001,5103,7695,3950,7750,5614,7724,3807,7349,7463,7047,5822,6041,7453,6969,5621,5996,7400,7292,6644,5967,7373,6990,7350,6112,7811,4065,6889,5567,6970,6876,7730,6590,7106,7454,39 57,7753,4011,7080,5853,4066,7467,6619,6997,7522,7011,4052,6781,5947,3998,3836,7379,6054,7 569,7353,4013,7051,6002,6057,7564,7512,6083,5867,7754,7813,6631,5625,7761,6839,7703,5975, 6044,7408,4039,6890,5854,6972,5949,6897,7374,6998,5111,7263,3958,7495,7001,3903,7732,7968,6648,6943,7570,6399,4019,7108,6085,7524,7053,3579,7475,7469,7585,3961,6863,6058,6004,40 56,7381,5626,6621,7736,3823,7059,5869,8000,4014,6065,6086,7756,6782,6892,5875,7088,7354,5 979,7814,4068,7572,7013,6060,7395,8064,6635,6843,5950,7762,7586,4043,6898,6031,7470,7817, 7002,7939,7528,5115,7707,3962,6622,5991,3581,7112,7279,5759,6527,7499,4021,7054,6008,4045,7382,6959,5599,7477,7120,6066,7014,4072,5870,7356,3964,7617,7061,6089,7385,7576,5628,30 71,5981,7777,7764,6871,7719,7818,6637,7397,5877,7327,7588,4022,7017,6090,7478,6845,7709,7 075,5117,7941,3935,7778,6039,3831,7825,7501,6900,7287,7004,6643,5995,4080,6875,5982,7768, 7507,6967,5878,7386,3582,6068,7066,7536,7820,7018,7398,7559,7062,4051,6097,7481,7618,4025,6646,6043,7710,7077,7502,6092,5118,7401,3835,7723,7942,4046,7343,7291,6887,5881,7826,69 04,5997,7780,7509,7025,7945,6638,7388,6072,7482,4026,6846,5615,7065,7592,6645,7020,7563,3 951,4053,6991,5823,7841,7751,7136,7523,6591,4054,6055,7455,3999,7351,6098,7402,7293,7725, 6877,6003,5882,7828,7784,5623,7510,7484,6971,6045,7409,7078,7946,5998,7731,4067,7026,5855,7081,7107,7513,6891,7620,3837,7565,6649,4028,7571,6999,7068,7375,6878,3959,6973,6113,78 42,4057,7726,7953,7600,4069,6005,6059,7525,7355,6114,7404,7832,7109,6100,7792,7755,6046,5 884,7948,7082,7028,6061,6650,7873,7294,4058,7410,6893,7733,7566,7089,7110,7514,7624,4015, 6899,6087,7526,7003,7573,7471,7737,3963,7084,6006,4070,7412,5951,6974,7763,3838,7055,6067,7357,7734,5627,7844,7015,6009,6783,7529,6104,7874,3583,7757,7032,5871,7383,7954,6623,60 62,7815,7516,7090,7587,7574,6894,7632,7848,7969,4060,7113,6116,6652,7530,7005,7758,4073,7 577,6091,4023,7738,6901,7956,7114,6010,4074,5629,7765,7740,7063,6069,7387,7479,6093,7876, 7766,7019,7769,7819,7006,7589,6120,7960,7970,3965,6902,6012,7779,7092,7770,5119,7578,4047,7399,3966,7856,7821,7121,7416,7067,6070,7537,7116,7358,7532,5983,7822,4081,5879,6905,78 27,7021,7503,7648,4027,6128,7483,7389,7096,7538,6639,7781,5630,7590,4076,7593,7619,7782,7 711,6847,6099,7403,7580,6073,7511,7540,7079,7943,7122,7485,5883,4082,7027,6094,6906,7390, 6647,7594,4029,7069,7621,7405,7022,7727,6879,4055,6074,8001,4030,7972,7880,8002,7829,5999,6101,7976,7947,7785,7772,7137,6102,7601,7888,6047,7984,7029,7083,7138,8004,7515,4059,80 65,7124,7411,7070,6908,7830,4084,7085,6115,7622,7486,7843,7786,4071,5885,8066,7949,6076,7 544,7596,7111,6007,7833,7904,6105,7735,7030,6117,6975,8008,7793,4088,7406,7091,7527,7625, 6651,7567,7955,7033,7759,7128,7846,7602,7845,3839,6895,6106,7517,7086,7413,4061,6063,7626,7834,7788,7140,6011,7531,6118,7295,7359,7115,5886,7950,7575,7604,7794,7034,7739,7633,66 53,7849,7414,7875,4075,7093,5631,7117,7518,7767,4062,7836,4077,7958,7144,7628,7036,6108,7 417,7850,7741,6121,7579,7971,6071,7957,7094,7877,7533,7608,6122,7796,7857,7007,7542,6903, 7591,7634,4031,7961,7418,7539,7152,7649,7742,6013,7581,6654,7771,7534,6095,4083,6014,7123,7636,7097,7823,8068,7973,7783,6907,7852,7118,7878,6129,7597,4085,7962,7420,7541,7773,60 75,8016,7858,7881,7800,7098,7650,7974,6124,7023,7125,7595,8072,3967,7126,7582,7071,7391,4 078,6130,7831,7860,8003,7787,7640,6077,7623,7964,7977,7882,7139,6103,7889,8005,6078,7884, 6909,7100,8032,4086,7978,7031,7774,7129,8080,7141,7890,7864,7545,7603,4089,6107,7985,7487,7789,6132,7980,7652,7598,7130,6119,8006,7835,7656,7087,7407,7546,7627,7790,7035,7795,71 42,7605,7548,4090,6910,6136,7986,7629,4063,7664,7837,7847,6655,5887,7892,8009,7797,6109,7 519,7635,7606,7132,7905, 7419,7630,7610,7609,7145,7095,7637,7415,4092,7851,8010,7146,7906, 6123,8067,7838,7951,6110,8017,6125,7988,7037,7896,8096,7959,7535,7119,8069,7038,7798,7853,4079,8012,7801,7879,7421,7859,7992,7153,8070,7854,6079,7099,7908,8018,7543,7612,7148,76 38,7651,6131,7583,7653,8073,7963,7641,7802,7912,8020,8128,7154,8033,7861,6133,7101,7965,4 087,7127,8074,7102,7883,7975,7642,7804,7862,7422,6015,7885,7743,8081,6126,7966,7979,7547, 7131,7865,7599,7156,7775,7657,7143,8034,7891,7654,4091,6134,8076,7886,7981,7644,8024,8007,7160,6137,7893,7866,8082,7920,8036,7987,6911,7982,7607,8097,7133,7658,7791,4093,7839,79 07,6138,8084,7631,8011,6111,7549,7665,7147,8098,7989,7894,8129,7134,7149,8040,4094,7660,7 799,7897,7868,7611,7909,6140,8013,8088,7550,7990,7103,8019,7898,7666,8048,7910,7613,7639, 7803,8100,7155,7855,6127,8071,7993,7668,7157,8014,7913,7994,7900,7614,8130,8104,7643,8021,8035,7805,7039,8075,7150,7655,7863,7914,7996,7921,8022,6135,8025,7672,7967,7423,8132,80 77,7158,7887,7645,8083,7161,7806,7916,8112,8037,7659,7867,7922,8026,6139,7646,8136,7551,8 078,7983,7162,8144,8038,7135,8085,4095,7895,7661,8041,7869,8099,6141,7924,8028,7667,7899, 7164,7991,8090,8042,8086,7670,8101,6142,7911,7928,8049,7151,7662,7870,8089,7669,8044,8015,8160,7615,7901,7995,8102,8050,8105,8131,7915,7673,8023,8092,7902,7997,7159,8133,8106,80 52,7674,7917,8113,8134,7923,8027,8108,7998,8079,7163,8039,7807,8056,7647,8114,7918,8137,7 676,8029,7925,8138,7165,8087,8043,8030,7926,8116,6143,8145,8091,8140,7166,7929,8045,8120, 7663,7871,8103,8146,8051,7930,7671,8093,8046,7903,8161,8053,8107,8162,8148,8094,7932,8109,8135,8054,7999,8115,7675,8057,8152,7919,8110,8164,8139,8058,7677,8117,8141,8168,8060,71 67,8118,8031,7927,8176,7678,8147,8121,7931,8142,8122,8047,8149,8150,8095,8163,7933,8124,8 055,8153,8165,8154,8111,8059,8166,7934,7679,8156,8169,8119,8170,8061,8143,8062,8177,8123, 8172,8178,8125,8151,8126,8155,8180,8167,8184,7935,8157,8171,8158,8173,8127,8179,8181,8063,8174,8182,8185,8186,8159,8188,8175,8183,8187,8189,8190,8191]

Sequence Group 4: Z4_8192

[0,1,2,7,3,8,11,24,4,10,13,28,16,33,35,77,5,12,14,32,19,38,47,81,22,46,42,88,57,96,102, 168,6,17,21,40,23,45,51,90,29,55,59,97,72,111,117,188,34,61,75,115,80,124,134,200,87,136,147,2 27,152,239,260,388,9,18,26,54,30,58,71,105,36,76,62,118,84,128,141,209,44,74,86,135,92,144,151,233,100,154,170,251,186,269,289,434,53,89,98,150,112,161,179,266,122,180,199,281,211,306,3 24,474,138,207,230,312,236,325,351,508,257,360,381,535,402,563,610,869,15,25,31,73,39,79,82, 140,48,85,93,149,101,159,165,263,56,94,103,162,116,178,196,284,127,197,208,299,232,320,345,4 95,64,109,123,185,129,198,215,314,148,228,237,327,256,358,373,534,163,247,267,364,282,397,405,560,308,421,456,596,484,633,710,871,69,125,143,218,158,235,254,362,169,258,272,387,290,4 04,433,585,194,285,300,418,326,447,479,646,341,487,516,679,543,723,752,1013,214,315,335,462, 365,494,521,698,401,530,561,739,598,759,831,1101,430,572,611,796,628,854,886,1172,704,908,9 41,1157,980,1229,1326,1690,20,37,41,91,49,95,106,177,50,107,119,189,131,210,219,343,63,120,1 32,224,145,231,245,344,153,244,261,379,286,400,410,559,67,142,155,226,173,248,268,398,183,2 78,291,413,305,444,467,623,181,301,318,443,340,480,499,680,368,523,544,721,569,747,805,1077, 78,167,174,275,192,297,316,435,201,323,332,476,352,506,528,718,259,346,367,514,390,540,568, 742,424,578,617,791,649,851,892,1147,296,383,414,554,442,595,621,834,470,640,661,867,711,92 2,953,1210,518,708,725,942,743,982,930,1253,816,1066,1102,1346,1114,1470,1534,1770,83,190,1 95,339,249,357,372,522,276,377,391,549,423,580,615,837,292,419,439,583,459,622,653,875,488, 664,697,914,740,949,1010,1269,342,445,465,652,497,688,731,932,547,732,754,1002,817,977,1086,1358,593,781,844,1069,877,1112,1152,1427,924,1163,1161,1518,1258,1560,1614,1954,382,485, 525,734,579,757,804,1029,618,835,857,1105,903,1124,1159,1463,654,883,936,1148,960,1168,126 2,1564,1025,1276,1321,1626,1393,1709,1763,2143,719,944,994,1265,1083,1271,1375,1655,1098, 1366,1437,1743,1498,1815,1922,2303,1129,1475,1553,1847,1597,1936,1888,2356,1684,2008,2061,2509,2169,2594,2711,3024,27,43,52,99,60,121,133,216,66,137,146,223,157,242,246,394,68,156, 166,241,175,298,309,429,203,311,338,471,354,501,526,737,70,172,191,304,205,336,348,492,217, 361,374,531,396,564,590,761,229,385,409,575,437,614,635,822,449,624,667,882,677,912,945,133 5,110,204,212,353,225,375,395,553,252,411,425,603,453,643,663,842,274,428,464,631,490,675,6 83,894,513,686,695,952,778,983,1055,1362,293,489,504,693,539,727,736,968,567,777,808,1024,8 61,1078,1106,1442,601,830,878,1111,925,1144,1216,1504,991,1226,1280,1565,1322,1633,1724,21 26,113,221,243,406,271,426,458,648,288,468,493,687,519,702,713,962,322,505,537,716,566,771, 799,1019,599,819,859,1096,895,1131,1191,1449,349,551,589,806,636,846,843,1134,655,884,910,1 173,971,1221,1241,1575,701,927,986,1230,1021,1292,1325,1659,1065,1353,1409,1744,1515,1828, 1930,2320,370,608,642,888,682,921,973,1227,768,990,1035,1312,1042,1331,1387,1704,783,1038, 1064,1373,1140,1406,1484,1812,1204,1507,1548,1854,1612,1969,2019,2375,821,1156,1182,1452, 1249,1521,1559,1904,1281,1608,1666,2001,1726,2071,2155,2532,1414,1670,1751,2085,1841,218 2,2232,2680,1910,2280,2350,2749,2439,2873,2997,3468,130,253,279,469,319,503,533,746,329,54 2,573,774,604,813,874,1193,363,591,647,838,669,918,900,1208,689,937,978,1275,1030,1299,134 0,1685,438,657,691,915,767,966,996,1319,773,1034,1051,1342,1081,1388,1425,1781,785,1074,11 21,1420,1201,1480,1540,1862,1236,1591,1610,1980,1668,2021,2105,2491,451,766,770,1022,789, 1040,1093,1399,827,1142,1179,1465,1222,1529,1601,1943,985,1197,1252,1545,1286,1627,1674,2 013,1395,1680,1755,2090,1846,2171,2223,2675,1047,1290,1372,1631,1415,1738,1790,2122,1492, 1824,1875,2218,1937,2285,2370,2800,1555,1917,1993,2348,2059,2416,2486,2890,2136,2518,2589,2981,2630,3134,3154,3775,463,792,812,1188,963,1214,1239,1586,1005,1273,1309,1644,1384,1 697,1775,2110,1058,1336,1411,1713,1459,1798,1880,2203,1533,1932,1869,2257,2014,2363,2438, 2822,1205,1429,1479,1831,1572,1891,1985,2333,1621,1995,2056,2419,2098,2447,2539,2965,172 8,2076,2151,2502,2236,2604,2660,3078,2299,2734,2785,3204,2879,3279,3302,3640,1287,1486,1615,1998,1692,2044,2077,2474,1768,2164,2188,2574,2265,2609,2754,3149,1786,2251,2339,2728,2 432,2802,2815,3295,2523,2897,2946,3355,3056,3484,3563,3985,1950,2402,2422,2859,2557,2906, 2987,3389,2624,3072,3095,3547,3225,3569,3792,4143,2697,3187,3264,3681,3373,3720,3854,427 9,3433,3888,3969,4392,4064,4487,4566,4981,65,104,114,184,126,187,220,313,139,206,234,337,264,371,386,594,160,222,240,369,283,399,450,607,307,448,422,638,502,672,703,943,171,265,295, 416,310,446,475,645,350,486,509,676,571,735,760,1004,376,520,587,751,605,786,818,1045,637,8 25,863,1127,891,1167,1228,1567,202,270,330,482,355,507,565,712,392,592,527,762,629,797,850, 1073,432,584,632,823,662,856,881,1143,694,897, 951,1195,1001,1248,1306,1676,481,639,678,873, 738,913, 975,1243,776,981,1043,1285,1076,1351,1400,1769,833, 1068,1135,1370,1151,1402,1468, 1845,1215,1495,1543, 1903,1595,1966,2067,2568,250,328,359,577,408,600,613, 848,454,630,665,8 70,696,911,931,1238,500,668,705,917, 753,972,1032,1295,794,1033,1071,1333,1138,1391,1455, 18 19,536,726,780,999,802,1037,1087,1377,865,1132, 1155,1410,1213,1491,1525,1902,920,1186,1245, 1506, 1289,1584,1602,1962,1357,1642,1730,2038,1795,2113, 2268,2571,557,788,853,1097,906,11 46,1203,1502,946, 1219,1256,1562,1307,1599,1672,2017,1023,1297,1334, 1638,1404,1708,1780,21 39,1447,1801,1865,2206,1923, 2297,2354,2826,1085,1380,1434,1740,1510,1816,1877, 2244,1594,1 896,1964,2324,2041,2368,2500,2969,1664, 1983,2069,2437,2104,2542,2599,3084,2255,2636,2695, 3061,2766,3176,3325,3844,287,393,420,660,455,670,715, 970,461,717,764,1008,810,1075,1100,14 51,529,769,814, 1120,860,1136,1181,1453,893,1180,1232,1538,1298,1589, 1618,1960,548,852,901, 1123,958,1190,1247,1585,993, 1274,1310,1625,1349,1700,1753,2094,984,1339,1385, 1698,1445,17 84,1827,2208,1517,1883,1928,2294,1978, 2340,2453,2930,597,940,959,1263,1017,1328,1382,1678, 1046,1398,1423,1773,1473,1840,1893,2288,1225,1457, 1513,1860,1570,1915,1977,2330,1649,199 9,2081,2428, 2148,2538,2610,3044,1324,1551,1630,1953,1696,2036, 2089,2506,1759,2128,2170,25 64,2271,2665,2718,3147, 1871,2263,2302,2696,2331,2768,2679,3215,2471,2915, 2970,3353,2992,3 536,3630,3950,626,1011,1027,1441, 1192,1489,1523,1879,1267,1532,1574,1940,1647,2006, 2075,2 513,1313,1640,1688,2012,1736,2091,2154,2579, 1803,2176,2242,2649,2326,2709,2820,3238,1450, 1702, 1749,2153,1822,2224,2310,2682,1935,2312,2359,2806, 2473,2761,2944,3371,2031,2406,252 7,2918,2584,2988, 3053,3475,2667,3070,3067,3605,3223,3664,3741,4187, 1546,1797,1886,2315,20 04,2365,2451,2849,2083,2507, 2547,2976,2628,3007,3063,3524,2156,2593,2687,3046, 2732,3079,3 229,3670,2843,3248,3317,3757,3423,3870, 3940,4422,2290,2701,2789,3233,2939,3240,3400,3797, 2962,3384,3490,3915,3578,4011,4148,4608,3014,3544, 3654,4053,3718,4166,4102,4669,3836,425 5,4323,4841, 4451,4930,5056,5374,333,427,477,685,515,772,815,1089, 546,826,862,1118,904,1175, 1184,1579,555,902,934,1170, 961,1330,1360,1660,1053,1364,1439,1761,1478,1830, 1890,2319,562, 955,1014,1347,1062,1436,1462,1813,1091, 1500,1527,1898,1583,1968,2027,2373,1133,1558,1613, 1991,1682,2074,2116,2484,1711,2096,2181,2592,2201, 2644,2703,3337,729,1056,1080,1474,1122, 1528,1581, 1948,1199,1620,1652,2050,1722,2134,2174,2522,1260, 1657,1747,2108,1809,2198,221 5,2614,1857,2220,2238, 2715,2400,2770,2895,3378,1317,1807,1836,2235,1914, 2305,2317,2747,19 74,2399,2458,2841,2555,2932,2978, 3495,2047,2498,2586,2986,2670,3038,3156,3585,2783, 3170,3 254,3672,3320,3766,3893,4403,745,1109,1177, 1606,1251,1653,1734,2146,1302,1754,1814,2222,1 873, 2250,2276,2737,1397,1839,1908,2283,1972,2389,2443, 2834,2042,2477,2550,2959,2616,3017, 3113,3505,1464, 1945,2025,2456,2120,2530,2524,3022,2159,2595,2641, 3086,2752,3162,3194,368 5,2249,2673,2777,3178,2836, 3271,3323,3803,2912,3362,3446,3917,3599,4026,4157, 4625,1520,20 63,2132,2602,2213,2663,2756,3171,2385, 2782,2858,3306,2871,3332,3415,3861,2409,2863,2910,3 396,3030,3440,3558,4006,3137,3590,3648,4062,3739, 4204,4268,4689,2480,3060,3099,3510,3208, 3608,3663, 4124,3256,3733,3813,4247,3895,4334,4435,4863,3456, 3819,3926,4350,4045,4469,452 4,5022,4133,4581,4661, 5094,4762,5224,5345,5787,807,1200,1278,1756,1386, 1834,1901,2337,141 3,1920,1986,2395,2054,2467,2577, 3116,1505,2029,2141,2515,2186,2657,2623,3144,2227, 2689,27 63,3246,2851,3285,3344,3838,1683,2162,2230, 2651,2383,2744,2792,3315,2393,2856,2888,3347,2 936, 3417,3473,3967,2414,2926,3003,3465,3131,3552,3638, 4071,3185,3710,3735,4220,3815,4271, 4374,4822,1716, 2381,2387,2839,2423,2866,2954,3431,2493,3035,3094, 3527,3164,3622,3724,417 5,2775,3124,3213,3645,3262, 3758,3824,4261,3426,3831,3931,4356,4052,4453,4514, 5017,2880,32 68,3394,3763,3457,3910,3980,4397,3570, 4020,4086,4508,4167,4588,4683,5149,3656,4141,4236,4 659,4319,4737,4816,5242,4414,4849,4925,5330,4971, 5478,5497,6054,1742,2430,2465,3107,2739, 3153,3191, 3702,2811,3244,3300,3781,3411,3853,3958,4381,2901, 3339,3449,3877,3518,3991,409 2,4493,3628,4159,4079, 4556,4262,4677,4761,5171,3139,3479,3551,4029,3680, 4107,4226,4642,37 51,4238,4317,4739,4364,4771,4872, 5315,3899,4339,4430,4833,4529,4940,5002,5424,4603, 5080,5 133,5545,5231,5616,5638,5938,3263,3561,3743, 4243,3847,4301,4341,4800,3947,4444,4476,4910, 4565, 4946,5100,5492,3974,4548,4649,5073,4755,5150,5165, 5632,4855,5249,5299,5687,5404,580 0,5869,6221,4182, 4721,4744,5208,4894,5257,5336,5716,4964,5418,5440, 5856,5565,5875,6067,63 48,5039,5530,5600,5972,5702, 6007,6118,6452,5757,6146,6209,6535,6285,6604,6660, 6941,108,16 4,176,273,193,277,317,440,213,302,334,472, 378,512,532,787,238,321,347,510,403,545,612,801,4 31,609,576,839,674,880,916,1198,255,380,415,570,436, 606,641,847,483,658,684,885,756,954,987, 1272,517,699, 779,974,798,1012,1052,1315,836,1060,1107,1412,1137, 1456,1526,1905,294,384,46 0,651,491,681,750,929,538, 784,706,989,828,1031,1090,1350,586,775,832,1057,868, 1099,1126,14 28,905,1145,1207,1488,1266,1550,1616, 2028,650,840,889,1117,957,1165,1237,1542,1003,1242,13 11,1588,1355,1663,1718,2125,1070,1345,1419,1687,1438, 1720,1794,2212,1512,1826,1882,2275,1 939,2344,2455, 2990,356,457,498,763,556,793,809,1088,616,829,872, 1113,909,1160,1185,1536,67 1,876,919,1169,979,1234, 1300,1600,1026,1301,1348,1645,1422,1710,1782,2183, 714,947,1007,12 61,1036,1305,1365,1695,1108,1416,1444, 1727,1509,1821,1858,2274,1174,1477,1544,1838,1593,1 926,1947,2338,1669,1990,2088,2421,2158,2503,2669, 2994,744,1016,1095,1374,1154,1433,1499,1 833,1202, 1516,1561,1900,1617,1944,2024,2398,1293,1604,1646, 1984,1721,2060,2138,2534,1772, 2166,2234,2606,2296, 2700,2760,3259,1363,1699,1758,2100,1842,2180,2246, 2642,1938,2267,234 2,2729,2426,2774,2917,3407,2016, 2364,2457,2848,2490,2958,3019,3523,2655,3059,3120, 3501,31 96,3619,3773,4297,407,541,574,864,619,879,933, 1231,625,938,992,1277,1044,1354,1379,1777,70 9,997, 1048,1403,1103,1421,1472,1779,1141,1471,1530,1876, 1605,1933,1963,2336,733,1094,1149, 1408,1217,1482, 1549,1927,1255,1578,1622,1971,1662,2052,2111,2482, 1246,1651,1705,2049,177 1,2145,2190,2608,1849,2252, 2301,2698,2358,2746,2865,3366,790,1194,1218,1569, 1288,1639,170 1,2030,1316,1715,1746,2131,1799,2205, 2262,2691,1522,1783,1844,2229,1907,2287,2357,2735,19 97,2380,2469,2838,2541,2952,3029,3486,1636,1889,1976, 2328,2046,2420,2476,2922,2118,2521,2 562,2985,2672, 3090,3146,3589,2240,2662,2705,3122,2736,3198,3103, 3661,2884,3349,3409,3801, 3428,3989,4083,4405,824, 1282,1296,1767,1483,1818,1856,2248,1573,1870,1912, 2314,1996,2386, 2464,2928,1624,1988,2040,2392,2095, 2479,2546,3001,2168,2569,2640,3075,2730,3136,3253,368 4,1776,2053,2107,2545,2185,2622,2714,3106,2309,2716, 2765,3237,2886,3190,3382,3821,2413,28 16,2941,3352, 3005,3425,3494,3925,3093,3509,3507,4057,3669,4116, 4194,4638,1885,2161,2254,2 720,2384,2772,2862,3282, 2470,2924,2966,3413,3051,3445,3504,3978,2549,3013,
3112,3488,3161, 3517,3675,4121,3277,3694,3765,4208,
3873,4325,4395,4870,2693,3128,3219,3679,3376,3687,384
9,4253,3402,3834,3939,4369,4028,4465,4599,5051,3453,
3996,4106,4505,4173,4615,4555,5109,42 89,4704,4773,
5275,4898,5363,5484,5784,466,581,644,896,692,1000,
1049,1368,728,1061,1104,14 01,1153,1466,1476,1919,741,
1150,1189,1461,1223,1641,1675,2011,1327,1681,1765,
2119,1806,21 93,2259,2724,748,1212,1284,1658,1338,
1760,1788,2177,1369,1832,1863,2269,1925,2346,2408,27
80,1417,1895,1959,2372,2034,2462,2505,2899,2066,2483,
2576,3011,2601,3069,3129,3785,950,13 32,1359,1800,
1407,1864,1921,2323,1493,1965,2002,2436,2079,2529,
2567,2935,1566,2009,2106,2 497,2173,2597,2613,3034,
2226,2618,2635,3143,2810,3200,3330,3829,1629,2172,
2199,2632,2286, 2708,2722,3175,2352,2809,2870,3275,
2974,3368,3414,3946,2433,2914,3006,3422,3096,3481,359
8,4036,3212,3612,3699,4122,3768,4218,4346,4851,965,
1390,1467,1952,1556,2003,2093,2540,161 1,2112,2178,
2620,2241,2648,2678,3166,1714,2204,2281,2686,2351,
2798,2854,3267,2427,2891,29 68,3398,3036,3455,3556,
3957,1789,2321,2405,2868,2511,2943,2938,3462,2552,
3016,3065,3525,3 181,3604,3637,4137,2647,3098,3206,
3620,3270,3716,3771,4258,3346,3812,3897,4371,4051,
4480, 4607,5070,1852,2450,2526,3021,2612,3088,3184,
3614,2794,3211,3291,3754,3304,3780,3865,431 5,2819,
3296,3343,3846,3471,3891,4008,4460,3580,4042,4101,
4513,4192,4658,4717,5129,2893,34 99,3541,3963,3653,
4061,4114,4578,3700,4186,4267,4698,4349,4783,4883,
5297,3906,4273,4380,4 799,4498,4915,4970,5451,4585,
5024,5102,5520,5198,5643,5756,6168,1041,1494,1582,
2115,1706, 2197,2273,2743,1733,2293,2367,2804,2441,
2878,2999,3560,1837,2411,2536,2929,2583,3083,304
3,3587,2625,3114,3193,3692,3283,3732,3793,4291,2035,
2554,2627,3077,2791,3173,3222,3762,28 03,3289,3322,
3795,3374,3867,3922,4419,2824,3361,3439,3914,3575,
4003,4091,4523,3627,4164,4 189,4675,4270,4719,4824,
5258,2072,2788,2796,3273,2833,3298,3393,3882,2909,
3477,3534,3982, 3607,4076,4178,4624,3205,3568,3659,
4097,3706,4210,4278,4709,3875,4284,4386,4805,4503,490
1,4960,5446,3314,3714,3843,4216,3908,4363,4432,4846,
4019,4474,4539,4955,4617,5031,5123,55 70,4109,4594,
4688,5099,4770,5176,5254,5656,4862,5283,5359,5742,
5401,5883,5900,6413,2102,2 840,2877,3550,3168,3595,
3634,4156,3243,3690,3749,4235,3860,4306,4412,4831,
3335,3787,3901, 4332,3972,4443,4545,4939,4081,4610,
4531,4999,4711,5115,5196,5591,3582,3928,4001,4484,413
1,4560,4679,5086,4203,4691,4767,5179,4814,5207,5306,
5728,4352,4788,4878,5268,4975,5373,54 32,5830,5046,
5506,5557,5944,5647,6012,6031,6307,3708,4010,4196,
4694,4299,4753,4790,5240,4 401,4892,4922,5344,5008,
5378,5525,5896,4427,4992,5090,5499,5191,5572,5584,
6024,5288,5663, 5713,6077,5812,6181,6245,6568,4632,
5163,5182,5630,5327,5671,5746,6104,5394,5825,5846,623
3,5963,6249,6425,6680,5468,5930,5999,6340,6090,6371,
6474,6773,6143,6497,6556,6847,6623,69 08,6958,7203,
724,928,969,1259,1020,1270,1383,1693,1084,1343,1432,
1764,1537,1855,1899,2418, 1164,1396,1460,1850,1598,
1931,2070,2448,1667,2065,1994,2516,2196,2590,2653,
3126,1211,154 1,1634,1981,1679,2058,2130,2533,1793,
2165,2216,2598,2362,2721,2778,3242,1868,2245,2403,27
58,2442,2825,2889,3309,2512,2904,2979,3451,3027,3515,
3617,4126,1320,1554,1737,2152,1810,2 210,2349,2677,
1913,2412,2260,2781,2495,2852,2950,3359,2022,2396,
2501,2900,2566,2964,3010, 3478,2633,3040,3141,3565,
3235,3651,3745,4280,2149,2519,2605,2998,2727,3074,
3188,3642,280 8,3197,3305,3705,3365,3809,3883,4402,
2921,3351,3463,3840,3492,3886,3986,4502,3596,4023,40
95,4576,4170,4654,4779,5338,1487,1732,1825,2378,1957,
2431,2461,2948,2080,2496,2573,2991,2 639,3066,3104,
3632,2191,2581,2658,3081,2764,3182,3287,3723,2845,
3288,3357,3783,3469,3871, 3968,4470,2279,2706,2814,
3228,2860,3294,3383,3851,2982,3459,3498,3898,3593,
4017,4068,457 5,3087,3548,3644,4040,3712,4153,4179,
4648,3818,4232,4354,4743,4438,4835,5011,5341,2334,28
31,2957,3399,3057,3485,3579,4033,3133,3602,3666,4119,
3746,4176,4275,4715,3274,3727,3784,4 225,3889,4322,
4417,4865,3954,4447,4526,4942,4600,5043,5106,5595,
3380,3856,3935,4366,4047, 4466,4542,4984,4169,4568,
4651,5074,4749,5120,5266,5731,4264,4678,4781,5195,
4821,5310,536 8,5836,4996,5407,5465,5815,5537,5919,
6051,6466,1609,1918,1989,2560,2086,2587,2684,3179,20
99,2690,2786,3250,2875,3364,3406,3961,2266,2795,2882,
3437,2972,3466,3539,3964,3033,3538,3 624,4088,3730,
4161,4199,4646,2313,2956,3048,3444,3158,3554,3650,
4154,3217,3691,3752,4207, 3806,4310,4383,4810,3203,
3791,3863,4307,3952,4424,4478,4944,4055,4550,4605,
5041,4672,509 1,5214,5697,2425,3119,3159,3676,3265,
3776,3858,4282,3312,3880,3919,4409,3993,4496,4562,50
34,3611,3970,4049,4520,4128,4591,4671,5082,4242,4695,
4794,5187,4875,5304,5379,5801,3770,4 104,4214,4636,
4304,4741,4803,5271,4391,4853,4899,5334,5014,5436,
5489,5893,4534,5005,5049, 5466,5083,5539,5449,5954,
5236,5681,5732,6074,5751,6224,6299,6543,2488,3257,
3280,3945,355 7,4014,4066,4544,3682,4080,4135,4620,
4240,4702,4787,5278,3755,4229,4295,4708,4361,4806,48
81,5349,4449,4907,4982,5420,5076,5481,5588,5974,3960,
4313,4377,4880,4472,4961,5059,5453,4 614,5061,5111,
5576,5238,5532,5710,6088,4733,5166,5293,5683,5354,
5747,5809,6173,5438,5822, 5820,6280,5960,6325,6387,
6710,4098,4441,4552,5064,4700,5118,5211,5619,4796,
5272,5317,573 7,5398,5767,5817,6216,4884,5362,5458,
5803,5503,5831,5966,6330,5613,5984,6044,6399,6134,64
84,6537,6868,5036,5472,5560,5970,5706,5977,6113,6429,
5725,6099,6186,6518,6257,6588,6683,6 985,5774,6230,
6317,6615,6368,6694,6652,7020,6460,6756,6802,7124,
6887,7176,7243,7409,1752, 2007,2135,2617,2233,2801,
2883,3387,2307,2907,2975,3435,3054,3529,3546,4145,
2329,3049,311 0,3521,3165,3778,3826,4259,3327,3833,
3943,4393,4000,4482,4558,5068,2343,3151,3260,3802,33
41,3937,3976,4462,3390,4031,4073,4570,4150,4656,4727,
5127,3460,4113,4193,4685,4287,4786,4 837,5251,4329,
4812,4913,5361,4936,5415,5474,6062,2712,3333,3372,
3994,3443,4074,4147,4629, 3572,4201,4249,4759,4343,
4860,4905,5286,3673,4257,4375,4828,4457,4933,4952,
5384,4517,495 7,4977,5487,5160,5541,5660,6094,3760,
4455,4490,4973,4590,5053,5066,5517,4665,5159,5220,56
11,5324,5699,5739,6191,4757,5264,5356,5745,5441,5797,
5902,6262,5554,5913,5989,6332,6047,6 406,6500,6854,
2741,3419,3531,4184,3658,4250,4359,4873,3737,4384,
4463,4959,4536,4990,5019, 5508,3879,4495,4582,5028,
4663,5146,5202,5603,4750,5244,5319,5723,5386,5776,
5864,6199,397 9,4627,4724,5218,4843,5295,5289,5781,
4888,5364,5412,5838,5523,5907,5935,6343,4989,5443,55
48,5921,5606,6004,6049,6434,5677,6082,6152,6520,6275,
6599,6688,6995,4059,4775,4857,5370,4 950,5434,5527,
5914,5141,5553,5628,6034,5640,6058,6127,6479,5168,
5633,5674,6109,5790,6148, 6240,6584,5885,6267,6313,
6620,6386,6722,6765,7033,5246,5814,5850,6204,5948,
6282,6324,666 7,5991,6380,6441,6751,6502,6810,6877,
7137,6158,6446,6526,6820,6611,6897,6934,7227,6672,69
67,7015,7265,7076,7333,7396,7603,2869,3573,3697,4387,
3864,4488,4573,5089,3905,4597,4680,5 154,4764,5230,
5347,5866,4039,4730,4867,5280,4919,5429,5392,5891, 4965,5460,5535,5982,5621,6016,6068,6462,4288,4890,4967,5422,5139,5515,5562,6041,5152,5626,5654,6070,5704,6129,6171,6554,5173,5692,5762,6165,5880,6236,6304,6628,5927,6362,6383,6733,6443,6767,6835,7112,4336,5136,5144,5609,5183,5635,5719,6140,5260,5794,5844,6218,5909,6294,6374,6701,5546,5873,5952,6310,5996,6400,6450,6760,6136,6456,6530,6824,6614,6888,6927,7224,5648,6002,6107,6404,6159,6514,6563,6850,6250,6595,6639,6923,6695,6971,7029,7292,6319,6677,6743,7013,6799,7061,7109,7342,6862,7128,7173,7388,7196,7461,7471,7713,4368,5189,5228,5859,5510,5899,5933,6356,5580,5980,6028,6417,6123,6472,6548,6839,5666,6064,6154,6488,6212,6572,6644,6912,6297,6690,6634,6951,6761,7025,7075,7304,5887,6176,6235,6601,6338,6656,6737,7004,6395,6745,6797,7063,6830,7081,7141,7380,6505,6813,6873,7119,6937,7182,7215,7436,6982,7256,7284,7491,7336,7525,7535,7667,5997,6242,6389,6748,6468,6786,6815,7099,6541,6883,6900,7163,6956,7185,7268,7469,6559,6947,7008,7252,7072,7293,7301,7532,7132,7346,7371,7557,7426,7609,7639,7779,6706,7052,7066,7325,7152,7350,7391,7571,7193,7433,7442,7633,7501,7641,7718,7825,7235,7484,7518,7680,7564,7695,7739,7860,7589,7750,7774,7888,7802,7911,7929,8009,182,262,280,412,303,417,473,634,331,452,496,673,550,722,749,1063,366,478,511,720,582,765,849,1082,620,845,803,1128,926,1178,1220,1552,389,552,602,795,627,841,887,1139,690,907,939,1183,1028,1264,1303,1637,730,956,1054,1291,1079,1337,1381,1689,1125,1392,1446,1796,1481,1848,1929,2353,441,558,659,899,700,935,1018,1235,755,1059,964,1304,1115,1356,1426,1725,820,1050,1119,1389,1162,1435,1469,1817,1206,1490,1563,1887,1632,1956,2032,2485,898,1130,1187,1458,1268,1514,1596,1949,1323,1603,1686,2000,1731,2084,2144,2596,1405,1719,1805,2109,1829,2147,2231,2688,1911,2264,2325,2757,2390,2829,2945,3511,524,656,707,1039,782,1072,1092,1424,855,1116,1166,1454,1209,1508,1535,1941,923,1171,1224,1519,1294,1592,1671,2015,1352,1673,1723,2062,1811,2133,2214,2656,976,1254,1329,1628,1361,1677,1745,2117,1448,1802,1835,2157,1909,2258,2300,2755,1524,1874,1951,2278,2005,2376,2397,2823,2092,2446,2551,2913,2629,3002,3177,3513,1009,1341,1431,1757,1503,1823,1897,2272,1557,1916,1967,2347,2033,2394,2481,2887,1661,2018,2064,2440,2150,2525,2611,3031,2202,2637,2710,3108,2779,3209,3272,3789,1741,2121,2187,2563,2282,2654,2725,3150,2388,2748,2827,3239,2919,3286,3434,3941,2472,2850,2947,3363,2989,3483,3543,4063,3163,3586,3647,4038,3725,4158,4312,4832,588,758,800,1158,858,1176,1240,1590,866,1244,1308,1643,1371,1729,1762,2209,967,1314,1376,1787,1440,1808,1867,2211,1485,1866,1934,2318,2020,2382,2415,2821,998,1430,1496,1792,1576,1878,1955,2377,1619,1987,2037,2424,2082,2514,2578,2977,1607,2068,2127,2510,2200,2615,2664,3109,2289,2731,2784,3207,2844,3258,3381,3903,1067,1547,1577,1975,1654,2055,2123,2487,1691,2142,2175,2603,2237,2683,2742,3201,1924,2217,2284,2704,2355,2771,2842,3247,2454,2867,2961,3354,3039,3476,3555,4021,2051,2332,2429,2812,2508,2911,2971,3441,2585,3018,3064,3506,3180,3616,3674,4125,2717,3172,3214,3649,3249,3728,3629,4198,3404,3884,3942,4340,3966,4525,4619,4934,1110,1648,1665,2195,1881,2256,2298,2726,1979,2311,2360,2799,2452,2874,2955,3448,2039,2444,2499,2881,2558,2973,3047,3520,2638,3073,3148,3600,3241,3665,3782,4221,2207,2517,2572,3045,2659,3127,3224,3633,2793,3226,3278,3767,3405,3719,3916,4358,2905,3331,3464,3887,3526,3962,4030,4464,3618,4046,4044,4595,4205,4653,4731,5164,2327,2631,2733,3230,2872,3284,3379,3814,2963,3442,3489,3949,3577,3984,4041,4515,3050,3537,3639,4022,3689,4056,4212,4660,3808,4231,4305,4747,4413,4858,4926,5383,3202,3655,3750,4215,3911,4223,4389,4785,3934,4373,4479,4903,4567,4994,5125,5558,3990,4533,4643,5033,4706,5142,5081,5610,4826,5227,5291,5766,5410,5848,5958,6234,666,811,890,1196,948,1318,1378,1748,995,1394,1443,1785,1501,1859,1872,2369,1006,1497,1539,1853,1580,2057,2097,2468,1703,2103,2194,2588,2243,2668,2738,3234,1015,1571,1650,2078,1712,2189,2221,2650,1750,2270,2304,2750,2374,2830,2898,3292,1804,2341,2410,2857,2492,2953,3004,3416,2531,2980,3080,3535,3102,3594,3657,4327,1257,1707,1735,2239,1791,2306,2371,2807,1892,2417,2459,2927,2543,3025,3071,3458,1973,2466,2570,2996,2645,3100,3117,3562,2702,3123,3142,3671,3326,3729,3862,4365,2043,2643,2676,3138,2769,3218,3232,3703,2837,3324,3388,3807,3496,3904,3951,4486,2925,3432,3528,3959,3621,4015,4136,4574,3744,4151,4237,4662,4308,4756,4879,5366,1279,1774,1861,2401,1961,2460,2556,3037,2026,2580,2652,3125,2719,3157,3186,3695,2140,2681,2762,3195,2835,3311,3370,3798,2920,3410,3491,3932,3564,3992,4093,4494,2225,2805,2896,3385,3008,3467,3461,3998,3052,3540,3591,4065,3709,4142,4177,4676,3155,3623,3736,4160,3800,4256,4311,4792,3881,4351,4436,4904,4589,5009,5134,5574,2292,2940,3023,3545,3115,3615,3713,4152,3307,3742,3825,4293,3837,4320,4407,4850,3334,3830,3878,4385,4007,4431,4547,4988,4117,4580,4637,5040,4728,5181,5241,5631,3412,4037,4078,4500,4191,4598,4652,5104,4239,4722,4801,5219,4882,5302,5396,5788,4445,4808,4911,5316,5026,5427,5479,5931,5110,5533,5604,5995,5696,6105,6210,6582,1367,1894,1992,2582,2129,2674,2753,3255,2163,2776,2853,3318,2931,3397,3519,4096,2277,2902,3032,3450,3085,3609,3571,4123,3130,3641,3721,4230,3816,4272,4333,4827,2494,3055,3132,3601,3303,3701,3753,4302,3316,3823,3855,4335,3909,4408,4461,4949,3338,3896,3977,4454,4111,4541,4626,5050,4168,4699,4725,5193,4804,5243,5339,5749,2537,3301,3310,3804,3348,3832,3927,4421,3427,4012,4072,4518,4144,4612,4713,5151,3734,4103,4197,4634,4246,4748,4811,5234,4415,4819,4917,5322,5032,5413,5470,5925,3848,4254,4382,4754,4446,4897,4963,5360,4559,5003,5065,5464,5143,5538,5625,6039,4645,5117,5209,5601,5287,5672,5743,6121,5377,5773,5842,6197,5884,6323,6341,6795,2565,3356,3395,4087,3696,4132,4174,4693,3774,4227,4286,4772,4400,4840,4941,5346,3869,4328,4439,4864,4509,4974,5072,5450,4618,5137,5058,5507,5235,5618,5695,6061,4118,4468,4540,5012,4670,5087,5200,5586,4740,5212,5284,5675,5331,5703,5795,6184,4886,5308,5390,5760,5485,5857,5912,6278,5552,5981,6026,6381,6111,6439,6459,6704,4248,4549,4732,5216,4834,5270,5309,5730,4931,5405,5433,5829,5514,5862,6000,6336,4956,5501,5593,5975,5690,6042,6056,6454,5779,6126,6169,6498,6260,6593,6650,6932,5158,5658,5679,6092,5813,6133,6202,6524,5878,6273,6292,6637,6398,6654,6808,7027,5946,6366,6427,6731,6512,6759,6848,7107,6557,6871,6921,7171,6980,7222,7263,7467,988,1233,1283,1623,1344,1635,1766,2114,1418,1717,1820,2192,1942,2295,2345,2908,1511,1778,1851,2291,2010,2379,2535,2937,2087,2528,2449,3012,2671,3092,3160,3652,1568,1946,2048,2435,2101,2520,2600,3028,2228,2634,2692,3101,2847,3231,3290,3772,2308,2723,2894,3269,2933,3340,3408,3842,3009,3421,3500,3988,3553,4054,4155,4666,1694,1958,2167,2621,2247,2685,2832,3183,2361,2903,2740,3293,2993,3367,3474,3894,2478,2885,3000,3418,3068,3487,3533,4013,3140,3567,3668,4100,3764,4190,4283,4815,2619,3015,3105,3516,3236,3597,3717,4181, 3321,3726,3839,4245,3902,4348,4423,4932,3438,3885,3999,4379,4027,4426,4522,5030,4134,4564,4631,5103,4705,5178,5298,5824,1884,2160,2261,2864,2407,2923,2951,3472,2544,2995,3076,3512,3145,3592,3631,4172,2666,3082,3167,3606,3276,3711,3820,4263,3360,3822,3892,4324,4005,4411,4504,4998,2759,3216,3329,3759,3377,3828,3918,4390,3503,3995,4035,4437,4130,4557,4604,5101,3613,4085,4183,4579,4252,4690,4714,5172,4357,4769,4887,5263,4969,5351,5519,5827,2818,3345,3482,3933,3584,4018,4115,4572,3660,4140,4202,4657,4285,4710,4809,5239,3805,4266,4326,4763,4429,4856,4948,5381,4492,4979,5055,5455,5126,5551,5608,6066,3913,4396,4475,4900,4584,4995,5069,5493,4703,5093,5175,5578,5267,5624,5758,6188,4798,5197,5300,5694,5337,5799,5853,6284,5505,5890,5943,6265,6011,6358,6477,6841,2023,2366,2445,3062,2548,3089,3192,3707,2561,3199,3299,3779,3392,3900,3938,4499,2745,3308,3401,3975,3493,4002,4077,4501,3559,4075,4163,4623,4269,4697,4736,5170,2797,3480,3574,3983,3686,4090,4188,4692,3748,4228,4290,4746,4345,4845,4914,5326,3731,4331,4404,4842,4491,4954,5007,5456,4593,5077,5132,5549,5192,5594,5709,6156,2916,3646,3688,4213,3796,4316,4398,4817,3845,4420,4459,4938,4530,5025,5088,5543,4149,4507,4587,5048,4668,5116,5190,5583,4778,5217,5313,5686,5388,5793,5863,6252,4309,4641,4752,5162,4839,5262,5321,5764,4921,5367,5411,5819,5522,5917,5965,6335,5062,5513,5556,5945,5585,6013,5929,6392,5727,6142,6189,6496,6207,6630,6698,6909,2984,3786,3811,4485,4094,4554,4602,5071,4219,4616,4674,5148,4777,5225,5307,5770,4294,4766,4830,5233,4895,5323,5395,5834,4980,5419,5491,5904,5579,5957,6060,6408,4497,4848,4909,5393,5001,5471,5564,5932,5140,5566,5615,6046,5729,6006,6167,6510,5256,5662,5783,6145,5839,6203,6258,6587,5918,6272,6270,6679,6397,6720,6774,7054,4635,4972,5079,5569,5223,5622,5708,6084,5314,5765,5805,6194,5882,6220,6266,6622,5397,5847,5937,6253,5979,6279,6402,6724,6080,6415,6471,6783,6550,6859,6903,7188,5544,5950,6030,6403,6163,6409,6533,6812,6182,6522,6598,6890,6661,6949,7031,7286,6226,6635,6714,6974,6758,7041,7002,7315,6836,7092,7134,7401,7202,7443,7499,7635,2179,2463,2607,3121,2707,3313,3403,3921,2790,3424,3497,3973,3581,4069,4082,4682,2813,3576,3636,4060,3693,4318,4362,4793,3859,4370,4483,4924,4538,5010,5085,5573,2828,3678,3790,4342,3876,4477,4512,4991,3924,4571,4609,5095,4687,5180,5250,5629,3997,4650,4729,5206,4823,5305,5353,5741,4861,5329,5426,5845,5448,5898,5951,6485,3221,3866,3907,4532,3981,4611,4684,5157,4108,4738,4782,5277,4877,5375,5417,5778,4209,4789,4908,5343,4986,5445,5462,5868,5045,5467,5486,5962,5657,6014,6125,6516,4300,4985,5018,5483,5114,5559,5571,5994,5186,5655,5715,6079,5811,6157,6195,6603,5274,5755,5840,6201,5922,6247,6342,6665,6025,6353,6419,6725,6473,6790,6875,7179,3252,3956,4070,4720,4195,4784,4893,5387,4277,4916,4993,5469,5063,5500,5529,5986,4418,5023,5108,5536,5185,5646,5701,6072,5269,5734,5807,6180,5870,6228,6306,6609,4516,5155,5248,5712,5358,5786,5780,6232,5400,5849,5895,6286,5998,6347,6373,6735,5498,5924,6019,6359,6073,6433,6476,6817,6139,6504,6567,6891,6675,6957,7037,7295,4596,5292,5372,5855,5461,5916,6001,6354,5642,6023,6091,6464,6103,6481,6545,6853,5665,6096,6138,6529,6239,6562,6647,6945,6327,6669,6709,6979,6772,7065,7101,7327,5736,6264,6296,6613,6385,6682,6719,7017,6420,6769,6822,7088,6876,7139,7194,7412,6574,6826,6895,7147,6968,7212,7241,7485,7022,7272,7312,7517,7363,7572,7621,7784,3386,4110,4234,4918,4406,5016,5098,5590,4442,5122,5201,5651,5282,5722,5833,6309,4577,5253,5382,5771,5431,5910,5877,6333,5475,5939,6008,6414,6085,6445,6490,6837,4825,5403,5477,5905,5639,5992,6033,6470,5650,6089,6119,6492,6161,6546,6586,6919,5670,6151,6215,6580,6321,6642,6703,6984,6365,6753,6770,7074,6823,7103,7160,7393,4869,5637,5645,6076,5680,6098,6175,6555,5750,6244,6291,6625,6349,6692,6763,7046,6018,6315,6391,6708,6424,6784,6828,7096,6552,6832,6898,7150,6973,7204,7237,7482,6112,6431,6528,6788,6575,6886,6930,7175,6655,6954,6993,7234,7042,7275,7323,7540,6715,7026,7083,7311,7131,7351,7390,7579,7184,7404,7441,7615,7463,7674,7681,7870,4902,5688,5721,6302,5987,6339,6370,6747,6053,6412,6458,6801,6540,6846,6914,7165,6131,6486,6569,6864,6618,6936,6997,7226,6697,7038,6989,7258,7097,7319,7362,7550,6328,6591,6641,6960,6730,7006,7078,7302,6779,7084,7130,7352,7155,7367,7416,7610,6880,7142,7191,7398,7244,7447,7477,7653,7282,7510,7533,7700,7575,7725,7734,7835,6426,6649,6775,7087,6843,7121,7143,7382,6907,7199,7217,7435,7262,7450,7520,7679,6925,7253,7306,7507,7359,7541,7547,7731,7407,7582,7605,7751,7646,7788,7811,7918,7050,7344,7355,7566,7428,7585,7617,7760,7458,7650,7659,7807,7708,7813,7874,7953,7492,7693,7719,7844,7755,7857,7889,7978,7776,7897,7914,7998,7936,8015,8027,8083,1250,1531,1587,1970,1656,1982,2124,2504,1739,2073,2184,2591,2316,2699,2751,3342,1843,2137,2219,2694,2391,2787,2949,3375,2475,2942,2861,3452,3097,3532,3603,4105,1906,2322,2434,2846,2489,2934,3020,3470,2626,3058,3118,3542,3281,3677,3738,4224,2713,3152,3328,3715,3369,3788,3857,4296,3447,3872,3953,4440,4004,4506,4606,5105,2045,2335,2559,3042,2646,3111,3266,3626,2767,3336,3169,3740,3429,3817,3923,4347,2892,3319,3436,3868,3508,3936,3987,4467,3583,4016,4120,4553,4217,4640,4734,5252,3041,3454,3549,3971,3683,4050,4171,4630,3769,4180,4292,4696,4355,4797,4871,5365,3890,4338,4452,4829,4481,4874,4968,5459,4586,5006,5075,5528,5147,5598,5711,6205,2253,2553,2661,3297,2817,3358,3391,3920,2960,3430,3514,3965,3588,4043,4084,4621,3091,3522,3610,4058,3722,4165,4274,4712,3810,4276,4344,4774,4458,4859,4951,5428,3189,3662,3777,4211,3827,4281,4372,4838,3955,4448,4489,4885,4583,5000,5047,5526,4067,4537,4633,5021,4701,5130,5156,5592,4807,5205,5320,5678,5399,5761,5920,6208,3251,3794,3930,4388,4034,4473,4569,5015,4112,4592,4655,5097,4735,5153,5247,5653,4260,4716,4776,5199,4876,5290,5380,5791,4937,5408,5482,5860,5550,5949,6005,6422,4367,4844,4920,5333,5027,5425,5495,5897,5145,5518,5596,5976,5684,6017,6144,6538,5237,5620,5714,6083,5748,6179,6229,6621,5908,6263,6312,6607,6375,6689,6794,7118,2404,2773,2855,3502,2967,3530,3635,4162,2983,3643,3747,4233,3841,4353,4394,4945,3174,3756,3850,4428,3944,4456,4528,4947,4009,4527,4613,5067,4718,5138,5174,5589,3227,3929,4024,4434,4138,4543,4639,5131,4200,4681,4742,5184,4795,5279,5348,5738,4185,4780,4852,5276,4935,5385,5435,5861,5035,5502,5555,5947,5614,5993,6097,6508,3350,4099,4139,4667,4251,4765,4847,5255,4298,4868,4906,5371,4976,5454,5512,5941,4601,4953,5029,5476,5107,5542,5612,5983,5215,5636,5724,6075,5798,6174,6238,6596,4760,5084,5188,5581,5273,5676,5733,6149,5355,5777,5818,6200,5923,6289,6334,6668,5488,5915,5953,6314,5985,6377,6298,6718,6116,6493,6539,6814,6553,6935,6992,7180,3420,4241,4265,4929,4546,4997,5044,5496,4673,5060,5112,5568,5213,5644,5720,6153,4745,5203,5265,5649,5328,5735,5804,6214,5409,5826,5894,6276,5978,6326,6418,6734,4943,5281,5342,5802,5430,5876,5961,6301,5563,5964,6010,6407,6117,6369,6519,6827,5669,6057,6164,6495,6217,6551,660

2,6894,6290,6612,6610,6976,6723,7011,7058,7300,5078,5402,5504,5967,5641,6015,6095,6442,57 26,6150,6185,6542,6256,6566,6608,6928,5806,6225,6305,6597,6346,6617,6727,7014,6438,6741,6 789,7068,6861,7135,7174,7415,5942,6318,6394,6729,6515,6736,6844,7091,6534,6834,6902,7158, 6959,7210,7280,7497,6571,6940,7005,7233,7045,7289,7257,7523,7115,7335,7368,7594,7429,7629,7676,7783,2575,2876,3026,3566,3135,3761,3852,4376,3220,3874,3948,4425,4032,4519,4535,51 21,3245,4025,4089,4511,4146,4768,4813,5232,4314,4820,4928,5357,4983,5439,5509,5971,3261,4 129,4244,4791,4330,4923,4958,5421,4378,5013,5052,5521,5128,5599,5664,6021,4450,5092,5169, 5627,5259,5718,5763,6128,5296,5740,5832,6223,5854,6271,6320,6805,3667,4321,4360,4978,4433,5054,5124,5577,4561,5177,5221,5693,5311,5785,5823,6160,4664,5229,5340,5754,5416,5851,58 67,6243,5473,5872,5889,6331,6052,6378,6480,6831,4751,5414,5447,5886,5540,5956,5969,6357,5 607,6050,6102,6437,6192,6509,6544,6906,5691,6141,6219,6549,6293,6592,6674,6963,6390,6685, 6744,7016,6791,7073,7145,7405,3698,4410,4521,5161,4647,5222,5325,5796,4726,5350,5423,5874,5490,5903,5928,6351,4866,5452,5534,5936,5605,6038,6087,6430,5685,6122,6187,6531,6246,65 73,6645,6913,4962,5575,5661,6100,5768,6166,6162,6578,5808,6227,6268,6624,6361,6678,6702,7 024,5901,6295,6384,6691,6432,6757,6793,7094,6491,6821,6878,7159,6972,7219,7285,7506,5038, 5707,5782,6231,5865,6288,6364,6686,6035,6388,6451,6781,6461,6800,6857,7129,6059,6455,6489,6842,6585,6874,6946,7207,6663,6966,7001,7236,7056,7310,7341,7531,6124,6606,6633,6917,67 13,6978,7010,7271,6746,7053,7100,7331,7146,7373,7422,7604,6884,7104,7164,7381,7230,7438,7 462,7664,7274,7486,7521,7689,7562,7736,7775,7904,3835,4563,4686,5352,4854,5444,5524,5990, 4891,5547,5623,6045,5698,6110,6213,6648,5020,5667,5792,6155,5837,6283,6251,6666,5879,6308,6372,6740,6444,6768,6809,7116,5261,5810,5881,6277,6032,6355,6396,6787,6043,6449,6475,68 11,6513,6858,6893,7187,6063,6503,6561,6889,6659,6944,6996,7240,6696,7040,7055,7318,7102,7 343,7394,7586,5303,6029,6037,6435,6071,6457,6527,6867,6137,6589,6629,6931,6681,6988,7048, 7294,6382,6653,6717,6999,6750,7069,7106,7338,6863,7111,7168,7384,7232,7431,7456,7662,6469,6755,6840,7071,6885,7154,7192,7403,6953,7216,7248,7453,7290,7488,7529,7709,7007,7278,73 26,7519,7366,7552,7584,7741,7411,7597,7626,7769,7645,7815,7822,7969,5335,6078,6108,6640,6 352,6671,6700,7036,6411,6738,6778,7082,6852,7123,7183,7397,6483,6806,6881,7138,6924,7198, 7251,7446,6991,7287,7245,7476,7339,7526,7561,7716,6664,6896,6943,7221,7021,7260,7321,7513,7064,7328,7365,7553,7389,7565,7607,7764,7148,7376,7419,7591,7465,7634,7655,7799,7495,76 84,7705,7836,7737,7858,7863,7941,6752,6948,7059,7329,7120,7358,7377,7578,7177,7427,7440,7 620,7479,7636,7691,7820,7190,7474,7515,7682,7559,7710,7714,7861,7599,7743,7759,7878,7792, 7908,7926,8007,7298,7546,7554,7730,7614,7745,7771,7884,7643,7798,7805,7921,7841,7927,7971,8031,7671,7832,7854,7951,7881,7957,7985,8052,7896,7989,8004,8065,8020,8077,8087,8126,32 10,3625,3704,4206,3799,4222,4399,4836,3912,4337,4471,4927,4622,5042,5096,5673,4048,4416,4 510,5037,4707,5135,5301,5705,4802,5294,5210,5772,5442,5843,5906,6316,4127,4628,4758,5194, 4818,5285,5369,5789,4966,5406,5463,5852,5617,5968,6020,6410,5057,5494,5659,6003,5700,6065,6120,6465,5769,6132,6196,6570,6237,6616,6687,7018,4303,4644,4896,5391,4987,5457,5602,59 26,5113,5668,5511,6022,5752,6086,6172,6501,5245,5652,5759,6130,5821,6183,6222,6590,5888,6 248,6329,6651,6405,6712,6776,7108,5389,5775,5858,6211,5973,6274,6367,6705,6048,6376,6463, 6749,6507,6819,6869,7178,6147,6494,6579,6838,6600,6870,6933,7231,6673,6955,6998,7270,7044,7308,7370,7618,4551,4889,5004,5634,5167,5689,5717,6170,5312,5753,5828,6206,5892,6269,63 00,6699,5437,5835,5911,6281,6009,6363,6447,6762,6081,6448,6499,6803,6583,6860,6920,7213,5 531,5955,6055,6401,6093,6453,6521,6845,6198,6576,6605,6879,6670,6952,6983,7269,6287,6638, 6707,6965,6754,7034,7049,7305,6825,7080,7149,7354,7195,7399,7480,7619,5587,6069,6178,6532,6261,6594,6662,6962,6322,6676,6721,7012,6777,7047,7105,7340,6436,6764,6804,7077,6872,71 33,7186,7413,6911,7200,7242,7448,7281,7494,7522,7717,6517,6849,6899,7156,6969,7211,7249,7 470,7043,7264,7307,7508,7356,7528,7590,7765,7098,7320,7372,7560,7392,7608,7631,7801,7475, 7647,7669,7794,7697,7829,7869,7982,4723,5119,5204,5816,5318,5841,5934,6360,5332,5940,6027,6416,6106,6506,6536,6916,5516,6036,6114,6560,6190,6581,6632,6918,6241,6631,6693,6994,67 66,7039,7060,7303,5567,6177,6254,6565,6344,6643,6711,7035,6393,6739,6780,7067,6818,7126,7 166,7386,6379,6807,6855,7125,6910,7189,7218,7449,6975,7254,7283,7493,7317,7516,7568,7753, 5682,6311,6345,6728,6428,6796,6851,7110,6467,6866,6892,7181,6938,7229,7261,7489,6684,6922,6970,7239,7019,7277,7316,7511,7086,7330,7378,7556,7418,7606,7637,7789,6792,7003,7070,72 99,7122,7353,7383,7592,7170,7406,7430,7616,7481,7657,7678,7819,7246,7478,7496,7670,7512,7 698,7663,7839,7576,7748,7766,7877,7773,7919,7939,8001,5744,6421,6440,6905,6646,6950,6981, 7250,6732,6990,7023,7291,7085,7334,7375,7595,6782,7079,7117,7337,7153,7385,7421,7623,7201,7434,7468,7651,7509,7675,7715,7845,6915,7127,7162,7420,7214,7457,7500,7665,7288,7502,75 24,7711,7577,7694,7758,7880,7349,7548,7601,7749,7624,7772,7791,7906,7658,7797,7796,7934,7 840,7947,7962,8039,7000,7197,7255,7503,7332,7527,7567,7726,7379,7593,7611,7767,7644,7778, 7795,7916,7423,7628,7666,7790,7683,7800,7842,7948,7724,7849,7866,7965,7893,7987,7999,8069,7490,7672,7706,7843,7757,7846,7887,7972,7763,7883,7909,7994,7930,8011,8032,8091,7780,79 20,7944,8018,7956,8035,8025,8097,7980,8047,8056,8113,8073,8121,8131,8152,4912,5226,5376,5 871,5480,6040,6115,6523,5561,6135,6193,6558,6259,6626,6636,7028,5582,6255,6303,6619,6350, 6798,6829,7095,6478,6833,6904,7172,6942,7220,7259,7505,5597,6337,6423,6816,6487,6901,6926,7208,6525,6961,6986,7266,7032,7309,7347,7530,6577,7009,7057,7324,7113,7374,7400,7583,71 36,7387,7437,7627,7445,7649,7673,7872,5959,6482,6511,6939,6564,6987,7030,7297,6657,7062,7 089,7361,7144,7410,7432,7598,6726,7093,7161,7395,7206,7444,7452,7638,7238,7454,7466,7677, 7545,7699,7742,7882,6785,7205,7225,7464,7276,7498,7504,7688,7314,7544,7570,7723,7613,7754,7768,7910,7360,7588,7625,7770,7660,7787,7823,7931,7704,7827,7850,7949,7867,7968,7990,80 67,5988,6547,6627,7051,6716,7090,7151,7417,6771,7167,7209,7455,7247,7473,7483,7685,6865,7 228,7273,7487,7313,7539,7563,7720,7357,7580,7612,7762,7640,7781,7809,7912,6929,7296,7345, 7569,7402,7602,7600,7782,7424,7630,7648,7803,7690,7824,7834,7952,7472,7661,7702,7830,7721,7856,7868,7973,7747,7879,7899,7995,7933,8013,8033,8092,6977,7369,7408,7632,7451,7656,76 92,7828,7537,7703,7729,7864,7735,7871,7891,7986,7549,7732,7746,7886,7785,7898,7924,8010,7 816,7932,7943,8019,7961,8040,8050,8100,7581,7793,7806,7913,7837,7935,7946,8028,7851,7959, 7974,8046,7991,8057,8071,8116,7901,7976,7996,8060,8016,8075,8081,8129,8029,8088,8096,8134,8107,8142,8151,8171,6101,6658,6742,7169,6856,7223, 7267,7514,6882,7279,7322,7543,7364,75 74,7622,7810,6964,7348,7414,7596,7439,7654,7642,7818,7459,7668,7696,7848,7727,7859,7875,7 981,7114,7425,7460,7652,7536,7687,7707,7865,7542,7728,7740,7876,7756,7892,7905,8003,7551, 7752,7777,7903,7814,7923,7940,8021,7831,7955,7960,8041,7975,8051,8063,8111,7140,7534,7538,7722,7555,7733,7761,7895,7587,7786,7804,7917,7826,7937,7958,8037,7701,7812,7838,7942,78 52,7966,7977,8048,7894,7979,7997,8061,8017,8074,8080,8128,7738,7855,7885,7967,7902,7993,8 006,8066,7928,8012,8023,8079,8036,8089,8099,8137,7945,8030,8043,8095,8055,8102,8110,8144, 8068,8114,8120,8149,8125,8157,8159,8179,7157,7558,7573,7808,7686,7821,7833,7954,7712,7847,7862,7970,7890,7984,8002,8064,7744,7873,7900,7988,7915,8008,8024,8078,7938,8034,8022,80 85,8049,8098,8106,8140,7817,7907,7922,8014,7950,8026,8042,8093,7964,8044,8054,8103,8062,8 108,8117,8148,7992,8058,8070,8112,8082,8122,8127,8155,8090,8133,8136,8161,8143,8164,8166, 8176,7853,7925,7963,8045,7983,8053,8059,8109,8000,8072,8076,8119,8086,8123,8135,8158,8005,8084,8094,8132,8105,8138,8139,8165,8115,8145,8147,8167,8153,8172,8174,8184,8038,8101,81 04,8141,8118,8146,8150,8169,8124,8154,8156,8173,8162,8175,8180,8186,8130,8160,8163,8177,8 168,8178,8181,8187,8170,8182,8183,8188,8185,8189,8190,8191]

Sequence Group 5: Q5_2048

[0,1,2,4,8,16,32,3,5,64,9,6,17,10,18,128,12,33,65,20,256,34,24,36,7,129,66,512,11,40,6 8,130,19,13,48,14,72,257,21,132,35,258,26,513,80,37,25,22,136,260,264,38,514,96,67,41,144,28,6 9,42,516,49,74,272,160,1026,520,288,528,192,544,70,44,131,81,50,73,15,320,133,52,23,134,384,7 6,137,82,56,27,97,39,259,84,138,145,261,29,43,98,515,88,140,30,146,1028,71,262,265,161,576,45, 100,640,1025,51,148,46,75,266,273,517,104,162,53,193,1032,152,77,164,768,268,274,518,54,83, 57,521,112,1024,135,78,289,194,85,276,522,58,168,139,99,86,60,280,89,290,529,524,196,141,104 0,101,147,176,142,530,321,31,200,90,1056,545,292,322,532,263,149,102,105,304,296,1030,163,9 2,1033,47,267,385,546,324,208,386,150,153,165,106,55,328,1088,536,577,548,1034,113,154,79,2 69,108,578,224,166,519,552,195,270,1041,641,1036,523,275,580,291,59,169,560,114,277,156,87, 1152,197,116,170,61,1042,531,525,642,281,278,526,177,293,388,1057,91,584,769,198,172,120,20 1,336,62,282,143,1029,1044,103,178,294,93,1058,644,202,592,323,392,297,770,107,180,1280,151, 209,284,1027,648,94,204,298,400,608,1089,352,325,533,155,210,305,547,300,109,1048,184,534, 1060,537,115,1090,167,225,326,306,772,157,656,329,110,117,212,171,1038,776,1064,330,1153,22 6,549,1043,538,387,308,216,416,271,279,158,337,550,672,1092,118,332,579,540,1072,389,173,10 37,121,553,199,784,179,228,338,312,1536,704,1154,390,174,554,581,1046,393,283,122,448,353,561,1096,203,63,340,394,1049,1281,527,582,556,181,295,1059,285,232,124,205,182,643,1156,562, 286,585,299,354,1045,211,401,1104,185,1061,396,344,586,645,1282,593,535,240,1050,206,95,32 7,564,800,402,356,307,301,417,1160,213,1066,568,1120,832,588,1035,1537,186,646,404,1091,22 7,896,594,418,302,649,771,360,539,111,1052,331,1168,214,309,1062,1284,188,449,1073,217,408, 609,596,551,650,229,159,420,310,1093,541,1288,773,610,657,333,1065,119,1098,600,339,1184,2 18,368,652,1031,230,391,313,450,542,1538,334,1076,233,555,774,175,123,1155,658,612,341,777, 220,314,1105,424,1068,395,673,583,355,1296,1094,287,183,234,1051,125,557,1216,660,616,342,316,1157,241,778,563,1074,345,452,397,403,1112,207,1540,674,558,785,1100,432,1039,357,187,1 162,236,664,1312,624,587,780,1080,1122,705,126,242,1063,565,398,346,456,358,405,303,569,15 44,244,1158,1097,595,1283,189,566,676,1169,1054,1108,361,706,589,1344,215,786,647,348,419,4 06,464,680,801,1069,362,1164,590,409,1286,570,1121,788,1552,1106,597,1075,572,1186,219,311,708,598,1289,601,651,421,792,802,611,1047,602,1172,410,231,688,653,1128,248,1070,369,190,36 4,1568,654,1095,659,1161,335,480,315,221,370,1285,613,1408,422,425,451,1077,614,543,1298,2 35,412,343,372,1185,775,317,1539,222,1099,426,453,237,1124,559,1170,1292,833,804,712,1082,8 34,661,1053,808,779,1217,617,604,1541,433,720,816,1101,1176,836,347,897,1136,243,1297,662,1600,454,318,675,1110,618,1081,898,781,1314,1220,376,428,1546,665,736,567,1107,1192,1078,84 0,625,238,1159,359,457,399,787,591,678,434,677,1290,1542,349,1300,1102,245,1188,458,666,111 3,620,1553,1163,1313,363,127,1067,191,1125,782,407,436,626,1218,571,465,681,246,707,1346,3 50,1084,599,668,1548,790,1165,1320,460,1123,1200,249,682,1664,573,1171,411,803,1116,789,1304,709,365,440,628,689,374,1224,423,1556,466,793,1130,250,371,1174,481,574,1348,413,1109,60 3,366,1545,1287,1055,468,1570,655,900,805,615,1166,684,1409,710,1187,429,794,252,1114,373,6 05,1232,848,690,713,632,1316,482,806,1132,1083,427,1177,904,1569,414,1291,223,1126,1554,66 3,692,835,1328,619,472,1137,455,796,1189,1601,809,714,1248,721,837,716,1086,1302,1352,864, 810,1173,606,1194,912,1103,722,696,377,1424,435,1293,1560,817,1129,1792,319,621,1180,812,4 84,1345,430,1572,1138,1299,838,667,1219,488,1111,239,378,459,622,1410,627,437,380,1201,160 8,818,1178,1294,461,1543,496,669,1190,1317,679,1140,1079,1221,724,841,1305,629,1584,351,46 7,1360,438,1115,737,251,462,442,441,1666,469,1549,247,683,1196,1226,842,1412,1127,738,1144, 1308,899,1602,670,1318,783,1085,849,1555,1193,820,1576,728,928,791,367,1376,901,1233,630,1 321,685,844,1204,633,711,1118,253,691,1301,824,1175,902,686,1668,1222,1416,1133,740,1347,8 50,375,1558,444,1306,470,1167,483,1547,415,485,905,1202,795,473,1240,634,744,1616,852,960, 1322,865,693,1131,1794,1350,797,1225,1604,1571,906,1252,715,1141,1330,807,474,636,1179,694, 254,1550,1665,717,1071,1315,575,913,1440,798,811,379,1208,1353,1191,697,1564,431,1142,607, 1228,489,1324,866,723,486,1573,1181,1234,908,1793,1561,718,813,1364,476,856,1117,1411,839, 1329,1295,1146,725,698,1472,914,1249,752,868,819,1349,814,439,929,1197,1578,490,1139,1680,623,1632,1336,671,1198,1362,739,1603,1557,1413,916,1303,463,1236,843,1135,381,1672,1354,4 97,1586,930,821,726,961,1203,1182,872,1418,492,1250,1332,631,1574,1223,729,1145,1605,700,1 796,443,1307,741,1378,1562,1356,1205,845,1319,920,382,1585,822,1425,851,1229,730,1609,498, 880,1256,742,445,1392,471,635,1148,1696,932,1580,687,1210,1420,1612,1325,1800,903,1134,82 5,1235,1361,500,1577,846,1670,1195,745,826,732,1264,446,962,1426,1620,936,1377,475,853,131 0,867,637,1551,1230,1414,907,1206,1667,1588,1333,487,1808,695,1441,1087,746,828,753,1610,8 54,1237,1326,857,1368,1209,504,799,1355,255,964,1242,909,1673,1559,1309,719,1143,477,1617, 915,1448,1380,638,748,944,1728,1331,1227,869,1592,1428,491,699,1253,1351,754,1183,1565,85 8,1618,1417,1476,478,968,1260,383,1212,910,1801,815,1579,976,870,1684,1633,917,1337,1241,1 606,1824,727,1150,1442,493,1357,1251,1676,873,1384,701,1566,931,1323,1798,1365,1473,756,1 334,860,499,731,1648,1238,823,1575,922,1199,1674,874,1432,1421,918,1636,1254,502,1795,933, 1366,1338,1682,1587,1211,1488,743,1358,760,1244,1581,881,1147,494,1379,1272,702,921,1624, 501,876, 1415,847,1856,1444,992,1697,447,1607,1436,1369,1257,1704,733,1797,1669,1340,1231, 827,1590,934,1634,1474,882,937,963,1419,747,1265,1119,505,1381,855,924,1810,734,829,1563,1 213,1611,1363,1430,1258,1688,1386,965,1614,1730,1239,938,884,506,1327,1589,1804,749,1370,1640,945,966,1456,1681,755,1266,859,1427,1593,1388,940,1214,830,1809,911,1621,1582,1832,8 71,639,1480,1698,1335,888,1372,1245,479,1422,1268,946,1732,1677,750,1802,1626,1393,969,50 8,1613,861,1446,1857,1339,757,1382,970,1700,1243,919,1594,1433,1826,1504,875,1635,1259,86 2,1920,1675,1445,758,1149,948,1359,1816,1596,1671,1712,977,1385,923,1622,972,1434,1311,1729,761,1396,877,1207,1475,1449,1812,952,1686,495,1262,1644,1619,1341,1429,1825,703,1371,1 638,1567,1736,935,1685,978,1625,883,762,1246,503,1458,925,1394,1269,878,1478,735,1799,167 8,1860,1443,1637,1481,1373,1699,1255,993,1591,1828,1452,885,939,994,1400,1744,1656,980,16 89,926,764,1270,941,1628,1367,1805,1457,1921,1583,1387,1642,967,1267,1484,1450,886,831,16 83,1342,1811,947,1705,1431,507,1261,1840,889,1650,984,1760,1490,1615,751,1702,942,1858,14 23,1460,1383,996,1692,1641,1814,971,1477,1273,1512,1733,890,1598,1374,509,1806,1922,1649, 949,973,1397,1489,1708,1627,1000,1690,892,1274,1438,1817,1390,1464,1868,950,1151,1731,1506,1827,1597,863,1451,759,1864,1714,1701,1395,1803,1008,1623,1482,1276,510,1435,1652,979,1 492,953,1928,1829,1389,1738,763,1872,974,1453,1643,1713,1818,1215,1402,1629,1520,1830,169 1,954,1459,1734,879,981,1505,1706,982,1924,927,1833,1639,1447,1746,1343,1679,1820,1761,14 79,1275,995,1740,1401,1888,765,956,1496,1861,887,1437,985,1720,997,1630,1813,1462,1398,16 45,1848,1687,1247,1716,1936,986,1483,1651,1745,943,1859,1508,1834,1454,891,1841,998,1595, 1278,766,1465,1709,1764,1646,1737,511,1485,1404,1693,1866,1952,1491,988,1657,1752,1807,13 99,1844,1001,951,1654,1926,1707,1391,1002,1468,1836,1494,1873,1271,1694,893,1923,1461,1748,1715,975,1862,894,1815,1497,1653,1510,1762,1842,1375,1703,1009,1466,1874,955,1739,1486, 1930,1889,1004,1658,1821,1718,1929,1599,1507,1776,1405,1735,1831,1493,1010,1984,1455,957, 1,865,983,1710,958,1514,1876,1768,1721,1938,1660,1500,1403,1892,1819,1741,1516,987,1932,14 63,1012,1843,1749,999,1838,1277,1647,1925,1498,1742,1513,1880,1717,1016,1953,1837,1867,1631,1469,1747,767,1904,1724,1524,989,1406,1754,1822,1835,1499,1944,1863,1890,1467,1003,152 2,1763,1695,1850,990,1005,1937,1722,1845,1495,1655,1765,1956,1487,1750,1869,1521,959,1896, 1263,1940,1770,1877,1509,1711,1756,1846,1011,1960,1784,1870,1662,1013,1985,1753,1927,152 8,1849,1882,1766,1511,1954,1719,1777,895,1439,1006,1878,1891,1939,1661,1502,1986,1852,193 4,1723,1772,1515,1897,1014,1470,1743,1931,1017,1968,1881,1894,1769,1517,1778,1941,1823,1659,1992,1875,1755,1501,1018,1900,1725,991,1933,1839,1525,1955,1988,1884,1726,1948,1780,15 18,1020,1767,1905,1851,1893,1945,1757,1530,1958,1471,1007,2000,1847,1898,1523,1942,1961,1 871,1771,1529,1912,1758,1989,1946,1526,1906,1883,1773,1957,1853,1976,1015,1751,1993,1503, 1962,1781,1885,1908,2016,1854,1532,1972,1774,1019,1895,1987,1969,1782,1279,1943,1899,1994,1663,1964,1785,1021,1935,1886,2001,1407,1779,1990,1970,1879,1022,1902,1947,1759,1907,15 27,1996,1786,1959,2002,1913,1949,2017,1534,1788,1910,1965,2004,1901,1966,1775,2008,1531,1 971,1950,1909,1991,2018,1727,1916,1855,1974,1995,2020,1977,1787,1914,2005,1887,1023,1963, 1998,1783,2024,1980,1903,1973,2003,1789,1997,2032,1978,1917,2010,1519,2019,2006,1951,1911,2021,2009,1790,2026,1975,2012,1967,1915,2025,2022,1981,1918,2033,1999,2028,1533,2011,19 82,2034,1979,2023,2013,2036,2007,2030,2014,2040,1535,2027,2029,2035,2037,1791,2038,2041,1 919,2042,2039,2044,2043,2031,1983,2046,2047,2015,2045]

Sequence Group 5: Z5_2048

[0,1,2,7,3,8,11,24,4,10,13,28,16,33,35,77,5,12,14,32,19,38,47,81,22,46,42,88,57,96,102, 166,6,17,21,40,23,45,51,90,29,55,59,97,72,110,116,184,34,61,75,114,80,123,133,195,87,135,146,2 21,151,232,252,363,9,18,26,54,30,58,71,105,36,76,62,117,84,127,140,204,44,74,86,134,92,143,150,227,100,153,168,244,182,260,277,402,53,89,98,149,111,160,176,257,121,177,194,269,206,291,3 07,433,137,202,224,297,230,308,331,462,249,339,357,483,376,504,541,725,15,25,31,73,39,79,82, 139,48,85,93,148,101,158,163,254,56,94,103,161,115,175,191,272,126,192,203,286,226,304,326,4 51,64,108,122,181,128,193,209,299,147,222,231,310,248,337,351,482,162,240,258,343,270,371,378,501,293,390,420,530,441,558,614,727,69,124,142,212,157,229,247,341,167,250,263,362,278,3 77,401,521,189,273,287,387,309,412,437,568,322,444,467,592,489,624,644,819,208,300,316,424, 344,450,471,607,375,479,502,636,532,648,700,874,399,512,542,675,553,715,737,915,611,751,773, 908,799,951,1005,1192,20,37,41,91,49,95,106,174,50,107,118,185,130,205,213,324,63,119,131,218,144,225,238,325,152,237,253,356,274,374,382,500,67,141,154,220,171,241,259,372,179,267,27 9,384,290,409,428,550,178,288,302,408,321,438,453,593,346,473,490,623,510,642,680,859,78,16 5,172,265,188,284,301,403,196,306,314,435,332,460,477,621,251,327,345,465,364,487,509,638,3 93,516,546,672,571,712,740,902,283,359,385,497,407,529,548,702,431,564,578,724,615,762,782,939,468,613,625,774,639,801,766,965,689,851,875,1016,881,1081,1115,1229,83,186,190,320,242, 336,350,472,266,355,365,494,392,518,545,704,280,388,406,519,422,549,573,730,445,581,606,756, 637,779,817,973,323,410,427,572,452,599,629,768,492,630,646,813,690,797,865,1022,527,666,7 08,853,731,880,905,1058,763,911,910,1105,967,1127,1155,1308,358,442,474,631,517,647,679,829, 547,703,717,876,748,887,909,1077,574,735,770,903,786,913,969,1129,827,978,1001,1161,1040,1 201,1226,1385,622,776,809,971,863,974,1030,1174,872,1026,1062,1215,1094,1247,1294,1444,88 9,1084,1123,1263,1146,1300,1278,1463,1189,1331,1352,1516,1396,1544,1581,1667,27,43,52,99,6 0,120,132,210,66,136,145,217,156,235,239,368,68,155,164,234,173,285,294,398,198,296,319,432, 334,455,475,634,70,170,187,289,200,317,328,448,211,340,352,480,370,505,524,650,223,360,381, 514,404,544,559,694,414,551,583,734,590,754,777,1011,109,199,207,333,219,353,369,496,245,38 3,394,536,417,566,580,706,264,397,426,556,447,588,595,742,464,597,604,781,664,802,845,1024,281,446,458,602,486,627,633,791,508,663,683,826,720,860,877,1065,535,699,732,879,764,900,94 3,1097,807,948,980,1130,1002,1165,1206,1378,112,215,236,379,262,395,421,570,276,429,449,598, 469,609,617,788,305,459,485,619,507,658,677,822,533,692,718,870,743,890,927,1068,329,495,5 23,681,560,709,707,893,575,736,752,916,793,945,957,1135,608,765,805,952,823,987,1004,1176,850,1020,1049,1216,1103,1253,1297,1451,348,540,565,738,594,761,795,949,655,806,834,997,838, 1008,1037,1199,667,836,849,1029,897,1048,1088,1244,936,1100,1121,1264,1153,1314,1336,1470, 693,907,922,1071,962,1107,1126,1287,981,1151,1179,1328,1207,1356,1391,1525,1053,1181,1219, 1363,1260,1402,1419,1571,1289,1435,1461,1591,1493,1628,1661,1772,129,246,268,430,303,457,481,641,312,488,513,661,537,686,729,929,342,525,569, 705,585,759,745,938,600,771,798,977,830, 991,1014,1190,
405,576,601,757,654,790,810,1000,660,833,843,1015,862,
1038,1057,1233,668,85 6,884,1055,934,1087,1117,1267,
954,1143,1152,1319,1180,1337,1371,1509,416,653,657,
824,671,8 37,869,1044,698,898,919,1079,946,1112,1148,
1303,804,931,964,1119,983,1162,1183,1333,1041,1 186,
1222,1365,1262,1398,1415,1569,842,986,1028,1164,1054,
1212,1236,1377,1092,1251,1272,14 12,1301,1437,1468,
1607,1124,1292,1324,1460,1351,1484,1508,1632,1382,
1519,1541,1656,1556,1 693,1700,1831,425,673,685,925,
789,941,956,1141,815,975,995,1169,1034,1195,1231,1373,
847,10 12,1051,1203,1075,1239,1275,1407,1114,1298,
1269,1429,1334,1465,1492,1613,937,1059,1086,12
55,1133,1280,1321,1456,1159,1325,1350,1485,1369,1495,
1527,1651,1208,1359,1388,1513,1421,1 548,1563,1681,
1442,1586,1604,1712,1629,1732,1736,1804,984,1089,
1156,1326,1193,1346,1360,1 504,1227,1395,1404,1536,
1431,1549,1593,1698,1235,1427,1458,1584,1490,1608,
1611,1734,1521, 1634,1647,1749,1674,1776,1791,1867,
1306,1480,1486,1624,1532,1636,1658,1755,1554,1680,168
6,1786,1717,1792,1833,1888,1577,1709,1729,1814,1752,
1819,1846,1909,1765,1850,1864,1922,18 78,1934,1943,
1982,138,113,65,275,104,255,180,470,125,183,201,418,
216,338,311,528,159,214,23 3,318,256,386,354,603,292,
366,400,503,434,659,562,785,169,243,261,373,295,391,
439,543,313,4 61,413,726,493,577,612,1009,335,443,515,
589,478,632,697,895,538,684,656,812,741,930,839,117
8,197,282,298,423,330,454,499,618,361,555,463,645,526,
669,714,848,389,491,587,695,563,780,6 82,873,520,719,
800,906,758,1042,950,1330,415,584,539,749,649,728,820,
921,610,857,772,988,81 1,961,1142,1080,674,828,867,
1063,894,998,1023,1200,923,1101,1047,1293,1131,1420,
1245,1564, 228,315,349,484,380,511,554,701,411,620,531,
722,579,746,792,970,436,561,651,755,605,844,775, 955,
670,814,885,1003,861,1032,1091,1220,466,640,591,796,
716,831,891,1019,696,933,846,1150, 917,1060,1069,1270,
750,882,976,1090,947,1111,1170,1438,1017,1188,1136,
1285,1230,1339,1370, 1598,506,662,733,871,688,896,959,
1099,767,992,918,1211,1025,1120,1167,1318,803,942,
1033,11 44,1078,1184,1266,1349,979,1241,1194,1406,
1290,1384,1462,1644,835,1052,1095,1249,996,1217, 1277,
1479,1125,1312,1343,1414,1228,1517,1445,1806,1154,
1329,1364,1505,1387,1467,1494,169 1,1296,1538,1557,
1623,1580,1757,1660,1927,271,367,396,557,440,626,582,
784,456,596,710,818, 652,854,886,1046,498,676,635,868,
713,953,840,1076,760,899,968,1106,924,1198,1163,1433,
534,7 23,687,1010,808,892,928,1113,747,944,985,1256,
1027,1139,1185,1353,825,1045,999,1210,1096,1 173,1261,
1381,1067,1240,1282,1401,1317,1448,1511,1618,567,864,
739,963,778,1056,990,1218,8 41,1018,1083,1191,1110,
1248,1288,1422,904,1145,1070,1341,1039,1258,1281,
1497,1187,1311,13 57,1452,1383,1477,1543,1707,940,
1160,1108,1295,1205,1332,1403,1531,1252,1428,1345,
1502,13 68,1589,1560,1685,1128,1394,1466,1575,1436,
1550,1640,1678,1487,1626,1599,1744,1669,1725,1 777,
1938,628,794,878,1043,920,1074,1168,1302,960,1224,
1093,1327,1137,1274,1386,1529,852,11 18,1157,1366,
1214,1449,1342,1515,1273,1409,1432,1582,1310,1633,
1558,1832,1013,1177,1246,1 474,1305,1418,1399,1616,
1204,1440,1507,1570,1483,1594,1655,1731,1361,1499,
1464,1605,1530, 1695,1639,1751,1561,1662,1710,1785,
1687,1770,1847,1887,1050,1259,1323,1439,1225,1537,146
9,1622,1379,1476,1579,1648,1506,1668,1714,1800,1286,
1551,1523,1673,1585,1728,1689,1796,16 30,1702,1760,
1781,1743,1863,1838,1912,1411,1609,1566,1723,1653,
1810,1704,1827,1539,1762,1 737,1844,1748,1855,1877,
1997,1601,1803,1787,1892,1775,1870,1902,1948,1823,
1897,1885,1965, 1919,2017,1956,2029,347,419,476,643,
522,665,711,888,552,783,691,972,744,914,1006,1166,586,
721,821,932,769,1073,966,1197,855,1036,1109,1338,1021,
1221,1254,1454,616,816,787,994,866,1 031,1098,1268,
935,1147,1061,1234,1134,1291,1375,1501,901,1116,1085,
1284,1172,1354,1320,14 81,1213,1367,1408,1659,1424,
1568,1542,1722,678,832,926,1072,993,1102,1242,1309,
883,1122,11 82,1340,1138,1397,1347,1524,982,1202,1223,
1447,1158,1374,1430,1578,1299,1459,1393,1553,14
96,1600,1637,1769,1066,1238,1322,1413,1276,1475,1453,
1615,1358,1534,1503,1595,1446,1641,1 665,1758,1265,
1547,1520,1649,1583,1703,1682,1797,1489,1675,1718,
1859,1742,1837,1818,1931, 753,1007,912,1171,958,1316,
1149,1425,1082,1196,1271,1417,1250,1390,1472,1619,
1064,1362,12 83,1510,1237,1457,1443,1643,1344,1491,
1555,1603,1533,1670,1692,1789,1132,1307,1380,1478,1
405,1574,1526,1708,1313,1514,1610,1684,1552,1663,
1735,1811,1426,1596,1573,1697,1645,1764, 1720,1829,
1635,1740,1794,1842,1774,1866,1874,1971,1209,1434,
1348,1565,1389,1540,1606,172 6,1455,1666,1590,1713,
1625,1747,1761,1848,1488,1650,1617,1771,1696,1754,
1801,1910,1676,18 21,1778,1862,1812,1884,1899,1946,
1522,1621,1705,1788,1664,1798,1826,1879,1739,1854,
1808,1 896,1843,1905,1921,1963,1724,1830,1856,1939,
1876,1914,1926,1985,1816,1933,1950,1978,1957, 1991,
2004,2034,858,1035,989,1279,1104,1315,1257,1471,1140,
1232,1392,1576,1355,1498,1545,1 677,1175,1372,1335,
1512,1441,1638,1535,1701,1423,1559,1597,1746,1620,
1719,1779,1858,1243, 1450,1410,1567,1482,1588,1602,
1727,1376,1614,1654,1780,1688,1767,1756,1869,1518,
1657,170 6,1753,1679,1795,1813,1890,1642,1824,1790,
1881,1840,1907,1918,1973,1304,1400,1528,1652,14
73,1631,1699,1783,1572,1733,1671,1768,1562,1802,1817,
1895,1592,1690,1711,1861,1738,1809,1 834,1942,1763,
1852,1825,1904,1873,1915,1936,1981,1627,1716,1784,
1835,1745,1882,1853,1923, 1805,1845,1891,1929,1865,
1961,1944,1988,1773,1880,1903,1947,1916,1968,1958,
2001,1898,195 3,1979,2009,1972,1995,2013,2037,1416,
1500,1546,1694,1612,1759,1683,1822,1587,1721,1715,18
49,1750,1868,1841,1935,1646,1793,1741,1836,1807,1857,
1893,1928,1782,1883,1901,1945,1875,1 954,1967,2000,
1672,1766,1828,1871,1799,1906,1886,1951,1815,1894,
1913,1983,1932,1959,1962, 2008,1851,1925,1941,1966,
1920,1989,1974,2006,1908,1977,1994,2021,1987,2012,
2019,2043,173 0,1820,1839,1924,1872,1900,1940,1969,
1860,1911,1930,1975,1949,1992,1984,2015,1889,1937,19
52,1990,1960,1980,1999,2025,1964,2003,1996,2018,2007,
2023,2027,2046,1917,1955,1970,1998,1 976,2002,2011,
2022,1986,2010,2005,2030,2016,2031,2026,2042,1993,
2014,2020,2032,2024,2033, 2035,2039,2028,2036,2038,
2041,2040,2047,2044,2045]

Sequence Group 5: Q5_4096

[0,1,2,4,8,16,32,3,5,64,9,6,17,10,18,128,12,33,65,20,
256,34,24,36,7,129,66,512,11,40,6 8,130,19,13,48,14,72,
257,21,132,35,258,26,513,80,37,25,22,136,260,264,38,514,
96,67,41,144,28,6 9,42,516,49,74,272,160,1026,520,288,
528,192,544,70,44,131,81,50,73,15,320,133,52,23,134,
384,7 6,137,82,56,27,97,39,259,84,138,145,261,29,43,98,
515,88,140,30,146,1028,71,262,265,2048,161,5 76,45,100,
640,1025,51,148,46,75,266,273,517,104,162,53,193,1032,
152,77,164,768,268,274,518,5 4,83,57,521,112,1024,135,
78,289,194,85,276,522,58,168,139,99,86,60,280,89,290,
529,524,196,14 1,1040,101,147,176,2049,142,530,321,31,
200,90,1056,545,292,322,532,2050,263,149,102,105,304,
296,1030,163,92,1033,47,267,385,546,324,2052,208,386, 150,153,165,106,55,328,1088,536,577,5 48,1034,113,154,
79,269,108,578,2056,224,166,519,552,195,270,1041,641,
1036,523,275,580,291,5 9,169,560,114,277,156,87,1152,
197,116,170,2064,61,1042,531,525,642,281,278,526,177,
293,388,1 057,91,584,769,198,2080,172,120,201,336,62,
282,143,1029,1044,103,178,294,93,1058,644,202,20
51,592,323,392,2053,297,770,107,180,1280,151,209,284,
1027,648,94,204,298,400,608,2112,1089, 352,325,533,155,
210,305,2057,547,300,109,1048,184,534,1060,537,115,
1090,167,225,326,2054,3 06,772,157,2065,656,329,110,
117,212,171,1038,776,1064,330,1153,2058,226,549,1043,
538,387,30 8,216,416,271,279,158,337,2066,550,672,1092,
118,332,579,540,1072,2176,389,173,1037,121,553, 199,
784,179,228,338,312,1536,704,1154,390,174,554,581,
1046,393,2060,283,2081,122,448,353,2 113,561,1096,203,
63,340,394,1049,1281,527,582,556,181,295,1059,285,232,
124,2068,205,182,64 3,2304,1156,562,286,585,299,354,
2082,1045,211,401,1104,185,1061,396,344,586,645,1282,
593,53 5,240,2072,1050,206,95,327,2084,564,800,402,
2055,356,307,301,417,1160,213,1066,568,1120,83 2,588,
1035,1537,186,2177,646,404,2114,1091,227,896,594,418,
2560,302,649,771,360,539,2059,1 11,1052,331,1168,214,
309,1062,1284,2088,188,449,1073,217,408,609,596,2116,
551,650,229,159,4 20,2178,310,1093,541,1288,773,610,
657,333,1065,119,1098,2067,2061,600,339,1184,218,2096,
36 8,652,1031,230,391,313,450,542,1538,334,1076,233,
555,2062,774,175,123,1155,658,2120,612,34 1,2305,777,
220,314,2069,1105,424,1068,395,673,583,355,1296,2180,
1094,287,183,234,1051,125, 557,1216,660,616,342,316,
2083,1157,241,778,2306,563,2074,1074,345,452,397,2561,
403,1112,20 7,2128,1540,674,558,785,1100,432,1039,357,
187,1162,236,664,1312,624,587,780,1080,2085,1122, 705,
2073,126,242,2070,1063,565,398,2184,346,456,2308,358,
405,303,569,2312,1544,244,1158,10 97,595,1283,189,566,
676,1169,1054,1108,361,2086,706,589,2562,1344,215,786,
647,348,2144,211 5,419,406,464,680,801,2089,1069,362,
1164,590,409,1286,570,1121,788,1552,2192,1106,2076,
597, 1075,572,1186,219,311,2117,708,598,2090,1289,601,
651,421,792,802,2564,611,1047,602,1172,41 0,231,2097,
688,653,1128,248,1070,2122,369,2320,190,364,1568,654,
2208,1095,659,1161,335,480, 315,221,3074,370,1285,613,
2568,1408,422,425,2336,451,1077,614,543,1298,235,412,
2576,343,3 72,2240,1185,775,317,2592,2118,1539,222,
1099,426,2092,453,237,1124,559,1170,2179,1292,833,
804,712,1082,834,661,1053,808,779,2129,1217,617,604,
2098,1541,433,720,2121,816,1101,2063,1 176,836,2368,
347,897,2181,1136,243,1297,2100,662,2071,1600,454,318,
675,1110,618,2182,1081, 898,781,1314,1220,376,428,
1546,665,736,567,1107,2432,1192,1078,840,2124,2185,
625,238,2130, 1159,359,457,2104,399,787,2075,2145,591,
678,434,677,2087,1290,1542,349,1300,1102,245,1188,
458,666,1113,620,1553,1163,2307,1313,363,2132,127,
1067,191,2186,1125,782,407,2193,436,626, 2309,2077,
1218,571,465,681,2091,246,707,2146,1346,350,1084,599,
668,2563,1548,790,1165,132 0,460,1123,2136,1200,249,
2188,682,1664,573,1171,411,803,2078,1116,789,2194,
1304,709,365,44 0,628,689,3076,2119,374,1224,423,2310,
1556,466,793,2313,1130,250,371,1174,481,574,1348,220
9,413,2624,1109,603,366,2093,1545,2148,1287,1055,468,
1570,655,900,2688,805,615,3073,1166,6 84,1409,710,
2099,1187,429,794,2196,252,1114,373,605,1232,848,690,
2094,2123,713,632,2314,13 16,482,806,2321,1132,2565,
1083,427,2152,1177,904,2210,1569,414,1291,2101,223,
1126,2241,155 4,663,3080,692,835,1328,619,472,2200,
1137,455,796,2125,1189,1601,809,714,2212,1248,721,837,
2816,716,1086,2316,1302,1352,864,2322,2566,810,2102,
1173,606,1194,2131,912,2105,2569,1103, 722,696,377,
1424,435,2160,1293,1560,817,1129,1792,319,621,1180,
812,484,3072,1345,430,1572, 2183,1138,2126,1299,838,
2337,2242,667,1219,488,2133,1111,239,378,2324,2570,
459,622,2106,2 216,1410,627,437,2187,380,2147,1201,
1608,818,1178,1294,461,2134,1543,496,669,1190,1317,67
9,1140,1079,2108,1221,724,2328,841,1305,629,2137,1584,
351,467,2338,2577,1360,438,2572,224 4,1115,737,251,
462,2189,442,441,3088,2149,1666,469,2195,1549,247,683,
2224,1196,1226,842,14 12,1127,738,1144,2190,1308,899,
2578,1602,670,1318,783,2369,1085,849,2079,1555,1193,
820,224 8,1576,728,928,2138,791,367,3104,2593,1376,
901,1233,630,2340,2370,1321,685,844,2580,1204,6
33,711,1118,253,691,2311,1301,2197,824,2150,1175,902,
686,2153,1668,1222,2352,1416,1133,740, 1347,850,375,
2344,1558,444,3078,1306,2211,470,1167,483,2140,1547,
415,3081,485,2095,905,12 02,795,473,2315,1240,634,744,
2433,2594,1616,852,960,2372,1322,865,693,2256,1131,
2434,1794, 1350,797,2198,2201,1225,2213,1604,1571,906,
1252,2154,715,1141,2103,2376,1330,807,3136,474, 636,
1179,694,254,2584,1550,1665,717,2625,1071,1315,575,
913,2596,1440,798,811,3082,2161,37 9,1208,2202,1353,
2127,1191,697,2317,2156,1564,431,2626,1142,607,2272,
1228,2214,489,2567,2 600,1324,866,723,2243,486,1573,
2318,1181,1234,3089,908,1793,1561,718,813,2689,1364,
476,85 6,3084,1117,1411,839,1329,2571,1295,2323,1146,
725,2628,2339,698,1472,914,2107,1249,752,868, 2217,
2608,2162,819,2325,2204,1349,814,439,2135,929,3200,
2245,1197,1578,490,2164,1139,168 0,623,2218,1632,1336,
671,1198,1362,739,1603,1557,2109,1413,916,3090,2579,
1303,463,1236,84 3,2573,2690,1135,381,2329,2326,1672,
1354,497,2574,2225,1586,930,821,2341,2436,726,961,310
5,2139,1203,1182,872,2632,2817,1418,492,2246,1250,
1332,631,1574,1223,729,2220,1145,2168,1 605,700,2249,
1796,443,1307,741,2384,1378,1562,2110,1356,1205,845,
2330,1319,920,382,2191,3 077,1585,822,3092,2151,1425,
2226,851,1229,730,2342,2141,1609,498,3106,880,2692,
1256,742,4 45,2250,1392,471,635,2640,1148,2371,1696,
932,2440,1580,687,2345,1210,1420,2818,1612,1325, 1800,
903,2155,1134,825,2228,1235,1361,500,3328,1577,2199,
846,1670,2257,2332,1195,745,3075, 826,2696,732,1264,
446,962,2142,2252,1426,1620,936,2346,2448,1377,475,
853,2656,1310,867,63 7,3137,2400,1551,2373,1230,2581,
1414,907,2203,2258,1206,1667,2353,1588,1333,487,1808,
2595, 695,1441,2348,2157,1087,746,3096,828,2232,753,
1610,854,2582,1237,1326,3108,857,2585,1368, 1209,504,
799,2163,1355,255,964,3138,2215,1242,909,1673,2273,
1559,2374,1309,719,2354,2820, 1143,477,2205,1617,915,
2704,2377,1448,2158,2165,2260,1380,638,748,2219,944,
1728,3086,2824, 1331,1227,3112,869,1592,1428,491,699,
2378,1253,1351,754,3201,1183,1565,858,1618,2274,141
7,2597,1476,478,3091,2586,2435,968,1260,383,2356,2264,
1212,910,2464,2319,2327,1801,815,22 06,2385,1579,976,
2598,2720,870,3140,2166,1684,1633,917,2380,2627,1337,
1241,2588,1606,1824, 3120,727,1150,1442,493,1357,2437,
1251,2221,1676,873,3085,2169,1384,701,1566,931,2601,
224 7,1323,1798,2832,2227,1365,1473,756,2276,2386,
1334,860,499,2360,3584,2752,731,3202,2438,1 648,2222,
1238,823,2602,2629,1575,3094,922,2441,1199,1674,874,
2331,1432,1421,918,2170,1636, 2496,1254,502,2401,1795,
933,1366,2609,1338,1682,3144,2251,1587,1211,1488,743,
2111,2388,13 58,760,2442,3097,1244,1581,881,3329,2575,
1147,2630,494,1379,2604,2229,2343,1272,702,3107, 921,
2333,1624,501,876,2280,2172,1415,847,2253,1856,2230,
1444,992,2691,1697,447,3204,2610, 1607,1436,2334,1369,
2633,1257,1704,733,2347,1797,1669,2402,1340,1231,827,
3093,1590,2259,9 34,1634,2449,3152,2233,1474,882,3109,
937,2444,2392,963,1419,747,2634,2693,1265,1119,3330, 505,2641,2583,1381,855,924,2288,1810,734,829,3098,2254,1563,1213,2143,1611,2375,1363,2612, 2848,1430,1258,2450,1688,1386,965,2404,1614,2355,1730,2349,2465,1239,938,3208,884,2261,5 06,1327,3114,2616,1589,1804,3168,749,2880,1370,1640,945,966,2636,3083,1456,1681,755,3585, 2234,1266,859,1427,2694,1593,2452,1388,940,3139,2275,2944,1214,830,2642,2466,1809,911,2350,2697,1621,2819,1582,2408,2587,1832,871,2159,639,1480,3100,2379,1698,1335,3216,888,2262, 1372,1245,479,2357,1422,1268,3110,946,3332,1732,1677,750,1802,2236,1626,2497,1393,969,312 1,2265,2456,508,1613,861,2657,2644,1446,1857,2599,2698,2277,1339,757,2207,2468,1382,970,2 358,3141,2589,3336,2821,1700,2658,1243,919,2705,2381,1594,1433,3113,2167,1826,1504,3146,875,1635,1259,862,1920,2648,1675,2387,1445,758,3232,2266,1149,948,1359,2416,2700,1816,1596, 3079,2278,2439,1671,1712,977,2361,2498,1385,923,2590,3586,2382,1622,972,3124,2281,1434,2 603,1311,2822,2223,2171,1729,3203,761,2706,1396,877,2660,2389,1207,1475,2825,1449,2268,18 12,952,2362,1686,495,1262,3153,2472,1644,1619,3116,2443,1341,1429,1825,703,2721,2631,1371,1638,2403,3344,1567,1736,935,3142,2335,1685,2231,978,1625,2282,3099,2173,2605,883,3264,7 62,2708,2664,1246,503,2390,2364,1458,3205,925,2289,1394,2826,1269,878,2611,1478,735,3122, 2393,1799,1678,2500,1860,2445,1443,1637,2451,1481,1373,3160,2255,1699,1255,993,3588,2722, 1591,2606,1828,2833,3148,2480,1452,885,3087,939,2405,2235,994,1400,3210,2284,2712,1744,1656,3360,980,2672,2635,1689,926,764,2828,3128,1270,941,3170,2753,1628,1367,2174,1805,2290, 1457,3111,2613,2446,1921,1583,2394,2504,1387,1642,967,2406,1267,2453,1484,2351,2617,1450, 886,3592,2292,831,1683,3206,3145,2643,1342,1811,3331,947,2237,2614,1705,1431,507,2724,321 7,1261,1840,3102,889,3156,2409,1650,984,1760,2754,1490,2637,1615,751,3392,2263,2834,1702, 942,2695,2396,1858,2467,2454,1423,2512,1460,2728,2849,1383,996,3117,2410,1692,3212,2638,1 641,2457,1814,3334,971,2618,1477,1273,3169,2836,1512,1733,3600,890,3154,1598,1374,509,180 6,2645,3123,1922,2620,1649,949,3234,2267,2359,973,1397,2756,2646,1489,1708,3337,2649,2699, 2469,1627,1000,2840,2850,1690,892,2659,3095,2650,1274,3220,2458,1438,2279,1817,2736,2701, 1390,1464,3176,2296,1868,3118,950,2417,1151,1731,1506,2238,1827,2412,1597,863,3616,2702, 1451,759,1864,3143,2707,1714,1701,3209,2383,2528,1395,1803,1008,2363,2269,1623,1482,2418, 3333,2661,1276,510,3456,2470,1435,2473,1652,2499,3125,2662,2591,3346,979,2283,2460,1492,9 53,2391,2420,1928,1829,3233,2823,1389,2365,1738,763,1872,974,1453,3587,2270,1643,1713,3147,2474,1818,1215,1402,2501,2285,1629,1520,3172,2607,3218,1830,1691,954,3340,2881,1459,285 2,1734,2760,3130,2882,2709,879,3101,981,2856,2827,1505,3265,2665,2652,1706,3589,982,2481, 2768,1924,927,2864,3149,1833,3224,2884,1639,1447,2395,1746,2945,1343,1679,3184,2291,1820, 1761,3345,2710,1479,1275,995,3648,2502,1740,2366,1401,2723,3158,2666,1888,765,3129,2946,2829,956,1496,3362,3268,2424,2476,1861,3594,887,2713,2784,1437,985,2615,3155,1720,3240,997, 3126,2888,1630,1813,2673,1462,2286,1398,3207,2407,2505,1645,2447,2835,1848,1687,2639,124 7,2726,1716,2482,2725,1936,986,3338,3590,2397,1483,3348,3150,2293,1651,1745,3236,943,2506, 2714,1859,1508,3161,2668,3601,1834,1454,3211,891,3361,2411,1841,998,1595,2175,3115,1278,2 239,766,3173,2830,2455,1465,2484,2674,1709,3266,2619,2513,1764,2729,1646,2294,2755,1737,511,3394,2398,1485,3132,2647,1404,2716,1693,3596,2838,1866,1952,3213,3368,2508,1491,3171,9 88,3248,2297,1657,1752,1807,2730,3712,1399,2621,1844,1001,3219,2459,2851,951,1654,3164,28 37,1926,1707,3352,2757,2413,2488,1391,1002,2676,2737,1468,2422,3272,2471,1836,3604,2514,1 494,2841,1873,3178,2298,2419,1271,3222,2529,2622,1694,3396,893,2461,1923,1461,3157,2651,1 748,2414,1715,975,3593,1862,894,1815,3335,3103,2516,1497,1653,3618,2703,2948,1510,1762,28 53,2663,1842,1375,3214,2732,3457,2758,1703,1009,3235,2477,1466,2842,1874,2300,3162,2421,2 653,3280,955,2896,2738,1739,2761,2680,1486,1930,3364,2530,2854,1889,1004,3180,1658,1821,3 131,2475,1718,1929,3225,2952,1599,1507,1776,3617,2462,1405,1735,3339,2271,3174,1831,1493, 1010,3602,2711,1984,2740,1455,2883,3376,2667,2520,957,3185,2503,2844,1865,3237,3649,2857,2762,3296,983,2769,2885,1710,958,2764,3134,1514,3350,3400,2912,1876,1768,1721,2858,1938,1 660,3221,2654,1500,3242,2960,1403,1892,3151,2770,1819,2744,1741,2425,3472,2483,1516,987,3 341,3608,2865,1932,3177,3840,2367,2669,1463,3228,1012,2860,2532,1843,3393,2478,3620,1749, 3186,999,3347,2886,1838,1277,2715,3267,1647,2536,3159,2287,2426,1925,2507,2670,1498,1742, 3458,2675,1513,2485,1880,2428,1717,1016,3249,3656,2866,1953,3226,3342,2509,1837,1867,359 1,2544,2717,1631,1469,3238,3365,2727,3188,1747,3127,767,3269,2772,1904,1724,2889,3353,152 4,2677,989,3632,2399,2515,1406,3408,2486,1754,3163,2785,2299,2510,1822,2490,2489,1835,371 4,2517,1499,3597,2295,1944,2731,1863,3244,3274,2890,1890,3460,3175,2786,1467,3192,1003,33 56,2947,1522,1763,3650,2718,3366,1695,2831,1850,990,3133,2897,1005,1937,3603,3241,2868,1722,3624,2776,2976,1845,2839,2415,1495,3424,2949,3281,2678,1655,3369,2733,1765,2892,1956,3 252,2681,2759,3166,2301,2739,1487,3349,2872,1750,1869,3223,2950,2734,1521,959,3716,3270,1 896,1263,3464,3181,2788,1940,1770,3395,2898,2423,1877,1509,3606,2492,1711,1756,3354,2518, 3215,2531,1846,1011,3595,2463,1960,2533,2953,3250,2843,2521,3288,2682,2792,1784,3664,2900,3008,1870,3370,2913,2741,1662,1013,3179,1985,3842,3398,2845,1753,1927,3273,1528,1849,18 82,3652,3619,2954,1766,3300,2763,3189,1511,1954,3378,2855,1719,2522,1777,2684,3227,2742,2 302,895,3598,3713,2765,1439,3119,3363,2623,2961,3488,1006,2846,2859,1878,2427,3256,1891,3 401,3239,2745,1939,1661,3612,1502,2479,1986,3190,2655,1852,3276,2537,1934,1723,3372,2914, 1772,2771,1515,2534,3621,1897,1014,3229,3282,2956,1470,3841,3609,2766,2861,1743,3412,252 4,2904,1931,3165,3459,2887,3377,3343,1017,3194,2773,1968,1881,2746,3520,1894,2962,3297,28 00,2916,1769,2867,1517,1778,3397,2862,2487,1941,2977,1823,3245,3626,2538,1659,3187,3728,2 671,1992,1875,3680,3384,2719,1755,3246,3410,2787,3651,1501,3605,1018,3461,2964,1900,3351, 2511,3284,1725,2891,991,3183,2429,1933,3720,3402,2545,3634,2978,2869,1839,2774,3009,1525,3251,3230,2920,1955,3466,1988,2540,1884,3298,3380,2679,3622,3271,2777,1726,3193,3653,274 8,1948,1780,3844,2491,3355,2789,1518,1020,3426,3610,1767,3404,3253,2893,1905,3367,2968,24 30,1851,3633,2870,1893,3473,2899,3277,2778,1945,3657,2546,1757,2928,3304,2790,2493,3440,2 519,2683,1530,3196,3744,2980,1958,3628,2735,1471,1007,3258,3468,2000,3660,3373,3848,2951, 1847,1898,3182,2873,1523,1942,3283,3409,2548,1961,3625,2894,3718,1871,3243,2793,1771,287 4,2780,3312,2494,3010,3474,3668,2984,1529,3425,2523,2901,3358,2915,2685,1912,3599,1758,32 78,3462,2955,1989,1946,3254,3715,1526,1906,3636,3381,2535,1883,3856,2743,3489,1773,1957,3 135,2794,1853,2876,1976,2801,3658,2902,1015,3285,3374,2905,3416,3257,2552,2847, 3403,2303, 3012,1751,3290,2957,3721,3607,3357,2767,
1993,1503,3191,1962,2525,3665,2963,1781,3496,188
5,1908,3428,2686,2796,2016,2992,3776,1854,3379,3275,
2917,1532,3640,3476,2539,2747,1972,33 01,3399,2802,
1774,3231,3613,2906,3666,3465,1019,3524,2526,1895,
3016,3308,1987,2431,3260,2 958,1969,3849,2863,1782,
3627,3024,1279,2918,1943,3732,3681,2965,1899,3385,
3289,1994,1663, 3654,3872,2775,3198,3490,2541,3405,
1964,3299,3724,2921,1785,3432,2749,3614,2979,1021,337
1,3846,1935,3413,3521,2804,3382,2908,2547,1886,2779,
2001,3696,3286,2871,1407,3623,1779,29 70,3247,3722,
2922,3480,3469,2966,1990,3684,3302,2550,1970,3843,
2981,3414,1879,1022,3386,3 730,3635,3259,3536,2791,
1902,3406,2808,1947,3292,3629,2929,3195,2542,3427,
1759,3320,2750, 1907,2969,3672,2549,2924,3463,2895,
1527,3904,3492,3040,3745,2495,1996,3655,3484,1786,341
7,3305,3752,2781,1959,2002,3845,3717,1913,3388,3279,
2875,1949,3638,2982,3682,2017,3522,29 30,1534,2985,
3011,3467,2795,3313,3167,2553,3429,2903,2972,3858,
2782,2877,1788,3611,3261,3 659,3411,1910,1965,3478,
3306,2004,3736,3434,3013,1901,3662,3778,1966,1775,
3287,2986,2932, 2008,2554,3375,3637,3852,2797,3418,
3688,2993,3014,3504,3729,2803,1531,3314,2907,3475,364
1,3436,2988,1971,3262,1950,2878,3857,2959,1909,3669,
3630,1991,3880,2919,2018,2687,3528,17 27,3746,3383,
2936,1916,3420,3293,2527,1855,3470,3316,2994,3780,
3725,2798,3850,3674,3441,3 017,1974,2556,3661,2909,
3494,3905,1995,3387,2805,3430,3018,2020,1977,3748,
3291,2967,1787, 3642,3481,1914,3874,3552,2923,3683,
3307,2910,3968,2005,3723,3493,2806,1887,3197,2996,340
7,1023,3864,3644,3719,3760,3025,3433,2971,1963,3670,
3020,3482,3359,1998,3777,1783,2809,34 44,2925,3255,
3523,2024,3497,3860,3000,3734,2543,3310,1980,3692,
3667,3389,3477,3873,2751,1 903,3419,3686,1973,3615,
3784,2983,3733,3026,3673,2003,2931,1789,2810,3294,
2551,3506,2973, 3442,3317,2926,3526,2783,1997,3847,
3726,3908,3491,3685,2032,1978,3529,3421,3747,3303,304
1,1917,3639,3876,2010,3500,2933,2987,3042,3448,3792,
3704,3028,3737,2974,2812,3318,2989,15 19,3676,3415,
3853,3505,2019,3969,3631,2006,3435,3690,3015,1951,
3315,3532,1911,3498,2934,2 021,2879,3731,3390,3859,
2995,3753,3479,2555,3309,3888,2937,3698,3032,3808,
3538,3663,2799, 2009,3750,2990,3906,1790,3471,3508,
3431,3044,2026,3740,1975,3689,3862,3019,2012,3525,332
1,3560,3781,2938,3646,3422,2557,3854,3970,3697,2997,
1967,3021,3445,3537,3756,3675,3048,37 38,2940,1915,
3322,3486,3865,2025,3438,3512,2022,3916,2998,3199,
3779,3554,1981,3875,3645,2 911,3499,2807,3912,3762,
3749,3443,3851,3056,3671,3530,1918,3324,2558,3483,
3700,2033,1999, 3027,3540,3001,3976,3877,3437,3786,
2811,3920,3022,3501,2028,3691,3761,3866,3263,3450,153
3,3677,3568,3878,3739,3002,3507,3782,2011,2927,3029,
3553,3754,3030,3972,2975,3881,1982,36 87,3495,3794,
3391,3727,2034,3868,3809,3527,3323,3043,1979,3788,
3449,2023,3936,2813,3004,3 544,3909,2935,3485,3033,
3768,3045,3678,3861,3510,3446,2013,3693,3896,3735,
2036,3295,3764, 3984,3034,2007,3531,3699,3793,2991,
3907,3556,3882,3502,2939,3889,3046,3643,3326,2814,203
0,3513,3757,3812,3694,3785,2559,2014,3533,3452,3741,
2040,3914,4000,3539,3036,3705,3800,38 55,3447,3892,
3049,2999,3702,3974,3755,3439,3050,3516,1535,3884,
3542,3921,2027,3319,2029,3 742,2941,3971,3509,3796,
3763,3023,3910,2942,3863,3545,3701,3558,3810,3890,
3423,3751,3057, 3514,3922,2035,3003,3787,3534,3978,
3937,3052,3706,3869,2037,3766,3977,3647,3555,3824,345
3,3783,3879,3541,3058,4032,3503,1791,3005,3913,3031,
3758,3006,3562,3924,3816,3769,3986,37 08,2038,3548,
3451,3940,2041,3867,3789,3564,3035,3980,3511,3060,
3891,3797,3047,3886,3325,3 695,1919,3973,3546,3790,
3561,3928,3765,3064,2042,4001,3885,3915,3679,3517,
3795,2815,3952, 3772,3572,3037,3454,3802,3870,3883,
2039,3547,3992,3911,2044,3938,3515,3051,3570,3811,374
3,3898,3038,3053,3985,3770,3893,3543,3703,3813,4004,
2043,3535,3798,3917,3569,3007,3944,33 11,3988,3818,
3925,3557,3759,3804,3894,3059,4008,2031,3832,3918,
3710,3061,4033,3801,3975,3 576,3897,3930,3814,3559,
4002,3767,3825,2943,3487,3054,3926,3939,3987,3709,
3550,4034,1983, 3900,3982,3771,3820,3563,3945,3062,
3518,3791,3979,3065,4016,3929,3942,3817,3565,3826,398
9,3871,2046,3707,4040,3923,3803,3549,3066,3948,3773,
3039,3981,3887,3573,4003,4036,3932,20 47,3774,3996,
3828,3566,3068,3815,3953,3899,3941,3993,3805,2015,
3578,4006,3519,3055,4048,3 895,3946,3571,3990,4009,
3919,3819,3577,3960,3806,4037,3994,3574,3954,3931,
3821,4005,3901, 4024,3063,3799,4041,3551,4010,3829,
3933,3956,4064,3902,3580,4020,3822,3067,3943,4035,401
7,3830,3327,3991,3947,4042,3711,4012,3833,3069,3983,
3934,4049,3455,3827,2045,4038,4018,39 27,3070,3950,
3995,3807,3955,3575,4044,3834,4007,4050,3961,3997,
4065,3582,3836,3958,4013,4 052,3949,4014,3823,4056,
3579,4019,3998,3957,4039,4066,3775,3964,3903,4022,
4043,4068,4025, 3835,3962,4053,3935,3071,4011,4046,
3831,4072,4028,3951,4021,4051,3837,4045,4080,4026,396
5,4058,3567,4067,4054,3999,3959,4069,4057,3838,4074,
4023,4060,4015,3963,4073,4070,4029,39 66,4081,4047,
4076,3581,4059,4030,4082,4027,4071,4061,4084,4055,
4078,4062,4088,3583,4075,4 077,4083,4085,3839,4086,
4089,3967,4090,4087,4092,4091,4079,4031,4094,4095,
4063,4093]

Sequence Group 5: Z5_4096

[0,1,2,7,3,8,11,24,4,10,13,28,16,33,35,77,5,12,14,32,19,
38,47,81,22,46,42,88,57,96,102, 168,6,17,21,40,23,45,51,
90,29,55,59,97,72,111,117,187,34,61,75,115,80,124,134,
199,87,136,147,2 26,152,238,259,382,9,18,26,54,30,58,71,
105,36,76,62,118,84,128,141,208,44,74,86,135,92,144,15
1,232,100,154,170,250,185,267,286,425,53,89,98,150,112,
161,179,264,122,180,198,278,210,302,3 20,462,138,206,
229,308,235,321,346,494,256,355,375,519,395,544,588,
818,15,25,31,73,39,79,82, 140,48,85,93,149,101,159,165,
261,56,94,103,162,116,178,195,281,127,196,207,296,231,
316,340,4 82,64,109,123,184,129,197,214,310,148,227,
236,323,255,353,367,518,163,246,265,359,279,390,3
98,541,304,412,445,575,471,609,678,820,69,125,143,217,
158,234,253,357,169,257,270,381,287,3 97,424,565,193,
282,297,409,322,437,466,621,336,474,501,650,527,689,
716,943,213,311,330,451, 360,481,506,668,394,514,542,
704,577,721,786,1018,421,553,589,755,604,806,835,1077,
673,852,8 81,1066,915,1125,1203,1490,20,37,41,91,49,95,
106,177,50,107,119,188,131,209,218,338,63,120,1 32,223,
145,230,244,339,153,243,260,373,283,393,403,540,67,142,
155,225,173,247,266,391,182,2 76,288,405,301,434,456,
600,181,298,314,433,335,467,485,651,362,508,528,688,
550,712,762,997, 78,167,174,273,191,294,312,426,200,
319,327,464,347,492,512,686,258,341,361,499,383,524,
549, 707,415,559,595,751,624,803,839,1056,293,377,406,
536,432,574,598,789,459,615,634,816,679,86 6,892,1108,
503,676,691,882,708,917,872,1144,772,988,1019,1219,
1030,1318,1369,1550,83,189,1 94,334,248,352,366,507,
274,371,384,533,414,561,593,792,289,410,430,563,448,
599,628,824,475, 637,667,858,705,888,940,1156,337,435,
454,627,483,659,696,874,531,697,718,934,773,912,1004,1
229,572,742,798,990,826,1028,1061,1285,867,1070,1069, 1356,1147,1390,1432,1688,376,472,509, 699,560,720,761, 956,596,790,808,1022,848,1037,1067,1312,629,832,877, 1057,898,1074,1151,139 3,953,1163,1199,1442,1256,1505, 1544,1823,687,884,928,1153,1001,1158,1243,1463,1015, 1236,12 92,1529,1341,1583,1664,1935,1040,1323,1384, 1609,1417,1675,1637,1972,1486,1728,1765,2076,1 842, 2132,2209,2406,27,43,52,99,60,121,133,215,66,137,146, 222,157,241,245,387,68,156,166,240, 175,295,305,420, 202,307,333,460,349,487,510,702,70,172,190,300,204,331, 343,479,216,356,368, 515,389,545,569,723,228,379,402, 556,428,592,610,777,439,601,639,831,648,856,885,1211, 110,20 3,211,348,224,369,388,535,251,404,416,581,442, 618,636,796,272,419,453,607,477,646,654,841,4 98,657, 665,891,739,918,979,1232,290,476,490,663,523,693,701, 904,548,738,765,952,811,998,102 3,1296,580,785,827, 1027,868,1053,1114,1345,925,1122,1166,1394,1200,1447, 1516,1812,113,220, 242,399,269,417,447,623,285,457,480, 658,504,671,681,900,318,491,521,684,547,732,758,947, 578, 775,809,1013,842,1041,1092,1300,344,534,568,763, 611,799,797,1044,630,833,854,1078,907,1118, 1134,1402, 670,869,921,1126,949,1176,1202,1466,987,1225,1270, 1530,1353,1593,1670,1946,364, 586,617,836,653,865,909, 1123,729,924,962,1192,968,1207,1252,1501,743,965,986, 1241,1049,126 7,1331,1580,1104,1348,1380,1613,1430, 1698,1736,1985,776,1065,1085,1303,1141,1358,1389,165 0,1167,1426,1471,1722,1517,1772,1832,2092,1275,1475, 1534,1782,1604,1853,1885,2189,1654,19 20,1968,2234, 2030,2312,2389,2668,130,252,277,458,315,489,517,711, 325,526,554,735,582,769,8 23,1094,358,570,622,793,641, 862,845,1107,660,878,913,1162,957,1182,1215,1487,429, 631,661,85 9,728,903,929,1197,734,961,976,1216,1000, 1253,1284,1559,745,994,1034,1280,1101,1328,1373,1 619, 1130,1413,1428,1705,1473,1737,1797,2063,441,727,731, 950,749,966,1010,1261,782,1051,10 82,1314,1119,1365, 1421,1680,920,1097,1143,1378,1171,1443,1477,1732, 1257,1482,1538,1786,16 08,1844,1879,2185,973,1175, 1240,1446,1276,1526,1566,1810,1337,1589,1628,1876, 1676,1923,19 82,2266,1386,1659,1715,1966,1763,2012, 2060,2324,1819,2082,2128,2379,2158,2472,2484,2837,4 52,752,768,1089,901,1112,1133,1410,937,1160,1189,1455, 1249,1495,1554,1801,982,1212,1272,15 08,1308,1571, 1632,1866,1368,1672,1624,1904,1733,1977,2029,2281, 1105,1287,1327,1595,1399,1 640,1709,1955,1438,1717, 1761,2014,1792,2034,2097,2368,1519,1776,1828,2071, 1889,2139,2176, 2439,1932,2224,2256,2516,2316,2560, 2574,2762,1172,1332,1433,1720,1491,1753,1777,2052,154 8,1838,1857,2119,1909,2143,2236,2481,1563,1900,1960, 2220,2025,2268,2277,2570,2086,2328,23 57,2603,2424, 2677,2721,2947,1685,2002,2017,2302,2109,2333,2383, 2623,2154,2435,2450,2710,2 528,2724,2847,3024,2200, 2505,2550,2786,2614,2807,2878,3093,2647,2897,2938, 3147,2986,3190, 3225,3405,139,114,65,284,104,262,183, 505,126,186,205,443,221,354,324,573,160,219,239,332,26 3,408,370,664,303,385,423,543,463,733,613,897,171,249, 268,392,306,413,468,591,326,493,438,8 19,532,633,674, 1209,350,473,558,647,513,700,781,1046,583,767,730,933, 840,1096,969,1470,201, 292,309,450,345,486,539,683,380, 606,495,717,571,746,805,985,411,530,644,778,614,890, 764,101 7,564,810,916,1064,861,1259,1124,1726,440,640, 585,849,722,822,944,1084,672,995,880,1178,93 1,1140, 1412,1317,754,955,1007,1294,1045,1193,1231,1504,1086, 1350,1266,1662,1396,1888,1581, 2178,233,328,365,520, 401,552,605,788,436,685,576,813,635,846,906,1152,465, 612,724,857,666, 978,883,1132,748,936,1035,1201,999, 1246,1336,1536,500,710,649,911,807,959,1042,1224,780, 11 00,980,1425,1080,1290,1301,1626,851,1032,1161,1335, 1121,1364,1458,1926,1220,1485,1404,164 8,1553,1741, 1796,2245,546,737,830,1014,771,1048,1137,1347,873, 1185,1081,1524,1234,1379,14 52,1704,919,1113,1247, 1415,1313,1479,1618,1760,1165,1575,1494,1865,1657, 1822,1971,2351,96 4,1274,1343,1586,1190,1532,1636, 2001,1388,1696,1749,1878,1549,2079,1936,2766,1431, 1725,17 85,2054,1826,1981,2033,2466,1669,2122,2162, 2301,2208,2627,2387,3163,280,386,418,608,469,6 92,638, 896,488,656,801,941,726,992,1036,1264,537,756,703, 1009,804,1128,971,1311,864,1052,11 49,1357,1088,1500, 1445,1914,579,815,770,1210,927,1043,1093,1367,847, 1117,1174,1598,1239,14 08,1480,1766,951,1262,1196, 1523,1344,1462,1607,1817,1299,1574,1643,1852,1703, 1943,2068,22 92,620,1003,838,1142,886,1283,1181,1533, 972,1222,1322,1489,1363,1584,1653,1890,1060,1416, 1302,1745,1255,1602,1641,2038,1484,1694,1774,1949, 1821,1997,2131,2499,1111,1441,1360,1665, 1515,1731, 1856,2108,1592,1903,1752,2050,1791,2231,2170,2449, 1392,1837,1979,2198,1922,214 4,2341,2432,2018,2307, 2246,2592,2412,2543,2681,3206,695,908,1026,1260,1083, 1307,1454,1679, 1139,1541,1340,1721,1405,1631,1825, 2103,989,1376,1436,1787,1528,1944,1748,2075,1630, 1870, 1912,2212,1692,2327,2165,2841,1214,1467,1582, 1993,1684,1884,1847,2288,1511,1929,2059,218 8,2011, 2237,2377,2555,1780,2042,1975,2259,2105,2475,2339, 2612,2171,2393,2508,2708,2453,26 61,2882,3023,1271, 1603,1714,1927,1543,2121,1984,2300,1813,1996,2204, 2361,2056,2409,2522,2 753,1649,2147,2089,2422,2223, 2549,2460,2736,2317,2489,2638,2695,2589,2936,2860, 3112,1874, 2271,2180,2539,2372,2776,2494,2826,2125, 2642,2577,2874,2602,2911,2985,3493,2250,2761,271 3,3036,2675,2960,3074,3252,2816,3057,3016,3329,3132, 3617,3281,3717,363,444,511,715,567,74 1,802,1039,603, 894,774,1155,844,1076,1205,1450,642,812,946,1099,876, 1305,1146,1498,993,125 1,1361,1740,1228,1537,1594, 1953,680,939,899,1188,1005,1244,1346,1622,1103,1419, 1291,1562, 1401,1658,1806,2047,1055,1372,1326,1647, 1461,1769,1707,2005,1527,1789,1869,2384,1894,218 4,2130,2538,760,960,1091,1304,1187,1352,1577,1691, 1033,1383,1476,1743,1407,1843,1755,2091, 1170,1507, 1539,1940,1437,1804,1908,2203,1674,1961,1835,2153, 2037,2249,2336,2660,1298,157 0,1710,1877,1634,1994, 1950,2287,1775,2115,2051,2240,1939,2345,2402,2630, 1616,2138,2085,23 65,2214,2490,2440,2741,2023,2427, 2530,2922,2586,2858,2806,3173,855,1206,1073,1459, 1136,17 01,1422,1898,1321,1496,1627,1882,1588,1831, 1989,2293,1295,1781,1644,2064,1569,1958,1934,2 349, 1751,2028,2157,2255,2112,2414,2470,2718,1398,1687, 1816,2000,1863,2194,2096,2504,1697, 2074,2275,2444, 2148,2396,2573,2779,1899,2241,2193,2480,2353,2646, 2534,2830,2331,2583,272 9,2869,2672,2945,2975,3351, 1520,1918,1757,2179,1830,2126,2261,2544,1954,2405, 2233,2519,23 05,2598,2639,2887,2022,2366,2290,2666, 2478,2621,2756,3104,2428,2813,2684,2931,2780,3008,3 066,3242,2087,2297,2495,2714,2400,2744,2822,2989, 2582,2909,2771,3048,2872,3083,3141,3312, 2540,2832, 2912,3208,2980,3118,3160,3420,2798,3185,3261,3386, 3295,3452,3533,3766,996,1250, 1180,1639,1355,1700, 1599,1988,1409,1558,1833,2199,1770,2040,2133,2429, 1464,1800,1735,206 9,1931,2337,2117,2485,1893,2167, 2244,2596,2296,2531,2689,2918,1578,1945,1873,2182, 2007,22 28,2254,2548,1809,2284,2376,2692,2457,2655, 2626,2957,2080,2382,2498,2617,2434,2733,2785,3 032, 2348,2817,2720,2997,2865,3087,3128,3359,1682,1848, 2100,2371,1991,2322,2483,2700,2190, 2564,2417,2656, 2174,2757,2802,3045,2235,2462,2510,2927,2581,2775, 2850,3224,2644,2901,281 8,3079,2968,3120,3200,3401, 2311,2527,2704,2853,2593,3000,2904,3150,2765,2877, 3033,3169,29 41,3308,3232,3440,2671,2993,3075,3245, 3121,3342,3300,3508,3064,3270,3389,3566,3355,3476,3 593,3796,1880,2046,2136,2474,2280,2635,2443,2814, 2227,2535,2523,2891,2607,2950,2868,3193, 2356,2725, 2585,2857,2770,2916,3037,3165,2698,3005,3071,3235, 2979,3274,3338,3505,2418,265 1,2827,2964,2746,3084, 3020,3266,2789,3041,3114,3413,3181,3301,3311,3557, 2900,3157,3220,33 36,3137,3443,3370,3540,3089,3382, 3470,3646,3433,3579,3634,3883,2553,2809,2862,3153, 2966,3 070,3216,3345,2926,3111,3172,3376,3258,3463, 3418,3599,3027,3202,3267,3450,3304,3397,3501, 3673, 3316,3529,3479,3625,3544,3664,3695,3931,3125,3278, 3348,3498,3381,3511,3573,3649,342 6,3570,3538,3721, 3611,3723,3688,3858,3469,3598,3640,3744,3668,3753, 3778,3820,3699,3782,38 04,3841,3824,3987,3903,3919, 108,164,176,271,192,275,313,431,212,299,329,461,372, 497,516,74 7,237,317,342,496,396,529,590,759,422,587, 557,794,645,829,860,1098,254,374,407,551,427,584, 616, 800,470,632,655,834,719,893,922,1159,502,669,740,910, 757,942,977,1194,791,983,1024,127 3,1047,1306,1362, 1651,291,378,449,626,478,652,714,871,522,744,675,923, 783,958,1008,1223,56 6,736,787,981,817,1016,1038,1286, 850,1054,1106,1334,1154,1382,1434,1742,625,795,837, 1031,8 95,1072,1131,1375,935,1135,1191,1411,1227,1469, 1512,1811,991,1218,1279,1488,1293,1513,156 8,1872, 1351,1591,1633,1917,1678,1964,2039,2385,351,446,484, 725,538,753,766,1006,594,784,82 1,1029,853,1068,1087, 1370,643,825,863,1075,914,1129,1183,1420,954,1184, 1221,1456,1282,1506, 1560,1854,682,887,938,1150,963, 1186,1235,1493,1025,1277,1297,1518,1349,1587,1617, 1916,10 79,1325,1377,1601,1414,1667,1683,1959,1474, 1713,1784,2016,1834,2072,2181,2388,709,945,101 2,1242, 1063,1289,1342,1597,1102,1354,1391,1646,1435,1681, 1739,1999,1177,1423,1457,1708,15 14,1764,1820,2094, 1552,1840,1887,2141,1930,2202,2239,2546,1233,1497, 1540,1794,1605,1851,1 896,2166,1677,1911,1962,2221, 2020,2248,2340,2633,1734,1978,2041,2295,2062,2364, 2403,2697, 2173,2426,2464,2687,2511,2751,2836,3102, 400,525,555,814,597,828,875,1127,602,879,926,1164, 970, 1226,1245,1556,677,930,974,1265,1020,1281,1320,1557, 1050,1319,1366,1629,1424,1673,169 3,1957,698,1011, 1058,1269,1115,1329,1381,1668,1145,1403,1439,1699, 1468,1758,1802,2057,113 8,1460,1502,1756,1551,1824, 1858,2142,1610,1901,1933,2201,1974,2232,2306,2610, 750,1095,111 6,1397,1173,1451,1499,1744,1195,1510, 1531,1815,1572,1868,1907,2196,1359,1561,1606,1883,16 52,1925,1973,2225,1719,1987,2048,2289,2099,2360,2408, 2679,1449,1638,1702,1951,1754,2015,2 053,2343,1807, 2084,2111,2381,2183,2447,2479,2735,1891,2177,2205, 2465,2226,2513,2454,2774, 2320,2599,2634,2851,2645, 2949,2996,3154,779,1168,1179,1547,1330,1585,1615, 1897,1400,1625, 1655,1942,1718,1992,2045,2346,1440, 1711,1750,1995,1790,2055,2102,2392,1841,2116,2164,243 7,2222,2473,2542,2788,1555,1759,1799,2101,1855,2152, 2211,2456,1938,2213,2243,2533,2321,25 07,2619,2861, 2010,2278,2354,2601,2394,2643,2683,2915,2448,2691, 2690,2982,2778,3012,3052,3 257,1635,1836,1902,2215, 1990,2247,2304,2562,2049,2344,2369,2636,2421,2654, 2688,2943,2104, 2399,2459,2680,2488,2694,2782,3014, 2559,2794,2831,3059,2889,3115,3149,3358,2197,2468,252 5,2784,2616,2790,2875,3078,2631,2867,2921,3135,2967, 3179,3240,3431,2658,2953,3007,3199,30 40,3248,3219, 3455,3099,3288,3317,3519,3371,3552,3595,3694,455,562, 619,843,662,932,975,123 7,694,984,1021,1263,1062,1315, 1324,1661,706,1059,1090,1310,1120,1453,1478,1730, 1204,1483, 1546,1808,1576,1860,1905,2218,713,1110, 1169,1465,1213,1542,1564,1849,1238,1596,1620,1913, 1666,1965,2006,2252,1278,1642,1690,1983,1746,2044, 2073,2329,1768,2058,2120,2398,2137,243 3,2469,2844, 889,1208,1230,1573,1268,1621,1663,1948,1338,1695, 1723,2027,1778,2090,2114,235 0,1395,1729,1798,2067, 1846,2134,2146,2411,1881,2150,2161,2477,2274,2514, 2588,2864,1444,18 45,1864,2159,1924,2207,2217,2497, 1970,2273,2310,2558,2374,2611,2637,2925,2026,2338, 2395,2 641,2451,2676,2740,2971,2521,2748,2796,3015, 2833,3063,3123,3349,902,1254,1316,1686,1387,1 724, 1788,2098,1429,1803,1850,2151,1892,2169,2187,2492, 1509,1867,1921,2192,1969,2265,2299, 2552,2021,2325, 2370,2628,2413,2659,2716,2930,1565,1947,2004,2308, 2077,2355,2352,2664,210 6,2401,2430,2699,2501,2743, 2760,3022,2168,2452,2518,2752,2554,2805,2835,3081, 2597,2856,29 02,3136,2978,3187,3244,3439,1612,2036, 2088,2404,2145,2446,2503,2749,2262,2520,2568,2824,2 575,2840,2885,3110,2279,2571,2595,2873,2670,2899, 2958,3176,2731,2974,3004,3201,3050,3265, 3293,3462, 2326,2686,2707,2934,2769,2984,3011,3231,2797,3047, 3086,3285,3124,3321,3365,352 8,2907,3090,3140,3328, 3196,3378,3400,3584,3234,3421,3453,3607,3490,3651, 3687,3811,967,133 9,1406,1805,1503,1862,1915,2230, 1522,1928,1980,2270,2031,2315,2391,2719,1600,2008, 2095,23 47,2124,2442,2416,2734,2155,2461,2509,2793, 2563,2812,2848,3100,1747,2107,2156,2438,2260,2 496, 2526,2829,2269,2567,2584,2849,2615,2886,2914,3159, 2282,2606,2650,2910,2728,2956,2999, 3205,2755,3035, 3049,3273,3088,3294,3339,3512,1773,2258,2264,2556, 2286,2572,2625,2894,233 5,2673,2703,2946,2745,2992, 3043,3251,2517,2723,2773,3002,2800,3060,3092,3290, 2890,3096,31 44,3331,3198,3373,3395,3582,2580,2804, 2871,3062,2908,3131,3164,3347,2963,3184,3212,3392,3 249,3423,3460,3626,3009,3238,3280,3451,3315,3481, 3510,3655,3354,3522,3549,3682,3565,3725, 3732,3874, 1795,2291,2314,2712,2493,2738,2759,3031,2537,2791, 2821,3069,2881,3106,3156,334 1,2591,2845,2905,3117, 2940,3168,3215,3385,2995,3246,3209,3412,3291,3457, 3489,3632,2732,29 17,2955,3189,3019,3222,3276,3446, 3056,3282,3314,3482,3335,3492,3531,3677,3126,3324, 3362,3 516,3403,3556,3575,3710,3429,3602,3622,3745, 3652,3767,3771,3846,2801,2959,3053,3283,3103, 3307, 3325,3504,3151,3369,3380,3543,3415,3558,3609,3730, 3162,3410,3448,3600,3487,3627,363 0,3769,3524,3657, 3672,3786,3703,3815,3832,3912,3255,3475,3483,3645, 3537,3659,3684,3792,35 63,3709,3715,3827,3750,3833, 3876,3935,3590,3741,3763,3856,3789,3862,3890,3956, 3803,3894,3 909,3969,3924,3981,3991,4030,1002,905,690, 1427,870,1371,1148,1895,948,1157,1217,1779,1258, 1590, 1521,2013,1071,1248,1309,1545,1374,1706,1623,2160, 1472,1656,1738,1963,1814,2267,208 1,2487,1109,1333, 1385,1671,1481,1716,1827,2043,1525,1871,1767,2386, 1941,2110,2175,2842,15 79,1839,1986,2135,1910,2216, 2334,2667,2032,2313,2263,2532,2410,2722,2576,3085, 1198,1448,1 492,1793,1567,1859,1956,2191,1645,2066, 1875,2242,2009,2283,2363,2594,1712,1937,2129,2330, 2083,2476,2309,2632,1998,2373,2512,2685,2441,2892, 2750,3287,1771,2123,2035,2423,2251,239 0,2547,2706, 2172,2608,2463,2808,2529,2768,3034,2948,2294,2561, 2622,2923,2665,2825,2863,31 13,2709,2976,2898,3239, 3017,3402,3177,3576,1288,1535,1614,1919,1689,1976, 2065,2342,1762,2 195,2019,2378,2113,2419,2500,2783, 1818,2078,2253,2436,2163,2587,2467,2758,2285,2536, 2652, 2834,2613,2879,2962,3142,1886,2229,2140,2506, 2367,2565,2662,2855,2332,2727,2590,3046,270 1,2919, 2932,3210,2425,2648,2792,2961,2747,2991,3072,3424, 2852,3098,3025,3229,3155,3297,33 37,3615,1967,2272, 2397,2629,2319,2669,2764,2973,2455,2815,2702,3130, 2866,3003,3067,3272,2 515,2739,2880,3038,2944,3094,
3204,3313,2795,3171,3105,3384,3236,3357,3454,3669,
2569,2906, 2969,3182,2823,3138,3218,3474,3010,3263,
3303,3394,3152,3520,3432,3848,3051,3286,3330,350
6,3361,3459,3491,3722,3243,3546,3567,3644,3594,3794,
3686,3974,1418,1660,1727,2070,1829,22 06,2118,2486,
1861,2149,2358,2545,2257,2604,2653,2896,1952,2298,
2219,2624,2362,2754,2578,2 942,2445,2674,2781,2983,
2711,3109,3061,3417,2024,2380,2318,2843,2524,2663,
2717,2994,2420, 2742,2803,3191,2870,3029,3095,3318,
2557,2895,2828,3129,2970,3077,3197,3353,2929,3170,322
6,3377,3271,3436,3514,3638,2093,2618,2407,2772,2471,
2913,2811,3139,2579,2854,2952,3101,29 90,3180,3233,
3404,2682,3039,2933,3299,2888,3194,3223,3495,3097,
3262,3322,3441,3356,3472,3 551,3739,2737,3058,2987,
3241,3122,3289,3379,3536,3186,3411,3306,3502,3334,
3605,3571,3714, 3013,3368,3458,3588,3422,3559,3663,
3707,3484,3648,3616,3780,3697,3759,3816,3985,2210,250
2,2640,2893,2705,2939,3068,3250,2767,3146,2965,3284,
3026,3214,3360,3534,2600,3001,3054,33 32,3134,3437,
3302,3518,3213,3388,3416,3596,3260,3656,3568,3875,
2846,3082,3178,3467,3254,3 399,3374,3636,3119,3427,
3509,3583,3480,3610,3681,3765,3326,3497,3456,3623,
3535,3727,3662, 3788,3572,3689,3742,3826,3716,3809,
3891,3934,2903,3195,3279,3425,3148,3545,3461,3643,335
0,3471,3592,3674,3507,3696,3747,3842,3230,3560,3526,
3702,3601,3762,3719,3837,3653,3734,37 98,3821,3779,
3908,3881,3959,3391,3628,3578,3757,3679,3852,3736,
3870,3547,3800,3772,3888,3 785,3899,3923,4045,3619,
3845,3828,3939,3814,3915,3949,3996,3866,3944,3932,
4013,3966,4065, 4004,4077,1611,1783,1906,2238,2003,
2276,2359,2657,2061,2482,2323,2787,2415,2696,2838,306
5,2127,2375,2551,2726,2458,2937,2777,3108,2605,2884,
2988,3296,2859,3143,3188,3444,2186,25 41,2491,2820,
2620,2876,2972,3207,2730,3042,2920,3161,3021,3237,
3344,3500,2678,2998,2954,3 228,3076,3319,3275,3477,
3133,3333,3387,3685,3407,3581,3550,3756,2303,2566,
2715,2935,2819, 2977,3174,3259,2649,3006,3091,3298,
3028,3372,3309,3527,2799,3116,3145,3435,3055,3343,341
4,3591,3247,3449,3367,3562,3494,3618,3660,3808,2928,
3167,3277,3393,3217,3468,3442,3635,33 23,3541,3503,
3612,3434,3665,3692,3795,3203,3555,3523,3675,3597,
3735,3711,3838,3486,3704,3 751,3904,3777,3880,3861,
3978,2431,2839,2693,3073,2763,3269,3044,3408,2951,
3107,3211,3398, 3183,3364,3465,3639,2924,3327,3227,
3513,3166,3447,3430,3667,3305,3488,3564,3621,3539,369
8,3724,3830,3018,3256,3352,3473,3383,3587,3530,3740,
3264,3517,3629,3713,3561,3690,3770,38 53,3409,3613,
3586,3729,3670,3802,3754,3872,3658,3775,3835,3886,
3813,3911,3920,4019,3127,3 419,3310,3577,3363,3548,
3624,3760,3445,3693,3606,3746,3647,3784,3799,3892,
3485,3676,3637, 3810,3728,3791,3843,3957,3705,3864,
3817,3907,3854,3930,3946,3994,3525,3642,3737,3829,369
1,3839,3869,3925,3774,3898,3850,3943,3887,3952,3968,
4011,3758,3873,3900,3986,3922,3961,39 73,4033,3859,
3980,3998,4026,4005,4039,4052,4082,2609,2883,2810,
3221,2981,3268,3192,3464,3 030,3158,3366,3589,3320,
3496,3553,3706,3080,3340,3292,3515,3428,3661,3542,
3733,3406,3569, 3614,3783,3641,3752,3818,3902,3175,
3438,3390,3580,3478,3604,3620,3761,3346,3633,3680,381
9,3718,3806,3793,3914,3521,3683,3738,3790,3708,3836,
3855,3937,3666,3867,3831,3927,3884,39 54,3965,4021,
3253,3375,3532,3678,3466,3654,3731,3823,3585,3768,
3700,3807,3574,3844,3860,3 942,3608,3720,3743,3906,
3773,3851,3877,3990,3801,3896,3868,3951,3918,3962,
3983,4029,3650, 3749,3825,3878,3781,3928,3897,3970,
3847,3889,3938,3976,3910,4009,3992,4036,3812,3926,395
0,3995,3963,4016,4006,4049,3945,4001,4027,4057,4020,
4043,4061,4085,3396,3499,3554,3726,36 31,3797,3712,
3865,3603,3755,3748,3893,3787,3913,3885,3982,3671,
3834,3776,3879,3849,3901,3 940,3975,3822,3929,3948,
3993,3921,4002,4015,4048,3701,3805,3871,3916,3840,
3953,3933,3999, 3857,3941,3960,4031,3979,4007,4010,
4056,3895,3972,3989,4014,3967,4037,4022,4054,3955,402
5,4042,4069,4035,4060,4067,4091,3764,3863,3882,3971,
3917,3947,3988,4017,3905,3958,3977,40 23,3997,4040,
4032,4063,3936,3984,4000,4038,4008,4028,4047,4073,
4012,4051,4044,4066,4055,4 071,4075,4094,3964,4003,
4018,4046,4024,4050,4059,4070,4034,4058,4053,4078,
4064,4079,4074, 4090,4041,4062,4068,4080,4072,4081,
4083,4087,4076,4084,4086,4089,4088,4095,4092,4093]

Sequence Group 5: Q5_8192

[0,1,2,4,8,16,32,3,5,64,9,6,17,10,18,128,12,33,65,20,
256,34,24,36,7,129,66,512,11,40,6 8,130,19,13,48,14,72,
257,21,132,35,258,26,513,80,37,25,22,136,260,264,38,514,
96,67,41,144,28,6 9,42,516,49,74,272,160,1026,520,288,
528,192,544,70,44,131,81,50,73,15,320,133,52,23,134,
384,7 6,137,82,56,27,97,39,259,84,138,145,261,29,43,98,
515,88,140,30,146,1028,71,262,265,2048,161,5 76,45,100,
640,1025,51,148,46,75,266,273,517,104,162,53,193,1032,
152,77,164,768,268,274,518,5 4,83,57,521,112,1024,135,
78,289,194,85,276,522,58,168,139,99,86,60,280,89,290,
529,524,196,14 1,1040,101,147,176,2049,142,530,321,31,
200,90,1056,545,292,322,532,2050,263,149,102,105,304,
4096,296,1030,163,92,1033,47,267,385,546,324,2052,208,
386,150,153,165,106,55,328,1088,536, 577,548,1034,113,
154,79,269,108,578,2056,224,166,519,552,195,270,1041,
641,1036,523,275,580, 291,59,169,560,114,277,156,87,
1152,197,116,170,2064,61,1042,531,525,642,281,278,526,
177,293, 388,1057,91,584,769,198,2080,172,120,201,336,
62,282,4097,143,1029,1044,103,178,294,93,1058, 644,202,
2051,592,323,392,2053,297,770,4098,107,180,1280,151,
209,284,1027,648,94,204,298,40 0,608,2112,1089,352,325,
533,155,210,305,2057,4100,547,300,109,1048,184,534,
1060,537,115,10 90,167,225,326,2054,306,772,157,2065,
656,329,110,117,212,171,1038,776,1064,4104,330,1153,20
58,226,549,1043,538,387,308,216,416,271,279,158,337,
2066,550,672,1092,118,332,579,540,1072, 2176,389,173,
1037,121,553,199,784,179,228,4112,338,312,1536,704,
1154,390,174,554,581,1046, 393,2060,283,2081,122,448,
353,2113,561,1096,203,63,4128,340,394,1049,1281,527,
582,556,181, 295,1059,285,232,124,2068,205,182,643,
2304,1156,562,286,585,4099,299,354,2082,1045,4101,21
1,401,1104,185,1061,396,344,586,645,1282,593,535,240,
2072,1050,206,95,327,2084,564,800,402, 2055,4160,356,
307,301,417,1160,213,1066,568,1120,832,4105,588,1035,
1537,186,2177,646,404,2 114,1091,227,896,594,418,2560,
302,649,771,360,539,2059,4102,111,1052,331,1168,4113,
214,309, 1062,1284,2088,188,449,1073,217,408,609,596,
2116,551,650,229,159,4106,420,2178,310,1093,54 1,1288,
773,610,657,333,1065,119,1098,2067,4114,2061,600,339,
1184,218,2096,368,652,1031,230, 391,313,4224,450,542,
1538,334,1076,233,555,2062,774,175,123,1155,658,2120,
612,341,2305,777, 220,314,2069,1105,424,1068,395,4108,
673,4129,583,355,1296,2180,1094,4161,287,183,234,1051,
125,557,1216,660,616,342,316,2083,1157,241,778,2306,
563,2074,1074,345,452,397,2561,4116,4 03,1112,207,
2128,1540,4352,674,558,785,1100,432,1039,357,187,1162,
236,664,1312,624,4130,58 7,780,1080,2085,1122,705,
2073,126,242,2070,1063,565,398,2184,346,456,2308,4120,
358,405,303, 569,2312,1544,4132,244,1158,1097,595,
1283,189,4103,566,676,1169,1054,1108,361,2086,706,58

9,2562,1344,215,786,647,348,2144,2115,419,406,464,680, 4225,801,2089,4162,1069,362,1164,590, 409,1286,4608, 570,1121,788,1552,2192,1106,4107,2076,597,1075,572, 1186,219,311,2117,708,59 8,2090,1289,601,651,421,792, 4136,802,2564,611,1047,602,1172,410,231,2097,4164,688, 653,1128, 248,1070,2122,4226,369,2320,190,364,1568, 654,2208,1095,659,1161,335,480,4115,315,4109,221, 3074,370,1285,613,2568,1408,4144,422,425,2336,451, 1077,614,543,1298,235,412,2576,343,372,2 240,1185,775, 317,2592,4110,2118,1539,222,1099,426,4168,2092,453, 4353,237,1124,559,1170,217 9,1292,4117,833,804,712, 1082,834,661,1053,808,779,2129,1217,617,604,2098,1541, 433,4228,720, 2121,816,1101,2063,1176,836,2368,347, 897,2181,1136,4131,243,1297,2100,662,4354,2071,1600, 4122,454,318,675,1110,618,2182,1081,4609,898,781,1314, 1220,376,428,1546,665,4176,736,567,1 107,2432,1192, 1078,840,2124,2185,625,238,2130,1159,359,457,2104,399, 787,2075,2145,4133,59 1,678,434,4121,677,2087,1290, 4118,1542,349,1300,1102,245,4232,1188,458,4356,666, 1113,620,1 553,1163,2307,1313,4360,363,2132,127,1067, 191,2186,1125,782,407,2193,436,626,2309,2077,12 18,571,465,681,2091,246,4134,707,2146,4610,1346,350, 1084,599,668,2563,1548,4192,4163,790,1 165,1320,460, 1123,2136,1200,4137,249,2188,682,1664,573,1171,411, 803,2078,1116,789,2194,130 4,709,365,4240,440,628, 4124,689,3076,2119,374,1224,423,2310,1556,4165,466, 793,2313,4138,11 30,250,371,1174,481,574,1348,2209, 4612,413,2624,1109,603,366,2093,1545,4145,2148,1287, 105 5,468,1570,655,900,4170,2688,805,4368,615,3073, 1166,684,1409,710,2099,1187,4256,429,794,21 96,252, 1114,373,605,1232,848,690,2094,5122,2123,713,632,2314, 1316,482,4616,806,2321,4384,1 132,2565,1083,427,2152, 1177,904,4624,2210,1569,4288,414,1291,2101,223,1126, 4640,2241,1554, 4166,663,3080,692,835,1328,619,472, 2200,1137,4140,455,796,2125,1189,1601,809,714,2212, 124 8,721,4227,837,2816,716,1086,2316,1302,1352,864, 2322,2566,4177,810,2102,1173,4146,606,119 4,2131,912, 4169,2105,2569,1103,4111,722,696,377,4416,1424,435, 2160,1293,4229,1560,817,1129, 1792,319,621,4148,1180, 812,4119,484,3072,1345,430,1572,2183,1138,2126,1299, 4230,838,2337, 2242,667,1219,488,2133,1111,239,378, 2324,2570,459,622,2106,2216,1410,4480,627,437,2187, 380, 4172,4233,2147,1201,4178,1608,818,1178,1294,461, 4152,2134,1543,4123,496,4193,669,1190,13 17,679,1140, 1079,2108,1221,4135,724,2328,841,1305,629,2137,1584, 351,467,2338,2577,1360,43 8,2572,2244,1115,737,251, 4355,462,2189,442,4180,441,3088,2149,4234,1666,469, 2195,1549,424 1,247,683,2224,1196,4357,1226,4125,842, 1412,1127,738,4139,1144,2190,1308,4194,899,2578,160 2,670,1318,783,2369,1085,4611,849,2079,1555,1193,820, 2248,1576,728,928,4184,2138,791,4236, 367,3104,2593, 1376,901,1233,630,2340,2370,1321,4126,685,844,2580, 4242,1204,633,711,1118,25 3,691,2311,1301,5124,2197, 4167,824,2150,1175,902,4358,686,2153,1668,4361,1222, 2352,1416,11 33,740,6144,1347,850,375,4257,2344,1558, 4672,444,3078,1306,2211,470,1167,4141,483,2140,15 47,4196,415,3081,485,2095,905,1202,795,473,2315,1240, 4736,634,744,2433,5121,2594,1616,852, 960,2372,1322, 865,4147,693,2256,4244,1131,2434,1794,1350,797,2198, 2201,1225,4142,4171,221 3,1604,1571,4362,906,1252, 2154,715,1141,4369,2103,2376,1330,4613,807,3136,474, 636,4200,11 79,694,254,2584,1550,4258,1665,717,2625, 1071,1315,575,913,4149,2596,1440,798,4289,811,308 2,5128,2161,379,1208,2202,1353,2127,1191,4248,697, 2317,2156,4173,1564,431,2626,1142,4260, 607,2272,1228, 2214,489,4864,2567,2600,1324,4364,866,723,2243,486, 4370,1573,4614,2318,1181, 4150,1234,3089,908,1793, 1561,718,813,4179,2689,1364,4153,476,4617,856,3084, 1117,1411,839, 1329,2571,1295,2323,1146,4208,725,2628, 2339,698,1472,914,2107,1249,752,868,2217,2608,5120, 2162,819,2325,2204,1349,4231,814,4174,439,2135,929, 4385,4290,3200,2245,1197,4181,1578,49 0,2164,1139, 4372,1680,623,4618,2218,1632,4154,1336,4264,671,1198, 1362,739,1603,4235,1557, 2109,1413,4195,916,3090,2579, 1303,463,1236,843,2573,2690,1135,4182,381,2329,2326, 1672,135 4,497,2574,2225,1586,930,821,4156,2341,2436, 726,4376,961,3105,2139,1203,4185,1182,872,263 2,2817, 1418,4386,4625,492,2246,1250,4620,1332,4292,631,1574, 1223,729,4237,2220,1145,5136, 2168,1605,4197,700,2249, 1796,443,4243,1307,741,2384,1378,4272,1562,2110,1356, 1205,845,233 0,6145,1319,920,382,4238,2191,3077,1585, 4626,822,3092,2151,1425,2226,851,1229,4417,730,23 42,2141,1609,4127,498,3106,880,2692,4296,1256,742,445, 2250,1392,4186,471,635,2640,1148,51 52,2371,1696,4641, 932,2440,1580,687,4388,4418,2345,1210,4628,1420,2818, 1612,1325,1800,903, 6146,2155,1134,4359,825,4245,2228, 1235,1361,4198,500,3328,1577,2199,846,1670,4201, 2257,2 332,1195,4400,745,3075,826,2696,732,1264,446, 962,2142,2252,1426,4392,1620,936,2346,5126,2 448,1377, 475,853,4259,2656,1310,867,4188,637,3137,5129,2400, 4143,1551,2373,1230,2581,1414, 4363,907,2203,2258, 1206,4481,1667,4642,2353,1588,1333,4420,487,6148, 1808,2595,695,1441,4 304,2348,2157,1087,4482,746,3096, 828,2232,753,4246,1610,4249,854,2582,1237,4261,1326, 3108, 857,2585,1368,1209,504,799,4202,2163,1355,4151, 255,4424,964,3138,5184,2215,1242,909,1673, 2273,1559, 2374,1309,4632,719,2354,2820,4673,1143,477,2205,1617, 4644,915,2704,2377,1448,51 30,2158,4209,2165,2260, 1380,4250,638,4175,748,2219,944,4365,1728,4204,3086, 2824,1331,4674, 1227,3112,869,6152,1592,4320,1428,491, 699,4262,2378,1253,4615,1351,4648,754,3201,1183,15 65,858,1618,4291,2274,1417,2597,1476,4366,478,3091, 2586,5137,2435,968,1260,383,2356,2264, 1212,4737,910, 2464,2319,5132,2327,1801,815,2206,2385,1579,4619,976, 4371,2598,2720,870,467 6,4387,3140,2166,1684,4155, 1633,917,2380,2627,1337,4265,1241,4656,4210,2588, 1606,4373,182 4,3120,4252,727,1150,1442,493,1357,4183, 2437,1251,5248,2221,1676,4293,873,3085,2169,1384, 701, 4212,1566,931,2601,2247,1323,4266,1798,2832,2227, 1365,1473,756,2276,6160,2386,1334,86 0,499,4157,2360, 3584,5138,2752,4627,731,3202,2438,1648,2222,4621, 1238,4738,823,2602,2629, 1575,4377,4374,3094,922,2441, 1199,4622,1674,4273,874,2331,1432,4389,1421,918,4484, 2170,16 36,5153,2496,1254,4187,502,2401,1795,933,4680, 1366,4865,2609,1338,4294,1682,3144,2251,158 7,1211, 1488,743,2111,6176,2388,1358,4268,760,4216,2442,3097, 1244,1581,4297,881,3329,2575,1 147,2630,494,1379,4432, 2604,2229,2343,1272,4158,702,3107,921,2333,4378,1624, 501,876,2280, 2172,1415,4239,5125,847,2253,1856,5140, 2230,1444,4199,992,4274,2691,1697,447,4390,4189,32 04,5154,2610,1607,4740,1436,2334,1369,2633,1257,4298, 1704,733,6147,2347,1797,4688,1669,44 19,2402,1340, 1231,4488,827,3093,6149,1590,2259,934,1634,4393,2449, 3152,2233,1474,4866,882, 3109,937,2444,2392,963,1419, 4203,747,2634,2693,1265,4276,1119,3330,505,2641,5376, 2583,13 81,855,924,4247,2288,1810,4305,734,4380,829, 3098,5123,2254,1563,4744,1213,2143,1611,2375, 1363, 4190,4300,2612,2848,1430,4394,1258,4496,2450,1688, 1386,4704,965,6208,2404,1614,5185, 2355,1730,4448, 2349,2465,1239,4421,938,4629,3208,884,2261,506,4251, 1327,4306,3114,2616,15 89,4401,1804,3168,749,2880, 6153,1370,1640,945,966,4643,2636,3083,1456,4396,1681, 4205,755, 3585,5144,2234,1266,859,1427,4280,2694,1593, 2452,1388,4630,940,3139,2275,5156,2944,4633,1 214,830, 2642,2466,1809,4211,911,2350,2697,1621,5186,2819, 1582,4263,2408,2587,1832,4321,87 1,4422,6150,2159,639, 4402,1480,4868,3100,2379,1698,4253,1335,3216,888, 6161,2262,1372,4752, 1245,4425,479,4206,2357,1422, 4213,1268,3110,4308,946,3332,1732,1677,750,1802,4267, 2236,1 626,5134,2497,1393,4872,969,3121,2265,5160, 2456,508,1613,861,2657,2644,1446,4426,1857,259 9,2698, 5249,2277,1339,757,2207,6154,2468,1382,4322,970,4645, 2358,3141,5139,2589,4634,4483, 3336,2821,1700,2658, 4404,1243,4312,919,2705,2381,1594,4512,1433,4367, 3113,4375,2167,1826, 4254,1504,3146,4433,875,6162, 1635,4646,1259,862,1920,4768,2648,1675,5188,2387, 1445,4214, 758,3232,2266,1149,948,4428,1359,4675,2416, 2700,1816,4636,1596,3079,2278,5168,2439,1671,1 712, 977,2361,6272,2498,1385,4485,923,4269,2590,3586,5133, 2382,1622,4217,972,3124,2281,143 4,2603,4649,1311, 4295,2822,2223,2171,1729,4880,4275,3203,761,2706, 4324,1396,4434,877,2660, 2389,1207,4408,1475,5632, 4800,2825,1449,5250,2268,1812,4486,952,4270,2362, 1686,495,4650, 1262,4677,3153,5142,2472,1644,4489, 1619,3116,2443,1341,6156,1429,4379,1825,703,2721, 6177, 2631,1371,4218,1638,4544,2403,3344,1567,1736, 4449,935,3142,6209,2335,1685,2231,978,1625,4 657,2282, 3099,2173,5192,2605,4299,883,3264,762,2708,2664,4159, 1246,4436,503,2390,2364,145 8,4490,5145,3205,925,2289, 1394,5377,2826,1269,4623,878,4678,2611,1478,4652,735, 4277,4391, 3122,5155,2393,1799,4381,1678,2500,1860, 2445,1443,4328,1637,4220,6164,2451,1481,4301,137 3,3160,4278,2255,1699,1255,4739,993,3588,6400,2722, 1591,5252,2606,1828,4658,2833,3148,248 0,1452,4382, 885,4681,3087,939,2405,2235,994,1400,4395,3210,2284, 2712,1744,4450,1656,3360, 980,2672,6178,5141,2635, 1689,926,764,4307,2828,3128,1270,4497,5200,4281,941, 3170,5157,275 3,1628,4492,1367,4440,2174,1805,2290, 1457,4682,4741,3111,2613,5378,2446,1921,4689,1583,46 31,2394,2504,1387,4336,1642,967,6168,2406,1267,5146, 2453,1484,4302,2351,2617,1450,4191,88 6,4423,3592, 6180,2292,831,4660,1683,4896,3206,3145,2643,1342, 4498,1811,3331,947,2237,6151, 2614,1705,1431,4452,507, 4403,2724,3217,1261,4397,1840,3102,4513,889,3156, 5256,2409,1650, 984,1760,4309,2754,1490,5162,2637, 1615,4664,751,3392,2263,5216,2834,4928,1702,942,2695, 23 96,1858,4684,5131,2467,2454,1423,5633,2512,1460, 4282,2728,6273,2849,1383,4742,996,4500,62 10,3117, 5187,2410,4323,1692,4992,3212,2638,1641,2457,4690, 1814,4514,3334,971,6656,2618,14 77,4398,1273,4745, 3169,4867,2836,1512,4456,1733,3600,4635,890,3154, 6155,1598,1374,509,180 6,4207,2645,3123,1922,5148, 2620,1649,4427,949,3234,2267,5264,2359,973,1397,4310, 2756,2646, 1489,4405,1708,3337,2649,5158,2699,5380, 2469,1627,1000,2840,6184,2850,1690,4284,892,4545, 2659,3095,5169,2650,1274,4313,4504,3220,2458,1438, 2279,4705,1817,4692,6212,2736,2701,139 0,4647,1464, 4746,3176,4325,2296,4255,1868,3118,4516,950,6274, 2417,1151,4406,1731,5189,150 6,4637,2238,1827,5384, 2412,1597,4869,863,4706,3616,2702,1451,759,4753,1864, 4429,3143,5161, 2707,1714,4215,1701,3209,2383,5194, 2528,6163,1395,1803,1008,2363,6157,2269,1623,4696,148 2,4435,2418,3333,5280,2661,1276,4314,510,3456,6192, 2470,1435,2473,4464,1652,4748,2499,312 5,2662,5127, 2591,4326,4487,3346,979,2283,2460,4409,1492,4546,953, 2391,2420,1928,4638,1829, 5634,3233,4430,2823,1389, 5172,2365,1738,4329,763,4651,6158,1872,4870,974,4271, 1453,4219, 3587,5251,2270,1643,4754,1713,3147,2474, 1818,6216,1215,4708,1402,4437,2501,6401,2285,162 9,4873,1520,3172,4316,2607,3218,1830,1691,4410,954, 3340,6165,2881,1459,5201,2852,1734,452 0,2760,3130, 2882,5164,2709,4491,879,3101,981,2856,2827,4769,1505, 4679,3265,2665,2652,1706, 4451,5392,3589,982,2481, 6276,5190,2768,1924,4383,927,4279,2864,3149,1833, 4330,5147,4221, 4653,3224,5312,2884,1639,4756,1447, 4712,2395,1746,2945,1343,4438,1679,4412,3184,6179,525 3,2291,1820,4337,1761,3345,4874,2710,6402,1479,4659, 1275,995,3648,6170,2502,1740,5170,236 6,1401,4441, 2723,3158,2666,1888,4548,765,4493,3129,6657,2946, 2829,956,1496,4499,3362,3268, 2424,5208,2476,4303, 1861,3594,887,2713,6224,2784,5636,1437,4770,985,4654, 2615,3155,1720, 4881,5196,3240,4528,997,3126,5135, 2888,1630,4453,1813,4283,2673,1462,5258,2286,1398, 4332, 4760,3207,2407,5408,2505,4720,1645,4683,2447, 2835,1848,4876,1687,5176,6181,2639,1247,521 8,2726, 1716,4801,2482,6169,2725,1936,4222,986,4338,3338, 6166,3590,5159,2397,4661,1483,449 4,3348,3150,2293, 1651,6280,4442,1745,4552,3236,943,2506,6404,2714, 1859,1508,4454,3161,450 1,2668,3601,1834,4399,1454, 3211,4665,891,3361,6408,5640,2411,1841,998,1595,4340, 2175,3115, 1278,5254,2239,5193,4691,766,3173,2830, 5379,2455,4285,1465,4662,2484,2674,1709,4772,5265, 3266,2619,5150,2513,1764,5204,2729,1646,4457,2294, 6182,2755,1737,4802,511,4685,6658,3394, 5440,2398, 1485,4311,4882,3132,2647,1404,2716,4743,1693,4444, 3596,6240,6211,2838,1866,451 5,1952,4502,3213,3368, 4560,2508,4776,1491,3171,4897,988,3248,6185,2297, 1657,1752,5165,180 7,4458,2730,3712,1399,5260,2621, 1844,4686,1001,4505,3219,2459,5382,2851,951,1654, 4666,316 4,5217,2837,1926,4884,1707,3352,2757,5648, 2413,6288,5202,2488,1391,1002,2676,6172,2737,14 68,4693,5171,4668,2422,3272,5282,2471,1836,4315,4407, 3604,6213,2514,1494,2841,4804,1873,4 694,6186,3178, 2298,5385,2419,4697,1271,4747,3222,4517,2529,2622, 4888,1694,4898,3396,893,6 660,2461,1923,4707,1461, 5143,3157,4698,2651,1748,5268,2414,1715,4506,975, 4327,3593,6193,1 862,894,4784,1815,4749,3335,3103, 5224,2516,1497,4344,1653,3618,2703,5166,2948,6218, 1510,1 762,4465,2853,6416,2663,1842,4286,1375,3214, 4460,2732,3457,5664,2758,1703,4750,1009,3235, 6304, 2477,1466,5191,2842,1874,4755,2300,3162,2421,5257, 2653,4431,4576,3280,955,2896,2738, 4411,1739,4317, 7170,2761,2680,1486,4466,1930,5381,3364,4709,2530, 6664,5504,2854,1889,451 8,1004,4521,6432,3180,1658, 4547,5173,4710,1821,4639,3131,5394,2475,1718,4331, 1929,4508,32 25,2952,1599,6672,1507,4439,1776,4468, 3617,6336,5281,2462,1405,4871,1735,3339,4413,2271,3 174,6688,1831,1493,1010,3602,6214,2711,1984,5635, 2740,1455,4318,2883,3376,2667,5195,2520, 4522,957, 3185,6188,2503,2844,4549,1865,4333,3237,3649,2857, 5220,2762,4655,5266,3296,983,2 769,6275,2885,5388, 1710,4929,958,4900,2764,3134,1514,4808,5178,3350, 4930,4757,3400,5149,2 912,1876,4904,1768,4875,6225, 1721,5313,2858,1938,4713,1660,4700,3221,6194,5637, 2654,4529, 1500,3242,4816,2960,6217,1403,4912,1892, 5197,3151,6159,2770,1819,5272,2744,1741,4932,242 5,6464,3472,2483,1516,4443,987,4993,3341,6277,3608, 5232,2865,1932,4339,3177,3840,2367,539 3,2669,6196, 4758,1463,3228,1012,2860,6167,2532,5696,1843,4550, 3393,4414,2478,3620,1749,47 71,5206,3186,4714,999, 3347,6278,5177,2886,1838,4994,1277,4877,2715,3267, 1647,5410,2536,53 16,4472,4524,3159,2287,5642,2426, 4761,1925,4832,2507,2670,1498,4663,1742,5203,3458, 6528,5 288,2675,1513,5174,2485,1880,4936,2428,6220, 6281,1717,4721,1016,4334,3249,6226,3656,5255, 2866, 1953,4455,4553,3226,3342,2509,1837,6200,4495,1867, 4883,3591,6171,2544,6241,2717,163 1,1469,4687,3238, 3365,4774,2727,3188,4530,1747,3127,4773,767,3269, 6183,2772,5386,1904,5638,1724,4445,2889,3353,1524,5396,2677,5198,4341,989,3632,2399,5284,2515,4554,1406,4762,3408,5209,2486,1754,4716,5649,3163,2785,5259,2299,6403,5409,2510,1822,4459,2490,6228,2489,1835,4223,5163,4287,6282,3714,5221,2517,1499,4878,4503,3597,6289,2295,1944,2731,4532,1863,4722,3244,6405,3274,6173,5314,2890,4667,1890,4561,3460,3175,4777,2786,6187,4342,1467,4803,3192,1003,3356,6242,2947,1522,1763,5442,3650,4446,2718,3366,1695,5180,2831,1850,4695,990,4764,3133,6659,5644,2897,1005,1937,4886,3603,3241,5261,2868,5416,4556,1722,3624,2776,5219,2976,6232,5296,1845,4345,2839,6284,2415,1495,4778,5760,3424,4669,2949,3281,5267,2678,1655,4507,4899,3369,6174,2733,1765,5212,2892,1956,4885,6290,3252,2681,5400,2759,4805,4461,3166,4536,2301,2739,4724,1487,4785,3349,7172,6215,2872,1750,4470,1869,5320,3223,4519,2950,6406,5652,2734,1521,4562,959,4889,3716,6409,3270,1896,5226,4346,1263,4467,3464,3181,5270,2788,1940,4577,1770,4670,3395,2898,5444,2423,6305,1877,1509,4509,3606,6720,5205,2492,1711,4699,1756,3354,4462,2518,3215,6189,5641,2531,1846,1011,3595,6244,2463,1960,5383,2533,5151,4564,2953,3250,2843,5666,2521,4751,4996,3288,6784,2682,2792,4901,1784,4711,7169,3664,2900,5262,3008,4780,1870,5505,3370,4806,2913,6195,2741,5283,1662,4525,1013,4890,6292,3179,1985,4348,5210,3842,4469,4701,3398,5328,2845,1753,4944,1927,4786,3273,6190,1528,6219,1849,4809,1882,4728,3652,3619,6410,5412,2954,4578,1766,3300,4902,2763,3189,6417,1511,1954,5228,3378,6661,2855,1719,5179,2522,1777,4523,2684,6248,3227,2742,5273,2302,5000,895,3598,6306,3713,5665,2765,1439,4510,3119,3363,2623,5387,2961,6197,4319,5222,3488,1006,2846,6337,2859,5650,1878,4759,7176,4788,2427,3256,1891,4931,5424,3401,4715,4568,3239,6296,5233,2745,1939,4551,1661,4892,6221,3612,1502,5285,2479,5697,4905,1986,4810,3190,6308,5344,2655,4817,1852,4933,3276,2537,6912,1934,4812,1723,5182,3372,6412,5398,2914,1772,5448,2771,1515,4960,2534,6418,3621,6662,1897,1014,4906,3229,6198,3282,5269,2956,1470,4702,3841,3609,2766,5290,2861,6227,5008,1743,3412,6201,2524,6665,2904,5199,1931,4818,3165,3459,4792,2887,3377,4473,5520,3343,4531,1017,3194,6256,2773,5389,1968,5656,1881,4913,2746,3520,1894,5225,2962,5888,4415,4717,3297,2800,5276,2916,4908,1769,4580,7168,5441,2867,1517,4526,1778,5668,3397,6279,5234,2862,6222,5395,2487,1941,4934,2977,6433,6338,1823,4763,5315,4584,3245,6229,3626,5207,2538,1659,4335,4474,3187,6420,3728,2671,1992,6666,4555,1875,4718,3680,6202,3384,6312,5506,2719,1755,4723,3246,3410,4533,2787,3651,6283,4476,1501,3605,1018,3461,6243,2964,5297,1900,5704,3351,4914,2511,3284,1725,5274,2891,5390,4557,991,3183,6230,5639,2429,4592,1933,4765,3720,3402,5286,2545,5413,4775,5236,3634,2978,5175,2869,6204,5317,1839,4820,2774,6424,3009,1525,4937,5401,3251,4725,6233,3230,5680,2920,1955,4447,4563,3466,6434,6673,1988,5456,2540,1884,4534,3298,6668,3380,6340,5211,2679,4833,4347,3622,3271,4558,2777,6285,4538,1726,4537,3193,7184,3653,6245,2748,1948,1780,5762,3844,4565,2491,6291,3355,5645,2789,1518,4343,1020,4779,3426,6320,3610,5292,5322,1767,4938,3404,3253,5508,2893,5223,4834,1905,3367,2968,5240,2430,6286,5404,1851,4995,3633,6674,5698,2870,1893,4766,5414,3473,4879,2899,3277,6465,5181,2778,1945,4945,3657,6175,2546,1757,5651,2928,5289,4916,6344,3304,2790,5672,2493,4824,5024,3440,6234,2519,2683,4887,1530,4463,3196,7200,3744,6689,5472,2980,4997,1958,5329,3628,4726,2735,6436,6466,5417,1471,4781,1007,4940,3258,6676,3468,2000,5300,3660,4729,4807,3373,3848,5214,2951,1847,4349,1898,4787,3182,6407,5397,2873,6293,1523,1942,4920,3283,3409,6246,5271,2548,4998,1961,3625,4782,2894,3718,6249,5764,1871,5318,3243,6448,2793,1771,5512,2874,5229,4836,2780,3312,2494,5443,3010,4946,4471,3474,6440,3668,5654,2984,1529,4540,7174,3425,2523,5402,2901,6307,4566,5263,3358,4579,2915,6236,2685,5643,1912,4511,7177,4581,6191,3599,1758,5001,5298,3278,4891,4569,3462,6411,5336,2955,1989,4730,1946,4840,3254,6529,3715,1526,6690,5712,4948,1906,5056,3636,3381,6468,5418,2535,4961,1883,4789,3856,2743,3489,6352,1773,1957,5227,3135,6530,5890,2794,1853,5446,2876,1976,4893,2801,6294,3658,6297,5321,2902,1015,3285,6309,3374,5700,2905,5667,5002,3416,3257,2552,5348,2847,6250,4811,5237,3403,6199,2303,6472,3012,5426,1751,4903,7232,3290,4570,2957,3721,4732,5275,3607,4790,4350,3357,6680,2767,5646,1993,5761,1503,4813,6721,3191,1962,5167,2525,5411,4671,5009,3665,6692,5536,2963,4894,1781,4907,3496,7178,6257,1885,4475,1908,5304,3428,6298,5449,2686,6223,5287,2796,2016,4793,2992,6413,3776,6252,1854,5660,4527,3379,6722,3275,5238,2917,1532,4703,3640,6368,3476,2539,5324,2747,6310,4585,1972,3301,6663,3399,6696,5420,2802,1774,4962,3231,3613,4819,2906,3666,6339,4582,5669,3465,1019,3524,6414,2526,5277,1895,5330,7185,5004,3016,3308,1987,5889,2431,5657,4814,4909,3260,6785,5460,2958,4572,1969,4952,7180,3849,5213,2863,5507,4935,1782,5425,3627,6667,5391,3024,6419,5242,1279,4821,2918,6724,6435,1943,4794,5568,3732,5010,6203,3681,5345,2965,1899,4848,4964,3385,6313,3289,6704,1994,6258,1663,4915,3654,6421,3872,6300,5445,2775,4910,3198,3490,4535,2541,3405,6231,5025,1964,3299,7296,3724,6341,2921,5293,1785,5674,3432,4586,2749,6260,3614,5235,2979,5776,4719,1021,3371,6314,3846,5728,5432,1935,4767,3413,3521,5294,2804,5458,4835,5699,3382,2908,5653,2547,6205,5509,1886,5012,7186,6675,5399,2779,2001,4559,5332,3696,4939,6669,3286,6786,5231,2871,1407,4477,3623,6425,6422,1779,5768,2970,5450,4593,3247,6670,3722,6321,5682,2922,5026,4917,3480,6437,3469,2966,6532,4822,1990,5057,3684,7201,3302,6235,5299,2550,1970,5278,3843,4968,2981,6728,3414,6913,5514,1879,1022,4588,3386,6342,3730,5346,5428,3635,4727,3259,3536,5670,2791,5319,4825,1902,3406,6316,5241,2808,6264,5701,1947,4796,3292,3629,6345,5892,2929,4539,5403,3195,4837,2542,3427,6480,5474,1759,5658,3320,6206,2750,1907,5452,2969,5301,4941,6426,3672,2549,5415,2924,5016,4478,3463,6287,7173,5681,2895,1527,4918,3904,7188,3492,6247,5521,3040,6322,4947,5325,3745,4826,2495,6438,6237,5705,1996,4594,7202,4976,3655,6788,3484,1786,5352,3417,4838,4541,3305,6346,3752,5488,2781,1959,4567,2002,4731,3845,6736,3717,5244,6467,5792,1913,5028,3388,3279,6536,5676,2875,4783,1949,3638,2982,3682,6441,5306,2017,5516,3522,6914,5708,2930,1534,5421,2985,5896,4999,3011,3467,6251,5230,2795,4921,3313,6324,3167,5331,2553,5457,4596,7424,3429,2903,5673,2972,6295,4942,5766,3858,6353,2782,6428,2877,5291,1788,4841,7171,3611,4922,6792,3261,4828,5360,3659,4542,5058,3411,6238,6348,5522,1910,5716,1965,5032,3478,6442,3306,2004,6544,5473,4571,4949,3736,3434,6752,5406,3013,4963,1901,4733,3662,7233,3778,6496,1966,1775,5647,3287,6469,5326,2986,6677,5510,2932,2008,5003,2554,6299,3375,6354,5302,5763,3637,6449,3852,5684,2797,5429,4583,3418,3688,2993,5904,3014,6691,4791,5537,3504,6444,3729,6253,5183,2803,1531,4842,7192,3314,4924,2907,3475,6328,4849,5706,3641,4950,3436,6678,2988,5333,1971,5422,7204,4953,6681,3262, 1950,5464,2878, 5305,4600,4895,3857,6259,5451,2959,4351,1909,5060,3669,7234,3630,6311,5338,5005,1991,5769,3880,6369,5655,2919,6470,5405,2018,4815,2687,6450,3528,6916,1727,5239,3746,4573,6301,33 83,5713,2936,1916,5011,3420,6800,3293,6473,5544,2527,6254,1855,3470,6261,3316,6356,5476,2 994,4734,3780,3725,4844,2798,3850,6315,5040,5824,3674,7182,3441,6920,3017,5427,1974,5323, 7208,4965,2556,3661,5688,2909,5524,4587,4795,3494,6474,3905,5349,5447,1995,4850,7297,3387,5279,2805,5661,4954,5714,3430,6370,5513,3018,6693,5572,2020,4574,7187,6682,6531,1977,50 64,5356,3748,4479,6452,3291,6360,5308,2967,1787,5006,3642,6560,3481,6415,1914,6423,5897,4 911,3874,6302,3552,6481,5675,2923,5072,3683,6694,3307,2910,3968,6816,4966,2005,3723,7236, 3493,6262,5780,2806,1887,5729,3197,5013,2996,6476,3407,6723,5433,5337,1023,3864,6684,3644,5702,5920,7216,4823,3719,3760,5246,3025,5538,4589,5453,3433,6533,5347,2971,6317,5772,19 63,4969,7181,3670,6265,5480,3020,4797,5662,3482,5027,6697,3359,6343,5419,1998,5894,3777,6 928,6323,1783,5461,2809,5569,4852,6372,3444,6482,5430,2925,4956,4595,3255,6456,3523,7680, 6848,2024,4827,3497,7298,3860,6534,5744,3000,6318,5334,3734,4919,2543,6698,3310,6725,5671,1980,7190,5018,3692,6537,3667,5295,5770,3389,4970,3477,6427,3873,5528,2751,5517,5014,19 03,3419,6266,3686,5732,6592,5350,1973,4598,3615,3784,6497,5891,2983,5029,5462,3733,3026,3 673,6705,5434,2003,5778,7240,6347,5683,2931,1789,5307,2810,5584,4839,6207,3294,6484,5454, 2551,4856,3506,6538,7193,5340,2973,5677,4977,3442,7425,3317,6671,5243,2926,6726,4590,5475,3526,6700,2783,6325,6439,5368,1997,4798,7203,3847,5017,6429,3726,5720,3908,4597,4972,34 91,6376,3685,6268,5511,2032,1978,4943,3529,6349,3421,5952,6326,5540,5088,3747,3303,6787,5 793,3041,4543,1917,3639,7300,3876,6706,5703,2010,5532,3500,6430,5465,2933,6729,5353,2987, 5800,4829,3042,3448,6443,5893,5765,3792,6498,3704,5436,3028,5327,4923,7189,3737,2974,5686,2812,6355,5030,5730,3318,6545,7248,6329,5570,2989,1519,4978,7205,3676,5033,6540,3415,64 88,5059,5515,3853,4843,3505,6730,6789,5361,2019,5215,7426,4601,3969,6737,3631,2006,6679,5 477,4951,5020,3435,6384,3690,5906,3015,4830,1951,4925,3315,7194,3532,6350,5659,1911,5309, 3498,6239,5707,2934,6471,5459,2021,2879,6708,3731,6944,5526,5354,3390,6546,3859,5784,2995,5482,5061,3753,3479,6500,5710,2555,6451,5826,3309,6445,3888,6561,5335,2937,5034,7304,36 98,4980,3032,3808,6357,4602,5423,3538,7210,3663,6712,2799,5685,2009,5900,7264,4845,6976,3 750,5466,2990,5736,5041,5062,3906,6732,7179,5552,5777,1790,4851,3471,7681,3508,6330,5362, 4955,5523,3431,6790,5689,3044,6548,5484,2026,5036,7235,6371,3740,7040,1975,5310,3689,4926,6738,3862,6562,5905,3019,2012,5007,3525,6446,3321,6793,5717,6915,5678,3560,6504,3781,66 83,5928,2938,4967,3646,3422,2557,3854,6255,4735,5576,3970,7196,3697,6475,5794,2997,1967,5 431,7312,4984,3021,3445,6358,5468,5341,4575,3537,6453,3756,5518,5364,7206,5042,7428,3675, 5828,3048,5773,4846,5898,3738,6332,5722,2940,6593,5489,1915,5065,7217,3322,6361,6552,4604,5709,3486,4957,6753,3865,6740,5542,2025,5953,3438,6695,3512,6794,2022,6373,5435,4853,63 03,3916,6564,5478,2998,5066,3199,6454,3779,7237,3554,6685,1981,3875,7432,3645,6917,5796,2 911,6754,5339,3499,5015,2807,6801,3912,6477,5690,5529,7209,3762,6263,3749,5922,5600,7242, 4971,3443,3851,5731,3056,5355,4958,6016,3671,6744,3530,5771,6483,5541,1918,4854,7328,3324,6362,5245,2558,5044,5455,3483,6512,3700,6796,5912,2033,5692,7175,6374,6535,1999,5767,30 27,5808,5073, 6457,3540,6594,5481,3001,5019,3976,6686,3877,7682,6478,5718,5068,3437,7220,3 786,6377,5530,2811,6699,5407,3920,6918,3022,6319,3501,6267,5825,2028,7299,3691,4857,6802, 3761,5492,3866,4973,3263,6756,3450,6485,5303,5571,1533,3677,6921,3568,5545,6364,5908,5048,3878,3739,6458,5782,3002,4591,5358,3507,7249,3782,6568,5740,2011,5715,7212,6539,5437,29 27,5525,3029,5921,4799,6817,3553,6727,5467,5734,3754,6499,7440,5663,3030,5832,5031,7238,3 972,6431,5781,2975,6327,5074,5721,3881,6378,7195,6269,6701,1982,4979,7360,3687,4858,6804, 3495,6760,5342,3794,4599,3391,6486,3727,6460,5554,2034,7301,5021,3868,6385,3809,5490,6922,5365,4974,3527,6707,3323,5574,3043,4831,1979,3788,7218,3449,6489,5895,2023,5774,3936,65 96,5956,2813,6541,5539,5733,3004,3544,6547,5577,5469,7256,6351,3909,5795,2935,5351,5089,7 684,3485,6818,5687,3033,6702,5924,3768,6929,7244,6576,5548,3045,4981,7183,3678,5035,6501, 3861,6331,5090,5496,3510,7306,3446,6380,6808,5840,2013,5752,7456,5076,6768,3693,6731,5785,5022,4860,3896,6924,3735,7224,5366,2036,5037,3295,7266,3764,6849,5724,5463,3984,6270,59 01,3034,6386,5553,2007,7207,6709,3531,6542,6017,5679,3699,6490,3793,6600,5483,2991,5738,5 063,3907,3556,6502,5363,6549,5580,3882,6447,3502,6713,5546,2939,4982,7688,3889,3046,3643, 6388,4927,5779,3326,7302,7241,6739,5438,2814,2030,5907,7427,5043,6333,3513,6710,5801,5527,4603,3757,6820,7313,5357,5936,7198,4985,3812,7252,3694,6505,5746,5080,5856,3785,6850,55 86,2559,6733,5711,2014,4847,7488,3533,6359,6930,5798,3452,5038,6791,3741,6492,5954,2040,3 914,6563,4000,6550,5519,6608,5556,6824,3539,6945,5479,3036,5092,3705,3800,7213,3855,6506, 5788,3447,7308,3892,6734,5737,3049,6553,5910,7430,5067,2999,3702,6714,5573,5369,7265,3974,6932,3755,5608,5829,7696,4986,7250,3439,5694,3050,5470,4605,5902,3516,6741,7219,6018,67 16,5745,1535,5045,7330,3884,6363,6455,5069,5493,3542,6852,3921,6742,5585,2027,5804,7433,6 745,3319,6795,2029,6565,5723,5096,6936,3742,6946,5786,2941,4988,3971,6755,3509,7191,6746, 5370,3796,7316,3763,6554,5534,3023,6375,5913,3910,2942,6832,3863,6797,5486,5560,7272,3545,6392,3701,5964,7214,5046,3558,3810,6513,5247,5827,5602,3890,6334,3423,5923,6508,5693,49 59,7712,3751,6798,5547,3057,4855,5960,3514,7239,3922,6803,5810,2035,5797,7305,6479,6624,5 491,3003,5899,5104,6459,3787,6365,5719,5578,3534,6514,3978,7429,6757,5372,4606,7552,3937, 6566,5531,3052,6569,5748,3706,6595,7221,6758,3869,6687,2037,7442,3766,5075,6379,3977,6556,5588,3647,5049,3555,6487,3824,6516,6024,5925,7329,3453,6919,3783,5485,6461,5834,4859,38 79,3541,5968,3058,5070,5549,4032,7683,3503,6366,5739,1791,5809,7243,6570,5914,3005,5311,5 498,6597,3913,6381,5725,5616,7268,6703,7314,5926,3031,5787,5050,7436,3758,6977,5555,3006, 6948,5830,3562,6856,7226,6978,6805,4975,7197,3924,5077,6952,3816,6923,5601,3769,7361,3986,6761,3708,6748,5802,2038,7685,5078,6577,3548,6864,6020,5023,3451,6960,3940,7245,5929,20 41,3867,7320,3789,6980,5735,5543,3564,6491,5842,3035,7041,5439,5775,7280,3980,6387,5916,5 857,7441,6806,3511,5575,3060,5371,5091,7744,3891,6598,5836,6462,5497,3797,6819,7254,6762, 5984,3047,4861,7225,3886,7042,3325,6925,5052,5592,3695,7458,7364,6520,6572,1919,5957,7690,4983,6809,3973,6880,5533,5081,3546,6711,3790,7251,5816,7336,5093,3561,7222,3928,6984,57 26,5909,3765,6769,5558,3064,6382,5494,2042,7303,4001,6503,6601,5741,3885,6543,3915,6931,5 944,5783,3679,3517,6735,5343,6822,5812,6578,3795,6821,6032,2815,5082,7434,3952,7686,3772, 6493,5579,3572,7444,7246,6389,5747, 3037,5841,7332,5039,6602,3454,6810,5955,5604,7257,3802,6764,7697,5930,5550,7307,4987,7457,3870,6507,5937,5094,5691,3883,6271,7211,5374,6335,20 39,4862,7269,3547,6926,6551,5561,3992,6580,3911,6770,5805,2044,7362,6715,3938,6609,5860,6 825,5742,6390,3515,6851,5833,3051,4607,3570,3811,7490,6494,5581,3743,7228,3898,6743,5500, 3038,6812,5789,7692,3053,3985,6934,5962,6048,7309,7464,6604,3770,5587,7267,5084,7344,3893,6393,5753,5848,5903,3543,6826,7808,5495,6717,5940,5097,7315,3703,6555,6947,5047,5750,38 13,7260,4004,6933,6022,2043,5803,7448,6853,6509,6584,5487,5098,6772,3535,6833,5564,3798,6 518,3917,7368,6567,5932,7700,3569,6610,5590,3007,6937,5969,3944,7274,6394,3311,6515,5367, 7318,3988,6625,3818,6718,5790,7492,4989,3925,3557,6557,6019,5557,7253,3759,6747,3804,5844,6510,5811,5071,7689,3894,5958,3059,4990,5911,4008,7431,7199,6612,5593,2031,5749,7714,67 99,7044,5606,5858,6949,3832,6759,5938,5471,7310,6828,3918,7553,6854,5799,5105,7331,3710,6 573,5562,3061,6938,5970,4033,6396,7258,6517,6749,7376,3801,5051,6992,3975,6834,5835,3576, 3897,6857,3930,6776,5582,6026,7460,6626,3814,6950,5985,5100,3559,4002,7276,5754,5917,3767,7227,3825,6571,5814,6025,7321,7048,5695,2943,5603,5872,7713,3487,6558,5501,5831,7435,63 67,7270,5927,3054,5589,5106,7698,3926,6807,6080,6836,5551,3939,6979,7472,6763,6616,5053,7 281,3987,6599,3709,6940,5961,3550,7333,7745,6953,4034,6858,1983,7392,5079,6865,3900,6981, 5806,5054,3982,6860,3771,7230,5610,7446,3820,7496,3563,7008,5972,5864,3945,5817,3062,6954,6034,5756,7317,3518,6750,5596,7338,7056,3791,5499,5988,7247,3979,6866,5915,6840,5837,65 21,7568,6579,5612,3065,5083,7437,4016,7704,3929,6961,6028,3942,7273,7936,6463,6765,5559,7 324,5108,6956,3817,6628,5939,7489,3565,6574,3826,7716,5845,7282,5095,7443,3989,6982,5934, 5373,3871,6811,7363,5743,6632,2046,7255,3707,6383,6522,6021,4040,6603,3923,6766,5594,5838,7554,3803,6771,5609,6581,5976,6524,3549,5813,3066,5112,7345,3948,7752,6962,6049,3773,73 22,7438,6605,5933,3039,5963,7687,6640,3981,6813,5727,5565,7334,7461,6823,7284,5843,7223,4 863,7365,3887,6868,6000,5820,3573,6985,7449,5620,6773,5085,7728,4003,6495,6611,5502,4036, 7504,3932,6582,5850,2047,7259,6881,6395,6606,5918,6586,3774,6585,5931,3996,3828,7810,6613,5595,7693,3566,6391,6040,3068,6827,5959,7340,7370,3815,6986,5986,7556,7271,6882,3953,55 63,7288,5099,7452,3899,7043,5618,5859,7746,3941,6814,7462,5791,6927,5946,5086,7229,3993,6 993,5101,6033,3805,7699,7337,6964,2015,5818,7720,6872,7072,5941,6935,3578,6511,5591,7520, 7045,4006,7377,6774,5751,7465,3519,6829,5861,3055,6988,6052,4048,7348,6777,6855,7262,3895,6397,3946,6835,5583,7445,3571,3990,6968,5846,5965,7319,7046,4009,6830,5617,5055,7812,39 19,7366,5992,5359,3819,7560,7277,6884,6036,5866,7491,6994,6519,5973,5605,7702,3577,6588,5 807,5852,7450,6614,7311,6627,5942,5107,7691,3960,6559,6056,6629,3806,7049,7346,6939,6617, 7384,4037,6778,3994,6888,5880,3574,7760,6996,3954,7104,5966,7466,7009,3931,6837,5758,5109,3821,4005,7275,6081,7938,3901,7494,4024,6941,5849,6023,7369,5624,3063,5945,5978,7748,77 15,7050,5862,7396,6859,7285,5607,6050,7474,3799,6951,5815,6618,5873,6780,7323,6838,6398,4 991,7694,4041,7809,3551,6861,5535,4010,7215,7459,6719,7057,7584,5102,6942,3829,6955,5974, 3933,6523,3956,7352,5987,7497,7335,4064,6841,6035,5757,3902,7708,5598,6575,6082,7286,3580,6751,5948,7372,6633,4020,6030,5819,7468,3822,7010,5868,6867,5611,6630,7717,5993,3067,51 10,7325,3943,7378,7052,5566,4035,7937,7705,6862,6957,5839,7508,6620,4017,7000,6027,7261,7 555,6983,3830,7473,7439,5113,7290,3327,6869,6064,5977,3991,6842,7616,5990,7058,7393,3947, 6896,7012,5865,4042,3711,6963,5613,5874,7493,6958,6583,6037,7073,4012,5919,7341,3833,7722,6634,5755,7283,7824,6767,6088,3069,5971,7776,7480,3983,6815,5851,7342,7506,6883,7747,55 97,7701,5114,7557,3934,7060,5996,7447,4049,6607,7380,5821,6987,5087,7279,3455,6525,6029,3 827,7816,7498,6641,2045,7730,7074,6965,5935,6870,4038,7105,5621,7347,4018,7326,7016,6051, 7562,3927,6084,3070,6636,5980,7394,7476,6775,7718,7367,6873,3950,5822,7289,7749,3995,6844,6044,5876,7940,6587,7451,6885,5614,5116,7522,3807,7706,5863,3955,7500,7349,6989,6001,74 63,7064,6526,5947,7729,3575,6966,5989,7569,6995,7373,6874,6041,7753,4044,6642,5853,7024,3 834,7400,6886,6589,7536,4007,6615,4050,6779,5626,7292,7840,3961,7076,6054,7724,6831,3997, 5567,5103,7354,4065,7564,6096,7756,3582,7469,7944,7047,5943,5994,7278,6969,5619,6038,7379,7505,6644,6057,7721,6990,7814,5967,7339,3836,6889,5867,6970,6876,7408,6590,7106,7570,39 58,7764,4013,7080,5625,4052,7521,6619,6997,7454,7011,3949,6781,6008,4014,3823,7695,5854,7 374,7558,4056,7051,6085,6042,7350,7811,5622,6002,7732,7477,6631,5979,7952,6839,7585,5869, 6053,7231,3579,6890,5949,6972,6072,6897,7754,6998,5111,7381,4019,7470,7001,3998,7512,7353,6648,6943,7499,6399,3957,7108,5847,7386,7053,4039,7817,7703,7453,4066,6863,6089,5599,37 75,7287,6058,6621,7761,3964,7059,5877,7592,3903,5981,6004,7524,6782,6892,6112,7088,7872,5 950,7475,4022,7371,7013,5628,7736,7572,6635,6843,6068,7397,7495,4043,6898,5870,7327,7709, 7002,7762,7561,5115,7620,4068,6622,5991,4025,7112,7404,6083,6527,7356,3835,7054,6065,3962,7945,6959,5878,7723,7120,5375,7014,4053,6039,7828,3935,7777,7061,5995,7481,7385,6090,30 71,5759,7750,7968,6871,7294,7586,6637,7501,6060,7395,7820,4011,7017,5881,7528,6845,7710,7 075,5117,7467,4046,7942,6031,3831,7509,7617,6900,7478,7004,6643,5982,4072,6875,6097,7792, 7382,6967,5503,7719,4028,5875,7066,7343,7818,7018,7576,7565,7062,3951,6086,7780,7398,4021,6646,6066,7939,7077,7510,5975,5118,7482,4051,7826,7731,3837,7355,7632,6887,5998,7502,69 04,6043,7388,7725,7025,7291,6638,7523,5855,7416,4045,6846,6003,7065,7768,6645,7020,7559,4 080,4026,6991,5623,8000,7588,7136,7841,6591,3965,6092,7751,4058,7580,5882,7513,7401,7848, 6877,6055,6098,7941,7813,6009,7484,7375,6971,6045,7734,7078,7778,6113,7618,3567,7026,5630,7081,7107,7563,6891,7409,4067,7263,6649,4054,7525,6999,7068,7954,6878,3999,6973,5884,77 07,3959,7357,7755,7507,4069,6006,6061,7574,7402,6100,7832,7530,7109,5997,7758,7874,6062,5 871,7383,7082,7028,6104,6650,7471,7733,4057,7948,6893,7514,7784,7089,7110,7600,7825,3838, 6899,5627,7410,7003,7571,7737,7532,4074,7084,6067,4023,7358,6046,6974,7953,4060,7055,6005,7765,7726,6087,7976,7015,6114,6783,7624,5823,7842,4015,7479,7032,6012,7516,7389,6623,59 51,7566,7412,7090,7876,7821,6894,7946,7770,7537,3963,7113,6070,6652,7757,7005,7590,4073,8 001,6091,4070,7483,6901,7526,7114,6116,4029,6073,7844,7387,7063,5883,7738,7577,6010,7970, 7648,7019,7779,7403,7006,8064,6101,7819,7589,3966,6902,5983,7293,7092,7503,5119,7960,4081,7740,4047,7815,7856,7121,7529,7067,6059,7766,7116,7578,7455,6094,7873,4076,5879,6905,75 40,7021,7351,7619,3581,6120,7593,7956,7096,7830,6639,7406,6076,7788,4059,7763,7485,7573,7 969,6847,5999,7515,7782,6069,7711,7880,7079,7829,7122,7769,6099,4030,7027,5885,6906,7390, 6647,7602,4082,7069,7538,7413,7022,7622,6879,4027,6093,7943,4071,7822,8004,7587,7781,612

8,6074,7625,7517,7843,7399,7137,6013,7735,7972,6106,7596,7029,7083,7138,7544,7888,4061,7800,7124,7833,7070,6908,7414,4084,7085,5615,7772,7511,7949,7601,4055,6115,8065,7727,6102,7531,7786,7111,6047,7411,7628,6007,7594,7030,6117,6975,7827,7486,4078,7955,7091,7849,7575,6651,7405,7984,7033,7794,7128,7904,7634,7759,4062,6895,6105,7846,7086,8002,4088,5886,7567,7604,7527,7140,6122,7836,6071,7785,7958,7115,6108,7621,7417,7656,7877,7034,7742,7518,6653,7950,8066,7793,3583,7093,6063,7117,7541,7633,4075,7852,4077,7771,7144,7834,7036,6011,7418,7582,7961,6121,7534,7608,6118,8012,7094,7295,7875,7650,6077,7971,7741,7007,7595,6903,8008,7858,4083,7845,7539,7947,7152,7767,7626,6014,7420,6654,7579,7796,6129,4085,6095,7123,7636,7097,8072,7973,7533,7882,6907,8016,7118,7597,6124,7787,3839,7857,7962,7359,7546,5629,7773,7664,7974,7835,7098,7603,7878,6107,7023,7125,7649,7850,4086,7126,8068,7071,7977,4089,6078,7783,7591,7890,7487,7823,6130,7964,7905,7623,7419,7139,6075,7884,7545,6119,8032,6909,7100,7640,3967,8005,7031,7581,7129,7864,7141,7774,7957,7606,7542,4090,6109,7789,7992,7831,6132,7391,7860,8080,7130,6103,7627,7795,7889,7087,8003,7652,7978,7598,7035,7985,7142,7739,7422,4087,6910,6126,7609,7853,4092,7908,7790,7881,6655,6110,7629,7548,7837,6136,8010,8096,7635,7132,7801,7896,7951,7543,7988,7145,7095,7798,8070,4091,7851,7535,7146,7612,5631,7980,7638,8017,6123,7415,6125,7838,7037,8067,7605,7892,7859,7119,8006,7038,7959,7641,4079,7797,7654,7906,7986,7519,7847,7153,7610,8018,6131,7099,7883,7630,8074,8033,7148,7802,7965,6133,7862,8073,7743,7651,7920,7549,7879,7975,7637,7154,8128,7599,5887,7101,8009,4031,7127,7854,7102,7658,8020,7912,7865,8082,7804,6134,7644,7547,8036,6137,7963,7885,7660,7131,8076,7607,7156,7987,7893,7143,7982,7421,7791,4094,6015,8069,7642,7886,7657,8024,7861,7160,6138,8097,7981,8011,7775,7613,7891,6911,8048,7868,7668,7133,7550,7898,4095,7966,7979,6135,7643,8088,8007,6140,8034,7611,7147,7666,7907,7839,7994,7134,7149,8081,4063,7866,7989,7639,7799,7909,8100,6139,7631,7894,8013,7665,7103,8040,7407,8084,7914,8021,7653,7855,7900,7990,7155,8104,6127,7928,8014,7806,7157,8129,7897,8071,7672,7993,8026,7910,7655,8098,7863,7921,7039,7583,7150,8022,8035,8083,7805,7646,8130,6079,7996,8078,7867,7916,7659,8041,7158,7614,7887,8075,7161,8112,8025,8038,7913,7661,7922,8085,7967,6142,7803,8136,8019,7899,7645,7162,8044,7869,7135,8077,4093,7983,7669,8099,8132,8028,6143,7870,8092,7924,7662,7164,7911,8049,7995,8037,8089,7901,6111,7674,8102,7615,7151,8144,7991,8042,7667,8086,8105,8015,7915,7673,8056,7902,8133,8090,7670,8050,8027,7917,8101,7997,8120,7159,7895,8137,7647,8106,7925,8029,8052,8160,7998,7676,8116,7918,7163,8039,8131,8113,7926,7423,8087,8043,8138,7807,8108,7929,7165,8079,8030,8145,7551,7923,6141,8134,8114,8023,7166,8046,8091,7903,8051,7671,8140,7930,8103,8146,8057,8093,8161,7678,7932,8054,8109,8148,8045,8110,7919,8152,7675,8115,8094,8053,8135,8162,7871,8060,7999,8118,8139,8164,8121,7931,8058,8149,8031,7167,8107,8142,7927,8168,8124,8047,8117,8147,7933,8141,8176,8122,8061,8154,7663,8163,8150,8095,8055,8165,8153,7934,8170,8119,8156,8111,8059,8169,8166,8125,8062,8177,8143,8172,7677,8155,8126,8178,8123,8167,8157,8180,8151,8174,8158,8184,7679,8171,8173,8179,8181,7935,8182,8185,8063,8186,8183,8188,8187,8175,8127,8190,8191,8159,8189]

Sequence Group 5: Z5_8192

[0,1,2,7,3,8,11,24,4,10,13,28,16,33,35,77,5,12,14,32,19,38,47,81,22,46,42,88,57,96,102,168,6,17,21,40,23,45,51,90,29,55,59,97,72,111,117,188,34,61,75,115,80,124,134,200,87,136,147,227,152,239,260,388,9,18,26,54,30,58,71,105,36,76,62,118,84,128,141,209,44,74,86,135,92,144,151,233,100,154,170,251,186,269,289,434,53,89,98,150,112,161,179,266,122,180,199,281,211,306,324,474,138,207,230,312,236,325,351,508,257,360,381,535,402,563,610,869,15,25,31,73,39,79,82,140,48,85,93,149,101,159,165,263,56,94,103,162,116,178,196,284,127,197,208,299,232,320,345,495,64,109,123,185,129,198,215,314,148,228,237,327,256,358,373,534,163,247,267,364,282,397,405,560,308,421,456,596,484,633,710,871,69,125,143,218,158,235,254,362,169,258,272,387,290,404,433,585,194,285,300,418,326,447,479,646,341,487,516,679,543,723,752,1013,214,315,335,462,365,494,521,698,401,530,561,739,598,759,831,1101,430,572,611,796,628,854,886,1172,704,908,941,1157,980,1229,1326,1690,20,37,41,91,49,95,106,177,50,107,119,189,131,210,219,343,63,120,132,224,145,231,245,344,153,244,261,379,286,400,410,559,67,142,155,226,173,248,268,398,183,278,291,413,305,444,467,623,181,301,318,443,340,480,499,680,368,523,544,721,569,747,805,1077,78,167,174,275,192,297,316,435,201,323,332,476,352,506,528,718,259,346,367,514,390,540,568,742,424,578,617,791,649,851,892,1147,296,383,414,554,442,595,621,834,470,640,661,867,711,922,953,1210,518,708,725,942,743,982,930,1253,816,1066,1102,1346,1114,1470,1534,1770,83,190,195,339,249,357,372,522,276,377,391,549,423,580,615,837,292,419,439,583,459,622,653,875,488,664,697,914,740,949,1010,1269,342,445,465,652,497,688,731,932,547,732,754,1002,817,977,1086,1358,593,781,844,1069,877,1112,1152,1427,924,1163,1161,1518,1258,1560,1614,1954,382,485,525,734,579,757,804,1029,618,835,857,1105,903,1124,1159,1463,654,883,936,1148,960,1168,1262,1564,1025,1276,1321,1626,1393,1709,1763,2143,719,944,994,1265,1083,1271,1375,1655,1098,1366,1437,1743,1498,1815,1922,2303,1129,1475,1553,1847,1597,1936,1888,2356,1684,2008,2061,2509,2169,2594,2711,3024,27,43,52,99,60,121,133,216,66,137,146,223,157,242,246,394,68,156,166,241,175,298,309,429,203,311,338,471,354,501,526,737,70,172,191,304,205,336,348,492,217,361,374,531,396,564,590,761,229,385,409,575,437,614,635,822,449,624,667,882,677,912,945,1335,110,204,212,353,225,375,395,553,252,411,425,603,453,643,663,842,274,428,464,631,490,675,683,894,513,686,695,952,778,983,1055,1362,293,489,504,693,539,727,736,968,567,777,808,1024,861,1078,1106,1442,601,830,878,1111,925,1144,1216,1504,991,1226,1280,1565,1322,1633,1724,2126,113,221,243,406,271,426,458,648,288,468,493,687,519,702,713,962,322,505,537,716,566,771,799,1019,599,819,859,1096,895,1131,1191,1449,349,551,589,806,636,846,843,1134,655,884,910,1173,971,1221,1241,1575,701,927,986,1230,1021,1292,1325,1659,1065,1353,1409,1744,1515,1828,1930,2320,370,608,642,888,682,921,973,1227,768,990,1035,1312,1042,1331,1387,1704,783,1038,1064,1373,1140,1406,1484,1812,1204,1507,1548,1854,1612,1969,2019,2375,821,1156,1182,1452,1249,1521,1559,1904,1281,1608,1666,2001,1726,2071,2155,2532,1414,1670,1751,2085,1841,2182,2232,2680,1910,2280,2350,2749,2439,2873,2997,3468,130,253,279,469,319,503,533,746,329,542,573,774,604,813,874,1193,363,591,647,838,669,918,900,1208,689,937,978,1275,1030,1299,1340,1685,438,657,691,915,767,966,996,1319,773,1034,1051,1342,1081,1388,1425,1781,785,1074,1121,1420,1201,1480,1540,1862,1236,1591,1610,1980,1668,2021,2105,2491,451,766,770,1022,789,1040,1093,1399,827,1142,1179,1465,1222,1529,1601,1943,985,1197,1252,1545,1286,1627,1674,2013,1395,1680,1755,2090,1846,2171,2223,2675,1047,1290,1372,1631,1415,1738, 1790,2122,1492, 1824,1875,2218,1937,2285,2370,2800,1555,1917,1993,2348,2059,2416,2486,2890,2136,2518,2589,2981,2630,3134,3154,3775,463,792,812,1188,963,1214,1239,1586,1005,1273,1309,1644,1384,1 697,1775,2110,1058,1336,1411,1713,1459,1798,1880,2203,1533,1932,1869,2257,2014,2363,2438, 2822,1205,1429,1479,1831,1572,1891,1985,2333,1621,1995,2056,2419,2098,2447,2539,2965,172 8,2076,2151,2502,2236,2604,2660,3078,2299,2734,2785,3204,2879,3279,3302,3640,1287,1486,1615,1998,1692,2044,2077,2474,1768,2164,2188,2574,2265,2609,2754,3149,1786,2251,2339,2728,2 432,2802,2815,3295,2523,2897,2946,3355,3056,3484,3563,3985,1950,2402,2422,2859,2557,2906, 2987,3389,2624,3072,3095,3547,3225,3569,3792,4143,2697,3187,3264,3681,3373,3720,3854,427 9,3433,3888,3969,4392,4064,4487,4566,4981,139,114,65,287,104,264,184,520,126,187,206,454,222,359,328,594,160,220,240,337,265,416,376,694,307,392,432,562,475,772,638,959,171,250,270, 399,310,422,481,613,330,507,448,870,548,660,705,1333,355,486,577,676,529,735,826,1136,605,8 10,769,1001,893,1195,1043,1664,202,295,313,461,350,500,557,715,386,630,509,753,592,786,853, 1062,420,546,672,823,639,951,807,1100,584,860,981,1155,917,1397,1228,2006,450,668,607,904, 760,873,1014,1181,703,1075,940,1295,999,1248,1589,1468,794,1027,1089,1439,1135,1313,1360, 1708,1184,1510,1404,1920,1567,2235,1813,2663,234,333,371,536,408,571,629,833,446,717,597,8 63,662,901,970,1263,477,637,762,913,696,1053,943,1238,788,1004,1122,1324,1080,1380,1491,17 53,515,745,678,975,856,1032,1132,1351,825,1200,1056,1606,1175,1434,1450,1871,906,1118,1274, 1489,1225,1528,1647,2288,1347,1683,1579,1902,1773,2027,2104,2768,565,776,881,1097,815,11 38,1245,1506,931,1302,1177,1736,1364,1546,1640,1978,984,1215,1382,1594,1464,1676,1860,205 4,1278,1803,1696,2201,1914,2141,2354,2936,1037,1413,1500,1819,1310,1747,1886,2400,1558,19 66,2038,2222,1769,2513,2305,3648,1613,2004,2089,2477,2148,2368,2443,3124,1928,2579,2636,2858,2709,3396,2992,4430,283,393,427,632,482,726,665,958,502,685,848,1011,764,1071,1123,140 2,555,797,738,1091,852,1232,1045,1462,920,1143,1260,1520,1186,1702,1630,2271,600,865,814,1 334,993,1133,1192,1532,902,1219,1289,1834,1370,1584,1678,2063,1023,1400,1317,1734,1502,16 53,1845,2134,1447,1801,1896,2181,1977,2315,2498,2841,645,1085,891,1251,946,1423,1298,1749,1046,1349,1474,1688,1527,1816,1908,2238,1151,1595,1451,2031,1391,1839,1893,2453,1682,196 4,2074,2324,2139,2395,2593,3178,1213,1625,1523,1923,1722,2012,2186,2555,1827,2255,2042,24 71,2096,2744,2649,3094,1562,2162,2365,2695,2283,2610,2918,3067,2423,2866,2770,3337,3035,3 254,3490,4524,729,972,1109,1398,1180,1457,1642,1940,1247,1759,1495,1999,1581,1879,2146,2547,1068,1543,1618,2091,1742,2317,2036,2507,1877,2208,2268,2715,1962,2895,2641,3781,1339,1 660,1814,2387,1948,2230,2174,2836,1716,2294,2484,2679,2414,2756,2978,3271,2081,2458,2359, 2789,2550,3139,2915,3371,2651,3003,3191,3544,3099,3457,3861,4141,1410,1840,1991,2290,176 1,2577,2373,2856,2128,2393,2703,2954,2480,3030,3213,3622,1903,2614,2527,3053,2732,3263,3113,3590,2880,3162,3415,3518,3332,3967,3819,4319,2215,2806,2667,3246,2970,3664,3170,3757,2 584,3423,3306,3847,3353,3915,4062,5208,2777,3638,3551,4166,3479,4011,4243,4625,3739,4204, 4124,4800,4364,5545,4689,5856,369,455,527,751,587,780,850,1127,626,955,818,1267,897,1170,1 328,1638,670,862,1017,1199,934,1455,1256,1700,1073,1386,1525,2025,1357,1754,1830,2330,712, 1008,961,1307,1087,1377,1505,1865,1203,1599,1436,1784,1574,1915,2116,2467,1146,1538,1478, 1901,1652,2067,1983,2406,1740,2094,2206,2988,2244,2673,2592,3244,802,1033,1190,1453,1306, 1513,1807,1960,1120,1551,1672,2029,1583,2170,2047,2530,1285,1711,1756,2312,1620,2113,226 3,2701,1935,2340,2159,2623,2451,2775,2910,3456,1445,1797,1986,2220,1883,2389,2326,2834,20 75,2568,2473,2761,2310,2926,3017,3400,1857,2602,2522,2959,2718,3164,3079,3599,2430,3060,3 229,3940,3325,3815,3718,4453,911,1330,1167,1649,1243,1974,1602,2249,1473,1698,1873,2227,1 822,2154,2383,2843,1441,2083,1898,2493,1795,2337,2302,2932,2041,2437,2628,2783,2564,3038, 3131,3558,1570,1953,2132,2399,2198,2689,2538,3185,1968,2506,2811,3086,2616,3007,3300,367 0,2250,2763,2687,3147,2939,3431,3238,3763,2901,3320,3578,3838,3475,3980,4045,4855,1730,2276,2050,2665,2153,2586,2792,3256,2331,3022,2747,3208,2863,3347,3417,3870,2428,2962,2839,3 465,3144,3384,3628,4301,3061,3733,3495,3958,3672,4107,4226,4603,2524,2851,3171,3552,3014, 3605,3751,4071,3317,3910,3656,4187,3844,4261,4381,4762,3248,3766,3917,4529,4053,4334,442 2,5022,3702,4476,4649,4940,4721,5100,5315,6007,1076,1385,1297,1890,1517,1972,1836,2381,1585,1780,2156,2696,2069,2456,2595,3063,1657,2108,2017,2500,2297,2912,2571,3156,2242,2644,2 766,3344,2849,3233,3505,3931,1809,2319,2213,2670,2409,2739,2782,3262,2120,2826,2976,3510, 3107,3446,3394,4006,2515,2986,3176,3378,3070,3585,3680,4157,2930,3741,3561,4086,3831,426 8,4356,4872,1945,2176,2542,2969,2385,2888,3153,3527,2682,3285,3044,3449,2657,3630,3710,4182,2752,3116,3194,3950,3315,3663,3797,4565,3426,3895,3743,4255,4029,4339,4508,4971,2871,3 223,3536,3803,3339,4092,3899,4397,3645,3853,4159,4444,3974,4755,4581,5073,3473,4079,4247, 4608,4341,4833,4737,5249,4220,4669,4946,5404,4863,5165,5478,6118,2224,2465,2599,3137,282 0,3411,3084,3735,2737,3240,3215,3877,3362,3991,3836,4493,2944,3570,3323,3813,3654,3926,4167,4435,3524,4102,4238,4588,4052,4677,4822,5242,3046,3440,3758,4020,3608,4262,4133,4659,3 685,4175,4323,5002,4469,4739,4761,5374,3893,4414,4556,4816,4374,5080,4894,5336,4271,4930, 5150,5632,5056,5440,5600,6452,3268,3724,3824,4403,4026,4236,4548,4841,3947,4317,4451,491 0,4642,5133,5017,5497,4148,4514,4661,5094,4744,4964,5231,5716,4771,5299,5171,5565,5345,5687,5787,6660,4350,4683,4849,5224,4925,5257,5424,5638,5039,5418,5330,5869,5530,5875,5757,6 348,5149,5492,5616,5938,5702,5972,6054,6209,5800,6067,6146,6285,6221,6941,6535,6604,108,1 64,176,273,193,277,317,440,213,302,334,472,378,512,532,787,238,321,347,510,403,545,612,801, 431,609,576,839,674,880,916,1198,255,380,415,570,436,606,641,847,483,658,684,885,756,954,987,1272,517,699,779,974,798,1012,1052,1315,836,1060,1107,1412,1137,1456,1526,1905,294,384,4 60,651,491,681,750,929,538,784,706,989,828,1031,1090,1350,586,775,832,1057,868,1099,1126,1 428,905,1145,1207,1488,1266,1550,1616,2028,650,840,889,1117,957,1165,1237,1542,1003,1242,1 311,1588,1355,1663,1718,2125,1070,1345,1419,1687,1438,1720,1794,2212,1512,1826,1882,2275, 1939,2344,2455,2990,356,457,498,763,556,793,809,1088,616,829,872,1113,909,1160,1185,1536,6 71,876,919,1169,979,1234,1300,1600,1026,1301,1348,1645,1422,1710,1782,2183,714,947,1007,1 261,1036,1305,1365,1695,1108,1416,1444,1727,1509,1821,1858,2274,1174,1477,1544,1838,1593, 1926,1947,2338,1669,1990,2088,2421,2158,2503,2669,2994,744,1016,1095,1374,1154,1433,1499, 1833,1202,1516,1561,1900,1617,1944,2024,2398,1293,1604,1646,1984,1721,2060,2138,2534,177 2,2166,2234,2606,2296,2700,2760,3259,1363,1699,1758,2100,1842,2180,2246,2642,1938,2267,23 42,2729,2426,2774, 2917,3407,2016,2364,2457,2848,2490,2958,3019,3523,2655,3059,3120,3501,3 196,3619,3773,4297,407,541,574,864,619,879,933,1231,625,938,992,1277,1044,1354,1379,1777,7 09,997,1048,1403,1103,1421,1472,1779,1141,1471,1530,1876,1605,1933,1963,2336,733,1094,114 9,1408,1217,1482,1549,1927,1255,1578,1622,1971,1662,2052,2111,2482,1246,1651,1705,2049,17 71,2145,2190,2608,1849,2252,2301,2698,2358,2746,2865,3366,790,1194,1218,1569,1288,1639,17 01,2030,1316,1715,1746,2131,1799,2205,2262,2691,1522,1783,1844,2229,1907,2287,2357,2735,1 997,2380,2469,2838,2541,2952,3029,3486,1636,1889,1976,2328,2046,2420,2476,2922,2118,2521,2562,2985,2672,3090,3146,3589,2240,2662,2705,3122,2736,3198,3103,3661,2884,3349,3409,380 1,3428,3989,4083,4405,824,1282,1296,1767,1483,1818,1856,2248,1573,1870,1912,2314,1996,238 6,2464,2928,1624,1988,2040,2392,2095,2479,2546,3001,2168,2569,2640,3075,2730,3136,3253,36 84,1776,2053,2107,2545,2185,2622,2714,3106,2309,2716,2765,3237,2886,3190,3382,3821,2413,2 816,2941,3352,3005,3425,3494,3925,3093,3509,3507,4057,3669,4116,4194,4638,1885,2161,2254, 2720,2384,2772,2862,3282,2470,2924,2966,3413,3051,3445,3504,3978,2549,3013,3112,3488,316 1,3517,3675,4121,3277,3694,3765,4208,3873,4325,4395,4870,2693,3128,3219,3679,3376,3687,38 49,4253,3402,3834,3939,4369,4028,4465,4599,5051,3453,3996,4106,4505,4173,4615,4555,5109,4 289,4704,4773,5275,4898,5363,5484,5784,466,581,644,896,692,1000,1049,1368,728,1061,1104,1401,1153,1466,1476,1919,741,1150,1189,1461,1223,1641,1675,2011,1327,1681,1765,2119,1806,2 193,2259,2724,748,1212,1284,1658,1338,1760,1788,2177,1369,1832,1863,2269,1925,2346,2408,2 780,1417,1895,1959,2372,2034,2462,2505,2899,2066,2483,2576,3011,2601,3069,3129,3785,950,1 332,1359,1800,1407,1864,1921,2323,1493,1965,2002,2436,2079,2529,2567,2935,1566,2009,2106, 2497,2173,2597,2613,3034,2226,2618,2635,3143,2810,3200,3330,3829,1629,2172,2199,2632,228 6,2708,2722,3175,2352,2809,2870,3275,2974,3368,3414,3946,2433,2914,3006,3422,3096,3481,35 98,4036,3212,3612,3699,4122,3768,4218,4346,4851,965,1390,1467,1952,1556,2003,2093,2540,16 11,2112,2178,2620,2241,2648,2678,3166,1714,2204,2281,2686,2351,2798,2854,3267,2427,2891,2 968,3398,3036,3455,3556,3957,1789,2321,2405,2868,2511,2943,2938,3462,2552,3016,3065,3525,3181,3604,3637,4137,2647,3098,3206,3620,3270,3716,3771,4258,3346,3812,3897,4371,4051,448 0,4607,5070,1852,2450,2526,3021,2612,3088,3184,3614,2794,3211,3291,3754,3304,3780,3865,43 15,2819,3296,3343,3846,3471,3891,4008,4460,3580,4042,4101,4513,4192,4658,4717,5129,2893,3 499,3541,3963,3653,4061,4114,4578,3700,4186,4267,4698,4349,4783,4883,5297,3906,4273,4380, 4799,4498,4915,4970,5451,4585,5024,5102,5520,5198,5643,5756,6168,1041,1494,1582,2115,170 6,2197,2273,2743,1733,2293,2367,2804,2441,2878,2999,3560,1837,2411,2536,2929,2583,3083,30 43,3587,2625,3114,3193,3692,3283,3732,3793,4291,2035,2554,2627,3077,2791,3173,3222,3762,2 803,3289,3322,3795,3374,3867,3922,4419,2824,3361,3439,3914,3575,4003,4091,4523,3627,4164, 4189,4675,4270,4719,4824,5258,2072,2788,2796,3273,2833,3298,3393,3882,2909,3477,3534,3982,3607,4076,4178,4624,3205,3568,3659,4097,3706,4210,4278,4709,3875,4284,4386,4805,4503,49 01,4960,5446,3314,3714,3843,4216,3908,4363,4432,4846,4019,4474,4539,4955,4617,5031,5123,5 570,4109,4594,4688,5099,4770,5176,5254,5656,4862,5283,5359,5742,5401,5883,5900,6413,2102, 2840,2877,3550,3168,3595,3634,4156,3243,3690,3749,4235,3860,4306,4412,4831,3335,3787,3901,4332,3972,4443,4545,4939,4081,4610,4531,4999,4711,5115,5196,5591,3582,3928,4001,4484,41 31,4560,4679,5086,4203,4691,4767,5179,4814,5207,5306,5728,4352,4788,4878,5268,4975,5373,5 432,5830,5046,5506,5557,5944,5647,6012,6031,6307,3708,4010,4196,4694,4299,4753,4790,5240, 4401,4892,4922,5344,5008,5378,5525,5896,4427,4992,5090,5499,5191,5572,5584,6024,5288,5663,5713,6077,5812,6181,6245,6568,4632,5163,5182,5630,5327,5671,5746,6104,5394,5825,5846,62 33,5963,6249,6425,6680,5468,5930,5999,6340,6090,6371,6474,6773,6143,6497,6556,6847,6623,6 908,6958,7203,1084,969,724,1609,928,1537,1259,2245,1020,1270,1343,2080,1396,1825,1732,241 8,1164,1383,1460,1764,1541,1981,1868,2633,1667,1913,2022,2343,2130,2801,2516,3159,1211,1487,1554,1931,1679,1994,2149,2461,1737,2210,2065,2991,2313,2560,2658,3783,1810,2165,2378,2 598,2266,2721,2907,3466,2442,2875,2795,3235,3033,3565,3305,4264,1320,1634,1693,2099,1793, 2191,2334,2684,1899,2496,2216,2764,2412,2825,2957,3341,1989,2307,2590,2900,2519,3141,286 9,3406,2396,2972,3197,3498,3081,3879,3617,4702,2070,2581,2448,3054,2778,2998,3260,3539,2653,3364,3119,3723,3228,3651,4161,3986,2845,3280,3387,3943,3463,3755,3826,4322,3546,4047,3 889,4597,4126,4973,4462,5434,1432,1752,1855,2279,1957,2362,2495,2921,2058,2690,2425,2979, 2566,3048,3179,3676,2135,2512,2781,3074,2639,3327,3126,3632,2831,3242,3443,3770,3372,385 6,4017,4383,2233,2741,2605,3188,2964,3287,3459,3809,2904,3573,3333,4184,3529,3935,3960,4534,3057,3435,3691,4014,3611,4074,4240,5034,3802,4288,4145,4575,4409,4727,4821,5539,2349,2 808,3010,3399,2883,3469,3644,4040,3104,3737,3531,4361,3833,4098,4229,4672,3203,3596,3858, 4169,3979,4280,4520,4764,3697,4449,4304,4936,4590,4867,5106,5704,3294,3905,4031,4470,375 2,4375,4552,5160,4113,4654,4743,4959,4402,5278,5053,6313,4193,4700,4803,5244,4875,5120,5202,5873,4605,5349,5407,5628,5481,6109,5751,6873,1598,1918,2007,2501,2152,2706,2573,3158,2 196,2617,2948,3257,2786,3357,3444,3886,2329,2852,2727,3390,2956,3624,3309,3976,3087,3478, 3673,4059,3548,4313,4214,5014,2431,2982,2882,3784,3217,3460,3557,4080,3049,3602,3712,448 8,3840,4153,4282,4775,3274,3883,3760,4359,4033,4250,4502,4860,3954,4447,4568,4913,4671,5064,5264,5611,2533,3380,3027,3658,3133,3919,3730,4377,3312,3806,3994,4295,4073,4466,4582,4 977,3492,4170,3961,4733,3871,4495,4562,5214,4287,4651,4786,5074,4865,5154,5362,5921,3593, 4207,4066,4600,4343,4708,4919,5324,4478,4996,4750,5236,4812,5515,5420,5844,4119,4890,511 8,5465,5028,5379,5683,5820,5183,5635,5541,6062,5794,5989,6186,6934,2712,3182,3419,3880,3538,3970,4232,4620,3650,4391,4023,4695,4147,4544,4873,5317,3351,4095,4199,4806,4368,5066,4 741,5272,4542,4944,5011,5487,4648,5660,5412,6417,3791,4259,4463,5144,4629,4967,4905,5606, 4336,5041,5251,5449,5173,5527,5739,6004,4794,5220,5111,5560,5319,5887,5681,6088,5422,576 2,5933,6230,5850,6159,6479,6677,3898,4496,4685,5036,4393,5347,5127,5626,4853,5152,5474,5719,5246,5790,5952,6294,4576,5384,5293,5809,5503,5997,5864,6267,5648,5907,6127,6212,6058,6 554,6446,6799,4952,5576,5438,5982,5732,6325,5913,6399,5354,6134,6034,6468,6074,6518,6620, 7325,5548,6304,6235,6694,6176,6588,6748,6995,6386,6722,6667,7099,6830,7491,7033,7633,185 0,2086,2260,2758,2403,2814,2950,3451,2488,3151,2889,3682,3040,3521,3776,4225,2587,2975,3265,3572,3110,3968,3666,4310,3359,3864,4068,4724,3818,4384,4482,5082,2677,3250,3165,3746,3 383,3851,4039,4526,3579,4176,3937,4424,4135,4591,4837,5230,3485,4088,4000,4573,4249,4779, 4678,5166,4366,4810,4942, 5747,4984,5443,5361,5980,2860,3288,3554,3964,3745,4049,4455,464 6,3437,4104,4275,4730,4150,4899,4757,5295,3705,4329,4387,5061,4201,4835,5005,5472,4614,5091,4888,5392,5211,5546,5674,6158,3952,4441,4680,4957,4550,5146,5076,5603,4787,5338,5238,5 532,5059,5692,5776,6113,4517,5370,5286,5723,5489,5909,5831,6275,5189,5814,5966,6537,6051, 6443,6368,6888,3066,3778,3515,4242,3642,4665,4179,4989,3993,4307,4536,4965,4472,4881,513 9,5613,3945,4796,4570,5260,4438,5089,5049,5699,4749,5195,5398,5554,5334,5797,5880,6240,4128,4636,4857,5159,4933,5460,5304,5927,4656,5271,5580,5838,5386,5767,6028,6330,4990,5535,5 458,5893,5706,6140,5974,6404,5666,6047,6257,6462,6173,6563,6611,7132,4354,5019,4759,5436, 4880,5356,5562,5991,5083,5781,5517,5948,5633,6070,6129,6484,5187,5725,5609,6165,5891,609 9,6297,6786,5815,6380,6191,6548,6332,6656,6737,6982,5289,5621,5914,6236,5774,6280,6395,6628,6044,6514,6319,6710,6466,6760,6839,7076,5984,6406,6520,6937,6615,6810,6868,7227,6356,6 900,7008,7182,7052,7268,7380,7695,3365,3863,3727,4558,4055,4663,4490,5136,4154,4417,4884, 5466,4781,5218,5364,5817,4257,4828,4715,5266,5043,5677,5341,5902,4982,5415,5537,6068,561 9,5970,6199,6530,4457,5068,4950,5441,5168,5510,5553,5996,4843,5595,5737,6204,5859,6152,6107,6584,5280,5745,5919,6094,5822,6262,6338,6688,5697,6387,6242,6639,6456,6765,6824,7141,4 627,4907,5310,5731,5141,5654,5899,6218,5453,6016,5801,6154,5429,6299,6362,6706,5523,5866, 5935,6543,6041,6324,6429,6956,6136,6502,6389,6756,6601,6813,6923,7196,5640,5960,6224,643 4,6064,6644,6505,6850,6310,6472,6690,6883,6559,7072,6967,7252,6171,6634,6751,6985,6815,7119,7061,7346,6733,7020,7185,7426,7137,7301,7461,7739,4961,5228,5368,5885,5588,6123,5836,6 383,5508,5977,5954,6488,6082,6572,6460,6912,5710,6250,6049,6441,6317,6526,6695,6877,6216, 6652,6745,6971,6614,7025,7112,7342,5803,6148,6400,6595,6282,6761,6672,7013,6343,6701,680 2,7215,6897,7063,7075,7409,6500,6862,6951,7109,6835,7256,7152,7391,6767,7176,7293,7532,7243,7442,7518,7860,6002,6374,6450,6854,6599,6743,6947,7124,6541,6797,6887,7163,7004,7284,7 224,7471,6683,6927,7015,7265,7066,7193,7336,7571,7081,7371,7304,7501,7396,7557,7603,7929, 6820,7029,7128,7333,7173,7350,7436,7535,7235,7433,7388,7639,7484,7641,7589,7825,7292,746 9,7525,7667,7564,7680,7713,7774,7609,7718,7750,7802,7779,8009,7888,7911,182,262,280,412,303,417,473,634,331,452,496,673,550,722,749,1063,366,478,511,720,582,765,849,1082,620,845,80 3,1128,926,1178,1220,1552,389,552,602,795,627,841,887,1139,690,907,939,1183,1028,1264,1303, 1637,730,956,1054,1291,1079,1337,1381,1689,1125,1392,1446,1796,1481,1848,1929,2353,441,55 8,659,899,700,935,1018,1235,755,1059,964,1304,1115,1356,1426,1725,820,1050,1119,1389,1162,1435,1469,1817,1206,1490,1563,1887,1632,1956,2032,2485,898,1130,1187,1458,1268,1514,1596, 1949,1323,1603,1686,2000,1731,2084,2144,2596,1405,1719,1805,2109,1829,2147,2231,2688,191 1,2264,2325,2757,2390,2829,2945,3511,524,656,707,1039,782,1072,1092,1424,855,1116,1166,145 4,1209,1508,1535,1941,923,1171,1224,1519,1294,1592,1671,2015,1352,1673,1723,2062,1811,2133,2214,2656,976,1254,1329,1628,1361,1677,1745,2117,1448,1802,1835,2157,1909,2258,2300,275 5,1524,1874,1951,2278,2005,2376,2397,2823,2092,2446,2551,2913,2629,3002,3177,3513,1009,13 41,1431,1757,1503,1823,1897,2272,1557,1916,1967,2347,2033,2394,2481,2887,1661,2018,2064,2 440,2150,2525,2611,3031,2202,2637,2710,3108,2779,3209,3272,3789,1741,2121,2187,2563,2282, 2654,2725,3150,2388,2748,2827,3239,2919,3286, 3434,3941,2472,2850,2947,3363,2989,3483,354 3,4063,3163,3586,3647,4038,3725,4158,4312,4832,588,758,800,1158,858,1176,1240,1590,866,12 44,1308,1643,1371,1729,1762,2209,967,1314,1376,1787,1440,1808,1867,2211,1485,1866,1934,23 18,2020,2382,2415,2821,998,1430,1496,1792,1576,1878,1955,2377,1619,1987,2037,2424,2082,25 14,2578,2977,1607,2068,2127,2510,2200,2615,2664,3109,2289,2731,2784,3207,2844,3258,3381,3 903,1067,1547,1577,1975,1654,2055,2123,2487,1691,2142,2175,2603,2237,2683,2742,3201,1924, 2217,2284,2704,2355,2771,2842,3247,2454,2867,2961,3354,3039,3476,3555,4021,2051,2332,242 9,2812,2508,2911,2971,3441,2585,3018,3064,3506,3180,3616,3674,4125,2717,3172,3214,3649,32 49,3728,3629,4198,3404,3884,3942,4340,3966,4525,4619,4934,1110,1648,1665,2195,1881,2256,2298,2726,1979,2311,2360,2799,2452,2874,2955,3448,2039,2444,2499,2881,2558,2973,3047,3520, 2638,3073,3148,3600,3241,3665,3782,4221,2207,2517,2572,3045,2659,3127,3224,3633,2793,322 6,3278,3767,3405,3719,3916,4358,2905,3331,3464,3887,3526,3962,4030,4464,3618,4046,4044,45 95,4205,4653,4731,5164,2327,2631,2733,3230,2872,3284,3379,3814,2963,3442,3489,3949,3577,3 984,4041,4515,3050,3537,3639,4022,3689,4056,4212,4660,3808,4231,4305,4747,4413,4858,4926, 5383,3202,3655,3750,4215,3911,4223,4389,4785,3934,4373,4479,4903,4567,4994,5125,5558,399 0,4533,4643,5033,4706,5142,5081,5610,4826,5227,5291,5766,5410,5848,5958,6234,666,811,890, 1196,948,1318,1378,1748,995,1394,1443,1785,1501,1859,1872,2369,1006,1497,1539,1853,1580,2 057,2097,2468,1703,2103,2194,2588,2243,2668,2738,3234,1015,1571,1650,2078,1712,2189,2221,2650,1750,2270,2304,2750,2374,2830,2898,3292,1804,2341,2410,2857,2492,2953,3004,3416,253 1,2980,3080,3535,3102,3594,3657,4327,1257,1707,1735,2239,1791,2306,2371,2807,1892,2417,24 59,2927,2543,3025,3071,3458,1973,2466,2570,2996,2645,3100,3117,3562,2702,3123,3142,3671,3 326,3729,3862,4365,2043,2643,2676,3138,2769,3218,3232,3703,2837,3324,3388,3807,3496,3904, 3951,4486,2925,3432,3528,3959,3621,4015,4136,4574,3744,4151,4237,4662,4308,4756,4879,536 6,1279,1774,1861,2401,1961,2460,2556,3037,2026,2580,2652,3125,2719,3157,3186,3695,2140,26 81,2762,3195,2835,3311,3370,3798,2920,3410,3491,3932,3564,3992,4093,4494,2225,2805,2896,3 385,3008,3467,3461,3998,3052,3540,3591,4065,3709,4142,4177,4676,3155,3623,3736,4160,3800, 4256,4311,4792,3881,4351,4436,4904,4589,5009,5134,5574,2292,2940,3023,3545,3115,3615,3713,4152,3307,3742,3825,4293,3837,4320,4407,4850,3334,3830,3878,4385,4007,4431,4547,4988,41 17,4580,4637,5040,4728,5181,5241,5631,3412,4037,4078,4500,4191,4598,4652,5104,4239,4722,4 801,5219,4882,5302,5396,5788,4445,4808,4911,5316,5026,5427,5479,5931,5110,5533,5604,5995, 5696,6105,6210,6582,1367,1894,1992,2582,2129,2674,2753,3255,2163,2776,2853,3318,2931,3397,3519,4096,2277,2902,3032,3450,3085,3609,3571,4123,3130,3641,3721,4230,3816,4272,4333,48 27,2494,3055,3132,3601,3303,3701,3753,4302,3316,3823,3855,4335,3909,4408,4461,4949,3338,3 896,3977,4454,4111,4541,4626,5050,4168,4699,4725,5193,4804,5243,5339,5749,2537,3301,3310, 3804,3348,3832,3927,4421,3427,4012,4072,4518,4144,4612,4713,5151,3734,4103,4197,4634,4246,4748,4811,5234,4415,4819,4917,5322,5032,5413,5470,5925,3848,4254,4382,4754,4446,4897,49 63,5360,4559,5003,5065,5464,5143,5538,5625,6039,4645,5117,5209,5601,5287,5672,5743,6121,5 377,5773,5842,6197,5884,6323,6341,6795,2565,3356,3395,4087,3696,4132,4174,4693,3774,4227, 4286,4772,4400,4840,4941,5346,3869, 4328,4439,4864,4509,4974,5072,5450,4618,5137,5058,5507,5235,5618,5695,6061,4118,4468,4540,5012,4670,5087,5200,5586,4740,5212,5284,5675,5331,57 03,5795,6184,4886,5308,5390,5760,5485,5857,5912,6278,5552,5981,6026,6381,6111,6439,6459,6 704,4248,4549,4732,5216,4834,5270,5309,5730,4931,5405,5433,5829,5514,5862,6000,6336,4956, 5501,5593,5975,5690,6042,6056,6454,5779,6126,6169,6498,6260,6593,6650,6932,5158,5658,5679,6092,5813,6133,6202,6524,5878,6273,6292,6637,6398,6654,6808,7027,5946,6366,6427,6731,65 12,6759,6848,7107,6557,6871,6921,7171,6980,7222,7263,7467,1418,1283,988,2023,1233,1942,16 23,2723,1344,1635,1717,2544,1778,2261,2160,2908,1511,1766,1851,2192,1946,2435,2308,3140,2 087,2361,2478,2828,2600,3313,3012,3688,1568,1884,1958,2379,2101,2449,2619,2951,2167,2685, 2528,3512,2797,3062,3167,4324,2247,2634,2864,3101,2745,3231,3424,4002,2933,3392,3308,376 4,3559,4100,3839,4798,1694,2048,2114,2561,2228,2666,2818,3192,2345,2995,2692,3276,2903,33 40,3482,3876,2445,2790,3092,3418,3015,3668,3386,3938,2885,3493,3726,4035,3606,4418,4155,5 225,2535,3082,2937,3581,3290,3516,3790,4077,3160,3900,3646,4263,3759,4190,4697,4522,3360, 3811,3921,4483,3999,4294,4362,4856,4082,4584,4429,5122,4666,5483,4991,5916,1820,2179,2295,2759,2407,2847,2993,3438,2520,3199,2916,3500,3068,3574,3707,4213,2607,3009,3293,3597,31 45,3859,3652,4172,3345,3772,3981,4309,3907,4396,4557,4914,2707,3252,3105,3717,3487,3820,3 995,4348,3421,4110,3866,4720,4069,4475,4497,5062,3584,3973,4228,4554,4149,4611,4777,5543, 4342,4825,4682,5101,4938,5250,5337,6013,2832,3321,3533,3933,3403,4005,4183,4579,3631,4277,4070,4895,4370,4635,4766,5192,3731,4134,4398,4703,4516,4815,5048,5282,4234,4980,4839,54 48,5114,5382,5608,6161,3828,4442,4571,4998,4290,4908,5079,5657,4650,5178,5263,5469,4932,5 770,5559,6709,4729,5223,5321,5734,5388,5624,5701,6315,5132,5834,5890,6091,5957,6529,6207, 7191,2010,2366,2463,3000,2621,3216,3076,3686,2671,3121,3472,3786,3299,3892,3983,4426,2813,3367,3236,3924,3480,4163,3842,4512,3613,4013,4209,4596,4085,4848,4752,5522,2923,3503,34 01,4326,3748,3997,4094,4616,3576,4140,4252,5016,4379,4690,4817,5292,3805,4423,4300,4893,4 572,4784,5030,5375,4492,4979,5093,5426,5190,5569,5755,6079,3028,3913,3553,4195,3660,4459, 4269,4909,3845,4345,4532,4830,4609,4995,5108,5486,4027,4705,4499,5256,4411,5023,5088,5709,4823,5175,5305,5578,5381,5651,5847,6359,4130,4746,4602,5126,4877,5233,5431,5811,5007,55 05,5269,5727,5329,5992,5904,6291,4657,5403,5622,5943,5536,5863,6145,6270,5680,6098,6014,6 485,6244,6419,6598,7241,3221,3711,3956,4420,4075,4507,4769,5148,4188,4921,4564,5217,4684, 5071,5387,5805,3885,4631,4736,5323,4902,5571,5262,5765,5069,5456,5519,5962,5172,6125,5895,6801,4331,4793,4993,5645,5157,5477,5417,6073,4869,5549,5741,5929,5670,6001,6195,6433,53 13,5715,5615,6030,5807,6328,6142,6510,5905,6215,6370,6635,6296,6575,6853,7026,4437,5025,5 206,5544,4924,5833,5629,6089,5367,5650,5951,6175,5736,6239,6391,6692,5103,5868,5783,6258, 5979,6426,6306,6669,6112,6347,6545,6618,6481,6919,6826,7131,5462,6046,5918,6414,6189,6720,6353,6783,5839,6550,6464,6843,6496,6890,6979,7566,6019,6703,6641,7041,6591,6949,7087,72 95,6772,7065,7017,7382,7155,7700,7327,7807,2291,2548,2740,3269,2894,3329,3474,3988,2984,3 678,3408,4219,3567,4060,4316,4763,3089,3497,3796,4108,3636,4504,4202,4845,3894,4406,4604, 5248,4357,4916,5010,5583,3183,3779,3693,4285,3918,4390,4577,5055,4115,4710,4477,4954,4674,5116,5353,5722,4018,4623,4538,5098,4782,5298,5197, 5662,4900,5326,5455,6203,5493,5924,58 45,6412,3377,3822,4090,4501,4283,4587,4985,5170,3975,4641,4809,5253,4687,5411,5274,5786,4 245,4861,4918,5566,4738,5351,5513,5950,5140,5594,5400,5877,5708,6018,6138,6574,4491,4972, 5201,5467,5077,5646,5579,6072,5307,5824,5729,6006,5564,6151,6228,6533,5045,5855,5778,6180,5965,6349,6279,6675,5688,6264,6402,6903,6477,6823,6758,7204,3592,4318,4054,4778,4181,51 86,4714,5498,4530,4842,5063,5475,5001,5395,5639,6080,4485,5314,5095,5750,4969,5590,5556,6 157,5267,5694,5882,6025,5819,6247,6321,6647,4668,5162,5372,5655,5445,5939,5793,6365,5180, 5764,6053,6286,5870,6220,6458,6724,5500,6008,5937,6335,6163,6555,6408,6788,6131,6473,6661,6837,6587,6930,6968,7407,4887,5529,5277,5917,5393,5840,6033,6420,5585,6232,5994,6385,60 96,6492,6546,6859,5686,6182,6076,6580,6333,6522,6697,7121,6265,6769,6603,6914,6725,7006,7 078,7282,5780,6085,6354,6642,6226,6679,6779,6984,6471,6886,6715,7054,6841,7096,7165,7363, 6415,6790,6891,7244,6974,7139,7188,7485,6747,7217,7306,7447,7344,7520,7610,7857,3902,4404,4266,5085,4593,5185,5018,5637,4692,4948,5397,5945,5300,5712,5849,6266,4789,5343,5239,57 58,5551,6139,5827,6342,5491,5898,6011,6490,6084,6403,6609,6898,4986,5573,5461,5922,5665,5 987,6023,6424,5358,6066,6194,6613,6302,6567,6528,6945,5771,6201,6358,6516,6272,6665,6730, 7037,6156,6774,6649,6993,6832,7101,7150,7416,5155,5419,5799,6188,5642,6119,6339,6625,5932,6445,6252,6569,5910,6698,6753,7050,5998,6309,6373,6909,6470,6719,6812,7262,6552,6876,67 75,7092,6960,7142,7234,7463,6103,6397,6630,6817,6486,6997,6880,7175,6708,6846,7038,7199,6 925,7359,7272,7507,6586,6989,7088,7286,7143,7398,7351,7582,7074,7315,7450,7646,7412,7547, 7674,7889,5471,5721,5853,6327,6060,6540,6284,6770,5986,6409,6392,6864,6504,6936,6836,7226,6167,6655,6476,6822,6714,6895,7042,7194,6622,7002,7084,7275,6973,7319,7393,7579,6253,65 62,6784,6954,6682,7097,7022,7311,6735,7046,7134,7477,7212,7352,7362,7635,6875,7184,7258,7 390,7160,7510,7428,7617,7103,7443,7541,7731,7499,7659,7719,7978,6431,6763,6828,7179,6957, 7083,7253,7401,6907,7130,7202,7435,7302,7533,7482,7681,7031,7237,7312,7517,7355,7458,7575,7760,7367,7605,7550,7708,7621,7751,7784,8027,7147,7323,7404,7572,7441,7585,7653,7734,74 92,7650,7615,7811,7693,7813,7776,7953,7540,7679,7725,7835,7755,7844,7870,7914,7788,7874,7 897,7936,7918,8083,7998,8015,1250,1531,1587,1970,1656,1982,2124,2504,1739,2073,2184,2591, 2316,2699,2751,3342,1843,2137,2219,2694,2391,2787,2949,3375,2475,2942,2861,3452,3097,3532,3603,4105,1906,2322,2434,2846,2489,2934,3020,3470,2626,3058,3118,3542,3281,3677,3738,42 24,2713,3152,3328,3715,3369,3788,3857,4296,3447,3872,3953,4440,4004,4506,4606,5105,2045,2 335,2559,3042,2646,3111,3266,3626,2767,3336,3169,3740,3429,3817,3923,4347,2892,3319,3436, 3868,3508,3936,3987,4467,3583,4016,4120,4553,4217,4640,4734,5252,3041,3454,3549,3971,3683,4050,4171,4630,3769,4180,4292,4696,4355,4797,4871,5365,3890,4338,4452,4829,4481,4874,49 68,5459,4586,5006,5075,5528,5147,5598,5711,6205,2253,2553,2661,3297,2817,3358,3391,3920,2 960,3430,3514,3965,3588,4043,4084,4621,3091,3522,3610,4058,3722,4165,4274,4712,3810,4276, 4344,4774,4458,4859,4951,5428,3189,3662,3777,4211,3827,4281,4372,4838,3955,4448,4489,4885,4583,5000,5047,5526,4067,4537,4633,5021,4701,5130,5156,5592,4807,5205,5320,5678,5399,57 61,5920,6208,3251,3794,3930,4388,4034,4473,4569,5015,4112,4592,4655,5097,4735,5153,5247,5 653,4260,4716,4776,5199,4876,5290,5380,5791,4937,5408,5482,5860,5550,5949, 6005,6422,4367, 4844,4920,5333,5027,5425,5495,5897, 5145,5518,5596,5976,5684,6017,6144,6538,5237,5620,571 4,6083,5748,6179,6229,6621,5908,6263,6312,6607,6375, 6689,6794,7118,2404,2773,2855,3502,29 67,3530,3635, 4162,2983,3643,3747,4233,3841,4353,4394,4945,3174, 3756,3850,4428,3944,4456,4 528,4947,4009,4527,4613, 5067,4718,5138,5174,5589,3227,3929,4024,4434,4138, 4543,4639,5131, 4200,4681,4742,5184,4795,5279,5348, 5738,4185,4780,4852,5276,4935,5385,5435,5861,5035,550 2,5555,5947,5614,5993,6097,6508,3350,4099,4139,4667, 4251,4765,4847,5255,4298,4868,4906,53 71,4976,5454, 5512,5941,4601,4953,5029,5476,5107,5542,5612,5983, 5215,5636,5724,6075,5798,6 174,6238,6596,4760,5084, 5188,5581,5273,5676,5733,6149,5355,5777,5818,6200, 5923,6289,6334, 6668,5488,5915,5953,6314,5985,6377, 6298,6718,6116,6493,6539,6814,6553,6935,6992,7180,342 0,4241,4265,4929,4546,4997,5044,5496,4673,5060,5112, 5568,5213,5644,5720,6153,4745,5203,52 65,5649,5328, 5735,5804,6214,5409,5826,5894,6276,5978,6326,6418, 6734,4943,5281,5342,5802,5 430,5876,5961,6301,5563, 5964,6010,6407,6117,6369,6519,6827,5669,6057,6164, 6495,6217,6551, 6602,6894,6290,6612,6610,6976,6723, 7011,7058,7300,5078,5402,5504,5967,5641,6015,6095,644 2,5726,6150,6185,6542,6256,6566,6608,6928,5806,6225, 6305,6597,6346,6617,6727,7014,6438,67 41,6789,7068, 6861,7135,7174,7415,5942,6318,6394,6729,6515,6736, 6844,7091,6534,6834,6902,7 158,6959,7210,7280,7497, 6571,6940,7005,7233,7045,7289,7257,7523,7115,7335, 7368,7594,7429, 7629,7676,7783,2575,2876,3026,3566, 3135,3761,3852,4376,3220,3874,3948,4425,4032,4519,453 5,5121,3245,4025,4089,4511,4146,4768,4813,5232,4314, 4820,4928,5357,4983,5439,5509,5971,32 61,4129,4244, 4791,4330,4923,4958,5421,4378,5013,5052,5521,5128, 5599,5664,6021,4450,5092,5 169,5627,5259,5718,5763, 6128,5296,5740,5832,6223,5854,6271,6320,6805,3667, 4321,4360,4978, 4433,5054,5124,5577,4561,5177,5221, 5693,5311,5785,5823,6160,4664,5229,5340,5754,5416,585 1,5867,6243,5473,5872,5889,6331,6052,6378,6480,6831, 4751,5414,5447,5886,5540,5956,5969,63 57,5607,6050, 6102,6437,6192,6509,6544,6906,5691,6141,6219,6549, 6293,6592,6674,6963,6390,6 685,6744,7016,6791,7073, 7145,7405,3698,4410,4521,5161,4647,5222,5325,5796, 4726,5350,5423, 5874,5490,5903,5928,6351,4866,5452, 5534,5936,5605,6038,6087,6430,5685,6122,6187,6531,624 6,6573,6645,6913,4962,5575,5661,6100,5768,6166,6162, 6578,5808,6227,6268,6624,6361,6678,67 02,7024,5901, 6295,6384,6691,6432,6757,6793,7094,6491,6821,6878, 7159,6972,7219,7285,7506,5 038,5707,5782,6231,5865, 6288,6364,6686,6035,6388,6451,6781,6461,6800,6857, 7129,6059,6455, 6489,6842,6585,6874,6946,7207,6663, 6966,7001,7236,7056,7310,7341,7531,6124,6606,6633,691 7,6713,6978,7010,7271,6746,7053,7100,7331,7146,7373, 7422,7604,6884,7104,7164,7381,7230,74 38,7462,7664, 7274,7486,7521,7689,7562,7736,7775,7904,3835,4563, 4686,5352,4854,5444,5524,5 990,4891,5547,5623,6045, 5698,6110,6213,6648,5020,5667,5792,6155,5837,6283, 6251,6666,5879, 6308,6372,6740,6444,6768,6809,7116, 5261,5810,5881,6277,6032,6355,6396,6787,6043,6449,647 5,6811,6513,6858,6893,7187,6063,6503,6561,6889,6659, 6944,6996,7240,6696,7040,7055,7318,71 02,7343,7394, 7586,5303,6029,6037,6435,6071,6457,6527,6867,6137, 6589,6629,6931,6681,6988,7 048,7294,6382,6653,6717, 6999,6750,7069,7106,7338,6863,7111,7168,7384,7232, 7431,7456,7662, 6469,6755,6840,7071,6885,7154,7192, 7403,6953,7216,7248,7453,7290,7488,7529,7709,7007,727 8,7326,7519,7366,7552,7584,7741,7411,7597,7626,7769, 7645,7815,7822,7969,5335,6078,6108,66 40,6352,6671, 6700,7036,6411,6738,6778,7082,6852,7123,7183,7397, 6483,6806,6881,7138,6924,7 198,7251,7446,6991,7287, 7245,7476,7339,7526,7561,7716,6664,6896,6943,7221, 7021,7260,7321, 7513,7064,7328,7365,7553,7389,7565, 7607,7764,7148,7376,7419,7591,7465,7634,7655,7799,749 5,7684,7705,7836,7737,7858,7863,7941,6752,6948,7059, 7329,7120,7358,7377,7578,7177,7427,74 40,7620,7479, 7636,7691,7820,7190,7474,7515,7682,7559,7710,7714, 7861,7599,7743,7759,7878,7 792,7908,7926,8007,7298, 7546,7554,7730,7614,7745,7771,7884,7643,7798,7805, 7921,7841,7927, 7971,8031,7671,7832,7854,7951,7881, 7957,7985,8052,7896,7989,8004,8065,8020,8077,8087,812 6,3912,3704,3210,4723,3625,4622,4206,5494,3799,4222, 4337,5312,4416,5004,4889,5673,4048,43 99,4510,4927, 4628,5194,5057,5888,4802,5113,5245,5597,5369,6040, 5772,6345,4127,4551,4644,5 135,4818,5210,5389,5717, 4896,5457,5294,6206,5567,5816,5911,6803,4987,5406, 5634,5852,5516, 5968,6135,6581,5700,6106,6036,6405, 6241,6651,6463,7098,4303,4758,4836,5332,4966,5437,558 7,5934,5096,5753,5463,6009,5668,6065,6178,6487,5204, 5561,5843,6130,5775,6329,6101,6536,56 52,6190,6376, 6605,6281,6865,6687,7334,5301,5835,5705,6259,6020, 6211,6423,6632,5906,6506,6 311,6762,6401,6712,7039, 6933,6081,6440,6523,6904,6579,6782,6829,7133,6636, 6969,6872,7279, 7018,7464,7208,7656,4471,4912,5042, 5531,5167,5617,5752,6147,5285,5940,5682,6196,5821,625 4,6360,6728,5376,5769,6022,6274,5892,6478,6316,6699, 6069,6410,6564,6792,6511,6849,6952,71 66,5480,5988, 5858,6367,6183,6447,6576,6819,6132,6658,6482,7051, 6626,6899,6915,7246,6261,6 558,6739,6950,6684,6987, 7085,7489,6816,7114,7028,7269,7181,7347,7392,7698, 5602,6048,6222, 6532,6115,6583,6707,6965,6300,6771, 6627,7153,6833,7000,7079,7317,6379,6673,6851,7043,692 9,7108,7239,7364,6742,7201,7122,7445,7276,7414,7522, 7756,6453,6882,6961,7213,6780,7161,72 55,7545,7009, 7308,7354,7455,7178,7595,7498,7943,7057,7332,7383, 7580,7418,7528,7563,7812,7 283,7623,7647,7729,7675, 7886,7773,8070,4707,5119,5226,5759,5391,5955,5828, 6344,5442,5871, 6170,6421,6027,6499,6565,6870,5582, 6086,5973,6525,6177,6693,6465,6926,6287,6590,6726,697 7,6638,7127,7070,7481,5689,6198,6114,6804,6393,6577, 6646,6990,6255,6676,6754,7223,6838,70 34,7110,7369, 6436,6869,6785,7151,6962,7090,7231,7410,6911,7200, 7264,7437,7316,7503,7588,7 723,5789,6517,6237,6716, 6322,6892,6766,7162,6467,6818,6939,7117,6986,7211, 7273,7466,6600, 7044,6916,7349,6860,7228,7261,7568, 7113,7307,7374,7508,7413,7543,7628,7830,6670,7067,698 1,7281,7144,7337,7439,7613,7218,7475,7357,7576,7387, 7687,7651,7804,7012,7425,7527,7669,74 87,7637,7749, 7796,7555,7733,7699,7872,7786,7850,7909,8081,5959, 6363,6547,6866,6631,6922,7 080,7291,6711,7170,6955, 7330,7030,7250,7417,7611,6494,6998,7060,7385,7157, 7504,7353,7593, 7249,7449,7480,7677,7305,7742,7648, 7970,6807,7095,7209,7538,7297,7460,7432,7721,7140,749 3,7583,7663,7551,7692,7768,7856,7378,7570,7524,7706, 7612,7817,7748,7880,7652,7777,7833,79 20,7806,7902, 7986,8030,6879,7229,7324,7490,7172,7622,7530,7728, 7406,7542,7673,7761,7581,7 785,7838,7937,7270,7638, 7601,7791,7683,7853,7809,7932,7738,7824,7891,7915, 7871,8003,7976, 8055,7452,7711,7658,7848,7766,7947, 7827,7965,7624,7893,7864,7983,7877,7994,8019,8141,770 2,7940,7922,8035,7907,8011,8045,8092,7961,8040,8028, 8109,8062,8161,8100,8173,5037,5318,55 11,6003,5659, 6055,6172,6570,5744,6337,6120,6732,6248,6619,6796, 7077,5841,6193,6428,6657,6 303,6920,6721,7126,6501, 6856,6983,7345,6825,7167,7220,7511,5926,6416,6350, 6777,6521,6845, 6964,7242,6662,7047,6901,7189,7023, 7277,7400,7574,6594,6994,6942,7267,7089,7370,7320,7548,7156,7386,7448,7772,7470,7661,7627,7847,6093,6448,6643,6918,6776,6970,7205,7303,6560,7003,7105,7348,7032,7430,7360,7602,6749,7136,7169,7502,7062,7399,7478,7672,7288,7516,7424,7642,7567,7701,7746,7901,6910,7197,7322,7454,7254,7539,7509,7720,7375,7618,7577,7694,7500,7752,7781,7887,7238,7632,7598,7762,7678,7826,7800,7933,7558,7793,7842,7999,7869,7975,7956,8074,6269,6798,6616,7086,6705,7314,7049,7472,6938,7125,7247,7459,7214,7421,7536,7724,6905,7379,7266,7587,7195,7514,7496,7754,7356,7560,7644,7704,7616,7787,7814,7924,7019,7299,7408,7544,7444,7668,7606,7831,7309,7592,7712,7803,7640,7778,7862,7948,7473,7696,7666,7819,7757,7895,7845,7967,7744,7867,7930,7981,7906,8006,8016,8115,7149,7483,7361,7657,7420,7625,7707,7851,7512,7782,7688,7837,7732,7876,7892,7987,7556,7763,7722,7903,7818,7883,7938,8053,7794,7959,7910,8002,7949,8026,8042,8090,7600,7727,7828,7923,7780,7934,7964,8021,7866,7993,7945,8039,7982,8048,8064,8107,7849,7968,7995,8082,8018,8057,8069,8129,7954,8076,8094,8122,8101,8135,8148,8178,6507,6855,6764,7259,6975,7313,7225,7534,7035,7186,7423,7670,7372,7569,7630,7795,7093,7395,7340,7590,7494,7747,7619,7823,7468,7649,7697,7875,7726,7843,7912,7997,7206,7505,7451,7660,7549,7686,7703,7852,7402,7717,7767,7913,7808,7899,7885,8010,7596,7770,7829,7882,7797,7931,7950,8033,7753,7962,7925,8023,7979,8050,8061,8117,7296,7434,7608,7765,7537,7740,7821,7917,7665,7859,7789,7900,7654,7939,7955,8038,7690,7810,7834,8001,7865,7946,7972,8086,7894,7991,7963,8047,8014,8058,8079,8125,7735,7840,7919,7973,7873,8024,7992,8066,7942,7984,8034,8072,8005,8105,8088,8132,7905,8022,8046,8091,8059,8112,8102,8145,8041,8097,8123,8153,8116,8139,8157,8181,7457,7573,7631,7816,7715,7890,7801,7960,7685,7846,7839,7988,7879,8008,7980,8078,7758,7928,7868,7974,7944,7996,8036,8071,7916,8025,8044,8089,8017,8098,8111,8144,7790,7898,7966,8012,7935,8049,8029,8095,7952,8037,8056,8127,8075,8103,8106,8152,7990,8068,8085,8110,8063,8133,8118,8150,8051,8121,8138,8165,8131,8156,8163,8187,7855,7958,7977,8067,8013,8043,8084,8113,8000,8054,8073,8119,8093,8136,8128,8159,8032,8080,8096,8134,8104,8124,8143,8169,8108,8147,8140,8162,8151,8167,8171,8190,8060,8099,8114,8142,8120,8146,8155,8166,8130,8154,8149,8174,8160,8175,8170,8186,8137,8158,8164,8176,8168,8177,8179,8183,8172,8180,8182,8185,8184,8191,8188,8189]

Sequence Group 5: Q5_16384

[0,1,2,4,8,16,32,3,5,64,9,6,17,10,18,128,12,33,65,20,256,34,24,36,7,129,66,512,11,40,68,130,19,13,48,14,72,257,21,132,35,258,26,513,80,37,25,22,136,260,264,38,514,96,67,41,144,28,69,42,516,49,74,272,160,1026,520,288,528,192,544,70,44,131,81,50,73,15,320,133,52,23,134,384,76,137,82,56,27,97,39,259,84,138,145,261,29,43,98,515,88,140,30,146,1028,71,262,265,2048,161,576,45,100,640,1025,51,148,46,75,266,273,517,104,162,53,193,1032,152,77,164,768,268,274,518,54,83,57,521,112,1024,135,78,289,194,85,276,522,58,168,139,99,86,60,280,89,290,529,524,196,141,1040,101,147,176,2049,142,530,321,31,200,90,1056,545,292,322,532,2050,263,149,102,105,304,4096,296,1030,163,92,1033,47,267,385,546,324,2052,208,386,150,153,165,106,55,328,1088,536,577,548,1034,113,154,79,269,108,578,2056,224,166,519,552,195,270,1041,641,1036,523,275,580,291,59,169,560,114,277,156,87,1152,197,116,170,2064,61,1042,531,525,642,281,278,526,177,293,388,1057,91,584,769,198,2080,172,120,201,336,62,282,4097,143,1029,1044,103,178,294,93,1058,644,202,2051,592,323,392,2053,297,770,4098,107,180,1280,151,209,284,1027,648,94,204,298,400,608,2112,1089,352,325,533,155,210,305,2057,4100,547,300,109,1048,184,534,1060,537,115,8192,1090,167,225,326,2054,306,772,157,2065,656,329,110,117,212,171,1038,776,1064,4104,330,1153,2058,226,549,1043,538,387,308,216,416,271,279,158,337,2066,550,672,1092,118,332,579,540,1072,2176,389,173,1037,121,553,199,784,179,228,4112,338,312,1536,704,1154,390,174,554,581,1046,393,2060,283,2081,122,448,353,2113,561,1096,203,63,4128,340,394,1049,1281,527,582,556,181,295,1059,285,232,124,2068,205,182,643,2304,1156,562,286,585,4099,299,354,2082,1045,4101,211,401,1104,185,1061,396,344,586,645,1282,593,535,240,8193,2072,1050,206,95,327,2084,564,800,402,2055,4160,356,307,301,417,1160,213,1066,568,1120,832,4105,588,1035,8194,1537,186,2177,646,404,2114,1091,227,896,594,418,2560,302,649,771,360,539,2059,4102,111,1052,331,1168,4113,214,309,1062,1284,2088,188,8196,449,1073,217,408,609,596,2116,551,650,229,159,4106,420,2178,310,1093,541,1288,773,610,657,333,1065,119,1098,2067,4114,2061,600,339,1184,218,2096,368,652,1031,230,391,313,4224,450,8200,542,1538,334,1076,233,555,2062,774,175,123,1155,658,2120,612,341,2305,777,220,314,2069,1105,424,1068,395,4108,673,4129,583,355,1296,2180,1094,4161,287,183,234,1051,125,557,1216,660,616,342,316,2083,1157,241,778,2306,563,8208,2074,1074,345,452,397,2561,4116,403,1112,207,2128,1540,4352,674,558,785,1100,432,1039,357,187,1162,236,664,1312,624,4130,587,780,1080,8224,2085,1122,705,2073,126,242,2070,1063,565,398,2184,346,456,2308,4120,358,405,303,569,2312,1544,4132,244,1158,1097,595,1283,189,4103,566,676,1169,8195,1054,1108,361,2086,706,8197,589,2562,1344,215,786,647,348,2144,2115,419,406,464,680,4225,801,2089,4162,1069,362,1164,590,409,1286,4608,570,1121,788,1552,2192,1106,4107,2076,597,1075,8256,572,1186,219,311,2117,708,598,2090,1289,601,651,421,792,4136,802,8201,2564,611,1047,602,1172,410,231,2097,4164,688,653,1128,248,1070,2122,4226,369,2320,190,364,1568,654,2208,1095,8198,659,1161,335,480,4115,315,4109,221,3074,8209,370,1285,613,2568,1408,4144,422,425,2336,451,1077,614,543,1298,235,412,2576,343,372,2240,1185,775,317,2592,4110,8202,2118,1539,222,1099,426,4168,2092,453,4353,237,1124,559,1170,2179,1292,4117,833,8210,804,712,1082,834,661,1053,808,779,2129,1217,617,604,2098,1541,433,4228,720,2121,816,1101,8320,2063,1176,836,2368,347,897,2181,1136,4131,243,1297,2100,662,4354,2071,1600,4122,454,318,675,1110,618,2182,1081,4609,898,781,1314,1220,376,428,1546,665,4176,736,8204,567,1107,8225,2432,1192,1078,840,2124,2185,625,8257,238,2130,1159,359,457,2104,399,787,2075,2145,4133,591,678,434,4121,677,2087,1290,4118,1542,349,1300,1102,245,4232,1188,458,4356,666,1113,620,1553,8212,1163,2307,1313,4360,363,2132,127,1067,8448,191,2186,1125,782,407,2193,436,626,2309,2077,1218,571,465,681,2091,246,4134,707,8226,2146,4610,1346,350,1084,599,668,2563,1548,4192,4163,790,1165,1320,460,1123,2136,1200,4137,249,2188,682,1664,8216,573,1171,411,803,2078,1116,8228,789,2194,1304,709,365,4240,440,628,4124,689,3076,8199,2119,374,1224,423,2310,1556,4165,466,793,2313,4138,1130,250,371,1174,481,574,1348,2209,4612,413,2624,1109,603,366,2093,1545,4145,8321,2148,1287,1055,8258,468,1570,655,900,4170,2688,805,4368,615,3073,8704,1166,684,1409,710,2099,1187,4256,429,8203,794,2196,252,1114,373,605,1232,848,690,2094,5122,2123,713,632,2314,1316,482,4616,806,2321,4384,1132,8232,2565,1083,427,2152,1177, 904,4624,2210,1569,8260,4288,414,1291,2101,223,1126, 4640,2241,1554,4166,663,3080,8322,69 2,835,1328,619, 472,2200,1137,4140,455,796,2125,1189,1601,809,714, 2212,1248,721,4227,837,82 11,2816,716,1086,8205,2316, 1302,1352,864,2322,2566,4177,8240,810,2102,1173,4146, 606,1194,2 131,912,4169,2105,2569,1103,4111,722,696, 377,4416,1424,435,2160,1293,4229,1560,8206,817,11 29,1792,319,621,4148,1180,812,4119,484,3072,8264,1345, 430,1572,8449,2183,1138,2126,1299,42 30,838,2337,2242, 667,1219,8213,488,2133,1111,239,378,2324,2570,459,622, 2106,2216,1410,4480, 627,437,2187,380,4172,4233,8324, 2147,1201,4178,1608,818,1178,1294,461,4152,2134,1543, 412 3,496,4193,669,1190,1317,679,1140,8227,1079,2108, 1221,4135,724,8450,2328,841,1305,8218,62 9,2137,1584, 351,467,2338,2577,1360,8705,438,2572,2244,1115,737, 251,4355,462,2189,442,4180, 441,3088,8272,2149,4234, 1666,469,2195,1549,4241,247,683,2224,1196,4357,1226, 4125,842,1412, 1127,738,4139,1144,2190,1308,4194,899, 2578,1602,670,1318,8229,783,2369,1085,4611,8217,849, 2079,1555,1193,8214,820,2248,1576,728,928,4184,2138, 8328,791,4236,367,3104,8452,2593,137 6,901,1233,630, 2340,2370,1321,4126,685,8456,844,2580,4242,1204,633, 711,1118,253,691,2311,1 301,5124,2197,4167,824,2150, 1175,902,4358,686,2153,1668,4361,1222,8230,2352,1416, 1133,870 6,740,6144,1347,850,375,4257,2344,1558,8288, 4672,444,3078,8259,1306,2211,470,1167,4141,48 3,2140, 1547,4196,415,3081,8233,485,2095,905,1202,795,473, 2315,1240,4736,634,744,2433,5121, 2594,1616,852,960, 2372,1322,865,4147,693,8336,2256,4244,1131,8220,2434, 1794,1350,797,2198, 2201,1225,4142,8261,4171,2213, 1604,1571,8234,4362,906,1252,2154,715,1141,4369,2103, 2376, 1330,4613,807,3136,8708,474,636,4200,1179,694, 254,2584,1550,4258,1665,8241,717,2625,1071, 1315,575, 913,4149,2596,1440,798,4289,811,3082,8266,5128,2161, 379,1208,8464,2202,1353,2127, 1191,4248,697,2317,2156, 4173,1564,8352,431,2626,1142,4260,607,2272,1228,2214, 489,4864,25 67,2600,1324,9218,4364,866,723,2243,486, 4370,1573,4614,8712,2318,1181,4150,1234,3089,8480, 908,1793,1561,718,813,4179,2689,1364,4153,476,4617, 856,3084,8720,1117,1411,839,1329,8384, 2571,1295,2323, 1146,4208,725,8736,2628,2339,698,1472,8262,914,2107, 1249,752,868,2217,2608, 5120,2162,8236,819,2325,2204, 1349,4231,814,4174,439,2135,929,4385,4290,3200,8323, 2245,11 97,4181,1578,490,2164,1139,4372,1680,623,4618, 2218,1632,4154,1336,8273,4264,671,1198,1362, 739,1603, 4235,8242,1557,2109,1413,4195,916,3090,8265,2579, 1303,463,1236,8207,843,2573,26 90,1135,4182,8512,381, 2329,2326,1672,1354,8325,497,2574,2225,1586,930,821, 4156,2341,8244, 2436,726,4376,961,3105,8215,2139,1203, 4185,1182,872,2632,2817,1418,4386,4625,8326,492,224 6,1250,4620,1332,4292,631,1574,1223,729,4237,2220, 1145,5136,2168,1605,4197,700,2249,1796, 443,4243,1307, 8576,741,2384,1378,4272,1562,8268,8329,2110,1356, 1205,8274,845,2330,6145,13 19,920,382,4238,2191,3077, 8248,1585,8219,4626,822,3092,8289,2151,1425,2226,851, 1229,4417, 730,2342,2141,1609,4127,498,3106,8231,880, 2692,4296,1256,742,445,2250,1392,4186,471,635,2 640, 1148,5152,2371,1696,4641,932,2440,1580,687,4388,4418, 8451,2345,1210,4628,1420,8276,28 18,1612,1325,1800, 8330,903,6146,2155,1134,4359,8337,825,4245,2228,1235, 1361,8453,4198,500, 3328,8221,1577,2199,846,1670,4201, 2257,8235,2332,1195,4400,745,3075,8290,826,2696,732, 12 64,446,962,2142,2252,1426,4392,1620,8707,936,2346, 5126,2448,1377,475,853,4259,2656,1310,8 67,4188,637, 3137,8280,5129,2400,4143,1551,8332,2373,1230,2581, 1414,4363,907,2203,2258,120 6,4481,1667,8222,4642, 2353,1588,1333,8338,4420,487,6148,1808,2595,695,1441, 4304,2348,2157, 1087,9220,4482,746,3096,8263,828,2232, 753,4246,1610,4249,8454,854,2582,1237,4261,1326,31 08,8457,857,2585,1368,1209,504,799,4202,2163,10240, 1355,4151,255,4424,964,3138,8353,5184, 2215,1242,909, 1673,8768,2273,1559,2374,1309,4632,719,8237,2354, 2820,4673,1143,8292,477,22 05,1617,4644,915,2704,2377, 1448,5130,2158,8832,4209,2165,2260,1380,9217,4250, 638,4175,748, 2219,944,4365,1728,4204,3086,8243,2824, 1331,4674,1227,3112,8340,869,6152,1592,4320,1428, 491, 699,4262,2378,1253,4615,1351,8238,4648,754,3201,8267, 1183,1565,858,1618,4291,8458,227 4,1417,2597,1476, 4366,478,3091,8465,2586,5137,2435,968,1260,8709,383, 2356,2264,1212,4737, 8296,910,2464,2319,5132,2327, 1801,8354,815,2206,2385,1579,4619,976,4371,2598,8245, 2720,87 0,4676,4387,3140,8385,2166,1684,9224,4155, 1633,917,2380,2627,1337,4265,1241,4656,8344,421 0,2588,1606,4373,1824,3120,8269,4252,727,1150,1442, 493,1357,4183,8356,2437,1251,5248,2221, 1676,4293,873, 3085,8960,2169,1384,701,4212,1566,8460,931,2601,2247, 1323,4266,1798,8466,8 710,2832,2227,1365,1473,8246, 756,2276,6160,2386,1334,860,499,4157,2360,3584,8275, 5138,275 2,8249,4627,731,3202,8713,2438,1648,2222, 4621,1238,4738,823,2602,2629,1575,4377,4374,3094, 8304,922,2441,1199,4622,1674,4273,874,2331,1432,4389, 1421,918,4484,2170,1636,5153,2496,1 254,9216,4187,502, 2401,1795,933,4680,1366,4865,8327,8270,2609,1338, 4294,1682,8481,3144,83 86,2251,1587,1211,1488,8277, 743,2111,6176,2388,1358,4268,8468,760,4216,2442,3097, 8714,124 4,1581,8250,4297,881,3329,8360,2575,1147, 2630,494,1379,4432,2604,8331,2229,2343,1272,4158, 702, 3107,8291,921,2333,4378,1624,501,876,2280,2172,1415, 4239,5125,8278,847,2253,1856,514 0,2230,1444,4199,992, 4274,2691,1697,447,4390,4189,3204,8252,5154,2610, 1607,4740,1436,8472, 2334,1369,2633,1257,4298,1704, 8281,733,6147,2347,1797,4688,1669,8482,8721,4419, 2402,1340, 1231,8716,4488,827,3093,6149,8388,1590, 2259,934,1634,4393,2449,3152,8333,2233,1474,9232, 4866,882,3109,8293,937,2444,2392,963,1419,4203,8339, 747,2634,2693,1265,4276,1119,3330,836 8,505,2641,5376, 2583,1381,855,924,4247,2288,10241,1810,4305,734,4380, 829,3098,8334,5123,2 254,1563,4744,1213,8722,2143, 1611,2375,1363,4190,4300,8513,2612,2848,1430,4394, 1258,8223, 4496,2450,1688,1386,8392,4704,965,6208, 2404,1614,5185,2355,8282,1730,4448,2349,2465,1239, 9248,4421,938,4629,3208,8737,884,2261,506,4251,1327, 4306,3114,8484,8514,2616,1589,4401,18 04,3168,8724, 749,2880,6153,1370,1640,945,966,4643,2636,3083,10242, 1456,4396,1681,8455,420 5,755,3585,8341,5144,2234, 1266,859,1427,4280,8294,2694,1593,2452,1388,4630,940, 3139,8297, 2275,5156,2944,4633,1214,8496,830,2642, 2466,1809,4211,12288,911,2350,2697,1621,5186,2819, 1582,8488,4263,2408,2587,1832,9222,4321,871,4422, 6150,8355,2159,639,4402,1480,4868,3100,8 284,2379, 1698,9225,4253,1335,3216,8239,888,6161,2262,1372, 4752,1245,4425,8459,479,4206,23 57,1422,4213,1268, 3110,8577,4308,946,3332,8738,1732,1677,750,1802,4267, 8516,2236,10244,16 26,5134,2497,1393,4872,969,3121, 8400,2265,5160,2456,508,1613,8578,861,2657,2644,1446, 4426, 1857,8342,8345,2599,2698,5249,2277,1339,8357, 757,2207,6154,2468,1382,4322,970,4645,2358, 3141,8298, 5139,2589,8247,4634,4483,3336,8520,2821,1700,2658, 9280,4404,1243,4312,919,2705, 2381,1594,4512,1433, 4367,3113,8728,4375,2167,1826,4254,1504,3146,8769, 4433,875,6162,1635, 4646,1259,862,1920,4768,8740,2648, 1675,5188,2387,1445,9226,4214,758,3232,8305,2266, 1149,9 48,4428,1359,4675,8346,8271,2416,2700,1816, 4636,1596,8461,3079,8300,2278,5168,2439,1671,1 712, 8770,977,2361,6272,2498,10248,1385,4485,8416,923,
4269,2590,3586,8358,5133,2382,1622,8 711,4217,972,
3124,8744,2281,1434,2603,4649,1311,4295,2822,8387,
2223,2171,1729,4880,4275,3 203,8462,761,2706,9233,
4324,1396,4434,877,2660,2389,1207,4408,1475,5632,
8833,4800,2825,14 49,5250,2268,1812,9228,4486,952,
4270,2362,1686,495,4650,1262,4677,8715,3153,8467,
5142,247 2,1644,4489,1619,8772,3116,8483,2443,1341,
6156,1429,4379,1825,8251,703,2721,6177,2631,137
1,4218,1638,8361,8752,4544,2403,3344,8306,1567,1736,
8469,4449,935,3142,6209,8348,2335,168 5,2231,978,1625,
4657,2282,3099,8279,2173,5192,2605,9344,4299,883,
3264,8389,762,2708,2664, 4159,1246,4436,8308,503,2390,
2364,1458,4490,5145,3205,8362,925,2289,1394,5377,
2826,1269,4 623,878,4678,2611,10256,1478,4652,735,
4277,4391,3122,8253,5155,2393,1799,9234,4381,1678,8
723,2500,1860,2445,1443,4328,1637,4220,8717,8834,
6164,2451,1481,4301,1373,8473,3160,8470, 4278,2255,
1699,1255,8718,4739,993,3588,6400,8369,2722,1591,
5252,2606,8485,1828,4658,2833, 3148,8580,2480,1452,
9249,4382,885,4681,3087,8283,939,2405,2235,994,1400,
4395,3210,8776,89 61,2284,2712,1744,4450,1656,3360,
8390,980,2672,6178,5141,2635,1689,926,764,4307,2828,
3128, 10272,1270,4497,5200,8364,4281,941,3170,8312,
5157,2753,1628,4492,1367,4440,8393,2174,180 5,2290,
1457,4682,4741,3111,8528,2613,5378,2446,1921,4689,
1583,8254,4631,2394,2504,1387,43 36,1642,8474,12289,
967,6168,2406,1267,5146,2453,1484,8335,9221,4302,
2351,2617,1450,9236,4 191,886,4423,3592,6180,8295,
8370,2292,831,4660,1683,4896,3206,8486,3145,8285,
2643,1342,92 50,4498,1811,3331,8836,947,2237,6151,
2614,1705,1431,4452,8394,507,4403,2724,3217,10243,12
61,4397,1840,3102,8784,4513,889,3156,8515,5256,2409,
1650,984,1760,4309,8584,2754,10245,14 90,5162,2637,
1615,4664,751,3392,8489,2263,5216,2834,4928,1702,
8962,942,2695,2396,1858,468 4,5131,12290,8299,2467,
2454,1423,5633,2512,1460,8372,4282,2728,6273,2849,
1383,9472,4742,9 96,4500,6210,3117,8343,5187,2410,
8401,4323,1692,4992,3212,8476,2638,1641,2457,9219,
4690,1 814,4514,3334,8840,971,6656,2618,1477,4398,
1273,4745,3169,8286,8396,4867,2836,1512,4456,1 733,
3600,8490,4635,890,3154,6155,8592,1598,1374,509,1806,
4207,8800,2645,3123,10304,1922,5 148,2620,1649,9281,
4427,949,3234,8544,2267,5264,2359,973,1397,4310,8517,
8725,2756,2646,14 89,4405,1708,8347,3337,8402,2649,
5158,2699,5380,2469,1627,8497,1000,2840,6184,2850,
10249, 1690,4284,12292,892,4545,2659,3095,8739,5169,
2650,1274,8492,4313,4504,3220,8301,2458,143 8,2279,
9240,4705,1817,4692,6212,8376,2736,2701,1390,4647,
1464,4746,3176,8726,4325,2296,92 52,4255,1868,3118,
8729,4516,950,6274,2417,1151,4406,1731,5189,8307,
1506,4637,2238,1827,53 84,2412,1597,9282,4869,863,
4706,3616,8359,2702,1451,759,4753,1864,4429,8417,
3143,8518,102 46,5161,2707,1714,4215,1701,8498,3209,
8964,2383,5194,2528,6163,1395,1803,8349,1008,2363,6
157,2269,10257,1623,4696,1482,8848,8521,4435,2418,
3333,8302,5280,2661,1276,8309,4314,510, 3456,6192,
8404,2470,1435,2473,4464,1652,4748,2499,3125,8363,
2662,5127,2591,9230,4326,448 7,3346,8968,979,2283,
2460,9256,4409,1492,4546,12296,953,2391,2420,1928,
4638,1829,5634,323 3,8522,4430,2823,1389,5172,2365,
1738,9345,4329,763,4651,6158,10250,1872,4870,974,
4271,145 3,4219,8418,3587,8741,5251,2270,1643,9235,
4754,1713,8730,3147,8579,2474,1818,6216,1215,47
08,1402,4437,8500,8408,2501,6401,2285,1629,4873,1520,
8608,3172,8463,4316,2607,3218,8471,1 830,1691,8350,
4410,954,3340,6165,8529,2881,10258,1459,5201,2852,
8742,1734,4520,2760,3130, 8864,2882,5164,2709,9284,
4491,879,3101,8310,981,2856,2827,4769,1505,4679,3265,
8524,8771,2 665,2652,1706,4451,5392,3589,8732,982,
2481,6276,9264,5190,2768,1924,4383,927,4279,2864,31
49,10368,1833,4330,5147,8581,4221,4653,3224,8365,
5312,2884,1639,9229,4756,1447,4712,8313, 2395,1746,
2945,1343,4438,1679,4412,8745,3184,8391,6179,5253,
2291,1820,4337,1761,8976,334 5,8371,4874,2710,6402,
1479,4659,1275,8420,12304,995,3648,6170,8530,2502,
1740,5170,2366,14 01,8504,9728,4441,2723,3158,8896,
2666,1888,9346,4548,765,4493,3129,6657,8582,8366,
2946,28 29,956,1496,4499,3362,8746,3268,8773,2424,
5208,2476,9238,4303,1861,3594,8585,887,2713,622
4,2784,5636,10252,1437,4770,8475,985,4654,2615,3155,
10273,1720,4881,5196,3240,8314,4528,9 97,3126,8640,
5135,2888,1630,4453,1813,4283,8545,2673,10305,1462,
5258,2286,1398,4332,4760, 3207,8753,2407,5408,2505,
9288,4720,1645,8395,4683,2447,2835,1848,4876,1687,
5176,8255,123 20,8532,6181,2639,1247,5218,2726,1716,
8586,9241,4801,2482,6169,2725,1936,9473,4222,986,43
38,3338,6166,8719,3590,8774,5159,2397,8748,4661,1483,
4494,3348,8373,3150,8487,2293,1651,6 280,9251,4442,
1745,4552,3236,8477,943,2506,6404,2714,1859,1508,
4454,3161,8424,8316,4501,2 668,3601,10260,1834,4399,
1454,3211,8397,4665,891,3361,6408,8374,5640,2411,
1841,998,1595,4 340,8835,2175,3115,10496,1278,5254,
2239,5193,9348,4691,766,3173,8754,2830,5379,2455,
4285, 1465,4662,8478,8777,2484,2674,1709,4772,5265,
12291,3266,8491,2619,5150,2513,1764,5204,27 29,1646,
8546,4457,2294,6182,2755,10274,1737,4802,9237,12293,
511,4685,6658,3394,8403,5440, 2398,1485,8593,4311,
9296,4882,3132,8377,2647,1404,2716,9253,4743,1693,
4444,3596,6240,858 8,8536,6211,2838,1866,4515,1952,
4502,3213,8778,3368,8837,4560,2508,9474,4776,1491,
3171,87 85,4897,988,3248,6185,8727,2297,1657,1752,
5165,8432,1807,4458,2730,3712,10264,1399,5260,2 621,
1844,9242,4686,1001,4505,3219,8398,2459,5382,2851,
951,1654,4666,8287,3164,8519,10276, 5217,2837,1926,
4884,1707,8756,3352,8992,2757,5648,2413,6288,5202,
2488,1391,8594,1002,267 6,6172,2737,10247,1468,4693,
5171,12352,8548,4668,2422,3272,8499,5282,2471,1836,
8493,4315, 4407,3604,6213,8609,2514,1494,2841,9352,
4804,1873,4694,6186,3178,8405,2298,5385,2419,925
8,4697,1271,4747,3222,8760,4517,2529,2622,9312,4888,
1694,4898,3396,9024,12297,893,6660,24 61,1923,4707,
1461,5143,3157,8780,9227,4698,2651,1748,5268,2414,
1715,9729,4506,975,4327,35 93,6193,8378,10369,1862,
894,4784,1815,4749,8838,3335,8596,3103,10306,5224,
2516,1497,9283, 4344,1653,8419,3618,9088,2703,5166,
2948,6218,1510,1762,4465,8786,8610,2853,6416,2663,107
52,1842,4286,1375,8494,3214,8841,4460,2732,3457,8963,
5664,2758,1703,8552,4750,1009,3235,6 304,8731,2477,
10251,1466,5191,2842,12294,1874,4755,2300,3162,8303,
2421,5257,2653,9244,44 31,4576,3280,8523,955,2896,
2738,9360,4411,1739,4317,7170,12305,8406,2761,2680,
1486,4466,1 930,5381,3364,8501,4709,2530,6664,9254,
5504,2854,1889,9476,4518,1004,4521,6432,3180,1028
0,1658,4547,5173,8380,4710,1821,4639,3131,8641,5394,
2475,1718,9265,4331,1929,4508,8409,32 25,8600,2952,
1599,6672,1507,4439,1776,4468,8801,3617,8788,10308,
6336,5281,2462,1405,4871, 1735,8743,3339,8842,4413,
2271,3174,6688,8421,1831,1493,8351,12298,1010,3602,
6214,8612,27 11,10370,1984,5635,2740,1455,8502,9285,
4318,2883,3376,8733,2667,5195,2520,9480,4522,957,3
185,6188,8965,8802,2503,2844,4549,1865,4333,3237,
8849,3649,8525,2857,5220,2762,9257,4655, 5266,3296,
8311,983,2769,6275,2885,9290,5388,10259,1710,4929, 12306,958,4900,2764,3134,102 53,1514,4808,5178,3350,
8792,4930,4757,3400,8531,5149,2912,1876,9376,4904,
1768,4875,8410,6 225,10288,1721,5313,2858,1938,4713,
1660,4700,8560,3221,8844,6194,5637,2654,9223,4529,150
0,8422,3242,8583,4816,2960,6217,1403,4912,1892,5197,
8505,12416,8642,3151,6159,2770,1819,5 272,2744,1741,
8734,9730,4932,2425,6464,3472,8526,2483,1516,9268,
4443,987,4993,3341,6277,8 425,3608,8747,10254,5232,
2865,8966,1932,4339,3177,8367,3840,8315,2367,5393,
2669,6196,934 7,4758,1463,3228,8850,1012,2860,6167,
2532,5696,10312,1843,4550,3393,8804,8533,4414,2478,3
620,10497,1749,4771,5206,3186,8969,4714,999,3347,
6278,8412,5177,2886,1838,4994,1277,4877, 8506,2715,
3267,10261,1647,5410,2536,5316,9297,4472,4524,3159,
8616,2287,5642,2426,9260,47 61,1925,4832,8587,12300,
2507,2670,1498,4663,1742,5203,8865,12321,3458,8775,
6528,5288,267 5,1513,5174,2485,1880,8547,9488,4936,
2428,6220,6281,10372,1717,4721,9286,12353,1016,4334,
3249,6226,8479,3656,8375,5255,2866,1953,8426,4455,
9243,4553,3226,8317,3342,8749,2509,183 7,6200,9408,
4495,1867,4883,3591,6171,8852,8808,2544,6241,2717,
1631,1469,4687,3238,8534,33 65,8508,4774,2727,3188,
10275,9349,4530,1747,3127,8433,4773,767,3269,6183,
8970,2772,5386,1 0498,1904,5638,8755,1724,4445,2889,
3353,10266,1524,5396,2677,5198,9266,4341,989,3632,853
7,2399,5284,2515,4554,1406,4762,8644,3408,8589,10753,
5209,2486,1754,4716,5649,12308,3163, 8595,2785,5259,
2299,6403,9304,5409,2510,1822,8399,4459,2490,6228,
2489,10320,1835,4223,51 63,9732,12544,8866,4287,6282,
3714,8750,5221,2517,1499,8977,4878,9292,4503,3597,
6289,8624, 2295,1944,2731,9231,4532,1863,4722,3244,
6405,8549,3274,8379,6173,5314,2890,9354,4667,189
0,4561,3460,8428,3175,8856,4777,2786,6187,9504,4342,
1467,4803,3192,8816,12322,1003,3356,6 242,8779,2947,
1522,1763,5442,3650,8972,9272,4446,2718,3366,10277,
1695,5180,2831,1850,931 4,4695,990,4764,3133,6659,
8897,10265,5644,2897,1005,1937,4886,8318,3603,8434,
3241,10262,5 261,2868,5416,9255,4556,1722,8757,3624,
8590,2776,5219,2976,6232,5296,10376,1845,4345,853
8,8648,2839,6284,2415,10500,1495,4778,5760,12312,
3424,8550,4669,2949,3281,8597,5267,2678, 1655,8495,
4507,4899,3369,6174,8761,2733,10504,1765,5212,2892,
9736,12324,1956,4885,6290,3 252,8436,2681,5400,2759,
9350,4805,9289,4461,3166,8787,4536,2301,2739,9475,
4724,1487,4785, 3349,7172,8381,12295,8758,6215,2872,
1750,4470,1869,5320,3223,8868,9361,4519,2950,6406,92
46,5652,2734,1521,9300,4562,959,4889,3716,6409,8553,
3270,10278,1896,5226,8898,4346,1263,4 467,3464,8781,
3181,10754,5270,2788,1940,9536,4577,1770,4670,8407,
3395,8978,2898,5444,242 3,6305,1877,1509,4509,8839,
3606,8540,10336,6720,5205,2492,10307,1711,4699,1756,
8611,3354, 8598,4462,2518,3215,6189,8656,5641,2531,
1846,8872,12417,1011,3595,6244,8993,2463,10281,1 960,
5383,2533,5151,12354,9261,4564,2953,3250,8554,2843,
5666,2521,9356,4751,4996,3288,678 4,8782,8601,2682,
2792,9478,4901,1784,4711,7169,12800,3664,8762,2900,
5262,3008,9313,4780,1 870,5505,3370,8980,4806,2913,
6195,2741,9744,5283,10384,1662,4525,9298,12299,1013,
4890,62 92,3179,10268,1985,4348,5210,3842,8789,4469,
9267,4701,3398,8764,5328,2845,1753,9378,4944, 1927,
4786,8411,3273,6190,8503,10309,1528,6219,1849,4809,
1882,4728,8900,3652,8790,3619,10 282,6410,5412,2954,
9481,4578,1766,8793,3300,8843,4902,2763,3189,6417,
8613,1511,1954,5228, 8984,12328,8994,3378,6661,2855,
10756,1719,5179,2522,1777,8803,9239,4523,2684,6248,
3227,8 794,2742,5273,2302,9364,5000,895,3598,6306,
8602,3713,8423,10289,5665,2765,12356,1439,451 0,3119,
8880,3363,8845,2623,5387,2961,6197,9320,4319,5222,
3488,8440,1006,2846,6337,2859,92 62,5650,10314,1878,
4759,7176,12418,8561,4788,2427,3256,10512,1891,4931,
5424,3401,8382,47 15,4568,3239,6296,8556,5233,2745,
1939,9760,4551,1661,4892,8846,6221,3612,10400,1502,
5285, 2479,5697,9287,4905,1986,4810,3190,8851,6308,
5344,2655,9353,4817,1852,4933,8527,3276,867 2,12307,
2537,6912,1934,4812,1723,5182,8507,12301,3372,8413,
11266,6412,5398,2914,1772,544 8,2771,1515,8562,9477,
4960,2534,6418,3621,6662,8805,10760,1897,9600,12336,
1014,4906,3229, 6198,8614,3282,8617,10528,5269,2956,
1470,8643,9269,4702,3841,8806,3609,8735,2766,5290,28
61,6227,9490,5008,1743,3412,6201,8427,8604,2524,6665,
2904,5199,10768,1931,4818,3165,8535, 3459,8564,4792,
2887,3377,10432,9377,4473,5520,3343,8967,4531,1017,
3194,6256,8509,2773,53 89,10784,1968,5656,12302,1881,
4913,2746,3520,10310,1894,5225,2962,5888,9731,4415,
4717,32 97,8414,2800,5276,2916,9291,4908,1769,4580,
8618,7168,12360,10284,5441,2867,1517,4526,177 8,5668,
8645,12545,3397,8429,6279,5234,2862,6222,9316,5395,
2487,1941,8751,9362,4934,2977,6 433,6338,10371,1823,
4763,5315,9484,12309,9025,4584,3245,6229,3626,8996,
5207,2538,1659,89 04,4335,9274,4474,3187,6420,9026,
3728,8853,2671,1992,6666,9245,4555,1875,4718,3680,
6202,9 000,3384,8971,10321,6312,5506,2719,9409,1755,
4723,3246,8809,3410,8796,4533,2787,3651,628 3,10290,
9733,4476,1501,3605,8625,12420,1018,3461,6243,8912,
2964,5297,10313,1900,5704,335 1,9008,9293,4914,2511,
3284,10255,1725,5274,2891,5390,9368,4557,991,3183,
6230,9028,10560,5 639,2429,4592,1933,4765,8539,3720,
9089,3402,10373,5286,2545,5413,9328,4775,5236,12323,
36 34,8435,2978,5175,2869,6204,9489,5317,10292,1839,
4820,8854,12546,2774,6424,3009,10263,15 25,4937,5401,
9792,12314,3251,8646,4725,6233,3230,8510,5680,2920,
1955,8867,4447,9302,4563, 3466,6434,8810,6673,10374,
1988,5456,2540,9273,12801,1884,4534,3298,6668,9090,
3380,8973,6 340,5211,2679,9506,4833,9412,4347,3622,
8568,3271,8620,4558,2777,6285,9738,4538,1726,4537,
3193,7184,8857,12368,8928,3653,6245,2748,1948,1780,
5762,3844,8759,9299,4565,2491,6291,33 55,10624,9384,
5645,2789,1518,9270,4343,1020,4779,3426,6320,9032,
3610,10316,5292,10377,53 22,8817,1767,4938,3404,8430,
3253,10322,5508,2893,5223,9351,4834,1905,8551,3367,
8649,2968, 5240,2430,6286,5404,10296,1851,4995,8591,
3633,8979,10267,6674,5698,2870,10337,1893,4766, 5414,
12325,3473,8783,4879,2899,3277,6465,8870,5181,2778,
1945,8626,12313,4945,3657,6175,8 869,2546,10279,1757,
5651,2928,5289,9482,12310,9734,4916,6344,3304,8541,
2790,5672,2493,94 92,4824,9294,5024,3440,6234,8437,
12424,2519,2683,9380,4887,1530,4463,3196,7200,8650,
1254 8,3744,8858,6689,5472,2980,9305,4997,1958,5329,
3628,8812,9745,4726,2735,6436,6466,9355,54 17,10499,
1471,4781,9505,12552,1007,4940,3258,6676,8555,3468,
10324,2000,5300,3660,8319,47 29,9259,4807,3373,8383,
3848,10378,5214,2951,1847,9317,4349,1898,4787,8974,
3182,6407,8599, 10385,5397,2873,6293,1523,1942,4920,
8628,3283,8818,3409,10501,6246,5271,2548,10269,9410,
4998,1961,8763,3625,8657,4782,2894,3718,6249,8873,
5764,10283,1871,5318,8438,12326,8899,3 243,6448,2793,
10338,1771,5512,2874,5229,12802,9538,4836,2780,3312,
8542,2494,5443,3010,92 76,4946,4471,3474,6440,8791,
3668,8860,10755,5654,2984,9740,12384,1529,4540,7174,
12355,34 25,8982,2523,5402,2901,6307,9357,4566,9512,
5263,3358,8652,4579,2915,6236,2685,9315,5643,1 0328,
1912,4511,7177,9392,12329,8441,4581,6191,3599,10380,
1758,5001,5298,3278,8874,4891,9 856,4569,3462,6411,
8765,5336,2955,1989,9363,4730,1946,4840,8603,3254, 6529,8995,3715,1027 0,1526,6690,5712,9308,4948,1906,5056,3636,8981,3381,10386,6468,5418,2535,9496,4961,1883,4 789,8901,3856,8557,12432,2743,3489,6352,8632,1773,1957,5227,8820,12316,3135,8881,11268,6 530,5890,2794,10311,1853,5446,2876,1976,8566,9416,4893,2801,6294,3658,6297,8615,10502,53 21,2902,9748,12357,1015,3285,6309,8658,3374,8985,10505,5700,2905,5667,12330,9322,5002,34 16,8442,3257,8563,2552,5348,2847,6250,9366,4811,5237,3403,6199,8673,8766,2303,6472,3012,9540,5426,10401,1751,4903,7232,12804,3290,8605,4570,2957,3721,10816,9301,4732,5275,3607,8 795,4790,4350,3357,6680,8558,2767,5646,10285,1993,5761,9737,12337,1503,4813,6721,3191,10 340,1962,5167,2525,5411,9479,4671,9247,5009,3665,8660,6692,5536,2963,9762,4894,1781,4907, 8847,3496,7178,9092,12362,10880,6257,1885,4475,1908,5304,8997,12560,3428,8807,11265,6298, 5449,2686,6223,9358,5287,2796,2016,8876,9601,4793,2992,6413,3776,6252,8902,10291,1854,56 60,9379,12448,8621,4527,3379,6722,3275,8986,10388,5238,2917,1532,8444,9306,4703,3640,636 8,8565,3476,8797,2539,5324,2747,6310,9424,4585,1972,3301,6663,9040,3399,8882,10286,6696,5 420,2802,13314,10315,1774,4962,3231,8905,3613,8824,4819,2906,3666,6339,10506,9508,4582,5 669,3465,8674,12808,1019,3524,6414,8998,2526,5277,10513,1895,5330,7185,12576,9324,5004,3 016,3308,10757,1987,5889,2431,5657,9275,4814,4909,3260,6785,8619,10344,5460,2958,9369,45 72,1969,4952,9096,7180,12816,3849,10402,5213,2863,5507,9761,4935,1782,5425,12480,3627,8606,6667,5391,3024,6419,9483,5242,10293,1279,4821,8415,9318,12832,2918,6724,6435,10433,19 43,4794,5568,9746,12358,3732,8855,5010,11272,6203,3681,8884,5345,2965,1899,9027,4848,952 0,4964,3385,6313,8811,3289,6704,8664,10392,1994,6258,9329,12332,1663,4915,3654,6421,8647, 3872,8988,10317,6300,5445,2775,9381,9793,4910,3198,9001,3490,8906,4535,2541,3405,6231,10 404,9440,5025,1964,3299,7296,8913,12419,9029,3724,6341,2921,5293,11008,1785,5674,3432,89 08,9278,4586,2749,6260,3614,10508,9494,5235,2979,5776,9544,4719,1021,3371,6314,9056,3846, 10514,5728,10758,5432,12369,1935,4767,3413,9002,3521,10294,5294,2804,5458,9365,4835,5699, 12338,3382,8798,2908,5653,2547,6205,9386,5509,10323,1886,5012,9104,7186,12361,10297,6675,5399,2779,10761,2001,4559,5332,9295,12303,3696,8914,4939,6669,3286,6786,8888,5231,2871, 1407,8569,12608,9616,4477,3623,6425,8627,6422,10352,1779,5768,2970,5450,9485,12421,9752, 4593,3247,6670,3722,9009,6321,5682,2922,9321,5026,9984,4917,3480,6437,8511,3469,8813,123 40,2966,6532,9372,4822,1990,5057,3684,7201,9004,12311,3302,8676,11264,6235,5299,2550,9537,1970,5278,3843,8622,9764,4968,2981,6728,3414,6913,10375,9330,5514,10318,1879,9491,1242 2,1022,4588,3386,6342,9030,3730,10529,5346,10434,5428,3635,8859,9411,4727,3259,8680,3536, 10325,5670,2791,5319,9303,4825,1902,8431,3406,6316,8570,10516,5241,2808,6264,5701,10762, 1947,4796,8651,3292,8814,3629,10298,6345,5892,2929,10408,9602,4539,5403,12672,3195,8819, 4837,2542,3427,6480,8629,5474,10379,1759,5658,8572,12364,12425,3320,6206,2750,10339,1907, 5452,2969,5301,9393,12370,9800,4941,6426,3672,9010,2549,5415,2924,9370,5016,9486,4478,34 63,6287,8653,7173,12344,10326,5681,2895,9735,12315,1527,4918,3904,7188,8688,12385,3492,8861,6247,5521,3040,6322,9382,4947,9509,5325,3745,8871,9332,4826,2495,6438,6237,9271,5705, 10300,1996,4594,7202,9413,12327,8916,4976,3655,6788,3484,10520,1786,5352,3417,9033,4838, 9497,4541,3305,6346,8821,3752,10329,5488,2781,1959,9776,4567,2002,4731,8543,3845,6736,86 59,3717,10530,5244,10769,6467,5792,9552,1913,5028,3388,8630,3279,10764,6536,5676,2875,10 436,9307,4783,1949,8929,3638,8443,12547,2982,3682,6441,8654,5306,10381,2017,5516,8634,12 372,3522,8633,11280,6914,5708,2930,10341,1534,5421,2985,5896,12426,9858,4999,3011,3467,6 251,8661,10387,5230,2795,9741,12433,4921,3313,6324,8439,3167,8875,10416,5331,2553,5457,9 388,12549,9418,4596,7424,12317,3429,9034,2903,5673,2972,6295,9604,4942,9319,5766,3858,63 53,8930,12331,2782,6428,2877,9336,5291,10382,1788,4841,7171,9500,12386,3611,9091,4922,67 92,3261,10770,9794,4828,5360,3659,8862,4542,9510,5058,3411,6238,8975,6348,5522,10561,191 0,5716,9277,12803,1965,5032,3478,6442,9041,3306,10271,2004,6544,5473,9747,4571,9385,4949,3736,9012,3434,10440,6752,5406,3013,9768,4963,1901,4733,8920,3662,7233,9120,12376,10330, 3778,6496,1966,1775,5647,8983,12428,3287,8559,11296,6469,5326,2986,6677,10785,9568,5510, 2932,2008,9093,9425,5003,2554,6299,3375,6354,8822,10532,5302,10562,5763,9513,12318,8877, 3637,6449,3852,9036,10772,5684,2797,5429,12434,9396,4583,3418,8825,3688,8903,2993,5904,3 014,6691,9310,4791,5537,3504,6444,8445,3729,8883,10503,6253,5183,2803,9493,13316,10389,1 531,4842,7192,12359,3314,9016,4924,2907,3475,6328,10342,9367,4849,5706,3641,9094,12550,4 950,3436,6678,8878,2988,5333,10345,1971,5422,7204,9860,12553,9414,4953,6681,3262,10544,1950,5464,2878,5305,9608,4600,9325,4895,3857,6259,8932,14336,5451,2959,9539,4351,1909,506 0,9042,3669,7234,8567,12449,3630,10536,6311,5338,9750,5005,1991,5769,12864,3880,8636,112 70,6369,5655,2919,6470,9498,5405,10403,2018,4815,8662,9359,12333,2687,6450,3528,6916,867 5,10332,1727,5239,9739,12388,3746,8607,4573,11273,6301,3383,8677,10287,5713,2936,1916,90 97,9394,5011,3420,6800,8987,3293,6473,8665,10507,5544,2527,6254,9432,12928,1855,3470,626 1,8826,3316,8936,10625,6356,5476,2994,13313,10786,9808,4734,3780,9044,3725,9152,4844,279 8,3850,6315,10564,9514,5040,5824,3674,7182,9057,12339,8885,3441,6920,3017,5427,10448,1974,5323,7208,12436,9323,4965,2556,3661,10626,9986,5688,2909,5524,9542,4587,4795,3494,6474, 8989,3905,10390,5349,10393,5447,9417,12334,1995,4850,7297,12363,3387,10405,5279,2805,566 1,9796,4954,9763,5714,12554,3430,9098,6370,5513,3018,6693,9444,5572,10346,2020,4574,8907, 7187,9333,12561,10295,6682,6531,10568,1977,5064,5356,9522,12805,3748,8999,4479,11328,645 2,3291,6360,8666,5308,2967,1787,8828,12392,9371,5006,3642,6560,8886,3481,6415,8446,10776, 1914,6423,5897,9742,12450,9857,4911,3874,6302,3552,8909,10817,6481,5675,2923,9263,9507,5 072,3683,6694,8767,3307,9105,12341,2910,3968,6816,10788,9632,4966,2005,3723,7236,8990,12 481,3493,9003,11274,6262,5780,2806,13320,10353,1887,5729,3197,8571,9400,5013,2996,6476,3407,6723,10394,9545,5433,10319,5337,9383,12440,1023,3864,6684,8889,3644,10509,5702,10348, 5920,7216,12365,9756,4823,3719,8623,3760,10818,5246,3025,5538,9334,4589,5453,12452,3433, 6533,8799,10464,5347,2971,6317,9420,5772,10406,1963,4969,8681,7181,13056,3670,10759,6265, 5480,3020,10792,9516,4797,5662,12556,3482,9058,5027,6697,3359,6343,8915,5419,10435,1998,5894,8678,12562,9765,12806,3777,6928,6323,10510,1783,5461,2809,5569,9373,12342,9426,4852, 11281,6372,3444,9100,6482,5430,2925,9985,4956,9753,4595,3255,6456,8910,3523,7680,9005,12 371,10881,6848,9556,12345,2024,4827,3497,7298,8668,12809,3860,9048,11276,6534,5744,3000, 6318,9309,9603,5334,3734,9031,9521,4919,2543,6698,3310,6725,10763,9487,5671,10515,1980,7 190,9338,12400,8917,5018,3692,6537,3667,10820,5295,10531,5770,3389,8890,9664,4970,3477,6 427,9106,3873,10299, 5528,2751,5517,9441,5014,1903,8944,3419,6266,9060,
3686,10409,5732,10 800,6592,5350,13312,10354,1973,
4598,3615,9011,3784,10517,6497,5891,2983,10396,9541,
5029, 5462,12423,3733,9006,12366,3026,3673,6705,8631,
5434,10327,2003,5778,9121,12577,7240,1248 2,11392,
6347,5683,2931,10437,1789,5307,2810,5584,9389,12373,
9770,4839,6207,3294,6484,868 2,10356,5454,2551,9331,
12564,9872,4856,3506,6538,8815,7193,12810,10410,5340,
2973,5677,98 24,12346,9528,4977,3442,7425,12456,3317,
8863,6671,5243,2926,6726,9390,4590,9554,5475,352
6,6700,8931,9795,12427,2783,6325,6439,9749,5368,
10301,1997,4798,7203,9605,12387,3847,910 8,5017,
11282,6429,3726,10771,9495,5720,3908,8655,4597,9428,
4972,3491,6376,9035,3685,6268, 10765,5511,10882,2032,
9327,12374,1978,4943,3529,6349,8573,3421,10521,5952,
10518,6326,554 0,9864,9546,5088,3747,8689,3303,10766,
6787,5793,3041,10417,9778,4543,1917,9122,3639,7300,
9013,12348,10533,3876,6706,5703,10628,2010,5532,8918,
12568,3500,9153,11297,6430,5465,293 3,6729,10331,
9395,5353,2987,5800,12377,9374,4829,3042,3448,6443,
9064,10824,5893,11009,57 65,9610,12578,12817,3792,
6498,3704,8684,10438,5436,3028,5327,9442,12812,9524,
4923,7189,1 2484,3737,8823,2974,5686,2812,6355,9766,
5030,9415,5730,3318,6545,8921,7248,12429,10412,6 329,
5570,2989,9337,13328,10360,1519,4978,7205,9797,12389,
3676,8892,5033,6540,3415,6488,1 0441,9988,5059,5515,
3853,8635,12435,9499,4843,3505,6730,8933,6789,5361,
10576,2019,5215,7 426,9570,12464,9754,4601,3969,6737,
3631,10302,2006,6679,5477,9548,4951,9397,5020,3435,63
84,9037,3690,10522,14337,5906,3015,9511,4830,1951,
4925,9112,3315,7194,8574,12430,3532,10 383,11269,
6350,5659,9777,1911,5309,12818,3498,9014,11284,6239,
5707,2934,6471,10343,9617,5 459,10418,2021,9043,9421,
12609,2879,6708,3731,6944,8922,10534,5526,10333,5354,
9801,12319, 3390,8690,11298,6546,3859,9072,10884,
5784,2995,5482,12488,9448,5061,3753,8934,3479,6500,
8637,10442,5710,2555,6451,9584,12378,5826,3309,6445,
8663,3888,8827,10832,6561,5335,2937, 9340,13344,
10563,9888,5034,7304,12833,3698,9124,4980,3032,3808,
6357,10632,9772,4602,5423, 3538,7210,8879,12580,
12610,3663,6712,2799,5685,10537,2009,5900,7264,9402,
12820,9612,484 5,6976,3750,11010,9804,5466,2990,5736,
9517,5041,9992,5062,3906,6732,9095,7179,14338,5552,
10347,5777,9326,12551,1790,4851,3471,7681,9017,12437,
3508,10420,6330,5362,9427,4955,9553, 5523,12390,3431,
8692,11520,6790,5689,3044,6548,9769,5484,10391,2026,
5036,9038,7235,9862, 12393,10449,6371,3740,7040,
10524,1975,5310,9387,12592,3689,8937,4926,11267,6738,
3862,656 2,9018,10888,5905,3019,2012,8924,9456,5007,
3525,6446,8638,3321,6793,9154,10334,5717,1044 4,6915,
5678,9618,12584,9812,3560,6504,3781,9128,10538,6683,
5928,2938,13318,10640,9569,49 67,3646,8667,3422,9045,
12451,2557,3854,6255,10848,9502,4735,5576,3970,7196,
9059,12380,36 97,8829,11329,6475,5794,2997,13321,
10592,1967,5431,7312,12335,9743,4984,3021,3445,6358,1
0565,9422,5468,10773,5341,9606,12555,4575,3537,6453,
9099,3756,10395,5518,10450,5364,7206, 9398,12673,
9859,5042,7428,12834,3675,10545,5828,3048,5773,9780,
4846,9525,5898,12612,373 8,6332,8679,14340,5722,2940,
6593,10000,5489,10787,1915,5065,8887,7217,9633,12496,
3322,10 540,6361,6552,10349,9279,4604,5709,12674,
3486,8938,4957,11288,6753,3865,6740,9020,5542,1 0424,
2025,5953,8945,12438,9802,12441,3438,6695,3512,6794,
9046,10774,2022,6373,5435,9429, 12453,9518,4853,
11300,6303,3916,9049,10777,6564,5478,2998,9560,9401,
5066,3199,6454,8696, 3779,7237,8991,12394,10355,3554,
6685,9547,12343,1981,3875,7432,8447,12616,3645,9156,
1133 0,6917,5796,2911,6754,13376,10407,9434,5339,
3499,9101,9865,5015,2807,6801,3912,6477,1046 5,9751,
5690,10566,5529,7209,9501,12824,8911,3762,6263,3749,
10546,5922,11012,5600,7242,12 865,9335,4971,3443,
8669,3851,10397,5731,3056,5355,9809,4958,6016,12836,
3671,6744,9107,35 30,10896,5771,10569,6483,5541,9640,
13322,10350,1918,4854,7328,12401,3324,10357,6362,
5245, 2558,10452,9572,5044,5455,12442,3483,8830,
12367,6512,3700,6796,8940,5912,10411,2033,569 2,9136,
12557,7175,9920,12396,11278,6374,6535,11016,1999,
5767,3027,5808,9523,12866,9419,5 073,11304,6457,3540,
6594,9061,14344,5481,3001,9784,12512,9620,5019,3976,
6686,8683,3877,7 682,8891,12454,10570,6478,5718,9445,
12807,9543,5068,3437,7220,12840,3786,8946,11393,6377,
5530,2811,6699,9375,9757,5407,3920,6918,9050,9810,
12483,3022,6319,3501,6267,10466,9609,5 825,10789,
2028,7299,9668,12558,3691,8670,4857,11283,6802,3761,
10778,13329,10627,5492,386 6,9160,9452,4973,3263,
6756,8575,3450,6485,10548,5303,10456,5571,9404,12929,
1533,3677,692 1,9102,3568,10656,5545,10511,6364,5908,
13324,10519,9993,5048,3878,9007,3739,10398,6458,5
782,3002,10577,9771,4591,5358,12811,3507,7249,9168,
12563,10790,3782,6568,5740,10912,2011, 5715,9062,
12868,7212,12579,11332,6539,5437,2927,10358,9876,
5525,3029,5921,12347,9825,47 99,6817,3553,6727,9109,
10572,5467,10819,5734,9529,12457,9433,12848,3754,
6499,7440,12402, 10780,5663,3030,5832,9798,12565,
10016,5031,11312,7238,12444,3972,8919,6431,5781,2975,
632 7,9342,5074,9634,5721,3881,6378,8685,7195,9549,
12375,10629,6269,6701,9443,13440,10413,19 82,4979,
7360,9868,12485,3687,9065,4858,11277,6804,3495,6760,
10361,9576,5342,3794,8893,12 404,9758,4599,3391,6486,
9123,3727,6460,10793,5554,10439,2034,7301,9515,12458,
9990,5021,3 868,6385,3809,11024,5490,10419,6922,5365,
9557,9665,4974,3527,6707,8948,3323,10468,14352, 5574,
3043,10578,9526,4831,1979,9052,3788,7218,8691,12349,
3449,10552,11776,6489,5895,1333 0,10944,2023,5774,
12819,3936,8923,11394,6596,5956,2813,6541,10630,9840,
5539,10414,5733,1 2813,9430,12930,3004,3544,6547,
9015,10794,5577,10821,5469,9767,12569,7256,12566,
11286,63 51,3909,9114,10633,5795,2935,5351,9391,
12814,9866,5089,7684,12465,3485,6818,9066,10523,5
687,3033,6702,9624,12581,9613,5924,3768,6929,9110,
7244,12676,10362,6576,5548,3045,9828,1 3345,10688,
9446,4981,7183,12379,3678,8694,5035,6501,3861,6331,
10593,9987,5090,5496,3510, 7306,9125,12872,9558,
13057,3446,6380,6808,5840,10801,2013,5752,7456,9530,
12486,9874,5076, 11336,6768,3693,10443,9779,6731,
5785,9403,5022,9680,4860,3896,6924,8935,3735,7224,
10303, 14368,5366,10580,9550,12460,2036,5037,3295,
7266,8952,12408,3764,10634,11289,6849,5724,94
36,9773,5463,12489,3984,9073,11521,6270,5901,3034,
6386,10767,9339,5553,10822,2007,8686,7 207,9571,
12624,10796,6709,3531,6542,10421,6017,10535,5679,
9464,12350,3699,8894,11299,649 0,3793,6600,9113,
10525,5483,2991,5738,12570,9816,5063,3907,8693,3556,
6502,9068,10472,536 3,10364,6549,5580,9607,12431,
13317,3882,6447,3502,9039,10445,6713,5546,2939,10048,
13332, 10422,9636,4982,7688,12391,3889,9184,12466,
3046,3643,6388,10883,9889,4927,5779,3326,7302, 8639,
12582,7241,12381,11396,6739,5438,2814,13346,10802,
2030,5907,7427,9799,12932,9628,5 043,6333,3513,6710,
10526,9561,5801,10825,5527,9449,12490,9896,4603,3757,
6820,8925,7313,1 4339,5357,10539,5936,7198,9989,
12880,9861,4985,3812,7252,12611,3694,10594,6505,5746,
9532, 5080,9423,5856,12680,3785,6850,9019,11285,
14341,5586,2559,6733,9782,5711,10451,2014,484 7,9126, 7488,9826,12585,3533,10641,6359,11344,6930,10425, 9666,5798,13058,3452,9074,5038,1 1301,6791,3741,6492, 9129,10636,5954,10584,2040,9155,9611,12395,3914,6563, 4000,6550,8939, 10826,5519,10885,6608,5556,9457, 12468,9311,11522,6824,3539,8697,10833,6945,5479,3036, 135 68,10775,9573,5092,3705,9047,3800,7213,9116, 12439,10480,3855,6506,10002,12497,5788,3447, 7308, 8926,12572,3892,9021,11290,6734,5737,3049,6553,13315, 10446,9755,5910,7430,12936,940 5,5067,2999,3702,6714, 10335,9803,5573,10567,5369,7265,9555,12382,12492, 3974,6932,3755,10 804,5608,11040,5829,7696,9622, 12586,9450,4986,7250,12688,3439,10642,5694,3050,5470, 9880, 4605,9578,5902,12896,3516,6741,9157,7219,14400, 6018,10596,6716,5745,9806,13377,10547,153 5,5045, 7330,9922,12640,3884,10541,6363,6455,10657,9431,5069, 5493,12613,3542,9130,12821,1 1400,6852,3921,6742, 9076,5585,10453,2027,5804,8698,12443,7433,9519,12498, 11306,6745,3319, 6795,10808,2029,6565,5723,9781, 12593,9996,5096,11360,6936,3742,6946,8941,11072, 14345,57 86,2941,9562,9832,4988,3971,6755,9137,3509, 7191,9158,12835,10828,11275,6746,5370,9648,12 588, 9873,3796,7316,12397,3763,8947,11777,6554,5534,3023, 6375,13336,10426,9458,5913,3910, 9051,9619,12472, 2942,6832,3863,6797,10886,9785,5486,10644,5560,7272, 9580,12822,3545,9132, 11331,6392,3701,10467,13348, 11136,5964,7214,12825,9406,5046,3558,9022,3810,6513, 10834,52 47,10658,5827,10001,12403,5602,3890,6334, 9103,3423,10542,5923,10889,6508,5693,9813,13378, 11011,9774,4959,7712,12455,3751,10600,6798,5547,3057, 10779,10024,4855,5960,12513,3514,7 239,9063,12614, 14342,3922,6803,5810,10351,2035,5797,8831,12594,7305, 9672,13060,11292,647 9,6624,10571,9890,5491,3003, 5899,12445,9527,5104,11408,6459,3787,6365,9080,14353, 5719,10 454,5578,9564,12944,9437,12617,3534,6514, 3978,7429,8671,12398,10549,6757,5372,9614,12405, 9460,4606,11302,7552,12500,3937,9138,11524,6566,5531, 3052,6569,9924,9869,5748,3706,6595, 8942,7221,9994, 12459,10428,6758,3869,6687,9818,13326,10689,2037, 7442,9585,13064,3766,916 1,5075,11313,6379,3977,6556, 10457,13352,10648,5588,3647,8700,9805,5049,3555,6487, 9053,38 24,6516,10849,6024,10836,5925,7329,9638, 12618,10049,3453,6919,3783,10791,5485,10890,6461, 5834,13441,10469,9531,4859,3879,8949,3541,10399, 14346,5968,3058,10660,9574,5070,5549,12 514,4032, 7683,9162,12837,3503,10550,11333,6366,5739,13331, 10781,1791,5809,12826,7243,126 75,11528,6570,5914, 3005,11013,9892,5311,10850,5498,12596,9435,12504, 6597,3913,6381,9111,1 0897,5725,10573,5616,9786, 12704,7268,9625,12559,11305,6703,7314,12567,10359, 5926,3031,57 87,10018,12446,9696,5050,11338,7436, 12625,3758,6977,9067,14354,5555,3006,6948,9827,12838, 9451,5830,3562,6856,9054,7226,10112,12960,10840,6978, 6805,9867,13380,10579,9637,4975,71 97,12406,3924, 8950,5077,11424,6952,3816,6923,10458,9341,5601,3769, 7361,9140,12620,9551,1 2867,3986,6761,3708,6748, 10608,5802,10892,2038,7685,10008,12828,9788,5078, 11271,6577,354 8,10470,13360,10631,6864,6020,9863, 9904,5023,3451,6960,9169,3940,7245,10553,14464,5929,1 0690,9577,12677,2041,3867,7320,9115,12461,3789,10782, 11778,6980,5735,13325,10574,9814,55 43,12409,3564, 9164,11316,6491,5842,3035,7041,10473,9626,5439,10795, 5775,12841,7280,9503, 12487,11014,3980,6387,10415, 5916,10363,5857,9921,13072,7441,12467,11395,6806, 3511,8953,1 0898,5575,3060,5371,12516,9588,5091,7744, 12626,3891,6598,9069,10852,5836,10581,6462,5497, 9399,12600,9667,13824,3797,6819,7254,12992,11017, 6762,5984,3047,9641,13442,10460,10004, 4861,7225, 12678,3886,9144,12462,7042,3325,6925,10554,9878,5052, 5592,3695,7458,8687,12842, 7364,9454,12869,11345, 6520,6572,13334,10664,1919,5957,7690,9836,12681,9811, 4983,11308,68 09,3973,6880,10635,9533,14348,5533, 9621,12571,10017,5081,3546,6711,8895,3790,7251,10913, 14369,5816,10823,7336,9563,12410,9830,5093,3561,7222, 12736,3928,10595,11536,6984,5726,97 59,9928,5909, 12641,3765,6769,9127,11334,14401,5558,3064,6382, 10527,9877,5494,10423,2042, 9170,7303,9817,12849, 4001,10474,6503,11291,6601,10365,13384,10797,5741, 12491,3885,9075,1 1456,6543,3915,6931,8954,10900, 5944,10856,5783,12351,9438,12628,3679,3517,6735,8695, 1058 2,5343,10556,6822,5812,9650,12682,13337,11397, 6578,3795,9117,10481,6821,6032,2815,9586,1 3569, 11018,9461,5082,7434,12815,3952,7686,9070,12870, 10803,3772,6493,9670,12844,5579,357 2,7444,8927, 12469,7246,12583,11314,6389,5747,3037,13347,10585, 9991,5841,7332,12573,9870, 5039,6602,3454,6810,10692, 10052,5955,10637,5604,7257,9635,12520,9829,12412, 3802,6764,769 7,14356,5930,10643,5550,7307,9673, 12493,9565,4987,11352,7457,12470,3870,10447,6507, 5937, 9891,5094,9447,5691,12931,3883,6271,9185,7211, 11780,14592,5374,10914,6335,9783,13444,107 98,2039, 4862,7269,10020,12850,3547,11025,6926,11340,6551, 10672,9644,5561,12574,3992,9077, 12873,11279,6580, 3911,6770,9131,10597,5805,10427,2044,9186,7362,9592, 12587,11402,6715,39 38,6609,10476,5860,10904,6825, 5742,9936,12642,9848,11552,6390,3515,6851,9172,10864, 14370, 5833,3051,13333,10827,9881,4607,3570,9118, 3811,7490,8956,12499,11020,11320,6494,5581,946 2,12689,13392,3743,7228,12473,3898,9133,11362,6743, 5500,3038,6812,13349,10945,9820,5789, 7692,12684, 9559,12632,3053,3985,6934,10366,9997,5962,10482,6048, 7309,9649,12874,7464,129 33,11303,6604,3770,10805, 13570,10638,5587,7267,10113,12881,9775,5084,7344, 12823,3893,639 3,10586,5753,10696,5848,9579,12528, 9834,5903,3543,6826,9159,7808,14360,5495,10598,6717,5 940,9459,13338,10645,9676,5097,7315,12494,3703,10543, 6555,6947,10809,9642,5047,5750,1238 3,3813,7260,9078, 12615,11784,14372,4004,6933,6022,10484,2043,5803, 9023,12852,7448,9875,1 3088,11398,6853,11337,6509, 10835,9534,6584,5487,12690,10003,5098,11523,6772, 3535,6833,91 39,10429,14343,5564,10806,9897,9623, 12644,3798,6518,3917,7368,8699,12595,10916,11409,656 7,5932,9453,12589,10032,11294,7700,12705,3569,9081, 11348,6610,5590,3007,6937,13448,10601, 9842,5969, 3944,9176,7274,9952,12501,10946,6394,3311,6515,9682, 13354,10829,5367,7318,980 7,12856,3988,8943,11584, 6625,3818,6718,10455,13408,11026,5790,7492,13120, 9894,4989,3925, 9134,3557,6557,10887,6019,10588,5557, 7253,10050,12876,13323,3759,6747,3804,10659,5844,10 646,6510,5811,9615,13825,10704,9652,5071,7689,12474, 3894,10920,14465,5958,3059,11041,957 5,4990,5911, 12934,4008,7431,9188,12692,7199,14402,11309,6612, 5593,13379,10602,2031,5749, 12515,7714,9884,13184, 11404,6799,7044,10830,9833,5606,10649,5858,12882, 10006,12706,1152 6,6949,3832,6759,9163,14848,5938, 10810,5471,9669,12590,7310,9465,12937,11361,6828, 3918,7 553,13059,11028,6854,5799,9704,12648,9925, 5105,11792,7331,12827,3710,6573,9082,11346,143 47,5562,3061,6938,9790,9566,5970,4033,6396,8701,7258, 9998,12399,10837,6517,11315,6749,10 114,13340,10812, 9841,7376,12619,3801,9141,5051,11426,6992,3975,6834, 10459,13456,10551,58 35,3576,9165,9589,12502,3897, 6857,3930,6776,10948,5582,10838,6026,7460,9681,12597, 9900,1 1529,6626,3814,10841,13350,10891,6950,5985, 13572,10661,9819,5100,3559,9192,4002,7276,110

32,14376,5754,11042,9882,12476,5917,3767,7227,9084, 12737,3825,10851,11287,6571,5814,1336 1,10842,9466, 6025,12505,7321,12696,11412,7048,5695,2943,10650, 9630,5603,10471,5872,12897, 7713,10009,12884,14404, 3487,6558,10928,5501,10893,5831,9582,12839,7435,9656, 12938,11368, 6367,7270,12517,10488,5927,3054,5589, 12447,10060,5106,11310,7698,12708,3926,6807,9142,1 4466,6080,10609,6836,5551,9343,12598,9923,13381,3939, 6979,7472,9698,12829,10430,6763,661 6,10019,13576, 10604,9789,5053,7281,13061,3987,9055,12898,11808, 6599,3709,6940,10894,9643, 5961,3550,7333,8951,12945, 7745,10056,12621,11335,6953,4034,6858,13353,10899, 1983,7392,9 906,12407,9893,5079,11401,6865,3900,6981, 10575,13386,10720,14355,5806,9587,9995,5054,398 2,6860,9200,3771,7230,10555,14349,5610,10461,7446, 9815,12888,9674,3820,7496,12627,3563,1 0610,11525, 7008,5972,13472,10853,9468,5864,12506,3945,8702, 11648,14384,5817,3062,6954,10 662,9627,6034,10665, 5756,12656,7317,9844,12940,3518,10691,11317,6750, 10854,13319,10783,5 596,12518,7338,12679,11538,7056, 3791,9171,10475,5499,10652,5988,12601,9684,12738, 7247,39 79,6866,9145,10583,5915,10612,6840,5837, 10120,12830,10021,13826,11425,6521,7568,12622,11 015, 6579,5612,3065,9581,13364,10557,9930,5083,7437,12521, 4016,7704,8955,12843,14350,3929, 6961,10064,13062, 6028,3942,7273,9166,12463,7936,9645,12411,11779,6463, 6765,13443,10462, 9835,5559,7324,12946,9905,5108, 11339,6956,3817,6628,10666,10010,14408,5939,7489, 9407,129 00,9594,12629,3565,6574,3826,7716,10693, 14593,5845,10477,7282,9821,13065,9712,5095,11364, 7443,12508,3989,10799,11410,6982,5934,10022,9883, 5373,12602,3871,6811,9146,7363,11532,14 357,5743, 11073,6632,9651,13393,11044,2046,7255,9926,12712, 3707,10952,6383,11322,6522,110 74,13356,10901,6021, 12683,4040,9071,11293,6603,3923,6766,9173,11048,5594, 11019,5838,1296 1,7554,9697,12871,11457,3803,6771, 10857,5609,10844,6581,5976,9898,12643,13584,11781, 6524, 3549,9174,10673,14468,5813,3066,13382,10960, 10116,5112,7345,12575,3948,7752,9119,12471,1 1056, 11341,6962,6049,10025,12522,13339,3773,7322,12413, 7438,12845,11416,6605,5933,3039,1 3504,11076,9831, 5963,7687,12948,9639,12904,6640,3981,6813,10587,9938, 5727,11137,5565,733 4,9535,12630,7461,9871,12604, 11376,6823,7284,14371,13445,10483,5843,7223,10012, 12529,995 3,4863,11537,7365,13066,3887,6868,10902, 14594,6000,9671,12851,9467,5820,3573,6985,9187,7 449, 11840,14362,5620,10694,6773,9932,13362,10558,9593, 5085,7728,12633,4003,10915,6495,11 350,6611,10858, 10080,5502,12740,4036,7504,8957,12685,11321,14849, 3932,6582,11138,5850,11 021,2047,9148,7259,9688, 12691,11554,6881,11460,6395,10616,13400,10668,6606, 5918,12495,10 053,11786,6586,3774,6585,9079,10905, 14416,5931,10976,13828,9629,12962,3996,3828,7810,917 7,12846,10807,11347,6613,5595,9912,13073,13388,11432, 7693,12720,3566,9189,11318,6391,604 0,3068,6827, 13327,11080,9822,5959,7340,12645,7370,10005,12475, 10865,3815,6986,9654,13450, 10478,5986,7556,9590, 12524,7271,12952,11399,6882,3953,10599,13600,10697, 5563,7288,12912, 9837,5099,7452,12875,3899,7043, 10639,5618,11027,5859,7746,10040,13068,9879,13368, 3941,6 814,7462,14373,5791,10831,6927,5946,9439, 13410,10918,9908,5086,7229,12993,3993,10674,143 61,6993,10917,10128,5101,6033,12414,3805,7699,9178, 12530,7337,11530,14358,11782,6964,133 51,10589,2015, 5818,12853,7720,9675,12686,11540,6872,11342,7072, 10485,9843,14472,5941,126 34,9937,12744,11428,6935, 3578,6511,9135,10698,14596,5591,10906,10051,7520, 9700,12646,113 53,7045,4006,7377,12693,10860,11793, 6774,5751,10026,12591,9646,11403,7465,12857,3519,682 9,9083,11553,14600,5861,3055,6988,13832,10603,10033, 6052,4048,9190,7348,9787,12532,10367, 6777,11307, 6855,9470,13446,10431,13385,7262,12883,3895,8958, 11365,6397,3946,6835,11022,1 3571,10647,5583,7445, 12477,9657,12854,3571,3990,6968,10676,5846,10866, 5965,7319,9901,129 64,13457,11458,7046,4009,10811, 13342,10705,6830,5617,9956,13396,10921,9838,5055, 7812,126 49,3919,7366,10486,14374,5992,10947,9929, 12994,5359,3819,7560,8703,12877,7277,14850,1158 6,6884,6036,13632,10590,9677,5866,12503,7491,13074, 11324,6994,6519,10839,9596,5973,10908, 5605,12935, 7702,9885,12636,11788,14432,3577,6588,14403,5807, 11030,5852,10058,12707,7450, 10144,12694,11405,6614, 11560,7311,12752,10700,6627,5942,12968,9683,5107, 11363,7691,1308 9,3960,6559,9180,11440,14377,6056, 10489,6629,9849,9944,13357,3806,7049,7346,9999, 12650,1 0922,6939,11904,6617,9591,13452,10813,10036, 7384,12878,4037,9193,12697,11411,6778,3994,6 888, 10651,13574,11043,5880,3574,9143,7760,9846,12858, 11356,6996,3954,7104,13409,11029,59 66,7466,10118, 13076,9899,11544,7009,3931,6837,10949,13840,10605, 14480,5758,13394,10680,9 583,5109,3821,9194,4005, 7275,10868,14364,6081,10929,7938,9660,12885,13363, 3901,7494,1286 0,4024,10614,11464,6941,5849,13474, 10663,10028,6023,12507,7369,12599,11796,14405,5624, 30 63,10706,9686,5945,11033,5978,12996,7748,10065, 12886,7715,14378,11370,7050,10490,13577,1 0611,5862, 12889,7396,9463,12939,11414,6859,7285,12709,10721, 5607,10814,6050,13080,9886,1 3090,11588,7474,3799, 6951,9085,14852,5815,10653,6618,5873,10115,12899, 9653,13335,11349,6 780,7323,12890,10843,6838,6398, 9940,13460,10606,9907,4991,7694,12698,4041,7809,9167, 1251 9,11785,14385,3551,6861,10054,5535,4010,7215, 9086,12976,7459,10007,12941,11527,6719,1129 5,7057, 13416,10708,9689,7584,12536,9845,5102,11810,6942, 3829,6955,10895,13358,11140,1441 0,5974,9702,9954, 12657,3933,6523,3956,7352,11045,14608,5987,10855, 7497,10034,12478,9567, 11406,7335,12652,4064,10924, 11649,6841,6035,13856,10950,9895,5757,12942,3902, 9201,7708,1 1427,14496,5598,10669,6575,9658,13383, 11034,6082,7286,10066,12947,3580,10492,11354,6751, 10613,13449,10845,5948,12623,7372,12768,11472,6633, 4020,9147,11088,6030,10930,5819,1260 3,7468,9931, 12509,15362,3822,7010,10953,5868,10872,6867,5611, 9678,12658,10122,13573,1155 6,6630,7717,12901,10722, 14856,5993,3067,13696,11046,10081,5110,7325,12710, 3943,7378,9196, 12713,14624,11372,7052,5566,9850, 12739,13365,4035,7937,12902,7705,10013,12831,11323, 686 2,6957,13586,10667,9910,5839,7508,12523,10121, 12700,11417,6620,4017,7000,11144,9791,1486 4,6027, 7261,9699,12631,7555,9968,12660,11809,6983,3830,7473, 14528,13473,10654,7439,9597, 13063,9927,5113,11531, 7290,12605,3327,6869,10463,11366,14880,6064,10023, 9685,5977,3991,6 842,9202,7616,11794,14406,5990, 10903,7058,10176,13827,10932,9647,7393,12510,3947, 11075,6 896,11568,7012,10859,13387,10712,5865,12714, 4042,9149,11377,14380,3711,6963,10695,5613,1 1036, 5874,12741,7493,10057,12525,11429,11841,6958,11049, 13412,10954,6583,6037,12847,1345 8,11488,7073,4012, 9175,10961,14467,5919,11077,13580,9902,13121,7341, 3833,7722,9150,13092, 10956,11326,6634,5755,9706, 13000,13370,11542,7283,13122,7824,12949,11592,6767, 6088,3069, 13341,11104,10068,5971,7776,13096,7480, 9960,13067,14417,3983,6815,9913,13505,11050,5851, 7342,10130,12905,7506,9852,12892,11413,6883,7747, 14386,13829,10846,5597,7701,12721,9692, 5114,11434,7557,13008,3934,7060,11152,14409,5996,7447,9595,13104,10084,13389,4049,6607,7 380,11343,14351,5821,10962,6987,10011,13464,10936,9933,5087,7279,13124,3455,10617,14656, 11664,6525,10675,9708,6029,12635,3827,7816,9179,13185,7498,11533,14469,11800,6641,13424, 11057,2045,7730,10124,12531,11369,7074,12032,6965,10559,13585,10861,14388,5935,12950,96 55,11420,6870,4038,7105,9204,11052,14359,5621,10724,13888,7347,10035,12742,11585,4018,73 26,12606,10670,11812,7016,6051,9941,12963,13398,11378,7562,12906,3927,9191,11539,14470,6 084,3070,6636,13369,11078,10030,5980,7394,13186,7476,9469,13069,10907,11459,6775,9839,13 602,10728,13508,7718,12664,7367,12716,11351,6873,3950,10479,13834,10618,5822,7289,12953, 10117,13024,7749,3995,6844,10699,6044,10862,5876,7940,9690,12855,9934,13395,11650,6587,7 451,14720,13480,10867,6885,5614,9705,13366,10677,10072,5116,7522,13128,3807,7706,10620,1 4412,14473,9909,12913,5863,3955,7500,9208,12526,7349,11441,14418,11848,6989,13447,11058, 10145,6001,12647,7463,12745,11418,7064,11534,6526,10701,10029,14392,5947,12687,7729,100 59,13075,11783,14363,3575,6966,10736,14433,5989,10909,9823,7569,9661,12879,11430,6995,11 557,7373,12966,10919,11380,6874,6041,12722,9939,11319,7753,12965,4044,6642,8959,11461,14 375,5853,10964,7024,13578,10096,13830,3834,7400,9916,12637,11081,6886,11545,6589,9716,13 588,10869,13390,7536,12533,4007,9181,11824,6615,4050,6779,10591,13476,10707,5626,7292,12 746,7840,9598,12954,11600,3961,7076,13401,10678,6054,7724,9946,12908,13841,11355,6831,39 97,10977,13451,10491,14595,5567,13601,10702,10014,5103,7354,12651,4065,7564,10682,14420, 6096,10681,7756,10027,12415,13355,3582,7469,12479,7944,14474,11906,7047,5943,13413,1070 9,9691,5994,13070,7278,12695,11789,14481,6969,10487,10136,5619,10923,6038,12724,7379,10055,12914,7505,11436,14597,11466,6644,14365,13506,11082,6057,12859,7721,10082,12753,11652, 6990,11367,7814,12969,10978,14379,5967,12534,9659,12995,11384,7339,3836,6889,9195,11548, 14434,5867,11139,6970,9714,9955,13634,11842,6876,7408,12638,10910,6590,11558,7106,9887,1 3372,11023,10042,7570,12887,3958,7764,9182,12956,11325,14851,4013,7080,13836,11089,5625, 4052,9197,7521,10129,13078,11795,6619,11433,6997,13453,11060,13608,7454,12748,9914,11816, 7011,3949,6781,10968,13411,11168,14424,6008,13488,10037,12537,4014,3823,7695,11031,1447 6,5854,10607,7374,9687,12970,13952,11616,7558,12861,4056,11141,11473,7051,6085,13459,108 70,9847,6042,12699,7350,13091,7811,11561,14366,5622,10925,9957,13404,11084,6002,7732,101 48,13077,7477,14482,11444,6631,10873,13592,10951,5979,12997,7952,12653,11358,6839,7585,1 2728,10493,5869,10931,6053,12916,7231,9679,12977,11541,15364,3579,6890,14407,5949,11064, 6972,6072,9942,12662,10061,13512,11415,6897,7754,12711,11142,14598,6998,13844,10926,9713, 5111,7381,12754,4019,7470,9151,13081,11908,14601,11462,7001,10088,13418,3998,7512,12538, 7353,9455,12659,11656,6648,11373,6943,13462,10980,10132,7499,12769,9962,12862,11587,6399,3957,7108,11090,13636,10615,14497,5847,10069,7386,9701,12701,11798,7053,4039,7817,14912, 13397,10684,7703,9903,12891,9948,11546,7453,12654,4066,6863,10710,11407,14381,6089,1383 3,10723,10038,5599,3775,9203,7287,11787,14436,6058,10655,6621,10152,13575,10725,13343,77 61,12756,3964,11145,11442,7059,11035,13858,10713,5877,12943,7592,13188,11480,14976,3903,10874,5981,10984,6004,13093,7524,9976,12903,15361, 11856,6782,11092,13454,11200,6892,6112, 12972,10062,13697,11562,7088,7872,12998,11105,14387,5950,10933,13475,9854,12717,7475,40 22,7371,9205,13082,14484,11371,7013,5628,10177,12540,13402,12034,7736,12661,7572,12893,1 590,6635,6843,13520,11037,9945,6068,7397,13136,7495,10119,12978,11465,14382,4043,6898,9720,14411,5870,7327,10041,13001,7709,10074,12920,11844,7002,11811,7762,14602,13604,11146, 7561,12770,9958,5115,11492,7620,13094,4068,6622,10955,11381,14609,5991,9703,10146,13420, 4025,7112,7404,11570,14853,6083,11047,6527,9911,13371,10714,9969,7356,12715,3835,10876,1 4440,11419,7054,10934,13465,10494,6065,13192,3962,9087,7945,11790,14498,11905,6959,13857, 10957,5878,7723,9631,12702,11311,11555,7120,10815,13579,11153,14389,5375,12511,13414,11 680,7014,4053,9198,11038,14529,6039,11051,13842,7828,10070,12951,15368,3935,7777,12980,1 0619,11448,7061,5995,10083,13123,13616,11593,7481,12907,7385,12760,11431,14488,6090,3071, 13425,10937,10131,5759,7750,12743,7968,9853,13084,14413,11804,6871,9694,13477,10671,138 89,7294,13097,7586,10178,13002,11382,6637,7501,14500,13536,10847,6060,7395,13009,10044,1 3125,11468,7820,4011,7017,10729,15104,5881,7528,10126,13004,9915,13374,11564,6845,7710,1 4604,13590,11106,7075,9964,13640,10963,9707,5117,7467,13152,4046,7942,10726,14610,11813, 14854,10089,6031,3831,7509,9206,13098,7617,11421,14390,11474,6900,13461,11148,9662,7478, 12894,12033,7004,11801,6643,10958,13482,11053,14419,5982,13200,9935,11604,14393,4072,687 5,10716,14857,6097,11096,13391,7792,10123,13010,11357,11651,7382,12984,11079,11569,6967, 5503,12665,13712,11535,7719,12723,4028,9209,11386,14448,5875,10965,7066,13581,10160,138 48,7343,7818,10073,13105,10938,11712,7018,10086,13417,11154,14080,7576,12607,7565,12909, 11489,7062,3951,10992,13468,11108,6086,7780,13100,7398,9961,12772,15360,4021,6646,13633, 11059,6066,7939,9709,12718,9970,13860,11589,7077,7510,14471,13426,11054,14414,5975,13587, 10679,10133,5118,7482,13126,4051,7826,11169,14625,14530,7731,10015,12955,13507,3837,735 5,12776,7632,11437,14421,11818,6887,13399,10730,9851,5998,12527,7502,12666,11379,14612,1 1920,6904,10863,10184,14858,6043,12747,7388,10067,12910,7725,11872,14394,11576,7025,145 04,13698,10911,7291,9947,12915,11438,6638,11602,7523,12725,10979,11843,14475,5855,12668, 9693,11797,7416,4045,6846,9210,11653,14435,6003,11156,7065,13489,10092,13896,11543,7768, 13106,10703,6645,11476,7020,9917,13466,11083,13582,7559,12749,4080,9183,11375,14422,4026, 6991,13831,10621,5623,8000,12784,7588,10125,12957,11912,11594,7136,13478,10737,13605,78 41,12967,13428,11826,6591,3965,11170,13367,11061,14396,6092,13509,10031,13012,7751,4058, 7580,10966,14616,5882,11201,7513,9717,13129,13593,11443,7401,12917,7848,14425,11422,6877, 6055,13872,11112,10147,6098,12639,7941,12755,7813,11658,14626,14865,10180,13648,10732,6 009,7484,10076,12726,7375,11490,14860,11572,6971,14532,13403,10871,6045,13025,7734,1253 9,11814,7078,11463,7778,12750,10969,14477,6113,12730,7618,9918,12729,11385,15376,3567,70 26,11845,14437,5630,10940,7081,10140,9972,13954,12036,7107,7563,12757,10683,14483,11547, 6891,13837,10981,9710,7409,12535,4067,7263,9212,12971,11618,14512,11802,6649,13484,1351 4,4054,7525,9959,13130,11596,6999,11445,7068,13700,11085,13415,7954,13026,10097,11559,68 78,3999,6973,11160,13432,10622,14478,5884,13596,7707,10043,13187,11825,3959,7357,14866,1 3890,11062,7755,10085,12958,13606,11665,7507,13071,4069,11091,11469,14657, 6006,13373,109 70,10137,6061,7574,13137,7402,11849,14367,6100,10738,9949,13843,11120,13481,7832,13108,7530,14536,11496,7109,10982,13864,10685,5997,13016,7758,13216,11632,14426,7874,10711,6062, 10875,5871,13079,7383,9722,12655,11388,15392,11936,7082,14881,13664,11172,7028,6104,131 89,10150,13521,11820,6650,7471,12918,10927,14628,14658,13609,9663,12973,7733,4057,7948,9 199,13132,11450,14868,11660,6893,10192,13492,11852,7514,12921,7784,12999,11565,7089,12040,7110,13406,11143,10039,7600,12541,7825,10090,12979,11374,14599,3838,6899,13589,11065,1 4485,5627,9715,7410,10134,13112,11475,7003,11601,7571,14438,13463,10740,7737,13190,10153, 11817,7532,12974,4074,7084,11086,11910,14441,6067,13956,10063,13510,4023,7358,11435,146 40,6046,10985,6974,9963,13704,11066,13421,7953,13028,4060,10972,11504,7055,10686,13635,1 1202,6005,13138,7765,12663,7726,11666,14632,11860,13846,11176,6087,7976,9721,12732,15366, 11617,7015,10715,13594,11093,14499,6114,12758,13455,11550,6783,7624,12771,11107,14428,5 823,10877,13835,7842,10104,12703,15369,4015,7479,12773,14383,11791,7032,6012,9950,13193, 13490,11470,7516,13083,7389,12761,11654,14603,6623,13528,11147,10181,5951,7566,12922,741 2,10138,13032,11446,14721,11907,7090,9718,14882,13904,7876,13140,7821,10098,13248,11828, 6894,11573,7946,14660,13610,10727,7770,13153,10075,12981,12048,7537,3963,7113,10935,1168 1,14544,6070,9965,10149,13419,11327,6652,7757,14722,14082,10986,7005,10045,13638,11068,10168,7590,13085,4073,8001,10993,14486,11850,14489,13513,11094,6091,4070,9207,7483,11477, 14501,11566,6901,13892,11097,13859,7526,13194,11608,11449,7114,10744,13540,11039,14442,6 116,13003,13429,11595,14391,4029,10495,14664,6073,11204,13618,7844,9943,13095,15424,1148 2,7387,12762,11149,11913,7063,5883,12924,13467,11799,7738,12982,7577,12542,11549,14872,6 010,10959,13838,10185,13953,7970,7648,9695,13005,14913,11383,7019,10154,13359,10717,136 03,7779,12863,7403,13201,11857,7006,8064,14884,13728,11155,6101,7819,13086,7589,9973,130 99,11688,15370,3966,6902,14449,5983,7293,10077,12667,10100,13496,11620,7092,7503,14490,1 3641,10878,14415,13479,10988,10208,5119,7960,12985,4081,7740,11184,14605,11968,14444,100 46,13852,4047,7815,12719,7856,11571,14914,11467,7121,13430,11109,9724,7529,12895,11832,1 4560,11668,7067,10731,13516,10939,14502,6059,12777,10164,7766,11493,14855,11591,7116,148 88,13612,10994,7578,9966,13154,11423,11805,7455,13011,11098,11858,14531,6094,12774,13861, 11657,7873,4076,9211,11716,14606,5879,10718,6905,13469,10087,13522,15377,7540,13196,11208,11500,7021,10179,14081,10623,13849,7351,13006,7619,13101,11452,14977,3581,13652,11150, 6120,7593,12764,7956,10161,13144,15372,12041,7096,13405,11055,13699,7830,13127,9974,136 17,11819,6639,7406,14859,13583,11216,14611,6076,13434,9471,13013,7788,4059,7763,11110,14 916,14627,7485,10135,12986,13760,11924,7573,13202,7969,14395,11873,6847,13537,11157,10091,5999,13040,7515,13156,7782,11577,14505,11481,14896,10186,14450,6069,7711,9855,13107,78 80,11846,14613,12064,7079,14492,13637,10967,7829,13102,11390,7122,11682,7769,12727,10733, 11597,14423,6099,13217,10156,11491,15488,4030,7027,11916,14533,5885,11113,6906,13485,99 77,13866,11624,7390,12778,10941,14452,11806,6647,13427,11171,13968,7602,12911,4082,9213, 11563,14506,12038,7069,13920,13624,7538,7413,10127,12959,11605,11713,7022,13486,10996,13 650,7622,13027,13891,11574,6879,4027,11100,13845,10739,14397,6093,13701,7943,10078,13204, 15378,4071,7822,14867,13591,10971,8004,10193,12751,13524,11888,7587,13131,7781,14861,11 478,14978,6128,13423,11063,9599,6074,7625,12669,7517,11815,14617,14614,9971,13960,11162, 13642,7843,12785,7399,11439,14862,11914,7137,14513,13874,11114,6013,13218,7735,13109,116 72,14629,11661,7972,11158,14724,6106,13014,7596,10182,13249,11876,15393,11494,7029,14427, 13491,10742,7083,10162,13470,12035,7138,7544,13160,11173,14920,11606,15105,13706,10071, 7888,4061,7800,9214,12780,11578,14534,11922,7124,13538,13620,11827,7833,12919,11451,7070, 11728,6908,13862,10983,13511,7414,13017,10094,11598,14508,4084,7085,13433,11000,14456,5 615,13893,7772,10139,12988,11484,11821,7511,14537,14084,11121,7949,12731,13595,11387,760 1,13029,4055,10734,11619,14672,6115,13666,9951,13850,8065,7727,11512,14398,6102,10942,10 099,13644,11161,13493,7531,13133,7786,14618,11864,7111,10741,13607,11116,6047,13208,7411, 12670,7628,11655,14479,15365,13873,11087,6007,7594,9719,13110,12096,15380,11684,7030,14 439,13713,11232,14514,6117,13139,13517,11937,6975,7827,13018,10687,14630,14429,13897,7486,10188,12786,15394,4078,7955,13168,11847,14980,11676,7091,9978,13544,11609,7849,13030,7 575,12733,11497,14538,11944,6651,13680,10973,10151,7405,12759,7984,10194,12923,12037,14 928,11909,7033,13436,14659,13984,7794,10105,13220,11580,7128,11471,7904,14728,13868,1106 7,7634,12975,10141,11830,7759,4062,6895,11174,11874,14633,6105,13498,10209,13708,11714,7 846,15106,13900,11122,7086,9726,13613,11177,14088,8002,13191,4088,11203,11659,14443,1342 2,10987,5886,7567,13113,7604,11505,14516,11359,13523,10745,13649,7527,12788,15616,11621, 7140,11095,13865,11164,14487,6122,13134,13958,12050,14545,7836,10974,14620,6071,11069,13 483,7785,9980,13033,15363,11803,7958,13114,14984,11453,7115,6108,13020,13552,11851,7621, 12734,7417,13250,11603,14430,14540,13714,10102,13908,7656,7877,10157,13224,11670,14634, 11498,7034,10196,14736,13665,7742,12763,7518,13141,11928,6653,11626,7950,14944,13598,112 05,8066,13155,7793,10093,12925,11854,15425,3583,7093,11970,14688,6063,10158,9967,13839,11479,7117,7541,14661,13518,11178,14869,13702,11124,10200,7633,13195,4075,7852,10746,1449 1,11567,14546,13494,13955,4077,7771,11829,14641,12044,7144,13876,10989,13621,7834,12775, 11610,11880,7036,11185,14096,11206,14883,6011,12983,13729,7418,11696,14636,11921,14445,1 3375,10995,7582,9723,13034,15384,11506,7961,13116,11099,11667,14520,6121,13041,13898,118 33,7534,7608,13142,11628,14870,6118,11180,13525,10163,13614,15396,8012,13145,14873,11454, 7094,10142,13656,11070,13497,7295,12792,7875,13087,12049,14451,7650,13643,11151,6077,79 71,12543,7741,10101,13252,11861,15426,11822,7007,14503,13530,7595,13197,10183,13961,12072,6903,8008,14561,13847,11111,14662,13597,10210,13007,7858,4083,7845,10879,14642,11720, 15108,9919,13431,11938,7539,12765,7947,14493,11575,7152,13905,11128,10108,7767,13203,762 6,11612,14992,11485,14665,13736,10719,14446,6014,10047,7420,11662,14453,11508,6654,14548, 13668,11186,7579,12926,11972,11917,7796,13036,10990,12042,14507,6129,13232,14016,11866,15374,4085,11633,15112,6095,11209,7123,13619,10166,13515,15400,7636,13157,10748,11853,70 97,13880,11101,13716,8072,12779,7973,12987,11686,14666,12097,13541,13639,7533,7882,10187, 13042,15489,11579,6907,13471,10997,13853,8016,13146,13906,11622,7118,7597,14562,13705,1 1210,14885,6124,13764,7787,10212,12766,15379,3839,7857,14874,14723,7962,10169,13256,135 48,11940,7359,12671,7546,14644,11483,14552,13500,11159,9979,5629,7773,13198,7664,11834,1 4752,11673,14607,10106, 14615,14089,7974,13103,7835,12066,14494,11744,7098,
14673,13867,11 115,7603,13264,11875,14886,11499,7878,
11102,12160,15008,6107,13158,10197,11915,15428,116
85,7023,14454,13972,10998,7125,10079,13921,11389,
7649,13205,11188,14668,11599,14915,1362 5,13529,7850,
4086,9215,12056,14876,11836,7126,13894,14112,15408,
8068,13015,11911,11952,7 071,13438,11217,13730,7977,
12781,13645,11625,14725,4089,13539,11163,14509,6078,
13964,778 3,10155,13161,15373,11862,7591,14457,13672,
11212,7890,12989,13854,11674,7487,13219,7823, 14889,
11551,14535,6130,13611,10190,14086,7964,7905,11969,
15120,14515,9975,13653,11001,13 761,7623,13044,7419,
14564,11636,7139,14674,13622,11117,6075,13148,7884,
12787,7545,11447, 14648,11715,15872,15040,6119,8032,
10216,13019,11689,15490,12052,6909,14726,13936,
11192,1 4510,13526,11926,7100,7640,13111,10735,14890,
11502,14917,13863,10172,15382,3967,8005,132 10,11884,
14729,11859,7031,13487,13962,11581,7581,13162,11669,
14619,12065,7129,13720,1094 3,13709,7864,13206,10095,
11611,14458,11878,7141,13924,14784,13542,7774,10165,
12790,11807, 11976,7957,14689,14083,11175,7606,13221,
13654,11925,7542,4090,11218,11865,14897,6109,13 626,
10195,13970,15432,7789,14539,13875,11123,9981,13499,
11002,13776,7992,13031,7831,1439 9,11486,14676,13646,
10743,6132,7391,13048,7860,11698,14730,15385,13532,
11165,13869,8080, 13169,11634,15617,11509,7130,14863,
13435,11118,14918,6103,12782,13667,11718,14892,
7627,1 0975,14517,14631,13560,7795,10189,12990,15395,
12039,7889,13209,14621,11918,7087,13912,1 2100,8003,
12789,7652,13164,11683,14568,11877,14460,13703,
10224,7978,7598,10170,13135,117 21,14541,11613,7035,
14144,14518,13732,7985,13280,11939,7142,11495,7739,
14979,13985,11233, 7422,12735,10109,11831,15492,4087,
6910,12068,14898,6126,13895,10202,13724,11692,7609,
14 622,13657,11125,14921,13545,11179,13992,7853,
13021,4092,11234,11640,14635,14085,13957,79 08,7790,
11984,14690,11896,13628,11220,13519,7881,13115,
15381,11929,6655,11166,13878,1100 4,14547,6110,13222,
13922,7629,11510,14737,15440,14521,13762,11181,7548,
9711,13170,15397, 11868,7837,13225,14732,11607,14680,
6136,13251,13707,12045,8010,8096,13035,11697,14922,
14 981,13553,10211,13407,15618,7635,12793,12161,
14929,11823,7132,10198,14871,13669,7801,13 143,7896,
13212,11627,14576,11882,7951,14098,11207,7543,13022,
7988,10143,13117,11507,1538 6,11724,7145,14542,13851,
10103,13501,11690,7095,7798,14431,13899,11126,14663,
13651,10213, 8070,4091,7851,11071,14900,11923,15136,
13718,13546,11582,7535,14738,12051,7146,13976,11 187,
13674,7612,13253,11945,11671,14692,13902,10747,
14643,5631,14018,7980,11501,14637,120 80,14753,13527,
11129,7638,13226,15496,11890,8017,13172,11224,12000,
14549,6123,12794,1361 5,11730,15402,7415,11855,14904,
6125,10991,13877,10201,14092,15456,7838,13037,15168,
11942, 7037,13658,11182,13928,8067,13233,7605,13254,
12098,14924,15371,13744,13969,7892,7859,99 82,13043,
11663,15873,11700,7119,14522,13554,8006,13147,13715,
11623,7038,7959,14982,13881, 11236,14740,13676,7641,
10218,13228,15427,4079,7797,14563,11932,15232,10167,
13502,11881, 7654,13118,7906,14930,12054,14754,14097,
11211,10204,7986,13199,7519,11717,14638,11513,14 985,
13909,15107,13870,7847,11752,14696,11973,7153,14875,
14120,11130,7610,13159,11838,116 14,8018,10749,12046,
14447,6131,12927,13768,12162,15388,11889,14667,
13986,11189,7099,1015 9,13623,15504,7883,13176,11213,
11637,14550,13660,13533,7630,8074,12767,11729,14645,
11948, 13710,13556,15398,8033,13234,15620,11867,7148,
14020,11240,13965,7802,13038,14090,11930, 14524,7965,
13914,11132,14785,6133,13681,7862,10107,13257,15409,
11514,8073,14553,14744,77 43,12796,13901,11678,7651,
13149,7920,14945,12057,14932,13734,10217,14145,7549,
7879,1163 0,14887,11704,14986,10214,14565,13627,7975,
13045,7637,14495,12108,7154,14756,13670,11190, 8128,
13258,7599,11391,14646,11971,15429,11746,14877,5887,
10173,12067,15624,11837,7101,1 5109,13988,11103,
14946,13531,11691,8009,13207,10999,14993,12104,
14669,13882,13721,15401, 4031,11954,14455,11941,7127,
14114,13792,15434,7854,13163,11635,12043,7102,13923,
11248,13 547,7658,13150,14208,11863,14936,11722,
13963,14675,13733,8020,10110,13046,15520,11516,79
12,14554,13437,10750,7865,13236,13647,11675,8082,
7804,14704,11892,14988,6134,14104,1022 5,13884,15367,
7644,14566,14727,10191,13959,11219,14000,7547,13265,
8036,14649,11732,1478 6,13673,11193,6137,7963,13211,
7885,12168,14878,12069,15874,14670,13910,7660,13260,
11629, 15412,11978,7131,14569,13722,11003,14891,
13599,12112,15110,8076,11214,14511,11693,14459,
14017,10220,15491,11883,7607,13049,14994,11953,7156,
13684,12058,7987,13165,11455,14948,1 1642,14677,
13495,13763,7893,9725,11869,15113,11760,7143,13737,
14556,14100,7982,13240,120 70,11931,7421,14650,13974,
11194,7791,12783,13550,11699,15441,4094,11974,14760,
6015,13932, 10203,13907,15404,8069,14731,13629,11119,
13717,11221,14113,7642,12991,7886,15009,11745, 14919,
13659,13926,7657,8024,11946,14691,15632,13855,11222,
14024,7861,13223,15430,12164, 7160,14623,13973,11167,
14519,6138,13266,13913,8097,12073,14570,15387,14461,
14893,7981,1 0174,13171,15552,11879,8011,13050,14996,
11687,14952,13534,11986,7775,7613,12791,11583,14 678,
11919,14652,13746,10226,15493,7891,13213,12060,
14577,12001,6911,13682,15114,13557,80 48,13166,11719,
14899,11515,7868,13766,11235,7668,13023,10171,11980,
15410,11641,7133,1468 1,14087,10215,13966,12128,7550,
14788,14148,11005,14733,13731,13925,7898,4095,11196,
11736, 14739,13769,13661,15448,7966,14543,12101,
13987,11127,13543,7979,13281,15876,11677,15010,
13879,11225,14894,6135,14116,7643,11960,15121,15436,
14768,13740,11237,8088,13173,15375, 11870,8007,13227,
14693,12053,14523,6140,13282,13688,11702,15498,8034,
11638,14572,15000,1 4032,10205,13944,15648,7611,
13268,14960,11885,7147,14923,13977,7666,13214,7907,
13052,12 088,15116,11927,15416,13558,7839,7994,10228,
13229,11487,15458,11956,7134,15041,13916,136
55,12176,7149,8081,14462,14093,11226,14578,13745,
10199,15399,4063,7866,14901,11723,1473 4,14209,13871,
11891,7989,14682,11985,14792,13675,11183,13930,7639,
13255,12099,11748,1469 4,13555,14741,13772,7799,
12074,14639,11694,14905,13738,11131,7909,13174,
15880,12081,8100, 11238,11835,14580,6139,13119,13971,
11518,15494,15433,14931,13630,11006,10222,14099,1561
9,7631,13235,14525,11705,14902,13993,13719,7894,8013,
12795,11949,15012,15505,13549,1412 8,15390,7665,
13177,12004,15444,11886,7103,14697,13938,8040,13272,
14048,11977,15042,7407, 13778,10751,14925,13903,8084,
10206,13039,15680,11725,7914,14551,15122,13990,
11644,8021, 13230,7653,14983,11933,14684,14146,10232,
7855,7900,12106,14755,12192,14742,13711,14800, 13748,
7990,15016,11731,7155,15137,13671,11228,8104,13284,
11897,11992,15405,12047,14698,6 127,13980,11639,
15500,12084,14926,13929,11241,14745,14102,15622,
7928,13259,11191,11894,1 4906,13765,13561,15457,8014,
12166,15124,11947,13800,14021,15888,7806,13178,
15442,11631, 7157,13886,11242,13662,8129,12797,14094,
11708,14933,15411,14210,14908,13937,7897,9727,13 237,
15522,12076,8071,14555,14647,7672,13261,13685,11734, 7993,8026,15044,12113,14934,137 77,10219,13996,15625,
7910,14937,11511,14987,10221,14757,13915,7655,13288,
8098,15128,1193 4,15138,13978,11133,7863,13180,7921,
12163,14947,11701,15383,14938,13562,11988,15508,1195
5,7039,14746,13726,11215,14567,14105,12102,7583,
11134,15024,12055,14989,13678,13752,1546 4,11737,
14584,11893,7150,14156,15406,8022,13238,11750,12002,
14705,13439,14019,8035,13794, 12082,14526,11615,
14115,14700,13885,8083,13151,15904,11943,7805,14990,
13739,11249,7646, 13047,14152,11706,15431,8130,12114,
14995,6079,14002,10227,13989,15497,7996,14671,14816,
13683,11195,14091,8078,13296,7867,14651,11979,14557,
13911,13770,7916,7659,11726,14706,12 170,15621,14949,
13564,8041,12798,15744,12129,7158,14758,13723,11244,
14761,13940,7614,11 898,14787,15413,14950,12061,
14879,10229,15634,11958,7887,13267,14571,12169,
14748,13780, 11839,8075,13241,11747,14679,12016,
14708,14216,14117,15521,11645,15111,11975,7161,
13677, 14653,14026,8112,13051,12071,11733,8025,14160,
11250,8038,13262,13741,12224,15875,11695,1 4558,
13931,9983,14001,15435,7913,14762,14106,11197,13503,
13690,7661,7922,14789,12105,14 573,13917,13808,15460,
8085,14895,15506,14118,11223,13979,7967,13242,15628,
11950,15169,13 747,11198,15140,6142,14022,7803,11754,
15048,15418,15170,14997,8136,13167,15389,12116,801
9,13269,15144,12008,15115,13793,11961,15553,7899,
12178,14953,11900,14940,13994,10230,158 77,7645,
13270,14769,11740,7162,15056,14212,8044,13215,11643,
15152,12132,15437,14121,786 9,10233,12059,15512,
11981,7135,15172,13927,13735,11756,8077,14683,14034,
11227,15233,1363 1,13967,15472,4093,12172,14579,
14108,14049,15633,7983,14998,11703,13767,11252,
13563,766 9,13283,15936,12083,14790,14028,14654,
13689,8099,11989,15011,15446,14954,14176,11239,813
2,13053,15417,12078,8028,15234,11517,15117,6143,
13244,13784,11887,15650,15556,14712,1476 4,10111,
14149,15882,7870,13175,15001,12165,15072,13725,8092,
7924,13273,11738,14903,11982, 15443,14008,15528,7662,
13285,11753,15414,12120,7164,15176,13918,14101,
11957,14961,7911, 13750,11256,14574,13686,10234,
15495,12193,8049,14695,14793,13933,12077,7995,14735,
12107, 15123,14136,13975,8037,11871,11709,14927,
13535,15014,14004,8089,14770,11987,15013,14224,
11007,7901,13274,15626,12144,15878,11964,14685,6111,
13771,11764,15636,15438,14581,13939, 11229,14033,
15524,7674,13231,14794,11646,15002,14147,13796,
15449,8102,11994,14956,15889, 14122,13742,15499,7615,
13179,15649,12062,7151,14699,14129,8144,13286,13883,
12075,14463, 15403,13566,14527,7991,10231,13054,
15461,11739,8042,15118,14743,13753,12184,7667,8086,1
4772,12103,14962,13997,10236,15554,8105,14907,12130,
14801,14052,15017,13934,8015,14582, 11707,15043,
14025,11243,7915,12799,11762,12003,15682,14686,
13773,11935,15420,12090,1493 5,13692,11230,15004,
13981,15884,7673,11245,12177,15126,14154,14240,
15501,15656,14796,119 62,13779,15459,8056,13276,
15536,12085,14585,13945,14040,7902,14095,11735,
15018,16000,13 687,14909,14132,8133,13289,15507,
11895,8090,14747,15139,7670,13239,13942,12005,15452,
80 50,12196,15125,14214,10235,13995,15640,8027,15045,
14701,14776,13679,7917,13290,8101,149 64,11727,15025,
13756,7997,8120,11990,14710,12109,15560,14759,14124,
15892,11761,7159,1480 2,13782,11199,15129,14161,
12136,15466,14586,11503,14707,13559,15510,12180,
14817,12010,14 910,13982,15684,7895,13181,12117,
11749,14749,14211,13749,15445,11951,14939,11996,
14036,1 4702,14003,8137,13263,15881,12086,7647,14150,
11251,8106,13182,14103,12200,15623,15391,1 4804,
13785,10223,13941,15906,7925,14991,15236,13798,
14050,8029,8052,15141,12024,14951,1 4130,13663,15502,
8160,15020,12110,15745,15046,13991,7998,13297,15523,
11902,14765,13754, 11253,15130,14162,7676,12225,
14588,15450,14709,14941,15568,11993,8116,13243,
15184,12167, 15026,14027,11768,7918,12089,15049,
12122,14968,13774,14218,15652,14818,12006,7163,
15142, 14177,8039,13292,11751,12194,15468,13946,8131,
14109,11959,15419,12017,14763,14006,1421 7,15513,
8113,15240,13887,11135,13795,14064,15905,7926,11679,
14750,13693,14023,15627,7423, 14559,15462,14119,
11246,13781,8087,13298,15890,12118,14999,14272,
15028,13743,8043,12131, 15171,15664,14955,14808,8138,
13245,15473,12179,7807,14791,11901,15132,14153,
11742,1552 5,15937,15145,12226,15050,10175,15584,
8108,13271,15057,12092,15173,13998,7929,13246,121
74,15052,11963,15422,13802,15638,12012,15688,11755,
7165,15200,14164,14056,12137,8079,14 009,11254,15146,
14226,13948,15509,11710,14942,13788,15530,8030,
15248,11983,13691,14180,8 145,15439,12171,15058,
14107,15032,14029,7551,14713,15760,14771,13804,
11257,7923,13275,1 5629,12208,15896,12121,15153,6141,
14220,12134,15465,16128,14655,14957,13751,15516,
8134, 13300,15148,12009,14820,14131,15681,8114,11757,
14766,12018,15908,14037,15474,8023,13287, 15635,
12181,7166,15174,14126,13565,12063,15003,15555,
13935,14824,10238,15447,11899,804 6,14575,14714,
14213,12232,8091,14795,12115,14958,13786,14030,
15746,11995,14963,13801,14 773,14168,7903,14716,
11741,14005,11258,8051,13304,15537,12140,15944,
15154,14241,11965,15 514,15630,14797,14125,11231,
14155,15879,7671,14832,12173,15005,13919,13757,
15526,15653, 15015,15476,14035,15415,8140,13055,
15557,12079,15060,14192,7930,14012,11765,15177,
15641, 13812,14965,8103,13277,15920,12195,8146,14687,
14803,13694,12228,15696,8057,12124,14774, 14042,
10239,15451,8093,15073,14587,14798,14110,8161,14778,
11966,14777,14123,7678,12188, 12020,16002,14805,
13787,15885,11758,14583,14232,11260,15019,14151,
15532,15562,12007,151 78,14178,15748,15463,15074,
12145,13755,15480,7932,13291,15644,12091,15235,
13810,14051,1 5938,12133,15006,15654,13983,15119,
14138,8054,13278,15421,12185,8109,15185,8148,13293,1
4225,11997,15891,15529,15156,10207,14010,15912,8045,
15064,15264,14133,8110,7919,15127,11 770,14703,13783,
15712,8152,15237,12198,15569,14966,13943,15657,
11711,15021,14053,11247,1 5180,14244,12240,15540,
14969,15047,15454,12087,14589,12138,15027,13775,
15637,7675,11763, 12182,15160,14038,14157,15511,
15238,12201,15022,13809,8115,13247,16004,12111,
15558,1418 4,8094,13551,12011,15752,15469,15076,
14228,14058,15683,8053,15186,14711,14165,13797,158
94,8135,11769,14780,13999,14044,15642,8162,14806,
15503,14819,14134,7871,13299,15883,121 52,14751,
14248,14821,8060,11998,15241,15538,15131,14809,
15576,12229,7999,14970,12186,15 080,14072,11766,
15952,15188,12146,15296,14158,15658,15201,12123,
15029,13950,8118,13301, 12013,12197,15467,14273,
16130,12093,15686,12216,15133,14041,14215,15561,
8139,13816,1125 5,14137,14170,15940,15907,15242,
14054,15588,8164,15051,15477,13799,14242,8121,15666,
119 91,15143,14007,14810,14065,7931,14972,15515,
15030,14590,8058,13183,15886,12233,16001,11 743,
15053,13727,12202,15407,15651,14911,15249,15776,
8149,13294,15134,12021,15147,14166, 8031,12125,14715,
12148,15544,14179,15689,15527,12256,7167,15033, 14227,13949,12094,15900, 13790,14767,14274,15478,
11772,14943,14140,15564,8107,14825,12212,14222,
14011,15660,120 14,15202,14060,15059,13803,8142,
14822,15909,14185,11259,7927,13302,15517,12135,
15570,15 244,13758,12227,16129,15897,15054,15149,
14031,15700,8168,14812,12209,15192,14219,15453,
15747,15175,12022,15665,15631,8124,13305,15482,
11519,15061,14256,14169,12183,15034,1580 8,14182,
15250,15585,12139,8047,15088,15204,14057,12234,8117,
11903,15155,13805,14066,156 85,15150,14775,14229,
8147,15265,12204,14111,7933,15533,12025,15914,14826,
13947,15475,16 016,14959,14280,11261,14163,15968,
15672,12175,15007,14043,15534,15698,15075,15939,
13789, 15893,8141,13306,15749,12126,15252,14188,
15639,12241,14799,15572,14013,15179,8176,1327
9,15471,11647,8122,14717,14221,12019,16008,15690,
14833,10237,15922,8061,15266,15157,141 27,8154,15062,
12230,15297,13813,15539,12210,15518,15208,14243,
15754,12119,14276,11262,1 4828,14172,15586,15668,
14967,15910,15559,15065,12142,14014,15481,7663,
15941,12187,15036, 14236,14068,16132,14779,15643,
15077,13806,8163,13308,15714,11999,15898,8150,14055,
1214 7,15692,15541,15181,14193,15655,8095,15256,
14718,14139,15921,8055,11767,15158,14181,157 61,8165,
15187,15565,15066,14233,15945,12236,14834,14045,
15216,12026,15592,15078,14781,1 5728,12199,14807,
12242,14971,13 818,15484,16032,12153,15268,14246,
15916,15023,12189,1375 9,8153,13295,15546,12257,
15756,14288,15948,11774,15661,16136,15239,14135,
14186,15470,79 34,15161,13811,14230,15571,15697,
14836,14249,15913,8170,15182,16006,14159,8119,15531,
12 028,15081,14059,15162,8156,15068,15600,14782,
15298,15762,12150,15956,12205,15272,13817, 12244,
15713,14811,15189,15646,15203,12141,14973,14200,
8111,12206,12015,15887,14046,1556 6,15750,12248,
15243,14277,14234,15542,16003,13814,14194,15924,
15669,14823,14171,16144,8 059,15031,15777,14061,
14245,15423,11771,15082,14141,15164,14264,8169,
15089,15946,15190, 8166,13303,15573,12211,15662,
15193,12190,15704,15545,14840,15135,15691,8125,
14591,12149, 15300,14039,15578,15245,12231,16009,
15895,15645,12258,15055,14281,13791,11967,15479,14
250,14813,15953,12156,15251,14069,15784,8062,12095,
14173,14196,15716,14974,15084,14304, 8177,15280,
16064,14142,8143,15667,12214,15563,15205,13820,
15928,15764,14827,15035,14260, 15589,15687,12235,
15090,14062,15519,15901,15194,15954,15753,8172,
13307,15812,12260,148 14,14183,12217,15304,15596,
14275,14719,15548,12027,7677,15246,14257,12154,
16137,15151,1 4070,15915,15312,13567,8155,15206,
12245,14231,16020,12127,15969,15253,14187,15673,
15577, 14282,11263,13951,15942,16160,15063,15486,
15778,14829,15693,14252,15587,8126,16012,122
03,15209,14073,15720,15037,15902,15267,8178,13309,
15659,12238,16134,14223,12023,15701,1 5809,15092,
15670,8123,15196,14835,14174,8167,12264,15067,14289,
15984,15574,15159,13695, 15911,12220,14067,15258,
15535,16010,15210,15768,15757,15254,12143,14278,
15972,15590,122 13,14838,14258,16131,15269,15702,
14167,8157,13310,15674,12243,16018,15923,12029,
15547,1 5824,15079,14190,15694,8180,15096,14235,
15580,15917,15217,15483,8151,14830,15715,14047,
15608,12237,15038,14195,15257,15960,14837,15212,
15751,12272,12218,15183,13815,16192,157 80,15328,
16033,14783,12157,14284,8174,15943,12250,15772,
14074,15705,15593,16040,15069,1 4247,14290,16133,
16005,14201,15676,15567,15163,14237,15926,8158,
15270,15970,14305,15810, 11759,15218,13822,15273,
8184,15299,15755,15083,15601,12259,15455,14841,
12246,15717,151 91,15260,16146,15070,12191,15165,
14076,15899,12151,15549,15947,15699,12261,14198,
14253, 15766,15594,14292,16024,15722,15301,14189,
15950,7679,16066,14254,14063,15575,15274,1522
0,14296,8171,14842,15663,8173,15925,12249,16140,
15085,15706,15976,15281,15302,15792,160 17,12030,
15091,13819,15602,15195,15763,15929,15724,12266,
15276,14259,12215,15550,14238, 15166,16145,12252,
15247,14197,15957,15918,14279,16168,15207,14306,
8179,14975,15816,1401 5,16034,12207,15671,15224,
14204,15708,15581,14815,14143,15758,15604,15282,
16068,16013,1 5086,16138,15962,8181,15729,12155,
15305,14262,14844,15949,15197,15782,12265,16193,
14283, 12262,15675,15093,15718,15306,14308,7935,
12221,14265,16036,15579,15255,14075,15930,157
69,14202,16162,15840,15211,15971,15595,15198,16256,
14293,16011,15781,12158,15094,14175, 15485,15284,
15695,8182,13311,16152,12273,15932,12239,16007,
16048,15313,15721,8185,15259, 14251,15958,15308,
15770,15647,14286,16065,12268,14071,15097,15732,
15213,15543,15811,11 773,14312,15785,16148,15288,
16022,14831,15598,14268,8063,15980,12251,15955,
15677,15765, 16161,15039,14191,15707,15974,14261,
15903,16072,15271,16021,8186,15314,15961,14291,1222
2,15219,14077,15098,15582,14839,15794,12274,15261,
15730,15605,15214,15814,15071,12219,1 4285,16135,
12263,16014,16196,15779,15973,14320,14266,15817,
15709,16035,15591,15329,1420 5,15927,8183,16164,
14298,15788,15221,15275,8188,15330,15736,16080,
12253,15992,15316,160 25,15262,15100,15606,12276,
15277,13807,15964,15703,16141,15793,12247,14307,
16257,15919, 14294,15723,15978,15303,14239,15603,
15820,14199,15786,15222,14309,8187,15167,16019,1567
8,12270,16147,15283,16041,15767,14843,15597,16176,
15225,15986,15320,16096,15826,15951,1 2254,15087,
14297,16038,15278,16194,12280,14078,15759,15796,
15719,15332,14314,8175,16028, 14263,15977,16150,
15307,14300,15813,15609,15848,16069,15226,15934,
15710,14845,16142,16 258,15985,11775,15285,14255,
15309,15733,15825,12267,16044,12269,15963,15336,
16026,15228, 14203,15610,15774,16153,14313,15726,
15800,14310,16204,15286,15487,16067,15842,14269,16
163,15933,15199,15787,15095,16200,8127,16050,12275,
16037,15731,16139,15344,15959,15818, 14206,15612,
14846,15771,15988,14321,12277,14287,15315,15828,
15289,16264,16165,15725,160 74,15099,16208,15310,
15789,14316,15979,12031,16049,16154,15551,15738,
13821,15965,15856, 16166,16027,15290,15795,8190,
16070,14299,15215,15317,15841,16042,12278,15318,
16260,1526 3,16169,12281,14270,15975,15783,16082,
15679,16015,14322,16156,16097,15815,15611,15331,1
4267,16076,15737,14311,16224,15101,8191,15292,15832,
12159,16197,15223,15773,15321,16056, 15333,15966,
16149,15798,15734,12282,14301,15981,16184,16023,
14324,15583,16052,16272,15 322,14295,8159,15819,
15987,16081,15279,16195,15844,16170,15790,15227,
16177,15334,15931, 15614,12279,15102,14318,15801,
16045,12284,16100,15982,16073,14847,14302,15821,
15740,160 29,14328,16202,16288,15827,15324,15993,
16088,16143,15735,16180,15337,15287,15990,16262,
12283,16043,15727,15338,15804,13823,16172,15830,
16209,14315,15607,14317,16030,15229,162 59,15797,
16084,16051,15311,16198,15230,16151,15833,12271,
15989,15846,16098,16178,15711, 16039,15345,15802,
16210,14323,15291,16075,15822,16266,16225,15340, 15994,16157,14325,16054,16265,15935,15843,16112,15741,16071,16167,15829,15346,16320,15791,14079,15293,16201, 12223,15319,16046,15294,15850,16212,16104,16057,16274,15996,14326,15836,15739,16228,14329,16155,16077,15852,15323,8189,16268,15799,15348,16179,16085,15335,16174,15613,15983,12286,14207,16261,15834,16078,15849,16216,16053,15352,14330,16289,16173,16203,15967,15805,16083,15103,16240,16060,15860,15325,15742,16090,12287,16158,16171,14327,15835,16280,16199,14332,16226,15803,15339,15858,16099,16031,16186,15326,15341,16273,12255,16058,16181,15831,15991,16101,16292,14331,15823,16086,16205,15857,15295,16232,15599,16276,16106,16213,15845,16047,16092,16182,15347,16296,14319,16120,16206,15998,15349,16321,16089,16263,15864,16185,16218,16102,15847,16290,16055,16113,15231,15775,15342,16214,16227,16275,15997,15838,16322,14271,16188,16270,16059,16108,15851,16233,15350,15806,16079,16267,15353,16304,16217,16230,16105,15853,16114,16277,16159,14334,15995,16328,16211,16091,15837,15354,16236,16061,15327,16269,12285,16175,15861,16291,16324,16220,14335,16062,16284,16116,15854,15356,16103,16241,16187,16229,16281,16093,14303,15866,16294,15807,15343,16336,16183,16234,15859,16278,16297,16207,16107,15865,16248,16094,16325,16282,15862,16242,16219,16109,16293,16189,16312,15351,16087,16329,15839,16298,16117,16221,16244,16352,16190,15868,16308,16110,15355,16231,16323,16305,16118,15615,16279,16235,16330,15999,16300,16121,15357,16271,16222,16337,15743,16115,14333,16326,16306,16215,15358,16238,16283,16095,16243,15863,16332,16122,16295,16338,16249,16285,16353,15870,16124,16246,16301,16340,16237,16302,16111,16344,15867,16307,16286,16245,16327,16354,16063,16252,16191,16310,16331,16356,16313,16123,16250,16341,16223,15359,16299,16334,16119,16360,16316,16239,16309,16339,16125,16333,16368,16314,16253,16346,15855,16355,16342,16287,16247,16357,16345,16126,16362,16311,16348,16303,16251,16361,16358,16317,16254,16369,16335,16364,15869,16347,16318,16370,16315,16359,16349,16372,16343,16366,16350,16376,15871,16363,16365,16371,16373,16127,16374,16377,16255,16378,16375,16380,16379,16367,16319,16382,16383,16351,16381]

Sequence Group 5: Z5_16384

[0,1,2,7,3,8,11,24,4,10,13,28,16,33,35,77,5,12,14,32,19,38,47,81,22,46,42,88,57,96,102, 168,6,17,21,40,23,45,51,90,29,55,59,97,72,111,117,188,34,61,75,115,80,124,134,200,87,136,147,227,152,239,260,389,9,18,26,54,30,58,71,105,36,76,62,118,84,128,141,209,44,74,86,135,92,144,151,233,100,154,170,251,186,269,289,436,53,89,98,150,112,161,179,266,122,180,199,281,211,306,325,477,138,207,230,312,236,326,352,512,257,361,382,540,403,568,617,889,15,25,31,73,39,79,82, 140,48,85,93,149,101,159,165,263,56,94,103,162,116,178,196,284,127,197,208,299,232,321,346,499,64,109,123,185,129,198,215,315,148,228,237,328,256,359,374,539,163,247,267,365,282,398,406,565,308,422,459,602,487,640,721,892,69,125,143,218,158,235,254,363,169,258,272,388,290,405,435,591,194,285,300,419,327,449,482,655,342,491,520,689,548,735,766,1044,214,316,336,465, 366,498,525,709,402,535,566,752,604,773,850,1140,431,577,618,812,635,873,907,1217,715,930, 966,1201,1009,1280,1387,1799,20,37,41,91,49,95,106,177,50,107,119,189,131,210,219,344,63,120,132,224,145,231,245,345,153,244,261,380,286,401,411,564,67,142,155,226,173,248,268,399,183,278,291,414,305,446,470,630,181,301,319,445,341,483,503,690,369,527,549,733,574,760,821,1113,78,167,174,275,192,297,317,437,201,324,333,479,353,510,533,730,259,347,368,518,391,545, 573,755,425,584,624,807,658,870,914,1190,296,384,415,559,444,601,628,853,473,648,670,887,722,946,978,1259,522,719,738,967,756,1011,955,1306,832,1101,1141,1409,1153,1549,1621,1892,83, 190,195,340,249,358,373,526,276,378,392,554,424,586,622,856,292,420,441,589,462,629,662,896, 492,673,708,937,753,974,1041,1324,343,447,468,661,501,698,744,957,552,745,768,1032,833,1005,1123,1423,599,796,863,1104,898,1151,1196,1500,948,1207,1205,1601,1312,1651,1713,2106,383, 489,529,747,585,771,820,1061,625,854,876,1144,925,1164,1203,1540,663,904,961,1191,987,1213, 1317,1655,1057,1332,1382,1726,1461,1822,1883,2333,731,969,1023,1320,1119,1327,1441,1759, 1137,1431,1511,1860,1581,1944,2071,2526,1169,1555,1643,1982,1693,2087,2028,2593,1792,2172,2234,2782,2364,2887,3037,3442,27,43,52,99,60,121,133,216,66,137,146,223,157,242,246,395,68, 156,166,241,175,298,309,430,203,311,339,474,355,505,531,750,70,172,191,304,205,337,349,496, 217,362,375,536,397,569,596,775,229,386,410,580,439,621,642,839,451,631,676,903,687,935,970, 1397,110,204,212,354,225,376,396,558,252,412,426,609,455,652,672,861,274,429,467,638,494,684,693,916,517,696,706,977,793,1012,1090,1427,293,493,508,704,544,740,749,995,572,792,824,1056,880,1114,1145,1516,607,848,899,1150,949,1187,1266,1587,1020,1277,1336,1656,1383,1733,1839,2312,113,221,243,407,271,427,461,657,288,471,497,697,523,713,724,989,323,509,542,728,571,786,815,1050,605,835,878,1134,917,1171,1236,1524,350,556,595,822,643,865,862,1174,664,905,932,1218,999,1271,1292,1666,712,951,1015,1281,1053,1348,1386,1763,1100,1417,1480,1861,1598,1959,2080,2548,371,615,650,909,692,945,1001,1278,783,1019,1067,1372,1075,1393,1455,1815,798,1070,1099,1439,1181,1476,1565,1941,1252,1590,1638,1991,1711,2124,2184,2614,837,1200, 1227,1527,1302,1605,1650,2049,1337,1706,1771,2164,1841,2247,2347,2810,1486,1776,1869,2263,1976,2381,2439,2995,2056,2500,2586,3083,2694,3245,3406,4041,130,253,279,472,320,507,538, 759,330,547,578,789,610,829,895,1239,364,597,656,857,678,942,922,1257,699,962,1007,1331,1062,1357,1402,1793,440,666,701,938,782,993,1025,1379,788,1066,1086,1404,1117,1456,1498,1905,800,1110,1161,1493,1249,1560,1629,2000,1287,1686,1709,2138,1774,2186,2287,2759,453,780,785,1054,805,1072,1131,1468,845,1184,1224,1543,1273,1616,1698,2095,1014,1244,1305,1635,1342,1727,1781,2177,1463,1788,1874,2269,1981,2367,2428,2989,1081,1346,1438,1731,1487,1855,1915,2307,1574,1954,2014,2423,2088,2506,2608,3151,1646,2065,2154,2583,2232,2667,2752,3268,2325,2793,2881,3386,2934,3587,3612,4472,466,808,828,1233,990,1264,1290,1680,1035,1329,1369, 1746,1452,1807,1898,2293,1093,1398,1483,1826,1535,1925,2019,2406,1620,2083,2008,2472,2178,2601,2693,3178,1253,1502,1559,1963,1663,2031,2144,2565,1721,2157,2228,2671,2278,2704,2819,3366,1843,2252,2342,2774,2444,2900,2972,3512,2522,3066,3131,3681,3253,3782,3814,4280,1343,1567,1714,2160,1801,2214,2253,2737,1889,2358,2387,2863,2482,2906,3089,3605,1910,2464, 2572,3058,2687,3154,3170,3804,2799,3277,3340,3885,3485,4062,4171,4774,2102,2649,2674,3226,2841,3288,3393,3932,2926,3505,3535,4150,3708,4179,4497,5010,3018,3658,3761,4338,3911,4394,4585,5215,3992,4635,4752,5388,4891,5534,5659,6334,139,114,65,287,104,264,184,524,126,187,206,456,222,360,329,600,160,220,240,338,265,417,377,705,307,393,434,567,478, 787,646,985,1 71,250,270,400,310,423,484,620,331,511, 450,890,553,669,716,1395,356,490,583,685,534,748,844, 1177,611,826,784,1031,915,1241,1076,1768,202,295,314, 464,351,504,562,726,387,637,513,767,5 98,801,872,1097, 421,551,681,840,647,976,823,1139,590,879,1010,1199, 940,1466,1279,2169,452, 677,614,926,774,894,1045,1226, 714,1111,965,1352,1028,1300,1683,1546,810,1059,1127, 1513,117 5,1373,1425,1820,1229,1593,1474,2069,1658, 2443,1942,2975,234,334,372,541,409,576,636,852,4 48,729,603,883,671,923,998,1318,480,644,776,936,707, 1088,968,1289,804,1034,1162,1385,1116,1 447,1573,1872, 519,758,688,1003,875,1064,1172,1415,843,1247,1091, 1704,1220,1508,1525,2010, 928,1158,1330,1571,1276, 1614,1749,2509,1410,1791,1671,2046,1895,2193,2285, 3108,570,791,90 2,1135,831,1179,1296,1589,956,1360, 1222,1852,1429,1636,1742,2135,1013,1265,1449,1689, 1541, 1783,1998,2225,1334,1930,1806,2404,2061,2330, 2590,3327,1069,1485,1583,1949,1370,1864,202 5,2646, 1649,2120,2206,2427,1890,2787,2528,4291,1712,2167, 2268,2740,2338,2606,2699,3573,20 78,2868,2941,3223, 3034,3940,3400,5443,283,394,428,639,485,739,674,984, 506,695,867,1042,778, 1106,1163,1472,560,813,751,1129, 871,1283,1079,1539,944,1185,1315,1603,1231,1813,1730, 2489, 606,885,830,1396,1022,1173,1237,1619,924,1269, 1345,1966,1435,1677,1785,2236,1055,1469,13 77,1850, 1585,1756,1980,2322,1521,1928,2038,2379,2134,2542, 2768,3202,654,1122,913,1304,971, 1496,1356,1866,1080, 1413,1553,1797,1613,1945,2053,2446,1194,1690,1526, 2198,1459,1973,203 3,2711,1790,2118,2250,2552,2328, 2639,2886,3645,1263,1725,1607,2072,1836,2176,2385, 2838,19 58,2469,2211,2732,2276,3077,2958,3533,1653, 2356,2603,3015,2504,2907,3303,3499,2675,3234,3 110, 3860,3457,3746,4069,5590,742,1000,1148,1467,1225, 1533,1744,2091,1299,1879,1577,2161,1 673,2018,2336, 2829,1103,1633,1717,2270,1859,2544,2204,2779,2016, 2411,2486,3042,2115,3274, 2948,4482,1401,1764,1943, 2629,2100,2436,2370,3196,1829,2516,2749,2994,2664, 3091,3382,377 0,2258,2717,2596,3137,2832,3592,3300, 3908,2960,3413,3664,4145,3540,4025,4595,5006,1481,19 74,2151,2511,1881,2866,2612,3221,2314,2637,3025,3351, 2743,3449,3693,4255,2047,2913,2805,3 481,3063,3758, 3559,4210,3254,3623,3966,4109,3853,4748,4534,5276, 2419,3158,2980,3735,3371, 4312,3634,4446,2875,3977, 3819,4572,3882,4672,4888,6721,3119,4277,4155,5043, 4056,4813,516 0,5754,4421,5103,4981,6035,5344,7320, 5855,7906,370,458,532,765,593,795,869,1167,633,980,83 4,1322,919,1215,1389,1739,679,881,1048,1246,959,1531, 1309,1811,1108,1454,1609,2191,1421,1 873,1961,2561, 723,1038,988,1366,1124,1443,1588,2003,1251,1696,1510, 1908,1665,2062,2299,27 27,1189,1626,1558,2045,1755, 2242,2142,2654,1857,2274,2409,3394,2454,2986,2885, 3733,818,10 65,1235,1528,1365,1596,1935,2113,1160, 1641,1778,2196,1676,2365,2217,2808,1341,1824,1875,2 537,1719,2296,2479,3023,2086,2573,2353,2924,2709, 3117,3293,4024,1519,1924,2145,2425,2022, 2631,2554, 3193,2251,2855,2734,3098,2535,3313,3431,3946,1995, 2897,2798,3358,3045,3626,351 3,4222,2684,3490,3713, 4708,3843,4528,4390,5482,933,1391,1212,1751,1294, 2129,1699,2461,155 2,1808,2012,2433,1952,2346,2624, 3204,1515,2260,2040,2761,1921,2570,2525,3320,2210, 2692,29 31,3128,2850,3461,3582,4165,1661,2105,2319, 2645,2400,3007,2817,3655,2122,2778,3165,3523,2 915, 3419,3811,4322,2462,3101,3005,3602,3330,3988,3724, 4456,3282,3838,4192,4559,4051,4768, 4864,6122,1845, 2495,2221,2977,2345,2877,3141,3748,2562,3438,3080, 3686,3231,3873,3968,460 9,2682,3362,3200,4037,3599, 3926,4264,5249,3491,4411,4077,4735,4324,4955,5136, 5717,2800,32 14,3635,4156,3428,4231,4437,4902,3833, 4664,4302,5077,4569,5186,5371,5970,3737,4459,4674,5 600,4875,5296,5431,6402,4368,5518,5791,6262,5907, 6534,6906,8201,1112,1453,1355,2030,1600, 2127,1968, 2621,1678,1903,2348,3016,2244,2715,2888,3494,1761, 2290,2182,2771,2519,3295,285 9,3614,2452,2952,3106, 3870,3212,3718,4090,4695,1937,2546,2417,2983,2658, 3071,3127,3757,23 04,3183,3380,4097,3551,4011,3938, 4805,2789,3392,3643,3917,3502,4202,4335,5030,3318, 4423,4 168,4923,4549,5198,5331,6152,2097,2372,2822, 3370,2627,3265,3611,4122,2997,3790,3469,4015, 2968, 4266,4379,5068,3087,3563,3668,4723,3830,4311,4504, 5656,3980,4645,4425,5176,4841,530 5,5566,6317,3242, 3705,4134,4513,3862,4933,4650,5395,4287,4582,5033, 5466,4759,5959,5682,64 87,4048,4913,5165,5726,5307, 6085,5932,6788,5126,5821,6274,7063,6136,6644,7197, 8428,2429,2 725,2894,3590,3176,3960,3521,4414,3069, 3727,3695,4619,3896,4782,4557,5544,3337,4180,3841, 4525,4299,4687,5044,5452,4118,4946,5152,5693,4874, 5833,6069,6775,3471,4001,4447,4826,423 6,5187,4994, 5805,4344,5057,5281,6368,5507,5936,5969,7011,4642, 5419,5642,6059,5359,6500,61 88,6942,5201,6247,6620, 7478,6460,7130,7422,9139,3767,4399,4540,5404,4836, 5149,5629,6098,4 719,5272,5478,6214,5780,6590,6392, 7231,5017,5576,5808,6523,5943,6304,6758,7638,5985, 6878, 6655,7355,6957,7583,7772,9613,5321,5844,6111, 6747,6237,6802,7100,7491,6432,7088,6931,793 0,7291, 7942,7717,8911,6617,7220,7450,8064,7612,8134,8296, 8618,7798,8324,8485,8776,8643,10 303,9327,9483,108, 164,176,273,193,277,318,442,213,302,335,475,379,516, 537,803,238,322,348,5 14,404,550,619,817,433,616,582, 858,683,901,939,1245,255,381,416,575,438,613,649,866, 486,667, 694,906,770,979,1016,1328,521,710,794,1002, 814,1043,1087,1375,855,1095,1146,1484,1178,153 2,1612, 2050,294,385,463,660,495,691,764,954,543,799,717,1018, 846,1063,1128,1414,592,790,85 1,1092,888,1138,1166, 1501,927,1188,1255,1570,1321,1640,1715,2195,659,859, 911,1157,983,1210, 1288,1632,1033,1293,1371,1682,1419, 1767,1831,2311,1105,1408,1491,1795,1512,1834,1920,241 6,1595,1957,2021,2494,2090,2578,2714,3397,357,460,502, 777,561,809,825,1126,623,847,893,115 2,931,1204,1230, 1623,680,897,943,1214,1008,1285,1358,1697,1058,1359, 1412,1747,1495,1823,1 906,2382,725,972,1037,1316,1068, 1364,1430,1805,1147,1488,1518,1842,1592,1951,1996, 2493,12 19,1557,1634,1972,1688,2076,2099,2571,1775, 2150,2267,2673,2351,2775,2982,3402,757,1047,11 33,1440,1198,1507,1582,1965,1250,1599,1652,2044,1716, 2096,2190,2644,1350,1701,1748,2143,1 835,2233,2327, 2813,1894,2361,2442,2903,2518,3021,3097,3753,1428, 1810,1878,2281,1977,2378, 2458,2949,2089,2485,2575, 3059,2680,3116,3302,3955,2180,2602,2716,3211,2758, 3357,3434,4117, 2965,3489,3568,4085,3670,4251,4469, 5243,408,546,579,884,626,900,958,1282,632,963,1021,133 3,1078,1418,1446,1900,720,1026,1082,1473,1142,1494, 1551,1902,1183,1550,1617,2015,1703,208 4,2117,2569, 746,1132,1192,1479,1267,1562,1639,2077,1308,1670, 1722,2126,1766,2223,2294,274 7,1298,1754,1817,2219, 1893,2335,2389,2905,1984,2465,2524,3019,2595,3079, 3233,3902,806,124 0,1268,1660,1344,1741,1812,2197, 1376,1828,1863,2318,1926,2408,2478,3011,1606,1907, 1979,24 35,2052,2508,2594,3067,2159,2620,2730,3199, 2821,3348,3448,4065,1737,2029,2133,2558,2216,2 672, 2739,3308,2302,2797,2847,3391,2985,3529,3601,4208, 2450,2974,3029,3570,3068,3673,3546, 4309,3260,3877, 3957,4510,3984,4780,4919,5406,842,1338,1354,1888, 1564,1948,1994,2460,1664, 2009,2058,2541,2158,2628, 2724,3316,1724,2147,2209,2636,2275,2742,2828,3411, 2363,2856,294 7,3509,3060,3589,3745,4342,1899,2224,2289,2827,2384,2923,3041,3550,2534,3043,3105,3723,3262,3662,3923,4536,2663,3171,3334,3881,3417,3979,4076,4686,3532,4095,4093,4881,4320,4968,5 087,5774,2024,2355,2467,3047,2626,3114,3230,3787,2731,3310,3367,3964,3478,4010,4089,4765, 2831,3427,3558,4067,3622,4108,4329,4977,3779,4356,4458,5109,4614,5283,5392,6148,3013,357 8,3700,4334,3914,4346,4576,5173,3948,4555,4707,5353,4838,5501,5711,6452,4021,4790,4953,5561,5053,5737,5640,6548,5232,5879,5989,6837,6194,6992,7205,7767,469,587,653,918,703,1030,1 083,1433,741,1096,1143,1471,1197,1544,1556,2068,754,1193,1234,1538,1274,1743,1782,2175,13 88,1789,1886,2303,1934,2393,2474,3052,761,1262,1340,1762,1400,1880,1912,2375,1434,1964,20 01,2487,2074,2580,2656,3124,1489,2037,2112,2610,2202,2722,2777,3279,2241,2748,2865,3425,2 896,3501,3579,4488,975,1394,1424,1927,1478,2002,2070,2551,1575,2119,2165,2691,2255,2807,2 854,3326,1657,2173,2288,2767,2369,2891,2912,3456,2432,2919,2940,3598,3164,3675,3850,4546, 1729,2368,2401,2936,2507,3033,3050,3641,2588,3163,3241,3777,3377,3904,3965,4718,2688,329 8,3418,3976,3536,4058,4221,4850,3692,4241,4364,4978,4463,5122,5316,6116,992,1458,1545,210 4,1647,2166,2273,2820,1710,2295,2376,2921,2451,2957,2993,3630,1827,2407,2501,3004,2587,3148,3219,3765,2681,3269,3369,3943,3458,4023,4162,4733,1914,2549,2653,3238,2784,3336,3329,4 032,2835,3430,3496,4119,3650,4229,4276,5000,2956,3538,3683,4252,3769,4386,4467,5182,3872, 4524,4647,5355,4873,5524,5724,6483,1988,2708,2803,3436,2911,3527,3654,4243,3143,3691,379 8,4442,3816,4480,4603,5269,3175,3805,3869,4571,4045,4639,4809,5492,4196,4860,4945,5574,5084,5804,5901,6584,3271,4083,4141,4742,4298,4887,4966,5678,4365,5075,5196,5868,5320,6007,6 171,6875,4659,5205,5368,6031,5551,6221,6314,7150,5689,6404,6536,7273,6703,7499,7714,8533, 1074,1576,1675,2298,1818,2399,2491,3076,1849,2515,2605,3156,2696,3252,3409,4167,1971,266 0,2815,3317,2874,3520,3468,4206,2927,3560,3666,4354,3788,4410,4498,5234,2203,2837,2929,3511,3139,3639,3704,4454,3155,3796,3840,4500,3912,4605,4682,5427,3180,3894,4000,4671,4188,4 800,4931,5589,4263,5041,5079,5829,5200,5903,6071,6806,2248,3135,3146,3774,3192,3807,3937, 4626,3292,4053,4131,4770,4233,4909,5062,5751,3682,4178,4307,4940,4374,5111,5212,5889,461 6,5223,5378,6042,5559,6199,6298,7140,3829,4384,4568,5120,4661,5343,5448,6106,4825,5515,5614,6288,5739,6416,6573,7364,4957,5702,5853,6532,5984,6664,6796,7527,6135,6850,6982,7687,7 058,7957,7993,9053,2283,3201,3251,4154,3632,4217,4272,5029,3732,4351,4434,5148,4594,5256, 5416,6082,3858,4490,4652,5293,4756,5465,5625,6261,4917,5728,5602,6363,5891,6560,6701,740 4,4198,4691,4798,5530,4991,5648,5838,6508,5100,5857,5979,6669,6056,6717,6890,7662,5325,6016,6161,6825,6323,7008,7114,7858,6443,7246,7340,8077,7509,8209,8251,8827,4376,4811,5089,5 862,5245,5956,6018,6772,5401,6185,6232,6956,6377,7017,7283,7983,5438,6352,6517,7233,6691, 7368,7391,8237,6861,7540,7632,8344,7822,8560,8694,9400,5764,6640,6674,7474,6926,7554,769 8,8398,7046,7848,7887,8668,8116,8704,9081,9664,7179,8049,8184,8894,8372,8963,9188,9885,8479,9241,9374,10068,9531,10221,10350,11014,1120,996,736,1707,952,1624,1313,2456,1051,1325, 1405,2256,1464,1955,1847,2669,1208,1450,1536,1884,1630,2139,2006,2937,1772,2059,2187,257 6,2316,3152,2790,3619,1260,1568,1644,2081,1786,2155,2339,2720,1853,2413,2238,3398,2539,28 44,2969,4484,1938,2359,2617,2892,2483,3048,3289,4038,2697,3247,3144,3720,3454,4173,3817,5191,1380,1734,1802,2279,1918,2390,2566,3000,2042,2765,2420,3103,2661,3181,3355,3867,2148, 2531,2882,3280,2794,3594,3239,3953,2641,3373,3671,4081,3516,4621,4248,5875,2245,2870,270 5,3482,3121,3407,3754,4138,2962,3898,3566,4397,3711,4295,5036,4775,3207,3783,3929,4713,40 33,4443,4542,5279,4147,4866,4636,5708,4983,6319,5496,7118,1505,1870,1992,2498,2109,2599,2 763,3306,2230,3009,2677,3383,2852,3473,3647,4330,2323,2785,3125,3507,2945,3846,3575,4268, 3189,3730,4006,4465,3909,4587,4822,5373,2440,3073,2901,3659,3364,3792,4027,4520,3285,418 5,3855,5073,4124,4702,4737,5608,3486,3994,4352,4818,4239,4906,5155,6421,4511,5230,5012,56 73,5411,5916,6067,7309,2584,3160,3423,3944,3258,4042,4285,4857,3547,4417,4127,5339,4552,4 941,5139,5825,3679,4218,4590,5047,4766,5216,5585,5974,4360,5474,5253,6257,5696,6143,6543,7614,3802,4657,4843,5508,4439,5360,5635,6636,4964,5798,5941,6295,5402,6842,6454,8840,508 5,5872,6039,6778,6156,6569,6709,7939,5722,6964,7069,7470,7201,8410,7705,10132,1694,2066,2 170,2772,2343,3030,2861,3617,2397,2917,3342,3750,3132,3887,4008,4632,2559,3216,3056,3933, 3353,4257,3822,4761,3525,4054,4326,4883,4151,5266,5117,6387,2685,3387,3256,4486,3697,4029,4163,4915,3475,4226,4381,5535,4563,5024,5219,5991,3775,4627,4452,5337,4846,5169,5557,61 31,4728,5471,5661,6218,5823,6473,6817,7442,2811,3919,3445,4305,3584,4678,4407,5363,3826,4 516,4787,5239,4904,5502,5684,6325,4072,5049,4739,5926,4610,5546,5650,6730,5228,5793,6012, 6489,6140,6625,6989,8032,4214,5107,4893,5712,5311,5887,6228,6921,5520,6358,5952,6765,6053,7265,7094,7884,4973,6183,6566,7174,6412,7018,7578,7839,6675,7484,7312,8313,7787,8166,85 70,10283,3038,3651,3972,4623,4136,4753,5144,5744,4293,5385,4831,5863,5015,5622,6153,6908, 3879,4937,5093,6043,5351,6477,5938,6832,5619,6270,6383,7211,5789,7535,7078,9064,4495,518 3,5498,6609,5760,6309,6204,7432,5299,6434,6791,7146,6659,7285,7682,8194,6023,6741,6553,7346,6912,7964,7572,8368,7096,7725,8055,8662,7894,8515,9199,9658,4648,5548,5848,6424,5389,6 961,6579,7467,6118,6622,7188,7645,6782,7778,8095,8796,5675,7028,6868,7817,7241,8180,7920, 8741,7510,8005,8447,8623,8304,9369,9126,9952,6283,7374,7126,8153,7669,8865,8018,9023,697 5,8461,8257,9173,8339,9290,9526,11374,7324,8822,8673,9699,8551,9447,9826,10448,8995,9764,9632,10725,10026,11902,10546,12392,1985,2264,2475,3094,2650,3168,3345,4017,2754,3607,326 6,4339,3463,4114,4473,5134,2878,3378,3762,4183,3555,4749,4315,5262,3890,4601,4896,5912,45 32,5375,5526,6502,2991,3740,3628,4430,3924,4578,4855,5595,4194,5059,4704,5434,4996,5698,6 092,6756,4063,4926,4796,5669,5167,6001,5835,6646,5348,6049,6267,7699,6338,7135,6987,8149, 3227,3794,4158,4743,4428,4871,5484,5787,3997,4950,5207,5921,5019,6195,5962,6873,4372,528 9,5379,6468,5096,6088,6373,7185,5735,6518,6178,7043,6726,7321,7562,8514,4725,5462,5839,62 92,5631,6612,6492,7427,6014,6946,6768,7295,6466,7592,7752,8416,5581,7003,6858,7653,7215,8 009,7859,8757,6687,7827,8121,9331,8291,9121,8957,10170,3497,4476,4105,5158,4282,5814,506 3,6347,4785,5257,5610,6305,5513,6168,6600,7445,4716,6026,5664,6808,5457,6514,6448,7604,5950,6699,7053,7336,6939,7792,7951,8686,4987,5770,6126,6634,6252,7165,6886,8045,5801,6830,7 385,7872,7031,7736,8246,8875,6349,7300,7163,7978,7618,8473,8138,9034,7546,8283,8719,9160, 8546,9392,9501,10813,5327,6398,5967,7121,6166,6977,7351,8168,6504,7761,7268,8084,7480,83 29,8450,9212,6685,7657,7437,8528,7975,8391,8806,9920,7829,8984,8582,9357,8877,9602,9800,1

0410,6862,7458,8020,8675,7749,8766,9013,9543,8278, 9279,8853,9734,9170,9855,10050,10663,8 156,9038,9292, 10292,9512,9976,10119,11081,8930,10202,10483,10950, 10599,11202,11543,12623, 3900,4599,4402,5644,4877, 5811,5538,6595,5026,5424,6172,7176,6003,6736,6993, 7834,5179,607 7,5897,6821,6438,7566,6951,7995,6335, 7083,7305,8325,7456,8129,8597,9315,5487,6480,6281,7131,6651,7254,7334,8178,6101,7410,7680,8606,7911,8500, 8406,9438,6845,7695,8029,8379,7843,8 731,8890,9685, 7601,8999,8689,9567,9147,9867,10011,10840,5756,6207, 6896,7667,6604,7523,79 89,8637,7152,8219,7802,8504, 7109,8808,8944,9725,7278,7925,8060,9345,8273,8863, 9089,10345, 8464,9254,9001,9844,9478,9986,10258, 10996,7494,8111,8650,9101,8316,9578,9259,10075,8833, 9183,9689,10156,9381,10652,10374,11158,8541,9556, 9833,10418,9988,10778,10624,11435,9789, 10513,10960, 11684,10827,11302,11799,12797,6299,6754,6999,7961, 7400,8437,7870,8989,7251,8 143,8097,9222,8356,9410, 9157,10232,7627,8705,8289,9116,8849,9306,9700,10141, 8632,9593,98 20,10384,9511,10524,10759,11423,7804, 8490,9025,9463,8772,9857,9645,10497,8900,9712,9956, 11049,10192,10630,10662,11632,9249,10105,10332, 10749,10039,11169,10872,11575,9870,10936, 11281, 12035,11131,11739,11990,13318,8190,8968,9135,10086, 9472,9815,10320,10791,9341,9946, 10166,10902,10472, 11253,11073,11829,9670,10268,10501,11193,10635, 10985,11407,12170,1067 6,11514,11312,11933,11588, 12123,12282,13647,10001,10536,10803,11397,10927, 11447,11715,12 046,11108,11706,11566,12412,11876, 12420,12234,13158,11277,11821,12012,12518,12148, 12570, 12694,12942,12303,12716,12840,13060,12961, 14091,13450,13558,182,262,280,413,303,418,476, 641, 332,454,500,682,555,734,762,1098,367,481,515,732,588, 779,868,1118,627,864,819,1168,950, 1223,1270,1642,390, 557,608,811,634,860,908,1180,700,929,964,1228,1060, 1319,1361,1738,743,9 81,1089,1347,1115,1399,1448,1798, 1165,1460,1520,1923,1561,1983,2079,2589,443,563,668, 921,7 11,960,1049,1286,769,1094,991,1363,1154,1420, 1499,1840,836,1084,1159,1457,1206,1509,1547,1 946, 1254,1572,1654,2027,1732,2108,2199,2751,920,1170, 1232,1534,1323,1597,1692,2101,1384,1 700,1794,2162, 1846,2262,2334,2889,1475,1833,1933,2291,1960,2337, 2438,3006,2057,2481,2553, 3092,2632,3187,3339,4098, 528,665,718,1071,797,1107,1130,1497,874,1155,1211, 1529,1258,1591, 1622,2092,947,1216,1275,1602,1351, 1687,1777,2179,1416,1779,1838,2235,1940,2321,2418, 2967, 1004,1307,1390,1728,1426,1784,1862,2301,1523, 1929,1967,2349,2054,2473,2523,3090,1608,201 3,2103, 2497,2168,2615,2643,3179,2271,2703,2834,3296,2932, 3412,3644,4103,1040,1403,1504,18 76,1586,1953,2039, 2490,1648,2064,2121,2582,2200,2638,2746,3264,1765, 2183,2237,2695,2341,2 801,2908,3451,2405,2943,3036, 3553,3123,3687,3773,4493,1858,2306,2386,2849,2503, 2964,3054, 3606,2630,3082,3184,3726,3304,3791,3993, 4710,2733,3213,3341,3897,3395,4061,4144,4890,3625,4203,4290,4854,4400,5032,5265,6084,594,772,816,1202, 877,1221,1291,1684,886,1295,1368,17 45,1437,1844,1882, 2412,994,1374,1442,1911,1514,1936,2005,2415,1566, 2004,2085,2545,2185,26 23,2666,3177,1027,1503,1578, 1917,1667,2017,2107,2616,1718,2146,2205,2676,2259, 2788,2867,3 381,1705,2243,2313,2783,2403,2914,2976, 3554,2510,3062,3130,3685,3205,3752,3922,4655,1102, 1637,1668,2132,1758,2227,2308,2753,1800,2331,2371, 2899,2445,2998,3075,3677,2073,2422,250 5,3028,2591, 3111,3203,3736,2712,3237,3361,3884,3462,4052,4161, 4828,2222,2564,2683,3166,27 80,3294,3372,4003,2876, 3433,3495,4092,3649,4247,4328,4982,3044,3636,3694, 4292,3738,4404,4 265,5092,3951,4630,4712,5306,4747, 5594,5743,6254,1149,1750,1770,2396,2020,2470,2521, 3055, 2137,2536,2597,3150,2710,3246,3352,4014,2208, 2700,2770,3255,2842,3376,3472,4113,2944,350 6,3604, 4224,3728,4313,4483,5127,2410,2792,2860,3470,2971, 3577,3707,4271,3142,3709,3781,44 62,3952,4391,4673, 5336,3287,3852,4036,4634,4121,4741,4842,5500,4250, 4865,4863,5705,5104,5 797,5923,6643,2557,2935,3064, 3714,3244,3789,3918,4527,3363,4005,4068,4722,4191, 4773,4859, 5577,3477,4135,4279,4830,4350,4880,5114, 5807,4519,5143,5255,5947,5418,6128,6238,7027,3678,4301,4436,5119,4665,5132,5383,6011,4701,5358,5523, 6202,5660,6355,6576,7343,4781,5607,57 81,6420,5884, 6606,6501,7441,6074,6753,6866,7735,7075,7890,8107, 8672,675,827,912,1242,973, 1378,1444,1865,1024,1462, 1517,1909,1584,1997,2011,2607,1036,1579,1628,1990, 1672,2229,227 7,2729,1814,2284,2395,2880,2453,2981, 3070,3719,1046,1662,1753,2254,1825,2388,2426,2959,1868,2488,2527,3084,2613,3188,3278,3800,1931,2574,2659, 3222,2760,3350,3414,3967,2809,3385,3 514,4133,3545, 4216,4303,5286,1311,1819,1851,2447,1916,2529,2609, 3159,2032,2668,2718,3315, 2823,3443,3504,4026,2128, 2726,2858,3405,2953,3541,3564,4170,3024,3572,3597, 4323,3844,440 6,4598,5347,2213,2951,2990,3591,3109, 3699,3717,4369,3197,3842,3931,4518,4078,4656,4724,5533,3312,3989,4123,4736,4254,4820,4999,5672,4426,5021, 5151,5809,5260,5960,6165,6997,1335,1 896,1999,2648, 2114,2719,2840,3460,2192,2869,2961,3574,3046,3615, 3657,4358,2329,2996,3100, 3669,3195,3825,3907,4505, 3305,3959,4070,4696,4172,4783,4934,5545,2430,3157, 3275,3927,342 0,4040,4031,4793,3480,4140,4211,4892, 4378,5007,5061,5832,3613,4256,4415,5034,4509,5177,5264,6021,4625,5324,5453,6203,5694,6380,6591,7372,2514, 3333,3439,4146,3562,4245,4383,5023,3 820,4424,4541, 5237,4558,5277,5409,6112,3857,4548,4620,5377,4806, 5444,5628,6346,4970,5681, 5773,6433,5919,6673,6774, 7477,3961,4852,4912,5554,5083,5710,5795,6541,5153, 5908,6036,674 0,6170,6884,7049,7773,5468,6047,6215, 6907,6409,7106,7198,8052,6552,7297,7429,8177,7600,8403,8619,9434,1432,2034,2153,2873,2315,2988,3088,3747, 2357,3118,3218,3834,3319,3941,4111,4 939,2496,3283, 3453,4016,3522,4237,4181,4980,3581,4281,4395,5141, 4529,5204,5295,6076,2762, 3484,3583,4225,3815,4367, 4441,5250,3832,4539,4586,5297,4663,5410,5495,6280, 3861,4646,476 4,5483,4962,5618,5755,6451,5045,5871, 5914,6696,6041,6776,6948,7703,2816,3812,3824,4514,3876,4550,4690,5430,3983,4814,4903,5583,5011,5733,5894, 6621,4413,4949,5091,5767,5164,5949,6 052,6762,5420, 6065,6224,6917,6418,7080,7182,8042,4575,5175,5372, 5958,5470,6193,6303,6986, 5647,6369,6476,7173,6608, 7308,7466,8270,5786,6565,6722,7423,6860,7559,7692, 8434,7016,774 8,7881,8593,7960,8862,8897,9943,2851, 3886,3939,4924,4359,4993,5056,5861,4471,5137,5227,5988,5400,6097,6266,6960,4608,5288,5459,6139,5567,6322, 6486,7149,5741,6597,6465,7250,6764,7 455,7598,8312, 4972,5506,5616,6385,5822,6511,6706,7396,5937,6728, 6855,7564,6932,7613,7789, 8568,6176,6893,7040,7723, 7208,7907,8017,8763,7333,8152,8242,8986,8414,9113, 9156,9722,516 6,5630,5925,6734,6086,6829,6895,7666, 6248,7064,7117,7857,7264,7917,8187,8887,6291,7238,7407,8140,7589,8275,8301,9144,7757,8446,8538,9246,8728, 9460,9590,10280,6633,7532,7570,8376, 7826,8460,8602, 9302,7948,8754,8793,9564,9022,9599,9973,10533,8081, 8953,9085,9785,9276,98 54,10072,10746,9378,10128, 10254,10923,10407,11070,11190,11818,1490,1339,1017, 2189,1284,2 093,1723,3051,1407,1736,1830,2824,1901, 2477,2354,3291,1594,1887,1987,2392,2098,2690,2533, 3593,2266,2598,2741,3185,2895,3828,3426,4347,1659,2023,2111,2619,2282,2707,2920,3347,2362,3003,2806,4099,3147,3492,3631,5282,2459,2939,3232,3542,3078,3715,3978,4799,3321,3936,3821,4457,4166,4944,4560,6030,1804,2218,2297,2846,2434,2978,3174,3665,2579,3403,3012,3778,3284,3863,4059,4617,2701,3138,3531,3969,3429,4319,3928,4706,3261,4075,4401,4849,4232,5426, 5028,6748,2814,3519,3328,4197,3797,4107,4494,4910,3621,4651,4288,5188,4448,5080,5867,5588,3893,4523,4681,5529,4794,5238,5342,6123,4918,5688,5441,6572,5816,7204,6351,8023,1950,2377,2517,3096,2655,3210,3401,3999,2796,3674,3301,4084,3500,4187,4375,5116,2904,3421,3801,4220,3600,4593,4297,5052,3871,4468,4769,5261,4660,5393,5643,6220,3032,3744,3549,4388,4066, 4535,4789,5319,3975,4958,4604,5905,4898,5516,5550,6470,4200,4757,5138,5639,5018,5729,5995,7315,5308,6072,5842,6535,6260,6789,6943,8212,3191,3839,4130,4697,3949,4803,5069,5679,4267,5211,4900,6189,5354,5769,5978,6692,4409,4995,5396,5878,5578,6057,6447,6849,5147,6331,6095,7145,6559,7024,7436,8519,4545,5464,5666,6362,5233,6209,6497,7528,5792,6668,6814,7180, 6249,7741,7344,9733,5920,6745,6915,7673,7035,7463,7608,8845,6588,7865,7971,8373,8103,9313,8612,10980,2174,2604,2723,3410,2922,3696,3510,4345,2984,3569,4046,4489,3809,4640,4771,5437,3167,3903,3722,4685,4057,5040,4567,5573,4242,4815,5110,5706,4921,6109,5955,7277,3309, 4088,3947,5284,4433,4791,4935,5738,4189,5004,5172,6390,5367,5856,6060,6867,4515,5432,5247,6186,5668,6008,6415,7012,5542,6329,6521,7102,6690,7363,7713,8348,3447,4670,4157,5088,4308,5491,5199,6211,4570,5315,5603,6081,5727,6356,6547,7209,4837,5880,5552,6800,5415,6403,6512,7625,6070,6663,6889,7378,7022,7516,7888,8936,4990,5945,5715,6578,6160,6760,7113,7821, 6376,7245,6826,7661,6929,8170,7999,8790,5803,7061,7460,8076,7304,7918,8483,8746,7571,8386,8214,9215,8693,9067,9470,11125,3703,4380,4732,5428,4908,5564,5983,6615,5078,6231,5654,6735,5845,6484,7033,7808,4631,5763,5930,6919,6200,7367,6812,7731,6482,7158,7272,8115,6656, 8442,7982,9955,5292,6022,6353,7503,6630,7193,7086,8337,6147,7326,7686,8048,7553,8188,8588,9096,6901,7636,7448,8250,7811,8870,8478,9272,8001,8630,8962,9560,8801,9416,10082,10529, 5454,6405,6716,7317,6235,7863,7473,8371,6998,7514,8090,8550,7676,8682,9004,9694,6537,7928,7766,8723,8148,9082,8826,9637,8415,8908,9349,9519,9206,10250,10016,10812,7169,8282,8028,9056,8576,9757,8922,9912,7874,9360,9164,10056,9240,10173,10402,12153,8225,9717,9570,10566,9453,10325,10691,11285,9884,10634,10506,11548,10879,12641,11378,13084,2512,2830,3072, 3768,3272,3849,4049,4779,3390,4333,3956,5124,4177,4886,5270,5971,3528,4079,4502,4956,4275,5560,5099,6105,4643,5407,5718,6786,5332,6222,6381,7390,3653,4479,4355,5224,4675,5384,5677,6458,4967,5890,5519,6287,5828,6561,6971,7650,4824,5750,5613,6531,6006,6876,6702,7539,6198,6925,7156,8604,7221,8037,7886,9052,3915,4537,4930,5555,5222,5691,6340,6653,4760,5778, 6048,6795,5852,7076,6836,7770,5162,6134,6226,7356,5933,6968,7260,8088,6603,7409,7057,7944,7622,8223,8468,9414,5540,6318,6708,7178,6494,7505,7380,8333,6891,7847,7663,8198,7353,8498,8656,9321,6442,7902,7755,8559,8120,8912,8764,9651,7584,8734,9029,10209,9194,10009,9850,11018,4212,5273,4876,5997,5066,6681,5896,7232,5601,6099,6472,7190,6366,7047,7492,8350,5531,6903,6524,7704,6313,7403,7339,8510,6824,7596,7956,8238,7838,8699,8858,9582,5819,6639, 7007,7526,7139,8065,7785,8949,6670,7729,8294,8777,7931,8641,9153,9767,7234,8202,8062,8882,8522,9373,9042,9924,8454,9187,9614,10044,9446,10273,10378,11625,6177,7289,6841,8025,7045,7876,8256,9069,7392,8667,8173,8994,8383,9229,9351,10098,7581,8564,8343,9429,8879,9296, 9703,10784,8736,9874,9481,10237,9769,10477,10667,11248,7759,8361,8924,9572,8653,9663,9902,10417,9181,10164,9746,10604,10053,10716,10906,11486,9058,9927,10175,11135,10389,10834, 10969,11880,9825,11053,11316,11755,11429,11994,12309,13297,4653,5405,5195,6507,5701,6679, 6393,7488,5858,6276,7051,8078,6879,7631,7892,8740,6017,6955,6771,7718,7329,8471,7853,8898,7218,7988,8208,9226,8359,9033,9496,10196,6342,7369,7167,8034,7545,8161,8236,9080,6981,8320,8586,9506,8815,9399,9310,10315,7743,8600,8934,9284,8749,9626,9782,10553,8508,9888,9585,10441,10033,10728,10866,11653,6627,7089,7796,8574,7498,8429,8893,9536,8053,9125,8709, 9404,8013,9705,9837,10593,8183,8832,8967,10225,9177,9755,9982,11186,9363,10140,9890,10707,10355,10842,11103,11802,8397,9018,9548,9992,9217,10452,10147,10932,9729,10067,10557,11002,10262,11476,11213,11952,9442,10430,10696,11258,10844,11595,11451,12207,10658,11344,11765,12438,11638,12087,12546,13453,7183,7648,7899,8868,8309,9339,8774,9878,8159,9046,9006,10110,9258,10290,10042,11080,8532,9600,9192,10005,9742,10187,10568,10989,9530,10466,10684,11224,10387,11356,11579,12197,8711,9388,9914,10338,9669,10718,10517,11329,9794,10581, 10818,11850,11042,11455,11484,12396,10137,10958,11173,11571,10894,11963,11689,12336,10731,11742,12066,12763,11928,12491,12720,13915,9093,9861,10022,10941,10349,10680,11162,11605,10220,10808,11013,11714,11307,12040,11871,12573,10540,11112,11333,11985,11461,11791,12182,12885,11499,12287,12097,12671,12349,12844,12984,14202,10856,11367,11616,12174,11734,12219,12467,12773,11905,12458,12328,13102,12617,13110,12946,13772,12062,12565,12741,13201,12865,13247,13361,13579,13004,13381,13490,13685,13597,14587,14031,14126,1303,1618,1681,2125,1760,2140,2309,2776,1856,2249,2383,2883,2543,3020,3085,3868,1978,2326,2424,3014,2635,3133,3343,3913,2738,3335,3228,4018,3537,4129,4227,4951,2051,2550,2689,3209,2755,3325,3435,4043,2928,3487,3565,4142,3784,4331,4418,5133,3039,3608,3848,4385,3905,4491,4588,5240,4012,4611,4726,5461,4801,5562,5723,6542,2215,2567,2843,3467,2954,3556,3763,4262,3107, 3859,3633,4422,3985,4531,4683,5317,3270,3836,3995,4606,4094,4703,4776,5503,4199,4821,4974,5638,5121,5776,5927,6794,3464,4022,4152,4754,4340,4872,5051,5762,4464,5064,5235,5864,5328,6029,6149,6994,4637,5304,5479,6078,5525,6154,6312,7164,5690,6375,6490,7286,6613,7417,7630,8607,2466,2836,2973,3806,3172,3888,3934,4680,3359,3986,4104,4744,4207,4861,4920,5745, 3530,4115,4238,4882,4396,5042,5206,5892,4521,5208,5314,5990,5490,6130,6282,7108,3660,4310,4474,5112,4544,5217,5356,6094,4731,5472,5536,6173,5685,6364,6444,7284,4894,5612,5765,6400,5873,6585,6629,7405,6044,6715,6914,7567,7054,7724,8030,8614,3743,4499,4693,5380,4848,5514,5662,6388,4963,5700,5799,6530,5929,6623,6785,7522,5184,5898,5992,6704,6159,6863,7019, 7780,6258,7071,7203,7913,7328,8085,8197,9076,5349,6104,6230,6938,6411,7101,7228,7984,6610,7271,7411,8142,7579,8220,8480,9333,6766,7457,7633,8357,7700,8558,8661,9529,8008,8732,8839,9491,8969,9688,9938,10777,2651,3115,3220,4086,3368,4125,4273,5037,3388,4283,4432,5145, 4566,5326,5390,6271,3640,4444,4577,5439,4714,5485,5598,6275,4810,5596,5734,6478,5902,6599,6662,7402,3710,4692,4832,5450,5001,5620,5775,6586,5094,5840,5939,6676,6024,6843,6962,76

81,5074,6002,6117,6838,6256,7029,7119,7914,6422,7240,
7338,8083,7446,8172,8385,9267,3878,4 942,5002,5818,
5171,5977,6107,6797,5244,6144,6205,7006,6324,7153,
7259,8072,5713,6286,6414, 7192,6544,7313,7443,8154,
6731,7487,7656,8342,7793,8547,8681,9465,5968,6506,
6686,7386,683 3,7565,7670,8492,6976,7754,7835,8599,
8036,8786,8881,9633,7214,8021,8096,8841,8157,8975,88
07,9752,8424,9235,9335,9987,9368,10287,10437,10943,
3974,5156,5194,6245,5626,6359,6441,72 29,5827,6467,
6554,7362,6729,7500,7646,8503,5944,6710,6820,7511,
6927,7675,7805,8627,7072,7 849,7981,8759,8144,8866,
9065,9790,6268,6848,6952,7803,7112,7943,8114,8814,
7352,8117,8207, 9041,8425,8958,9291,10018,7552,8303,
8527,9239,8636,9362,9479,10186,8789,9502,9500,10396,
9765,10490,10615,11301,6496,7059,7242,8122,7497,8218,
8380,9120,7658,8494,8569,9344,8718, 9398,9495,10269,
7810,8651,8825,9467,8907,9518,9776,10500,9108,9808,
9926,10641,10104,1082 0,10928,11649,8073,8852,9012,
9781,9280,9796,10062,10703,9323,10038,10208,10889,
10351,110 37,11241,11922,9409,10300,10473,11098,
10577,11268,11170,12006,10766,11404,11504,12251,11
694,12379,12552,12979,2864,3248,3444,4174,3588,4453,
4579,5361,3701,4615,4720,5436,4844,5 584,5609,6571,
3734,4834,4929,5572,5013,5980,6054,6759,5267,6066,
6244,6980,6336,7127,7252, 8130,3755,4989,5161,6019,
5291,6233,6293,7095,5366,6386,6453,7274,6580,7418,
7541,8232,547 5,6519,6652,7468,6807,7644,7726,8448,
6874,7685,7860,8649,7901,8748,8854,9964,4318,5278,53
38,6326,5449,6455,6574,7375,5649,6665,6742,7595,6897,
7768,7846,8516,5812,6755,6950,7712,7 084,7895,7926,
8692,7186,7938,7970,8876,8292,8977,9202,10029,5954,
7082,7141,7962,7310,810 2,8128,8931,7433,8290,8396,
9107,8583,9268,9346,10219,7591,8474,8638,9358,8795,
9455,9650,1 0363,9002,9676,9819,10502,9933,10653,
10851,11620,4361,5412,5586,6638,5788,6744,6924,7791,
5915,6965,7097,7940,7216,7996,8047,8918,6141,7151,
7299,8061,7431,8265,8367,9090,7580,843 6,8571,9316,
8695,9411,9579,10233,6300,7373,7536,8392,7737,8531,
8521,9424,7816,8655,8742,9 532,8943,9659,9716,10523,
7994,8797,8990,9690,9095,9845,9937,10712,9228,10004,
10142,10890, 10385,11060,11254,11948,6429,7621,7762,
8663,7924,8784,8948,9678,8258,9000,9136,9908,9158,
9953,10093,10804,8308,9146,9223,10055,9439,10133,
10319,11026,9620,10373,10465,11109,106 11,11328,
11422,12034,8438,9489,9555,10245,9741,10401,10488,
11209,9821,10600,10726,11391, 10855,11521,11672,
12283,10158,10737,10903,11544,11089,11721,11800,
12508,11220,11882,119 96,12603,12139,12780,12943,
13526,4556,5651,5851,6970,6119,7138,7279,8167,6184,
7322,7462, 8279,7602,8411,8625,9584,6399,7547,7782,
8505,7871,8773,8706,9631,7950,8828,8964,9806,912
2,9873,9975,10768,6809,7820,7952,8760,8252,8929,9017,
9921,8277,9134,9189,9977,9278,10094, 10182,10966,
8314,9255,9387,10171,9610,10310,10449,11124,9701,
10563,10606,11352,10730,114 24,11581,12223,6885,8247,
8264,9102,8332,9148,9309,10118,8467,9448,9544,10275,
9665,10426, 10587,11282,8988,9596,9751,10459,9832,
10643,10742,11412,10106,10756,10914,11554,11096,11
699,11786,12500,9176,9843,10051,10651,10160,10878,
10984,11611,10337,11050,11147,11776,11 270,11891,
12026,12677,10479,11233,11375,11991,11498,12105,
12214,12803,11637,12263,12370, 12924,12433,13120,
13147,13863,6940,8345,8409,9568,8919,9644,9711,10552,
9051,9801,9898,10 679,10081,10790,10954,11591,9211,
9966,10149,10830,10259,11001,11157,11754,10435,
11260,11 137,11845,11414,12017,12137,12707,9622,
10191,10308,11065,10514,11180,11361,11971,10631,1
1380,11494,12109,11567,12149,12296,12904,10861,
11530,11662,12240,11809,12393,12477,1305 1,11913,
12584,12658,13210,12787,13302,13330,13718,9834,
10321,10617,11385,10779,11472,115 32,12193,10937,
11685,11729,12348,11857,12401,12611,13140,10975,
11836,11978,12575,12130,1 2681,12699,13322,12271,
12812,12880,13396,13023,13544,13633,14078,11293,
12083,12113,1275 9,12323,12822,12931,13433,12425,
13045,13072,13614,13234,13638,13881,14231,12532,
13189,1 3284,13761,13417,13802,13946,14357,13485,
13981,14063,14461,14157,14546,14614,14947,4667, 4370,
3688,5909,4258,5747,5105,7224,4506,5128,5300,6899,
5422,6371,6179,7560,4867,5397,556 9,6240,5757,6697,
6461,7965,6037,6556,6779,7413,7000,8271,7744,8904,
4984,5632,5782,6592,60 61,6723,7036,7640,6190,7159,
6869,8609,7359,7830,8014,9957,6343,7066,7481,7897,
7266,8124,8 462,9430,7605,8404,8260,9035,8687,9591,
9161,10720,5251,5963,6089,6934,6306,7122,7398,805
6,6527,7709,7170,8204,7549,8317,8555,9221,6712,7347,
7882,8451,7750,8871,8393,9328,7519,85 77,8971,9485,
8767,10111,9683,11398,6880,7866,7615,8724,8228,8620,
9077,9552,8002,9260,8835, 9858,9026,9738,10559,10281,
8352,9114,9298,10214,9425,9909,10023,10815,9561,
10379,10130, 11237,10507,11803,11031,12482,5509,6216,
6435,7292,6647,7451,7706,8487,6856,8068,7573,858
9,7840,8712,8939,9778,7013,7739,8233,8755,7976,9196,
8846,9706,8326,9048,9393,9934,9273,10 073,10333,
10907,7199,8162,7908,8955,8565,9127,9417,9999,8456,
9606,9208,10598,9537,10201, 10238,11141,8729,9379,
9802,10328,9672,10422,10686,11896,9989,10762,10534,
11203,10948,114 36,11576,12632,7424,8284,8645,9318,
8420,9436,9726,10370,8809,9880,9539,10873,10035,
10461, 10669,11348,8982,9646,10076,10570,10270,10747,
11120,11488,9813,11009,10786,11750,11226, 11645,
12001,12866,9140,10154,10356,11043,9904,10895,11165,
12079,10484,11323,11458,11783, 10938,12255,11923,
13726,10612,11395,11550,12199,11656,12021,12143,
13107,11252,12355,124 41,12756,12548,13441,12937,
14492,5885,6567,6749,7719,7041,8098,7854,8901,7132,
7934,8539, 9072,8244,9247,9395,10124,7387,8364,8135,
9304,8552,9695,9166,10263,8780,9450,9772,10397, 9565,
10801,10647,11866,7585,8595,8417,9960,9007,9420,9580,
10432,8715,9656,9838,11071,100 46,10547,10750,11505,
9103,10120,9919,10871,10358,10700,11093,11633,10228,
11007,11191,117 17,11345,11938,12230,12735,7775,9285,
8676,9748,8859,10177,9868,10897,9171,9994,10296,107
72,10419,11038,11215,11810,9473,10573,10241,11445,
10099,11082,11181,12160,10760,11318,11 525,11954,
11643,12069,12376,13177,9640,10637,10408,11243,
10846,11408,11725,12319,11054,1 1840,11469,12188,
11564,12597,12462,13069,10495,11683,12020,12527,
11887,12402,12839,1303 7,12114,12767,12634,13373,
12994,13270,13550,14574,8109,8945,9353,10114,9549,
10256,10674, 11275,9735,10920,10343,11386,10537,
11154,11654,12310,9236,10455,10622,11556,10886,
11943, 11456,12246,11152,11761,11861,12556,11313,
12807,12448,13870,9970,10713,11033,12056,1128
8,11794,11704,12727,10836,11906,12208,12503,12099,
12612,12918,13290,11536,12168,12010,12 662,12312,
13126,12835,13413,12463,12951,13193,13610,13076,
13512,13952,14227,10144,11085, 11369,11898,10925,
12353,12030,12754,11621,12067,12538,12890,12201,
12987,13221,13697,112 05,12410,12277,13018,12580,
13281,13093,13662,12788,13154,13465,13581,13366,
14059,13907, 14394,11771,12685,12488,13261,12909,
13743,13166,13843,12363,13473,13334,13935,13391,140
09,14152,15111,12644,13713,13617,14252,13538,14103, 14323,14663,13823,14289,14212,14803, 14436,15344,14714,15534,6425,6909,7255,8191,7533,8297,8542,9405,7693,8888,8430,9787,8700, 9524,9944,10664,7877,8584,9087,9603,8820,10251,9759,10796,9250,10089,10411,11431,10013, 10910,11061,11964,8043,9060,8914,9895,9293,10063,10368,11129,9616,10583,10203,10970,10518,11229,11599,12179,9461,10443,10304,11198,10697,11513,11358,12089,10884,11560,11759,129 33,11822,12494,12374,13257,8377,9130,9573,10246,9892,10383,11019,11311,9382,10470,10738, 11440,10542,11695,11478,12281,9828,10825,10916,11934,10625,11597,11853,12536,11265,1198 0,11678,12421,12155,12642,12826,13511,10226,10997,11363,11781,11163,12058,11956,12722,11 527,12339,12190,12619,11932,12849,12968,13445,11115,12387,12267,12895,12560,13159,13052, 13670,12124,13027,13238,14033,13357,13903,13798,14516,8744,9947,9513,10688,9723,11337,1 0589,11830,10293,10792,11142,11792,11048,11668,12047,12737,10216,11538,11194,12224,1099 2,11975,11917,12859,11467,12134,12429,12654,12333,12999,13116,13626,10509,11297,11628,12 077,11745,12519,12292,13185,11325,12244,12693,13061,12413,12959,13326,13749,11832,12624, 12517,13134,12868,13481,13249,13851,12816,13352,13648,13928,13535,14073,14137,14846,108 62,11875,11482,12484,11666,12364,12667,13271,11967,12975,12598,13214,12765,13384,13467,13962,12122,12900,12731,13521,13133,13428,13704,14376,13029,13815,13557,14051,13750,1419 5,14308,14643,12273,12746,13168,13619,12967,13677,13836,14163,13348,14003,13736,14273,1 3934,14340,14451,14773,13263,13853,14010,14580,14144,14408,14486,14977,13783,14535,1468 1,14913,14738,15034,15188,15620,9263,10087,9863,11174,10390,11335,11074,12042,10549,1096 2,11674,12529,11515,12164,12381,13034,10709,11586,11418,12235,11908,12831,12344,13148,11819,12453,12627,13382,12745,13243,13565,14023,11021,11945,11770,12492,12094,12590,12652, 13279,11606,12711,12917,13571,13086,13499,13437,14097,12257,12928,13175,13420,13039,136 55,13758,14242,12857,13827,13627,14176,13920,14347,14427,14861,11286,11707,12301,12907, 12051,12798,13143,13592,12509,13309,13008,13504,12473,13705,13791,14267,12607,13097,131 97,14043,13343,13741,13884,14610,13474,13989,13828,14335,14122,14413,14562,14938,12774,13230,13602,13891,13375,14182,13992,14464,13721,13942,14247,14506,14066,14768,14626,150 16,13530,14171,14328,14648,14414,14829,14752,15140,14301,14698,14918,15247,14853,15082, 15298,15681,11787,12178,12385,13124,12703,13458,13059,13820,12588,13254,13222,13969,134 04,14083,13926,14551,12875,13639,13356,13899,13731,14017,14253,14498,13588,14189,14320, 14631,14143,14704,14820,15135,13009,13493,13845,14111,13681,14342,14220,14688,13765,14260,14397,14961,14529,14756,14772,15227,13985,14479,14603,14814,14444,15021,14877,15201, 14348,14906,15073,15397,15002,15274,15377,15853,13288,13806,13912,14470,14118,14316,145 96,14835,14039,14390,14512,14891,14675,15057,14972,15310,14234,14567,14692,15030,14758, 14932,15127,15449,14779,15174,15086,15354,15207,15430,15492,15951,14421,14709,14841,151 22,14901,15145,15262,15401,14991,15258,15197,15542,15331,15545,15473,15802,15069,15306,15386,15581,15442,15602,15646,15732,15501,15656,15697,15771,15738,16070,15895,15926,313, 432,457,645,488,651,727,953,530,702,763,1006,838,1077,1109,1542,581,737,781,1073,882,1136, 1248,1569,934,1243,1186,1627,1353,1695,1752,2207,612,841,910,1176,941,1238,1297,1645,1029, 1326,1367,1702,1492,1816,1867,2324,1085,1392,1530,1848,1563,1913,1975,2394,1625,1989,2063,2547,2110,2618,2728,3322,686,849,986,1314,1039,1362,1482,1773,1121,1537,1406,1871,1610, 1939,2036,2449,1209,1522,1615,1986,1674,2048,2094,2577,1735,2123,2220,2670,2317,2766,287 1,3515,1310,1631,1708,2082,1821,2156,2272,2756,1897,2280,2391,2826,2457,2946,3031,3672,20 07,2441,2560,2979,2592,3035,3153,3803,2706,3198,3286,3901,3375,4007,4182,5020,802,982,1052,1506,1156,1554,1580,2035,1256,1611,1679,2075,1740,2149,2188,2744,1349,1685,1757,2163,18 54,2265,2373,2845,1932,2374,2448,2916,2568,3017,3129,3759,1422,1803,1904,2310,1947,2380,2 476,2992,2067,2555,2600,3049,2702,3190,3250,3899,2171,2652,2757,3217,2833,3354,3389,3998, 2955,3455,3609,4128,3716,4259,4517,5025,1470,1919,2043,2492,2141,2585,2686,3208,2212,2713,2781,3314,2872,3384,3508,4091,2360,2848,2918,3446,3040,3567,3690,4304,3113,3729,3835,44 16,3935,4564,4658,5445,2471,2999,3093,3627,3224,3756,3854,4477,3374,3889,4002,4612,4137,4 679,4905,5683,3493,4039,4184,4797,4240,4975,5070,5874,4496,5131,5229,5836,5345,6025,6272, 7133,891,1125,1182,1669,1261,1691,1780,2261,1272,1787,1877,2332,1962,2455,2499,3122,1411, 1885,1969,2532,2055,2563,2642,3126,2116,2640,2735,3276,2853,3365,3415,3996,1451,2041,213 0,2540,2239,2657,2764,3356,2300,2812,2879,3424,2942,3552,3646,4223,2286,2925,3008,3548,31 12,3698,3771,4419,3235,3864,3942,4561,4030,4638,4823,5621,1548,2201,2240,2795,2350,2909,3 001,3517,2398,3027,3074,3680,3161,3795,3880,4551,2721,3134,3229,3827,3324,3921,4028,4622, 3466,4064,4204,4784,4316,4965,5086,5810,2902,3297,3432,3981,3544,4126,4215,4914,3656,4284,4353,5014,4522,5180,5268,5975,3845,4508,4573,5231,4624,5350,5202,6090,4856,5591,5686,63 20,5719,6624,6780,7311,1604,2340,2366,3104,2662,3186,3249,3856,2802,3267,3331,3962,3465,4 073,4195,4925,2884,3450,3534,4082,3618,4219,4327,5038,3731,4363,4475,5154,4613,5254,5435, 6127,3120,3557,3638,4325,3764,4445,4589,5209,3954,4591,4666,5413,4858,5335,5645,6348,4116,4750,4947,5597,5046,5714,5824,6520,5185,5849,5846,6737,6102,6834,6963,7707,3290,3721,38 66,4596,4071,4676,4819,5486,4205,4916,4985,5695,5118,5746,5841,6605,4332,5060,5218,5813,5 290,5865,6113,6844,5476,6145,6259,6988,6436,7175,7296,8099,4553,5241,5386,6120,5636,6132, 6394,7055,5674,6370,6545,7253,6688,7412,7639,8418,5758,6635,6818,7482,6922,7668,7563,8517,7120,7818,7932,8810,8150,8970,9184,9736,997,1195,1301,1720,1381,1891,1970,2480,1445,199 3,2060,2530,2136,2633,2647,3344,1465,2131,2194,2625,2246,2910,2963,3488,2414,2970,3102,36 61,3169,3776,3874,4602,1477,2231,2344,2938,2431,3095,3140,3749,2484,3206,3257,3891,3349,4 009,4106,4688,2556,3307,3408,4050,3524,4193,4261,4878,3576,4228,4373,5058,4408,5146,5242, 6294,1809,2421,2463,3162,2538,3259,3346,3973,2678,3416,3474,4153,3595,4294,4362,4938,279 1,3483,3637,4249,3741,4403,4429,5095,3823,4438,4466,5263,4740,5352,5558,6360,2890,3739,37 86,4460,3920,4580,4600,5312,4020,4738,4833,5473,4997,5623,5697,6555,4148,4901,5048,5709,5 189,5800,5993,6700,5376,6013,6155,6846,6263,7004,7212,8066,1832,2513,2634,3396,2773,3476, 3616,4314,2862,3648,3751,4440,3847,4487,4530,5298,3026,3793,3910,4543,4019,4717,4807,5458,4139,4868,4988,5670,5097,5761,5922,6570,3145,3970,4102,4827,4269,4952,4943,5771,4336,50 65,5140,5876,5322,6000,6055,6870,4485,5192,5364,6027,5463,6182,6269,7065,5587,6337,6474,7 256,6727,7438,7654,8449,3240,4175,4289,5072,4427,5178,5329,6015,4709,5374, 5499,6239,5521, 6284,6423,7162,4755,5510,5582,6389, 5785,6464,6657,7401,5961,6711,6810,7495,6958,7738,784 1,8553,4870,5834,5899,6581,6079,6743,6831,7603,6157, 6947,7079,7806,7217,7953,8123,8850,64 88,7090,7269, 7979,7469,8179,8274,9128,7616,8369,8506,9251,8677, 9474,9686,10474,1956,2679, 2818,3652,3010,3785,3895, 4633,3057,3930,4044,4729,4159,4847,5035,5928,3215, 4110,4306,492 7,4382,5168,5108,5972,4449,5220,5340, 6142,5488,6206,6307,7123,3526,4341,4451,5157,4705,53 09,5391,6253,4727,5497,5547,6310,5633,6426,6515,7335, 4762,5611,5736,6503,5951,6648,6792,7 512,6040,6910, 6953,7763,7085,7844,8019,8778,3585,4700,4715,5467, 4777,5512,5663,6449,4895, 5794,5888,6611,6004,6767, 6933,7683,5362,5940,6087,6803,6167,6990,7098,7828, 6439,7110,728 0,7990,7479,8155,8259,9117,5537,6180, 6384,7001,6491,7243,7357,8057,6677,7428,7537,8248,76 71,8381,8543,9342,6822,7628,7788,8501,7927,8633,8768, 9503,8086,8823,8959,9660,9036,9922,9 958,10961,3629, 4786,4845,5913,5301,5986,6050,6898,5421,6137,6229, 7030,6413,7147,7323,803 1,5568,6296,6479,7187,6596, 7376,7548,8221,6777,7659,7524,8327,7831,8529,8674, 9383,5964,65 25,6645,7444,6859,7574,7774,8475,6978, 7794,7921,8639,8006,8690,8864,9634,7222,7963,8112,8 798,8285,8985,9091,9827,8407,9224,9317,10040,9484, 10167,10204,10751,6169,6660,6966,7799, 7136,7896, 7966,8743,7306,8139,8192,8932,8340,8996,9261,9948, 7348,8315,8486,9213,8664,934 7,9370,10193,8834,9514, 9604,10294,9791,10498,10626,11278,7696,8608,8644, 9449,8902,9527,9 671,10346,9024,9816,9856,10601, 10077,10636,10986,11516,9159,10012,10143,10814, 10322,108 74,11083,11716,10420,11132,11255,11877, 11399,12013,12125,12695,2026,1837,1436,2857,1769, 2745,2305,3851,1922,2320,2437,3596,2520,3194,3053, 4120,2152,2502,2622,3099,2750,3440,326 3,4461,2950, 3332,3503,4004,3676,4721,4274,5287,2226,2665,2769, 3360,2966,3459,3702,4190,30 61,3799,3571,5022,3958, 4349,4501,6289,3173,3725,4060,4405,3883,4597,4889, 5777,4160,4839,4 711,5408,5090,5934,5522,7074,2402, 2898,2987,3624,3149,3772,3990,4538,3311,4246,3808, 4662, 4112,4763,4971,5579,3452,3950,4392,4879,4278, 5259,4829,5680,4087,4992,5346,5831,5163,644 5,6020, 7814,3580,4377,4169,5123,4684,5031,5446,5895,4492, 5615,5226,6192,5399,6075,6904,66 18,4792,5480,5653, 6549,5772,6241,6354,7172,5904,6718,6462,7635,6851, 8281,7406,9097,2581,3 081,3243,3906,3404,4035,4244, 4911,3561,4547,4132,5003,4357,5113,5318,6114,3684, 4270,4689, 5150,4470,5553,5236,6046,4772,5417,5740, 6265,5627,6406,6672,7275,3831,4629,4412,5333,497 9,5493,5766,6332,4885,5948,5563,6944,5881,6538,6575, 7529,5129,5730,6138,6667,6010,6763,70 37,8387,6321, 7116,6881,7597,7318,7856,8016,9286,4013,4734,5055, 5671,4853,5783,6064,6707,5 203,6212,5883,7237,6365, 6804,7021,7758,5357,5987,6408,6916,6607,7103,7507, 7916,6150,7383, 7144,8216,7623,8093,8512,9586,5505, 6485,6693,7419,6234,7261,7558,8603,6828,7732,7880,825 5,7307,8816,8421,10763,6959,7812,7987,8750,8106,8537, 8683,9905,7651,8940,9045,9445,9180,1 0359,9679,11930, 2839,3338,3479,4253,3706,4574,4366,5285,3780,4435, 4959,5440,4698,5604,57 42,6457,3982,4802,4607,5657, 4969,6032,5528,6602,5174,5796,6108,6739,5910,7160, 6996,8353,4 143,5008,4851,6290,5382,5768,5924,6773, 5115,5998,6175,7452,6379,6892,7105,7935,5469,6450, 6250,7235,6695,7050,7476,8080,6564,7381,7586,8176, 7756,8440,8788,9418,4300,5641,5082,608 3,5246,6510, 6201,7263,5532,6328,6632,7128,6761,7414,7610,8287, 5820,6918,6577,7867,6430,74 64,7576,8702,7115,7728, 7958,8457,8091,8592,8966,9997,5982,6985,6750,7641, 7207,7825,8186,8 896,7435,8322,7891,8737,8003,9242, 9070,9853,6839,8136,8534,9154,8375,8997,9550,9809, 8646, 9459,9288,10264,9754,10125,10510,12065,4583, 5323,5704,6446,5893,6593,7025,7677,6073,7288, 6682, 7800,6883,7544,8104,8883,5593,6799,6972,7991,7249, 8443,7878,8804,7542,8229,8347,919 1,7722,9509,9055, 10971,6302,7067,7408,8578,7691,8269,8163,9407,7194, 8399,8762,9124,8629,9 264,9654,10153,7972,8713,8523, 9324,8886,9930,9545,10317,9073,9697,10019,10595,9864, 10456, 11092,11511,6475,7465,7784,8389,7293,8937, 8548,9443,8069,8590,9169,9617,8753,9745,10057, 10721, 7599,9008,8842,9784,9219,10139,9887,10670,9486,9969, 10391,10556,10253,11250,11027, 11772,8241,9354,9104, 10112,9641,10787,9983,10933,8950,10403,10210,11069, 10289,11175,1139 4,12995,9301,10745,10607,11549, 10491,11319,11663,12209,10904,11607,11489,12449, 11839,134 29,12297,13816,3236,3603,3875,4654,4100, 4746,4961,5752,4234,5274,4862,6124,5101,5869,627 7,7015,4387,4998,5455,5946,5213,6587,6096,7155,5606, 6419,6752,7852,6345,7276,7440,8469,45 26,5429,5294, 6225,5646,6396,6705,7517,5957,6928,6540,7342,6865, 7624,8041,8727,5806,6787,6 642,7594,7048,7945,7769, 8615,7247,7998,8226,9673,8300,9112,8965,10108,4816, 5494,5918,658 2,6223,6724,7393,7720,5732,6815,7092, 7862,6888,8151,7903,8847,6164,7181,7281,8433,6974,80 38,8336,9167,7665,8488,8131,9021,8698,9299,9535, 10454,6562,7371,7776,8253,7555,8580,8459, 9403,7959, 8921,8739,9271,8431,9563,9721,10364,7502,8981,8831, 9624,9197,9972,9829,10683,8 659,9797,10083,11212, 10242,11022,10869,11965,5142,6279,5860,7039,6062, 7747,6935,8310,663 1,7148,7531,8266,7425,8119,8567, 9421,6551,7974,7588,8781,7366,8482,8413,9576,7889, 8671,90 31,9312,8915,9760,9916,10618,6854,7702,8075, 8601,8211,9143,8861,10008,7734,8803,9364,984 1,9010, 9707,10199,10797,8311,9275,9141,9942,9589,10415, 10097,10944,9520,10234,10649,1105 7,10485,11271, 11370,12524,7225,8362,7909,9099,8118,8952,9329,10127, 8470,9731,9245,10047,9 456,10279,10393,11105,8657, 9628,9413,10468,9939,10339,10732,11746,9798,10893, 10519,11238, 10799,11463,11639,12176,8836,9433,9984, 10608,9718,10693,10922,11409,10229,11166,10774,1 1582,11066,11690,11862,12398,10115,10947,11177, 12073,11382,11795,11919,12750,10847,11998, 12241, 12640,12340,12853,13135,14000,5617,6417,6197,7569, 6733,7745,7454,8563,6894,7332,8 125,9155,7947,8708, 8972,9803,7060,8026,7836,8792,8402,9540,8926,9961, 8298,9061,9282,1027 6,9431,10090,10532,11199,7395, 8445,8239,9109,8621,9232,9311,10138,8051,9389,9652, 10543,98 77,10439,10354,11309,8818,9668,9995,10329, 9812,10660,10811,11535,9574,10908,10621,11432, 11045, 11700,11827,12547,7688,8165,8872,9639,8573,9498,9954, 10571,9131,10178,9770,10444,9 084,10734,10858,11573, 9256,9893,10024,11227,10224,10785,10993,12121,10406, 11143,10911,11 680,11346,11804,12043,12682,9469, 10071,10584,11003,10266,11441,11148,11884,10757, 11079,1 1539,11951,11262,12388,12145,12818,10481, 11420,11669,12184,11806,12495,12361,13048,1162 9,12268,12649,13250,12535,12939,13344,14134,8261, 8725,8978,9928,9377,10381,9839,10898,92 30,10101, 10059,11116,10305,11289,11055,12022,9598,10638, 10239,11017,10771,11189,11551,11 939,10565,11454, 11657,12156,11381,12279,12478,13040,9773,10429, 10934,11332,10698,11691,1 1501,12254,10821,11562, 11777,12723,11987,12365,12397,13211,11139,11909, 12110,12470,1185 2,12827,12577,13163,11703,12628, 12919,13540,12795,13298,13500,14527,10150,10880, 11034,11 892,11341,11652,12100,12505,11222,11768, 11961,12599,12231,12896,12743,13369,11522,12052,12258,12846,12371,12673,13024,13645,12409,13113,12948,13455,13174,13607,13732,14765,118 17,12289,12515,13015,12620,13058,13276,13547,12775,13268,13155,13833,13410,13840,13694, 14405,12916,13363,13519,13917,13628,13959,14057,14243,13748,14074,14168,14332,14258,150 80,14623,14702,1796,2181,2257,2786,2352,2804,3002,3539,2468,2930,3086,3663,3273,3818,389 2,4767,2611,3022,3136,3810,3379,3945,4186,4812,3498,4176,4055,4928,4398,5054,5159,5942,2698,3281,3437,4034,3518,4164,4286,4954,3712,4343,4431,5067,4669,5271,5365,6133,3837,4478,4 745,5330,4804,5442,5549,6243,4922,5571,5699,6481,5779,6589,6757,7606,2893,3299,3620,4321, 3742,4420,4649,5197,3916,4758,4503,5370,4897,5489,5655,6330,4096,4730,4907,5565,5016,567 6,5749,6522,5125,5802,5966,6666,6121,6813,6967,7861,4317,4932,5076,5725,5280,5854,6045,6798,5414,6058,6236,6902,6341,7073,7196,8063,5599,6316,6499,7125,6546,7202,7365,8235,6720,7 434,7551,8360,7674,8495,8707,9675,3182,3610,3766,4694,3987,4788,4835,5652,4201,4899,5027, 5716,5135,5843,5906,6783,4389,5039,5170,5866,5341,6034,6208,6930,5477,6210,6327,7032,650 9,7177,7337,8181,4533,5248,5425,6110,5504,6219,6367,7143,5703,6493,6558,7219,6714,7421,7504,8358,5877,6641,6801,7461,6913,7647,7690,8484,7087,7783,7986,8642,8127,8799,9106,9681,4 628,5451,5667,6391,5830,6533,6689,7449,5953,6732,6835,7593,6969,7684,7851,8598,6187,6937, 7034,7771,7206,7929,8089,8855,7316,8145,8280,8991,8401,9165,9270,10134,6361,7154,7287,80 10,7471,8175,8305,9057,7672,8346,8491,9214,8652,9297,9547,10375,7833,8530,8710,9428,8775,9623,9727,10564,9079,9795,9899,10527,10027,10715,10957,11740,3399,3925,4047,5005,4209,50 50,5210,6028,4230,5221,5381,6146,5527,6339,6401,7327,4512,5394,5539,6459,5687,6505,6628,7 331,5790,6626,6769,7538,6941,7660,7727,8481,4592,5665,5815,6471,5994,6650,6811,7649,6093, 6877,6979,7742,7070,7912,8033,8758,6068,7044,7166,7905,7314,8101,8195,8993,7485,8318,8412,9162,8520,9244,9458,10311,4778,5931,5996,6853,6174,7020,7157,7864,6246,7191,7258,8074,7 377,8224,8335,9149,6746,7341,7475,8268,7609,8384,8518,9225,7797,8562,8733,9412,8869,9612, 9744,10503,7010,7568,7753,8465,7900,8640,8747,9557,8046,8830,8910,9667,9111,9848,9941,10 668,8293,9094,9174,9901,9227,10030,9871,10782,9492,10284,10377,10999,10412,11284,11427,11894,4884,6158,6196,7303,6654,7416,7501,8307,6864,7525,7619,8439,7795,8575,8722,9569,698 4,7779,7885,8587,8000,8752,8880,9693,8147,8923,9054,9822,9216,9925,10123,10819,7325,7915, 8024,8878,8185,9020,9190,9876,8427,9193,9281,10096,9494,10017,10335,11029,8628,9371,9594, 10288,9702,10405,10516,11188,9852,10541,10538,11388,10795,11475,11592,12226,7557,8133,8 321,9200,8572,9294,9454,10172,8735,9559,9635,10386,9780,10438,10531,11267,8885,9715,9886, 10505,9968,10555,10805,11483,10163,10833,10946,11612,11110,11779,11881,12544,9151,9911, 10065,10810,10326,10823,11075,11677,10366,11051,11211,11846,11343,11982,12171,12790,104 50,11295,11462,12038,11559,12194,12108,12864,11730,12317,12414,13082,12582,13198,13351,1 3728,3642,4074,4296,5098,4455,5403,5541,6374,4581,5575,5692,6456,5826,6614,6637,7634,4618,5817,5917,6601,6005,7023,7099,7824,6273,7111,7301,8050,7389,8200,8330,9205,4641,5981,61 63,7062,6301,7290,7350,8169,6378,7447,7513,8349,7643,8497,8617,9307,6495,7582,7716,8545,7 873,8720,8802,9516,7941,8761,8935,9713,8980,9811,9913,10976,5258,6285,6350,7379,6469,751 5,7637,8455,6678,7730,7807,8670,7968,8844,8920,9583,6847,7819,8022,8787,8160,8974,9005,9753,8263,9014,9044,9936,9361,10032,10249,11041,6995,8158,8213,9039,8382,9179,9203,9993,85 09,9359,9468,10161,9648,10313,10388,11221,8665,9542,9704,10400,9859,10493,10682,11355,10 054,10704,10841,11485,10951,11626,11813,12520,5303,6428,6616,7701,6823,7809,7997,8867,69 54,8035,8171,9016,8295,9068,9123,9978,7189,8222,8370,9138,8507,9338,9440,10148,8654,9504, 9638,10361,9756,10453,10614,11236,7354,8452,8613,9464,8812,9597,9588,10463,8891,9720,980 5,10567,10002,10692,10744,11507,9066,9862,10043,10717,10152,10867,10955,11686,10278,1101 6,11145,11848,11379,12003,12183,12814,7490,8697,8838,9730,9003,9846,10007,10706,9332,100 52,10185,10929,10206,10968,11099,11766,9376,10194,10274,11068,10478,11136,11314,11974,10 654,11365,11453,12050,11589,12253,12334,12891,9507,10525,10591,11245,10770,11393,11473,1 2141,10843,11580,11698,12308,11816,12427,12562,13111,11159,11708,11860,12447,12028,12605,12680,13311,12151,12752,12855,13399,12982,13553,13693,14194,5517,6680,6887,8040,7168,8 210,8355,9238,7230,8395,8536,9350,8679,9482,9691,10620,7459,8624,8857,9571,8947,9836,976 8,10665,9027,9889,10021,10831,10174,10892,10987,11732,7875,8895,9030,9824,9326,9990,1007 0,10942,9348,10183,10236,10990,10323,11101,11184,11915,9385,10302,10428,11172,10645,11305,11439,12064,10729,11546,11584,12276,11702,12337,12480,13062,7954,9322,9336,10157,9402, 10197,10353,11122,9534,10487,10580,11273,10695,11416,11568,12206,10041,10633,10780,1144 8,10852,11614,11713,12324,11113,11723,11868,12455,12036,12586,12668,13305,10223,10864,11 064,11623,11161,11838,11935,12512,11331,11995,12086,12661,12196,12762,12883,13461,11465, 12163,12295,12852,12408,12954,13055,13569,12534,13092,13192,13676,13245,13850,13871,14482,8012,9415,9480,10605,9980,10677,10740,11534,10107,10828,10919,11651,11091,11752,11904, 12490,10260,10978,11150,11790,11259,11950,12095,12639,11425,12186,12075,12718,12326,128 73,12980,13488,10656,11195,11303,12008,11497,12116,12284,12834,11604,12299,12405,12957,1 2468,12993,13122,13660,11823,12434,12555,13074,12687,13209,13287,13785,12783,13380,1344 4,13924,13559,14006,14029,14360,10854,11317,11594,12304,11743,12384,12436,13036,11889,12574,12615,13173,12730,13216,13405,13866,11926,12709,12841,13371,12973,13463,13479,14021, 13099,13577,13642,14086,13764,14209,14285,14660,12217,12936,12962,13537,13151,13587,13 682,14117,13236,13779,13804,14272,13949,14290,14496,14789,13332,13906,13991,14396,14101, 14433,14553,14893,14165,14579,14647,14976,14724,15044,15099,15366,5637,5313,4565,6949,5 193,6784,6103,8302,5460,6129,6311,7969,6440,7430,7227,8635,5850,6410,6598,7298,6793,7764, 7521,9040,7081,7620,7845,8493,8071,9343,8819,9965,5976,6661,6819,7655,7107,7790,8108,871 7,7239,8231,7937,9677,8435,8906,9086,10973,7397,8141,8557,8976,8341,9201,9528,10469,8680, 9476,9334,10092,9750,10628,10207,11693,6255,7005,7137,8007,7361,8196,8476,9133,7590,8785, 8243,9277,8626,9386,9621,10271,7781,8423,8960,9517,8824,9932,9466,10372,8594,9643,10028,10522,9831,11118,10711,12315,7949,8942,8691,9786,9303,9687,10135,10588,9075,10307,9897,1 0877,10080,10767,11541,11279,9423,10168,10342,11217,10464,10930,11036,11775,10597,11372, 11133,12167,11491,12684,11977,13291,6529,7270,7496,8366,7711,8526,8783,9554,7923,9145,86 48,9655,8917,9775,9998,10806,8082,8813,9308,9818,9050,10244,9907,10736,9397,10103, 10434, 10953,10318,11086,11327,11864,8276,9234,8987, 10014,9630,10180,10458,11011,9523,10642,102 55,11577, 10574,11206,11240,12080,9792,10423,10829,11322, 10702,11413,11659,12768,11000,11 728,11518,12136, 11900,12347,12476,13422,8502,9356,9710,10362,9490, 10475,10755,11362,9872, 10900,10576,11835,11047, 11449,11642,12272,10037,10678,11088,11553,11269, 11718,12060,124 00,10838,11959,11749,12636,12158, 12541,12861,13630,10190,11156,11349,11988,10924, 11854,1 2104,12932,11471,12248,12369,12666,11890, 13087,12792,14366,11590,12313,12452,13042,1255 1,12879,12988,13838,12180,13180,13253,13534,13347, 14124,13688,15005,6923,7629,7815,8794, 8113,9175, 8928,9963,8206,9011,9607,10129,9319,10297,10436, 11128,8466,9435,9210,10347,961 9,10723,10213,11264, 9842,10489,10800,11390,10602,11763,11619,12739,8660, 9661,9488,10974, 10061,10460,10616,11421,9777,10689, 10860,12014,11059,11529,11720,12416,10159,11123,1093 9,11833,11351,11673,12033,12531,11232,11957,12127, 12602,12270,12806,13068,13514,8851,103 31,9740,10776, 9918,11179,10888,11856,10218,11006,11292,11737,11411, 11983,12146,12689,105 12,11555,11242,12357,11106, 12024,12118,13002,11727,12243,12431,12819,12539, 12923,13196,1 3895,10673,11610,11401,12172,11808, 12322,12610,13146,12000,12714,12380,13031,12465,1339 3,13272,13801,11480,12571,12877,13328,12758,13217, 13603,13774,12963,13543,13424,14068,1 3740,13978, 14215,15072,9185,10003,10395,11119,10586,11256, 11647,12202,10765,11874,11338, 12305,11520,12093, 12549,13137,10286,11444,11600,12456,11844,12809, 12367,13079,12091,126 47,12734,13355,12239,13574, 13260,14487,10983,11687,11979,12911,12213,12676, 12592,13507,1 1797,12777,13050,13308,12950,13407, 13673,13997,12442,13011,12869,13448,13139,13856,1360 0,14099,13274,13700,13910,14269,13809,14184,14558, 14786,11146,12025,12291,12770,11878,13 178,12888, 13532,12522,12921,13339,13650,13044,13735,13936, 14344,12138,13224,13105,13760, 13377,13988,13826, 14310,13560,13878,14146,14246,14062,14645,14521, 14923,12657,13469,13 295,13971,13665,14379,13886, 14466,13186,14154,14034,14545,14082,14604,14721, 15497,13432, 14356,14275,14804,14204,14683,14866, 15141,14450,14836,14775,15253,14957,15672,15181,15 820,7486,7980,8331,9266,8610,9367,9609,10446,8770, 9950,9499,10816,9762,10561,10963,11636, 8954,9649, 10145,10640,9882,11251,10789,11758,10299,11097, 11403,12343,11025,11865,12005, 12829,9119,10117,9974, 10915,10336,11077,11360,12070,10650,11563,11208, 11921,11503,12159, 12499,13022,10499,11434,11300, 12133,11671,12422,12280,12940,11842,12461,12645, 13683,126 98,13301,13195,13968,9451,10181,10610, 11246,10913,11376,11968,12237,10425,11459,11710,12 352,11524,12583,12390,13108,10850,11785,11869,12802, 11602,12497,12726,13337,12192,12842, 12568,13233, 12998,13430,13591,14183,11230,11947,12285,12664, 12102,12913,12821,13503,124 32,13165,13033,13412, 12800,13613,13717,14129,12055,13206,13096,13654, 13359,13880,13786, 14319,12971,13767,13953,14625, 14054,14518,14430,15022,9807,10965,10551,11661, 10753,1226 2,11569,12705,11291,11753,12082,12674, 11992,12559,12903,13516,11219,12444,12129,13064,11 942,12838,12786,13623,12378,12978,13241,13440,13161, 13745,13847,14280,11493,12222,12526, 12930,12631, 13321,13119,13902,12250,13078,13475,13794,13226, 13707,14026,14384,12706,13 416,13319,13862,13632, 14161,13961,14472,13582,14049,14298,14539,14200, 14655,14711,15289, 11825,12747,12394,13293,12558, 13188,13451,13980,12830,13724,13395,13930,13541, 14077,14 148,14564,12969,13657,13510,14191,13860, 14112,14349,14908,13768,14443,14221,14638,14386, 14761,14854,15125,13100,13525,13887,14276,13715, 14326,14460,14729,14046,14599,14372,14 822,14543, 14879,14967,15229,13973,14474,14606,15076,14716, 14935,14999,15392,14416,15036, 15155,15343,15203, 15436,15556,15883,10309,11095,10883,12112,11384, 12260,12016,12899,115 31,11912,12563,13329,12424, 13007,13199,13770,11682,12486,12331,13071,12779, 13595,13170, 13873,12696,13265,13419,14075,13523, 13957,14230,14618,11970,12811,12655,13299,12944,133 87,13439,13987,12507,13494,13671,14237,13819,14175, 14121,14678,13089,13680,13893,14106, 13776,14304, 14393,14797,13621,14452,14282,14741,14532,14884, 14951,15299,12211,12594,131 28,13664,12906,13567, 13869,14255,13313,14012,13751,14178,13283,14351, 14423,14817,13402, 13830,13913,14633,14042,14378, 14501,15097,14156,14585,14454,14874,14699,14939, 15060,153 59,13549,13945,14262,14507,14070,14746, 14589,14980,14363,14550,14799,15015,14651,15224, 15108,15419,14198,14735,14869,15129,14941,15276, 15213,15519,14849,15167,15347,15604,152 94,15471, 15640,15929,12669,13020,13204,13854,13484,14140, 13792,14447,13385,13965,13938, 14569,14092,14665, 14537,15048,13637,14291,14052,14515,14370,14613, 14805,15009,14251,147 55,14863,15113,14715,15172, 15268,15515,13753,14170,14467,14691,14329,14880, 14781,15160, 14400,14811,14926,15379,15032,15215, 15228,15586,14583,14993,15092,15265,14963,15423,153 12,15567,14886,15337,15463,15715,15410,15621,15701, 16051,13995,14437,14525,14984,14696, 14860,15088, 15281,14630,14921,15020,15323,15151,15454,15389, 15651,14792,15064,15162,154 33,15218,15356,15509, 15756,15234,15547,15475,15683,15572,15742,15789, 16121,14946,15177, 15285,15506,15334,15523,15614, 15718,15402,15611,15564,15826,15665,15828,15775, 16016,154 62,15649,15708,15855,15749,15868,15902, 15965,15795,15907,15940,15993,15970,16201,16080, 16103,2292,2736,2825,3422,2933,3441,3667,4260,3065, 3586,3760,4393,3963,4562,4644,5580,32 25,3689,3813, 4554,4080,4699,4960,5634,4213,4948,4817,5753,5190, 5886,5999,6816,3323,3971,4 149,4795,4235,4936,5071, 5784,4450,5130,5225,5900,5481,6115,6213,7014,4584, 5275,5556,6181, 5624,6297,6407,7129,5748,6431,6563, 7370,6649,7483,7652,8511,3543,3991,4348,5106,4481,521 4,5456,6038,4668,5570,5302,6217,5720,6344,6516,7213, 4869,5543,5731,6427,5847,6539,6619,74 15,5965,6671, 6840,7561,7002,7710,7868,8765,5102,5759,5911,6594, 6125,6725,6920,7694,6264,6 936,7124,7801,7226,7977, 8100,8973,6463,7200,7388,8027,7439,8105,8272,9142, 7617,8338,8458, 9265,8581,9394,9601,10544,3865,4337, 4507,5511,4751,5605,5658,6513,4976,5721,5859,6583,59 73,6713,6781,7678,5181,5870,6009,6738,6191,6911,7091, 7832,6333,7093,7210,7933,7399,8079,8 240,9083,5334, 6091,6278,6991,6357,7104,7257,8044,6568,7382,7453, 8126,7611,8328,8408,9262, 6751,7534,7697,8365,7813, 8554,8596,9384,7992,8688,8889,9541,9032,9696,9996, 10548,5433,63 08,6528,7282,6698,7426,7587,8354,6827, 7626,7733,8499,7869,8591,8756,9497,7068,7837,7936,8 678,8110,8837,8998,9747,8217,9047,9182,9879,9305, 10048,10155,10981,7248,8054,8189,8913,8 374,9078, 9207,9949,8579,9248,9390,10100,9551,10179,10421, 11214,8738,9432,9605,10306,9674, 10496,10594,11396, 9971,10661,10761,11359,10881,11537,11762,12493,4101, 4677,4808,5837,49 86,5882,6051,6905,5009,6063,6227, 7026,6382,7223,7294,8230,5310,6242,6395,7349,6550, 7394,7 520,8234,6658,7518,7664,8444,7842,8566,8631, 9380,5398,6526,6683,7360,6871,7543,7708,8556, 6973, 7777,7879,8647,7973,8817,8938,9653,6945,7946,8067, 8811,8215,9009,9098,9881,8388,921 8,9314,10045,9422, 10131,10334,11153,5592,6805,6872,7751,7052,7919,8058, 8769,7134,8094,81 64,8983,8286,9132,9237,10034,7642, 8245,8378,9172,8513,9289,9419,10113,8703,9462,9627, 102 91,9761,10486,10613,11334,7910,8472,8658,9365, 8805,9538,9642,10431,8951,9724,9804,10535, 10000, 10710,10802,11490,9195,9985,10058,10764,10116,10885, 10733,11598,10369,11126,11216, 11805,11249,12068, 12200,12633,5707,7038,7077,8205,7550,8323,8405,9209, 7760,8432,8524,934 0,8701,9475,9618,10442,7883,8684, 8791,9487,8903,9647,9774,10560,9049,9817,9945,10685, 101 02,10788,10972,11630,8227,8821,8927,9771,9088, 9910,10074,10739,9330,10078,10165,10949,10 371,10870, 11176,11831,9525,10252,10467,11130,10569,11244,11347, 11981,10714,11371,11368,1 2165,11608,12247,12354, 12938,8463,9037,9220,10084,9471,10176,10330,11020, 9629,10433,105 08,11225,10648,11276,11364,12053,9779, 10585,10748,11336,10826,11387,11617,12256,11010,11646,11751,12375,11907,12528,12621,13223,10036,10773, 10921,11622,11167,11634,11872,12430, 11204,11851, 12002,12589,12126,12712,12886,13446,11287,12078, 12232,12766,12320,12908,128 28,13513,12483,13019, 13103,13706,13258,13807,13943,14274,4371,4840,5081, 5935,5252,6251,6 397,7262,5387,6437,6557,7345,6694, 7506,7530,8540,5423,6684,6790,7493,6882,7922,8004, 8730, 7161,8015,8203,8956,8299,9105,9231,10091,5447, 6857,7042,7967,7184,8193,8254,9071,7267,83 51,8419, 9252,8549,9396,9515,10188,7384,8489,8622,9444,8779, 9615,9698,10392,8848,9657,983 0,10582,9869,10675, 10775,11782,6100,7171,7236,8288,7358,8422,8544,9355, 7575,8634,8714,95 66,8873,9737,9814,10457,7746,8726, 8925,9684,9062,9865,9894,10623,9168,9903,9935,10798, 10 243,10887,11094,11841,7893,9059,9118,9929,9287, 10064,10088,10848,9408,10240,10344,11008, 10520, 11155,11228,12011,9562,10416,10572,11239,10719, 11324,11506,12135,10912,11526,1165 5,12259,11756, 12389,12557,13202,6151,7319,7508,8605,7721,8716,8899, 9758,7855,8941,9074,9 906,9198,9962,10010,10835,8092, 9129,9274,10025,9406,10217,10316,10994,9553,10380, 10511,1 1200,10627,11290,11442,12023,8262,9352,9510, 10340,9708,10471,10462,11298,9783,10590,1067 1,11400, 10857,11512,11565,12278,9959,10722,10899,11540, 10998,11681,11760,12439,11121,118 20,11940,12591, 12157,12732,12897,13466,8394,9592,9732,10596,9891, 10708,10863,11528,10211, 10909,11035,11735,11056, 11773,11897,12516,10257,11044,11117,11867,11310, 11931,12098,127 04,11477,12144,12225,12776,12350, 12960,13038,13539,10382,11357,11419,12031,11587, 12169,1 2245,12858,11658,12341,12450,13010,12561, 13117,13239,13733,11953,12459,12600,13136,12755,13280,13345,13908,12867,13414,13505,13986,13620, 14119,14244,14676,6372,7577,7786,8946, 8070,9115, 9257,10126,8137,9300,9437,10230,9575,10360,10558, 11446,8363,9521,9749,10445,98 40,10699,10639,11487, 9915,10752,10875,11644,11023,11705,11793,12485,8782, 9788,9917,10687, 10205,10845,10926,11747,10227,11032, 11084,11796,11164,11899,11976,12653,10265,11144,11266,11966,11468,12090,12210,12789,11552,12311,12345, 12976,12454,13041,13167,13686,8860,10 200,10215, 11004,10282,11046,11192,11918,10409,11320,11410, 12057,11517,12189,12329,12920, 10896,11457,11596, 12220,11667,12377,12464,13028,11910,12474,12608, 13144,12764,13262,133 35,13900,11072,11679,11863, 12386,11955,12581,12672,13194,12115,12724,12808, 13327,12910,1 3421,13531,14040,12236,12876,12996, 13501,13098,13589,13678,14138,13215,13714,13799,14228,13852,14377,14398,14919,8916,10295,10357,11433, 10837,11500,11561,12302,10959,11640,117 26,12411, 11888,12504,12643,13176,11104,11784,11944,12537, 12044,12686,12817,13310,12198,1 2901,12799,13383, 13030,13522,13618,14067,11479,11986,12088,12736, 12269,12836,12985,1348 2,12366,13000,13094,13593, 13156,13629,13742,14213,12566,13125,13231,13698, 13353,13817,1 3885,14324,13438,13970,14024,14445, 14127,14513,14536,14815,11670,12101,12356,13005,12496,13077,13127,13663,12629,13251,13289,13784,13392, 13824,13993,14391,12663,13374,13491,1 3963,13611, 14044,14060,14530,13722,14145,14196,14581,14302, 14689,14753,15070,12929,1357 2,13598,14104,13766, 14153,14235,14611,13844,14317,14341,14739,14465, 14759,14933,15175,1 3927,14428,14499,14847,14597, 14878,14978,15263,14649,15003,15058,15332,15123, 15387,1543 1,15647,6498,6162,5369,7850,6033,7679, 6983,9204,6315,7009,7195,8874,7330,8334,8132,9533,6719,7302,7489,8199,7689,8669,8426,9931,7985,8525, 8751,9391,8979,10222,9714,10824,6852,75 56,7715,8561, 8011,8696,9015,9611,8146,9137,8843,10545,9337,9799, 9979,11778,8306,9043,9457, 9866,9243,10085,10404, 11304,9577,10352,10212,10945,10619,11452,11058, 12446,7142,7904,80 39,8909,8267,9100,9375,10020,8496, 9682,9150,10162,9522,10267,10494,11114,8685,9325, 9851,1 0394,9719,10794,10341,11210,9493,10515,10882, 11354,10694,11914,11533,13016,8856,9835,958 7,10655, 10184,10554,10982,11417,9967,11149,10758,11692, 10935,11585,12307,12063,10301,110 15,11183,12007, 11299,11736,11837,12525,11426,12150,11929,12882, 12264,13350,12708,13889,7 420,8174,8400,9269,8616, 9427,9680,10427,8829,10031,9546,10526,9810,10644, 10853,11618,899 2,9709,10189,10681,9940,11090,10769, 11558,10277,10956,11272,11757,11160,11883,12111,12604,9178,10122,9875,10868,10504,11028,11294,11815, 10399,11466,11100,12338,11405,11997,1202 7,12804, 10659,11261,11641,12107,11523,12187,12418,13426, 11807,12481,12288,12854,12638,13 049,13164,14007, 9401,10235,10579,11201,10367,11308,11574,12142, 10735,11712,11406,12578,1 1847,12221,12404,12974, 10891,11502,11885,12316,12054,12469,12785,13091, 11650,12692,1250 2,13307,12872,13220,13509,14186, 11040,11949,12131,12717,11731,12595,12825,13570, 12242,12 956,13067,13333,12630,13710,13447,14821, 12351,13014,13142,13667,13228,13529,13625,14368, 12894,13789,13859,14102,13941,14617,14240,15353, 7823,8535,8721,9692,9019,10060,9823,108 22,9110,9900, 10480,10977,10198,11138,11274,11925,9366,10312, 10095,11187,10492,11545,1106 3,12049,10705,11321, 11613,12166,11430,12514,12383,13401,9558,10530, 10365,11780,10918,112 96,11443,12195,10646,11510, 11676,12742,11859,12298,12471,13104,11005,11920, 11744,12576,1 2132,12428,12761,13212,12019,12691, 12845,13278,12972,13460,13692,14088,9743,11171, 10609, 11593,10781,11973,11701,12596,11067,11812, 12076,12489,12185,12713,12863,13354,11342,12318,12029,13057,11903,12751,12837,13636,12479,12953, 13121,13471,13219,13563,13805,14419, 11496,12373, 12175,12887,12554,13026,13286,13763,12729,13379, 13075,13659,13153,13982,138 75,14339,12252,13248, 13527,13923,13418,13825,14167,14313,13599,14110, 14008,14565,14284, 14489,14695,15408,10069,10859, 11235,11916,11415,12041,12407,12915,11583,12614, 12120,130 06,12290,12815,13227,13755,11127,12216, 12360,13145,12587,13462,13066,13703,12813,13316, 13398,13948,12949,14142,13865,14925,11789,12440,
12710,13555,12927,13342,13267,14081,125 43,13434,
13675,13905,13586,13994,14225,14505,13131,13644,
13518,14028,13757,14382,14164, 14594,13876,14250,
14432,14736,14346,14668,14983,15173,11941,12753,
12992,13427,12618,137 88,13536,14100,13203,13562,
13933,14203,13669,14279,14456,14801,12856,13832,
13727,14299, 13967,14497,14359,14777,14128,14404,
14635,14719,14560,15055,14953,15288,13324,14048,138
92,14483,14218,14833,14411,14904,13795,14640,14541,
14971,14578,15024,15121,15751,14015, 14813,14743,
15190,14686,15090,15240,15465,14892,15217,15164,
15558,15315,15888,15499,159 98,8390,8884,9233,10151,
9508,10248,10482,11283,9666,10809,10376,11627,10632,
11392,11767, 12399,9847,10521,10991,11464,10743,
12037,11603,12511,11140,11895,12177,13047,11828,1260
6,12733,13478,10006,10967,10832,11724,11178,11873,
12140,12794,11474,12325,11999,12660,12 275,12874,
13184,13653,11330,12205,12085,12851,12426,13112,
12981,13576,12585,13150,13315, 14236,13364,13898,
13803,14481,10327,11030,11438,12032,11722,12154,
12700,12947,11263,122 29,12460,13054,12294,13259,
13081,13730,11665,12533,12609,13456,12362,13182,
13390,13932, 12905,13492,13244,13842,13635,14014,
14159,14667,12018,12683,12986,13331,12823,13556,134
72,14080,13123,13778,13661,13999,13454,14174,14266,
14621,12782,13814,13720,14208,13951, 14406,14325,
14784,13608,14306,14469,15039,14556,14950,14876,
15367,10672,11769,11383,124 19,11572,12966,12330,
13370,12074,12506,12805,13340,12721,13237,13548,
14089,12009,13132, 12847,13687,12679,13487,13443,
14181,13073,13616,13849,14022,13773,14287,14374,
14749,122 66,12935,13208,13568,13304,13918,13739,
14426,12958,13702,14056,14333,13834,14257,14534,
14838,13372,14001,13916,14389,14188,14646,14476,
14910,14150,14552,14766,14965,14682,150 67,15109,
15584,12567,13409,13085,13890,13235,13796,14032,
14490,13480,14271,13984,14449, 14108,14573,14636,
14989,13606,14210,14085,14673,14387,14608,14807,
15278,14307,14888,147 01,15050,14839,15153,15231,
15452,13723,14095,14412,14744,14264,14788,14899,
15128,14549, 15019,14827,15205,14969,15250,15325,
15537,14484,14912,15025,15411,15116,15296,15350,156
66,14865,15381,15477,15626,15517,15703,15796,16048,
11151,11893,11697,12833,12162,12965,1 2744,13546,
12300,12651,13240,13925,13114,13641,13808,14309,
12435,13172,13035,13695,1343 6,14160,13781,14399,
13362,13868,14005,14571,14094,14471,14708,15033,
12701,13464,13323,1 3896,13580,13976,14020,14495,
13191,14072,14224,14713,14354,14659,14616,15085,
13711,1423 3,14418,14601,14315,14771,14845,15185,
14180,14894,14751,15138,14959,15255,15309,15593,1
2925,13269,13747,14217,13552,14135,14395,14726,
13909,14520,14293,14661,13882,14808,1487 1,15200,
13990,14362,14435,15045,14548,14832,14937,15429,
14642,15008,14895,15245,15101,1 5300,15400,15642,
14116,14463,14731,14943,14566,15143,15012,15336,
14819,14975,15186,1536 2,15062,15532,15440,15689,
14680,15133,15241,15456,15301,15574,15524,15767,
15226,15486,1 5629,15833,15589,15730,15862,16081,
13336,13652,13812,14381,14065,14629,14331,14889,1397
5,14477,14457,14995,14588,15075,14964,15391,14193,
14760,14555,14949,14826,15029,15191,1 5357,14723,
15149,15237,15444,15115,15490,15569,15764,14294,
14654,14905,15095,14791,1525 1,15169,15482,14851,
15195,15291,15658,15375,15525,15536,15822,15007,
15346,15425,15566,1 5320,15692,15606,15804,15257,
15622,15724,15920,15680,15846,15908,16170,14503,
14882,1495 5,15340,15098,15236,15420,15577,15043,
15287,15365,15613,15472,15716,15663,15869,15179,1
5404,15483,15700,15528,15637,15760,15950,15541,
15791,15734,15897,15808,15941,15975,1621 9,15305,
15495,15580,15757,15619,15770,15840,15923,15673,
15837,15801,16002,15881,16004,1 5967,16145,15723,
15867,15914,16026,15945,16035,16061,16106,15979,
16065,16089,16128,1611 0,16275,16190,16207,6080,6770,
6900,7740,7056,7765,8059,8800,7244,7955,8182,8961,
8441,916 3,9253,10272,7472,8087,8249,9152,8585,9320,
9608,10324,8745,9595,9452,10447,9860,10578,10 690,
11460,7607,8453,8666,9426,8771,9581,9728,10476,9028,
9793,9896,10592,10169,10807,1090 1,11635,9186,9951,
10247,10865,10314,10979,11087,11738,10440,11107,
11231,11946,11306,1203 9,12181,12860,7898,8477,8905,
9766,9063,9883,10146,10727,9283,10261,9981,10905,
10413,1102 4,11185,11814,9505,10231,10424,11102,
10539,11207,11280,11984,10657,11326,11481,12106,116
24,12228,12358,13053,9763,10451,10603,11257,10817,
11377,11557,12215,10952,11570,11733,12 306,11826,
12445,12545,13200,11134,11801,11962,12487,12004,
12550,12678,13320,12152,12728, 12820,13408,12914,
13497,13640,14238,8319,8892,9092,10195,9372,10298,
10348,11182,9625,10 414,10550,11247,10666,11366,
11428,12203,9849,10562,10701,11389,10876,11547,
11709,12327,1 1012,11711,11811,12415,11972,12530,
12656,13282,10015,10783,10964,11615,11039,11719,1184
9,12501,11234,11958,12015,12564,12147,12719,12784,
13406,11402,12084,12218,12749,12314,12 892,12926,
13489,12457,12991,13141,13596,13242,13699,13894,
14241,10121,10988,11197,11870, 11353,11993,12128,
12740,11470,12161,12249,12850,12359,12922,13046,
13566,11688,12332,124 17,12983,12553,13101,13218,
13737,12637,13255,13349,13821,13435,13931,13998,
14493,11843, 12510,12613,13160,12757,13277,13367,
13867,12912,13397,13495,13964,13604,14013,14166,146
27,13032,13524,13643,14093,13684,14207,14268,14722,
13879,14305,14365,14706,14438,14798, 14917,15275,
8611,9295,9441,10528,9636,10575,10741,11542,9662,
10754,10917,11648,11062,118 24,11879,12648,9991,
10931,11076,11927,11218,11969,12072,12650,11315,
12071,12191,12810,12 335,12902,12952,13486,10079,
11196,11339,11937,11508,12092,12227,12893,11601,
12286,12368, 12964,12443,13088,13179,13672,11578,
12423,12521,13083,12635,13225,13292,13822,12769,133
76,13442,13929,13517,13983,14109,14592,10285,11450,
11509,12265,11675,12403,12513,13056,1 1741,12542,
12593,13207,12688,13314,13389,13921,12173,12659,
12760,13341,12862,13425,1351 5,13972,13003,13545,
13656,14084,13746,14201,14278,14693,12395,12832,
12970,13476,13080,1 3594,13666,14172,13187,13719,
13771,14232,13897,14337,14388,14776,13358,13888,
13937,1436 7,13974,14440,14350,14831,14132,14575,
14628,14940,14644,15074,15137,15341,10398,11660,1
1696,12626,12096,12715,12781,13368,12274,12801,
12870,13459,13001,13554,13651,14177,1237 2,12989,
13070,13561,13152,13668,13754,14249,13256,13780,
13864,14321,13966,14380,14488,1 4850,12646,13090,
13171,13752,13285,13841,13947,14353,13452,13950,
14004,14475,14133,1443 1,14605,14954,13585,14061,
14190,14577,14254,14641,14700,15028,14338,14712,
14710,15118,1 4837,15158,15210,15470,12824,13246,
13378,13954,13551,14011,14107,14517,13658,14173,1421
4,14632,14297,14658,14707,15065,13756,14263,14358,
14694,14403,14718,14842,15161,14511,1 4858,14911,
15220,14992,15292,15335,15592,13922,14371,14459, 14844,14600,14852,14973,1524 4,14622,14962,15038,15318,15100,15373,15450,15678,14664,15079,15152,15399,15194,15459,1 5424,15706,15271,15508,15543,15780,15607,15816,15864,15974,8933,9477,9739,10629,9923,10 940,11078,11855,10066,11111,11223,11924,11350,12059,12081,12881,10109,11340,11437,12048,11519,12406,12466,13025,11764,12475,12625,13190,12697,13296,13386,13958,10136,11495,116 64,12437,11788,12616,12665,13273,11858,12738,12791,13400,12889,13498,13578,14018,11960,1 2843,12945,13533,13063,13649,13701,14147,13109,13674,13787,14261,13813,14314,14373,1492 9,10793,11774,11834,12690,11936,12793,12884,13470,12117,12955,13012,13615,13129,13729,13 777,14185,12261,13021,13169,13691,13266,13810,13831,14283,13338,13837,13858,14385,14055, 14441,14559,14958,12382,13264,13306,13855,13423,13940,13956,14417,13508,14053,14115,14 510,14222,14593,14634,15042,13612,14162,14256,14639,14343,14687,14783,15104,14455,14794, 14862,15163,14914,15225,15303,15582,10839,11901,12061,12934,12238,13013,13149,13744,12 346,13181,13275,13839,13360,13874,13904,14409,12540,13312,13415,13914,13506,14038,14098, 14502,13605,14139,14216,14619,14286,14666,14747,15049,12670,13468,13575,14113,13708,14 192,14187,14671,13759,14265,14311,14725,14422,14787,14812,15171,13872,14345,14448,14800,14504,14875,14916,15248,14572,14948,15010,15319,15114,15383,15455,15688,12772,13634,13 725,14270,13829,14336,14425,14795,14035,14453,14526,14902,14538,14924,14987,15286,14064, 14531,14570,14970,14679,15006,15087,15370,14769,15107,15148,15403,15208,15481,15514,15 714,14141,14705,14734,15053,14825,15120,15157,15439,14864,15204,15254,15504,15304,15549, 15599,15790,15017,15259,15324,15557,15395,15616,15641,15851,15443,15667,15704,15877,15747,15925,15966,16096,11052,12119,12293,13183,12523,13303,13403,13979,12572,13431,13528, 14047,13622,14125,14248,14750,12748,13583,13738,14179,13793,14330,14292,14774,13846,14 361,14434,14857,14519,14887,14934,15272,13065,13762,13848,14322,14030,14415,14462,14909, 14045,14524,14554,14936,14598,14988,15027,15349,14069,14586,14653,15023,14764,15084,15 142,15407,14806,15189,15206,15489,15256,15516,15570,15772,13118,14027,14037,14508,14079,14533,14615,14998,14158,14684,14730,15068,14790,15132,15198,15464,14446,14757,14830,15 146,14868,15221,15261,15511,14994,15267,15328,15560,15398,15609,15635,15849,14547,14873, 14968,15223,15018,15314,15355,15579,15094,15380,15415,15632,15460,15669,15712,15898,15 154,15447,15498,15702,15540,15736,15769,15931,15588,15783,15813,15960,15832,16006,16013, 16161,13162,14087,14123,14742,14410,14780,14810,15184,14480,14855,14898,15235,14982,15280,15345,15573,14563,14930,15013,15295,15061,15361,15418,15625,15136,15457,15412,15657, 15512,15709,15746,15905,14770,15031,15083,15385,15168,15427,15493,15695,15216,15500,15 539,15737,15565,15750,15793,15955,15307,15552,15596,15777,15644,15821,15842,15990,15676, 15872,15893,16027,15927,16049,16054,16133,14870,15089,15211,15502,15277,15531,15553,15 763,15338,15605,15618,15807,15660,15823,15879,16011,15352,15654,15698,15870,15744,15899,15903,16052,15785,15933,15949,16069,15983,16100,16118,16199,15468,15729,15739,15919,15 800,15935,15962,16076,15830,15989,15996,16113,16032,16119,16163,16223,15859,16023,16045, 16143,16073,16149,16177,16244,16088,16181,16196,16257,16212,16269,16279,16318,11168,10 849,10049,12342,10724,12204,11609,13365,10995,11631,11798,13130,11911,12725,12569,13590, 11373,11886,12045,12622,12212,12977,12796,13857,12451,12871,13043,13496,13205,14041,13712,14402,11492,12103,12233,12898,12472,12997,13229,13646,12579,13317,13106,14239,13457, 13769,13883,14927,12702,13252,13542,13811,13394,13955,14155,14674,13624,14120,14036,144 73,14281,14754,14540,15252,11748,12391,12498,13157,12675,13294,13483,13911,12848,13690, 13325,14002,13584,14071,14206,14568,12990,13449,13800,14149,13716,14383,14114,14624,135 64,14219,14439,14703,14327,14996,14796,15507,13115,13790,13631,14300,14016,14245,14494,14733,13877,14590,14364,14881,14468,14824,15187,15071,14090,14514,14609,15040,14672,149 03,14956,15290,14737,15110,15004,15448,15165,15643,15371,15843,11989,12601,12778,13411,1 2941,13520,13689,14169,13095,13919,13601,14226,13775,14295,14420,14843,13213,13709,1401 9,14318,13861,14557,14369,14809,14076,14478,14656,14915,14595,14979,15093,15326,13346,1 3977,13818,14429,14211,14522,14669,14945,14151,14763,14561,15202,14727,15035,15051,15413,14303,14650,14856,15091,14793,15131,15238,15670,14942,15270,15176,15437,15342,15520,1 5568,15886,13502,14050,14259,14620,14131,14677,14818,15106,14352,14890,14728,15313,1496 0,15147,15232,15488,14442,14782,14981,15192,15066,15264,15406,15538,14859,15364,15279,1 5624,15445,15591,15705,15946,14528,15014,15102,15376,14900,15321,15422,15728,15156,1547 9,15527,15634,15339,15781,15679,16135,15209,15505,15559,15765,15595,15711,15748,16003,15453,15810,15834,15918,15863,16078,15964,16262,12321,12878,13017,13696,13232,13939,1378 2,14401,13300,13835,14197,14491,14025,14582,14657,15001,13477,14096,13960,14612,14205,1 4802,14542,15063,14334,14685,14840,15119,14740,15284,15222,15662,13609,14229,14130,1492 8,14458,14670,14748,15134,14296,14785,14872,15388,14966,15182,15266,15544,14509,15000,1 4907,15311,15103,15243,15396,15587,15047,15363,15432,15615,15487,15685,15774,15912,13734,14602,14277,14828,14375,15026,14885,15322,14544,14944,15078,15273,15130,15374,15441,1 5645,14697,15193,15052,15522,14990,15393,15428,15753,15269,15478,15550,15690,15590,1572 6,15815,16021,14778,15219,15124,15451,15302,15510,15617,15799,15382,15655,15530,15761,1 5563,15875,15838,15995,15159,15603,15710,15857,15668,15824,15939,15987,15740,15922,1588 7,16063,15977,16041,16101,16273,13944,14424,14637,14997,14732,15059,15233,15461,14823,15330,15096,15503,15178,15417,15594,15797,14576,15144,15212,15561,15317,15686,15526,1577 9,15416,15628,15661,15865,15476,15932,15835,16162,14931,15249,15372,15721,15467,15639,1 5610,15910,15297,15674,15768,15850,15735,15880,15959,16047,15554,15755,15707,15894,1579 8,16008,15938,16072,15839,15968,16024,16112,15997,16094,16178,16222,15011,15394,15496,1 5671,15333,15809,15713,15917,15583,15725,15861,15952,15766,15976,16029,16129,15438,15825,15787,15982,15871,16044,16000,16124,15928,16015,16083,16107,16062,16195,16168,16247,1 5631,15900,15845,16039,15957,16139,16018,16157,15811,16085,16055,16175,16068,16186,1621 1,16333,15890,16132,16114,16227,16099,16203,16237,16284,16153,16232,16220,16301,16254,1 6353,16292,16365,12771,13138,13388,13996,13573,14058,14199,14662,13679,14392,14136,1484 8,14288,14720,14920,15230,13797,14223,14500,14762,14355,15056,14834,15283,14584,14986,1

5126,15518,14952,15327,15384,15693,13901,14485,
14407,14897,14607,14974,15105,15409,1476 7,15196,
15037,15351,15170,15446,15576,15759,14690,15139,
15081,15435,15242,15546,15491,1 5731,15316,15562,
15627,15963,15650,15848,15814,16038,14105,14523,
14745,15054,14896,1511 2,15368,15474,14652,15150,
15260,15521,15180,15608,15533,15788,14867,15293,
15329,15684,1 5214,15575,15659,15860,15458,15699,
15601,15829,15752,15889,15936,16093,15046,15360,1549
4,15633,15421,15722,15691,15909,15551,15805,15762,
15882,15682,15942,15972,16079,15405,1 5819,15784,
15953,15866,16017,15991,16125,15743,15984,16033,
16191,16060,16167,16148,1626 6,14312,14922,14717,
15239,14816,15485,15199,15652,15077,15282,15414,
15638,15378,15598,1 5719,15913,15041,15555,15434,
15773,15358,15696,15677,15944,15529,15745,15831,
15892,1580 3,15978,16005,16116,15166,15469,15585,
15727,15623,15856,15792,16022,15480,15778,15901,1
5994,15827,15969,16053,16140,15653,15884,15854,
16010,15947,16087,16036,16159,15934,1605 8,16122,
16173,16098,16198,16208,16307,15308,15664,15535,
15844,15597,15812,15896,16042,1 5694,15973,15876,
16028,15921,16067,16084,16179,15741,15954,15911,
16095,16009,16075,1613 0,16245,15985,16151,16102,
16194,16141,16218,16234,16282,15786,15916,16019,
16115,15971,1 6126,16156,16213,16057,16185,16137,
16231,16174,16240,16256,16299,16040,16160,16187,1627
4,16210,16249,16261,16321,16146,16268,16286,16314,
16293,16327,16340,16370,14591,14985,1 4883,15426,
15117,15484,15390,15717,15183,15348,15600,15858,
15548,15754,15817,15986,1524 6,15571,15513,15776,
15675,15937,15806,16014,15648,15836,15885,16066,
15915,16034,16104,1 6189,15369,15687,15630,15847,
15733,15874,15891,16043,15578,15906,15958,16105,
15999,1609 1,16077,16202,15782,15961,16020,16074,
15988,16123,16142,16225,15943,16154,16117,16215,1
6171,16242,16253,16309,15466,15612,15794,15956,
15720,15930,16012,16109,15852,16050,1598 0,16092,
15841,16131,16147,16230,15878,16001,16025,16193,
16056,16138,16164,16278,16086,1 6183,16155,16239,
16206,16250,16271,16317,15924,16031,16111,16165,
16064,16216,16184,1625 8,16134,16176,16226,16264,
16197,16297,16280,16324,16097,16214,16238,16283,
16251,16304,1 6294,16337,16233,16289,16315,16345,
16308,16331,16349,16373,15636,15758,15818,16007,1590
4,16082,15992,16152,15873,16037,16030,16180,16071,
16200,16172,16270,15948,16120,16059,1 6166,16136,
16188,16228,16263,16108,16217,16236,16281,16209,
16290,16303,16336,15981,1609 0,16158,16204,16127,
16241,16221,16287,16144,16229,16248,16319,16267,
16295,16298,16344,1 6182,16260,16277,16302,16255,
16325,16310,16342,16243,16313,16330,16357,16323,
16348,1635 5,16379,16046,16150,16169,16259,16205,
16235,16276,16305,16192,16246,16265,16311,16285,1
6328,16320,16351,16224,16272,16288,16326,16296,
16316,16335,16361,16300,16339,16332,1635 4,16343,
16359,16363,16382,16252,16291,16306,16334,16312,
16338,16347,16358,16322,16346,1 6341,16366,16352,
16367,16362,16378,16329,16350,16356,16368,16360,
16369,16371,16375,1636 4,16372,16374,16377,16376,
16383,16380,16381]

Sequence Group 6: Q6_2048

[0,1,2,4,8,16,32,3,5,64,9,6,17,10,18,128,12,33,65,20,
256,34,24,36,7,129,66,512,11,40,6 8,130,19,13,48,14,72,
257,21,132,35,258,26,513,80,37,25,22,136,260,264,38,514, 96,67,41,144,28,6 9,42,516,49,74,272,160,1026,520,288,
528,192,544,70,44,131,81,50,73,15,320,133,52,23,134,
384,7 6,137,82,56,27,97,39,259,84,138,145,261,29,43,98,
515,88,140,30,146,1028,71,262,265,161,576,45, 100,640,
1025,51,148,46,75,266,273,517,104,162,53,193,1032,152,
77,164,768,268,274,518,54,83, 57,521,112,1024,135,78,
289,194,85,276,522,58,168,139,99,86,60,280,89,290,529,
524,196,141,104 0,101,147,176,142,530,321,31,200,90,
1056,545,292,322,532,263,149,102,105,304,296,1030,
163,9 2,1033,47,267,385,546,324,208,386,150,153,165,
106,55,328,1088,536,577,548,1034,113,154,79,2 69,108,
578,224,166,519,552,195,270,1041,641,1036,523,275,580,
291,59,169,560,114,277,156,87, 1152,197,116,170,61,
1042,531,525,642,281,278,526,177,293,388,1057,91,584,
769,198,172,120,20 1,336,62,282,143,1029,1044,103,178,
294,93,1058,644,202,592,323,392,297,770,107,180,1280,
151, 209,284,1027,648,94,204,298,400,608,1089,352,325,
533,155,210,305,547,300,109,1048,184,534, 1060,537,115,
1090,167,225,326,306,772,157,656,329,110,117,212,171,
1038,776,1064,330,1153,22 6,549,1043,538,387,308,216,
416,271,279,158,337,550,672,1092,118,332,579,540,1072,
389,173,10 37,121,553,199,784,179,228,338,312,1536,704,
1154,390,174,554,581,1046,393,283,122,448,353,5
61,1096,203,63,340,394,1049,1281,527,582,556,181,295,
1059,285,232,124,205,182,643,1156,562, 286,585,299,354,
1045,211,401,1104,185,1061,396,344,586,645,1282,593,
535,240,1050,206,95,32 7,564,800,402,356,307,301,417,
1160,213,1066,568,1120,832,588,1035,1537,186,646,404,
1091,22 7,896,594,418,302,649,771,360,539,111,1052,331,
1168,214,309,1062,1284,188,449,1073,217,408, 609,596,
551,650,229,159,420,310,1093,541,1288,773,610,657,333,
1065,119,1098,600,339,1184,2 18,368,652,1031,230,391,
313,450,542,1538,334,1076,233,555,774,175,123,1155,
658,612,341,777, 220,314,1105,424,1068,395,673,583,355,
1296,1094,287,183,234,1051,125,557,1216,660,616,342,
316,1157,241,778,563,1074,345,452,397,403,1112,207,
1540,674,558,785,1100,432,1039,357,187,1 162,236,664,
1312,624,587,780,1080,1122,705,126,242,1063,565,398,
346,456,358,405,303,569,15 44,244,1158,1097,595,1283,
189,566,676,1169,1054,1108,361,706,589,1344,215,786,
647,348,419,4 06,464,680,801,1069,362,1164,590,409,
1286,570,1121,788,1552,1106,597,1075,572,1186,219,311,
708,598,1289,601,651,421,792,802,611,1047,602,1172,
410,231,688,653,1128,248,1070,369,190,36 4,1568,654,
1095,659,1161,335,480,315,221,370,1285,613,1408,422,
425,451,1077,614,543,1298,2 35,412,343,372,1185,775,
317,1539,222,1099,426,453,237,1124,559,1170,1292,833,
804,712,1082,8 34,661,1053,808,779,1217,617,604,1541,
433,720,816,1101,1176,836,347,897,1136,243,1297,662,1
600,454,318,675,1110,618,1081,898,781,1314,1220,376,
428,1546,665,736,567,1107,1192,1078,84 0,625,238,1159,
359,457,399,787,591,678,434,677,1290,1542,349,1300,
1102,245,1188,458,666,111 3,620,1553,1163,1313,363,
127,1067,191,1125,782,407,436,626,1218,571,465,681,
246,707,1346,3 50,1084,599,668,1548,790,1165,1320,460,
1123,1200,249,682,1664,573,1171,411,803,1116,789,13
04,709,365,440,628,689,374,1224,423,1556,466,793,1130,
250,371,1174,481,574,1348,413,1109,60 3,366,1545,1287,
1055,468,1570,655,900,805,615,1166,684,1409,710,1187,
429,794,252,1114,373,6 05,1232,848,690,713,632,1316,
482,806,1132,1083,427,1177,904,1569,414,1291,223,1126,
1554,66 3,692,835,1328,619,472,1137,455,796,1189,1601,
809,714,1248,721,837,716,1086,1302,1352,864, 810,1173,
606,1194,912,1103,722,696,377,1424,435,1293,1560,817,
1129,1792,319,621,1180,812,4 84,1345,430,1572,1138,
1299,838,667,1219,488,1111,239,378,459,622,1410,627,
437,380,1201,160 8,818,1178,1294,461,1543,496,669, 1190,1317,679,1140,1079,1221,724,841,1305,629,1584,351,46 7,1360,438,1115,737,251,462,442,441,1666,469,1549,247,683,1196,1226,842,1412,1127,738,1144, 1308,899,1602,670,1318,783,1085,849,1555,1193,820,1576,728,928,791,367,1376,901,1233,630,1 321,685,844,1204,633,711,1118,253,691,1301,824,1175,902,686,1668,1222,1416,1133,740,1347,8 50,375,1558,444,1306,470,1167,483,1547,415,485,905,1202,795,473,1240,634,744,1616,852,960, 1322,865,693,1131,1794,1350,797,1225,1604,1571,906,1252,715,1141,1330,807,474,636,1179,694, 254,1550,1665,717,1071,1315,575,913,1440,798,811,379,1208,1353,1191,697,1564,431,1142,607, 1228,489,1324,866,723,486,1573,1181,1234,908,1793,1561,718,813,1364,476,856,1117,1411,839, 1329,1295,1146,725,698,1472,914,1249,752,868,819,1349,814,439,929,1197,1578,490,1139,1680,623,1632,1336,671,1198,1362,739,1603,1557,1413,916,1303,463,1236,843,1135,381,1672,1354,4 97,1586,930,821,726,961,1203,1182,872,1418,492,1250,1332,631,1574,1223,729,1145,1605,700,1 796,443,1307,741,1378,1562,1356,1205,845,1319,920,382,1585,822,1425,851,1229,730,1609,498, 880,1256,742,445,1392,471,635,1148,1696,932,1580,687,1210,1420,1612,1325,1800,903,1134,82 5,1235,1361,500,1577,846,1670,1195,745,826,732,1264,446,962,1426,1620,936,1377,475,853,131 0,867,637,1551,1230,1414,907,1206,1667,1588,1333,487,1808,695,1441,1087,746,828,753,1610,8 54,1237,1326,857,1368,1209,504,799,1355,255,964,1242,909,1673,1559,1309,719,1143,477,1617, 915,1448,1380,638,748,944,1728,1331,1227,869,1592,1428,491,699,1253,1351,754,1183,1565,85 8,1618,1417,1476,478,968,1260,383,1212,910,1801,815,1579,976,870,1684,1633,917,1337,1241,1 606,1824,727,1150,1442,493,1357,1251,1676,873,1384,701,1566,931,1323,1798,1365,1473,756,1 334,860,499,731,1648,1238,823,1575,922,1199,1674,874,1432,1421,918,1636,1254,502,1795,933, 1366,1338,1682,1587,1211,1488,743,1358,760,1244,1581,881,1147,494,1379,1272,702,921,1624, 501,876,1415,847,1856,1444,992,1697,447,1607,1436,1369,1257,1704,733,1797,1669,1340,1231, 827,1590,934,1634,1474,882,937,963,1419,747,1265,1119,505,1381,855,924,1810,734,829,1563,1 213,1611,1363,1430,1258,1688,1386,965,1614,1730,1239,938,884,506,1327,1589,1804,749,1370,1640,945,966,1456,1681,755,1266,859,1427,1593,1388,940,1214,830,1809,911,1621,1582,1832,8 71,639,1480,1698,1335,888,1372,1245,479,1422,1268,946,1732,1677,750,1802,1626,1393,969,50 8,1613,861,1446,1857,1339,757,1382,970,1700,1243,919,1594,1433,1826,1504,875,1635,1259,86 2,1920,1675,1445,758,1149,948,1359,1816,1596,1671,1712,977,1385,923,1622,972,1434,1311,1729,761,1396,877,1207,1475,1449,1812,952,1686,495,1262,1644,1619,1341,1429,1825,703,1371,1 638,1567,1736,935,1685,978,1625,883,762,1246,503,1458,925,1394,1269,878,1478,735,1799,167 8,1860,1443,1637,1481,1373,1699,1255,993,1591,1828,1452,885,939,994,1400,1744,1656,980,16 89,926,764,1270,941,1628,1367,1805,1457,1921,1583,1387,1642,967,1267,1484,1450,886,831,16 83,1342,1811,947,1705,1431,507,1261,1840,889,1650,984,1760,1490,1615,751,1702,942,1858,14 23,1460,1383,996,1692,1641,1814,971,1477,1273,1512,1733,890,1598,1374,509,1806,1922,1649, 949,973,1397,1489,1708,1627,1000,1690,892,1274,1438,1817,1390,1464,1868,950,1151,1731,1506,1827,1597,863,1451,759,1864,1714,1701,1395,1803,1008,1623,1482,1276,510,1435,1652,979,1 492,953,1928,1829,1389,1738,763,1872,974,1453,1643,1713,1818,1215,1402,1629,1520,1830,169 1,954,1459,1734,879,981,1505,1706,982,1924,927,1833,1639,1447,1746,1343,1679,1820,1761,14 79,1275,995,1740,1401,1888,765,956,1496,1861,887,1437,985,1720,997,1630,1813,1462,1398,16 45,1848,1687,1247,1716,1936,986,1483,1651,1745,943,1859,1508,1834,1454,891,1841,998,1595, 1278,766,1465,1709,1764,1646,1737,511,1485,1404,1693,1866,1952,1491,988,1657,1752,1807,13 99,1844,1001,951,1654,1926,1707,1391,1002,1468,1836,1494,1873,1271,1694,893,1923,1461,1748,1715,975,1862,894,1815,1497,1653,1510,1762,1842,1375,1703,1009,1466,1874,955,1739,1486, 1930,1889,1004,1658,1821,1718,1929,1599,1507,1776,1405,1735,1831,1493,1010,1984,1455,957, 1,865,983,1710,958,1514,1876,1768,1721,1938,1660,1500,1403,1892,1819,1741,1516,987,1932,14 63,1012,1843,1749,999,1838,1277,1647,1925,1498,1742,1513,1880,1717,1016,1953,1837,1867,1631,1469,1747,767,1904,1724,1524,989,1406,1754,1822,1835,1499,1944,1863,1890,1467,1003,152 2,1763,1695,1850,990,1005,1937,1722,1845,1495,1655,1765,1956,1487,1750,1869,1521,959,1896, 1263,1940,1770,1877,1509,1711,1756,1846,1011,1960,1784,1870,1662,1013,1985,1753,1927,152 8,1849,1882,1766,1511,1954,1719,1777,895,1439,1006,1878,1891,1939,1661,1502,1986,1852,193 4,1723,1772,1515,1897,1014,1470,1743,1931,1017,1968,1881,1894,1769,1517,1778,1941,1823,1659,1992,1875,1755,1501,1018,1900,1725,991,1933,1839,1525,1955,1988,1884,1726,1948,1780,15 18,1020,1767,1905,1851,1893,1945,1757,1530,1958,1471,1007,2000,1847,1898,1523,1942,1961,1 871,1771,1529,1912,1758,1989,1946,1526,1906,1883,1773,1957,1853,1976,1015,1751,1993,1503, 1962,1781,1885,1908,2016,1854,1532,1972,1774,1019,1895,1987,1969,1782,1279,1943,1899,1994,1663,1964,1785,1021,1935,1886,2001,1407,1779,1990,1970,1879,1022,1902,1947,1759,1907,15 27,1996,1786,1959,2002,1913,1949,2017,1534,1788,1910,1965,2004,1901,1966,1775,2008,1531,1 971,1950,1909,1991,2018,1727,1916,1855,1974,1995,2020,1977,1787,1914,2005,1887,1023,1963, 1998,1783,2024,1980,1903,1973,2003,1789,1997,2032,1978,1917,2010,1519,2019,2006,1951,1911,2021,2009,1790,2026,1975,2012,1967,1915,2025,2022,1981,1918,2033,1999,2028,1533,2011,19 82,2034,1979,2023,2013,2036,2007,2030,2014,2040,1535,2027,2029,2035,2037,1791,2038,2041,1 919,2042,2039,2044,2043,2031,1983,2046,2047,2015,2045]

Sequence Group 6: Z6_2048

[0,1,2,7,3,8,11,24,4,10,13,28,16,33,35,77,5,12,14,32,19,38,47,81,22,46,42,88,57,96,102, 166,6,17,21,40,23,45,51,90,29,55,59,97,72,110,116,184,34,61,75,114,80,123,133,195,87,135,146,2 21,151,232,252,363,9,18,26,54,30,58,71,105,36,76,62,117,84,127,140,204,44,74,86,134,92,143,150,227,100,153,168,244,182,260,277,402,53,89,98,149,111,160,176,257,121,177,194,269,206,291,3 07,433,137,202,224,297,230,308,331,462,249,339,357,483,376,504,541,725,15,25,31,73,39,79,82, 139,48,85,93,148,101,158,163,254,56,94,103,161,115,175,191,272,126,192,203,286,226,304,326,4 51,64,108,122,181,128,193,209,299,147,222,231,310,248,337,351,482,162,240,258,343,270,371,378,501,293,390,420,530,441,558,614,727,69,124,142,212,157,229,247,341,167,250,263,362,278,3 77,401,521,189,273,287,387,309,412,437,568,322,444,467,592,489,624,644,819,208,300,316,424, 344,450,471,607,375,479,502,636,532,648,700,874,399,512,542,675,553,715,737,915,611,751,773, 908,799,951,1005,1192,20,37,41,91,49,95,106,174,50,107,118,185,130,205,213,324,63,119,131,218,144,225,238,325,152,237,253,356,274,374,382,500,67,141,154,220,171,241,259,372,179,267,27 9,384,290,409,428,550,178,288,302,408,321,438,453,593,346,473,490,623,510,642,680,859,78,16 5,172,265,188,284,301,403,196,306,314,435,332,460,477,621,251,327,345,465,364, 487,509,638,3 93,516,546,672,571,712,740,902,283,359,
385,497,407,529,548,702,431,564,578,724,615,762,782,
939,468,613,625,774,639,801,766,965,689,851,875,1016,
881,1081,1115,1229,83,186,190,320,242, 336,350,472,266,
355,365,494,392,518,545,704,280,388,406,519,422,549,
573,730,445,581,606,756, 637,779,817,973,323,410,427,
572,452,599,629,768,492,630,646,813,690,797,865,1022,
527,666,7 08,853,731,880,905,1058,763,911,910,1105,967,
1127,1155,1308,358,442,474,631,517,647,679,829, 547,
703,717,876,748,887,909,1077,574,735,770,903,786,913,
969,1129,827,978,1001,1161,1040,1 201,1226,1385,622,
776,809,971,863,974,1030,1174,872,1026,1062,1215,1094,
1247,1294,1444,88 9,1084,1123,1263,1146,1300,1278,
1463,1189,1331,1352,1516,1396,1544,1581,1667,27,43,52,
99,6 0,120,132,210,66,136,145,217,156,235,239,368,68,
155,164,234,173,285,294,398,198,296,319,432, 334,455,
475,634,70,170,187,289,200,317,328,448,211,340,352,480,
370,505,524,650,223,360,381, 514,404,544,559,694,414,
551,583,734,590,754,777,1011,109,199,207,333,219,353,
369,496,245,38 3,394,536,417,566,580,706,264,397,426,
556,447,588,595,742,464,597,604,781,664,802,845,1024,
281,446,458,602,486,627,633,791,508,663,683,826,720,
860,877,1065,535,699,732,879,764,900,94 3,1097,807,948,
980,1130,1002,1165,1206,1378,112,215,236,379,262,395,
421,570,276,429,449,598, 469,609,617,788,305,459,485,
619,507,658,677,822,533,692,718,870,743,890,927,1068,
329,495,5 23,681,560,709,707,893,575,736,752,916,793,
945,957,1135,608,765,805,952,823,987,1004,1176,8
50,1020,1049,1216,1103,1253,1297,1451,348,540,565,738,
594,761,795,949,655,806,834,997,838, 1008,1037,1199,
667,836,849,1029,897,1048,1088,1244,936,1100,1121,
1264,1153,1314,1336,1470, 693,907,922,1071,962,1107,
1126,1287,981,1151,1179,1328,1207,1356,1391,1525,
1053,1181,1219, 1363,1260,1402,1419,1571,1289,1435,
1461,1591,1493,1628,1661,1772,129,246,268,430,303,457,
481,641,312,488,513,661,537,686,729,929,342,525,569,
705,585,759,745,938,600,771,798,977,830, 991,1014,1190,
405,576,601,757,654,790,810,1000,660,833,843,1015,862,
1038,1057,1233,668,85 6,884,1055,934,1087,1117,1267,
954,1143,1152,1319,1180,1337,1371,1509,416,653,657,
824,671,8 37,869,1044,698,898,919,1079,946,1112,1148,
1303,804,931,964,1119,983,1162,1183,1333,1041,1 186,
1222,1365,1262,1398,1415,1569,842,986,1028,1164,1054,
1212,1236,1377,1092,1251,1272,14 12,1301,1437,1468,
1607,1124,1292,1324,1460,1351,1484,1508,1632,1382,
1519,1541,1656,1556,1 693,1700,1831,425,673,685,925,
789,941,956,1141,815,975,995,1169,1034,1195,1231,1373,
847,10 12,1051,1203,1075,1239,1275,1407,1114,1298,
1269,1429,1334,1465,1492,1613,937,1059,1086,12
55,1133,1280,1321,1456,1159,1325,1350,1485,1369,1495,
1527,1651,1208,1359,1388,1513,1421,1 548,1563,1681,
1442,1586,1604,1712,1629,1732,1736,1804,984,1089,
1156,1326,1193,1346,1360,1 504,1227,1395,1404,1536,
1431,1549,1593,1698,1235,1427,1458,1584,1490,1608,
1611,1734,1521, 1634,1647,1749,1674,1776,1791,1867,
1306,1480,1486,1624,1532,1636,1658,1755,1554,1680,168
6,1786,1717,1792,1833,1888,1577,1709,1729,1814,1752,
1819,1846,1909,1765,1850,1864,1922,18 78,1934,1943,
1982,138,113,65,275,104,255,180,470,125,183,201,418,
216,338,311,528,159,214,23 3,318,256,386,354,603,292,
366,400,503,434,659,562,785,169,243,261,373,295,391,
439,543,313,4 61,413,726,493,577,612,1009,335,443,515,
589,478,632,697,895,538,684,656,812,741,930,839,117
8,197,282,298,423,330,454,499,618,361,555,463,645,526,
669,714,848,389,491,587,695,563,780,6 82,873,520,719,
800,906,758,1042,950,1330,415,584,539,749,649,728,820,
921,610,857,772,988,81 1,961,1142,1080,674,828,867, 1063,894,998,1023,1200,923,1101,1047,1293,1131,1420,
1245,1564, 228,315,349,484,380,511,554,701,411,620,531,
722,579,746,792,970,436,561,651,755,605,844,775, 955,
670,814,885,1003,861,1032,1091,1220,466,640,591,796,
716,831,891,1019,696,933,846,1150, 917,1060,1069,1270,
750,882,976,1090,947,1111,1170,1438,1017,1188,1136,
1285,1230,1339,1370, 1598,506,662,733,871,688,896,959,
1099,767,992,918,1211,1025,1120,1167,1318,803,942,
1033,11 44,1078,1184,1266,1349,979,1241,1194,1406,
1290,1384,1462,1644,835,1052,1095,1249,996,1217, 1277,
1479,1125,1312,1343,1414,1228,1517,1445,1806,1154,
1329,1364,1505,1387,1467,1494,169 1,1296,1538,1557,
1623,1580,1757,1660,1927,271,367,396,557,440,626,582,
784,456,596,710,818, 652,854,886,1046,498,676,635,868,
713,953,840,1076,760,899,968,1106,924,1198,1163,1433,
534,7 23,687,1010,808,892,928,1113,747,944,985,1256,
1027,1139,1185,1353,825,1045,999,1210,1096,1 173,1261,
1381,1067,1240,1282,1401,1317,1448,1511,1618,567,864,
739,963,778,1056,990,1218,8 41,1018,1083,1191,1110,
1248,1288,1422,904,1145,1070,1341,1039,1258,1281,
1497,1187,1311,13 57,1452,1383,1477,1543,1707,940,
1160,1108,1295,1205,1332,1403,1531,1252,1428,1345,
1502,13 68,1589,1560,1685,1128,1394,1466,1575,1436,
1550,1640,1678,1487,1626,1599,1744,1669,1725,1 777,
1938,628,794,878,1043,920,1074,1168,1302,960,1224,
1093,1327,1137,1274,1386,1529,852,11 18,1157,1366,
1214,1449,1342,1515,1273,1409,1432,1582,1310,1633,
1558,1832,1013,1177,1246,1 474,1305,1418,1399,1616,
1204,1440,1507,1570,1483,1594,1655,1731,1361,1499,
1464,1605,1530, 1695,1639,1751,1561,1662,1710,1785,
1687,1770,1847,1887,1050,1259,1323,1439,1225,1537,146
9,1622,1379,1476,1579,1648,1506,1668,1714,1800,1286,
1551,1523,1673,1585,1728,1689,1796,16 30,1702,1760,
1781,1743,1863,1838,1912,1411,1609,1566,1723,1653,
1810,1704,1827,1539,1762,1 737,1844,1748,1855,1877,
1997,1601,1803,1787,1892,1775,1870,1902,1948,1823,
1897,1885,1965, 1919,2017,1956,2029,347,419,476,643,
522,665,711,888,552,783,691,972,744,914,1006,1166,586,
721,821,932,769,1073,966,1197,855,1036,1109,1338,1021,
1221,1254,1454,616,816,787,994,866,1 031,1098,1268,
935,1147,1061,1234,1134,1291,1375,1501,901,1116,1085,
1284,1172,1354,1320,14 81,1213,1367,1408,1659,1424,
1568,1542,1722,678,832,926,1072,993,1102,1242,1309,
883,1122,11 82,1340,1138,1397,1347,1524,982,1202,1223,
1447,1158,1374,1430,1578,1299,1459,1393,1553,14
96,1600,1637,1769,1066,1238,1322,1413,1276,1475,1453,
1615,1358,1534,1503,1595,1446,1641,1 665,1758,1265,
1547,1520,1649,1583,1703,1682,1797,1489,1675,1718,
1859,1742,1837,1818,1931, 753,1007,912,1171,958,1316,
1149,1425,1082,1196,1271,1417,1250,1390,1472,1619,
1064,1362,12 83,1510,1237,1457,1443,1643,1344,1491,
1555,1603,1533,1670,1692,1789,1132,1307,1380,1478,1
405,1574,1526,1708,1313,1514,1610,1684,1552,1663,
1735,1811,1426,1596,1573,1697,1645,1764, 1720,1829,
1635,1740,1794,1842,1774,1866,1874,1971,1209,1434,
1348,1565,1389,1540,1606,172 6,1455,1666,1590,1713,
1625,1747,1761,1848,1488,1650,1617,1771,1696,1754,
1801,1910,1676,18 21,1778,1862,1812,1884,1899,1946,
1522,1621,1705,1788,1664,1798,1826,1879,1739,1854,
1808,1 896,1843,1905,1921,1963,1724,1830,1856,1939,
1876,1914,1926,1985,1816,1933,1950,1978,1957, 1991,
2004,2034,858,1035,989,1279,1104,1315,1257,1471,1140,
1232,1392,1576,1355,1498,1545,1 677,1175,1372,1335,
1512,1441,1638,1535,1701,1423,1559,1597,1746,1620,
1719,1779,1858,1243, 1450,1410,1567,1482,1588,1602,
1727,1376,1614,1654,1780,1688,1767,1756,1869,1518,
1657,170 6,1753,1679,1795,1813,1890,1642,1824,1790, 1881,1840,1907,1918,1973,1304,1400,1528,1652,14
73,1631,1699,1783,1572,1733,1671,1768,1562,1802,1817,
1895,1592,1690,1711,1861,1738,1809,1 834,1942,1763,
1852,1825,1904,1873,1915,1936,1981,1627,1716,1784,
1835,1745,1882,1853,1923, 1805,1845,1891,1929,1865,
1961,1944,1988,1773,1880,1903,1947,1916,1968,1958,
2001,1898,195 3,1979,2009,1972,1995,2013,2037,1416,
1500,1546,1694,1612,1759,1683,1822,1587,1721,1715,18
49,1750,1868,1841,1935,1646,1793,1741,1836,1807,1857,
1893,1928,1782,1883,1901,1945,1875,1 954,1967,2000,
1672,1766,1828,1871,1799,1906,1886,1951,1815,1894,
1913,1983,1932,1959,1962, 2008,1851,1925,1941,1966,
1920,1989,1974,2006,1908,1977,1994,2021,1987,2012,
2019,2043,173 0,1820,1839,1924,1872,1900,1940,1969,
1860,1911,1930,1975,1949,1992,1984,2015,1889,1937,19
52,1990,1960,1980,1999,2025,1964,2003,1996,2018,2007,
2023,2027,2046,1917,1955,1970,1998,1 976,2002,2011,
2022,1986,2010,2005,2030,2016,2031,2026,2042,1993,
2014,2020,2032,2024,2033, 2035,2039,2028,2036,2038,
2041,2040,2047,2044,2045]

Sequence Group 6: Q6_4096

[0,1,2,4,8,16,32,3,5,64,9,6,17,10,18,128,12,33,65,20,
256,34,24,36,7,129,66,512,11,40,6 8,130,19,13,48,14,72,
257,21,132,35,258,26,513,80,37,25,22,136,260,264,38,514,
96,67,41,144,28,6 9,42,516,49,74,272,160,1026,520,288,
528,192,544,70,44,131,81,50,73,15,320,133,52,23,134,
384,7 6,137,82,56,27,97,39,259,84,138,145,261,29,43,98,
515,88,140,30,146,1028,71,262,265,161,576,45, 100,640,
1025,51,148,46,75,266,273,517,104,162,53,193,1032,152,
77,164,768,2048,2049,268,274, 518,54,83,57,521,112,
1024,135,78,289,194,85,276,522,58,168,139,99,86,60,280,
89,290,529,524,1 96,141,1040,101,147,176,142,530,321,
31,200,90,1056,545,292,322,532,263,149,102,105,304,296,
1030,163,92,1033,47,267,385,546,324,208,386,150,153,
165,106,55,328,1088,536,577,548,1034,11 3,154,79,269,
2050,2052,108,578,224,166,519,552,195,270,1041,641,
1036,523,275,580,291,59,205 6,2064,169,560,114,277,156,
87,1152,197,116,170,61,1042,531,525,642,281,278,526,
177,293,388,1 057,2080,2051,91,584,769,198,172,120,201,
336,62,282,143,1029,1044,103,178,294,93,1058,644,2
02,592,323,392,297,2053,2112,770,107,180,1280,151,209,
284,1027,648,94,204,298,400,608,1089, 352,325,533,155,
210,305,547,300,109,1048,184,534,1060,537,115,1090,
167,225,326,306,772,157, 656,329,110,2057,2054,117,212,
171,1038,776,1064,330,1153,226,549,1043,538,387,308,
216,416,2 71,279,2065,2058,158,337,550,672,1092,118,
332,579,540,1072,389,173,1037,121,553,199,784,17 9,228,
338,2066,2176,312,1536,704,1154,2060,2081,390,174,554,
581,1046,393,283,122,448,353,5 61,1096,203,63,340,394,
1049,1281,527,582,556,181,295,1059,285,232,2113,2068,
124,205,182,64 3,1156,562,2304,2082,286,585,299,354,
1045,211,401,1104,185,1061,396,344,586,645,1282,593,53
5,240,1050,206,95,327,564,800,2072,2084,402,356,2055,
2177,307,301,417,1160,213,1066,568,11 20,832,588,1035,
1537,186,646,404,1091,227,896,594,418,302,649,2114,
2560,771,360,539,111,105 2,331,1168,214,2059,2088,309,
1062,1284,188,449,1073,217,408,609,596,551,650,229,
159,420,31 0,1093,541,2116,2178,1288,773,610,657,333,
1065,119,1098,600,339,1184,218,368,652,1031,230,3
91,313,450,542,1538,334,2067,2061,2096,2062,1076,233,
555,774,175,123,1155,658,2120,2305,61 2,341,777,220,
314,1105,424,1068,395,673,583,355,1296,1094,287,183,
234,1051,2069,2180,125,5 57,1216,660,616,342,2083,
2306,316,1157,241,778,563,1074,345,452,397,403,1112,
207,2074,2561, 1540,674,558,785,1100,432,1039,357,187,
1162,236,664,1312,624,587,780,1080,1122,2128,2085,7
05,126,242,1063,2073,2070,565,398,346,456,2184,2308,
358,405,303,569,1544,244,1158,1097,595, 1283,189,566,
676,1169,1054,1108,361,706,589,1344,215,786,647,348,
2312,2086,419,406,2562,2 144,464,680,2115,2089,801,
1069,362,1164,2192,2076,590,409,1286,570,1121,788,
1552,1106,597, 1075,572,1186,219,311,708,598,1289,601,
651,421,792,802,2117,2090,611,1047,602,1172,410,231,
688,653,2564,2097,1128,248,1070,369,2122,2320,190,364,
1568,654,1095,659,1161,335,480,315,2 21,370,1285,613,
1408,422,2208,3074,425,451,2568,2336,1077,614,543,
1298,235,412,343,372,257 6,2240,1185,775,317,1539,222,
1099,426,453,237,1124,559,1170,2592,2118,1292,833,804,
712,108 2,834,661,1053,2092,2179,2129,2098,808,779,
1217,617,604,1541,433,720,816,1101,2121,2063,11
76,836,347,897,1136,243,1297,662,1600,454,318,675,
2368,2181,1110,618,1081,898,781,1314,122 0,376,428,
1546,2100,2071,665,736,567,1107,2182,2432,1192,1078,
2124,2185,840,625,238,1159,3 59,457,399,787,2130,2104,
591,678,434,677,1290,1542,2075,2145,349,1300,1102,245,
1188,458,66 6,1113,620,1553,1163,1313,363,127,1067,
191,1125,782,407,436,2087,2307,626,1218,2132,2186,5
71,465,2193,2309,681,246,707,1346,2077,2091,2146,2563,
350,1084,599,668,1548,790,2136,2188, 1165,1320,460,
1123,1200,249,682,1664,573,1171,411,803,1116,789,1304,
709,365,440,628,689,20 78,2194,374,1224,3076,2119,423,
1556,466,793,2310,2313,2209,2624,1130,250,371,1174,
2093,214 8,481,574,1348,413,1109,603,366,1545,1287,
1055,468,1570,655,900,805,615,1166,684,1409,710, 2688,
3073,1187,429,2099,2196,794,252,1114,373,605,1232,848,
690,2094,2123,713,632,2314,2321, 1316,482,806,1132,
2565,2152,1083,427,1177,904,1569,414,2210,2101,1291,
223,1126,1554,663,6 92,835,1328,619,472,2241,3080,
1137,455,2200,2125,796,1189,1601,809,714,1248,721,837,
716,10 86,2212,2816,1302,1352,864,810,1173,606,1194,
912,1103,722,696,377,2316,2322,1424,435,2566, 2102,
1293,1560,817,1129,1792,319,621,1180,2131,2105,2569,
2160,812,484,1345,430,1572,1138,3 072,2183,1299,838,
667,1219,2126,2337,488,1111,239,378,459,622,1410,627,
2242,2133,437,380,1 201,1608,818,1178,2324,2570,1294,
461,1543,496,669,1190,1317,679,2106,2216,1140,1079,
2187,2 147,1221,724,841,1305,629,1584,2134,2108,351,
467,2328,2137,1360,438,1115,737,2338,2577,25 1,462,
442,441,2572,2244,1666,469,1549,247,683,1196,2189,
3088,2149,2195,1226,842,1412,1127, 738,1144,2224,2190,
1308,899,1602,670,1318,783,1085,849,1555,1193,820,
1576,728,928,791,367, 2578,2369,1376,901,2079,2248,
2138,3104,1233,630,2593,2340,1321,685,844,1204,633,
711,2370, 2580,2311,2197,2150,2153,1118,253,691,1301,
824,1175,2352,2344,902,686,1668,1222,1416,1133, 740,
1347,850,375,1558,444,1306,470,1167,483,1547,415,3078,
2211,485,905,2140,3081,1202,795, 473,1240,2095,2315,
634,744,2433,2594,1616,852,2372,2256,2434,2198,960,
1322,2201,2213,865, 693,2154,2103,1131,1794,1350,797,
1225,1604,1571,906,2376,3136,1252,715,1141,1330,807,
474, 636,1179,694,254,1550,1665,2584,2625,717,1071,
2596,3082,1315,575,913,1440,798,811,379,120 8,2161,
2202,1353,1191,2127,2317,697,1564,431,1142,607,1228,
2156,2626,489,1324,2272,2214,8 66,723,2567,2600,486,
1573,1181,1234,908,1793,1561,718,813,1364,2243,2318,
476,856,3089,268 9,1117,1411,839,1329,1295,1146,3084,
2571,725,698,1472,914,2323,2628,1249,752,868,819,1349,
814,439,929,2339,2107,1197,1578,490,1139,2217,2608,
1680,623,2162,2325,1632,1336,671,1198,1 362,739,2204,
2135,1603,1557,3200,2245,2164,2218,1413,916,1303,463,
1236,843,2109,3090,1135, 381,1672,1354,2579,2573,497,
1586,930,821,2690,2329,726,961,1203,1182,2326,2574, 872,1418,4 92,1250,1332,631,2225,2341,2436,3105,1574,
1223,729,1145,1605,700,2139,2632,1796,443,2817, 2246,
1307,741,2220,2168,1378,1562,1356,1205,845,1319,2249,
2384,920,382,2110,2330,1585,822, 1425,851,2191,3077,
3092,2151,1229,730,1609,498,2226,2342,880,1256,742,
445,1392,471,2141,3 106,2692,2250,2640,2371,635,1148,
1696,932,1580,687,2440,2345,1210,1420,1612,1325,1800,
903, 1134,825,1235,1361,500,1577,846,1670,1195,745,
2818,2155,2228,3328,826,732,2199,2257,2332, 3075,1264,
446,2696,2142,962,1426,1620,936,2252,2346,1377,475,
2448,2656,3137,2400,2373,258 1,853,1310,867,637,2203,
2258,1551,1230,2353,2595,1414,907,1206,1667,1588,
1333,487,1808,23 48,2157,695,1441,1087,746,828,753,
1610,854,1237,1326,3096,2232,857,1368,2582,3108,1209,
50 4,799,1355,2585,2163,255,964,3138,2215,2273,2374,
1242,909,2354,2820,2205,2704,1673,1559,1 309,719,2377,
2158,1143,477,2165,2260,1617,915,1448,1380,2219,3086,
638,748,2824,3112,944,1 728,1331,1227,869,1592,1428,
491,699,1253,1351,754,2378,3201,1183,1565,2274,2597,
858,1618, 1417,1476,3091,2586,478,968,1260,383,2435,
2356,1212,910,1801,815,2264,2464,1579,976,2319, 2327,
870,1684,1633,917,2206,2385,2598,2720,3140,2166,1337,
1241,2380,2627,1606,1824,727,11 50,1442,493,1357,1251,
2588,3120,1676,873,2437,2221,1384,701,3085,2169,1566,
931,1323,1798, 1365,1473,2601,2247,756,1334,860,499,
2832,2227,731,1648,1238,823,1575,922,1199,1674,2276,
2386,874,1432,1421,918,2360,3584,2752,3202,1636,1254,
2438,2222,502,1795,2602,2629,933,136 6,3094,2441,1338,
1682,2331,2170,2496,2401,1587,1211,1488,743,1358,760,
2609,3144,1244,1581, 881,1147,2251,2111,494,1379,1272,
702,2388,2442,3097,3329,921,1624,501,876,2575,2630,
1415, 847,1856,1444,992,1697,2604,2229,2343,3107,2333,
2280,447,1607,1436,1369,2172,2253,1257,17 04,2230,
2691,733,1797,3204,2610,1669,1340,1231,827,1590,934,
2334,2633,1634,1474,2347,2402, 3093,2259,882,937,2449,
3152,2233,3109,963,1419,747,1265,2444,2392,1119,505,
1381,855,2634, 2693,924,1810,3330,2641,2583,2288,3098,
2254,734,829,1563,1213,2143,2375,1611,1363,2612,28
48,1430,1258,1688,1386,965,1614,1730,1239,2450,2404,
938,884,506,1327,1589,1804,2355,2349, 2465,3208,749,
1370,2261,3114,2616,3168,1640,945,2880,2636,966,1456,
1681,755,3083,3585,223 4,2694,1266,859,2452,3139,2275,
2944,2642,2466,1427,1593,1388,940,2350,2697,1214,830,
2819, 2408,1809,911,1621,1582,2587,2159,1832,871,3100,
2379,639,1480,1698,1335,888,1372,1245,479, 1422,1268,
3216,2262,946,1732,2357,3110,1677,750,1802,1626,3332,
2236,2497,3121,1393,969,2 265,2456,2657,2644,508,1613,
2599,2698,2277,2207,861,1446,2468,2358,1857,1339,
3141,2589,75 7,1382,3336,2821,970,1700,2658,2705,2381,
3113,1243,919,2167,3146,1594,1433,1826,1504,875, 1635,
1259,862,2648,2387,1920,1675,3232,2266,1445,758,2416,
2700,1149,948,1359,1816,3079,22 78,1596,1671,1712,977,
2439,2361,1385,923,1622,972,2498,2590,1434,1311,3586,
2382,1729,761, 1396,877,3124,2281,2603,2822,2223,2171,
3203,2706,1207,1475,2660,2389,1449,1812,952,1686,2
825,2268,495,1262,2362,3153,1644,1619,2472,3116,1341,
1429,2443,2721,1825,703,1371,1638,15 67,1736,2631,
2403,935,1685,978,1625,3344,3142,883,762,1246,503,
2335,2231,1458,925,1394,12 69,2282,3099,878,1478,735,
1799,2173,2605,3264,2708,2664,2390,1678,1860,2364,
3205,2289,282 6,2611,3122,1443,1637,2393,2500,1481,
1373,2445,2451,3160,2255,1699,1255,993,1591,1828,145
2,3588,2722,885,939,994,1400,2606,2833,3148,2480,1744,
1656,3087,2405,2235,3210,980,1689,9 26,764,2284,2712,
1270,941,1628,1367,1805,1457,3360,2672,2635,2828,
3128,3170,1921,1583,275 3,2174,1387,1642,2290,3111,
967,1267,2613,2446,1484,1450,2394,2504,886,831,1683,
1342,1811,9 47,2406,2453,2351,2617,3592,2292,1705,
1431,3206,3145,2643,3331,507,1261,1840,889,2237,261
4,1650,984,1760,1490,2724,3217,3102,3156,1615,751,
2409,2754,2637,3392,2263,2834,1702,942, 1858,1423,
2695,2396,1460,1383,2467,2454,996,1692,1641,1814,971,
1477,2512,2728,1273,1512,1 733,890,1598,1374,2849,
3117,2410,3212,509,1806,2638,2457,3334,2618,1922,
1649,3169,2836,36 00,3154,949,973,2645,3123,2620,3234,
1397,1489,2267,2359,2756,2646,3337,2649,1708,1627,269
9,2469,1000,1690,2840,2850,892,1274,2659,3095,1438,
1817,2650,3220,2458,2279,1390,1464,273 6,2701,1868,
950,1151,1731,1506,1827,1597,863,3176,2296,3118,2417,
1451,759,2238,2412,1864, 1714,3616,2702,3143,2707,
1701,1395,3209,2383,2528,2363,1803,1008,2269,2418,
3333,2661,162 3,1482,3456,2470,1276,510,2473,2499,
1435,1652,3125,2662,2591,3346,2283,2460,2391,2420,
979, 1492,3233,2823,953,1928,1829,1389,2365,3587,1738,
763,2270,3147,1872,974,2474,2501,1453,1 643,2285,3172,
1713,1818,1215,1402,2607,3218,1629,1520,1830,1691,
3340,2881,954,1459,1734,8 79,2852,2760,3130,2882,981,
1505,2709,3101,1706,982,2856,2827,3265,2665,2652,
3589,2481,276 8,2864,3149,1924,927,3224,2884,1833,
1639,2395,2945,3184,2291,1447,1746,3345,2710,1343,167
9,3648,2502,2366,2723,1820,1761,1479,1275,995,1740,
3158,2666,1401,1888,765,956,3129,2946, 2829,3362,1496,
1861,3268,2424,887,1437,985,1720,2476,3594,997,1630,
1813,1462,2713,2784,26 15,3155,3240,3126,1398,1645,
2888,2673,2286,3207,2407,2505,2447,2835,1848,1687,
2639,2726,1 247,1716,2482,2725,3338,3590,1936,986,
1483,1651,1745,943,2397,3348,1859,1508,3150,2293,32
36,2506,1834,1454,2714,3161,2668,3601,891,1841,998,
1595,3211,3361,1278,766,1465,1709,2411, 2175,1764,
1646,3115,2239,3173,2830,2455,2484,1737,511,2674,
3266,1485,1404,2619,2513,1693, 1866,2729,2294,2755,
3394,1952,1491,988,1657,1752,1807,2398,3132,2647,
2716,3596,2838,1399, 1844,3213,3368,2508,3171,1001,
951,1654,1926,3248,2297,2730,3712,1707,1391,2621,
3219,2459, 2851,1002,1468,3164,2837,3352,2757,2413,
2488,1836,1494,1873,1271,2676,2737,1694,893,2422,
3272,1923,1461,2471,3604,1748,1715,2514,2841,975,
1862,894,1815,3178,2298,2419,3222,1497, 1653,2529,
2622,3396,2461,3157,2651,2414,3593,1510,1762,3335,
3103,2516,3618,1842,1375,270 3,2948,2853,2663,3214,
2732,1703,1009,3457,2758,1466,1874,3235,2477,955,
1739,2842,2300,316 2,2421,2653,3280,2896,2738,1486,
1930,2761,2680,1889,1004,1658,1821,1718,1929,3364,
2530,28 54,3180,1599,1507,3131,2475,1776,1405,3225,
2952,3617,2462,1735,1831,3339,2271,3174,3602,1 493,
1010,2711,2740,2883,3376,1984,1455,2667,2520,957,
1865,3185,2503,2844,3237,3649,2857,2 762,3296,2769,
2885,2764,3134,983,1710,3350,3400,958,1514,2912,2858,
3221,2654,1876,1768,32 42,2960,1721,1938,3151,2770,
2744,2425,1660,1500,1403,1892,3472,2483,1819,1741,
1516,987,33 41,3608,1932,1463,2865,3177,3840,2367,
1012,1843,2669,3228,1749,999,2860,2532,3393,2478,36
20,3186,3347,2886,2715,3267,1838,1277,2536,3159,2287,
2426,2507,2670,3458,2675,1647,1925,2 485,2428,1498,
1742,3249,3656,2866,3226,1513,1880,1717,1016,1953,
1837,3342,2509,1867,1631, 3591,2544,2717,3238,1469,
1747,3365,2727,767,1904,1724,1524,3188,3127,989,1406,
1754,1822,3 269,2772,2889,3353,2677,3632,2399,2515,
3408,2486,3163,2785,2299,2510,2490,2489,1835,1499,
3714,2517,3597,2295,2731,3244,1944,1863,1890,1467,
1003,1522,3274,2890,3460,3175,2786,319 2,1763,1695,
3356,2947,3650,2718,1850,990,1005,1937,3366,2831,
3133,2897,1722,1845,3603,324 1,1495,1655,2868,3624,
2776,2976,2839,2415,1765,1956,3424,2949,1487,1750, 3281,2678,1869,15 21,3369,2733,2892,3252,2681,2759,959,1896,1263,1940,3166,2301,2739,3349,2872,3223,1770,18 77,2950,2734,3716,3270,1509,1711,3464,3181,2788,3395,1756,1846,2898,2423,3606,2492,1011,1 960,3354,2518,3215,2531,3595,2463,1784,1870,1662,1013,2533,2953,1985,1753,3250,2843,2521, 3288,2682,2792,1927,1528,3664,2900,1849,1882,3008,3370,2913,2741,1766,1511,3179,3842,339 8,2845,3273,3652,3619,2954,1954,1719,3300,2763,3189,3378,1777,895,2855,2522,2684,3227,274 2,2302,1439,1006,3598,3713,1878,1891,2765,3119,3363,2623,2961,3488,2846,2859,2427,3256,1939,1661,3401,3239,1502,1986,2745,3612,1852,1934,2479,3190,2655,3276,2537,3372,1723,1772,2 914,2771,1515,1897,2534,3621,3229,3282,2956,3841,3609,2766,1014,1470,2861,3412,1743,1931, 2524,2904,3165,3459,2887,3377,3343,3194,2773,2746,3520,2962,1017,1968,3297,2800,2916,286 7,3397,2862,2487,2977,1881,1894,3245,3626,1769,1517,2538,3187,1778,1941,1823,1659,3728,2671,1992,1875,3680,3384,1755,1501,2719,3246,3410,2787,1018,1900,3651,3605,1725,991,3461,29 64,3351,2511,3284,2891,3183,2429,3720,3402,2545,3634,2978,2869,2774,3009,3251,3230,1933,1 839,2920,3466,2540,3298,3380,2679,1525,1955,1988,1884,1726,1948,3622,3271,2777,3193,3653, 2748,1780,1518,3844,2491,1020,1767,1905,1851,3355,2789,1893,1945,3426,3610,3404,3253,2893,3367,2968,2430,3633,2870,3473,2899,3277,2778,3657,2546,1757,1530,2928,3304,2790,2493,34 40,2519,1958,1471,1007,2000,2683,3196,3744,2980,3628,2735,1847,1898,3258,3468,3660,3373,1 523,1942,3848,2951,3182,2873,1961,1871,3283,3409,1771,1529,2548,3625,2894,3718,3243,2793, 1912,1758,2874,2780,1989,1946,3312,2494,3010,3474,3668,2984,3425,2523,1526,1906,2901,3358,2915,2685,3599,3278,1883,1773,3462,2955,3254,3715,3636,3381,2535,3856,1957,1853,2743,34 89,3135,2794,1976,1015,2876,2801,3658,2902,3285,3374,1751,1993,1503,1962,2905,3416,3257,2 552,2847,3403,2303,3012,1781,1885,3290,2957,1908,2016,3721,3607,3357,2767,3191,2525,3665, 2963,3496,3428,2686,2796,1854,1532,2992,3776,3379,3275,2917,3640,3476,2539,2747,3301,1972,1774,3399,2802,1019,1895,3231,3613,2906,3666,3465,3524,2526,3016,3308,2431,1987,1969,32 60,2958,3849,2863,3627,3024,1782,1279,2918,3732,3681,2965,1943,1899,3385,3289,1994,1663,3 654,3872,2775,3198,3490,2541,3405,3299,1964,1785,3724,2921,1021,1935,3432,2749,3614,2979, 3371,3846,3413,3521,2804,3382,2908,2547,2779,3696,3286,2871,3623,2970,3247,3722,1886,2001,2922,3480,3469,2966,1407,1779,1990,1970,3684,3302,2550,3843,1879,1022,2981,3414,1902,19 47,3386,3730,3635,3259,3536,2791,3406,2808,3292,3629,2929,3195,2542,3427,3320,2750,2969,3 672,2549,2924,1759,1907,3463,2895,3904,3492,3040,3745,1527,1996,1786,1959,2495,3655,3484, 3417,2002,1913,3305,3752,1949,2017,2781,3845,1534,1788,3717,3388,3279,2875,3638,2982,3682,3522,2930,2985,3011,3467,2795,3313,3167,2553,3429,2903,2972,3858,1910,1965,2782,2877,36 11,3261,3659,3411,2004,1901,3478,3306,3736,3434,3013,3662,3778,3287,1966,1775,2986,2932,2 008,1531,2554,3375,3637,3852,1971,1950,2797,3418,3688,2993,3014,3504,3729,2803,3314,2907, 1909,1991,3475,3641,3436,2988,3262,2878,3857,2959,3669,3630,3880,2919,2018,1727,2687,3528,3746,3383,2936,3420,3293,2527,3470,3316,1916,1855,1974,1995,2994,3780,3725,2798,3850,36 74,3441,3017,2020,1977,2556,3661,2909,3494,3905,3387,2805,3430,3018,3748,3291,2967,1787,1 914,3642,3481,3874,3552,2923,3683,3307,2910,2005,1887,3968,3723,1023,1963,3493,2806,3197, 2996,3407,3864,3644,3719,3760,3025,3433,2971,3670,3020,3482,3359,1998,1783,3777,2809,3444,2925,2024,1980,3255,3523,3497,3860,3000,3734,2543,3310,1903,1973,3692,3667,3389,3477,38 73,2751,3419,3686,3615,3784,2983,3733,3026,3673,2931,2810,3294,2551,3506,2973,3442,3317,2 003,1789,2926,3526,2783,3847,1997,2032,3726,3908,1978,1917,3491,3685,2010,1519,3529,3421, 3747,3303,3041,3639,3876,3500,2933,2987,3042,3448,3792,3704,3028,3737,2974,2812,3318,2989,3676,3415,3853,3505,2019,2006,3969,3631,3435,3690,1951,1911,3015,3315,3532,3498,2021,20 09,2934,2879,3731,3390,3859,2995,3753,3479,2555,3309,3888,2937,3698,3032,3808,3538,3663,2 799,1790,2026,3750,2990,3906,3471,3508,3431,3044,3740,3689,3862,3019,3525,1975,2012,3321, 3560,3781,2938,3646,3422,1967,1915,2557,3854,3970,3697,2997,3021,3445,3537,3756,3675,3048,3738,2940,3322,3486,3865,3438,3512,2025,2022,3916,2998,3199,3779,3554,3875,3645,2911,19 81,1918,2033,1999,3499,2807,3912,3762,3749,3443,3851,3056,3671,3530,3324,2558,3483,3700,3 027,3540,3001,3976,3877,3437,3786,2811,2028,1533,3920,3022,3501,3691,3761,3866,3263,3450, 3677,3568,3878,3739,3002,3507,3782,2927,3029,3553,2011,1982,3754,3030,3972,2975,3881,3687,3495,3794,2034,1979,3391,3727,3868,3809,3527,3323,3043,3788,3449,3936,2813,3004,3544,39 09,2935,3485,3033,3768,3045,3678,3861,3510,2023,2013,3446,3693,2036,2007,3896,3735,3295,3 764,3984,3034,3531,3699,3793,2991,3907,3556,3882,3502,2939,3889,3046,3643,3326,2814,3513, 3757,3812,3694,2030,2014,3785,2559,3533,3452,3741,3914,2040,1535,4000,3539,3036,3705,3800,3855,3447,3892,3049,2999,3702,3974,3755,3439,3050,3516,3884,3542,3921,3319,3742,2941,39 71,3509,3796,3763,2027,2029,3023,3910,2942,3863,2035,2037,3545,3701,3558,3810,3890,3423,3 751,3057,3514,3922,3003,3787,3534,3978,3937,3052,3706,3869,3766,3977,1791,2038,3647,3555, 3824,3453,3783,3879,3541,3058,4032,3503,3005,3913,3031,3758,3006,3562,3924,3816,2041,1919,3769,3986,3708,3548,3451,3940,3867,3789,3564,3035,3980,3511,3060,3891,3797,3047,3886,33 25,3695,3973,3546,3790,3561,3928,3765,3064,4001,3885,3915,3679,3517,3795,2815,3952,3772,3 572,3037,3454,3802,3870,2042,2039,3883,3547,3992,3911,3938,3515,3051,3570,3811,3743,3898, 3038,3053,3985,3770,3893,3543,3703,3813,4004,3535,3798,3917,3569,2044,2043,3007,3944,3311,3988,3818,3925,3557,3759,3804,3894,3059,4008,3832,3918,3710,3061,4033,3801,3975,3576,38 97,3930,2031,1983,3814,3559,4002,3767,3825,2943,3487,3054,3926,3939,3987,3709,3550,4034,3 900,3982,2046,2047,3771,3820,3563,3945,3062,3518,3791,3979,3065,4016,3929,3942,3817,3565, 3826,3989,3871,3707,4040,3923,3803,3549,3066,3948,3773,3039,3981,3887,3573,4003,4036,3932,3774,3996,3828,3566,3068,3815,3953,3899,3941,3993,3805,3578,4006,3519,3055,4048,3895,39 46,3571,3990,4009,3919,3819,3577,3960,3806,4037,3994,3574,3954,3931,3821,4005,3901,4024,3 063,3799,4041,3551,4010,3829,3933,3956,4064,2015,2045,3902,3580,4020,3822,3067,3943,4035, 4017,3830,3327,3991,3947,4042,3711,4012,3833,3069,3983,3934,4049,3455,3827,4038,4018,3927,3070,3950,3995,3807,3955,3575,4044,3834,4007,4050,3961,3997,4065,3582,3836,3958,4013,40 52,3949,4014,3823,4056,3579,4019,3998,3957,4039,4066,3775,3964,3903,4022,4043,4068,4025,3 835,3962,4053,3935,3071,4011,4046,3831,4072,4028,3951,4021,4051,3837,4045,4080,4026,3965, 4058,3567,4067,4054,3999,3959,4069,4057,3838,4074,4023,4060,4015,3963,4073,4070,4029,3966,4081,4047,4076,3581,4059,4030,4082,4027,4071,4061,4084,4055,4078,4062,4088,3583,4075,40 77,4083,4085,3839,4086,4089,3967,4090,4087,4092,4091,4079,4031,4094,4095,4063,4093]

Sequence Group 6: Z6_4096

[0,1,2,7,3,8,11,24,4,10,13,28,16,33,35,77,5,12,14,32,19,38,47,81,22,46,42,88,57,96,102, 168,6,17,21,40,23,45,51,90,29,55,59,97,72,110,116,186,34,61,75,114,80,123,135,197,87,137,148,2 25,153,238,260,381,9,18,26,54,30,58,71,105,36,76,62,117,84,127,142,206,44,74,86,136,92,145,152,233,100,155,170,252,184,268,287,424,53,89,98,151,111,162,178,265,121,179,196,279,210,301,3 17,461,139,204,230,307,236,320,345,494,257,353,375,519,396,544,587,815,15,25,31,73,39,79,82, 141,48,85,93,150,101,160,165,262,56,94,103,163,115,177,193,282,126,194,205,296,232,314,340,4 81,64,108,122,183,128,195,213,309,149,228,237,322,256,351,369,518,164,246,266,357,280,389,398,539,303,412,446,574,471,608,678,817,69,124,144,216,159,235,255,355,169,258,271,380,288,3 97,423,563,191,283,297,409,321,438,465,618,334,474,499,650,527,688,714,943,212,310,328,450, 358,480,503,667,393,515,540,704,576,718,786,1016,421,554,588,753,603,805,833,1073,673,853,8 83,1064,915,1129,1203,1490,20,37,41,91,49,95,106,176,50,107,118,187,132,207,217,336,63,119,1 33,222,146,231,244,337,154,243,261,374,284,392,404,538,67,143,156,224,173,247,267,390,181,2 75,289,406,300,435,454,600,180,298,312,434,333,468,483,651,362,505,528,687,552,712,758,993, 78,167,174,273,190,294,311,425,198,316,326,463,346,492,509,685,259,341,359,497,382,525,549, 706,415,558,594,750,621,802,840,1054,293,377,407,535,431,573,598,788,459,614,634,814,679,86 4,894,1103,500,675,689,884,707,917,870,1145,769,981,1017,1218,1025,1315,1367,1549,83,188,1 92,332,248,350,368,504,274,373,383,532,414,560,593,790,290,410,430,561,448,599,625,820,475, 639,666,858,705,891,939,1153,335,436,453,624,482,657,693,874,530,696,716,935,770,911,1003,1228,571,742,796,985,821,1024,1059,1278,865,1067,1066,1351,1147,1387,1431,1684,376,472,506, 697,559,717,757,955,595,789,807,1018,850,1033,1065,1309,628,829,876,1055,898,1071,1149,138 9,951,1162,1199,1441,1254,1509,1546,1821,686,888,929,1151,1001,1156,1242,1464,1014,1234,12 84,1529,1334,1581,1658,1934,1035,1320,1381,1605,1414,1668,1630,1963,1485,1725,1760,2074,1 844,2124,2211,2399,27,43,52,99,60,120,134,214,66,138,147,221,158,241,245,386,68,157,166,240, 175,295,304,420,200,306,331,460,348,485,507,702,70,172,189,299,202,329,342,478,215,354,370, 516,388,545,568,720,229,378,401,556,426,592,609,776,440,601,641,828,648,856,889,1213,109,20 1,211,347,223,371,387,534,253,405,416,580,443,616,638,794,272,419,452,606,477,646,653,842,4 96,655,664,893,740,918,975,1230,291,476,490,662,524,691,701,903,548,739,763,950,810,994,101 9,1289,579,785,824,1021,866,1050,1113,1337,925,1120,1166,1396,1200,1451,1518,1814,112,219, 242,399,270,417,447,620,286,455,479,656,501,669,681,900,315,491,521,683,547,730,755,946,577, 774,808,1010,843,1036,1091,1294,343,533,567,759,610,797,795,1039,629,832,854,1074,905,111 7,1137,1401,668,867,921,1130,947,1181,1202,1468,980,1226,1267,1530,1347,1591,1661,1947,364, 586,615,834,652,863,907,1121,727,924,962,1195,966,1208,1249,1505,743,964,979,1239,1047,12 66,1326,1578,1100,1344,1379,1608,1425,1694,1738,1974,775,1061,1084,1297,1142,1355,1386,1647,1167,1419,1471,1720,1519,1768,1831,2089,1273,1473,1533,1781,1602,1858,1887,2185,1649,1 913,1961,2235,2025,2312,2385,2666,129,254,278,458,313,489,517,711,324,526,555,737,581,766, 819,1093,356,569,619,791,643,861,845,1102,658,877,914,1161,958,1187,1216,1486,427,632,659,8 59,726,902,930,1198,736,961,973,1217,1000,1250,1277,1555,744,990,1028,1275,1098,1323,1371, 1611,1132,1411,1424,1701,1472,1739,1801,2057,442,725,729,948,749,965,1009,1260,784,1048,10 81,1311,1118,1362,1416,1673,920,1095,1144,1373,1171,1448,1475,1727,1255,1480,1540,1787,16 04,1850,1879,2179,972,1180,1238,1450,1274,1526,1562,1811,1332,1587,1618,1876,1669,1915,19 72,2261,1384,1654,1712,1960,1759,2008,2056,2322,1818,2077,2117,2378,2158,2459,2472,2831,451,751,765,1089,901,1107,1136,1409,937,1157,1191,1459,1246,1497,1553,1805,977,1214,1269,15 13,1307,1565,1621,1869,1366,1666,1613,1903,1730,1967,2024,2283,1101,1279,1322,1595,1399,1 634,1703,1954,1437,1713,1758,2009,1797,2029,2097,2363,1522,1775,1826,2061,1891,2136,2173, 2431,1930,2228,2258,2510,2313,2560,2578,2754,1176,1327,1434,1718,1491,1752,1778,2048,1547,1839,1862,2110,1905,2137,2239,2470,1559,1899,1956,2224,2022,2266,2271,2574,2081,2324,23 59,2603,2414,2672,2719,2941,1676,2002,2010,2306,2106,2328,2380,2617,2154,2430,2444,2704,2 525,2720,2839,3018,2201,2503,2551,2782,2612,2793,2884,3089,2651,2902,2936,3142,2984,3186, 3223,3400,140,113,65,285,104,263,182,502,125,185,203,444,220,352,323,572,161,218,239,330,264,408,372,663,302,384,422,541,462,731,612,897,171,249,269,391,305,413,469,589,325,493,439,8 16,531,633,674,1209,349,473,557,647,514,700,781,1043,582,764,728,934,841,1094,967,1470,199, 292,308,449,344,484,537,682,379,605,495,715,570,745,804,978,411,529,645,777,613,892,762,101 5,562,809,916,1060,860,1258,1128,1724,441,642,583,851,719,818,944,1083,672,991,882,1184,93 1,1141,1410,1314,752,954,1005,1285,1042,1196,1229,1508,1085,1345,1263,1655,1397,1890,1579, 2174,234,327,365,520,400,553,604,787,437,684,575,812,635,848,904,1150,464,611,721,857,665, 974,885,1133,748,936,1029,1201,995,1244,1329,1536,498,710,649,910,806,959,1037,1223,780,10 97,976,1418,1075,1282,1295,1614,852,1026,1160,1328,1119,1361,1460,1924,1219,1484,1404,164 5,1552,1741,1800,2248,546,738,825,1011,768,1046,1139,1343,871,1188,1080,1525,1231,1378,145 5,1700,919,1112,1245,1412,1310,1476,1610,1755,1163,1573,1496,1868,1652,1820,1962,2352,963, 1,272,1335,1583,1194,1531,1627,2001,1385,1690,1749,1878,1548,2075,1935,2756,1430,1721,178 6,2049,1823,1969,2028,2455,1660,2114,2159,2305,2210,2629,2384,3163,281,385,418,607,470,69 0,640,896,488,654,798,942,724,988,1032,1262,536,754,703,1008,803,1131,970,1308,862,1049,11 48,1354,1088,1504,1449,1909,578,813,767,1212,928,1038,1092,1363,849,1116,1177,1596,1235,14 07,1477,1761,949,1261,1197,1524,1336,1463,1603,1817,1293,1572,1638,1855,1699,1942,2059,22 96,617,1002,835,1143,890,1276,1186,1532,971,1222,1317,1487,1360,1582,1648,1892,1058,1413,1296,1745,1251,1598,1635,2031,1481,1687,1769,1948,1819,1995,2119,2495,1106,1440,1358,165 9,1515,1726,1859,2103,1590,1902,1751,2044,1796,2231,2168,2439,1388,1838,1968,2195,1914,21 42,2338,2424,2011,2310,2249,2596,2403,2539,2673,3214,692,906,1020,1259,1082,1306,1458,167 2,1140,1542,1333,1719,1405,1620,1822,2099,984,1372,1435,1794,1528,1943,1748,2069,1619,1873,1908,2214,1686,2323,2162,2838,1215,1469,1580,1990,1675,1886,1851,2292,1514,1928,2053,21 84,2005,2242,2373,2557,1779,2033,1966,2259,2102,2463,2331,2607,2169,2386,2506,2703,2445,2 662,2885,3017,1268,1599,1707,1925,1543,2111,1973,2304,1815,1994,2207,2360,2052,2402,2520, 2742,1646,2143,2083,2413,2225,2550,2453,2730,2318,2478,2642,2693,2595,2931,2858,3098,1875,2267,2176,2535,2367,2770,2488,2815,2115,2648,2579,2874,2602,2917,2981,3473,2253,2747,27 05,3032,2669,2968,3064,3256,2805,3043,3009,3317,3127,3609,3272,3701,363,445,508,713,566,7 41,799,1034,602,895,771,1152,844,1072,1204,1454,644,811,945,1096,875,1301, 1146,1503,989,12 48,1359,1740,1227,1537,1594,1950,680,
938,899,1190,1004,1243,1342,1612,1099,1415,1283,1558,
1400,1653,1807,2041,1051,1370,1321,1644,1462,1762,
1702,2003,1527,1795,1872,2381,1896,217 8,2118,2534,
756,960,1090,1300,1189,1346,1576,1685,1027,1380,1474,
1744,1406,1845,1753,2088, 1170,1512,1541,1939,1436,
1806,1904,2206,1667,1957,1833,2151,2030,2252,2329,
2657,1292,156 4,1706,1877,1626,1991,1949,2287,1774,
2108,2045,2243,1938,2339,2391,2638,1609,2131,2080,23
61,2215,2479,2432,2731,2017,2415,2526,2923,2594,2855,
2792,3173,855,1205,1070,1461,1138,16 98,1417,1897,
1316,1502,1615,1883,1586,1830,1982,2297,1288,1780,
1639,2058,1563,1955,1931,2 349,1750,2023,2155,2255,
2107,2406,2458,2713,1398,1677,1816,2000,1863,2194,
2096,2502,1691, 2068,2270,2438,2150,2387,2575,2771,
1898,2246,2189,2467,2353,2650,2528,2825,2325,2588,272
6,2870,2668,2940,2972,3349,1523,1912,1754,2175,1827,
2116,2260,2544,1951,2398,2234,2511,23 07,2601,2643,
2888,2016,2362,2293,2663,2466,2616,2743,3096,2416,
2797,2674,2930,2776,3008,3 051,3248,2082,2303,2489,
2712,2390,2738,2814,2985,2585,2916,2764,3042,2871,
3073,3139,3313, 2538,2830,2920,3215,2980,3108,3162,
3419,2790,3183,3258,3386,3273,3459,3530,3756,992,
1247, 1185,1631,1350,1695,1597,1975,1408,1554,1832,
2200,1763,2032,2125,2417,1465,1804,1731,206 0,1929,
2330,2109,2473,1893,2163,2247,2600,2302,2527,2675,
2922,1577,1946,1874,2177,2004,22 30,2254,2545,1810,
2286,2372,2692,2452,2653,2628,2961,2076,2379,2494,
2613,2425,2727,2777,3 026,2348,2808,2718,2987,2862,
3083,3126,3361,1674,1854,2098,2366,1983,2319,2471,
2701,2188, 2561,2407,2656,2172,2746,2791,3039,2238,
2454,2507,2927,2584,2765,2842,3222,2649,2912,280
9,3072,2971,3109,3208,3397,2311,2524,2702,2843,2597,
2990,2913,3143,2755,2875,3027,3169,29 37,3303,3226,
3434,2667,2986,3065,3249,3112,3334,3294,3505,3050,
3265,3387,3553,3360,3469,3 583,3777,1882,2040,2130,
2462,2282,2639,2433,2804,2229,2529,2521,2889,2606,
2960,2863,3187, 2358,2721,2589,2854,2757,2921,3033,
3168,2700,2991,3055,3227,2973,3268,3323,3504,2412,265
2,2824,2969,2739,3082,3016,3259,2783,3038,3099,3401,
3182,3295,3312,3552,2903,3155,3217,33 22,3138,3435,
3362,3544,3088,3373,3468,3639,3425,3582,3629,3869,
2556,2796,2859,3154,2970,3 054,3216,3335,2926,3097,
3172,3363,3257,3464,3418,3585,3019,3209,3264,3458,
3302,3396,3499, 3667,3316,3511,3472,3628,3545,3663,
3693,3964,3113,3269,3348,3498,3372,3510,3573,3662,342
4,3572,3531,3728,3608,3729,3692,3868,3465,3584,3638,
3734,3666,3735,3757,3819,3700,3776,38 18,3845,3844,
3965,3886,3887,130,131,208,251,209,276,319,432,226,
318,339,466,366,511,513,74 7,227,338,360,510,395,542,
591,773,428,590,564,800,637,836,868,1108,250,367,403,
550,429,585, 623,822,467,631,661,837,732,886,922,1164,
512,671,735,912,772,941,987,1183,793,997,1040,128
1,1053,1312,1368,1657,277,394,456,630,486,660,723,873,
522,746,676,923,782,957,1012,1224,58 4,734,792,996,826,
1023,1052,1299,846,1057,1110,1348,1158,1390,1433,
1742,627,801,838,1045,8 87,1078,1126,1377,933,1127,
1182,1421,1232,1467,1507,1809,999,1220,1290,1489,
1304,1510,157 1,1870,1357,1593,1641,1921,1688,1976,
2043,2389,361,433,487,733,543,761,778,1007,596,783,82
7,1044,847,1076,1087,1374,636,830,869,1079,913,1125,
1175,1426,956,1178,1221,1452,1298,1500, 1566,1849,694,
880,940,1155,968,1179,1237,1493,1041,1286,1305,1516,
1356,1589,1629,1920,10 86,1338,1382,1607,1422,1679,
1692,1965,1479,1716,1784,2020,1835,2078,2186,2393,
709,952,102 2,1252,1069,1303,1353,1601,1109,1364,1393,
1656,1438,1689,1737,1999,1173,1427,1453,1711,15
11,1770,1825,2094,1556,1840,1885,2144,1933,2202,2236,
2547,1236,1494,1538,1790,1616,1848,1 895,2167,1683,
1917,1970,2220,2026,2244,2342,2632,1735,1986,2046,
2291,2067,2369,2409,2697, 2181,2435,2475,2688,2513,
2759,2837,3106,402,523,551,823,597,831,878,1124,622,
879,926,1165, 982,1225,1253,1560,677,927,983,1270,
1030,1291,1330,1561,1056,1325,1369,1640,1428,1682,170
4,1964,699,1013,1062,1280,1115,1339,1383,1680,1135,
1403,1439,1708,1466,1765,1798,2064,113 4,1456,1498,
1764,1551,1828,1853,2145,1622,1901,1936,2199,1984,
2232,2300,2611,760,1105,112 2,1395,1172,1446,1495,
1743,1192,1506,1534,1813,1574,1866,1911,2197,1365,
1567,1617,1881,16 62,1927,1981,2222,1723,1992,2054,
2288,2101,2364,2418,2682,1445,1643,1709,1953,1757,
2019,2 062,2344,1803,2090,2122,2388,2187,2450,2486,
2737,1888,2183,2203,2476,2223,2515,2460,2779, 2321,
2593,2633,2852,2641,2949,2999,3153,779,1168,1174,
1550,1340,1588,1628,1900,1402,1637, 1663,1944,1722,
1996,2051,2346,1442,1714,1756,1997,1788,2063,2105,
2396,1841,2127,2166,244 2,2221,2483,2543,2789,1557,
1766,1793,2104,1852,2153,2209,2464,1940,2212,2240,
2537,2326,25 09,2621,2864,2015,2278,2354,2599,2397,
2640,2685,2910,2451,2691,2690,2983,2781,3013,3057,3
260,1642,1836,1906,2213,1993,2241,2299,2563,2055,
2345,2371,2634,2428,2655,2689,2945,2112, 2405,2468,
2683,2492,2695,2785,3015,2559,2800,2833,3063,2890,
3119,3150,3357,2198,2480,253 1,2787,2619,2794,2876,
3080,2630,2868,2918,3135,2964,3179,3240,3432,2659,
2952,3007,3199,30 44,3246,3220,3453,3103,3289,3318,
3520,3374,3554,3597,3695,457,565,626,839,670,932,986,
124 0,698,998,1031,1265,1068,1319,1331,1670,708,1063,
1104,1318,1123,1447,1482,1734,1206,1488, 1545,1808,
1584,1857,1907,2218,722,1114,1169,1457,1210,1539,
1568,1846,1241,1600,1632,1918, 1678,1977,2012,2250,
1287,1650,1697,1988,1746,2050,2079,2334,1772,2065,
2129,2404,2140,244 0,2481,2847,881,1207,1233,1575,
1271,1633,1671,1952,1349,1705,1728,2036,1777,2092,
2126,235 0,1394,1733,1792,2072,1843,2138,2147,2420,
1880,2149,2164,2485,2276,2516,2583,2866,1443,18
42,1864,2160,1926,2205,2217,2499,1980,2275,2309,2558,
2376,2614,2635,2925,2035,2341,2400,2 637,2456,2680,
2745,2967,2523,2752,2802,3020,2834,3069,3124,3350,
908,1257,1324,1693,1392,1 729,1785,2100,1432,1799,
1847,2152,1889,2171,2191,2496,1501,1865,1923,2193,
1979,2268,2295, 2552,2027,2332,2374,2626,2421,2660,
2717,2932,1569,1945,2007,2301,2084,2355,2351,2665,211
3,2408,2436,2698,2501,2749,2767,3025,2170,2457,2519,
2760,2553,2813,2836,3084,2592,2860,28 99,3136,2979,
3189,3243,3441,1624,2042,2091,2410,2146,2449,2505,
2753,2263,2522,2568,2827,2 572,2844,2883,3117,2279,
2570,2591,2873,2677,2898,2956,3176,2734,2976,3005,
3200,3053,3270, 3296,3462,2333,2687,2710,2935,2774,
2989,3012,3233,2803,3049,3087,3286,3125,3324,3367,352
9,2905,3091,3141,3331,3196,3380,3403,3587,3235,3421,
3451,3607,3491,3650,3687,3810,969,135 2,1420,1802,
1499,1861,1919,2227,1520,1932,1987,2273,2037,2316,
2395,2723,1606,2013,2095,23 47,2133,2447,2423,2736,
2156,2469,2512,2799,2564,2819,2850,3104,1747,2120,
2157,2443,2262,2 498,2532,2832,2272,2567,2581,2851,
2618,2886,2909,3159,2280,2608,2646,2907,2732,2955,
3001, 3203,2762,3037,3052,3277,3090,3297,3341,3513,
1776,2257,2265,2554,2285,2571,2625,2894,234 0,2678,
2707,2947,2750,2996,3046,3251,2518,2725,2778,3003,
2807,3066,3093,3291,2891,3100,31 46,3333,3198,3376,
3395,3581,2580,2812,2872,3068,2906,3132,3164,3347,
2962,3185,3210,3392,3 247,3423,3460,3625,3010,3238,
3282,3450,3315,3482,3512,3654,3354,3523,3549,3682, 3566,3723,3732,3875,1791,2289,2315,2715,2497,2741,2766,3035,2541,2795,2823,3075,2880,3111,3157,3343,2587,2848,2901,3121,2943,3167,3213,3385,2998,3244,3205,3413,3292,3455,3490,3633,2735,2911,2954,3191,3023,3224,3279,3446,3061,3283,3314,3483,3339,3493,3533,3677,3128,3327,3364,3517,3405,3558,3575,3711,3430,3602,3622,3746,3651,3768,3772,3846,2810,2957,3058,3284,3107,3308,3328,3506,3151,3371,3382,3542,3415,3559,3611,3730,3161,3411,3448,3600,3488,3626,3631,3770,3525,3656,3673,3787,3704,3814,3831,3913,3254,3478,3484,3646,3538,3658,3684,3793,3564,3710,3716,3826,3751,3832,3877,3934,3593,3743,3765,3856,3790,3861,3892,3955,3803,3896,3910,3970,3924,3982,3991,4030,1006,909,695,1429,872,1375,1154,1894,953,1159,1211,1782,1264,1592,1517,2018,1077,1256,1313,1544,1376,1710,1636,2161,1478,1664,1736,1971,1812,2269,2086,2491,1111,1341,1391,1681,1483,1717,1829,2047,1521,1867,1771,2392,1941,2121,2182,2845,1585,1837,1989,2139,1916,2216,2337,2671,2038,2314,2264,2536,2419,2724,2573,3086,1193,1444,1492,1789,1570,1856,1959,2192,1651,2071,1871,2237,2014,2281,2368,2590,1715,1937,2135,2335,2087,2484,2308,2631,1998,2375,2514,2686,2446,2892,2758,3288,1773,2132,2039,2429,2245,2394,2548,2709,2180,2609,2474,2816,2533,2773,3036,2948,2290,2562,2623,2919,2670,2828,2865,3118,2711,2977,2897,3239,3021,3404,3177,3576,1302,1535,1625,1922,1696,1985,2070,2343,1767,2196,2021,2382,2123,2426,2500,2786,1824,2085,2251,2441,2165,2582,2477,2763,2284,2540,2647,2835,2615,2878,2959,3144,1884,2226,2141,2508,2370,2565,2661,2857,2336,2729,2586,3048,2699,2914,2933,3206,2434,2644,2798,2958,2751,2995,3076,3426,2853,3102,3028,3231,3156,3299,3340,3616,1978,2274,2401,2627,2320,2676,2769,2975,2461,2820,2706,3131,2867,3004,3071,3276,2517,2744,2879,3040,2946,3094,3202,3311,2801,3171,3110,3384,3236,3356,3452,3670,2569,2904,2965,3181,2826,3137,3219,3477,3011,3266,3305,3394,3152,3521,3433,3848,3056,3287,3332,3507,3359,3457,3492,3721,3242,3546,3567,3645,3596,3795,3686,3975,1423,1665,1732,2073,1834,2204,2128,2490,1860,2148,2356,2546,2256,2604,2654,2896,1958,2294,2219,2624,2365,2761,2576,2944,2448,2679,2784,2988,2714,3116,3067,3417,2034,2383,2317,2846,2530,2664,2722,2997,2427,2748,2811,3192,2869,3031,3095,3319,2555,2895,2829,3130,2966,3079,3197,3353,2929,3170,3228,3379,3275,3438,3515,3640,2093,2620,2411,2775,2482,2908,2818,3140,2577,2856,2951,3105,2994,3180,3234,3406,2684,3041,2934,3301,2887,3194,3225,3495,3101,3263,3325,3442,3355,3475,3551,3741,2740,3062,2992,3241,3123,3290,3381,3537,3188,3412,3307,3502,3338,3605,3570,3715,3014,3370,3456,3591,3422,3560,3664,3708,3485,3648,3617,3782,3697,3761,3815,3986,2208,2504,2636,2893,2708,2942,3074,3250,2772,3148,2963,3285,3029,3212,3358,3535,2598,3002,3059,3336,3134,3439,3304,3519,3211,3389,3416,3598,3262,3655,3568,3876,2849,3085,3178,3470,3253,3402,3377,3636,3122,3428,3509,3586,3481,3612,3681,3767,3329,3497,3454,3623,3536,3725,3661,3789,3571,3688,3744,3825,3717,3808,3893,3933,2900,3195,3281,3427,3149,3543,3461,3644,3351,3474,3595,3674,3508,3696,3748,3840,3232,3561,3527,3703,3601,3764,3719,3836,3652,3736,3798,3821,3781,3909,3882,3958,3391,3627,3578,3759,3679,3852,3738,3871,3547,3800,3773,3890,3786,3901,3923,4045,3619,3843,3827,3938,3813,3916,3948,3996,3865,3943,3931,4013,3967,4065,4004,4077,1623,1783,1910,2233,2006,2277,2357,2658,2066,2487,2327,2788,2422,2696,2840,3070,2134,2377,2549,2728,2465,2939,2780,3115,2605,2882,2993,3298,2861,3145,3190,3444,2190,2542,2493,2822, 2622,2877,2974,3204,2733,3045,2915,3160,3024,3237,3345,3501,2681,3000,2953,3230,3078,3320,3278,3479,3133,3337,3388,3685,3408,3580,3550,3758,2298,2566,2716,2938,2821,2978,3174,3261,2645,3006,3092,3300,3030,3375,3309,3528,2806,3120,3147,3437,3060,3344,3414,3594,3245,3449,3369,3563,3494,3618,3659,3807,2928,3166,3280,3393,3218,3471,3443,3635,3326,3540,3503,3613,3436,3665,3691,3796,3201,3557,3524,3675,3599,3737,3712,3837,3487,3705,3752,3905,3780,3881,3860,3979,2437,2841,2694,3077,2768,3274,3047,3409,2950,3114,3207,3399,3184,3366,3466,3641,2924,3330,3229,3514,3165,3447,3431,3669,3306,3489,3565,3621,3539,3698,3722,3829,3022,3255,3352,3476,3383,3590,3532,3742,3267,3518,3630,3714,3562,3689,3771,3853,3410,3614,3589,3727,3671,3802,3754,3873,3657,3778,3834,3888,3812,3912,3920,4019,3129,3420,3310,3577,3365,3548,3624,3762,3445,3694,3606,3747,3647,3785,3799,3894,3486,3676,3637,3809,3726,3792,3841,3956,3706,3863,3816,3908,3854,3930,3945,3994,3526,3643,3739,3828,3690,3838,3870,3925,3775,3900,3850,3942,3889,3951,3969,4011,3760,3874,3902,3987,3922,3960,3974,4033,3858,3981,3998,4026,4005,4039,4052,4082,2610,2881,2817,3221,2982,3271,3193,3463,3034,3158,3368,3592,3321,3496,3555,3707,3081,3342,3293,3516,3429,3660,3541,3733,3407,3569,3615,3784,3642,3753,3817,3904,3175,3440,3390,3579,3480,3604,3620,3763,3346,3634,3680,3820,3718,3805,3794,3915,3522,3683,3740,3791,3709,3835,3855,3936,3668,3866,3830,3927,3884,3953,3966,4021,3252,3378,3534,3678,3467,3653,3731,3823,3588,3769,3699,3806,3574,3842,3859,3941,3610,3720,3745,3907,3774,3851,3878,3990,3801,3898,3867,3950,3919,3961,3984,4029,3649,3750,3824,3879,3783,3928,3899,3971,3847,3891,3937,3977,3911,4009,3992,4036,3811,3926,3949,3995,3962,4016,4006,4049,3944,4001,4027,4057,4020,4043,4061,4085,3398,3500,3556,3724,3632,3797,3713,3864,3603,3755,3749,3895,3788,3914,3885,3983,3672,3833,3779,3880,3849,3903,3939,3976,3822,3929,3947,3993,3921,4002,4015,4048,3702,3804,3872,3917,3839,3952,3932,3999,3857,3940,3959,4031,3980,4007,4010,4056,3897,3973,3989,4014,3968,4037,4022,4054,3954,4025,4042,4069,4035,4060,4067,4091,3766,3862,3883,3972,3918,3946,3988,4017,3906,3957,3978,4023,3997,4040,4032,4063,3935,3985,4000,4038,4008,4028,4047,4073,4012,4051,4044,4066,4055,4071,4075,4094,3963,4003,4018,4046,4024,4050,4059,4070,4034,4058,4053,4078,4064,4079,4074,4090,4041,4062,4068,4080,4072,4081,4083,4087,4076,4084,4086,4089,4088,4095,4092,4093]

Sequence Group 7: Q7_2048

[0,1,2,4,8,16,32,3,5,64,9,6,17,10,18,128,12,33,65,20,256,34,24,36,7,129,66,512,11,40,68,130,19,13,48,14,72,257,21,132,35,258,26,513,80,37,25,22,136,260,264,38,514,96,67,41,144,28,69,42,516,49,74,272,160,1026,520,288,528,192,544,70,44,131,81,50,73,15,320,133,52,23,134,384,76,137,82,56,27,97,39,259,84,138,145,261,29,43,98,515,88,140,30,146,1028,71,262,265,161,576,45,100,640,1025,51,148,46,75,266,273,517,104,162,53,193,1032,152,77,164,768,268,274,518,54,83,57,521,112,1024,135,78,289,194,85,276,522,58,168,139,99,86,60,280,89,290,529,524,196,141,1040,101,147,176,142,530,321,31,200,90,1056,545,292,322,532,263,149,102,105,304,296,1030,163,92,1033,47,267,385,546,324,208,386,150,153,165,106,55,328,1088,536,577,548,1034,113,154,79,269,108,578,224,166,519,552,195,270,1041,641,1036,523,275,580,291,59,169,560,114,277,156,87,1152,197,116,170,61,1042,531,525,642,281,278,526,177,293,388,1057,91,584, 769,198,172,120,20 1,336,62,282,143,1029,1044,103,178, 294,93,1058,644,202,592,323,392,297,770,107,180,1280, 151, 209,284,1027,648,94,204,298,400,608,1089,352,325, 533,155,210,305,547,300,109,1048,184,534, 1060,537,115, 1090,167,225,326,306,772,157,656,329,110,117,212,171, 1038,776,1064,330,1153,22 6,549,1043,538,387,308,216, 416,271,279,158,337,550,672,1092,118,332,579,540,1072, 389,173,10 37,121,553,199,784,179,228,338,312,1536,704, 1154,390,174,554,581,1046,393,283,122,448,353,5 61,1096,203,63,340,394,1049,1281,527,582,556,181,295, 1059,285,232,124,205,182,643,1156,562, 286,585,299,354, 1045,211,401,1104,185,1061,396,344,586,645,1282,593, 535,240,1050,206,95,32 7,564,800,402,356,307,301,417, 1160,213,1066,568,1120,832,588,1035,1537,186,646,404, 1091,22 7,896,594,418,302,649,771,360,539,111,1052,331, 1168,214,309,1062,1284,188,449,1073,217,408, 609,596, 551,650,229,159,420,310,1093,541,1288,773,610,657,333, 1065,119,1098,600,339,1184,2 18,368,652,1031,230,391, 313,450,542,1538,334,1076,233,555,774,175,123,1155, 658,612,341,777, 220,314,1105,424,1068,395,673,583,355, 1296,1094,287,183,234,1051,125,557,1216,660,616,342, 316,1157,241,778,563,1074,345,452,397,403,1112,207, 1540,674,558,785,1100,432,1039,357,187,1 162,236,664, 1312,624,587,780,1080,1122,705,126,242,1063,565,398, 346,456,358,405,303,569,15 44,244,1158,1097,595,1283, 189,566,676,1169,1054,1108,361,706,589,1344,215,786, 647,348,419,4 06,464,680,801,1069,362,1164,590,409, 1286,570,1121,788,1552,1106,597,1075,572,1186,219,311, 708,598,1289,601,651,421,792,802,611,1047,602,1172, 410,231,688,653,1128,248,1070,369,190,36 4,1568,654, 1095,659,1161,335,480,315,221,370,1285,613,1408,422, 425,451,1077,614,543,1298,2 35,412,343,372,1185,775, 317,1539,222,1099,426,453,237,1124,559,1170,1292,833, 804,712,1082,8 34,661,1053,808,779,1217,617,604,1541, 433,720,816,1101,1176,836,347,897,1136,243,1297,662,1 600,454,318,675,1110,618,1081,898,781,1314,1220,376, 428,1546,665,736,567,1107,1192,1078,84 0,625,238,1159, 359,457,399,787,591,678,434,677,1290,1542,349,1300, 1102,245,1188,458,666,111 3,620,1553,1163,1313,363, 127,1067,191,1125,782,407,436,626,1218,571,465,681, 246,707,1346,3 50,1084,599,668,1548,790,1165,1320,460, 1123,1200,249,682,1664,573,1171,411,803,1116,789,13 04,709,365,440,628,689,374,1224,423,1556,466,793,1130, 250,371,1174,481,574,1348,413,1109,60 3,366,1545,1287, 1055,468,1570,655,900,805,615,1166,684,1409,710,1187, 429,794,252,1114,373,6 05,1232,848,690,713,632,1316, 482,806,1132,1083,427,1177,904,1569,414,1291,223,1126, 1554,66 3,692,835,1328,619,472,1137,455,796,1189,1601, 809,714,1248,721,837,716,1086,1302,1352,864, 810,1173, 606,1194,912,1103,722,696,377,1424,435,1293,1560,817, 1129,1792,319,621,1180,812,4 84,1345,430,1572,1138, 1299,838,667,1219,488,1111,239,378,459,622,1410,627, 437,380,1201,160 8,818,1178,1294,461,1543,496,669, 1190,1317,679,1140,1079,1221,724,841,1305,629,1584, 351,46 7,1360,438,1115,737,251,462,442,441,1666,469, 1549,247,683,1196,1226,842,1412,1127,738,1144, 1308, 899,1602,670,1318,783,1085,849,1555,1193,820,1576,728, 928,791,367,1376,901,1233,630,1 321,685,844,1204,633, 711,1118,253,691,1301,824,1175,902,686,1668,1222,1416, 1133,740,1347,8 50,375,1558,444,1306,470,1167,483, 1547,415,485,905,1202,795,473,1240,634,744,1616,852, 960, 1322,865,693,1131,1794,1350,797,1225,1604,1571, 906,1252,715,1141,1330,807,474,636,1179,694, 254,1550, 1665,717,1071,1315,575,913,1440,798,811,379,1208,1353, 1191,697,1564,431,1142,607, 1228,489,1324,866,723,486, 1573,1181,1234,908,1793,1561,718,813,1364,476,856, 1117,1411,839, 1329,1295,1146,725,698,1472,914,1249, 752,868,819,1349,814,439,929,1197,1578,490,1139,1680, 623,1632,1336,671,1198,1362,739,1603,1557,1413,916, 1303,463,1236,843,1135,381,1672,1354,4 97,1586,930, 821,726,961,1203,1182,872,1418,492,1250,1332,631,1574, 1223,729,1145,1605,700,1 796,443,1307,741,1378,1562, 1356,1205,845,1319,920,382,1585,822,1425,851,1229,730, 1609,498, 880,1256,742,445,1392,471,635,1148,1696,932, 1580,687,1210,1420,1612,1325,1800,903,1134,82 5,1235, 1361,500,1577,846,1670,1195,745,826,732,1264,446,962, 1426,1620,936,1377,475,853,131 0,867,637,1551,1230, 1414,907,1206,1667,1588,1333,487,1808,695,1441,1087, 746,828,753,1610,8 54,1237,1326,857,1368,1209,504,799, 1355,255,964,1242,909,1673,1559,1309,719,1143,477, 1617, 915,1448,1380,638,748,944,1728,1331,1227,869, 1592,1428,491,699,1253,1351,754,1183,1565,85 8,1618, 1417,1476,478,968,1260,383,1212,910,1801,815,1579,976, 870,1684,1633,917,1337,1241,1 606,1824,727,1150,1442, 493,1357,1251,1676,873,1384,701,1566,931,1323,1798, 1365,1473,756,1 334,860,499,731,1648,1238,823,1575, 922,1199,1674,874,1432,1421,918,1636,1254,502,1795, 933, 1366,1338,1682,1587,1211,1488,743,1358,760,1244, 1581,881,1147,494,1379,1272,702,921,1624, 501,876, 1415,847,1856,1444,992,1697,447,1607,1436,1369,1257, 1704,733,1797,1669,1340,1231, 827,1590,934,1634,1474, 882,937,963,1419,747,1265,1119,505,1381,855,924,1810, 734,829,1563,1 213,1611,1363,1430,1258,1688,1386,965, 1614,1730,1239,938,884,506,1327,1589,1804,749,1370, 1640,945,966,1456,1681,755,1266,859,1427,1593,1388, 940,1214,830,1809,911,1621,1582,1832,8 71,639,1480, 1698,1335,888,1372,1245,479,1422,1268,946,1732,1677, 750,1802,1626,1393,969,50 8,1613,861,1446,1857,1339, 757,1382,970,1700,1243,919,1594,1433,1826,1504,875, 1635,1259,86 2,1920,1675,1445,758,1149,948,1359,1816, 1596,1671,1712,977,1385,923,1622,972,1434,1311,17 29,761,1396,877,1207,1475,1449,1812,952,1686,495,1262, 1644,1619,1341,1429,1825,703,1371,1 638,1567,1736,935, 1685,978,1625,883,762,1246,503,1458,925,1394,1269,878, 1478,735,1799,167 8,1860,1443,1637,1481,1373,1699, 1255,993,1591,1828,1452,885,939,994,1400,1744,1656, 980,16 89,926,764,1270,941,1628,1367,1805,1457,1921, 1583,1387,1642,967,1267,1484,1450,886,831,16 83,1342, 1811,947,1705,1431,507,1261,1840,889,1650,984,1760, 1490,1615,751,1702,942,1858,14 23,1460,1383,996,1692, 1641,1814,971,1477,1273,1512,1733,890,1598,1374,509, 1806,1922,1649, 949,973,1397,1489,1708,1627,1000,1690, 892,1274,1438,1817,1390,1464,1868,950,1151,1731,150 6,1827,1597,863,1451,759,1864,1714,1701,1395,1803, 1008,1623,1482,1276,510,1435,1652,979,1 492,953,1928, 1829,1389,1738,763,1872,974,1453,1643,1713,1818,1215, 1402,1629,1520,1830,169 1,954,1459,1734,879,981,1505, 1706,982,1924,927,1833,1639,1447,1746,1343,1679,1820, 1761,14 79,1275,995,1740,1401,1888,765,956,1496,1861, 887,1437,985,1720,997,1630,1813,1462,1398,16 45,1848, 1687,1247,1716,1936,986,1483,1651,1745,943,1859,1508, 1834,1454,891,1841,998,1595, 1278,766,1465,1709,1764, 1646,1737,511,1485,1404,1693,1866,1952,1491,988,1657, 1752,1807,13 99,1844,1001,951,1654,1926,1707,1391, 1002,1468,1836,1494,1873,1271,1694,893,1923,1461,174 8,1715,975,1862,894,1815,1497,1653,1510,1762,1842, 1375,1703,1009,1466,1874,955,1739,1486, 1930,1889, 1004,1658,1821,1718,1929,1599,1507,1776,1405,1735, 1831,1493,1010,1984,1455,957, 1,865,983,1710,958,1514, 1876,1768,1721,1938,1660,1500,1403,1892,1819,1741, 1516,987,1932,14 63,1012,1843,1749,999,1838,1277,1647, 1925,1498,1742,1513,1880,1717,1016,1953,1837,1867,16 31,1469,1747,767,1904,1724,1524,989,1406,1754,1822, 1835,1499,1944,1863,1890,1467,1003,152 2,1763,1695, 1850,990,1005,1937,1722,1845,1495,1655,1765,1956,
1487,1750,1869,1521,959,1896, 1263,1940,1770,1877,
1509,1711,1756,1846,1011,1960,1784,1870,1662,1013,
1985,1753,1927,152 8,1849,1882,1766,1511,1954,1719,
1777,895,1439,1006,1878,1891,1939,1661,1502,1986,
1852,193 4,1723,1772,1515,1897,1014,1470,1743,1931,
1017,1968,1881,1894,1769,1517,1778,1941,1823,16
59,1992,1875,1755,1501,1018,1900,1725,991,1933,1839,
1525,1955,1988,1884,1726,1948,1780,15 18,1020,1767,
1905,1851,1893,1945,1757,1530,1958,1471,1007,2000,
1847,1898,1523,1942,1961,1 871,1771,1529,1912,1758,
1989,1946,1526,1906,1883,1773,1957,1853,1976,1015,
1751,1993,1503, 1962,1781,1885,1908,2016,1854,1532,
1972,1774,1019,1895,1987,1969,1782,1279,1943,1899,199
4,1663,1964,1785,1021,1935,1886,2001,1407,1779,1990,
1970,1879,1022,1902,1947,1759,1907,15 27,1996,1786,
1959,2002,1913,1949,2017,1534,1788,1910,1965,2004,
1901,1966,1775,2008,1531,1 971,1950,1909,1991,2018,
1727,1916,1855,1974,1995,2020,1977,1787,1914,2005,
1887,1023,1963, 1998,1783,2024,1980,1903,1973,2003,
1789,1997,2032,1978,1917,2010,1519,2019,2006,1951,191
1,2021,2009,1790,2026,1975,2012,1967,1915,2025,2022,
1981,1918,2033,1999,2028,1533,2011,19 82,2034,1979,
2023,2013,2036,2007,2030,2014,2040,1535,2027,2029,
2035,2037,1791,2038,2041,1 919,2042,2039,2044,2043,
2031,1983,2046,2047,2015,2045]

Sequence Group 7: Z7_2048

[0,1,2,7,3,8,11,24,4,10,13,28,16,33,35,77,5,12,14,32,19,
38,47,81,22,46,42,88,57,96,102, 166,6,17,21,40,23,45,51,
90,29,55,59,97,72,110,116,184,34,61,75,114,80,123,133,
195,87,135,146,2 21,151,232,252,363,9,18,26,54,30,58,71,
105,36,76,62,117,84,127,140,204,44,74,86,134,92,143,15
0,227,100,153,168,244,182,260,277,402,53,89,98,149,111,
160,176,257,121,177,194,269,206,291,3 07,433,137,202,
224,297,230,308,331,462,249,339,357,483,376,504,541,
725,15,25,31,73,39,79,82, 139,48,85,93,148,101,158,163,
254,56,94,103,161,115,175,191,272,126,192,203,286,226,
304,326,4 51,64,108,122,181,128,193,209,299,147,222,
231,310,248,337,351,482,162,240,258,343,270,371,3
78,501,293,390,420,530,441,558,614,727,69,124,142,212,
157,229,247,341,167,250,263,362,278,3 77,401,521,189,
273,287,387,309,412,437,568,322,444,467,592,489,624,
644,819,208,300,316,424, 344,450,471,607,375,479,502,
636,532,648,700,874,399,512,542,675,553,715,737,915,
611,751,773, 908,799,951,1005,1192,20,37,41,91,49,95,
106,174,50,107,118,185,130,205,213,324,63,119,131,21
8,144,225,238,325,152,237,253,356,274,374,382,500,67,
141,154,220,171,241,259,372,179,267,27 9,384,290,409,
428,550,178,288,302,408,321,438,453,593,346,473,490,
623,510,642,680,859,78,16 5,172,265,188,284,301,403,
196,306,314,435,332,460,477,621,251,327,345,465,364,
487,509,638,3 93,516,546,672,571,712,740,902,283,359,
385,497,407,529,548,702,431,564,578,724,615,762,782,
939,468,613,625,774,639,801,766,965,689,851,875,1016,
881,1081,1115,1229,83,186,190,320,242, 336,350,472,266,
355,365,494,392,518,545,704,280,388,406,519,422,549,
573,730,445,581,606,756, 637,779,817,973,323,410,427,
572,452,599,629,768,492,630,646,813,690,797,865,1022,
527,666,7 08,853,731,880,905,1058,763,911,910,1105,967,
1127,1155,1308,358,442,474,631,517,647,679,829, 547,
703,717,876,748,887,909,1077,574,735,770,903,786,913,
969,1129,827,978,1001,1161,1040,1 201,1226,1385,622,
776,809,971,863,974,1030,1174,872,1026,1062,1215,1094,
1247,1294,1444,88 9,1084,1123,1263,1146,1300,1278,
1463,1189,1331,1352,1516,1396,1544,1581,1667,27,43,52,
99,6 0,120,132,210,66,136,145,217,156,235,239,368,68,
155,164,234,173,285,294,398,198,296,319,432, 334,455,
475,634,70,170,187,289,200,317,328,448,211,340,352,480,
370,505,524,650,223,360,381, 514,404,544,559,694,414,
551,583,734,590,754,777,1011,109,199,207,333,219,353,
369,496,245,38 3,394,536,417,566,580,706,264,397,426,
556,447,588,595,742,464,597,604,781,664,802,845,1024,
281,446,458,602,486,627,633,791,508,663,683,826,720,
860,877,1065,535,699,732,879,764,900,94 3,1097,807,948,
980,1130,1002,1165,1206,1378,112,215,236,379,262,395,
421,570,276,429,449,598, 469,609,617,788,305,459,485,
619,507,658,677,822,533,692,718,870,743,890,927,1068,
329,495,5 23,681,560,709,707,893,575,736,752,916,793,
945,957,1135,608,765,805,952,823,987,1004,1176,8
50,1020,1049,1216,1103,1253,1297,1451,348,540,565,738,
594,761,795,949,655,806,834,997,838, 1008,1037,1199,
667,836,849,1029,897,1048,1088,1244,936,1100,1121,
1264,1153,1314,1336,1470, 693,907,922,1071,962,1107,
1126,1287,981,1151,1179,1328,1207,1356,1391,1525,
1053,1181,1219, 1363,1260,1402,1419,1571,1289,1435,
1461,1591,1493,1628,1661,1772,129,246,268,430,303,457,
481,641,312,488,513,661,537,686,729,929,342,525,569,
705,585,759,745,938,600,771,798,977,830, 991,1014,1190,
405,576,601,757,654,790,810,1000,660,833,843,1015,862,
1038,1057,1233,668,85 6,884,1055,934,1087,1117,1267,
954,1143,1152,1319,1180,1337,1371,1509,416,653,657,
824,671,8 37,869,1044,698,898,919,1079,946,1112,1148,
1303,804,931,964,1119,983,1162,1183,1333,1041,1 186,
1222,1365,1262,1398,1415,1569,842,986,1028,1164,1054,
1212,1236,1377,1092,1251,1272,14 12,1301,1437,1468,
1607,1124,1292,1324,1460,1351,1484,1508,1632,1382,
1519,1541,1656,1556,1 693,1700,1831,425,673,685,925,
789,941,956,1141,815,975,995,1169,1034,1195,1231,1373,
847,10 12,1051,1203,1075,1239,1275,1407,1114,1298,
1269,1429,1334,1465,1492,1613,937,1059,1086,12
55,1133,1280,1321,1456,1159,1325,1350,1485,1369,1495,
1527,1651,1208,1359,1388,1513,1421,1 548,1563,1681,
1442,1586,1604,1712,1629,1732,1736,1804,984,1089,
1156,1326,1193,1346,1360,1 504,1227,1395,1404,1536,
1431,1549,1593,1698,1235,1427,1458,1584,1490,1608,
1611,1734,1521, 1634,1647,1749,1674,1776,1791,1867,
1306,1480,1486,1624,1532,1636,1658,1755,1554,1680,168
6,1786,1717,1792,1833,1888,1577,1709,1729,1814,1752,
1819,1846,1909,1765,1850,1864,1922,18 78,1934,1943,
1982,138,113,65,275,104,255,180,470,125,183,201,418,
216,338,311,528,159,214,23 3,318,256,386,354,603,292,
366,400,503,434,659,562,785,169,243,261,373,295,391,
439,543,313,4 61,413,726,493,577,612,1009,335,443,515,
589,478,632,697,895,538,684,656,812,741,930,839,117
8,197,282,298,423,330,454,499,618,361,555,463,645,526,
669,714,848,389,491,587,695,563,780,6 82,873,520,719,
800,906,758,1042,950,1330,415,584,539,749,649,728,820,
921,610,857,772,988,81 1,961,1142,1080,674,828,867,
1063,894,998,1023,1200,923,1101,1047,1293,1131,1420,
1245,1564, 228,315,349,484,380,511,554,701,411,620,531,
722,579,746,792,970,436,561,651,755,605,844,775, 955,
670,814,885,1003,861,1032,1091,1220,466,640,591,796,
716,831,891,1019,696,933,846,1150, 917,1060,1069,1270,
750,882,976,1090,947,1111,1170,1438,1017,1188,1136,
1285,1230,1339,1370, 1598,506,662,733,871,688,896,959,
1099,767,992,918,1211,1025,1120,1167,1318,803,942,
1033,11 44,1078,1184,1266,1349,979,1241,1194,1406,
1290,1384,1462,1644,835,1052,1095,1249,996,1217, 1277,
1479,1125,1312,1343,1414,1228,1517,1445,1806,1154,
1329,1364,1505,1387,1467,1494,169 1,1296,1538,1557,
1623,1580,1757,1660,1927,271,367,396,557,440,626,582,
784,456,596,710,818, 652,854,886,1046,498,676,635,868, 713,953,840,1076,760,899,968,1106,924,1198,1163,1433,534,7 23,687,1010,808,892,928,1113,747,944,985,1256,1027,1139,1185,1353,825,1045,999,1210,1096,1 173,1261,1381,1067,1240,1282,1401,1317,1448,1511,1618,567,864,739,963,778,1056,990,1218,8 41,1018,1083,1191,1110,1248,1288,1422,904,1145,1070,1341,1039,1258,1281,1497,1187,1311,13 57,1452,1383,1477,1543,1707,940,1160,1108,1295,1205,1332,1403,1531,1252,1428,1345,1502,13 68,1589,1560,1685,1128,1394,1466,1575,1436,1550,1640,1678,1487,1626,1599,1744,1669,1725,1 777,1938,628,794,878,1043,920,1074,1168,1302,960,1224,1093,1327,1137,1274,1386,1529,852,11 18,1157,1366,1214,1449,1342,1515,1273,1409,1432,1582,1310,1633,1558,1832,1013,1177,1246,1 474,1305,1418,1399,1616,1204,1440,1507,1570,1483,1594,1655,1731,1361,1499,1464,1605,1530, 1695,1639,1751,1561,1662,1710,1785,1687,1770,1847,1887,1050,1259,1323,1439,1225,1537,146 9,1622,1379,1476,1579,1648,1506,1668,1714,1800,1286,1551,1523,1673,1585,1728,1689,1796,16 30,1702,1760,1781,1743,1863,1838,1912,1411,1609,1566,1723,1653,1810,1704,1827,1539,1762,1 737,1844,1748,1855,1877,1997,1601,1803,1787,1892,1775,1870,1902,1948,1823,1897,1885,1965, 1919,2017,1956,2029,347,419,476,643,522,665,711,888,552,783,691,972,744,914,1006,1166,586,721,821,932,769,1073,966,1197,855,1036,1109,1338,1021,1221,1254,1454,616,816,787,994,866,1 031,1098,1268,935,1147,1061,1234,1134,1291,1375,1501,901,1116,1085,1284,1172,1354,1320,14 81,1213,1367,1408,1659,1424,1568,1542,1722,678,832,926,1072,993,1102,1242,1309,883,1122,11 82,1340,1138,1397,1347,1524,982,1202,1223,1447,1158,1374,1430,1578,1299,1459,1393,1553,14 96,1600,1637,1769,1066,1238,1322,1413,1276,1475,1453,1615,1358,1534,1503,1595,1446,1641,1 665,1758,1265,1547,1520,1649,1583,1703,1682,1797,1489,1675,1718,1859,1742,1837,1818,1931, 753,1007,912,1171,958,1316,1149,1425,1082,1196,1271,1417,1250,1390,1472,1619,1064,1362,12 83,1510,1237,1457,1443,1643,1344,1491,1555,1603,1533,1670,1692,1789,1132,1307,1380,1478,1 405,1574,1526,1708,1313,1514,1610,1684,1552,1663,1735,1811,1426,1596,1573,1697,1645,1764, 1720,1829,1635,1740,1794,1842,1774,1866,1874,1971,1209,1434,1348,1565,1389,1540,1606,172 6,1455,1666,1590,1713,1625,1747,1761,1848,1488,1650,1617,1771,1696,1754,1801,1910,1676,18 21,1778,1862,1812,1884,1899,1946,1522,1621,1705,1788,1664,1798,1826,1879,1739,1854,1808,1 896,1843,1905,1921,1963,1724,1830,1856,1939,1876,1914,1926,1985,1816,1933,1950,1978,1957, 1991,2004,2034,858,1035,989,1279,1104,1315,1257,1471,1140,1232,1392,1576,1355,1498,1545,1 677,1175,1372,1335,1512,1441,1638,1535,1701,1423,1559,1597,1746,1620,1719,1779,1858,1243, 1450,1410,1567,1482,1588,1602,1727,1376,1614,1654,1780,1688,1767,1756,1869,1518,1657,170 6,1753,1679,1795,1813,1890,1642,1824,1790,1881,1840,1907,1918,1973,1304,1400,1528,1652,14 73,1631,1699,1783,1572,1733,1671,1768,1562,1802,1817,1895,1592,1690,1711,1861,1738,1809,1 834,1942,1763,1852,1825,1904,1873,1915,1936,1981,1627,1716,1784,1835,1745,1882,1853,1923, 1805,1845,1891,1929,1865,1961,1944,1988,1773,1880,1903,1947,1916,1968,1958,2001,1898,195 3,1979,2009,1972,1995,2013,2037,1416,1500,1546,1694,1612,1759,1683,1822,1587,1721,1715,18 49,1750,1868,1841,1935,1646,1793,1741,1836,1807,1857,1893,1928,1782,1883,1901,1945,1875,1 954,1967,2000,1672,1766,1828,1871,1799,1906,1886,1951,1815,1894,1913,1983,1932,1959,1962, 2008,1851,1925,1941,1966,1920,1989,1974,2006,1908,1977,1994,2021,1987,2012,2019,2043,173 0,1820,1839,1924,1872,1900,1940,1969,1860,1911,1930,1975,1949,1992,1984,2015,1889,1937,19 52,1990,1960,1980,1999,2025,1964,2003,1996,2018,2007,2023,2027,2046,1917,1955,1970,1998,1 976,2002,2011,2022,1986,2010,2005,2030,2016,2031,2026,2042,1993,2014,2020,2032,2024,2033, 2035,2039,2028,2036,2038,2041,2040,2047,2044,2045]

Sequence Group 7: Q7_4096

[0,1,2,4,8,16,32,3,5,64,9,6,17,10,18,128,12,33,65,20,256,34,24,36,7,129,66,512,11,40,6 8,130,19,13,48,14,72,257,21,132,35,258,26,513,80,37,25,22,136,260,264,38,514,96,67,41,144,28,6 9,42,516,49,74,272,160,1026,520,288,528,192,544,70,44,131,81,50,73,15,320,133,52,23,134,384,7 6,137,82,56,27,97,39,259,84,138,145,261,29,43,98,515,88,140,30,146,1028,71,262,265,161,576,45, 100,640,1025,51,148,46,75,266,273,517,104,162,53,193,1032,152,77,164,768,2048,2049,268,274, 518,54,83,57,521,112,1024,135,78,289,194,85,276,522,58,168,139,99,86,60,280,89,290,529,524,1 96,141,1040,101,147,176,142,530,321,31,200,90,1056,545,292,322,532,263,149,102,105,304,296,1030,163,92,1033,47,267,385,546,324,208,386,150,153,165,106,55,328,1088,536,577,548,1034,11 3,154,79,269,2050,2052,108,578,224,166,519,552,195,270,1041,641,1036,523,275,580,291,59,205 6,2064,169,560,114,277,156,87,1152,197,116,170,61,1042,531,525,642,281,278,526,177,293,388,1 057,2080,2051,91,584,769,198,172,120,201,336,62,282,143,1029,1044,103,178,294,93,1058,644,2 02,592,323,392,297,2053,2112,770,107,180,1280,151,209,284,1027,648,94,204,298,400,608,1089, 352,325,533,155,210,305,547,300,109,1048,184,534,1060,537,115,1090,167,225,326,306,772,157, 656,329,110,2057,2054,117,212,171,1038,776,1064,330,1153,226,549,1043,538,387,308,216,416,2 71,279,2065,2058,158,337,550,672,1092,118,332,579,540,1072,389,173,1037,121,553,199,784,17 9,228,338,2066,2176,312,1536,704,1154,2060,2081,390,174,554,581,1046,393,283,122,448,353,5 61,1096,203,63,340,394,1049,1281,527,582,556,181,295,1059,285,232,2113,2068,124,205,182,64 3,1156,562,2304,2082,286,585,299,354,1045,211,401,1104,185,1061,396,344,586,645,1282,593,53 5,240,1050,206,95,327,564,800,2072,2084,402,356,2055,2177,307,301,417,1160,213,1066,568,11 20,832,588,1035,1537,186,646,404,1091,227,896,594,418,302,649,2114,2560,771,360,539,111,105 2,331,1168,214,2059,2088,309,1062,1284,188,449,1073,217,408,609,596,551,650,229,159,420,31 0,1093,541,2116,2178,1288,773,610,657,333,1065,119,1098,600,339,1184,218,368,652,1031,230,3 91,313,450,542,1538,334,2067,2061,2096,2062,1076,233,555,774,175,123,1155,658,2120,2305,61 2,341,777,220,314,1105,424,1068,395,673,583,355,1296,1094,287,183,234,1051,2069,2180,125,5 57,1216,660,616,342,2083,2306,316,1157,241,778,563,1074,345,452,397,403,1112,207,2074,2561, 1540,674,558,785,1100,432,1039,357,187,1162,236,664,1312,624,587,780,1080,1122,2128,2085,7 05,126,242,1063,2073,2070,565,398,346,456,2184,2308,358,405,303,569,1544,244,1158,1097,595, 1283,189,566,676,1169,1054,1108,361,706,589,1344,215,786,647,348,2312,2086,419,406,2562,2 144,464,680,2115,2089,801,1069,362,1164,2192,2076,590,409,1286,570,1121,788,1552,1106,597, 1075,572,1186,219,311,708,598,1289,601,651,421,792,802,2117,2090,611,1047,602,1172,410,231,688,653,2564,2097,1128,248,1070,369,2122,2320,190,364,1568,654,1095,659,1161,335,480,315,2 21,370,1285,613,1408,422,2208,3074,425,451,2568,2336,1077,614,543,1298,235,412,343,372,257 6,2240,1185,775,317,1539,222,1099,426,453,237,1124,559,1170,2592,2118,1292,833,804,712,108 2,834,661,1053,2092,2179,2129,2098,808,779, 1217,617,604,1541,433,720,816,1101,2121,2063,11
76,836,347,897,1136,243,1297,662,1600,454,318,675,
2368,2181,1110,618,1081,898,781,1314,122 0,376,428,
1546,2100,2071,665,736,567,1107,2182,2432,1192,1078,
2124,2185,840,625,238,1159,3 59,457,399,787,2130,2104,
591,678,434,677,1290,1542,2075,2145,349,1300,1102,245,
1188,458,66 6,1113,620,1553,1163,1313,363,127,1067,
191,1125,782,407,436,2087,2307,626,1218,2132,2186,5
71,465,2193,2309,681,246,707,1346,2077,2091,2146,2563,
350,1084,599,668,1548,790,2136,2188, 1165,1320,460,
1123,1200,249,682,1664,573,1171,411,803,1116,789,1304,
709,365,440,628,689,20 78,2194,374,1224,3076,2119,423,
1556,466,793,2310,2313,2209,2624,1130,250,371,1174,
2093,214 8,481,574,1348,413,1109,603,366,1545,1287,
1055,468,1570,655,900,805,615,1166,684,1409,710, 2688,
3073,1187,429,2099,2196,794,252,1114,373,605,1232,848,
690,2094,2123,713,632,2314,2321, 1316,482,806,1132,
2565,2152,1083,427,1177,904,1569,414,2210,2101,1291,
223,1126,1554,663,6 92,835,1328,619,472,2241,3080,
1137,455,2200,2125,796,1189,1601,809,714,1248,721,837,
716,10 86,2212,2816,1302,1352,864,810,1173,606,1194,
912,1103,722,696,377,2316,2322,1424,435,2566, 2102,
1293,1560,817,1129,1792,319,621,1180,2131,2105,2569,
2160,812,484,1345,430,1572,1138,3 072,2183,1299,838,
667,1219,2126,2337,488,1111,239,378,459,622,1410,627,
2242,2133,437,380,1 201,1608,818,1178,2324,2570,1294,
461,1543,496,669,1190,1317,679,2106,2216,1140,1079,
2187,2 147,1221,724,841,1305,629,1584,2134,2108,351,
467,2328,2137,1360,438,1115,737,2338,2577,25 1,462,
442,441,2572,2244,1666,469,1549,247,683,1196,2189,
3088,2149,2195,1226,842,1412,1127, 738,1144,2224,2190,
1308,899,1602,670,1318,783,1085,849,1555,1193,820,
1576,728,928,791,367, 2578,2369,1376,901,2079,2248,
2138,3104,1233,630,2593,2340,1321,685,844,1204,633,
711,2370, 2580,2311,2197,2150,2153,1118,253,691,1301,
824,1175,2352,2344,902,686,1668,1222,1416,1133, 740,
1347,850,375,1558,444,1306,470,1167,483,1547,415,3078,
2211,485,905,2140,3081,1202,795, 473,1240,2095,2315,
634,744,2433,2594,1616,852,2372,2256,2434,2198,960,
1322,2201,2213,865, 693,2154,2103,1131,1794,1350,797,
1225,1604,1571,906,2376,3136,1252,715,1141,1330,807,
474, 636,1179,694,254,1550,1665,2584,2625,717,1071,
2596,3082,1315,575,913,1440,798,811,379,120 8,2161,
2202,1353,1191,2127,2317,697,1564,431,1142,607,1228,
2156,2626,489,1324,2272,2214,8 66,723,2567,2600,486,
1573,1181,1234,908,1793,1561,718,813,1364,2243,2318,
476,856,3089,268 9,1117,1411,839,1329,1295,1146,3084,
2571,725,698,1472,914,2323,2628,1249,752,868,819,1349,
814,439,929,2339,2107,1197,1578,490,1139,2217,2608,
1680,623,2162,2325,1632,1336,671,1198,1 362,739,2204,
2135,1603,1557,3200,2245,2164,2218,1413,916,1303,463,
1236,843,2109,3090,1135, 381,1672,1354,2579,2573,497,
1586,930,821,2690,2329,726,961,1203,1182,2326,2574,
872,1418,4 92,1250,1332,631,2225,2341,2436,3105,1574,
1223,729,1145,1605,700,2139,2632,1796,443,2817, 2246,
1307,741,2220,2168,1378,1562,1356,1205,845,1319,2249,
2384,920,382,2110,2330,1585,822, 1425,851,2191,3077,
3092,2151,1229,730,1609,498,2226,2342,880,1256,742,
445,1392,471,2141,3 106,2692,2250,2640,2371,635,1148,
1696,932,1580,687,2440,2345,1210,1420,1612,1325,1800,
903, 1134,825,1235,1361,500,1577,846,1670,1195,745,
2818,2155,2228,3328,826,732,2199,2257,2332, 3075,1264,
446,2696,2142,962,1426,1620,936,2252,2346,1377,475,
2448,2656,3137,2400,2373,258 1,853,1310,867,637,2203,
2258,1551,1230,2353,2595,1414,907,1206,1667,1588,
1333,487,1808,23 48,2157,695,1441,1087,746,828,753,
1610,854,1237,1326,3096,2232,857,1368,2582,3108,1209, 50 4,799,1355,2585,2163,255,964,3138,2215,2273,2374,
1242,909,2354,2820,2205,2704,1673,1559,1 309,719,2377,
2158,1143,477,2165,2260,1617,915,1448,1380,2219,3086,
638,748,2824,3112,944,1 728,1331,1227,869,1592,1428,
491,699,1253,1351,754,2378,3201,1183,1565,2274,2597,
858,1618, 1417,1476,3091,2586,478,968,1260,383,2435,
2356,1212,910,1801,815,2264,2464,1579,976,2319, 2327,
870,1684,1633,917,2206,2385,2598,2720,3140,2166,1337,
1241,2380,2627,1606,1824,727,11 50,1442,493,1357,1251,
2588,3120,1676,873,2437,2221,1384,701,3085,2169,1566,
931,1323,1798, 1365,1473,2601,2247,756,1334,860,499,
2832,2227,731,1648,1238,823,1575,922,1199,1674,2276,
2386,874,1432,1421,918,2360,3584,2752,3202,1636,1254,
2438,2222,502,1795,2602,2629,933,136 6,3094,2441,1338,
1682,2331,2170,2496,2401,1587,1211,1488,743,1358,760,
2609,3144,1244,1581, 881,1147,2251,2111,494,1379,1272,
702,2388,2442,3097,3329,921,1624,501,876,2575,2630,
1415, 847,1856,1444,992,1697,2604,2229,2343,3107,2333,
2280,447,1607,1436,1369,2172,2253,1257,17 04,2230,
2691,733,1797,3204,2610,1669,1340,1231,827,1590,934,
2334,2633,1634,1474,2347,2402, 3093,2259,882,937,2449,
3152,2233,3109,963,1419,747,1265,2444,2392,1119,505,
1381,855,2634, 2693,924,1810,3330,2641,2583,2288,3098,
2254,734,829,1563,1213,2143,2375,1611,1363,2612,28
48,1430,1258,1688,1386,965,1614,1730,1239,2450,2404,
938,884,506,1327,1589,1804,2355,2349, 2465,3208,749,
1370,2261,3114,2616,3168,1640,945,2880,2636,966,1456,
1681,755,3083,3585,223 4,2694,1266,859,2452,3139,2275,
2944,2642,2466,1427,1593,1388,940,2350,2697,1214,830,
2819, 2408,1809,911,1621,1582,2587,2159,1832,871,3100,
2379,639,1480,1698,1335,888,1372,1245,479, 1422,1268,
3216,2262,946,1732,2357,3110,1677,750,1802,1626,3332,
2236,2497,3121,1393,969,2 265,2456,2657,2644,508,1613,
2599,2698,2277,2207,861,1446,2468,2358,1857,1339,
3141,2589,75 7,1382,3336,2821,970,1700,2658,2705,2381,
3113,1243,919,2167,3146,1594,1433,1826,1504,875, 1635,
1259,862,2648,2387,1920,1675,3232,2266,1445,758,2416,
2700,1149,948,1359,1816,3079,22 78,1596,1671,1712,977,
2439,2361,1385,923,1622,972,2498,2590,1434,1311,3586,
2382,1729,761, 1396,877,3124,2281,2603,2822,2223,2171,
3203,2706,1207,1475,2660,2389,1449,1812,952,1686,2
825,2268,495,1262,2362,3153,1644,1619,2472,3116,1341,
1429,2443,2721,1825,703,1371,1638,15 67,1736,2631,
2403,935,1685,978,1625,3344,3142,883,762,1246,503,
2335,2231,1458,925,1394,12 69,2282,3099,878,1478,735,
1799,2173,2605,3264,2708,2664,2390,1678,1860,2364,
3205,2289,282 6,2611,3122,1443,1637,2393,2500,1481,
1373,2445,2451,3160,2255,1699,1255,993,1591,1828,145
2,3588,2722,885,939,994,1400,2606,2833,3148,2480,1744,
1656,3087,2405,2235,3210,980,1689,9 26,764,2284,2712,
1270,941,1628,1367,1805,1457,3360,2672,2635,2828,
3128,3170,1921,1583,275 3,2174,1387,1642,2290,3111,
967,1267,2613,2446,1484,1450,2394,2504,886,831,1683,
1342,1811,9 47,2406,2453,2351,2617,3592,2292,1705,
1431,3206,3145,2643,3331,507,1261,1840,889,2237,261
4,1650,984,1760,1490,2724,3217,3102,3156,1615,751,
2409,2754,2637,3392,2263,2834,1702,942, 1858,1423,
2695,2396,1460,1383,2467,2454,996,1692,1641,1814,971,
1477,2512,2728,1273,1512,1 733,890,1598,1374,2849,
3117,2410,3212,509,1806,2638,2457,3334,2618,1922,
1649,3169,2836,36 00,3154,949,973,2645,3123,2620,3234,
1397,1489,2267,2359,2756,2646,3337,2649,1708,1627,269
9,2469,1000,1690,2840,2850,892,1274,2659,3095,1438,
1817,2650,3220,2458,2279,1390,1464,273 6,2701,1868,
950,1151,1731,1506,1827,1597,863,3176,2296,3118,2417,
1451,759,2238,2412,1864, 1714,3616,2702,3143,2707,
1701,1395,3209,2383,2528,2363,1803,1008,2269,2418, 3333,2661,1623,1482,3456,2470,1276,510,2473,2499,1435,1652,3125,2662,2591,3346,2283,2460,2391,2420,979, 1492,3233,2823,953,1928,1829,1389,2365,3587,1738,763,2270,3147,1872,974,2474,2501,1453,1643,2285,3172,1713,1818,1215,1402,2607,3218,1629,1520,1830,1691,3340,2881,954,1459,1734,879,2852,2760,3130,2882,981,1505,2709,3101,1706,982,2856,2827,3265,2665,2652,3589,2481,2768,2864,3149,1924,927,3224,2884,1833,1639,2395,2945,3184,2291,1447,1746,3345,2710,1343,1679,3648,2502,2366,2723,1820,1761,1479,1275,995,1740,3158,2666,1401,1888,765,956,3129,2946, 2829,3362,1496,1861,3268,2424,887,1437,985,1720,2476,3594,997,1630,1813,1462,2713,2784,2615,3155,3240,3126,1398,1645,2888,2673,2286,3207,2407,2505,2447,2835,1848,1687,2639,2726,1247,1716,2482,2725,3338,3590,1936,986,1483,1651,1745,943,2397,3348,1859,1508,3150,2293,3236,2506,1834,1454,2714,3161,2668,3601,891,1841,998,1595,3211,3361,1278,766,1465,1709,2411, 2175,1764,1646,3115,2239,3173,2830,2455,2484,1737,511,2674,3266,1485,1404,2619,2513,1693, 1866,2729,2294,2755,3394,1952,1491,988,1657,1752,1807,2398,3132,2647,2716,3596,2838,1399, 1844,3213,3368,2508,3171,1001,951,1654,1926,3248,2297,2730,3712,1707,1391,2621,3219,2459, 2851,1002,1468,3164,2837,3352,2757,2413,2488,1836,1494,1873,1271,2676,2737,1694,893,2422,3272,1923,1461,2471,3604,1748,1715,2514,2841,975,1862,894,1815,3178,2298,2419,3222,1497, 1653,2529,2622,3396,2461,3157,2651,2414,3593,1510,1762,3335,3103,2516,3618,1842,1375,2703,2948,2853,2663,3214,2732,1703,1009,3457,2758,1466,1874,3235,2477,955,1739,2842,2300,3162,2421,2653,3280,2896,2738,1486,1930,2761,2680,1889,1004,1658,1821,1718,1929,3364,2530,2854,3180,1599,1507,3131,2475,1776,1405,3225,2952,3617,2462,1735,1831,3339,2271,3174,3602,1493,1010,2711,2740,2883,3376,1984,1455,2667,2520,957,1865,3185,2503,2844,3237,3649,2857,2762,3296,2769,2885,2764,3134,983,1710,3350,3400,958,1514,2912,2858,3221,2654,1876,1768,3242,2960,1721,1938,3151,2770,2744,2425,1660,1500,1403,1892,3472,2483,1819,1741,1516,987,3341,3608,1932,1463,2865,3177,3840,2367,1012,1843,2669,3228,1749,999,2860,2532,3393,2478,3620,3186,3347,2886,2715,3267,1838,1277,2536,3159,2287,2426,2507,2670,3458,2675,1647,1925,2485,2428,1498,1742,3249,3656,2866,3226,1513,1880,1717,1016,1953,1837,3342,2509,1867,1631, 3591,2544,2717,3238,1469,1747,3365,2727,767,1904,1724,1524,3188,3127,989,1406,1754,1822,3269,2772,2889,3353,2677,3632,2399,2515,3408,2486,3163,2785,2299,2510,2490,2489,1835,1499,3714,2517,3597,2295,2731,3244,1944,1863,1890,1467,1003,1522,3274,2890,3460,3175,2786,3192,1763,1695,3356,2947,3650,2718,1850,990,1005,1937,3366,2831,3133,2897,1722,1845,3603,3241,1495,1655,2868,3624,2776,2976,2839,2415,1765,1956,3424,2949,1487,1750,3281,2678,1869,1521,3369,2733,2892,3252,2681,2759,959,1896,1263,1940,3166,2301,2739,3349,2872,3223,1770,1877,2950,2734,3716,3270,1509,1711,3464,3181,2788,3395,1756,1846,2898,2423,3606,2492,1011,1960,3354,2518,3215,2531,3595,2463,1784,1870,1662,1013,2533,2953,1985,1753,3250,2843,2521, 3288,2682,2792,1927,1528,3664,2900,1849,1882,3008,3370,2913,2741,1766,1511,3179,3842,3398,2845,3273,3652,3619,2954,1954,1719,3300,2763,3189,3378,1777,895,2855,2522,2684,3227,2742,2302,1439,1006,3598,3713,1878,1891,2765,3119,3363,2623,2961,3488,2846,2859,2427,3256,1939,1661,3401,3239,1502,1986,2745,3612,1852,1934,2479,3190,2655,3276,2537,3372,1723,1772,2914,2771,1515,1897,2534,3621,3229,3282,2956,3841,3609,2766,1014,1470,2861,3412,1743,1931, 2524,2904,3165,3459,2887,3377,3343,3194,2773,2746,3520,2962,1017,1968,3297,2800,2916,2867,3397,2862,2487,2977,1881,1894,3245,3626,1769,1517,2538,3187,1778,1941,1823,1659,3728,2671,1992,1875,3680,3384,1755,1501,2719,3246,3410,2787,1018,1900,3651,3605,1725,991,3461,2964,3351,2511,3284,2891,3183,2429,3720,3402,2545,3634,2978,2869,2774,3009,3251,3230,1933,1839,2920,3466,2540,3298,3380,2679,1525,1955,1988,1884,1726,1948,3622,3271,2777,3193,3653, 2748,1780,1518,3844,2491,1020,1767,1905,1851,3355,2789,1893,1945,3426,3610,3404,3253,2893,3367,2968,2430,3633,2870,3473,2899,3277,2778,3657,2546,1757,1530,2928,3304,2790,2493,3440,2519,1958,1471,1007,2000,2683,3196,3744,2980,3628,2735,1847,1898,3258,3468,3660,3373,1523,1942,3848,2951,3182,2873,1961,1871,3283,3409,1771,1529,2548,3625,2894,3718,3243,2793, 1912,1758,2874,2780,1989,1946,3312,2494,3010,3474,3668,2984,3425,2523,1526,1906,2901,3358,2915,2685,3599,3278,1883,1773,3462,2955,3254,3715,3636,3381,2535,3856,1957,1853,2743,3489,3135,2794,1976,1015,2876,2801,3658,2902,3285,3374,1751,1993,1503,1962,2905,3416,3257,2552,2847,3403,2303,3012,1781,1885,3290,2957,1908,2016,3721,3607,3357,2767,3191,2525,3665, 2963,3496,3428,2686,2796,1854,1532,2992,3776,3379,3275,2917,3640,3476,2539,2747,3301,1972,1774,3399,2802,1019,1895,3231,3613,2906,3666,3465,3524,2526,3016,3308,2431,1987,1969,3260,2958,3849,2863,3627,3024,1782,1279,2918,3732,3681,2965,1943,1899,3385,3289,1994,1663,3654,3872,2775,3198,3490,2541,3405,3299,1964,1785,3724,2921,1021,1935,3432,2749,3614,2979, 3371,3846,3413,3521,2804,3382,2908,2547,2779,3696,3286,2871,3623,2970,3247,3722,1886,2001,2922,3480,3469,2966,1407,1779,1990,1970,3684,3302,2550,3843,1879,1022,2981,3414,1902,1947,3386,3730,3635,3259,3536,2791,3406,2808,3292,3629,2929,3195,2542,3427,3320,2750,2969,3672,2549,2924,1759,1907,3463,2895,3904,3492,3040,3745,1527,1996,1786,1959,2495,3655,3484, 3417,2002,1913,3305,3752,1949,2017,2781,3845,1534,1788,3717,3388,3279,2875,3638,2982,3682,3522,2930,2985,3011,3467,2795,3313,3167,2553,3429,2903,2972,3858,1910,1965,2782,2877,3611,3261,3659,3411,2004,1901,3478,3306,3736,3434,3013,3662,3778,3287,1966,1775,2986,2932,2008,1531,2554,3375,3637,3852,1971,1950,2797,3418,3688,2993,3014,3504,3729,2803,3314,2907, 1909,1991,3475,3641,3436,2988,3262,2878,3857,2959,3669,3630,3880,2919,2018,1727,2687,3528,3746,3383,2936,3420,3293,2527,3470,3316,1916,1855,1974,1995,2994,3780,3725,2798,3850,3674,3441,3017,2020,1977,2556,3661,2909,3494,3905,3387,2805,3430,3018,3748,3291,2967,1787,1914,3642,3481,3874,3552,2923,3683,3307,2910,2005,1887,3968,3723,1023,1963,3493,2806,3197, 2996,3407,3864,3644,3719,3760,3025,3433,2971,3670,3020,3482,3359,1998,1783,3777,2809,3444,2925,2024,1980,3255,3523,3497,3860,3000,3734,2543,3310,1903,1973,3692,3667,3389,3477,3873,2751,3419,3686,3615,3784,2983,3733,3026,3673,2931,2810,3294,2551,3506,2973,3442,3317,2003,1789,2926,3526,2783,3847,1997,2032,3726,3908,1978,1917,3491,3685,2010,1519,3529,3421, 3747,3303,3041,3639,3876,3500,2933,2987,3042,3448,3792,3704,3028,3737,2974,2812,3318,2989,3676,3415,3853,3505,2019,2006,3969,3631,3435,3690,1951,1911,3015,3315,3532,3498,2021,2009,2934,2879,3731,3390,3859,2995,3753,3479,2555,3309,3888,2937,3698,3032,3808,3538,3663,2799,1790,2026,3750,2990,3906,3471,3508,3431,3044,3740,3689,3862,3019,3525,1975,2012,3321, 3560,3781,2938,3646,3422,1967,1915,2557,3854,3970,3697,2997,3021,3445,3537,3756,3675,304

8,3738,2940,3322,3486,3865,3438,3512,2025,2022,3916,2998,3199,3779,3554,3875,3645,2911,1981,1918,2033,1999,3499,2807,3912,3762,3749,3443,3851,3056,3671,3530,3324,2558,3483,3700,3027,3540,3001,3976,3877,3437,3786,2811,2028,1533,3920,3022,3501,3691,3761,3866,3263,3450,3677,3568,3878,3739,3002,3507,3782,2927,3029,3553,2011,1982,3754,3030,3972,2975,3881,3687,3495,3794,2034,1979,3391,3727,3868,3809,3527,3323,3043,3788,3449,3936,2813,3004,3544,3909,2935,3485,3033,3768,3045,3678,3861,3510,2023,2013,3446,3693,2036,2007,3896,3735,3295,3764,3984,3034,3531,3699,3793,2991,3907,3556,3882,3502,2939,3889,3046,3643,3326,2814,3513,3757,3812,3694,2030,2014,3785,2559,3533,3452,3741,3914,2040,1535,4000,3539,3036,3705,3800,3855,3447,3892,3049,2999,3702,3974,3755,3439,3050,3516,3884,3542,3921,3319,3742,2941,3971,3509,3796,3763,2027,2029,3023,3910,2942,3863,2035,2037,3545,3701,3558,3810,3890,3423,3751,3057,3514,3922,3003,3787,3534,3978,3937,3052,3706,3869,3766,3977,1791,2038,3647,3555,3824,3453,3783,3879,3541,3058,4032,3503,3005,3913,3031,3758,3006,3562,3924,3816,2041,1919,3769,3986,3708,3548,3451,3940,3867,3789,3564,3035,3980,3511,3060,3891,3797,3047,3886,3325,3695,3973,3546,3790,3561,3928,3765,3064,4001,3885,3915,3679,3517,3795,2815,3952,3772,3572,3037,3454,3802,3870,2042,2039,3883,3547,3992,3911,3938,3515,3051,3570,3811,3743,3898,3038,3053,3985,3770,3893,3543,3703,3813,4004,3535,3798,3917,3569,2044,2043,3007,3944,3311,3988,3818,3925,3557,3759,3804,3894,3059,4008,3832,3918,3710,3061,4033,3801,3975,3576,3897,3930,2031,1983,3814,3559,4002,3767,3825,2943,3487,3054,3926,3939,3987,3709,3550,4034,3900,3982,2046,2047,3771,3820,3563,3945,3062,3518,3791,3979,3065,4016,3929,3942,3817,3565,3826,3989,3871,3707,4040,3923,3803,3549,3066,3948,3773,3039,3981,3887,3573,4003,4036,3932,3774,3996,3828,3566,3068,3815,3953,3899,3941,3993,3805,3578,4006,3519,3055,4048,3895,3946,3571,3990,4009,3919,3819,3577,3960,3806,4037,3994,3574,3954,3931,3821,4005,3901,4024,3063,3799,4041,3551,4010,3829,3933,3956,4064,2015,2045,3902,3580,4020,3822,3067,3943,4035,4017,3830,3327,3991,3947,4042,3711,4012,3833,3069,3983,3934,4049,3455,3827,4038,4018,3927,3070,3950,3995,3807,3955,3575,4044,3834,4007,4050,3961,3997,4065,3582,3836,3958,4013,4052,3949,4014,3823,4056,3579,4019,3998,3957,4039,4066,3775,3964,3903,4022,4043,4068,4025,3835,3962,4053,3935,3071,4011,4046,3831,4072,4028,3951,4021,4051,3837,4045,4080,4026,3965,4058,3567,4067,4054,3999,3959,4069,4057,3838,4074,4023,4060,4015,3963,4073,4070,4029,3966,4081,4047,4076,3581,4059,4030,4082,4027,4071,4061,4084,4055,4078,4062,4088,3583,4075,4077,4083,4085,3839,4086,4089,3967,4090,4087,4092,4091,4079,4031,4094,4095,4063,4093]

Sequence Group 7: Z7_4096

[0,1,2,7,3,8,11,24,4,10,13,28,16,33,35,77,5,12,14,32,19,38,47,81,22,46,42,88,57,96,102,168,6,17,21,40,23,45,51,90,29,55,59,97,72,110,116,186,34,61,75,114,80,123,135,197,87,137,148,225,153,238,260,381,9,18,26,54,30,58,71,105,36,76,62,117,84,127,142,206,44,74,86,136,92,145,152,233,100,155,170,252,184,268,287,424,53,89,98,151,111,162,178,265,121,179,196,279,210,301,317,461,139,204,230,307,236,320,345,494,257,353,375,519,396,544,587,815,15,25,31,73,39,79,82,141,48,85,93,150,101,160,165,262,56,94,103,163,115,177,193,282,126,194,205,296,232,314,340,481,64,108,122,183,128,195,213,309,149,228,237,322,256,351,369,518,164,246,266,357,280,389,398,539,303,412,446,574,471,608,678,817,69,124,144,216,159,235,255,355,169,258,271,380,288,397,423,563,191,283,297,409,321,438,465,618,334,474,499,650,527,688,714,943,212,310,328,450,358,480,503,667,393,515,540,704,576,718,786,1016,421,554,588,753,603,805,833,1073,673,853,883,1064,915,1129,1203,1490,20,37,41,91,49,95,106,176,50,107,118,187,132,207,217,336,63,119,133,222,146,231,244,337,154,243,261,374,284,392,404,538,67,143,156,224,173,247,267,390,181,275,289,406,300,435,454,600,180,298,312,434,333,468,483,651,362,505,528,687,552,712,758,993,78,167,174,273,190,294,311,425,198,316,326,463,346,492,509,685,259,341,359,497,382,525,549,706,415,558,594,750,621,802,840,1054,293,377,407,535,431,573,598,788,459,614,634,814,679,864,894,1103,500,675,689,884,707,917,870,1145,769,981,1017,1218,1025,1315,1367,1549,83,188,192,332,248,350,368,504,274,373,383,532,414,560,593,790,290,410,430,561,448,599,625,820,475,639,666,858,705,891,939,1153,335,436,453,624,482,657,693,874,530,696,716,935,770,911,1003,1228,571,742,796,985,821,1024,1059,1278,865,1067,1066,1351,1147,1387,1431,1684,376,472,506,697,559,717,757,955,595,789,807,1018,850,1033,1065,1309,628,829,876,1055,898,1071,1149,1389,951,1162,1199,1441,1254,1509,1546,1821,686,888,929,1151,1001,1156,1242,1464,1014,1234,1284,1529,1334,1581,1658,1934,1035,1320,1381,1605,1414,1668,1630,1963,1485,1725,1760,2074,1844,2124,2211,2399,27,43,52,99,60,120,134,214,66,138,147,221,158,241,245,386,68,157,166,240,175,295,304,420,200,306,331,460,348,485,507,702,70,172,189,299,202,329,342,478,215,354,370,516,388,545,568,720,229,378,401,556,426,592,609,776,440,601,641,828,648,856,889,1213,109,201,211,347,223,371,387,534,253,405,416,580,443,616,638,794,272,419,452,606,477,646,653,842,496,655,664,893,740,918,975,1230,291,476,490,662,524,691,701,903,548,739,763,950,810,994,1019,1289,579,785,824,1021,866,1050,1113,1337,925,1120,1166,1396,1200,1451,1518,1814,112,219,242,399,270,417,447,620,286,455,479,656,501,669,681,900,315,491,521,683,547,730,755,946,577,774,808,1010,843,1036,1091,1294,343,533,567,759,610,797,795,1039,629,832,854,1074,905,1117,1137,1401,668,867,921,1130,947,1181,1202,1468,980,1226,1267,1530,1347,1591,1661,1947,364,586,615,834,652,863,907,1121,727,924,962,1195,966,1208,1249,1505,743,964,979,1239,1047,1266,1326,1578,1100,1344,1379,1608,1425,1694,1738,1974,775,1061,1084,1297,1142,1355,1386,1647,1167,1419,1471,1720,1519,1768,1831,2089,1273,1473,1533,1781,1602,1858,1887,2185,1649,1913,1961,2235,2025,2312,2385,2666,129,254,278,458,313,489,517,711,324,526,555,737,581,766,819,1093,356,569,619,791,643,861,845,1102,658,877,914,1161,958,1187,1216,1486,427,632,659,859,726,902,930,1198,736,961,973,1217,1000,1250,1277,1555,744,990,1028,1275,1098,1323,1371,1611,1132,1411,1424,1701,1472,1739,1801,2057,442,725,729,948,749,965,1009,1260,784,1048,1081,1311,1118,1362,1416,1673,920,1095,1144,1373,1171,1448,1475,1727,1255,1480,1540,1787,1604,1850,1879,2179,972,1180,1238,1450,1274,1526,1562,1811,1332,1587,1618,1876,1669,1915,1972,2261,1384,1654,1712,1960,1759,2008,2056,2322,1818,2077,2117,2378,2158,2459,2472,2831,451,751,765,1089,901,1107,1136,1409,937,1157,1191,1459,1246,1497,1553,1805,977,1214,1269,1513,1307,1565,1621,1869,1366,1666,1613,1903,1730,1967,2024,2283,1101,1279,1322,1595,1399,1634,1703,1954,1437,1713,1758,2009,1797,2029,2097,2363,1522,1775,1826,2061,1891,2136,2173,2431,1930,2228,2258,2510,2313,2560,2578,2754,1176,1327,1434,1718,1491,1752,1778,2048,154

7,1839,1862,2110,1905,2137,2239,2470,1559,1899,1956,2224,2022,2266,2271,2574,2081,2324,23 59,2603,2414,2672,2719,2941,1676,2002,2010,2306,2106,2328,2380,2617,2154,2430,2444,2704,2 525,2720,2839,3018,2201,2503,2551,2782,2612,2793,2884,3089,2651,2902,2936,3142,2984,3186, 3223,3400,140,113,65,285,104,263,182,502,125,185,203,444,220,352,323,572,161,218,239,330,264,408,372,663,302,384,422,541,462,731,612,897,171,249,269,391,305,413,469,589,325,493,439,8 16,531,633,674,1209,349,473,557,647,514,700,781,1043,582,764,728,934,841,1094,967,1470,199, 292,308,449,344,484,537,682,379,605,495,715,570,745,804,978,411,529,645,777,613,892,762,101 5,562,809,916,1060,860,1258,1128,1724,441,642,583,851,719,818,944,1083,672,991,882,1184,93 1,1141,1410,1314,752,954,1005,1285,1042,1196,1229,1508,1085,1345,1263,1655,1397,1890,1579, 2174,234,327,365,520,400,553,604,787,437,684,575,812,635,848,904,1150,464,611,721,857,665, 974,885,1133,748,936,1029,1201,995,1244,1329,1536,498,710,649,910,806,959,1037,1223,780,10 97,976,1418,1075,1282,1295,1614,852,1026,1160,1328,1119,1361,1460,1924,1219,1484,1404,164 5,1552,1741,1800,2248,546,738,825,1011,768,1046,1139,1343,871,1188,1080,1525,1231,1378,145 5,1700,919,1112,1245,1412,1310,1476,1610,1755,1163,1573,1496,1868,1652,1820,1962,2352,963, 1,272,1335,1583,1194,1531,1627,2001,1385,1690,1749,1878,1548,2075,1935,2756,1430,1721,178 6,2049,1823,1969,2028,2455,1660,2114,2159,2305,2210,2629,2384,3163,281,385,418,607,470,69 0,640,896,488,654,798,942,724,988,1032,1262,536,754,703,1008,803,1131,970,1308,862,1049,11 48,1354,1088,1504,1449,1909,578,813,767,1212,928,1038,1092,1363,849,1116,1177,1596,1235,14 07,1477,1761,949,1261,1197,1524,1336,1463,1603,1817,1293,1572,1638,1855,1699,1942,2059,22 96,617,1002,835,1143,890,1276,1186,1532,971,1222,1317,1487,1360,1582,1648,1892,1058,1413,1296,1745,1251,1598,1635,2031,1481,1687,1769,1948,1819,1995,2119,2495,1106,1440,1358,165 9,1515,1726,1859,2103,1590,1902,1751,2044,1796,2231,2168,2439,1388,1838,1968,2195,1914,21 42,2338,2424,2011,2310,2249,2596,2403,2539,2673,3214,692,906,1020,1259,1082,1306,1458,167 2,1140,1542,1333,1719,1405,1620,1822,2099,984,1372,1435,1794,1528,1943,1748,2069,1619,1873,1908,2214,1686,2323,2162,2838,1215,1469,1580,1990,1675,1886,1851,2292,1514,1928,2053,21 84,2005,2242,2373,2557,1779,2033,1966,2259,2102,2463,2331,2607,2169,2386,2506,2703,2445,2 662,2885,3017,1268,1599,1707,1925,1543,2111,1973,2304,1815,1994,2207,2360,2052,2402,2520, 2742,1646,2143,2083,2413,2225,2550,2453,2730,2318,2478,2642,2693,2595,2931,2858,3098,1875,2267,2176,2535,2367,2770,2488,2815,2115,2648,2579,2874,2602,2917,2981,3473,2253,2747,27 05,3032,2669,2968,3064,3256,2805,3043,3009,3317,3127,3609,3272,3701,363,445,508,713,566,7 41,799,1034,602,895,771,1152,844,1072,1204,1454,644,811,945,1096,875,1301,1146,1503,989,12 48,1359,1740,1227,1537,1594,1950,680,938,899,1190,1004,1243,1342,1612,1099,1415,1283,1558,1400,1653,1807,2041,1051,1370,1321,1644,1462,1762,1702,2003,1527,1795,1872,2381,1896,217 8,2118,2534,756,960,1090,1300,1189,1346,1576,1685,1027,1380,1474,1744,1406,1845,1753,2088, 1170,1512,1541,1939,1436,1806,1904,2206,1667,1957,1833,2151,2030,2252,2329,2657,1292,156 4,1706,1877,1626,1991,1949,2287,1774,2108,2045,2243,1938,2339,2391,2638,1609,2131,2080,2361,2215,2479,2432,2731,2017,2415,2526,2923,2594,2855,2792,3173,855,1205,1070,1461,1138,16 98,1417,1897,1316,1502,1615,1883,1586,1830,1982,2297,1288,1780,1639,2058,1563,1955,1931,2 349,1750,2023,2155,2255, 2107,2406,2458,2713,1398,1677,1816,2000,1863,2194,2096,2502,1691, 2068,2270,2438,2150,2387,2575,2771,1898,2246,2189,2467,2353,2650,2528,2825,2325,2588,2726,2870,2668,2940,2972,3349,1523,1912,1754,2175,1827,2116,2260,2544,1951,2398,2234,2511,23 07,2601,2643,2888,2016,2362,2293,2663,2466,2616,2743,3096,2416,2797,2674,2930,2776,3008,3 051,3248,2082,2303,2489,2712,2390,2738,2814,2985,2585,2916,2764,3042,2871,3073,3139,3313, 2538,2830,2920,3215,2980,3108,3162,3419,2790,3183,3258,3386,3273,3459,3530,3756,992,1247, 1185,1631,1350,1695,1597,1975,1408,1554,1832,2200,1763,2032,2125,2417,1465,1804,1731,206 0,1929,2330,2109,2473,1893,2163,2247,2600,2302,2527,2675,2922,1577,1946,1874,2177,2004,22 30,2254,2545,1810,2286,2372,2692,2452,2653,2628,2961,2076,2379,2494,2613,2425,2727,2777,3 026,2348,2808,2718,2987,2862,3083,3126,3361,1674,1854,2098,2366,1983,2319,2471,2701,2188, 2561,2407,2656,2172,2746,2791,3039,2238,2454,2507,2927,2584,2765,2842,3222,2649,2912,2809,3072,2971,3109,3208,3397,2311,2524,2702,2843,2597,2990,2913,3143,2755,2875,3027,3169,29 37,3303,3226,3434,2667,2986,3065,3249,3112,3334,3294,3505,3050,3265,3387,3553,3360,3469,3 583,3777,1882,2040,2130,2462,2282,2639,2433,2804,2229,2529,2521,2889,2606,2960,2863,3187, 2358,2721,2589,2854,2757,2921,3033,3168,2700,2991,3055,3227,2973,3268,3323,3504,2412,2652,2824,2969,2739,3082,3016,3259,2783,3038,3099,3401,3182,3295,3312,3552,2903,3155,3217,33 22,3138,3435,3362,3544,3088,3373,3468,3639,3425,3582,3629,3869,2556,2796,2859,3154,2970,3 054,3216,3335,2926,3097,3172,3363,3257,3464,3418,3585,3019,3209,3264,3458,3302,3396,3499, 3667,3316,3511,3472,3628,3545,3663,3693,3964,3113,3269,3348,3498,3372,3510,3573,3662,3424,3572,3531,3728,3608,3729,3692,3868,3465,3584,3638,3734,3666,3735,3757,3819,3700,3776,38 18,3845,3844,3965,3886,3887,130,131,208,251,209,276,319,432,226,318,339,466,366,511,513,74 7,227,338,360,510,395,542,591,773,428,590,564,800,637,836,868,1108,250,367,403,550,429,585, 623,822,467,631,661,837,732,886,922,1164,512,671,735,912,772,941,987,1183,793,997,1040,1281,1053,1312,1368,1657,277,394,456,630,486,660,723,873,522,746,676,923,782,957,1012,1224,58 4,734,792,996,826,1023,1052,1299,846,1057,1110,1348,1158,1390,1433,1742,627,801,838,1045,8 87,1078,1126,1377,933,1127,1182,1421,1232,1467,1507,1809,999,1220,1290,1489,1304,1510,157 1,1870,1357,1593,1641,1921,1688,1976,2043,2389,361,433,487,733,543,761,778,1007,596,783,827,1044,847,1076,1087,1374,636,830,869,1079,913,1125,1175,1426,956,1178,1221,1452,1298,1500, 1566,1849,694,880,940,1155,968,1179,1237,1493,1041,1286,1305,1516,1356,1589,1629,1920,10 86,1338,1382,1607,1422,1679,1692,1965,1479,1716,1784,2020,1835,2078,2186,2393,709,952,102 2,1252,1069,1303,1353,1601,1109,1364,1393,1656,1438,1689,1737,1999,1173,1427,1453,1711,1511,1770,1825,2094,1556,1840,1885,2144,1933,2202,2236,2547,1236,1494,1538,1790,1616,1848,1 895,2167,1683,1917,1970,2220,2026,2244,2342,2632,1735,1986,2046,2291,2067,2369,2409,2697, 2181,2435,2475,2688,2513,2759,2837,3106,402,523,551,823,597,831,878,1124,622,879,926,1165, 982,1225,1253,1560,677,927,983,1270,1030,1291,1330,1561,1056,1325,1369,1640,1428,1682,1704,1964,699,1013,1062,1280,1115,1339,1383,1680,1135,1403,1439,1708,1466,1765,1798,2064,113 4,1456,1498,1764,1551,1828,1853,2145,1622,1901,1936,2199,1984,2232,2300,2611,760,1105,112 2,1395,1172,1446,1495,1743,1192,1506,1534,1813,1574,1866,1911,2197,1365,1567,1617,1881,16 62,1927,1981,2222,1723,1992,2054, 2288,2101,2364,2418,2682,1445,1643,1709,1953,1757,2019,2 062,2344,1803,2090,2122,2388,2187,2450,2486,2737,1888,2183,2203,2476,2223,2515,2460,2779, 2321,2593,2633,2852,2641,2949,2999,3153,779,1168,1174,1550,1340,1588,1628,1900,1402,1637, 1663,1944,1722,1996,2051,2346,1442,1714,1756,1997,1788,2063,2105,2396,1841,2127,2166,244 2,2221,2483,2543,2789,1557,1766,1793,2104,1852,2153,2209,2464,1940,2212,2240,2537,2326,25 09,2621,2864,2015,2278,2354,2599,2397,2640,2685,2910,2451,2691,2690,2983,2781,3013,3057,3260,1642,1836,1906,2213,1993,2241,2299,2563,2055,2345,2371,2634,2428,2655,2689,2945,2112, 2405,2468,2683,2492,2695,2785,3015,2559,2800,2833,3063,2890,3119,3150,3357,2198,2480,253 1,2787,2619,2794,2876,3080,2630,2868,2918,3135,2964,3179,3240,3432,2659,2952,3007,3199,30 44,3246,3220,3453,3103,3289,3318,3520,3374,3554,3597,3695,457,565,626,839,670,932,986,124 0,698,998,1031,1265,1068,1319,1331,1670,708,1063,1104,1318,1123,1447,1482,1734,1206,1488, 1545,1808,1584,1857,1907,2218,722,1114,1169,1457,1210,1539,1568,1846,1241,1600,1632,1918, 1678,1977,2012,2250,1287,1650,1697,1988,1746,2050,2079,2334,1772,2065,2129,2404,2140,244 0,2481,2847,881,1207,1233,1575,1271,1633,1671,1952,1349,1705,1728,2036,1777,2092,2126,235 0,1394,1733,1792,2072,1843,2138,2147,2420,1880,2149,2164,2485,2276,2516,2583,2866,1443,1842,1864,2160,1926,2205,2217,2499,1980,2275,2309,2558,2376,2614,2635,2925,2035,2341,2400,2 637,2456,2680,2745,2967,2523,2752,2802,3020,2834,3069,3124,3350,908,1257,1324,1693,1392,1 729,1785,2100,1432,1799,1847,2152,1889,2171,2191,2496,1501,1865,1923,2193,1979,2268,2295, 2552,2027,2332,2374,2626,2421,2660,2717,2932,1569,1945,2007,2301,2084,2355,2351,2665,2113,2408,2436,2698,2501,2749,2767,3025,2170,2457,2519,2760,2553,2813,2836,3084,2592,2860,28 99,3136,2979,3189,3243,3441,1624,2042,2091,2410,2146,2449,2505,2753,2263,2522,2568,2827,2 572,2844,2883,3117,2279,2570,2591,2873,2677,2898,2956,3176,2734,2976,3005,3200,3053,3270, 3296,3462,2333,2687,2710,2935,2774,2989,3012,3233,2803,3049,3087,3286,3125,3324,3367,3529,2905,3091,3141,3331,3196,3380,3403,3587,3235,3421,3451,3607,3491,3650,3687,3810,969,135 2,1420,1802,1499,1861,1919,2227,1520,1932,1987,2273,2037,2316,2395,2723,1606,2013,2095,23 47,2133,2447,2423,2736,2156,2469,2512,2799,2564,2819,2850,3104,1747,2120,2157,2443,2262,2 498,2532,2832,2272,2567,2581,2851,2618,2886,2909,3159,2280,2608,2646,2907,2732,2955,3001, 3203,2762,3037,3052,3277,3090,3297,3341,3513,1776,2257,2265,2554,2285,2571,2625,2894,234 0,2678,2707,2947,2750,2996,3046,3251,2518,2725,2778,3003,2807,3066,3093,3291,2891,3100,31 46,3333,3198,3376,3395,3581,2580,2812,2872,3068,2906,3132,3164,3347,2962,3185,3210,3392,3 247,3423,3460,3625,3010,3238,3282,3450,3315,3482,3512,3654,3354,3523,3549,3682,3566,3723, 3732,3875,1791,2289,2315,2715,2497,2741,2766,3035,2541,2795,2823,3075,2880,3111,3157,3343,2587,2848,2901,3121,2943,3167,3213,3385,2998,3244,3205,3413,3292,3455,3490,3633,2735,29 11,2954,3191,3023,3224,3279,3446,3061,3283,3314,3483,3339,3493,3533,3677,3128,3327,3364,3 517,3405,3558,3575,3711,3430,3602,3622,3746,3651,3768,3772,3846,2810,2957,3058,3284,3107, 3308,3328,3506,3151,3371,3382,3542,3415,3559,3611,3730,3161,3411,3448,3600,3488,3626,3631,3770,3525,3656,3673,3787,3704,3814,3831,3913,3254,3478,3484,3646,3538,3658,3684,3793,35 64,3710,3716,3826,3751,3832,3877,3934,3593,3743,3765,3856,3790,3861,3892,3955,3803,3896,3 910,3970,3924,3982,3991, 4030,1006,909,695,1429,872,1375,1154,1894,953,1159,1211,1782,1264, 1592,1517,2018,1077,1256,1313,1544,1376,1710,1636,2161,1478,1664,1736,1971,1812,2269,2086,2491,1111,1341,1391,1681,1483,1717,1829,2047,1521,1867,1771,2392,1941,2121,2182,2845,15 85,1837,1989,2139,1916,2216,2337,2671,2038,2314,2264,2536,2419,2724,2573,3086,1193,1444,1 492,1789,1570,1856,1959,2192,1651,2071,1871,2237,2014,2281,2368,2590,1715,1937,2135,2335, 2087,2484,2308,2631,1998,2375,2514,2686,2446,2892,2758,3288,1773,2132,2039,2429,2245,2394,2548,2709,2180,2609,2474,2816,2533,2773,3036,2948,2290,2562,2623,2919,2670,2828,2865,31 18,2711,2977,2897,3239,3021,3404,3177,3576,1302,1535,1625,1922,1696,1985,2070,2343,1767,2 196,2021,2382,2123,2426,2500,2786,1824,2085,2251,2441,2165,2582,2477,2763,2284,2540,2647, 2835,2615,2878,2959,3144,1884,2226,2141,2508,2370,2565,2661,2857,2336,2729,2586,3048,2699,2914,2933,3206,2434,2644,2798,2958,2751,2995,3076,3426,2853,3102,3028,3231,3156,3299,33 40,3616,1978,2274,2401,2627,2320,2676,2769,2975,2461,2820,2706,3131,2867,3004,3071,3276,2 517,2744,2879,3040,2946,3094,3202,3311,2801,3171,3110,3384,3236,3356,3452,3670,2569,2904, 2965,3181,2826,3137,3219,3477,3011,3266,3305,3394,3152,3521,3433,3848,3056,3287,3332,3507,3359,3457,3492,3721,3242,3546,3567,3645,3596,3795,3686,3975,1423,1665,1732,2073,1834,22 04,2128,2490,1860,2148,2356,2546,2256,2604,2654,2896,1958,2294,2219,2624,2365,2761,2576,2 944,2448,2679,2784,2988,2714,3116,3067,3417,2034,2383,2317,2846,2530,2664,2722,2997,2427, 2748,2811,3192,2869,3031,3095,3319,2555,2895,2829,3130,2966,3079,3197,3353,2929,3170,3228,3379,3275,3438,3515,3640,2093,2620,2411,2775,2482,2908,2818,3140,2577,2856,2951,3105,29 94,3180,3234,3406,2684,3041,2934,3301,2887,3194,3225,3495,3101,3263,3325,3442,3355,3475,3 551,3741,2740,3062,2992,3241,3123,3290,3381,3537,3188,3412,3307,3502,3338,3605,3570,3715, 3014,3370,3456,3591,3422,3560,3664,3708,3485,3648,3617,3782,3697,3761,3815,3986,2208,2504,2636,2893,2708,2942,3074,3250,2772,3148,2963,3285,3029,3212,3358,3535,2598,3002,3059,33 36,3134,3439,3304,3519,3211,3389,3416,3598,3262,3655,3568,3876,2849,3085,3178,3470,3253,3 402,3377,3636,3122,3428,3509,3586,3481,3612,3681,3767,3329,3497,3454,3623,3536,3725,3661, 3789,3571,3688,3744,3825,3717,3808,3893,3933,2900,3195,3281,3427,3149,3543,3461,3644,3351,3474,3595,3674,3508,3696,3748,3840,3232,3561,3527,3703,3601,3764,3719,3836,3652,3736,37 98,3821,3781,3909,3882,3958,3391,3627,3578,3759,3679,3852,3738,3871,3547,3800,3773,3890,3 786,3901,3923,4045,3619,3843,3827,3938,3813,3916,3948,3996,3865,3943,3931,4013,3967,4065, 4004,4077,1623,1783,1910,2233,2006,2277,2357,2658,2066,2487,2327,2788,2422,2696,2840,3070,2134,2377,2549,2728,2465,2939,2780,3115,2605,2882,2993,3298,2861,3145,3190,3444,2190,25 42,2493,2822,2622,2877,2974,3204,2733,3045,2915,3160,3024,3237,3345,3501,2681,3000,2953,3 230,3078,3320,3278,3479,3133,3337,3388,3685,3408,3580,3550,3758,2298,2566,2716,2938,2821, 2978,3174,3261,2645,3006,3092,3300,3030,3375,3309,3528,2806,3120,3147,3437,3060,3344,3414,3594,3245,3449,3369,3563,3494,3618,3659,3807,2928,3166,3280,3393,3218,3471,3443,3635,33 26,3540,3503,3613,3436,3665,3691,3796,3201,3557,3524,3675,3599,3737,3712,3837,3487,3705,3 752,3905,3780,3881,3860,3979,2437,2841,2694,3077,2768,3274,3047,3409,2950,3114,3207,3399, 3184,3366,3466,3641,2924,3330,3229,3514,3165,3447,3431,3669,3306,3489,3565,3621,3539,3698,3722,3829,3022,3255,3352,3476,3383,3590,3532,3742, 3267,3518,3630,3714,3562,3689,3771,38 53,3410,3614,3589,3727,3671,3802,3754,3873,3657,3778,3834,3888,3812,3912,3920,4019,3129,3 420,3310,3577,3365,3548,3624,3762,3445,3694,3606,3747,3647,3785,3799,3894,3486,3676,3637, 3809,3726,3792,3841,3956,3706,3863,3816,3908,3854,3930,3945,3994,3526,3643,3739,3828,3690,3838,3870,3925,3775,3900,3850,3942,3889,3951,3969,4011,3760,3874,3902,3987,3922,3960,39 74,4033,3858,3981,3998,4026,4005,4039,4052,4082,2610,2881,2817,3221,2982,3271,3193,3463,3 034,3158,3368,3592,3321,3496,3555,3707,3081,3342,3293,3516,3429,3660,3541,3733,3407,3569, 3615,3784,3642,3753,3817,3904,3175,3440,3390,3579,3480,3604,3620,3763,3346,3634,3680,3820,3718,3805,3794,3915,3522,3683,3740,3791,3709,3835,3855,3936,3668,3866,3830,3927,3884,39 53,3966,4021,3252,3378,3534,3678,3467,3653,3731,3823,3588,3769,3699,3806,3574,3842,3859,3 941,3610,3720,3745,3907,3774,3851,3878,3990,3801,3898,3867,3950,3919,3961,3984,4029,3649, 3750,3824,3879,3783,3928,3899,3971,3847,3891,3937,3977,3911,4009,3992,4036,3811,3926,3949,3995,3962,4016,4006,4049,3944,4001,4027,4057,4020,4043,4061,4085,3398,3500,3556,3724,36 32,3797,3713,3864,3603,3755,3749,3895,3788,3914,3885,3983,3672,3833,3779,3880,3849,3903,3 939,3976,3822,3929,3947,3993,3921,4002,4015,4048,3702,3804,3872,3917,3839,3952,3932,3999, 3857,3940,3959,4031,3980,4007,4010,4056,3897,3973,3989,4014,3968,4037,4022,4054,3954,4025,4042,4069,4035,4060,4067,4091,3766,3862,3883,3972,3918,3946,3988,4017,3906,3957,3978,40 23,3997,4040,4032,4063,3935,3985,4000,4038,4008,4028,4047,4073,4012,4051,4044,4066,4055,4 071,4075,4094,3963,4003,4018,4046,4024,4050,4059,4070,4034,4058,4053,4078,4064,4079,4074, 4090,4041,4062,4068,4080,4072,4081,4083,4087,4076,4084,4086,4089,4088,4095,4092,4093]

Sequence Group 8: Q8_2048

[0,1,2,4,8,16,32,3,5,64,9,6,17,10,18,128,12,33,65,20,256,34,24,36,7,129,66,512,11,40,6 8,130,19,13,48,14,72,257,21,132,35,258,26,513,80,37,25,22,136,260,264,38,514,96,67,41,144,28,6 9,42,516,49,74,272,160,1026,520,288,528,192,544,70,44,131,81,50,73,15,320,133,52,23,134,384,7 6,137,82,56,27,97,39,259,84,138,145,261,29,43,98,515,88,140,30,146,1028,71,262,265,161,576,45, 100,640,1025,51,148,46,75,266,273,517,104,162,53,193,1032,152,77,164,768,268,274,518,54,83, 57,521,112,1024,135,78,289,194,85,276,522,58,168,139,99,86,60,280,89,290,529,524,196,141,104 0,101,147,176,142,530,321,31,200,90,1056,545,292,322,532,263,149,102,105,304,296,1030,163,9 2,1033,47,267,385,546,324,208,386,150,153,165,106,55,328,1088,536,577,548,1034,113,154,79,2 69,108,578,224,166,519,552,195,270,1041,641,1036,523,275,580,291,59,169,560,114,277,156,87, 1152,197,116,170,61,1042,531,525,642,281,278,526,177,293,388,1057,91,584,769,198,172,120,20 1,336,62,282,143,1029,1044,103,178,294,93,1058,644,202,592,323,392,297,770,107,180,1280,151, 209,284,1027,648,94,204,298,400,608,1089,352,325,533,155,210,305,547,300,109,1048,184,534, 1060,537,115,1090,167,225,326,306,772,157,656,329,110,117,212,171,1038,776,1064,330,1153,22 6,549,1043,538,387,308,216,416,271,279,158,337,550,672,1092,118,332,579,540,1072,389,173,10 37,121,553,199,784,179,228,338,312,1536,704,1154,390,174,554,581,1046,393,283,122,448,353,561,1096,203,63,340,394,1049,1281,527,582,556,181,295,1059,285,232,124,205,182,643,1156,562, 286,585,299,354,1045,211,401,1104,185,1061,396,344,586,645,1282,593,535,240,1050,206,95,32 7,564,800,402,356,307,301,417,1160,213,1066,568,1120,832,588,1035,1537,186,646,404,1091,22 7,896,594,418,302,649,771,360,539,111,1052,331,1168,214,309,1062,1284,188,449,1073,217,408, 609,596,551,650,229,159,420,310,1093,541,1288,773,610,657,333,1065,119,1098,600,339,1184,2 18,368,652,1031,230,391,313,450,542,1538,334,1076,233,555,774,175,123,1155,658,612,341,777, 220,314,1105,424,1068,395,673,583,355,1296,1094,287,183,234,1051,125,557,1216,660,616,342,316,1157,241,778,563,1074,345,452,397,403,1112,207,1540,674,558,785,1100,432,1039,357,187,1 162,236,664,1312,624,587,780,1080,1122,705,126,242,1063,565,398,346,456,358,405,303,569,15 44,244,1158,1097,595,1283,189,566,676,1169,1054,1108,361,706,589,1344,215,786,647,348,419,4 06,464,680,801,1069,362,1164,590,409,1286,570,1121,788,1552,1106,597,1075,572,1186,219,311,708,598,1289,601,651,421,792,802,611,1047,602,1172,410,231,688,653,1128,248,1070,369,190,36 4,1568,654,1095,659,1161,335,480,315,221,370,1285,613,1408,422,425,451,1077,614,543,1298,2 35,412,343,372,1185,775,317,1539,222,1099,426,453,237,1124,559,1170,1292,833,804,712,1082,8 34,661,1053,808,779,1217,617,604,1541,433,720,816,1101,1176,836,347,897,1136,243,1297,662,1600,454,318,675,1110,618,1081,898,781,1314,1220,376,428,1546,665,736,567,1107,1192,1078,84 0,625,238,1159,359,457,399,787,591,678,434,677,1290,1542,349,1300,1102,245,1188,458,666,111 3,620,1553,1163,1313,363,127,1067,191,1125,782,407,436,626,1218,571,465,681,246,707,1346,3 50,1084,599,668,1548,790,1165,1320,460,1123,1200,249,682,1664,573,1171,411,803,1116,789,1304,709,365,440,628,689,374,1224,423,1556,466,793,1130,250,371,1174,481,574,1348,413,1109,60 3,366,1545,1287,1055,468,1570,655,900,805,615,1166,684,1409,710,1187,429,794,252,1114,373,6 05,1232,848,690,713,632,1316,482,806,1132,1083,427,1177,904,1569,414,1291,223,1126,1554,66 3,692,835,1328,619,472,1137,455,796,1189,1601,809,714,1248,721,837,716,1086,1302,1352,864, 810,1173,606,1194,912,1103,722,696,377,1424,435,1293,1560,817,1129,1792,319,621,1180,812,4 84,1345,430,1572,1138,1299,838,667,1219,488,1111,239,378,459,622,1410,627,437,380,1201,160 8,818,1178,1294,461,1543,496,669,1190,1317,679,1140,1079,1221,724,841,1305,629,1584,351,46 7,1360,438,1115,737,251,462,442,441,1666,469,1549,247,683,1196,1226,842,1412,1127,738,1144, 1308,899,1602,670,1318,783,1085,849,1555,1193,820,1576,728,928,791,367,1376,901,1233,630,1 321,685,844,1204,633,711,1118,253,691,1301,824,1175,902,686,1668,1222,1416,1133,740,1347,8 50,375,1558,444,1306,470,1167,483,1547,415,485,905,1202,795,473,1240,634,744,1616,852,960, 1322,865,693,1131,1794,1350,797,1225,1604,1571,906,1252,715,1141,1330,807,474,636,1179,694, 254,1550,1665,717,1071,1315,575,913,1440,798,811,379,1208,1353,1191,697,1564,431,1142,607, 1228,489,1324,866,723,486,1573,1181,1234,908,1793,1561,718,813,1364,476,856,1117,1411,839, 1329,1295,1146,725,698,1472,914,1249,752,868,819,1349,814,439,929,1197,1578,490,1139,1680,623,1632,1336,671,1198,1362,739,1603,1557,1413,916,1303,463,1236,843,1135,381,1672,1354,4 97,1586,930,821,726,961,1203,1182,872,1418,492,1250,1332,631,1574,1223,729,1145,1605,700,1 796,443,1307,741,1378,1562,1356,1205,845,1319,920,382,1585,822,1425,851,1229,730,1609,498, 880,1256,742,445,1392,471,635,1148,1696,932,1580,687,1210,1420,1612,1325,1800,903,1134,82 5,1235,1361,500,1577,846,1670,1195,745,826,732,1264,446,962,1426,1620,936,1377,475,853,131 0,867,637,1551,1230,1414,907,1206,1667,1588,1333,487,1808,695,1441,1087,746,828,753,1610,8 54,1237,1326,857,1368,1209,504,799,1355,255,964,1242,909,1673,1559,1309,719,1143,477, 1617, 915,1448,1380,638,748,944,1728,1331,1227,869, 1592,1428,491,699,1253,1351,754,1183,1565,85 8,1618, 1417,1476,478,968,1260,383,1212,910,1801,815,1579,976, 870,1684,1633,917,1337,1241,1 606,1824,727,1150,1442, 493,1357,1251,1676,873,1384,701,1566,931,1323,1798, 1365,1473,756,1 334,860,499,731,1648,1238,823,1575, 922,1199,1674,874,1432,1421,918,1636,1254,502,1795, 933, 1366,1338,1682,1587,1211,1488,743,1358,760,1244, 1581,881,1147,494,1379,1272,702,921,1624, 501,876, 1415,847,1856,1444,992,1697,447,1607,1436,1369,1257, 1704,733,1797,1669,1340,1231, 827,1590,934,1634,1474, 882,937,963,1419,747,1265,1119,505,1381,855,924,1810, 734,829,1563,1 213,1611,1363,1430,1258,1688,1386,965, 1614,1730,1239,938,884,506,1327,1589,1804,749,1370, 1640,945,966,1456,1681,755,1266,859,1427,1593,1388, 940,1214,830,1809,911,1621,1582,1832,8 71,639,1480, 1698,1335,888,1372,1245,479,1422,1268,946,1732,1677, 750,1802,1626,1393,969,50 8,1613,861,1446,1857,1339, 757,1382,970,1700,1243,919,1594,1433,1826,1504,875, 1635,1259,86 2,1920,1675,1445,758,1149,948,1359,1816, 1596,1671,1712,977,1385,923,1622,972,1434,1311,17 29,761,1396,877,1207,1475,1449,1812,952,1686,495,1262, 1644,1619,1341,1429,1825,703,1371,1 638,1567,1736,935, 1685,978,1625,883,762,1246,503,1458,925,1394,1269,878, 1478,735,1799,167 8,1860,1443,1637,1481,1373,1699, 1255,993,1591,1828,1452,885,939,994,1400,1744,1656, 980,16 89,926,764,1270,941,1628,1367,1805,1457,1921, 1583,1387,1642,967,1267,1484,1450,886,831,16 83,1342, 1811,947,1705,1431,507,1261,1840,889,1650,984,1760, 1490,1615,751,1702,942,1858,14 23,1460,1383,996,1692, 1641,1814,971,1477,1273,1512,1733,890,1598,1374,509, 1806,1922,1649, 949,973,1397,1489,1708,1627,1000,1690, 892,1274,1438,1817,1390,1464,1868,950,1151,1731,150 6,1827,1597,863,1451,759,1864,1714,1701,1395,1803, 1008,1623,1482,1276,510,1435,1652,979,1 492,953,1928, 1829,1389,1738,763,1872,974,1453,1643,1713,1818,1215, 1402,1629,1520,1830,169 1,954,1459,1734,879,981,1505, 1706,982,1924,927,1833,1639,1447,1746,1343,1679,1820, 1761,14 79,1275,995,1740,1401,1888,765,956,1496,1861, 887,1437,985,1720,997,1630,1813,1462,1398,16 45,1848, 1687,1247,1716,1936,986,1483,1651,1745,943,1859,1508, 1834,1454,891,1841,998,1595, 1278,766,1465,1709,1764, 1646,1737,511,1485,1404,1693,1866,1952,1491,988,1657, 1752,1807,13 99,1844,1001,951,1654,1926,1707,1391, 1002,1468,1836,1494,1873,1271,1694,893,1923,1461,174 8,1715,975,1862,894,1815,1497,1653,1510,1762,1842, 1375,1703,1009,1466,1874,955,1739,1486, 1930,1889, 1004,1658,1821,1718,1929,1599,1507,1776,1405,1735, 1831,1493,1010,1984,1455,957, 1,865,983,1710,958,1514, 1876,1768,1721,1938,1660,1500,1403,1892,1819,1741, 1516,987,1932,14 63,1012,1843,1749,999,1838,1277,1647, 1925,1498,1742,1513,1880,1717,1016,1953,1837,1867,16 31,1469,1747,767,1904,1724,1524,989,1406,1754,1822, 1835,1499,1944,1863,1890,1467,1003,152 2,1763,1695, 1850,990,1005,1937,1722,1845,1495,1655,1765,1956, 1487,1750,1869,1521,959,1896, 1263,1940,1770,1877, 1509,1711,1756,1846,1011,1960,1784,1870,1662,1013, 1985,1753,1927,152 8,1849,1882,1766,1511,1954,1719, 1777,895,1439,1006,1878,1891,1939,1661,1502,1986, 1852,193 4,1723,1772,1515,1897,1014,1470,1743,1931, 1017,1968,1881,1894,1769,1517,1778,1941,1823,16 59,1992,1875,1755,1501,1018,1900,1725,991,1933,1839, 1525,1955,1988,1884,1726,1948,1780,15 18,1020,1767, 1905,1851,1893,1945,1757,1530,1958,1471,1007,2000, 1847,1898,1523,1942,1961,1 871,1771,1529,1912,1758, 1989,1946,1526,1906,1883,1773,1957,1853,1976,1015, 1751,1993,1503, 1962,1781,1885,1908,2016,1854,1532, 1972,1774,1019,1895,1987,1969,1782,1279,1943,1899,199 4,1663,1964,1785,1021,1935,1886,2001,1407,1779,1990, 1970,1879,1022,1902,1947,1759,1907,15 27,1996,1786, 1959,2002,1913,1949,2017,1534,1788,1910,1965,2004, 1901,1966,1775,2008,1531,1 971,1950,1909,1991,2018, 1727,1916,1855,1974,1995,2020,1977,1787,1914,2005, 1887,1023,1963, 1998,1783,2024,1980,1903,1973,2003, 1789,1997,2032,1978,1917,2010,1519,2019,2006,1951,191 1,2021,2009,1790,2026,1975,2012,1967,1915,2025,2022, 1981,1918,2033,1999,2028,1533,2011,19 82,2034,1979, 2023,2013,2036,2007,2030,2014,2040,1535,2027,2029, 2035,2037,1791,2038,2041,1 919,2042,2039,2044,2043, 2031,1983,2046,2047,2015,2045]

Sequence Group 8: Z8_2048

[0,1,2,7,3,8,11,24,4,10,13,28,16,33,35,77,5,12,14,32,19, 38,47,81,22,46,42,88,57,96,102, 166,6,17,21,40,23,45,51, 90,29,55,59,97,72,110,116,184,34,61,75,114,80,123,133, 195,87,135,146,2 21,151,232,252,363,9,18,26,54,30,58,71, 105,36,76,62,117,84,127,140,204,44,74,86,134,92,143,15 0,227,100,153,168,244,182,260,277,402,53,89,98,149,111, 160,176,257,121,177,194,269,206,291,3 07,433,137,202, 224,297,230,308,331,462,249,339,357,483,376,504,541, 725,15,25,31,73,39,79,82, 139,48,85,93,148,101,158,163, 254,56,94,103,161,115,175,191,272,126,192,203,286,226, 304,326,4 51,64,108,122,181,128,193,209,299,147,222, 231,310,248,337,351,482,162,240,258,343,270,371,3 78,501,293,390,420,530,441,558,614,727,69,124,142,212, 157,229,247,341,167,250,263,362,278,3 77,401,521,189, 273,287,387,309,412,437,568,322,444,467,592,489,624, 644,819,208,300,316,424, 344,450,471,607,375,479,502, 636,532,648,700,874,399,512,542,675,553,715,737,915, 611,751,773, 908,799,951,1005,1192,20,37,41,91,49,95, 106,174,50,107,118,185,130,205,213,324,63,119,131,21 8,144,225,238,325,152,237,253,356,274,374,382,500,67, 141,154,220,171,241,259,372,179,267,27 9,384,290,409, 428,550,178,288,302,408,321,438,453,593,346,473,490, 623,510,642,680,859,78,16 5,172,265,188,284,301,403, 196,306,314,435,332,460,477,621,251,327,345,465,364, 487,509,638,3 93,516,546,672,571,712,740,902,283,359, 385,497,407,529,548,702,431,564,578,724,615,762,782, 939,468,613,625,774,639,801,766,965,689,851,875,1016, 881,1081,1115,1229,83,186,190,320,242, 336,350,472,266, 355,365,494,392,518,545,704,280,388,406,519,422,549, 573,730,445,581,606,756, 637,779,817,973,323,410,427, 572,452,599,629,768,492,630,646,813,690,797,865,1022, 527,666,7 08,853,731,880,905,1058,763,911,910,1105,967, 1127,1155,1308,358,442,474,631,517,647,679,829, 547, 703,717,876,748,887,909,1077,574,735,770,903,786,913, 969,1129,827,978,1001,1161,1040,1 201,1226,1385,622, 776,809,971,863,974,1030,1174,872,1026,1062,1215,1094, 1247,1294,1444,88 9,1084,1123,1263,1146,1300,1278, 1463,1189,1331,1352,1516,1396,1544,1581,1667,27,43,52, 99,6 0,120,132,210,66,136,145,217,156,235,239,368,68, 155,164,234,173,285,294,398,198,296,319,432, 334,455, 475,634,70,170,187,289,200,317,328,448,211,340,352,480, 370,505,524,650,223,360,381, 514,404,544,559,694,414, 551,583,734,590,754,777,1011,109,199,207,333,219,353, 369,496,245,38 3,394,536,417,566,580,706,264,397,426, 556,447,588,595,742,464,597,604,781,664,802,845,1024, 281,446,458,602,486,627,633,791,508,663,683,826,720, 860,877,1065,535,699,732,879,764,900,94 3,1097,807,948, 980,1130,1002,1165,1206,1378,112,215,236,379,262,395, 421,570,276,429,449,598, 469,609,617,788,305,459,485, 619,507,658,677,822,533,692,718,870,743,890,927,1068, 329,495,5 23,681,560,709,707,893,575,736,752,916,793, 945,957,1135,608,765,805,952,823,987,1004,1176,8
50,1020,1049,1216,1103,1253,1297,1451,348,540,565,738,
594,761,795,949,655,806,834,997,838, 1008,1037,1199,
667,836,849,1029,897,1048,1088,1244,936,1100,1121,
1264,1153,1314,1336,1470, 693,907,922,1071,962,1107,
1126,1287,981,1151,1179,1328,1207,1356,1391,1525,
1053,1181,1219, 1363,1260,1402,1419,1571,1289,1435,
1461,1591,1493,1628,1661,1772,129,246,268,430,303,457,
481,641,312,488,513,661,537,686,729,929,342,525,569,
705,585,759,745,938,600,771,798,977,830, 991,1014,1190,
405,576,601,757,654,790,810,1000,660,833,843,1015,862,
1038,1057,1233,668,85 6,884,1055,934,1087,1117,1267,
954,1143,1152,1319,1180,1337,1371,1509,416,653,657,
824,671,8 37,869,1044,698,898,919,1079,946,1112,1148,
1303,804,931,964,1119,983,1162,1183,1333,1041,1 186,
1222,1365,1262,1398,1415,1569,842,986,1028,1164,1054,
1212,1236,1377,1092,1251,1272,14 12,1301,1437,1468,
1607,1124,1292,1324,1460,1351,1484,1508,1632,1382,
1519,1541,1656,1556,1 693,1700,1831,425,673,685,925,
789,941,956,1141,815,975,995,1169,1034,1195,1231,1373,
847,10 12,1051,1203,1075,1239,1275,1407,1114,1298,
1269,1429,1334,1465,1492,1613,937,1059,1086,12
55,1133,1280,1321,1456,1159,1325,1350,1485,1369,1495,
1527,1651,1208,1359,1388,1513,1421,1 548,1563,1681,
1442,1586,1604,1712,1629,1732,1736,1804,984,1089,
1156,1326,1193,1346,1360,1 504,1227,1395,1404,1536,
1431,1549,1593,1698,1235,1427,1458,1584,1490,1608,
1611,1734,1521, 1634,1647,1749,1674,1776,1791,1867,
1306,1480,1486,1624,1532,1636,1658,1755,1554,1680,168
6,1786,1717,1792,1833,1888,1577,1709,1729,1814,1752,
1819,1846,1909,1765,1850,1864,1922,18 78,1934,1943,
1982,138,113,65,275,104,255,180,470,125,183,201,418,
216,338,311,528,159,214,23 3,318,256,386,354,603,292,
366,400,503,434,659,562,785,169,243,261,373,295,391,
439,543,313,4 61,413,726,493,577,612,1009,335,443,515,
589,478,632,697,895,538,684,656,812,741,930,839,117
8,197,282,298,423,330,454,499,618,361,555,463,645,526,
669,714,848,389,491,587,695,563,780,6 82,873,520,719,
800,906,758,1042,950,1330,415,584,539,749,649,728,820,
921,610,857,772,988,81 1,961,1142,1080,674,828,867,
1063,894,998,1023,1200,923,1101,1047,1293,1131,1420,
1245,1564, 228,315,349,484,380,511,554,701,411,620,531,
722,579,746,792,970,436,561,651,755,605,844,775, 955,
670,814,885,1003,861,1032,1091,1220,466,640,591,796,
716,831,891,1019,696,933,846,1150, 917,1060,1069,1270,
750,882,976,1090,947,1111,1170,1438,1017,1188,1136,
1285,1230,1339,1370, 1598,506,662,733,871,688,896,959,
1099,767,992,918,1211,1025,1120,1167,1318,803,942,
1033,11 44,1078,1184,1266,1349,979,1241,1194,1406,
1290,1384,1462,1644,835,1052,1095,1249,996,1217, 1277,
1479,1125,1312,1343,1414,1228,1517,1445,1806,1154,
1329,1364,1505,1387,1467,1494,169 1,1296,1538,1557,
1623,1580,1757,1660,1927,271,367,396,557,440,626,582,
784,456,596,710,818, 652,854,886,1046,498,676,635,868,
713,953,840,1076,760,899,968,1106,924,1198,1163,1433,
534,7 23,687,1010,808,892,928,1113,747,944,985,1256,
1027,1139,1185,1353,825,1045,999,1210,1096,1 173,1261,
1381,1067,1240,1282,1401,1317,1448,1511,1618,567,864,
739,963,778,1056,990,1218,8 41,1018,1083,1191,1110,
1248,1288,1422,904,1145,1070,1341,1039,1258,1281,
1497,1187,1311,13 57,1452,1383,1477,1543,1707,940,
1160,1108,1295,1205,1332,1403,1531,1252,1428,1345,
1502,13 68,1589,1560,1685,1128,1394,1466,1575,1436,
1550,1640,1678,1487,1626,1599,1744,1669,1725,1 777,
1938,628,794,878,1043,920,1074,1168,1302,960,1224,
1093,1327,1137,1274,1386,1529,852,11 18,1157,1366,
1214,1449,1342,1515,1273,1409,1432,1582,1310,1633,
1558,1832,1013,1177,1246,1 474,1305,1418,1399,1616,
1204,1440,1507,1570,1483,1594,1655,1731,1361,1499,
1464,1605,1530, 1695,1639,1751,1561,1662,1710,1785,
1687,1770,1847,1887,1050,1259,1323,1439,1225,1537,146
9,1622,1379,1476,1579,1648,1506,1668,1714,1800,1286,
1551,1523,1673,1585,1728,1689,1796,16 30,1702,1760,
1781,1743,1863,1838,1912,1411,1609,1566,1723,1653,
1810,1704,1827,1539,1762,1 737,1844,1748,1855,1877,
1997,1601,1803,1787,1892,1775,1870,1902,1948,1823,
1897,1885,1965, 1919,2017,1956,2029,347,419,476,643,
522,665,711,888,552,783,691,972,744,914,1006,1166,586,
721,821,932,769,1073,966,1197,855,1036,1109,1338,1021,
1221,1254,1454,616,816,787,994,866,1 031,1098,1268,
935,1147,1061,1234,1134,1291,1375,1501,901,1116,1085,
1284,1172,1354,1320,14 81,1213,1367,1408,1659,1424,
1568,1542,1722,678,832,926,1072,993,1102,1242,1309,
883,1122,11 82,1340,1138,1397,1347,1524,982,1202,1223,
1447,1158,1374,1430,1578,1299,1459,1393,1553,14
96,1600,1637,1769,1066,1238,1322,1413,1276,1475,1453,
1615,1358,1534,1503,1595,1446,1641,1 665,1758,1265,
1547,1520,1649,1583,1703,1682,1797,1489,1675,1718,
1859,1742,1837,1818,1931, 753,1007,912,1171,958,1316,
1149,1425,1082,1196,1271,1417,1250,1390,1472,1619,
1064,1362,12 83,1510,1237,1457,1443,1643,1344,1491,
1555,1603,1533,1670,1692,1789,1132,1307,1380,1478,1
405,1574,1526,1708,1313,1514,1610,1684,1552,1663,
1735,1811,1426,1596,1573,1697,1645,1764, 1720,1829,
1635,1740,1794,1842,1774,1866,1874,1971,1209,1434,
1348,1565,1389,1540,1606,172 6,1455,1666,1590,1713,
1625,1747,1761,1848,1488,1650,1617,1771,1696,1754,
1801,1910,1676,18 21,1778,1862,1812,1884,1899,1946,
1522,1621,1705,1788,1664,1798,1826,1879,1739,1854,
1808,1 896,1843,1905,1921,1963,1724,1830,1856,1939,
1876,1914,1926,1985,1816,1933,1950,1978,1957, 1991,
2004,2034,858,1035,989,1279,1104,1315,1257,1471,1140,
1232,1392,1576,1355,1498,1545,1 677,1175,1372,1335,
1512,1441,1638,1535,1701,1423,1559,1597,1746,1620,
1719,1779,1858,1243, 1450,1410,1567,1482,1588,1602,
1727,1376,1614,1654,1780,1688,1767,1756,1869,1518,
1657,170 6,1753,1679,1795,1813,1890,1642,1824,1790,
1881,1840,1907,1918,1973,1304,1400,1528,1652,14
73,1631,1699,1783,1572,1733,1671,1768,1562,1802,1817,
1895,1592,1690,1711,1861,1738,1809,1 834,1942,1763,
1852,1825,1904,1873,1915,1936,1981,1627,1716,1784,
1835,1745,1882,1853,1923, 1805,1845,1891,1929,1865,
1961,1944,1988,1773,1880,1903,1947,1916,1968,1958,
2001,1898,195 3,1979,2009,1972,1995,2013,2037,1416,
1500,1546,1694,1612,1759,1683,1822,1587,1721,1715,18
49,1750,1868,1841,1935,1646,1793,1741,1836,1807,1857,
1893,1928,1782,1883,1901,1945,1875,1 954,1967,2000,
1672,1766,1828,1871,1799,1906,1886,1951,1815,1894,
1913,1983,1932,1959,1962, 2008,1851,1925,1941,1966,
1920,1989,1974,2006,1908,1977,1994,2021,1987,2012,
2019,2043,173 0,1820,1839,1924,1872,1900,1940,1969,
1860,1911,1930,1975,1949,1992,1984,2015,1889,1937,19
52,1990,1960,1980,1999,2025,1964,2003,1996,2018,2007,
2023,2027,2046,1917,1955,1970,1998,1 976,2002,2011,
2022,1986,2010,2005,2030,2016,2031,2026,2042,1993,
2014,2020,2032,2024,2033, 2035,2039,2028,2036,2038,
2041,2040,2047,2044,2045]

Sequence Group 8: Q8_4096

[0,1,2,4,8,16,32,3,5,64,9,6,17,10,18,128,12,33,65,20,
256,34,24,36,7,129,66,512,11,40,6 8,130,19,13,48,14,72,
257,21,132,35,258,26,513,80,37,25,22,136,260,264,38,514,
96,67,41,144,28,6 9,42,516,49,74,272,160,1026,520,288, 528,192,544,70,44,131,81,50,73,15,320,133,52,23,134,384,7 6,137,82,56,27,97,39,259,84,138,145,261,29,43,98,515,88,140,30,146,1028,71,262,265,161,576,45, 100,640,1025,51,148,46,75,266,273,517,104,162,53,193,1032,152,77,164,768,2048,2049,268,274, 518,54,83,57,521,112,1024,135,78,289,194,85,276,522,58,168,139,99,86,60,280,89,290,529,524,1 96,141,1040,101,147,176,142,530,321,31,200,90,1056,545,292,322,532,263,149,102,105,304,296,1030,163,92,1033,47,267,385,546,324,208,386,150,153,165,106,55,328,1088,536,577,548,1034,11 3,154,79,269,2050,2052,108,578,224,166,519,552,195,270,1041,641,1036,523,275,580,291,59,205 6,2064,169,560,114,277,156,87,1152,197,116,170,61,1042,531,525,642,281,278,526,177,293,388,1 057,2080,2051,91,584,769,198,172,120,201,336,62,282,143,1029,1044,103,178,294,93,1058,644,202,592,323,392,297,2053,2112,770,107,180,1280,151,209,284,1027,648,94,204,298,400,608,1089, 352,325,533,155,210,305,547,300,109,1048,184,534,1060,537,115,1090,167,225,326,306,772,157, 656,329,110,2057,2054,117,212,171,1038,776,1064,330,1153,226,549,1043,538,387,308,216,416,2 71,279,2065,2058,158,337,550,672,1092,118,332,579,540,1072,389,173,1037,121,553,199,784,17 9,228,338,2066,2176,312,1536,704,1154,2060,2081,390,174,554,581,1046,393,283,122,448,353,5 61,1096,203,63,340,394,1049,1281,527,582,556,181,295,1059,285,232,2113,2068,124,205,182,64 3,1156,562,2304,2082,286,585,299,354,1045,211,401,1104,185,1061,396,344,586,645,1282,593,535,240,1050,206,95,327,564,800,2072,2084,402,356,2055,2177,307,301,417,1160,213,1066,568,11 20,832,588,1035,1537,186,646,404,1091,227,896,594,418,302,649,2114,2560,771,360,539,111,105 2,331,1168,214,2059,2088,309,1062,1284,188,449,1073,217,408,609,596,551,650,229,159,420,31 0,1093,541,2116,2178,1288,773,610,657,333,1065,119,1098,600,339,1184,218,368,652,1031,230,391,313,450,542,1538,334,2067,2061,2096,2062,1076,233,555,774,175,123,1155,658,2120,2305,61 2,341,777,220,314,1105,424,1068,395,673,583,355,1296,1094,287,183,234,1051,2069,2180,125,5 57,1216,660,616,342,2083,2306,316,1157,241,778,563,1074,345,452,397,403,1112,207,2074,2561, 1540,674,558,785,1100,432,1039,357,187,1162,236,664,1312,624,587,780,1080,1122,2128,2085,705,126,242,1063,2073,2070,565,398,346,456,2184,2308,358,405,303,569,1544,244,1158,1097,595, 1283,189,566,676,1169,1054,1108,361,706,589,1344,215,786,647,348,2312,2086,419,406,2562,2 144,464,680,2115,2089,801,1069,362,1164,2192,2076,590,409,1286,570,1121,788,1552,1106,597, 1075,572,1186,219,311,708,598,1289,601,651,421,792,802,2117,2090,611,1047,602,1172,410,231,688,653,2564,2097,1128,248,1070,369,2122,2320,190,364,1568,654,1095,659,1161,335,480,315,2 21,370,1285,613,1408,422,2208,3074,425,451,2568,2336,1077,614,543,1298,235,412,343,372,257 6,2240,1185,775,317,1539,222,1099,426,453,237,1124,559,1170,2592,2118,1292,833,804,712,108 2,834,661,1053,2092,2179,2129,2098,808,779,1217,617,604,1541,433,720,816,1101,2121,2063,1176,836,347,897,1136,243,1297,662,1600,454,318,675,2368,2181,1110,618,1081,898,781,1314,122 0,376,428,1546,2100,2071,665,736,567,1107,2182,2432,1192,1078,2124,2185,840,625,238,1159,3 59,457,399,787,2130,2104,591,678,434,677,1290,1542,2075,2145,349,1300,1102,245,1188,458,66 6,1113,620,1553,1163,1313,363,127,1067,191,1125,782,407,436,2087,2307,626,1218,2132,2186,571,465,2193,2309,681,246,707,1346,2077,2091,2146,2563,350,1084,599,668,1548,790,2136,2188, 1165,1320,460,1123,1200,249,682,1664,573,1171,411,803,1116,789,1304,709,365,440,628,689,20 78,2194,374,1224,3076,2119,423,1556,466,793,2310,2313,2209,2624,1130,250,371,1174,2093,214 8,481,574,1348,413,1109,603,366,1545,1287,1055,468,1570,655,900,805,615,1166,684,1409,710, 2688,3073,1187,429,2099,2196,794,252,1114,373,605,1232,848,690,2094,2123,713,632,2314,2321, 1316,482,806,1132,2565,2152,1083,427,1177,904,1569,414,2210,2101,1291,223,1126,1554,663,6 92,835,1328,619,472,2241,3080,1137,455,2200,2125,796,1189,1601,809,714,1248,721,837,716,10 86,2212,2816,1302,1352,864,810,1173,606,1194,912,1103,722,696,377,2316,2322,1424,435,2566, 2102,1293,1560,817,1129,1792,319,621,1180,2131,2105,2569,2160,812,484,1345,430,1572,1138,3 072,2183,1299,838,667,1219,2126,2337,488,1111,239,378,459,622,1410,627,2242,2133,437,380,1 201,1608,818,1178,2324,2570,1294,461,1543,496,669,1190,1317,679,2106,2216,1140,1079,2187,2 147,1221,724,841,1305,629,1584,2134,2108,351,467,2328,2137,1360,438,1115,737,2338,2577,25 1,462,442,441,2572,2244,1666,469,1549,247,683,1196,2189,3088,2149,2195,1226,842,1412,1127, 738,1144,2224,2190,1308,899,1602,670,1318,783,1085,849,1555,1193,820,1576,728,928,791,367, 2578,2369,1376,901,2079,2248,2138,3104,1233,630,2593,2340,1321,685,844,1204,633,711,2370, 2580,2311,2197,2150,2153,1118,253,691,1301,824,1175,2352,2344,902,686,1668,1222,1416,1133, 740,1347,850,375,1558,444,1306,470,1167,483,1547,415,3078,2211,485,905,2140,3081,1202,795, 473,1240,2095,2315,634,744,2433,2594,1616,852,2372,2256,2434,2198,960,1322,2201,2213,865, 693,2154,2103,1131,1794,1350,797,1225,1604,1571,906,2376,3136,1252,715,1141,1330,807,474, 636,1179,694,254,1550,1665,2584,2625,717,1071,2596,3082,1315,575,913,1440,798,811,379,120 8,2161,2202,1353,1191,2127,2317,697,1564,431,1142,607,1228,2156,2626,489,1324,2272,2214,8 66,723,2567,2600,486,1573,1181,1234,908,1793,1561,718,813,1364,2243,2318,476,856,3089,268 9,1117,1411,839,1329,1295,1146,3084,2571,725,698,1472,914,2323,2628,1249,752,868,819,1349,814,439,929,2339,2107,1197,1578,490,1139,2217,2608,1680,623,2162,2325,1632,1336,671,1198,1 362,739,2204,2135,1603,1557,3200,2245,2164,2218,1413,916,1303,463,1236,843,2109,3090,1135, 381,1672,1354,2579,2573,497,1586,930,821,2690,2329,726,961,1203,1182,2326,2574,872,1418,4 92,1250,1332,631,2225,2341,2436,3105,1574,1223,729,1145,1605,700,2139,2632,1796,443,2817, 2246,1307,741,2220,2168,1378,1562,1356,1205,845,1319,2249,2384,920,382,2110,2330,1585,822, 1425,851,2191,3077,3092,2151,1229,730,1609,498,2226,2342,880,1256,742,445,1392,471,2141,3 106,2692,2250,2640,2371,635,1148,1696,932,1580,687,2440,2345,1210,1420,1612,1325,1800,903, 1134,825,1235,1361,500,1577,846,1670,1195,745,2818,2155,2228,3328,826,732,2199,2257,2332, 3075,1264,446,2696,2142,962,1426,1620,936,2252,2346,1377,475,2448,2656,3137,2400,2373,258 1,853,1310,867,637,2203,2258,1551,1230,2353,2595,1414,907,1206,1667,1588,1333,487,1808,23 48,2157,695,1441,1087,746,828,753,1610,854,1237,1326,3096,2232,857,1368,2582,3108,1209,50 4,799,1355,2585,2163,255,964,3138,2215,2273,2374,1242,909,2354,2820,2205,2704,1673,1559,1 309,719,2377,2158,1143,477,2165,2260,1617,915,1448,1380,2219,3086,638,748,2824,3112,944,1 728,1331,1227,869,1592,1428,491,699,1253,1351,754,2378,3201,1183,1565,2274,2597,858,1618, 1417,1476,3091,2586,478,968,1260,383,2435,2356,1212,910,1801,815,2264,2464,1579,976,2319, 2327,870,1684,1633,917,2206,2385,2598,2720,3140,2166,1337,1241,2380,2627,1606,1824,727,11 50,1442,493,1357,1251,2588,3120,1676,873,2437,2221,1384,701,3085,2169,1566,931,1323,1798, 1365,1473,2601,2247,756,1334,860,499,2832,2227,731,1648,1238,823,1575,922,1199,1674,2276,2386,874,1432,1421,918,2360,3584,2752,3202,1636,1254, 2438,2222,502,1795,2602,2629,933,136 6,3094,2441,1338,
1682,2331,2170,2496,2401,1587,1211,1488,743,1358,760,
2609,3144,1244,1581, 881,1147,2251,2111,494,1379,1272,
702,2388,2442,3097,3329,921,1624,501,876,2575,2630,
1415, 847,1856,1444,992,1697,2604,2229,2343,3107,2333,
2280,447,1607,1436,1369,2172,2253,1257,17 04,2230,
2691,733,1797,3204,2610,1669,1340,1231,827,1590,934,
2334,2633,1634,1474,2347,2402, 3093,2259,882,937,2449,
3152,2233,3109,963,1419,747,1265,2444,2392,1119,505,
1381,855,2634, 2693,924,1810,3330,2641,2583,2288,3098,
2254,734,829,1563,1213,2143,2375,1611,1363,2612,28
48,1430,1258,1688,1386,965,1614,1730,1239,2450,2404,
938,884,506,1327,1589,1804,2355,2349, 2465,3208,749,
1370,2261,3114,2616,3168,1640,945,2880,2636,966,1456,
1681,755,3083,3585,223 4,2694,1266,859,2452,3139,2275,
2944,2642,2466,1427,1593,1388,940,2350,2697,1214,830,
2819, 2408,1809,911,1621,1582,2587,2159,1832,871,3100,
2379,639,1480,1698,1335,888,1372,1245,479, 1422,1268,
3216,2262,946,1732,2357,3110,1677,750,1802,1626,3332,
2236,2497,3121,1393,969,2 265,2456,2657,2644,508,1613,
2599,2698,2277,2207,861,1446,2468,2358,1857,1339,
3141,2589,75 7,1382,3336,2821,970,1700,2658,2705,2381,
3113,1243,919,2167,3146,1594,1433,1826,1504,875, 1635,
1259,862,2648,2387,1920,1675,3232,2266,1445,758,2416,
2700,1149,948,1359,1816,3079,22 78,1596,1671,1712,977,
2439,2361,1385,923,1622,972,2498,2590,1434,1311,3586,
2382,1729,761, 1396,877,3124,2281,2603,2822,2223,2171,
3203,2706,1207,1475,2660,2389,1449,1812,952,1686,2
825,2268,495,1262,2362,3153,1644,1619,2472,3116,1341,
1429,2443,2721,1825,703,1371,1638,15 67,1736,2631,
2403,935,1685,978,1625,3344,3142,883,762,1246,503,
2335,2231,1458,925,1394,12 69,2282,3099,878,1478,735,
1799,2173,2605,3264,2708,2664,2390,1678,1860,2364,
3205,2289,282 6,2611,3122,1443,1637,2393,2500,1481,
1373,2445,2451,3160,2255,1699,1255,993,1591,1828,145
2,3588,2722,885,939,994,1400,2606,2833,3148,2480,1744,
1656,3087,2405,2235,3210,980,1689,9 26,764,2284,2712,
1270,941,1628,1367,1805,1457,3360,2672,2635,2828,
3128,3170,1921,1583,275 3,2174,1387,1642,2290,3111,
967,1267,2613,2446,1484,1450,2394,2504,886,831,1683,
1342,1811,9 47,2406,2453,2351,2617,3592,2292,1705,
1431,3206,3145,2643,3331,507,1261,1840,889,2237,261
4,1650,984,1760,1490,2724,3217,3102,3156,1615,751,
2409,2754,2637,3392,2263,2834,1702,942, 1858,1423,
2695,2396,1460,1383,2467,2454,996,1692,1641,1814,971,
1477,2512,2728,1273,1512,1 733,890,1598,1374,2849,
3117,2410,3212,509,1806,2638,2457,3334,2618,1922,
1649,3169,2836,36 00,3154,949,973,2645,3123,2620,3234,
1397,1489,2267,2359,2756,2646,3337,2649,1708,1627,269
9,2469,1000,1690,2840,2850,892,1274,2659,3095,1438,
1817,2650,3220,2458,2279,1390,1464,273 6,2701,1868,
950,1151,1731,1506,1827,1597,863,3176,2296,3118,2417,
1451,759,2238,2412,1864, 1714,3616,2702,3143,2707,
1701,1395,3209,2383,2528,2363,1803,1008,2269,2418,
3333,2661,162 3,1482,3456,2470,1276,510,2473,2499,
1435,1652,3125,2662,2591,3346,2283,2460,2391,2420,
979, 1492,3233,2823,953,1928,1829,1389,2365,3587,1738,
763,2270,3147,1872,974,2474,2501,1453,1 643,2285,3172,
1713,1818,1215,1402,2607,3218,1629,1520,1830,1691,
3340,2881,954,1459,1734,8 79,2852,2760,3130,2882,981,
1505,2709,3101,1706,982,2856,2827,3265,2665,2652,
3589,2481,276 8,2864,3149,1924,927,3224,2884,1833,
1639,2395,2945,3184,2291,1447,1746,3345,2710,1343,167
9,3648,2502,2366,2723,1820,1761,1479,1275,995,1740,
3158,2666,1401,1888,765,956,3129,2946, 2829,3362,1496,
1861,3268,2424,887,1437,985,1720,2476,3594,997,1630,
1813,1462,2713,2784,26 15,3155,3240,3126,1398,1645,
2888,2673,2286,3207,2407,2505,2447,2835,1848,1687,
2639,2726,1 247,1716,2482,2725,3338,3590,1936,986,
1483,1651,1745,943,2397,3348,1859,1508,3150,2293,32
36,2506,1834,1454,2714,3161,2668,3601,891,1841,998,
1595,3211,3361,1278,766,1465,1709,2411, 2175,1764,
1646,3115,2239,3173,2830,2455,2484,1737,511,2674,
3266,1485,1404,2619,2513,1693, 1866,2729,2294,2755,
3394,1952,1491,988,1657,1752,1807,2398,3132,2647,
2716,3596,2838,1399, 1844,3213,3368,2508,3171,1001,
951,1654,1926,3248,2297,2730,3712,1707,1391,2621,
3219,2459, 2851,1002,1468,3164,2837,3352,2757,2413,
2488,1836,1494,1873,1271,2676,2737,1694,893,2422,
3272,1923,1461,2471,3604,1748,1715,2514,2841,975,
1862,894,1815,3178,2298,2419,3222,1497, 1653,2529,
2622,3396,2461,3157,2651,2414,3593,1510,1762,3335,
3103,2516,3618,1842,1375,270 3,2948,2853,2663,3214,
2732,1703,1009,3457,2758,1466,1874,3235,2477,955,
1739,2842,2300,316 2,2421,2653,3280,2896,2738,1486,
1930,2761,2680,1889,1004,1658,1821,1718,1929,3364,
2530,28 54,3180,1599,1507,3131,2475,1776,1405,3225,
2952,3617,2462,1735,1831,3339,2271,3174,3602,1 493,
1010,2711,2740,2883,3376,1984,1455,2667,2520,957,
1865,3185,2503,2844,3237,3649,2857,2 762,3296,2769,
2885,2764,3134,983,1710,3350,3400,958,1514,2912,2858,
3221,2654,1876,1768,32 42,2960,1721,1938,3151,2770,
2744,2425,1660,1500,1403,1892,3472,2483,1819,1741,
1516,987,33 41,3608,1932,1463,2865,3177,3840,2367,
1012,1843,2669,3228,1749,999,2860,2532,3393,2478,36
20,3186,3347,2886,2715,3267,1838,1277,2536,3159,2287,
2426,2507,2670,3458,2675,1647,1925,2 485,2428,1498,
1742,3249,3656,2866,3226,1513,1880,1717,1016,1953,
1837,3342,2509,1867,1631, 3591,2544,2717,3238,1469,
1747,3365,2727,767,1904,1724,1524,3188,3127,989,1406,
1754,1822,3 269,2772,2889,3353,2677,3632,2399,2515,
3408,2486,3163,2785,2299,2510,2490,2489,1835,1499,
3714,2517,3597,2295,2731,3244,1944,1863,1890,1467,
1003,1522,3274,2890,3460,3175,2786,319 2,1763,1695,
3356,2947,3650,2718,1850,990,1005,1937,3366,2831,
3133,2897,1722,1845,3603,324 1,1495,1655,2868,3624,
2776,2976,2839,2415,1765,1956,3424,2949,1487,1750,
3281,2678,1869,15 21,3369,2733,2892,3252,2681,2759,
959,1896,1263,1940,3166,2301,2739,3349,2872,3223,
1770,18 77,2950,2734,3716,3270,1509,1711,3464,3181,
2788,3395,1756,1846,2898,2423,3606,2492,1011,1 960,
3354,2518,3215,2531,3595,2463,1784,1870,1662,1013,
2533,2953,1985,1753,3250,2843,2521, 3288,2682,2792,
1927,1528,3664,2900,1849,1882,3008,3370,2913,2741,
1766,1511,3179,3842,339 8,2845,3273,3652,3619,2954,
1954,1719,3300,2763,3189,3378,1777,895,2855,2522,
2684,3227,274 2,2302,1439,1006,3598,3713,1878,1891,
2765,3119,3363,2623,2961,3488,2846,2859,2427,3256,19
39,1661,3401,3239,1502,1986,2745,3612,1852,1934,2479,
3190,2655,3276,2537,3372,1723,1772,2 914,2771,1515,
1897,2534,3621,3229,3282,2956,3841,3609,2766,1014,
1470,2861,3412,1743,1931, 2524,2904,3165,3459,2887,
3377,3343,3194,2773,2746,3520,2962,1017,1968,3297,
2800,2916,286 7,3397,2862,2487,2977,1881,1894,3245,
3626,1769,1517,2538,3187,1778,1941,1823,1659,3728,26
71,1992,1875,3680,3384,1755,1501,2719,3246,3410,2787,
1018,1900,3651,3605,1725,991,3461,29 64,3351,2511,
3284,2891,3183,2429,3720,3402,2545,3634,2978,2869,
2774,3009,3251,3230,1933,1 839,2920,3466,2540,3298,
3380,2679,1525,1955,1988,1884,1726,1948,3622,3271,
2777,3193,3653, 2748,1780,1518,3844,2491,1020,1767,
1905,1851,3355,2789,1893,1945,3426,3610,3404,3253,289
3,3367,2968,2430,3633,2870,3473,2899,3277,2778,3657,
2546,1757,1530,2928,3304,2790,2493,34 40,2519,1958, 1471,1007,2000,2683,3196,3744,2980,3628,2735,1847,1898,3258,3468,3660,3373,1 523,1942,3848,2951,3182,2873,1961,1871,3283,3409,1771,1529,2548,3625,2894,3718,3243,2793, 1912,1758,2874,2780,1989,1946,3312,2494,3010,3474,3668,2984,3425,2523,1526,1906,2901,3358,2915,2685,3599,3278,1883,1773,3462,2955,3254,3715,3636,3381,2535,3856,1957,1853,2743,34 89,3135,2794,1976,1015,2876,2801,3658,2902,3285,3374,1751,1993,1503,1962,2905,3416,3257,2 552,2847,3403,2303,3012,1781,1885,3290,2957,1908,2016,3721,3607,3357,2767,3191,2525,3665, 2963,3496,3428,2686,2796,1854,1532,2992,3776,3379,3275,2917,3640,3476,2539,2747,3301,1972,1774,3399,2802,1019,1895,3231,3613,2906,3666,3465,3524,2526,3016,3308,2431,1987,1969,32 60,2958,3849,2863,3627,3024,1782,1279,2918,3732,3681,2965,1943,1899,3385,3289,1994,1663,3 654,3872,2775,3198,3490,2541,3405,3299,1964,1785,3724,2921,1021,1935,3432,2749,3614,2979, 3371,3846,3413,3521,2804,3382,2908,2547,2779,3696,3286,2871,3623,2970,3247,3722,1886,2001,2922,3480,3469,2966,1407,1779,1990,1970,3684,3302,2550,3843,1879,1022,2981,3414,1902,19 47,3386,3730,3635,3259,3536,2791,3406,2808,3292,3629,2929,3195,2542,3427,3320,2750,2969,3 672,2549,2924,1759,1907,3463,2895,3904,3492,3040,3745,1527,1996,1786,1959,2495,3655,3484, 3417,2002,1913,3305,3752,1949,2017,2781,3845,1534,1788,3717,3388,3279,2875,3638,2982,3682,3522,2930,2985,3011,3467,2795,3313,3167,2553,3429,2903,2972,3858,1910,1965,2782,2877,36 11,3261,3659,3411,2004,1901,3478,3306,3736,3434,3013,3662,3778,3287,1966,1775,2986,2932,2 008,1531,2554,3375,3637,3852,1971,1950,2797,3418,3688,2993,3014,3504,3729,2803,3314,2907, 1909,1991,3475,3641,3436,2988,3262,2878,3857,2959,3669,3630,3880,2919,2018,1727,2687,3528,3746,3383,2936,3420,3293,2527,3470,3316,1916,1855,1974,1995,2994,3780,3725,2798,3850,36 74,3441,3017,2020,1977,2556,3661,2909,3494,3905,3387,2805,3430,3018,3748,3291,2967,1787,1 914,3642,3481,3874,3552,2923,3683,3307,2910,2005,1887,3968,3723,1023,1963,3493,2806,3197, 2996,3407,3864,3644,3719,3760,3025,3433,2971,3670,3020,3482,3359,1998,1783,3777,2809,3444,2925,2024,1980,3255,3523,3497,3860,3000,3734,2543,3310,1903,1973,3692,3667,3389,3477,38 73,2751,3419,3686,3615,3784,2983,3733,3026,3673,2931,2810,3294,2551,3506,2973,3442,3317,2 003,1789,2926,3526,2783,3847,1997,2032,3726,3908,1978,1917,3491,3685,2010,1519,3529,3421, 3747,3303,3041,3639,3876,3500,2933,2987,3042,3448,3792,3704,3028,3737,2974,2812,3318,2989,3676,3415,3853,3505,2019,2006,3969,3631,3435,3690,1951,1911,3015,3315,3532,3498,2021,20 09,2934,2879,3731,3390,3859,2995,3753,3479,2555,3309,3888,2937,3698,3032,3808,3538,3663,2 799,1790,2026,3750,2990,3906,3471,3508,3431,3044,3740,3689,3862,3019,3525,1975,2012,3321, 3560,3781,2938,3646,3422,1967,1915,2557,3854,3970,3697,2997,3021,3445,3537,3756,3675,3048,3738,2940,3322,3486,3865,3438,3512,2025,2022,3916,2998,3199,3779,3554,3875,3645,2911,19 81,1918,2033,1999,3499,2807,3912,3762,3749,3443,3851,3056,3671,3530,3324,2558,3483,3700,3 027,3540,3001,3976,3877,3437,3786,2811,2028,1533,3920,3022,3501,3691,3761,3866,3263,3450, 3677,3568,3878,3739,3002,3507,3782,2927,3029,3553,2011,1982,3754,3030,3972,2975,3881,3687,3495,3794,2034,1979,3391,3727,3868,3809,3527,3323,3043,3788,3449,3936,2813,3004,3544,39 09,2935,3485,3033,3768,3045,3678,3861,3510,2023,2013,3446,3693,2036,2007,3896,3735,3295,3 764,3984,3034,3531,3699,3793,2991,3907,3556,3882,3502,2939,3889,3046,3643,3326,2814,3513, 3757,3812,3694,2030,2014,3785,2559,3533,3452,3741,3914,2040,1535,4000,3539,3036,3705,3800,3855,3447,3892,3049,2999,3702,3974,3755,3439,3050,3516,3884,3542,3921,3319,3742,2941,39 71,3509,3796,3763,2027,2029,3023,3910,2942,3863,2035,2037,3545,3701,3558,3810,3890,3423,3 751,3057,3514,3922,3003,3787,3534,3978,3937,3052,3706,3869,3766,3977,1791,2038,3647,3555, 3824,3453,3783,3879,3541,3058,4032,3503,3005,3913,3031,3758,3006,3562,3924,3816,2041,1919,3769,3986,3708,3548,3451,3940,3867,3789,3564,3035,3980,3511,3060,3891,3797,3047,3886,33 25,3695,3973,3546,3790,3561,3928,3765,3064,4001,3885,3915,3679,3517,3795,2815,3952,3772,3 572,3037,3454,3802,3870,2042,2039,3883,3547,3992,3911,3938,3515,3051,3570,3811,3743,3898, 3038,3053,3985,3770,3893,3543,3703,3813,4004,3535,3798,3917,3569,2044,2043,3007,3944,3311,3988,3818,3925,3557,3759,3804,3894,3059,4008,3832,3918,3710,3061,4033,3801,3975,3576,38 97,3930,2031,1983,3814,3559,4002,3767,3825,2943,3487,3054,3926,3939,3987,3709,3550,4034,3 900,3982,2046,2047,3771,3820,3563,3945,3062,3518,3791,3979,3065,4016,3929,3942,3817,3565, 3826,3989,3871,3707,4040,3923,3803,3549,3066,3948,3773,3039,3981,3887,3573,4003,4036,3932,3774,3996,3828,3566,3068,3815,3953,3899,3941,3993,3805,3578,4006,3519,3055,4048,3895,39 46,3571,3990,4009,3919,3819,3577,3960,3806,4037,3994,3574,3954,3931,3821,4005,3901,4024,3 063,3799,4041,3551,4010,3829,3933,3956,4064,2015,2045,3902,3580,4020,3822,3067,3943,4035, 4017,3830,3327,3991,3947,4042,3711,4012,3833,3069,3983,3934,4049,3455,3827,4038,4018,3927,3070,3950,3995,3807,3955,3575,4044,3834,4007,4050,3961,3997,4065,3582,3836,3958,4013,40 52,3949,4014,3823,4056,3579,4019,3998,3957,4039,4066,3775,3964,3903,4022,4043,4068,4025,3 835,3962,4053,3935,3071,4011,4046,3831,4072,4028,3951,4021,4051,3837,4045,4080,4026,3965, 4058,3567,4067,4054,3999,3959,4069,4057,3838,4074,4023,4060,4015,3963,4073,4070,4029,3966,4081,4047,4076,3581,4059,4030,4082,4027,4071,4061,4084,4055,4078,4062,4088,3583,4075,40 77,4083,4085,3839,4086,4089,3967,4090,4087,4092,4091,4079,4031,4094,4095,4063,4093]

Sequence Group 8: Z8_4096

[0,1,2,7,3,8,11,24,4,10,13,28,16,33,35,77,5,12,14,32,19,38,47,81,22,46,42,88,57,96,102, 168,6,17,21,40,23,45,51,90,29,55,59,97,72,110,116,186,34,61,75,114,80,123,135,197,87,137,148,2 25,153,238,260,381,9,18,26,54,30,58,71,105,36,76,62,117,84,127,142,206,44,74,86,136,92,145,152,233,100,155,170,252,184,268,287,424,53,89,98,151,111,162,178,265,121,179,196,279,210,301,3 17,461,139,204,230,307,236,320,345,494,257,353,375,519,396,544,587,815,15,25,31,73,39,79,82, 141,48,85,93,150,101,160,165,262,56,94,103,163,115,177,193,282,126,194,205,296,232,314,340,4 81,64,108,122,183,128,195,213,309,149,228,237,322,256,351,369,518,164,246,266,357,280,389,398,539,303,412,446,574,471,608,678,817,69,124,144,216,159,235,255,355,169,258,271,380,288,3 97,423,563,191,283,297,409,321,438,465,618,334,474,499,650,527,688,714,943,212,310,328,450, 358,480,503,667,393,515,540,704,576,718,786,1016,421,554,588,753,603,805,833,1073,673,853,8 83,1064,915,1129,1203,1490,20,37,41,91,49,95,106,176,50,107,118,187,132,207,217,336,63,119,1 33,222,146,231,244,337,154,243,261,374,284,392,404,538,67,143,156,224,173,247,267,390,181,2 75,289,406,300,435,454,600,180,298,312,434,333,468,483,651,362,505,528,687,552,712,758,993, 78,167,174,273,190,294,311,425,198,316,326,463,346,492,509,685,259,341,359,497,382,525, 549, 706,415,558,594,750,621,802,840,1054,293,377,407, 535,431,573,598,788,459,614,634,814,679,86 4,894,1103, 500,675,689,884,707,917,870,1145,769,981,1017,1218, 1025,1315,1367,1549,83,188,1 92,332,248,350,368,504, 274,373,383,532,414,560,593,790,290,410,430,561,448, 599,625,820,475, 639,666,858,705,891,939,1153,335,436, 453,624,482,657,693,874,530,696,716,935,770,911,1003,1 228,571,742,796,985,821,1024,1059,1278,865,1067,1066, 1351,1147,1387,1431,1684,376,472,506, 697,559,717,757, 955,595,789,807,1018,850,1033,1065,1309,628,829,876, 1055,898,1071,1149,138 9,951,1162,1199,1441,1254,1509, 1546,1821,686,888,929,1151,1001,1156,1242,1464,1014, 1234,12 84,1529,1334,1581,1658,1934,1035,1320,1381, 1605,1414,1668,1630,1963,1485,1725,1760,2074,1 844, 2124,2211,2399,27,43,52,99,60,120,134,214,66,138,147, 221,158,241,245,386,68,157,166,240, 175,295,304,420, 200,306,331,460,348,485,507,702,70,172,189,299,202,329, 342,478,215,354,370, 516,388,545,568,720,229,378,401, 556,426,592,609,776,440,601,641,828,648,856,889,1213, 109,20 1,211,347,223,371,387,534,253,405,416,580,443, 616,638,794,272,419,452,606,477,646,653,842,4 96,655, 664,893,740,918,975,1230,291,476,490,662,524,691,701, 903,548,739,763,950,810,994,101 9,1289,579,785,824, 1021,866,1050,1113,1337,925,1120,1166,1396,1200,1451, 1518,1814,112,219, 242,399,270,417,447,620,286,455,479, 656,501,669,681,900,315,491,521,683,547,730,755,946, 577, 774,808,1010,843,1036,1091,1294,343,533,567,759, 610,797,795,1039,629,832,854,1074,905,111 7,1137,1401, 668,867,921,1130,947,1181,1202,1468,980,1226,1267, 1530,1347,1591,1661,1947,364, 586,615,834,652,863,907, 1121,727,924,962,1195,966,1208,1249,1505,743,964,979, 1239,1047,12 66,1326,1578,1100,1344,1379,1608,1425, 1694,1738,1974,775,1061,1084,1297,1142,1355,1386,16 47,1167,1419,1471,1720,1519,1768,1831,2089,1273,1473, 1533,1781,1602,1858,1887,2185,1649,1 913,1961,2235, 2025,2312,2385,2666,129,254,278,458,313,489,517,711, 324,526,555,737,581,766, 819,1093,356,569,619,791,643, 861,845,1102,658,877,914,1161,958,1187,1216,1486,427, 632,659,8 59,726,902,930,1198,736,961,973,1217,1000, 1250,1277,1555,744,990,1028,1275,1098,1323,1371, 1611, 1132,1411,1424,1701,1472,1739,1801,2057,442,725,729, 948,749,965,1009,1260,784,1048,10 81,1311,1118,1362, 1416,1673,920,1095,1144,1373,1171,1448,1475,1727, 1255,1480,1540,1787,16 04,1850,1879,2179,972,1180, 1238,1450,1274,1526,1562,1811,1332,1587,1618,1876, 1669,1915,19 72,2261,1384,1654,1712,1960,1759,2008, 2056,2322,1818,2077,2117,2378,2158,2459,2472,2831,4 51,751,765,1089,901,1107,1136,1409,937,1157,1191,1459, 1246,1497,1553,1805,977,1214,1269,15 13,1307,1565, 1621,1869,1366,1666,1613,1903,1730,1967,2024,2283, 1101,1279,1322,1595,1399,1 634,1703,1954,1437,1713, 1758,2009,1797,2029,2097,2363,1522,1775,1826,2061, 1891,2136,2173, 2431,1930,2228,2258,2510,2313,2560, 2578,2754,1176,1327,1434,1718,1491,1752,1778,2048,154 7,1839,1862,2110,1905,2137,2239,2470,1559,1899,1956, 2224,2022,2266,2271,2574,2081,2324,23 59,2603,2414, 2672,2719,2941,1676,2002,2010,2306,2106,2328,2380, 2617,2154,2430,2444,2704,2 525,2720,2839,3018,2201, 2503,2551,2782,2612,2793,2884,3089,2651,2902,2936, 3142,2984,3186, 3223,3400,140,113,65,285,104,263,182, 502,125,185,203,444,220,352,323,572,161,218,239,330,26 4,408,372,663,302,384,422,541,462,731,612,897,171,249, 269,391,305,413,469,589,325,493,439,8 16,531,633,674, 1209,349,473,557,647,514,700,781,1043,582,764,728,934, 841,1094,967,1470,199, 292,308,449,344,484,537,682,379, 605,495,715,570,745,804,978,411,529,645,777,613,892, 762,101 5,562,809,916,1060,860,1258,1128,1724,441,642, 583,851,719,818,944,1083,672,991,882,1184,93 1,1141, 1410,1314,752,954,1005,1285,1042,1196,1229,1508,1085, 1345,1263,1655,1397,1890,1579, 2174,234,327,365,520, 400,553,604,787,437,684,575,812,635,848,904,1150,464, 611,721,857,665, 974,885,1133,748,936,1029,1201,995, 1244,1329,1536,498,710,649,910,806,959,1037,1223,780, 10 97,976,1418,1075,1282,1295,1614,852,1026,1160,1328, 1119,1361,1460,1924,1219,1484,1404,164 5,1552,1741, 1800,2248,546,738,825,1011,768,1046,1139,1343,871, 1188,1080,1525,1231,1378,145 5,1700,919,1112,1245, 1412,1310,1476,1610,1755,1163,1573,1496,1868,1652, 1820,1962,2352,963, 1,272,1335,1583,1194,1531,1627, 2001,1385,1690,1749,1878,1548,2075,1935,2756,1430, 1721,178 6,2049,1823,1969,2028,2455,1660,2114,2159, 2305,2210,2629,2384,3163,281,385,418,607,470,69 0,640, 896,488,654,798,942,724,988,1032,1262,536,754,703, 1008,803,1131,970,1308,862,1049,11 48,1354,1088,1504, 1449,1909,578,813,767,1212,928,1038,1092,1363,849, 1116,1177,1596,1235,14 07,1477,1761,949,1261,1197, 1524,1336,1463,1603,1817,1293,1572,1638,1855,1699, 1942,2059,22 96,617,1002,835,1143,890,1276,1186,1532, 971,1222,1317,1487,1360,1582,1648,1892,1058,1413, 1296,1745,1251,1598,1635,2031,1481,1687,1769,1948, 1819,1995,2119,2495,1106,1440,1358,165 9,1515,1726, 1859,2103,1590,1902,1751,2044,1796,2231,2168,2439, 1388,1838,1968,2195,1914,21 42,2338,2424,2011,2310, 2249,2596,2403,2539,2673,3214,692,906,1020,1259,1082, 1306,1458,167 2,1140,1542,1333,1719,1405,1620,1822, 2099,984,1372,1435,1794,1528,1943,1748,2069,1619,187 3,1908,2214,1686,2323,2162,2838,1215,1469,1580,1990, 1675,1886,1851,2292,1514,1928,2053,21 84,2005,2242, 2373,2557,1779,2033,1966,2259,2102,2463,2331,2607, 2169,2386,2506,2703,2445,2 662,2885,3017,1268,1599, 1707,1925,1543,2111,1973,2304,1815,1994,2207,2360, 2052,2402,2520, 2742,1646,2143,2083,2413,2225,2550, 2453,2730,2318,2478,2642,2693,2595,2931,2858,3098,187 5,2267,2176,2535,2367,2770,2488,2815,2115,2648,2579, 2874,2602,2917,2981,3473,2253,2747,27 05,3032,2669, 2968,3064,3256,2805,3043,3009,3317,3127,3609,3272, 3701,363,445,508,713,566,7 41,799,1034,602,895,771, 1152,844,1072,1204,1454,644,811,945,1096,875,1301, 1146,1503,989,12 48,1359,1740,1227,1537,1594,1950,680, 938,899,1190,1004,1243,1342,1612,1099,1415,1283,1558, 1400,1653,1807,2041,1051,1370,1321,1644,1462,1762, 1702,2003,1527,1795,1872,2381,1896,217 8,2118,2534, 756,960,1090,1300,1189,1346,1576,1685,1027,1380,1474, 1744,1406,1845,1753,2088, 1170,1512,1541,1939,1436, 1806,1904,2206,1667,1957,1833,2151,2030,2252,2329, 2657,1292,156 4,1706,1877,1626,1991,1949,2287,1774, 2108,2045,2243,1938,2339,2391,2638,1609,2131,2080,23 61,2215,2479,2432,2731,2017,2415,2526,2923,2594,2855, 2792,3173,855,1205,1070,1461,1138,16 98,1417,1897, 1316,1502,1615,1883,1586,1830,1982,2297,1288,1780, 1639,2058,1563,1955,1931,2 349,1750,2023,2155,2255, 2107,2406,2458,2713,1398,1677,1816,2000,1863,2194, 2096,2502,1691, 2068,2270,2438,2150,2387,2575,2771, 1898,2246,2189,2467,2353,2650,2528,2825,2325,2588,272 6,2870,2668,2940,2972,3349,1523,1912,1754,2175,1827, 2116,2260,2544,1951,2398,2234,2511,23 07,2601,2643, 2888,2016,2362,2293,2663,2466,2616,2743,3096,2416, 2797,2674,2930,2776,3008,3 051,3248,2082,2303,2489, 2712,2390,2738,2814,2985,2585,2916,2764,3042,2871, 3073,3139,3313, 2538,2830,2920,3215,2980,3108,3162, 3419,2790,3183,3258,3386,3273,3459,3530,3756,992, 1247, 1185,1631,1350,1695,1597,1975,1408,1554,1832, 2200,1763,2032,2125,2417,1465,1804,1731,206 0,1929, 2330,2109,2473,1893,2163,2247,2600,2302,2527,2675, 2922,1577,1946,1874,2177,2004,22 30,2254,2545,1810,
2286,2372,2692,2452,2653,2628,2961,2076,2379,2494,
2613,2425,2727,2777,3 026,2348,2808,2718,2987,2862,
3083,3126,3361,1674,1854,2098,2366,1983,2319,2471,
2701,2188, 2561,2407,2656,2172,2746,2791,3039,2238,
2454,2507,2927,2584,2765,2842,3222,2649,2912,280
9,3072,2971,3109,3208,3397,2311,2524,2702,2843,2597,
2990,2913,3143,2755,2875,3027,3169,29 37,3303,3226,
3434,2667,2986,3065,3249,3112,3334,3294,3505,3050,
3265,3387,3553,3360,3469,3 583,3777,1882,2040,2130,
2462,2282,2639,2433,2804,2229,2529,2521,2889,2606,
2960,2863,3187, 2358,2721,2589,2854,2757,2921,3033,
3168,2700,2991,3055,3227,2973,3268,3323,3504,2412,265
2,2824,2969,2739,3082,3016,3259,2783,3038,3099,3401,
3182,3295,3312,3552,2903,3155,3217,33 22,3138,3435,
3362,3544,3088,3373,3468,3639,3425,3582,3629,3869,
2556,2796,2859,3154,2970,3 054,3216,3335,2926,3097,
3172,3363,3257,3464,3418,3585,3019,3209,3264,3458,
3302,3396,3499, 3667,3316,3511,3472,3628,3545,3663,
3693,3964,3113,3269,3348,3498,3372,3510,3573,3662,342
4,3572,3531,3728,3608,3729,3692,3868,3465,3584,3638,
3734,3666,3735,3757,3819,3700,3776,38 18,3845,3844,
3965,3886,3887,130,131,208,251,209,276,319,432,226,
318,339,466,366,511,513,74 7,227,338,360,510,395,542,
591,773,428,590,564,800,637,836,868,1108,250,367,403,
550,429,585, 623,822,467,631,661,837,732,886,922,1164,
512,671,735,912,772,941,987,1183,793,997,1040,128
1,1053,1312,1368,1657,277,394,456,630,486,660,723,873,
522,746,676,923,782,957,1012,1224,58 4,734,792,996,826,
1023,1052,1299,846,1057,1110,1348,1158,1390,1433,
1742,627,801,838,1045,8 87,1078,1126,1377,933,1127,
1182,1421,1232,1467,1507,1809,999,1220,1290,1489,
1304,1510,157 1,1870,1357,1593,1641,1921,1688,1976,
2043,2389,361,433,487,733,543,761,778,1007,596,783,82
7,1044,847,1076,1087,1374,636,830,869,1079,913,1125,
1175,1426,956,1178,1221,1452,1298,1500, 1566,1849,694,
880,940,1155,968,1179,1237,1493,1041,1286,1305,1516,
1356,1589,1629,1920,10 86,1338,1382,1607,1422,1679,
1692,1965,1479,1716,1784,2020,1835,2078,2186,2393,
709,952,102 2,1252,1069,1303,1353,1601,1109,1364,1393,
1656,1438,1689,1737,1999,1173,1427,1453,1711,15
11,1770,1825,2094,1556,1840,1885,2144,1933,2202,2236,
2547,1236,1494,1538,1790,1616,1848,1 895,2167,1683,
1917,1970,2220,2026,2244,2342,2632,1735,1986,2046,
2291,2067,2369,2409,2697, 2181,2435,2475,2688,2513,
2759,2837,3106,402,523,551,823,597,831,878,1124,622,
879,926,1165, 982,1225,1253,1560,677,927,983,1270,
1030,1291,1330,1561,1056,1325,1369,1640,1428,1682,170
4,1964,699,1013,1062,1280,1115,1339,1383,1680,1135,
1403,1439,1708,1466,1765,1798,2064,113 4,1456,1498,
1764,1551,1828,1853,2145,1622,1901,1936,2199,1984,
2232,2300,2611,760,1105,112 2,1395,1172,1446,1495,
1743,1192,1506,1534,1813,1574,1866,1911,2197,1365,
1567,1617,1881,16 62,1927,1981,2222,1723,1992,2054,
2288,2101,2364,2418,2682,1445,1643,1709,1953,1757,
2019,2 062,2344,1803,2090,2122,2388,2187,2450,2486,
2737,1888,2183,2203,2476,2223,2515,2460,2779, 2321,
2593,2633,2852,2641,2949,2999,3153,779,1168,1174,
1550,1340,1588,1628,1900,1402,1637, 1663,1944,1722,
1996,2051,2346,1442,1714,1756,1997,1788,2063,2105,
2396,1841,2127,2166,244 2,2221,2483,2543,2789,1557,
1766,1793,2104,1852,2153,2209,2464,1940,2212,2240,
2537,2326,25 09,2621,2864,2015,2278,2354,2599,2397,
2640,2685,2910,2451,2691,2690,2983,2781,3013,3057,3
260,1642,1836,1906,2213,1993,2241,2299,2563,2055,
2345,2371,2634,2428,2655,2689,2945,2112, 2405,2468,
2683,2492,2695,2785,3015,2559,2800,2833,3063,2890,
3119,3150,3357,2198,2480,253 1,2787,2619,2794,2876,
3080,2630,2868,2918,3135,2964,3179,3240,3432,2659,
2952,3007,3199,30 44,3246,3220,3453,3103,3289,3318,
3520,3374,3554,3597,3695,457,565,626,839,670,932,986,
124 0,698,998,1031,1265,1068,1319,1331,1670,708,1063,
1104,1318,1123,1447,1482,1734,1206,1488, 1545,1808,
1584,1857,1907,2218,722,1114,1169,1457,1210,1539,
1568,1846,1241,1600,1632,1918, 1678,1977,2012,2250,
1287,1650,1697,1988,1746,2050,2079,2334,1772,2065,
2129,2404,2140,244 0,2481,2847,881,1207,1233,1575,
1271,1633,1671,1952,1349,1705,1728,2036,1777,2092,
2126,235 0,1394,1733,1792,2072,1843,2138,2147,2420,
1880,2149,2164,2485,2276,2516,2583,2866,1443,18
42,1864,2160,1926,2205,2217,2499,1980,2275,2309,2558,
2376,2614,2635,2925,2035,2341,2400,2 637,2456,2680,
2745,2967,2523,2752,2802,3020,2834,3069,3124,3350,
908,1257,1324,1693,1392,1 729,1785,2100,1432,1799,
1847,2152,1889,2171,2191,2496,1501,1865,1923,2193,
1979,2268,2295, 2552,2027,2332,2374,2626,2421,2660,
2717,2932,1569,1945,2007,2301,2084,2355,2351,2665,211
3,2408,2436,2698,2501,2749,2767,3025,2170,2457,2519,
2760,2553,2813,2836,3084,2592,2860,28 99,3136,2979,
3189,3243,3441,1624,2042,2091,2410,2146,2449,2505,
2753,2263,2522,2568,2827,2 572,2844,2883,3117,2279,
2570,2591,2873,2677,2898,2956,3176,2734,2976,3005,
3200,3053,3270, 3296,3462,2333,2687,2710,2935,2774,
2989,3012,3233,2803,3049,3087,3286,3125,3324,3367,352
9,2905,3091,3141,3331,3196,3380,3403,3587,3235,3421,
3451,3607,3491,3650,3687,3810,969,135 2,1420,1802,
1499,1861,1919,2227,1520,1932,1987,2273,2037,2316,
2395,2723,1606,2013,2095,23 47,2133,2447,2423,2736,
2156,2469,2512,2799,2564,2819,2850,3104,1747,2120,
2157,2443,2262,2 498,2532,2832,2272,2567,2581,2851,
2618,2886,2909,3159,2280,2608,2646,2907,2732,2955,
3001, 3203,2762,3037,3052,3277,3090,3297,3341,3513,
1776,2257,2265,2554,2285,2571,2625,2894,234 0,2678,
2707,2947,2750,2996,3046,3251,2518,2725,2778,3003,
2807,3066,3093,3291,2891,3100,31 46,3333,3198,3376,
3395,3581,2580,2812,2872,3068,2906,3132,3164,3347,
2962,3185,3210,3392,3 247,3423,3460,3625,3010,3238,
3282,3450,3315,3482,3512,3654,3354,3523,3549,3682,
3566,3723, 3732,3875,1791,2289,2315,2715,2497,2741,
2766,3035,2541,2795,2823,3075,2880,3111,3157,334
3,2587,2848,2901,3121,2943,3167,3213,3385,2998,3244,
3205,3413,3292,3455,3490,3633,2735,29 11,2954,3191,
3023,3224,3279,3446,3061,3283,3314,3483,3339,3493,
3533,3677,3128,3327,3364,3 517,3405,3558,3575,3711,
3430,3602,3622,3746,3651,3768,3772,3846,2810,2957,
3058,3284,3107, 3308,3328,3506,3151,3371,3382,3542,
3415,3559,3611,3730,3161,3411,3448,3600,3488,3626,363
1,3770,3525,3656,3673,3787,3704,3814,3831,3913,3254,
3478,3484,3646,3538,3658,3684,3793,35 64,3710,3716,
3826,3751,3832,3877,3934,3593,3743,3765,3856,3790,
3861,3892,3955,3803,3896,3 910,3970,3924,3982,3991,
4030,1006,909,695,1429,872,1375,1154,1894,953,1159,
1211,1782,1264, 1592,1517,2018,1077,1256,1313,1544,
1376,1710,1636,2161,1478,1664,1736,1971,1812,2269,208
6,2491,1111,1341,1391,1681,1483,1717,1829,2047,1521,
1867,1771,2392,1941,2121,2182,2845,15 85,1837,1989,
2139,1916,2216,2337,2671,2038,2314,2264,2536,2419,
2724,2573,3086,1193,1444,1 492,1789,1570,1856,1959,
2192,1651,2071,1871,2237,2014,2281,2368,2590,1715,
1937,2135,2335, 2087,2484,2308,2631,1998,2375,2514,
2686,2446,2892,2758,3288,1773,2132,2039,2429,2245,239
4,2548,2709,2180,2609,2474,2816,2533,2773,3036,2948,
2290,2562,2623,2919,2670,2828,2865,31 18,2711,2977,
2897,3239,3021,3404,3177,3576,1302,1535,1625,1922, 1696,1985,2070,2343,1767,2196,2021,2382,2123,2426,2500,2786,1824,2085,2251,2441,2165,2582,2477,2763,2284,2540,2647,2835,2615,2878,2959,3144,1884,2226,2141,2508,2370,2565,2661,2857,2336,2729,2586,3048,2699,2914,2933,3206,2434,2644,2798,2958,2751,2995,3076,3426,2853,3102,3028,3231,3156,3299,3340,3616,1978,2274,2401,2627,2320,2676,2769,2975,2461,2820,2706,3131,2867,3004,3071,3276,2517,2744,2879,3040,2946,3094,3202,3311,2801,3171,3110,3384,3236,3356,3452,3670,2569,2904,2965,3181,2826,3137,3219,3477,3011,3266,3305,3394,3152,3521,3433,3848,3056,3287,3332,3507,3359,3457,3492,3721,3242,3546,3567,3645,3596,3795,3686,3975,1423,1665,1732,2073,1834,2204,2128,2490,1860,2148,2356,2546,2256,2604,2654,2896,1958,2294,2219,2624,2365,2761,2576,2944,2448,2679,2784,2988,2714,3116,3067,3417,2034,2383,2317,2846,2530,2664,2722,2997,2427,2748,2811,3192,2869,3031,3095,3319,2555,2895,2829,3130,2966,3079,3197,3353,2929,3170,3228,3379,3275,3438,3515,3640,2093,2620,2411,2775,2482,2908,2818,3140,2577,2856,2951,3105,2994,3180,3234,3406,2684,3041,2934,3301,2887,3194,3225,3495,3101,3263,3325,3442,3355,3475,3551,3741,2740,3062,2992,3241,3123,3290,3381,3537,3188,3412,3307,3502,3338,3605,3570,3715,3014,3370,3456,3591,3422,3560,3664,3708,3485,3648,3617,3782,3697,3761,3815,3986,2208,2504,2636,2893,2708,2942,3074,3250,2772,3148,2963,3285,3029,3212,3358,3535,2598,3002,3059,3336,3134,3439,3304,3519,3211,3389,3416,3598,3262,3655,3568,3876,2849,3085,3178,3470,3253,3402,3377,3636,3122,3428,3509,3586,3481,3612,3681,3767,3329,3497,3454,3623,3536,3725,3661,3789,3571,3688,3744,3825,3717,3808,3893,3933,2900,3195,3281,3427,3149,3543,3461,3644,3351,3474,3595,3674,3508,3696,3748,3840,3232,3561,3527,3703,3601,3764,3719,3836,3652,3736,3798,3821,3781,3909,3882,3958,3391,3627,3578,3759,3679,3852,3738,3871,3547,3800,3773,3890,3786,3901,3923,4045,3619,3843,3827,3938,3813,3916,3948,3996,3865,3943,3931,4013,3967,4065,4004,4077,1623,1783,1910,2233,2006,2277,2357,2658,2066,2487,2327,2788,2422,2696,2840,3070,2134,2377,2549,2728,2465,2939,2780,3115,2605,2882,2993,3298,2861,3145,3190,3444,2190,2542,2493,2822,2622,2877,2974,3204,2733,3045,2915,3160,3024,3237,3345,3501,2681,3000,2953,3230,3078,3320,3278,3479,3133,3337,3388,3685,3408,3580,3550,3758,2298,2566,2716,2938,2821,2978,3174,3261,2645,3006,3092,3300,3030,3375,3309,3528,2806,3120,3147,3437,3060,3344,3414,3594,3245,3449,3369,3563,3494,3618,3659,3807,2928,3166,3280,3393,3218,3471,3443,3635,3326,3540,3503,3613,3436,3665,3691,3796,3201,3557,3524,3675,3599,3737,3712,3837,3487,3705,3752,3905,3780,3881,3860,3979,2437,2841,2694,3077,2768,3274,3047,3409,2950,3114,3207,3399,3184,3366,3466,3641,2924,3330,3229,3514,3165,3447,3431,3669,3306,3489,3565,3621,3539,3698,3722,3829,3022,3255,3352,3476,3383,3590,3532,3742,3267,3518,3630,3714,3562,3689,3771,3853,3410,3614,3589,3727,3671,3802,3754,3873,3657,3778,3834,3888,3812,3912,3920,4019,3129,3420,3310,3577,3365,3548,3624,3762,3445,3694,3606,3747,3647,3785,3799,3894,3486,3676,3637,3809,3726,3792,3841,3956,3706,3863,3816,3908,3854,3930,3945,3994,3526,3643,3739,3828,3690,3838,3870,3925,3775,3900,3850,3942,3889,3951,3969,4011,3760,3874,3902,3987,3922,3960,3974,4033,3858,3981,3998,4026,4005,4039,4052,4082,2610,2881,2817,3221,2982,3271,3193,3463,3034,3158,3368,3592,3321,3496,3555,3707,3081,3342,3293,3516,3429,3660,3541,3733,3407,3569,3615,3784,3642,3753,3817,3904,3175,3440,3390,3579,3480,3604,3620,3763,3346,3634,3680,3820,3718,3805,3794,3915,3522,3683,3740,3791,3709,3835,3855,3936,3668,3866,3830,3927,3884,3953,3966,4021,3252,3378,3534,3678,3467,3653,3731,3823,3588,3769,3699,3806,3574,3842,3859,3941,3610,3720,3745,3907,3774,3851,3878,3990,3801,3898,3867,3950,3919,3961,3984,4029,3649,3750,3824,3879,3783,3928,3899,3971,3847,3891,3937,3977,3911,4009,3992,4036,3811,3926,3949,3995,3962,4016,4006,4049,3944,4001,4027,4057,4020,4043,4061,4085,3398,3500,3556,3724,3632,3797,3713,3864,3603,3755,3749,3895,3788,3914,3885,3983,3672,3833,3779,3880,3849,3903,3939,3976,3822,3929,3947,3993,3921,4002,4015,4048,3702,3804,3872,3917,3839,3952,3932,3999,3857,3940,3959,4031,3980,4007,4010,4056,3897,3973,3989,4014,3968,4037,4022,4054,3954,4025,4042,4069,4035,4060,4067,4091,3766,3862,3883,3972,3918,3946,3988,4017,3906,3957,3978,4023,3997,4040,4032,4063,3935,3985,4000,4038,4008,4028,4047,4073,4012,4051,4044,4066,4055,4071,4075,4094,3963,4003,4018,4046,4024,4050,4059,4070,4034,4058,4053,4078,4064,4079,4074,4090,4041,4062,4068,4080,4072,4081,4083,4087,4076,4084,4086,4089,4088,4095,4092,4093].

What is claimed is:

1. A polar code encoding method, comprising:

obtaining, by an encoding apparatus, K to-be-encoded bits, a mother code length N, and a first sequence, wherein the first sequence comprises sequence numbers of N polarized subchannels, the sequence numbers of the N polarized subchannels are arranged in the first sequence based on reliability of the N polarized subchannels, $N=2^n$, $K \leq N$, N is greater than or equal to 32, and K, n, and N are positive integers;

determining, based on the first sequence, K polarized subchannels used to contain the K to-be-encoded bits, and performing polarization encoding on the K to-be-encoded bits to obtain an encoded bit sequence;

performing rate matching on the encoded sequence to obtain a rate-matched sequence; and outputting the rate-matched sequence;

wherein the first sequence is a sequence Q5_8192 or a subsequence of the sequence Q5_8192.

2. The polar code encoding method according to claim 1, wherein the first sequence is a subsequence of a second sequence, the second sequence comprises sequence numbers of $N_{max}$ polarized subchannels, the sequence numbers of the $N_{max}$ polarized subchannels are arranged in the second sequence based on reliability of the $N_{max}$ polarized subchannels, N is less than or equal to $N_{max}$, and $N_{max}=2^{n_{max}}$, wherein $n_{max}$ is a positive integer, n is less than or equal to $n_{max}$, and the second sequence is any sequence having a length of $N_{max}$.

3. The polar code encoding method according to claim 1, wherein the K to-be-encoded bits comprise a cyclic redundancy check bit or a parity check bit.

4. The polar code encoding method according to claim 1, wherein the determining, based on the first sequence, K polarized subchannels used to contain the K to-be-encoded bits comprises, in response to M being less than or equal to N, mapping the K to-be-encoded bits to the K polarized subchannels with high reliability in M−P non-punctured polarized subchannels to enable reliability of the polarized subchannels containing the K to-be-encoded bits to be higher than reliability of remaining M−P−K polarized subchannels, wherein M is a target code length, P is a quantity of pre-frozen polarized subchannels, and P is greater than or equal to 0.

5. The polar code encoding method according to claim 1, wherein the first sequence is prestored.

6. The polar code encoding method according to claim 1, wherein the sequence numbers of the N polarized subchannels are 0 to (N−1) or 1 to N.

7. A polar code encoding apparatus, comprising:

an input interface circuit, configured to obtain K to-be-encoded bits, wherein K is a positive integer;

a logic circuit, configured to:

determine a mother code length N and a first sequence, determine, based on the first sequence, K polarized subchannels used to contain the K to-be-encoded bits, and perform polar encoding on the K to-be-encoded bits to obtain an encoded bit sequence, wherein the first sequence comprises sequence numbers of N polarized subchannels, the sequence numbers of the N polarized subchannels are arranged in the first sequence based on reliability of the N polarized subchannels, $N=2^n$, K≤N, N is greater than or equal to 32, and K, n, and N are positive integers; and perform rate matching on the encoded bit sequence to obtain a rate-matched bit sequence; and an output circuit, configured to output the rate-matched bit sequence, wherein the first sequence is a sequence Q5_8192 or a subsequence of the sequence Q5_8192.

8. The polar code encoding apparatus according to claim 7, wherein the first sequence is a subsequence of a second sequence, the second sequence comprises sequence numbers of $N_{max}$ polarized subchannels, the sequence numbers of the $N_{max}$ polarized subchannels are arranged in the second sequence based on reliability of the $N_{max}$ polarized subchannels, N is less than or equal to $N_{max}$, and $N_{max}=2^{n_{max}}$, wherein $n_{max}$ is a positive integer, n is less than or equal to $n_{max}$, and the second sequence is any sequence having a length of $N_{max}$.

9. The polar code encoding apparatus according to claim 7, wherein the K to-be-encoded bits comprise a cyclic redundancy check bit or a parity check bit.

10. The polar code encoding apparatus according to claim 7, wherein in response to M being less than or equal to N, the logic circuit is configured to map the K to-be-encoded bits to the K polarized subchannels with high reliability in M−P non-punctured polarized subchannels to enable reliability of the polarized subchannels containing the K to-be-encoded bits to be higher than reliability of remaining M−P−K polarized subchannels, wherein M is a target code length, P is a quantity of pre-frozen polarized subchannels, and P is greater than or equal to 0.

11. The polar code encoding apparatus according to claim 7, wherein the first sequence is prestored.

12. The polar code encoding apparatus according to claim 7, wherein the sequence numbers of the N polarized subchannels are 0 to (N−1) or 1 to N.

13. A non-transitory computer-readable medium having instruction stored thereon that, when executed by a processor, cause an apparatus to:

obtain K to-be-encoded bits, wherein K is a positive integer;

determine a mother code length N and a first sequence, determine, based on the first sequence, K polarized subchannels used to contain the K to-be-encoded bits, and perform polar encoding on the K to-be-encoded bits to obtain an encoded bit sequence, wherein the first sequence comprises sequence numbers of N polarized subchannels, the sequence numbers of the N polarized subchannels are arranged in the first sequence based on reliability of the N polarized subchannels, $N=2^n$, K≤N, N is greater than or equal to 32, and K, n, and N are positive integers; and perform rate matching on the encoded bit sequence, and obtain and output a rate-matched bit sequence;

wherein the first sequence is a sequence Q5_8192 or a subsequence of the sequence Q5_8192.

14. The non-transitory computer-readable medium according to claim 13, wherein the first sequence is a subsequence of a second sequence, the second sequence comprises sequence numbers of $N_{max}$ polarized subchannels, the sequence numbers of the $N_{max}$ polarized subchannels are arranged in the second sequence based on reliability of the $N_{max}$ polarized subchannels, N is less than or equal to $N_{max}$, and $N_{max}=2^{n_{max}}$, wherein $n_{max}$ is a positive integer, n is less than or equal to $n_{max}$, and the second sequence is any sequence having a length of $N_{max}$.

15. The non-transitory computer-readable medium according to claim 13, wherein the K to-be-encoded bits comprise a cyclic redundancy check bit or a parity check bit.

16. The non-transitory computer-readable medium according to claim 13, wherein in response to M being less than or equal to N, the apparatus is caused to map the K to-be-encoded bits to the K polarized subchannels with high reliability in M−P non-punctured polarized subchannels to enable reliability of the polarized subchannels containing the K to-be-encoded bits to be higher than reliability of remaining M−P−K polarized subchannels, wherein M is a target code length, P is a quantity of pre-frozen polarized subchannels, and P is greater than or equal to 0.

17. The non-transitory computer-readable medium according to claim 13, wherein the first sequence is prestored.

* * * * *